US011997921B2

(12) United States Patent
Lim et al.

(10) Patent No.: US 11,997,921 B2
(45) Date of Patent: May 28, 2024

(54) ORGANIC LIGHT EMITTING DEVICE

(71) Applicant: LG Chem, Ltd., Seoul (KR)

(72) Inventors: Dowon Lim, Daejeon (KR); Ji Hoon Kim, Daejeon (KR); Juhwan Kim, Daejeon (KR); Donghwan Lee, Daejeon (KR); Jaesoon Bae, Daejeon (KR); Jaechol Lee, Daejeon (KR); Songrim Jang, Daejeon (KR); Doowhan Choi, Daejeon (KR); Keunsoo Lee, Daejeon (KR); Jumin Lee, Daejeon (KR)

(73) Assignee: LG Chem, Ltd. (KR)

( * ) Notice: Subject to any disclaimer, the term of this patent is extended or adjusted under 35 U.S.C. 154(b) by 326 days.

(21) Appl. No.: 17/466,121

(22) Filed: Sep. 3, 2021

(65) Prior Publication Data

US 2022/0085292 A1 Mar. 17, 2022

(30) Foreign Application Priority Data

Sep. 10, 2020 (KR) ........................ 10-2020-0116030

(51) Int. Cl.
*H10K 85/60* (2023.01)
*H10K 85/10* (2023.01)
(Continued)

(52) U.S. Cl.
CPC ......... *H10K 85/633* (2023.02); *H10K 85/111* (2023.02); *H10K 85/151* (2023.02);
(Continued)

(58) Field of Classification Search
CPC .. H10K 85/633; H10K 85/151; H10K 85/111; H10K 85/624; H10K 85/626; H10K 50/17; H10K 50/15
(Continued)

(56) References Cited

U.S. PATENT DOCUMENTS 5,734,003 A 3/1998 Iwasaki et al.
8,741,512 B2 6/2014 Iwasaki et al.
(Continued)

FOREIGN PATENT DOCUMENTS

CN 106661445 A 5/2017
CN 109075261 A 12/2018
(Continued)

OTHER PUBLICATIONS

Chengyuan, Qin et al., "Research progress of aggregation-induced luminescent organic fluorine compounds," Chinese Journal of Organic Chemistry, May 26, 2020, pp. 1-27, [online] URL: http://kns.cnki.net/kcms/detail/31.1321.O6.20200525.1726.006.html.

*Primary Examiner* — Tu-Tu V Ho
(74) *Attorney, Agent, or Firm* — Lerner David LLP

(57) ABSTRACT

The present invention relates to an organic light emitting device including: an anode; a cathode; and a light emitting light provided between the anode and the cathode, in which a first organic material layer including a composition which includes a compound of Chemical Formula 1 or a cured product thereof is included between the light emitting layer and the anode, and a second organic material layer including a composition which includes a copolymer of Chemical Formula 2 or a cured product thereof is included between the first organic material layer and the light emitting layer,

[Chemical Formula 1]

(Continued)

-continued

[Chemical Formula 2]

$$E-\!\!\left[A\right]_a\!\left[B'\right]_b\!\left[C'\right]_c\!-E$$

Wherein all the variables are described herein.

19 Claims, 2 Drawing Sheets

(51) Int. Cl.
*H10K 50/15* (2023.01)
*H10K 50/17* (2023.01)

(52) U.S. Cl.
CPC ............. *H10K 50/15* (2023.02); *H10K 50/17* (2023.02); *H10K 85/624* (2023.02); *H10K 85/626* (2023.02)

(58) Field of Classification Search
USPC ............................................................ 257/40
See application file for complete search history.

(56) References Cited

U.S. PATENT DOCUMENTS

| | | | | |
|---|---|---|---|---|
| 9,356,242 | B2 * | 5/2016 | Kaiser .................. | H10K 85/655 |
| 9,954,174 | B2 | 4/2018 | Radu et al. | |
| 10,749,111 | B2 | 8/2020 | Radu et al. | |
| 10,879,467 | B2 | 12/2020 | Radu et al. | |
| 2010/0109517 | A1 | 5/2010 | Fukushima et al. | |
| 2016/0133847 | A1 | 5/2016 | Fujiyama et al. | |
| 2017/0213977 | A1 | 7/2017 | Shin et al. | |
| 2019/0148650 | A1 | 5/2019 | Kwak et al. | |
| 2019/0338140 | A1 | 11/2019 | Shin et al. | |
| 2020/0227645 | A1 | 7/2020 | Lee et al. | |
| 2020/0287140 | A1 | 9/2020 | Chae et al. | |
| 2020/0365815 | A1 | 11/2020 | Oh et al. | |
| 2021/0221932 | A1 | 7/2021 | Hwang et al. | |

FOREIGN PATENT DOCUMENTS

| | | | |
|---|---|---|---|
| JP | H8176293 | A | 7/1996 |
| JP | 2009096983 | A | 5/2009 |
| KR | 20120112277 | A | 10/2012 |
| KR | 20150093995 | A | 8/2015 |
| KR | 20160084918 | A | 7/2016 |
| KR | 20160131947 | A | 11/2016 |
| KR | 20180059380 | A1 | 6/2018 |
| KR | 20180066115 | A | 6/2018 |
| KR | 20180137263 | A | 12/2018 |
| KR | 20190143406 | A | 12/2019 |
| KR | 20200034516 | A | 3/2020 |
| KR | 20200035775 | A | 4/2020 |
| KR | 20200063051 | A | 6/2020 |
| WO | 2012177006 | A2 | 12/2012 |
| WO | 2019066250 | A1 | 4/2019 |
| WO | 2019066338 | A1 | 4/2019 |
| WO | 2019093665 | A1 | 5/2019 |

* cited by examiner

[FIG. 1]
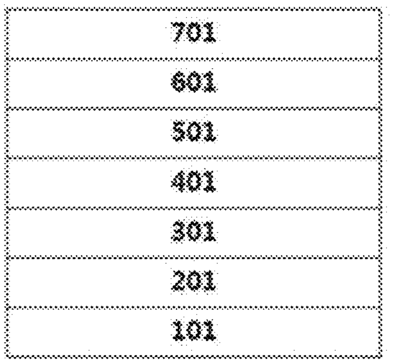
[FIG. 2]
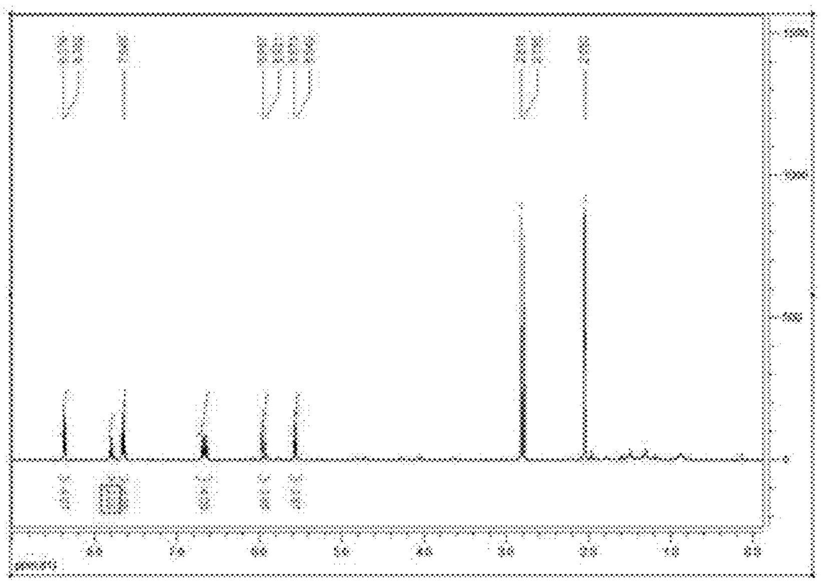

[FIG. 3]
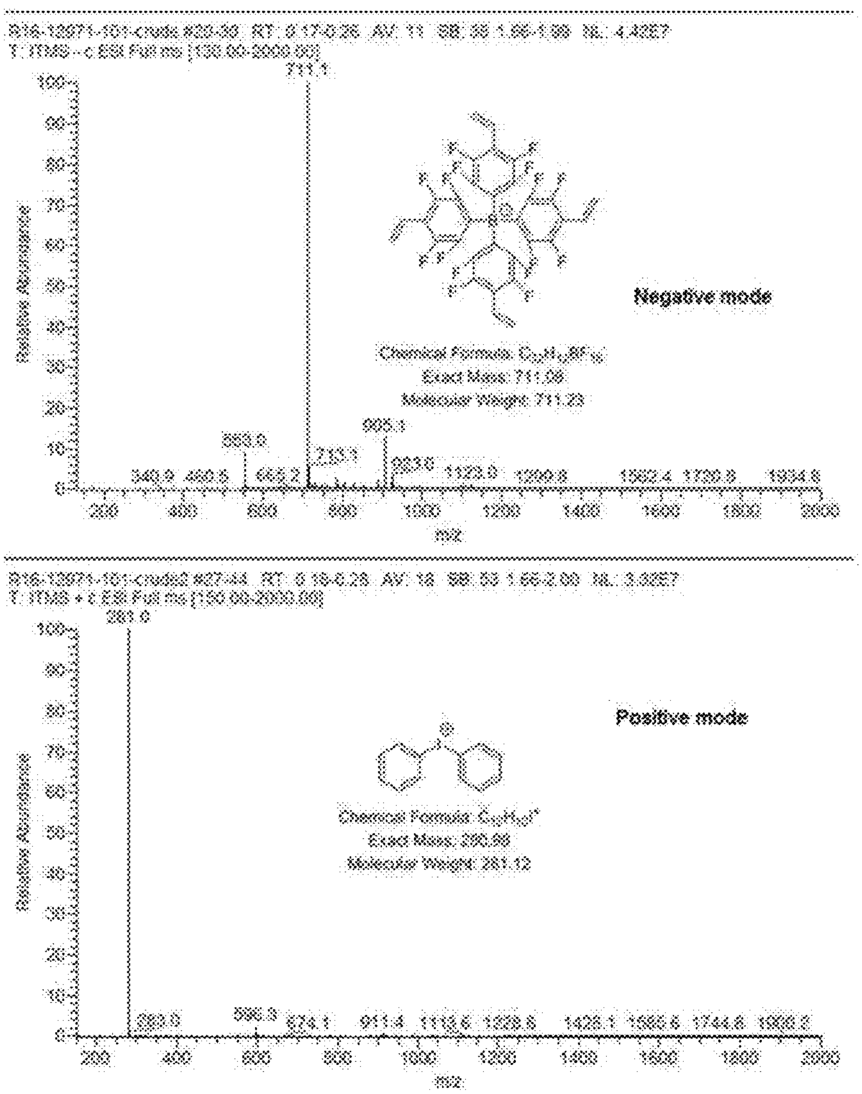

ORGANIC LIGHT EMITTING DEVICE

CROSS-REFERENCE TO RELATED APPLICATIONS

The present application claims priority from Korean Patent Application No. 10-2020-0116030 filed on Sep. 10, 2020, the entire contents of which are incorporated herein by reference.

TECHNICAL FIELD

The present invention relates to an organic light emitting device.

BACKGROUND ART

An organic light emission phenomenon is one of the examples of converting an electric current into visible rays through an internal process of a specific organic molecule. The principle of the organic light emission phenomenon is as follows. When an organic material layer is disposed between an anode and a cathode and an electric current is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic light emitting device using the principle may be generally composed of a cathode, an anode, and an organic material layer disposed therebetween, for example, a hole injection layer, a hole transport layer, a light emitting layer, an electron injection layer, and an electron transport layer.

In order to manufacture an organic light emitting device in the related art, a deposition process has been usually used. However, there are problems in that the loss of materials occurs frequently when an organic light emitting device is manufactured by a deposition process and in that it is difficult to manufacture a device having a large area, and to solve these problems, a device using a solution process has been developed.

Therefore, there is a need for development of materials for an organic material layer prepared by a solution process, and a combination of the materials.

RELATED ART DOCUMENT

Patent Document (Patent Document 1) Korean Patent Application Laid-Open No. 10-2012-0112277

SUMMARY OF THE INVENTION

The present invention has been made in an effort to provide an organic light emitting device having excellent driving voltage, efficiency, or service life characteristics.

An exemplary embodiment of the present invention provides an organic light emitting device including: an anode; a cathode; and a light emitting light provided between the anode and the cathode, in which a first organic material layer including a composition which includes a compound of the following Chemical Formula 1 or a cured product thereof is included between the light emitting layer and the anode, and a second organic material layer including a composition which includes a copolymer of the following Chemical Formula 2 or a cured product thereof is included between the first organic material layer and the light emitting layer.

[Chemical Formula 1]

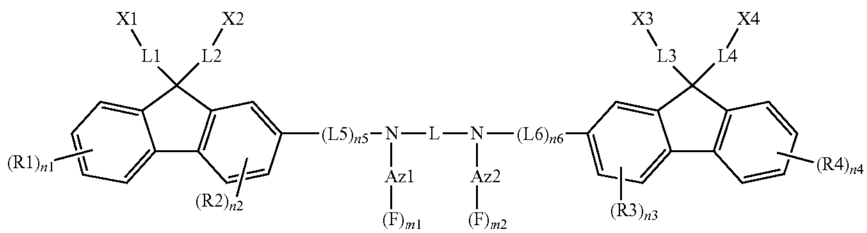

In Chemical Formula 1,

L and L1 to L4 are the same as or different from each other, and are each independently a substituted or unsubstituted arylene group, L5 and L6 are the same as or different from each other, and are each independently a direct bond; or a substituted or unsubstituted arylene group, Az1 and Az2 are the same as or different from each other, and are each independently a substituted or unsubstituted aryl group; or a substituted or unsubstituted heteroaryl group, R1 to R4 are the same as or different from each other, and are each independently hydrogen; deuterium; a substituted or unsubstituted alkyl group; a substituted or unsubstituted alkoxy group; a substituted or unsubstituted aryl group; or a substituted or unsubstituted heteroaryl group, X1 to X4 are the same as or different from each other, and are each independently —(U101)w; or -M-Q, and two or more of X1 to X4 are -M-Q, U101 is hydrogen; deuterium; a halogen group; a substituted or unsubstituted alkyl group; a substituted or unsubstituted alkoxy group; a substituted or unsubstituted aryl group; or a substituted or unsubstituted aryloxy group, w is an integer from 0 to 5, and when w is 2 or higher, each U101 is the same as or different from each other, M is O or S, Q is a curable group, m1 and m2 are the same as or different from each other, and are each independently an integer from 1 to 5, n5 and n6 are the same as or different from each other, and are each independently an integer from 0 to 2, n1 and n4 are the same as or different from each other, and are each independently an integer from 0 to 4, n2 and n3 are the same as or different from each other, and are each independently an integer from 0 to 3, when n5 and n6 are each 2, each L5 and L6 is the same as or different from each other, respectively, when n1 to n4 are each 2 or higher, each R1 to R4 is the same as or different from each other, respectively.

[Chemical Formula 2]

$$E\text{-}[A]_a\text{-}[B']_b\text{-}[C']_c\text{-}E$$

In Chemical Formula 2,

A is a monomer unit including at least one triarylamine group,

B' is a monomer unit having at least three binding points in a copolymer,

C' is an aromatic monomer unit or a deuterated analog thereof,

E is each independently selected from the group consisting of hydrogen; deuterium; a halogen group; a substituted or unsubstituted alkyl group; a substituted or unsubstituted silyl group; a substituted or unsubstituted germanium group; a substituted or unsubstituted aryl group; a substituted or unsubstituted arylamino group; a substituted or unsubstituted siloxane group; and a substituted or unsubstituted curable group, and a, b and c are a mole fraction, a+b+c=1, a≠0, and b≠0.

An organic light emitting device according to an exemplary embodiment of the present invention is excellent in curing and maintaining power of a film of a first organic material layer by including the compound of Chemical Formula 1 in the first organic material layer, and has an improved ability to inject holes from the first organic material layer to a second organic material layer.

The organic light emitting device according to an exemplary embodiment of the present invention includes a compound of Chemical Formula 1 in the first organic material layer and a copolymer of Chemical Formula 2 in the second organic material layer, whereby a device having low driving voltage, high efficiency, and/or high service life characteristics can be manufactured.

BRIEF DESCRIPTION OF THE DRAWINGS

FIG. 1 is a view illustrating an example of an organic light emitting device according to an exemplary embodiment of the present invention.

FIG. 2 is an NMR spectrum of Compound 3-3 prepared in the Preparation Example.

FIG. 3 is a mass spectrum of Compound 3-3 prepared in the Preparation Example.

DETAILED DESCRIPTION

Hereinafter, the present invention will be described in detail.

An exemplary embodiment of the present invention provides the following organic light emitting device including:

an anode; a cathode; and a light emitting layer provided between the anode and the cathode, in which a first organic material layer including a composition which includes a compound of the following Chemical Formula 1 or a cured product thereof is included between the light emitting layer and the anode, and a second organic material layer including a composition which includes a copolymer of the following Chemical Formula 2 or a cured product thereof is included between the first organic material layer and the light emitting layer.

[Chemical Formula 1]

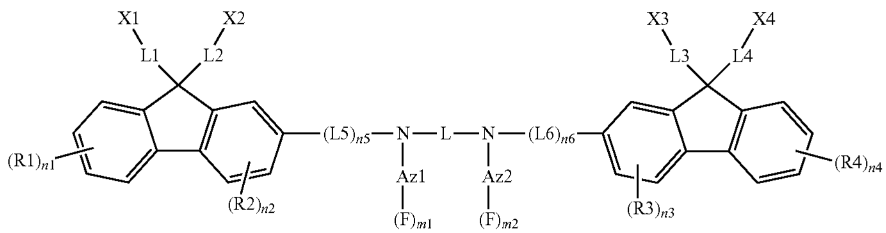

In Chemical Formula 1,

L and L1 to L4 are the same as or different from each other, and are each independently a substituted or unsubstituted arylene group, L5 and L6 are the same as or different from each other, and are each independently a direct bond; or a substituted or unsubstituted arylene group, Az1 and Az2 are the same as or different from each other, and are each independently a substituted or unsubstituted aryl group; or a substituted or unsubstituted heteroaryl group, R1 to R4 are the same as or different from each other, and are each independently hydrogen; deuterium; a substituted or unsubstituted alkyl group; a substituted or unsubstituted alkoxy group; a substituted or unsubstituted aryl group; or a substituted or unsubstituted heteroaryl group, X1 to X4 are the same as or different from each other, and are each independently —(U101)w; or -M-Q, and two or more of X1 to X4 are -M-Q, U101 is hydrogen; deuterium; a halogen group; a substituted or unsubstituted alkyl group; a substituted or unsubstituted alkoxy group; a substituted or unsubstituted aryl group; or a substituted or unsubstituted aryloxy group, w is an integer from 0 to 5, and when w is 2 or higher, each U101 is the same as or different from each other, M is O or S, Q is a curable group, m1 and m2 are the same as or different from each other, and are each independently an integer from 1 to 5, n5 and n6 are the same as or different from each other, and are each independently an integer from 0 to 2, n1 and n4 are the same as or different from each other, and are each independently an integer from 0 to 4, n2 and n3 are the same as or different from each other, and are each independently an integer from 0 to 3, when n5 and n6 are each 2, each L5 and L6 is the same as or different from each other, respectively, when n1 to n4 are each 2 or higher, each R1 to R4 is the same as or different from each other, respectively,

[Chemical Formula 2]

$$E-\!\left[A\right]_{a}\!\left[B'\right]_{b}\!\left[C'\right]_{c}\!-E$$

in Chemical Formula 2,

A is a monomer unit including at least one triarylamine group,

B' is a monomer unit having at least three binding points in a copolymer,

C' is an aromatic monomer unit or a deuterated analog thereof,

E is each independently selected from the group consisting of hydrogen; deuterium; a halogen group; a substituted or unsubstituted alkyl group; a substituted or unsubstituted silyl group; a substituted or unsubstituted germanium group; a substituted or unsubstituted aryl group; a substituted or unsubstituted arylamino group; a substituted or unsubstituted siloxane group; and a substituted or unsubstituted curable group, and a, b and c are a mole fraction, a+b+c=1, a≠0, and b≠0.

The compound of Chemical Formula 1 forms a stable thin film completely cured by heat treatment or light treatment by including oxygen (O) or sulfur (S) atoms in the compound. Specifically, the above-described compound of the present invention has solvent selectivity due to a high affinity with hydrocarbon-based and/or ether-based solvents, and is resistant to a solvent to be used when other layers in addition to an organic material layer including the compound are formed by the solution process, so that it is possible to prevent the compound from moving to other layers. Further, the compound represented by Chemical Formula 1 deepens the highest occupied molecular orbital (HOMO) of a molecule due to a strong electron withdrawing effect by substituting a bonded substituent of an amine group with a fluoro group (—F), and when the compound of the present invention having a deep HOMO is used for an organic light emitting device, for example, a hole injection layer, the hole mobility is increased as a whole due to a reduced difference in energy level from a hole transport layer, thereby having an effect of improving the service life of the organic light emitting device.

When one member (layer) is disposed "on" another member (layer) in the present invention, this includes not only a case where the one member (layer) is brought into contact with another member, but also a case where still another member (layer) is present between the two members (layers).

When one part "includes" one constituent element in the present invention, unless otherwise specifically described, this does not mean that another constituent element is excluded, but means that another constituent element may be further included.

In the present invention, the "layer" has a meaning compatible with a "film" usually used in the art, and means a coating covering a target region. The size of the "layer" is not limited, and the sizes of the respective "layers" may be the same as or different from one another. According to an exemplary embodiment, the size of the "layer" may be the same as that of the entire device, may correspond to the size of a specific functional region, and may also be as small as a single sub-pixel.

Unless otherwise defined in the present invention, all technical and scientific terms used in the present invention have the same meaning as commonly understood by one with ordinary skill in the art to which the present invention pertains. Although methods and materials similar to or equivalent to those described in the present invention may be used in the practice or in the test of exemplary embodiments of the present invention, suitable methods and materials will be described below. All publications, patent applications, patents, and other references mentioned in the present invention are hereby incorporated by reference in their entireties, and in the case of conflict, the present invention, including definitions, will control unless a particular passage is mentioned. In addition, the materials, methods, and examples are illustrative only and are not intended to be limiting.

In the present invention, a "curable group" means a group capable of inducing a cross-linking bond by heat treatment and/or exposure to light. The cross-linkage may be produced while radicals produced by decomposing carbon-carbon multiple bonds or cyclic structures by means of a heat treatment or light irradiation are linked to each other.

In an exemplary embodiment of the present invention, the curable group is any one of the following structures.

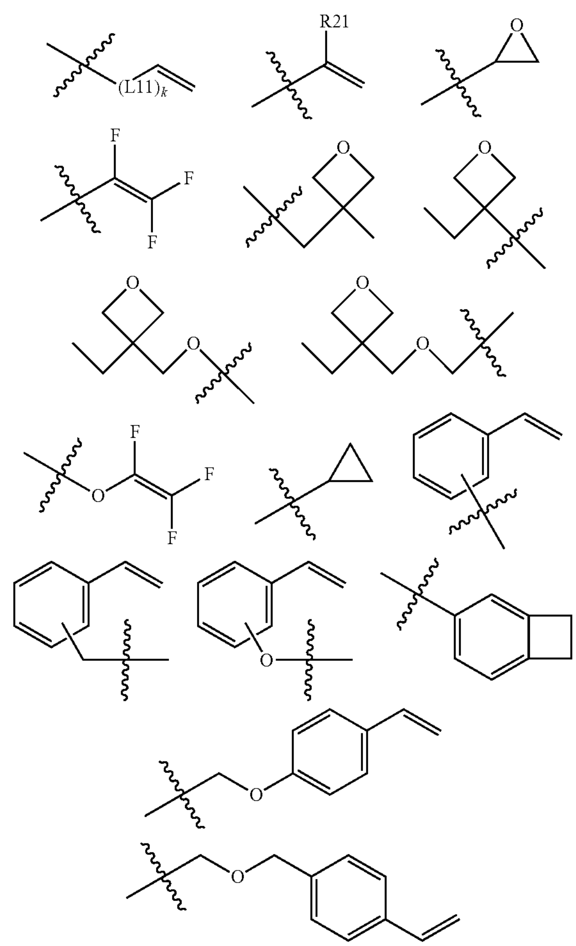

-continued

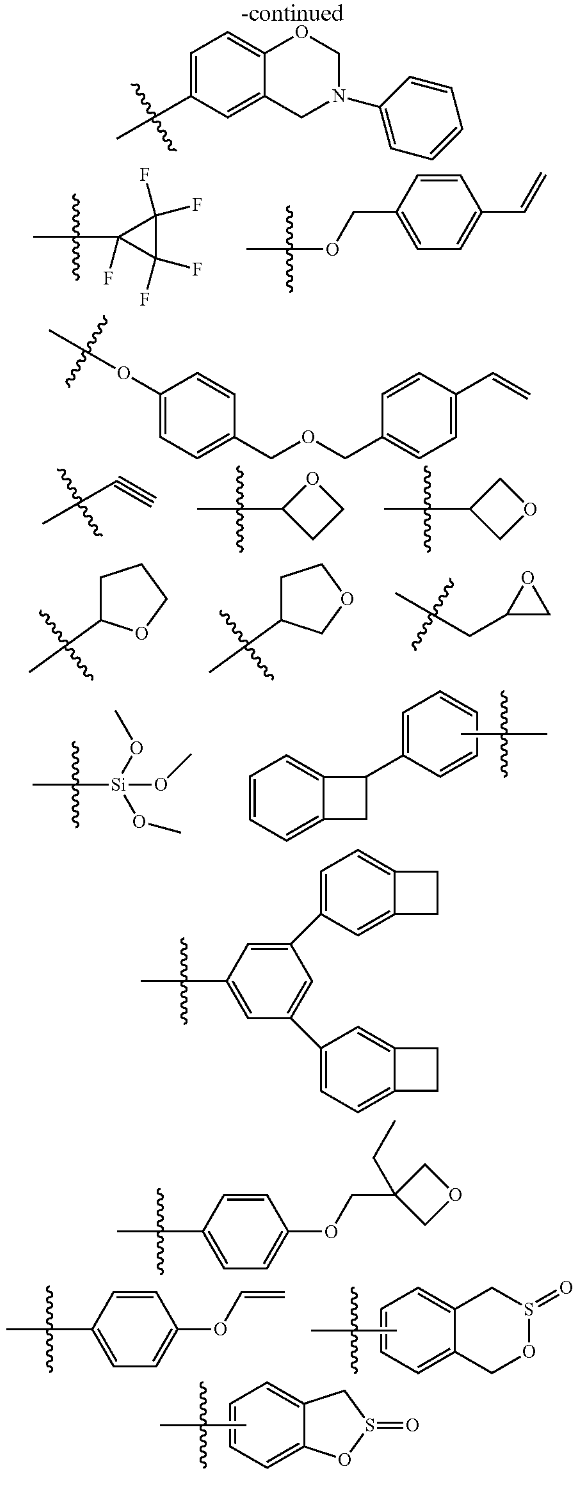

In the structures,

L11 is a direct bond; —O—; —S—; a substituted or unsubstituted alkylene group; a substituted or unsubstituted arylene group; or a substituted or unsubstituted heteroarylene group, k is 1 or 2, when k is 2, each L11 is the same as or different from each other, and R21 is a substituted or unsubstituted alkyl group.

According to an exemplary embodiment of the present invention, L11 is a direct bond; a methylene group; or an ethylene group.

In another exemplary embodiment, L11 is a direct bond.

According to an exemplary embodiment of the present invention, R21 is a methyl group; or an ethyl group.

According to another exemplary embodiment, R21 is a methyl group.

In the present invention, the term "deuterated" is intended to mean that at least one available H is replaced with D. For X % deuterated compounds or groups, X % of the available H is replaced with D. For deuterated compounds or groups, deuterium is present in an amount 100-fold or higher than their natural abundance level.

According to an exemplary embodiment of the present invention, one or more of the compound of Chemical Formula 1 and the copolymer of Chemical Formula 2 may be deuterated, In this case, the deuterated compound may be prepared in a similar manner using a deuterated precursor material, or more generally by treating a non-deuterated compound with a deuterated solvent, for example, benzene-d6 in the presence of a Lewis acid H/D exchange catalyst, such as trifluoromethanesulfonic acid, aluminum trichloride or ethyl aluminum dichloride.

In the present invention, the "deuteration rate" or "deuterium substitution rate" may be confirmed by a known method such as a proton nuclear magnetic resonance method (1H NMR), thin-layer chromatography mass spectrometry (TLS/MS), or gas chromatography mass spectrometry (GC/MS).

In the present invention, the "deuterated analog" refers to a structural analog of a compound or group in which one or more available hydrogens are replaced by deuterium.

In an exemplary embodiment of the present invention, at least one of the compound of Chemical Formula 1 or the copolymer of Chemical Formula 2 is 10% to 100% deuterated.

In an exemplary embodiment of the present invention, the copolymer of Chemical Formula 2 is 5% to 100% deuterated.

In an exemplary embodiment of the present invention, the copolymer of Chemical Formula 2 is 40% to 100% deuterated.

In an exemplary embodiment of the present invention, the copolymer of Chemical Formula 2 is a compound which is 50% to 100% deuterated.

According to an exemplary embodiment of the present invention, one or more of the compound of Chemical Formula 1 or the copolymer of Chemical Formula 2 may be deuterated. When deuterium is substituted at the hydrogen position, chemical properties of the compound are almost unchanged. However, since deuterium has twice the atomic weight of hydrogen, physical properties of the deuterated compound change. For example, the deuterated compound has a lower vibration energy level, and a reduction in the vibration energy level may prevent a decrease in intermolecular Van der Waals force and a decrease in quantum efficiency due to collision due to intermolecular vibration. Therefore, a device including deuterated compounds has improved efficiency and service life.

Throughout the present invention, the term "combination thereof" included in the Markush type expression means a mixture or combination of one or more selected from the group consisting of constituent elements described in the Markush type expression, and means including one or more selected from the group consisting of the above-described constituent elements.

Examples of the substituents in the present invention will be described below, but are not limited thereto.

In the present invention,

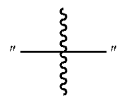

"-----" and "*" mean a moiety to be linked.

In the present invention, the term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more substituents are substituted, the two or more substituents may be the same as or different from each other.

In the present invention, the term "substituted or unsubstituted" means being substituted with one or more substituents selected from the group consisting of deuterium; a halogen group; a cyano group; an alkyl group; a cycloalkyl group; an alkoxy group; a silyl group; an aryl group; a germanium group; a curable group; and a heteroaryl group, being substituted with a substituent to which two or more substituents among the exemplified substituents are linked, or having no substituent.

In the present invention, a halogen group is a fluoro group (—F), a chloro group (—Cl), a bromo group (—Br), or an iodo group (—I).

In the present invention, the alkyl group may be straight-chained or branched, and the number of carbon atoms thereof is not particularly limited, but may be 1 to 20. According to another exemplary embodiment, the number of carbon atoms of the alkyl group is 1 to 10. Specific examples of the alkyl group include a methyl group, an ethyl group, an n-propyl group, an isopropyl group, an n-butyl group, an isobutyl group, a tert-butyl group, an n-pentyl group, an n-hexyl group, an n-heptyl group, and the like, but are not limited thereto.

In the present invention, a cycloalkyl group is not particularly limited, but may have 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. Specific examples of the cycloalkyl group include a cyclopropyl group, a cyclobutyl group, a cyclopentyl group, a cyclohexyl group, a cycloheptyl group, a cyclooctyl group, and the like, but are not limited thereto.

In the present invention, the alkoxy group may be straight-chained or branched. The number of carbon atoms of the alkoxy group is not particularly limited, but may be 1 to 20. Specific examples of the alkoxy group include a methoxy group, an ethoxy group, an n-propoxy group, an n-butoxy group, a tert-butoxy group, an n-pentyloxy group, an n-hexyloxy group, an n-octyloxy group, an n-nonyloxy group, an n-decyloxy group, and the like, but are not limited thereto.

In the present invention, the amino group means —NRR', and R and R' are the same or different from each other, and may be each independently an alkyl group, an aryl group, or deuterated analogs thereof.

In the present invention, the aryloxy group means —OR, and R means an aryl group.

In the present invention, the germanium group means —GeRR'R", and R, R', and R" are the same as or different from each other, and are each independently hydrogen, deuterium, an alkyl group, a deuterated alkyl group, a fluoroalkyl group, a deuterated moiety-fluorinated alkyl group, an aryl group, or a deuterated aryl group.

In the present invention, the silyl group means —SiRR'R", R, R', and R" are the same as or different from each other, and are each independently hydrogen, deuterium, an alkyl group, a deuterated alkyl group, a fluoroalkyl group, an aryl group, or a deuterated aryl group, and in some embodiments, when R, R', and R" are each an alkyl group, one or more carbons in the alkyl group are replaced with Si.

In the present invention, the siloxane group means —RSiOSiR', R and R' are the same as or different from each other, and are each independently hydrogen, deuterium, an alkyl group, a deuterated alkyl group, a fluoroalkyl group, an aryl group, or a deuterated aryl group, and in some embodiments, when R and R' are each an alkyl group, one or more carbons in the alkyl group are replaced with Si.

In the present invention, the siloxy group means $—OSiR_3$, and R's are the same as or different from each other, and are each independently hydrogen, deuterium, an alkyl group, a deuterated alkyl group, a fluoroalkyl group, an aryl group, or a deuterated aryl group.

In the present invention, the aryl group is not particularly limited, but may have 6 to 60 carbon atoms, and may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of the monocyclic aryl group include a phenyl group, a biphenyl group, a terphenyl group, and the like, but are not limited thereto. Examples of the polycyclic aryl group include a naphthyl group, an anthracenyl group, a phenanthrenyl group, a pyrenyl group, a perylenyl group, a triphenylenyl group, a chrysenyl group, a fluorenyl group, and the like, but are not limited thereto.

In the present invention, a fluorenyl group may be substituted, and two substituents may be bonded to each other to form a spiro structure.

When the fluorenyl group is substituted, the substituent may be a spirofluorenyl group such as

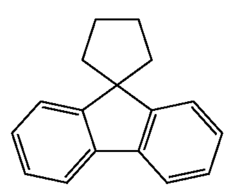

and

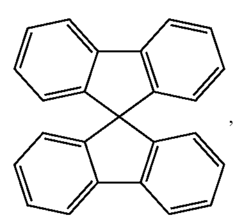

, and a substituted fluorenyl group such as

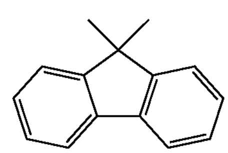

(a 9,9-dimethylfluorenyl group) and

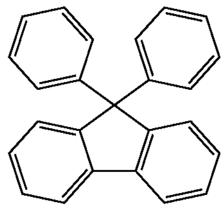 [SMILES: c1ccc(C2(c3ccccc3)c3ccccc3-c3ccccc32)cc1]

(a 9,9-diphenylfluorenyl group). However, the substituent is not limited thereto.

In the present invention, a heteroaryl group is an aromatic cyclic group including one or more of N, O, P, S, Si, and Se as a heteroatom, and the number of carbon atoms thereof is not particularly limited, but may be 2 to 60. According to an exemplary embodiment, the number of carbon atoms of the heteroaryl group is 2 to 30. Examples of the heteroaryl group include a pyridine group, a pyrrole group, a pyrimidine group, a pyridazine group, a furan group, a thiophene group, a benzothiophene group, a benzofuran group, a dibenzothiophene group, a dibenzofuran group, and the like, but are not limited thereto.

In the present invention, the above-described description on the alkyl group is applied to the alkylene group except for a divalent alkylene group.

In the present invention, the above-described description on the aryl group is applied to the arylene group except for a divalent arylene group.

In the present invention, the above-described description on the heteroaryl group is applied to the heteroarylene group except for a divalent heteroarylene group.

In the present invention, in the "—O—", O means an oxygen atom and — means a direct bond (single bond).

In the present invention, in the "—S—", S means a sulfur atom and — means a direct bond (single bond).

In the present invention, the aliphatic ring is not an aromatic but a hydrocarbon ring, and examples thereof include examples of the above-described cycloalkyl group, and an adamantyl group.

In the present invention, the above-described description on the aryl group may be applied to an aromatic ring.

In the present invention, the "adjacent" group may mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

In the present invention, in a substituted or unsubstituted ring formed by bonding groups, the "ring" means a hydrocarbon ring; or a hetero ring. The hydrocarbon ring group may be an aromatic, aliphatic or aromatic-aliphatic fused ring. The description on the heterocyclic group may be applied to the hetero ring except for a divalent hetero ring.

In the present invention, the above-described description on the aryl group may be applied to an aromatic hydrocarbon ring except for a divalent aromatic hydrocarbon ring.

In the present invention, the above-described description on the cycloalkyl group may be applied to an aliphatic hydrocarbon ring except for a divalent aliphatic hydrocarbon ring.

In the present invention, a mole fraction means a ratio of the number of moles of a given component to the total number of moles of all components.

In the present invention, the "monomer unit" is intended to mean a repeating unit in a polymer or a copolymer.

Hereinafter, the compound of Chemical Formula 1 will be described.

According to an exemplary embodiment of the present invention, X1 to X4 are the same as or different from each other, and are each independently —(U101)w; or -M-Q, and two or more of X1 to X4 are -M-Q.

According to another exemplary embodiment, X1 to X4 are the same as or different from each other, and are each independently —(U101)w; or -M-Q, and two of X1 to X4 are -M-Q.

According to still another exemplary embodiment, X1 and X4 are the same as or different from each other, and are each independently -M-Q, and X2 and X3 are the same as or different from each other, and are each independently —(U101)w.

In another exemplary embodiment, X1 and X2 are the same as or different from each other, and are each independently -M-Q, X3 and X4 are the same as or different from each other, and are each independently —(U101)w.

According to yet another exemplary embodiment, X1, X2, and X4 are the same as or different from each other, and are each independently -M-Q, and X3 is —(U101)w.

In still another exemplary embodiment, X1 to Y4 are the same as or different from each other, and are each independently -M-Q.

According to an exemplary embodiment of the present invention, Chemical Formula 1 is represented by the following Chemical Formula 1-1.

[Chemical Formula 1-1]

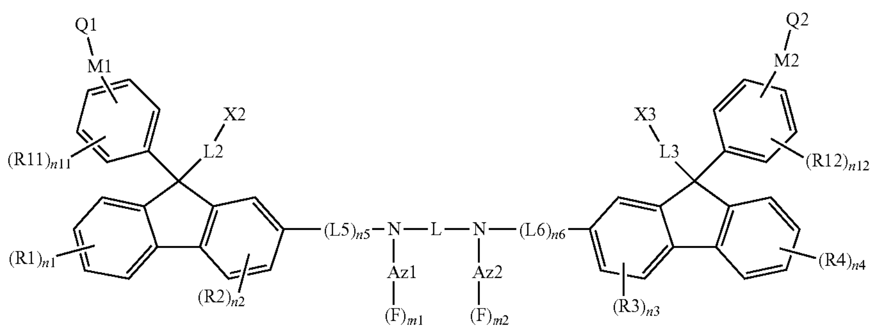

In Chemical Formula 1-1,

R1 to R4, L2, L3, L5, L6, n1 to n6, Az1, Az2, L, X2, X3, m1, and m2 are the same as those defined in Chemical Formula 1, M1 and M2 are the same as or different from each other, and are each independently O or S, Q1 and Q2 are the same as or different from each other, and are each independently a curable group, R11 and R12 are the same as or different from each other, and are each independently hydrogen; deuterium; a halogen group; a substituted or unsubstituted alkyl group; a substituted or unsubstituted alkoxy group; a substituted or unsubstituted aryloxy group; a substituted or unsubstituted aryl group; or a substituted or unsubstituted heteroaryl group, n11 and n12 are the same as or different from each other, and are each independently an integer from 0 to 4, and when n11 and n12 are each 2 or higher, each R11 and R12 is the same as or different from each other, respectively.

According to an exemplary embodiment of the present invention, L1 to L4 are the same as or different from each other, and are each independently a substituted or unsubstituted arylene group having 6 to 60 carbon atoms.

According to another exemplary embodiment, L1 to L4 are the same as or different from each other, and are each independently a substituted or unsubstituted arylene group having 6 to 30 carbon atoms.

According to still another exemplary embodiment, L1 to L4 are the same as or different from each other, and are each independently a substituted or unsubstituted phenylene group; or a substituted or unsubstituted naphthyl group.

In an exemplary embodiment of the present invention, Chemical Formula 1 is represented by the following Chemical Formula 1-2 or 1-3.

In Chemical Formulae 1-2 and 1-3, R1 to R4, L5, L6, n1 to n6, Az1, Az2, L, m1, and m2 are the same as those defined in Chemical Formula 1, M1 and M2 are the same as or different from each other, and are each independently O or S, Q1 and Q2 are the same as or different from each other, and are each independently a curable group, R11 to R16 are the same as or different from each other, and are each independently hydrogen; deuterium; a halogen group; a substituted or unsubstituted alkyl group; a substituted or unsubstituted alkoxy group; a substituted or unsubstituted aryloxy group; a substituted or unsubstituted aryl group; or a substituted or unsubstituted heteroaryl group, n11 and n12 are the same as or different from each other, and are each independently an integer from 0 to 4, n13 and n14 are the same as or different from each other, and are each independently an integer from 0 to 5, n15 and n16 are the same as or different from each other, and are each independently an integer from 0 to 7, and when n11 to n16 are each 2 or higher, each R11 to R16 is the same as or different from each other. respectively.

According to an exemplary embodiment of the present invention, Chemical Formula 1 is represented by any one of the following Chemical Formulae 1-4 to 1-7.

[Chemical Formula 1-2]

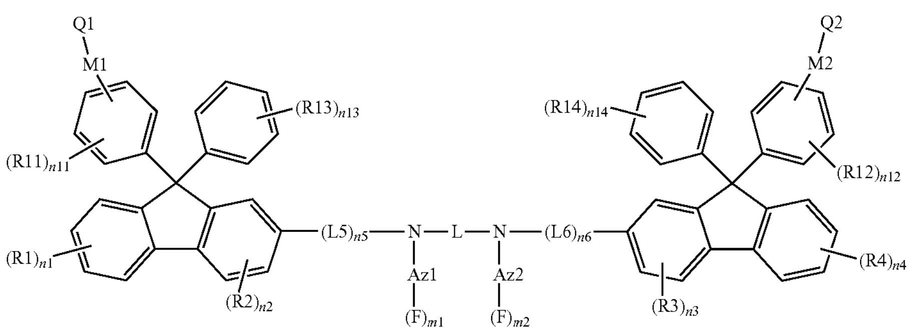

[Chemical Formula 1-3]

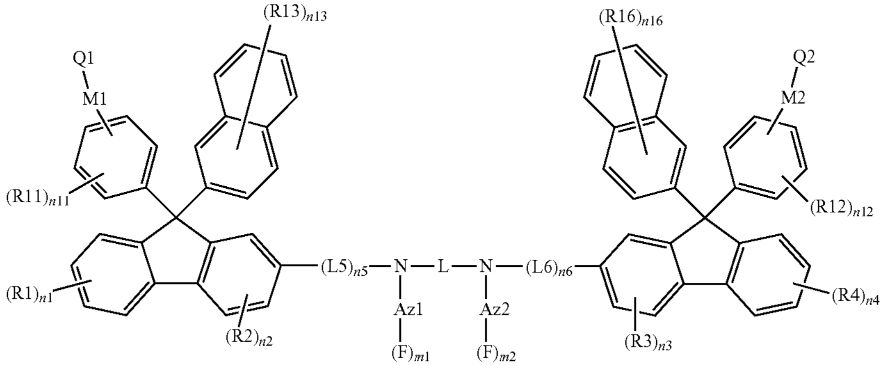

[Chemical Formula 1-4]

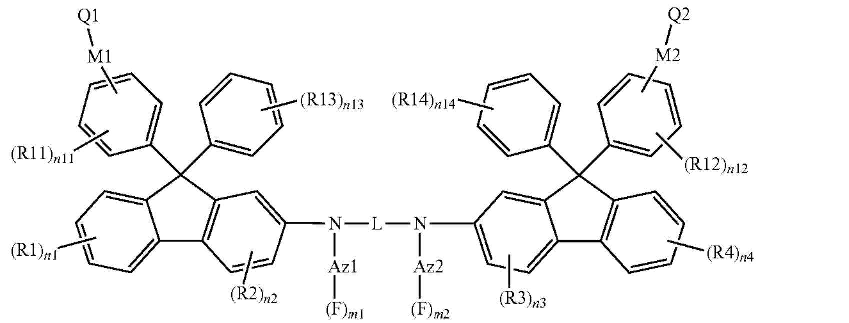

[Chemical Formula 1-5]

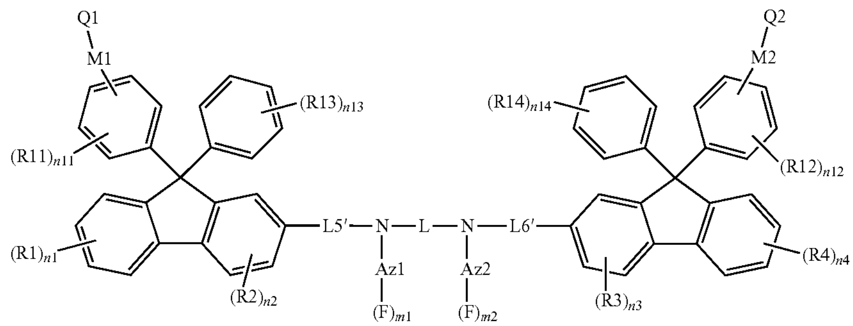

[Chemical Formula 1-6]

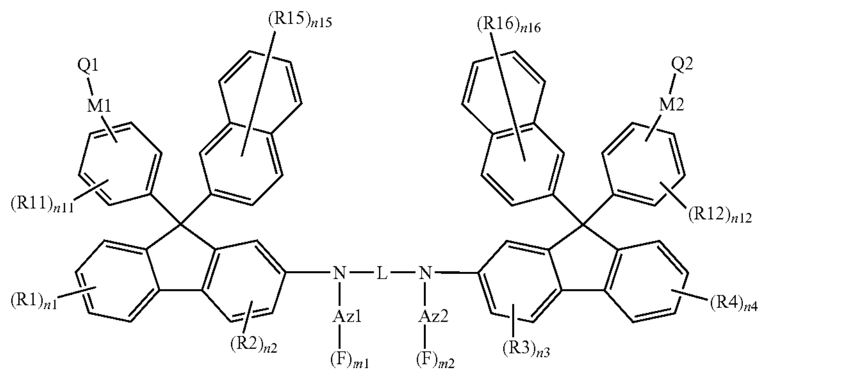

[Chemical Formula 1-7]

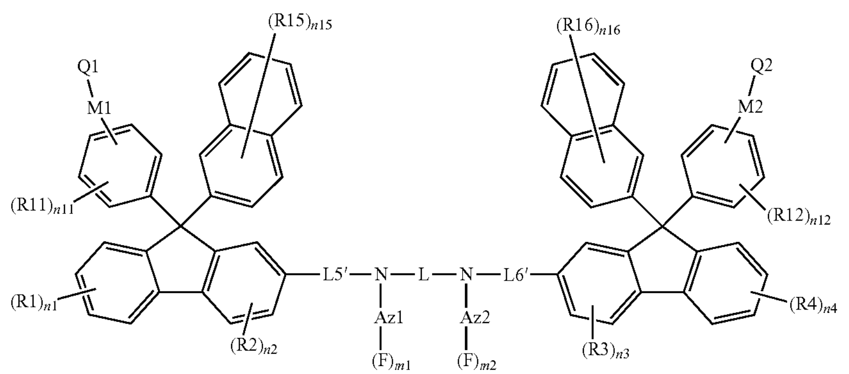

In Chemical Formulae 1-4 to 1-7,

R1 to R4, n1 to n4, Az1, Az2, L, m1, and m2 are the same as those defined in Chemical Formula 1, M1 and M2 are the same as or different from each other, and are each independently O or S, Q1 and Q2 are the same as or different from each other, and are each independently a curable group, L5' and L6' are the same as or different from each other, and are each independently a substituted or unsubstituted arylene group, R11 to R16 are the same as or different from each other, and are each independently hydrogen; deuterium; a halogen group; a substituted or unsubstituted alkyl group; a substituted or unsubstituted alkoxy group; a substituted or unsubstituted aryloxy group; a substituted or unsubstituted aryl group; or a substituted or unsubstituted heteroaryl group, n11 and n12 are the same as or different from each other, and are each independently an integer from 0 to 4, n13 and n14 are the same as or different from each other, and are each independently an integer from 0 to 5, n15 and n16 are the same as or different from each other, and are each independently an integer from 0 to 7, and when n11 to n16 are each 2 or higher, each R11 to R16 is the same as or different from each other, respectively.

In an exemplary embodiment of the present invention,

L5' and L6' are the same as or different from each other, and are each independently a substituted or unsubstituted arylene group having 6 to 30 carbon atoms.

According to an exemplary embodiment of the present invention, M is O.

According to an exemplary embodiment of the present invention, M is S.

According to an exemplary embodiment of the present invention, M1 and M2 are each O.

According to an exemplary embodiment of the present invention, M1 and M2 are each S.

In an exemplary embodiment of the present invention, Q is a curable group.

In an exemplary embodiment of the present invention, Q1 and Q2 are the same as or different from each other, and are each independently a curable group.

According to an exemplary embodiment of the present invention, w is an integer from 0 to 2, and when w is 2, each U101 is the same as or different from each other.

According to an exemplary embodiment of the present invention, U101 is hydrogen; deuterium; a halogen group; a substituted or unsubstituted alkyl group having 1 to 20 carbon atoms; a substituted or unsubstituted alkoxy group having 1 to 20 carbon atoms; a substituted or unsubstituted aryl group having 6 to 30 carbon atoms; or a substituted or unsubstituted aryloxy group having 6 to 30 carbon atoms.

According to another exemplary embodiment, U101 is hydrogen; deuterium; or a substituted or unsubstituted alkyl group having 1 to 20 carbon atoms.

According to still another exemplary embodiment, U101 is hydrogen; deuterium; a substituted or unsubstituted methyl group; a substituted or unsubstituted ethyl group; a substituted or unsubstituted propyl group; or a substituted or unsubstituted butyl group.

According to yet another exemplary embodiment, U101 is hydrogen; deuterium; a methyl group; an ethyl group; a propyl group; or a butyl group.

According to an exemplary embodiment of the present invention, R11 to R16 are the same as or different from each other, and are each independently hydrogen; deuterium; a halogen group; a substituted or unsubstituted alkyl group having 1 to 20 carbon atoms; a substituted or unsubstituted alkoxy group having 1 to 20 carbon atoms; a substituted or unsubstituted aryloxy group having 6 to 30 carbon atoms; a substituted or unsubstituted aryl group having 6 to 30 carbon atoms; or a substituted or unsubstituted heteroaryl group having 2 to 30 carbon atoms.

According to an exemplary embodiment of the present invention, R11 and R12 are the same as or different from each other, and are each independently hydrogen; deuterium; or a substituted or unsubstituted alkyl group having 1 to 20 carbon atoms.

According to another exemplary embodiment, R11 and R12 are each hydrogen.

In an exemplary embodiment of the present invention, R13 to R16 are the same as or different from each other, and are each independently hydrogen; deuterium; a substituted or unsubstituted alkyl group having 1 to 20 carbon atoms; or a substituted or unsubstituted alkoxy group having 1 to 20 carbon atoms.

According to still another exemplary embodiment, R13 to R16 are the same as or different from each other, and are each independently hydrogen; deuterium; a substituted or unsubstituted methyl group; a substituted or unsubstituted ethyl group; a substituted or unsubstituted propyl group; a substituted or unsubstituted butyl group; or a substituted or unsubstituted ethoxy group.

According to yet another exemplary embodiment, R13 to R16 are the same as or different from each other, and are each independently hydrogen; deuterium; a methyl group; an ethyl group; a propyl group; a butyl group; an ethoxy group; or an ethoxy group substituted with an ethoxy group.

According to an exemplary embodiment of the present invention, n11 is an integer from 0 to 4, and when n11 is 2 or higher, each R11 is the same as or different from each other.

According to an exemplary embodiment of the present invention, n11 is 0 or 1.

According to an exemplary embodiment of the present invention, n12 is an integer from 0 to 4, and when n12 is 2 or higher, each R12 is the same as or different from each other.

According to an exemplary embodiment of the present invention, n12 is 0 or 1.

According to an exemplary embodiment of the present invention, n13 is an integer from 0 to 5, and when n13 is 2 or higher, each R13 is the same as or different from each other.

According to an exemplary embodiment of the present invention, n13 is an integer from 0 to 2, and when n13 is 2, each R13 is the same as or different from each other.

According to an exemplary embodiment of the present invention, n14 is an integer from 0 to 5, and when n14 is 2 or higher, each R14 is the same as or different from each other.

According to an exemplary embodiment of the present invention, n14 is an integer from 0 to 2, and when n14 is 2 or higher, each R14 is the same as or different from each other.

According to an exemplary embodiment of the present invention, n15 is an integer from 0 to 5, and when n15 is 2, each R15 is the same as or different from each other.

According to an exemplary embodiment of the present invention, n15 is an integer from 0 to 2, and when n15 is 2 or higher, each R15 is the same as or different from each other.

According to an exemplary embodiment of the present invention, n16 is an integer from 0 to 5, and when n16 is 2 or higher, each R16 is the same as or different from each other.

According to an exemplary embodiment of the present invention, n16 is an integer from 0 to 2, and when n16 is 2, each R16 is the same as or different from each other.

According to an exemplary embodiment of the present invention, L is a substituted or unsubstituted arylene group having 6 to 60 carbon atoms.

According to another exemplary embodiment, L is a substituted or unsubstituted phenylene group; a substituted or unsubstituted biphenylylene group; or a substituted or unsubstituted spirobifluorenylene group.

According to still another exemplary embodiment, L is any one of the following Chemical Formulae 1-A to 1-C.

[Chemical Formula 1-A]

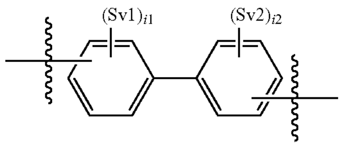

[Chemical Formula 1-B]

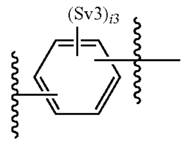

[Chemical Formula 1-C]

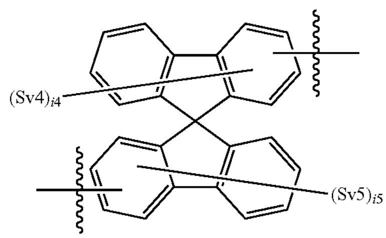

In Chemical Formulae 1-A to 1-C,

Sv1 to Sv5 are the same as or different from each other, and are each independently hydrogen; deuterium; a substituted or unsubstituted alkyl group; a substituted or unsubstituted alkoxy group; a substituted or unsubstituted aryl group; or a substituted or unsubstituted heteroaryl group, i1 to i3 are the same as or different from each other, and are each independently an integer from 0 to 4, i4 and i5 are the same as or different from each other, and are each independently an integer from 0 to 7, and when i1 to i5 are each 2 or higher, each i1 to i5 is the same as or different from each other, respectively.

According to an exemplary embodiment of the present invention, Sv1 to Sv5 are the same as or different from each other, and are each independently hydrogen; deuterium; a substituted or unsubstituted alkyl group having 1 to 20 carbon atoms; a substituted or unsubstituted alkoxy group having 1 to 20 carbon atoms; a substituted or unsubstituted aryl group having 6 to 30 carbon atoms; or a substituted or unsubstituted heteroaryl group having 2 to 30 carbon atoms.

According to an exemplary embodiment of the present invention, Sv1 to Sv5 are the same as or different from each other, and are each independently hydrogen; or deuterium.

According to an exemplary embodiment of the present invention, i1 is an integer from 0 to 4, and when i1 is 2 or higher, each Sv1 is the same as or different from each other.

According to another exemplary embodiment, i1 is 0 or 1.

According to an exemplary embodiment of the present invention, i2 is an integer from 0 to 4, and when i2 is 2 or higher, each Sv2 is the same as or different from each other.

According to still another exemplary embodiment, i2 is 0 or 1.

According to an exemplary embodiment of the present invention, i3 is an integer from 0 to 4, and when i3 is 2 or higher, each Sv3 is the same as or different from each other.

According to another exemplary embodiment, i3 is 0 or 1.

According to an exemplary embodiment of the present invention, i4 is an integer from 0 to 7, and when i4 is 2 or higher, each Sv4 is the same as or different from each other.

According to another exemplary embodiment, i4 is 0 or 1.

According to an exemplary embodiment of the present invention, i5 is an integer from 0 to 7, and when i5 is 2 or higher, each Sv5 is the same as or different from each other.

According to another exemplary embodiment, i5 is 0 or 1.

According to an exemplary embodiment of the present invention, L5 and L6 are the same as or different from each other, and are each independently a direct bond; or a substituted or unsubstituted arylene group having 6 to 60 carbon atoms.

According to another exemplary embodiment, L5 and L6 are the same as or different from each other, and are each independently a direct bond; or a substituted or unsubstituted phenylene group.

According to an exemplary embodiment of the present invention, L5 and L6 are the same as or different from each other, and are each independently a direct bond; or a phenylene group.

According to another exemplary embodiment, L5 and L6 are each a direct bond.

According to still another exemplary embodiment, L5 and L6 are each a phenylene group.

According to an exemplary embodiment of the present invention, n5 is an integer from 0 to 2, and when n5 is 2, each L5 is the same as or different from each other.

According to an exemplary embodiment of the present invention, n6 is an integer from 0 to 2, and when n6 is 2, each L6 is the same as or different from each other.

According to an exemplary embodiment of the present invention, R1 to R4 are the same as or different from each other, and are each independently hydrogen; deuterium; a substituted or unsubstituted alkyl group having 1 to 20 carbon atoms; a substituted or unsubstituted alkoxy group having 1 to 20 carbon atoms; a substituted or unsubstituted aryl group having 6 to 30 carbon atoms; or a substituted or unsubstituted heteroaryl group having 2 to 30 carbon atoms.

According to an exemplary embodiment of the present invention, R1 to R4 are the same as or different from each other, and are each independently hydrogen; deuterium; a substituted or unsubstituted alkyl group having 1 to 20 carbon atoms; or a substituted or unsubstituted aryl group having 6 to 30 carbon atoms.

According to an exemplary embodiment of the present invention, n1 is an integer from 0 to 4, and when n1 is 2 or higher, each R1 is the same as or different from each other.

In another exemplary embodiment, n1 is 0 or 1.

According to an exemplary embodiment of the present invention, n2 is an integer from 0 to 4, and when n2 is 2 or higher, each R2 is the same as or different from each other.

In still another exemplary embodiment, n2 is 0 or 1.

According to an exemplary embodiment of the present invention, n3 is an integer from 0 to 4, and when n3 is 2 or higher, each R3 is the same as or different from each other.

In yet another exemplary embodiment, n3 is 0 or 1.

According to an exemplary embodiment of the present invention, n4 is an integer from 0 to 4, and when n4 is 2 or higher, each R4 is the same as or different from each other.

In still yet another exemplary embodiment, n4 is 0 or 1.

According to an exemplary embodiment of the present invention, Az1 and Az2 are the same as or different from each other, and are each independently a substituted or unsubstituted aryl group having 6 to 60 carbon atoms; or a substituted or unsubstituted heteroaryl group having 2 to 60 carbon atoms.

According to another exemplary embodiment, Az1 and Az2 are the same as or different from each other, and are each independently an aryl group having 6 to 60 carbon atoms, which is unsubstituted or substituted with an alkyl group having 1 to 20 carbon atoms.

According to still another exemplary embodiment, Az1 and Az2 are the same as or different from each other, and are each independently a phenyl group which is unsubstituted or substituted with an alkyl group having 1 to 20 carbon atoms; a biphenyl group which is unsubstituted or substituted with an alkyl group having 1 to 20 carbon atoms; or a terphenyl group which is unsubstituted or substituted with an alkyl group having 1 to 20 carbon atoms.

According to yet another exemplary embodiment, Az1 and Az2 are the same as or different from each other, and are each independently a phenyl group which is unsubstituted or substituted with one or more substituents of a methyl group, an ethyl group, a propyl group, and a butyl group; a biphenyl group which is unsubstituted or substituted with one or more substituents of a methyl group, an ethyl group, a propyl group, and a butyl group; or a terphenyl group which is unsubstituted or substituted with one or more substituents of a methyl group, an ethyl group, a propyl group, and a butyl group.

According to an exemplary embodiment of the present invention, m1 is an integer from 1 to 3.

According to an exemplary embodiment of the present invention, m1 is 1 or 2.

According to an exemplary embodiment of the present invention, m2 is an integer from 1 to 3.

According to an exemplary embodiment of the present invention, m2 is 1 or 2.

According to another exemplary embodiment, -Az1-$(F)_{m1}$ and -Az2-$(F)_{m2}$ are the same as or different from each other, and are each independently represented by any one of the following Chemical Formulae 101 to 103.

[Chemical Formula 101]

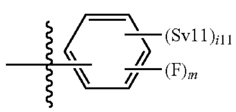

[Chemical Formula 102]

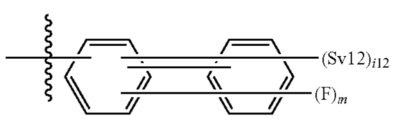

[Chemical Formula 103]

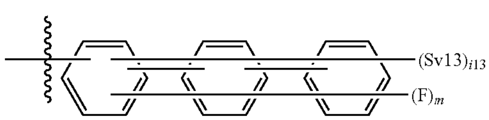

In Chemical Formulae 101 to 103,

Sv11 to Sv13 are the same as or different from each other, and are each independently hydrogen; or a substituted or unsubstituted alkyl group, m is an integer from 1 to 5, i11 is an integer from 0 to 4, and when i11 is 2 or higher, each Sv11 is the same as or different from each other, i12 is an integer from 0 to 8, and when i12 is 2 or higher, each Sv12 is the same as or different from each other, and i13 is an integer from 0 to 12, and when i13 is 2 or higher, each Sv13 is the same as or different from each other.

According to an exemplary embodiment of the present invention, Sv11 to Sv13 are the same as or different from each other, and are each independently hydrogen; or a substituted or unsubstituted alkyl group having 1 to 20 carbon atoms.

According to another exemplary embodiment, Sv11 to Sv13 are the same as or different from each other, and are each independently hydrogen; a substituted or unsubstituted methyl group; a substituted or unsubstituted ethyl group; a substituted or unsubstituted propyl group; or a substituted or unsubstituted butyl group.

According to still another exemplary embodiment, Sv11 to Sv13 are the same as or different from each other, and are each independently hydrogen; a methyl group; an ethyl group; a propyl group; or a butyl group.

According to an exemplary embodiment of the present invention, m is 1 or 2.

According to an exemplary embodiment of the present invention, i11 is an integer from 0 to 2.

According to an exemplary embodiment of the present invention, i11 is 0 or 1.

According to an exemplary embodiment of the present invention, i12 is an integer from 0 to 2.

According to an exemplary embodiment of the present invention, i12 is 0 or 1.

According to an exemplary embodiment of the present invention, i13 is an integer from 0 to 2.

According to an exemplary embodiment of the present invention, i13 is 0 or 1.

In an exemplary embodiment of the present invention, the compound of Chemical Formula 1 is any one selected from the group consisting of the following compounds.

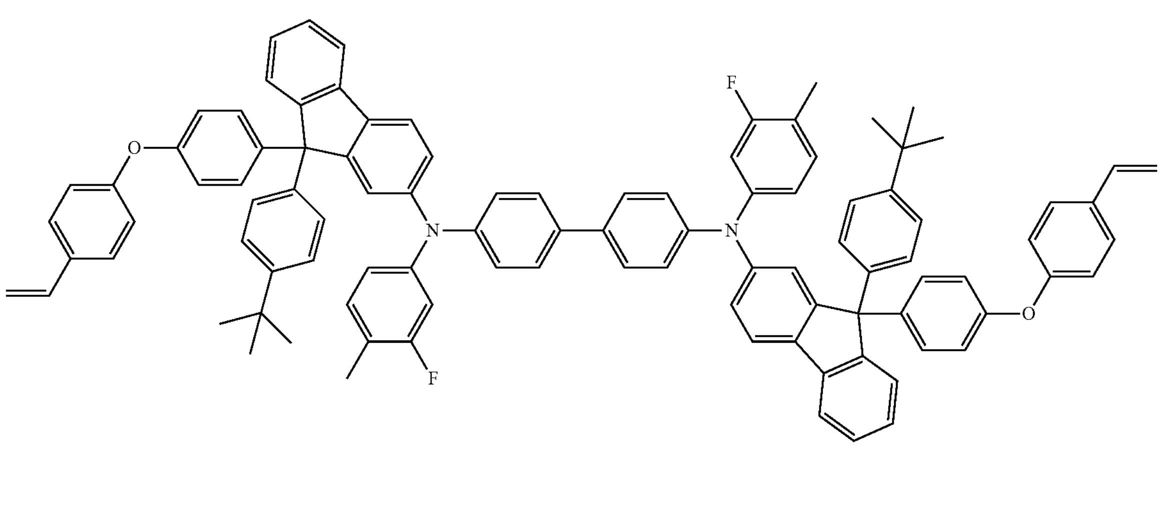

-continued
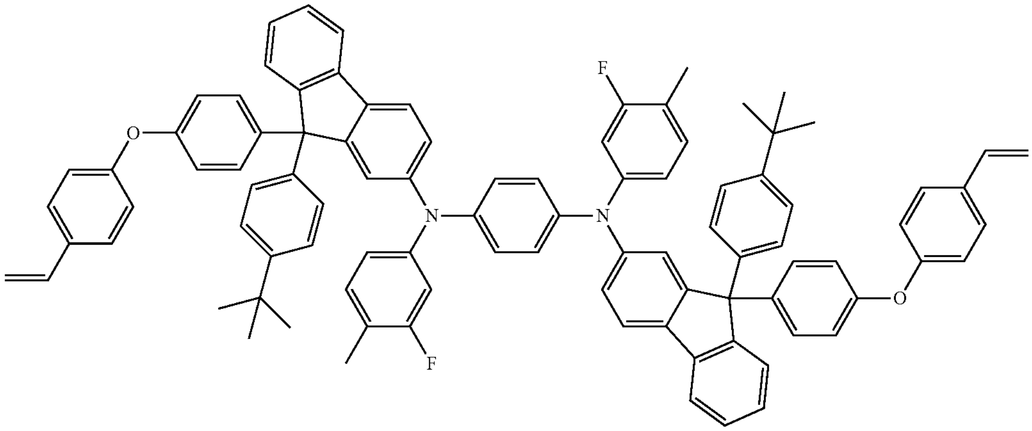
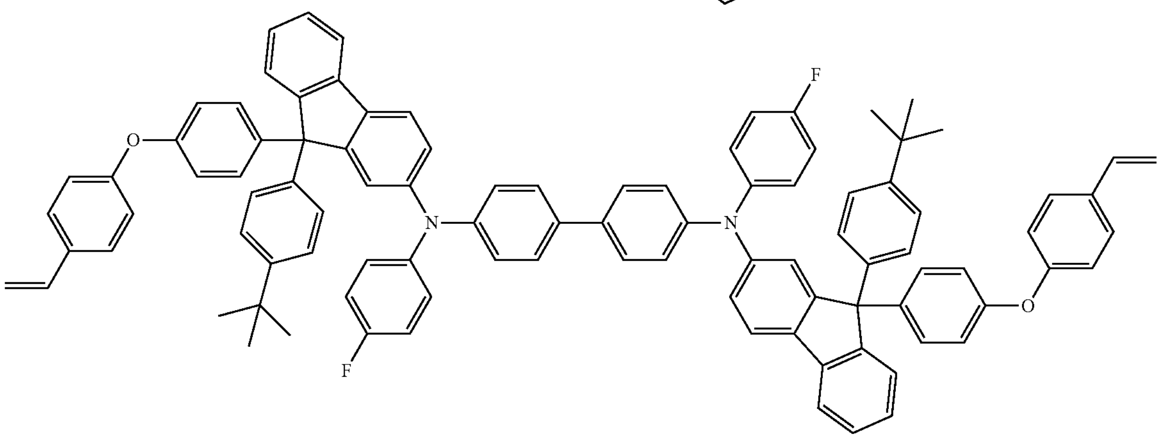
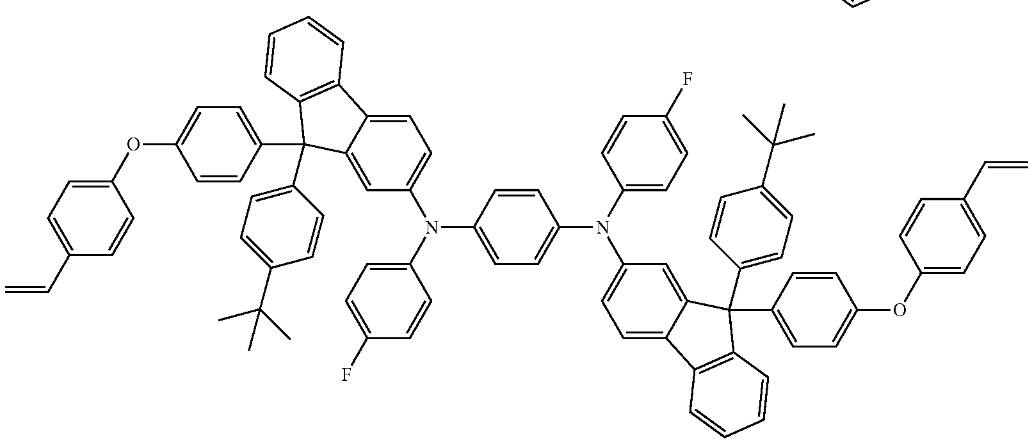
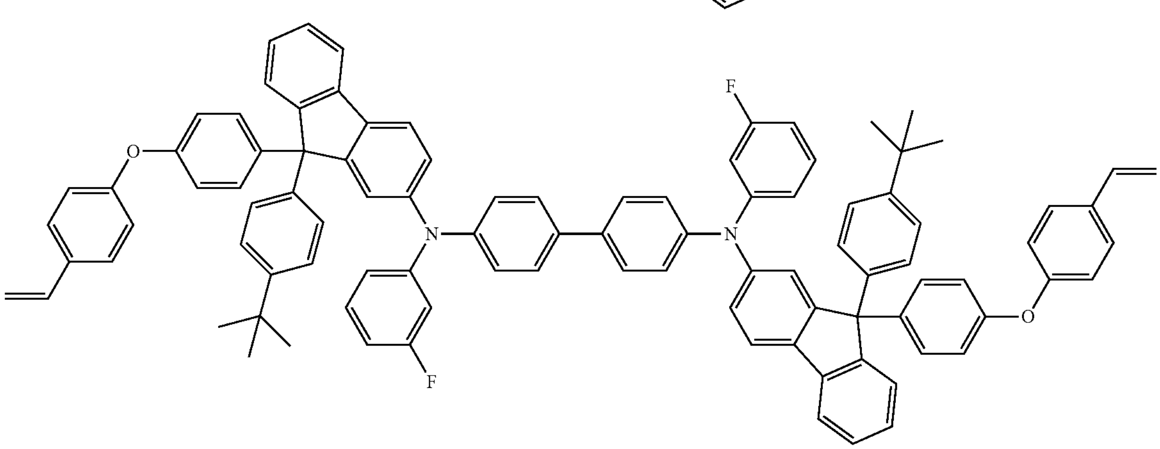

-continued
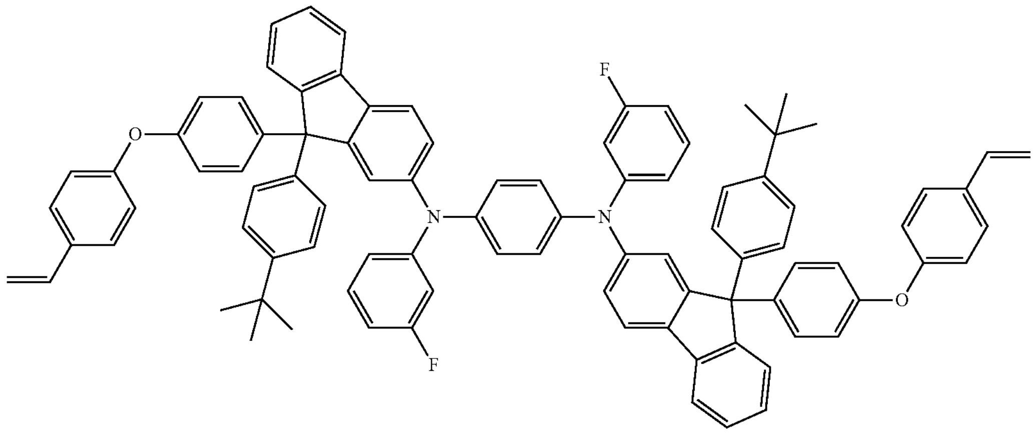
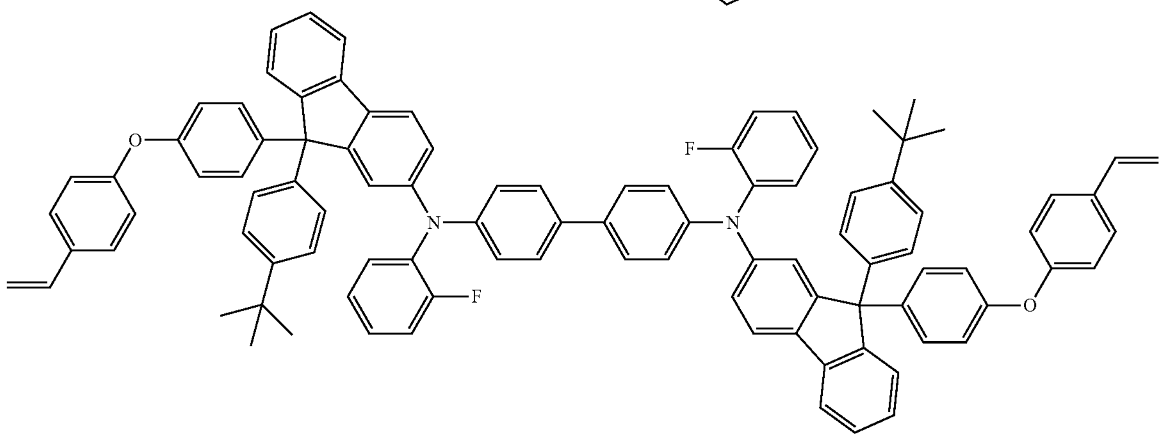
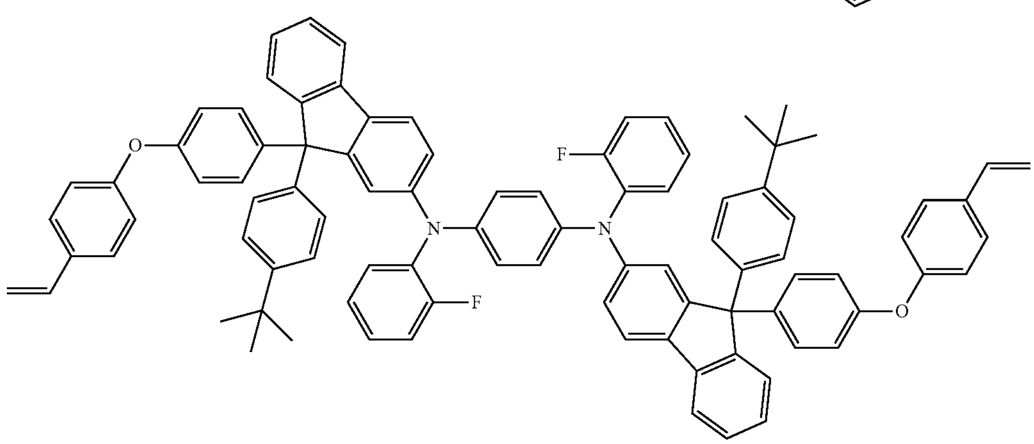
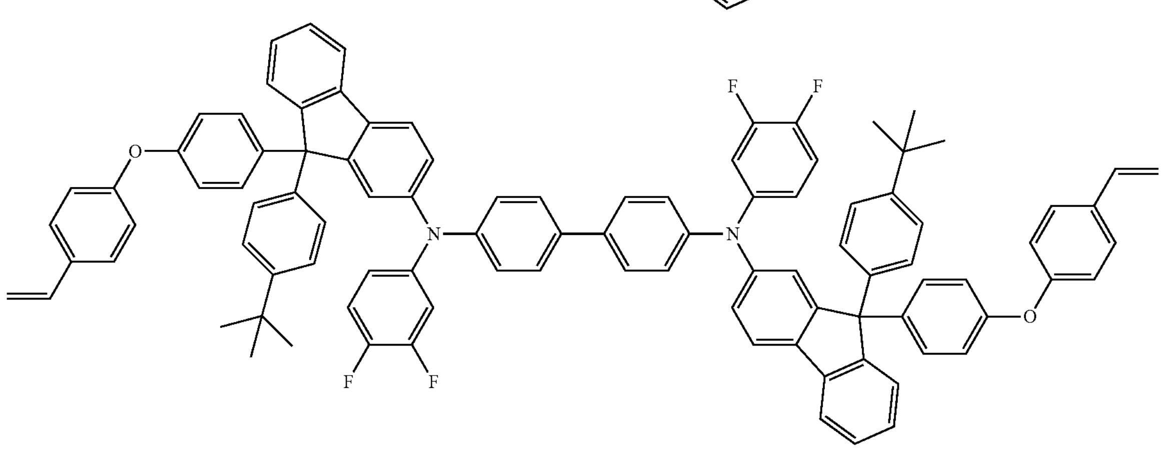

-continued
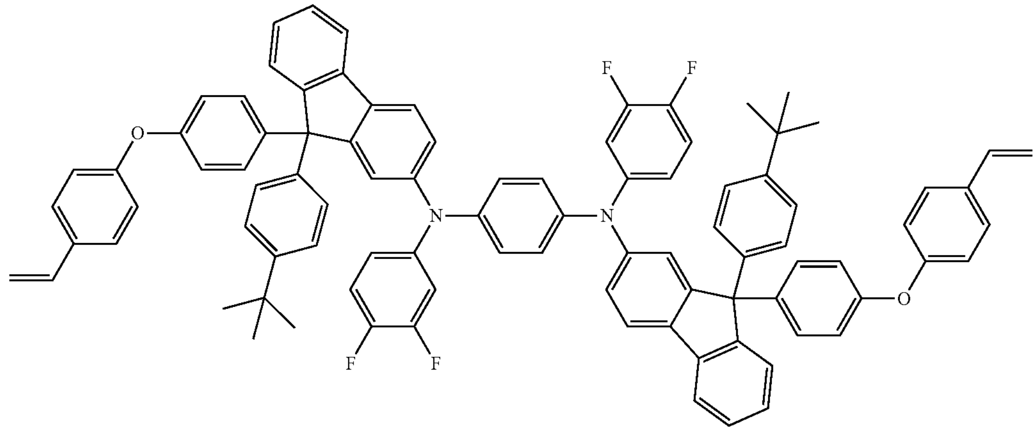
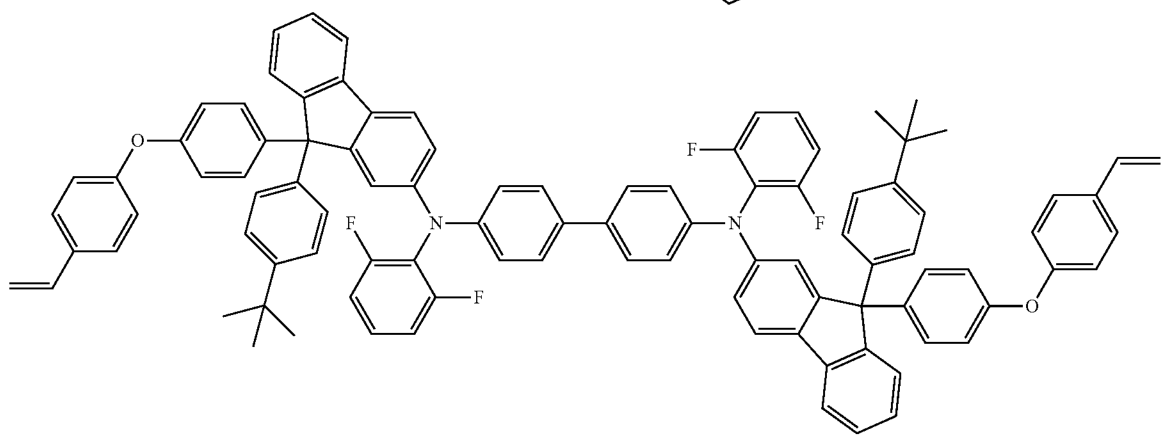
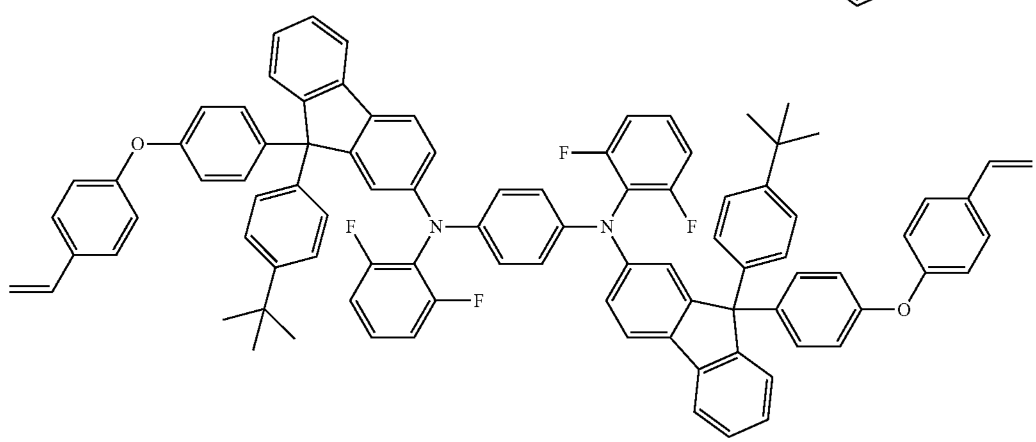
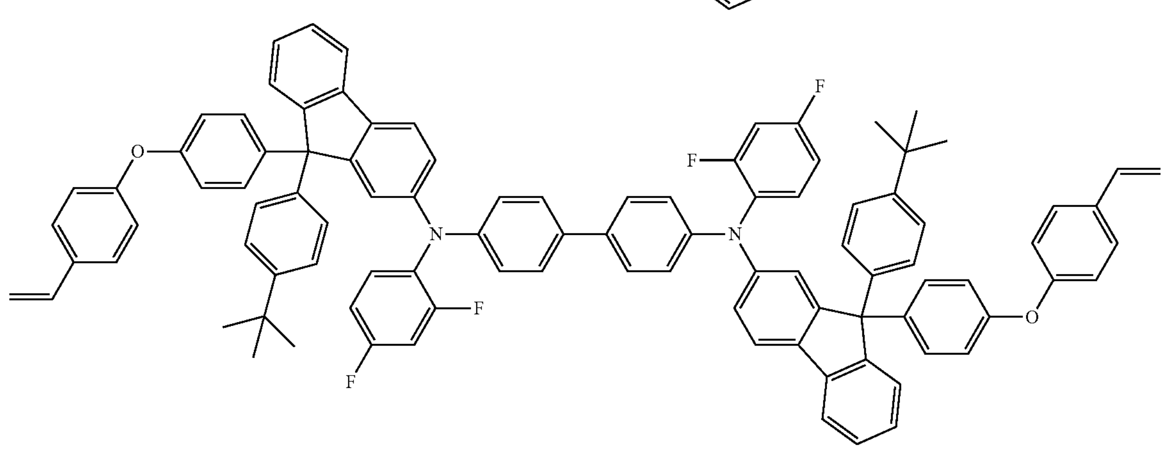

-continued
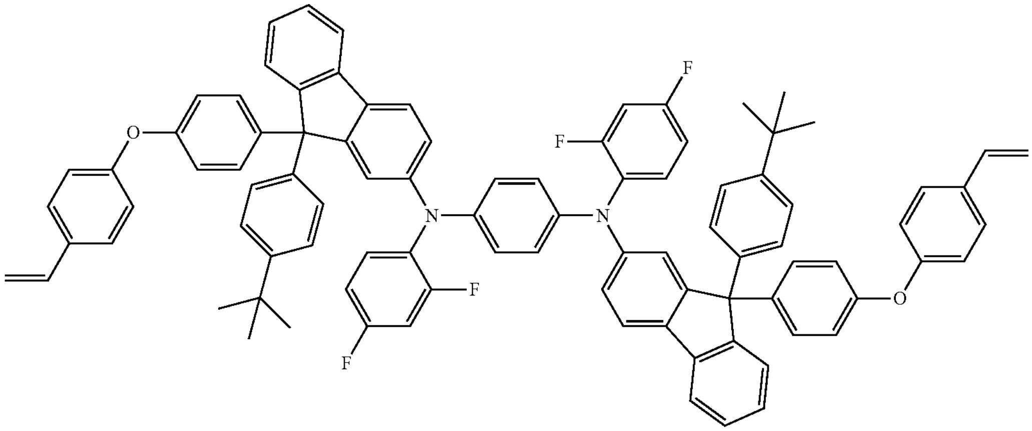
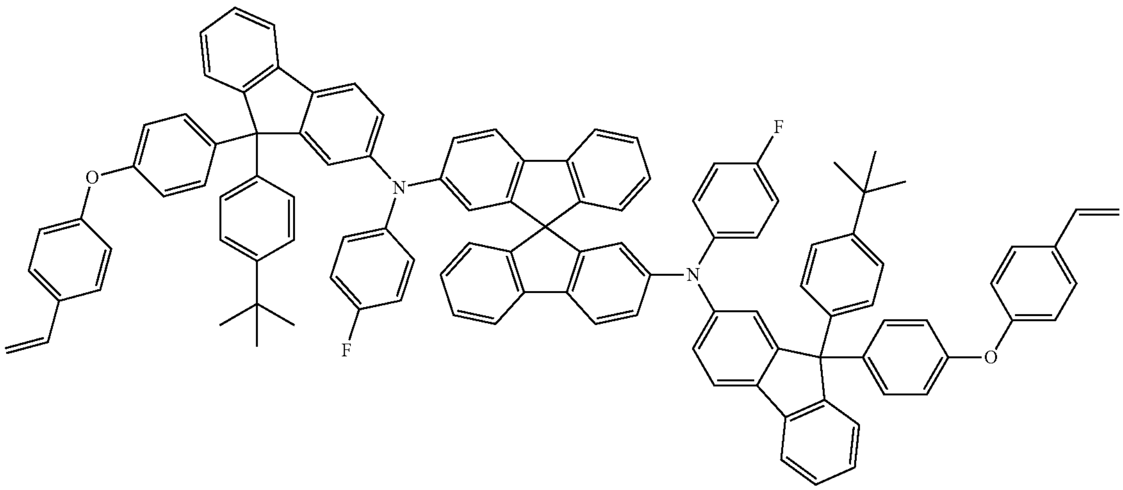
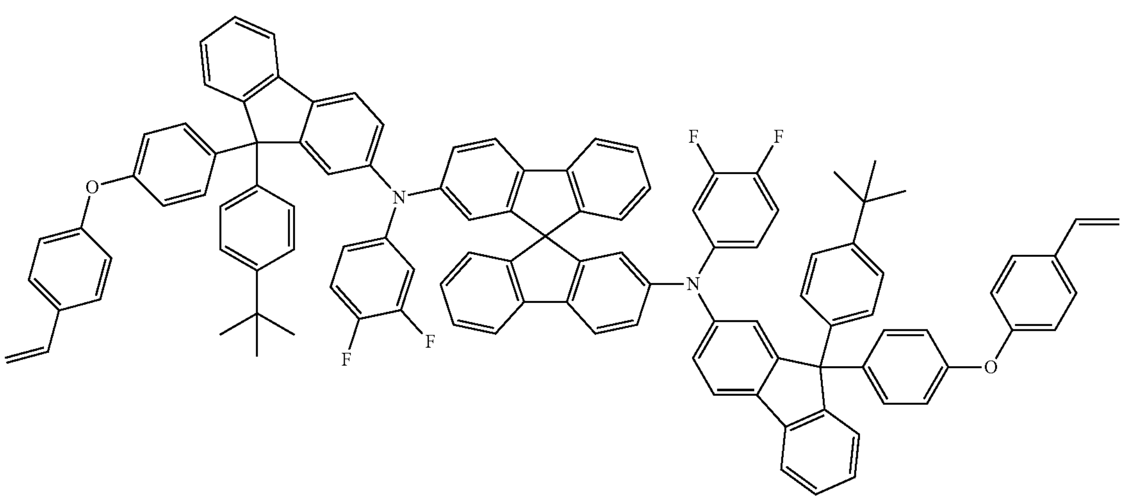

-continued
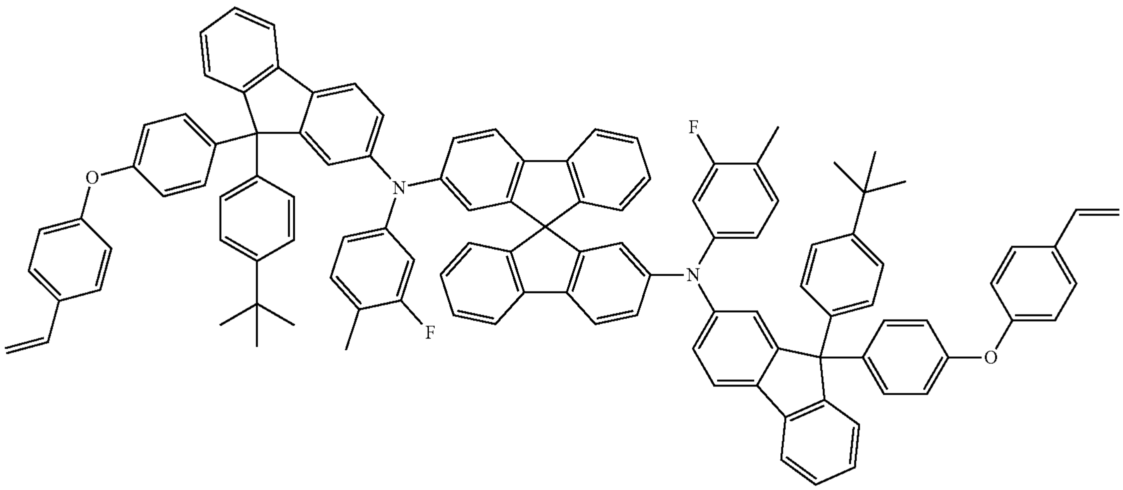
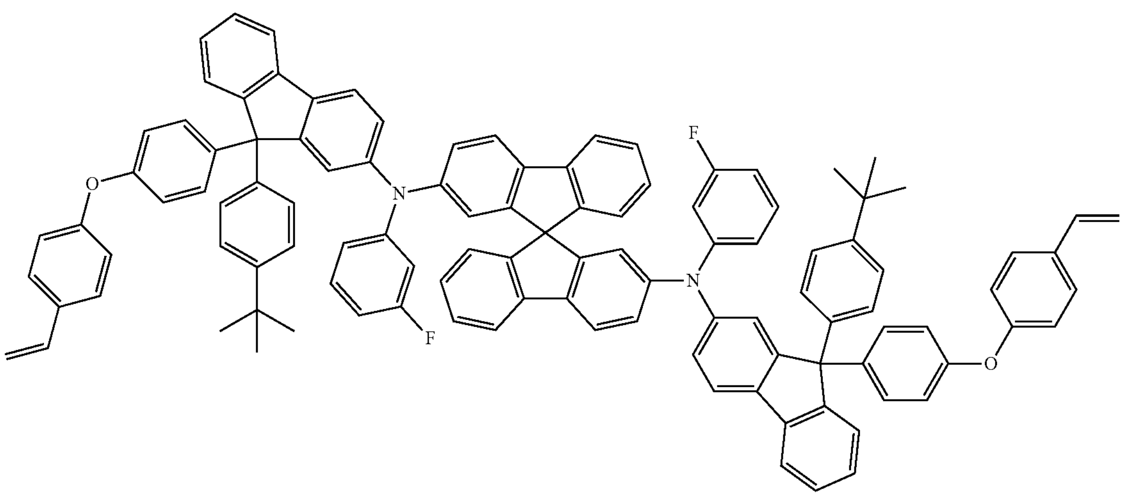
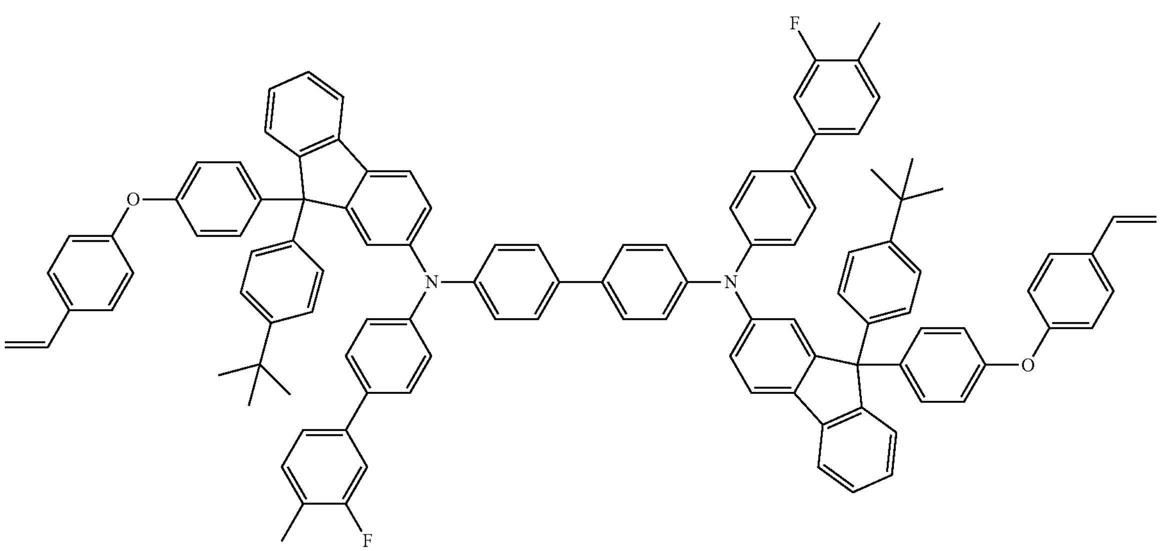

-continued
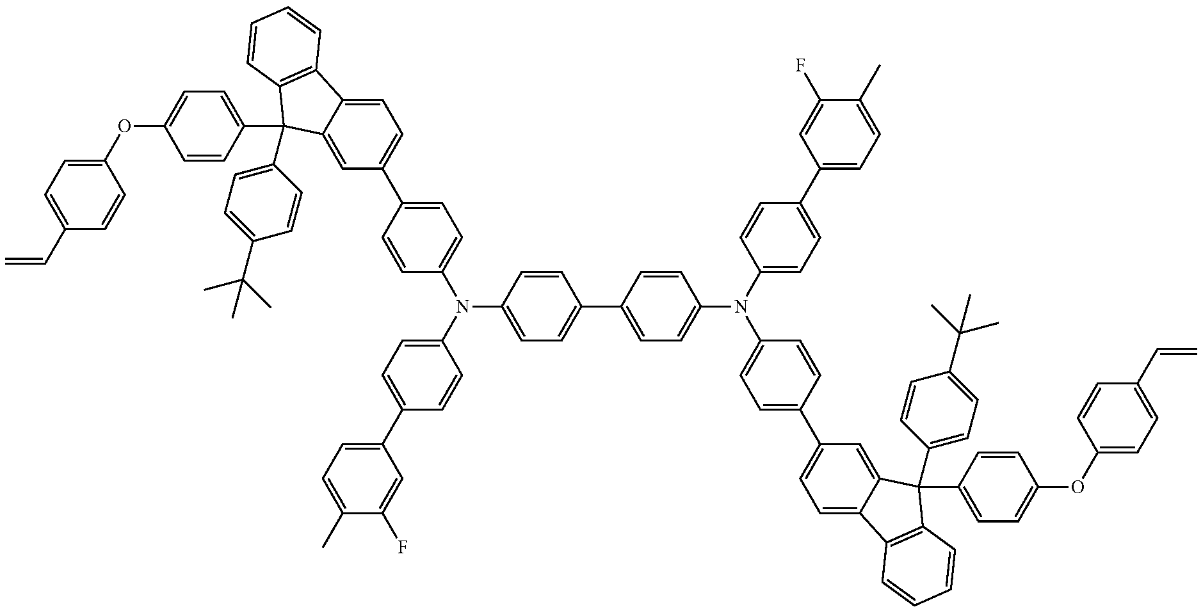
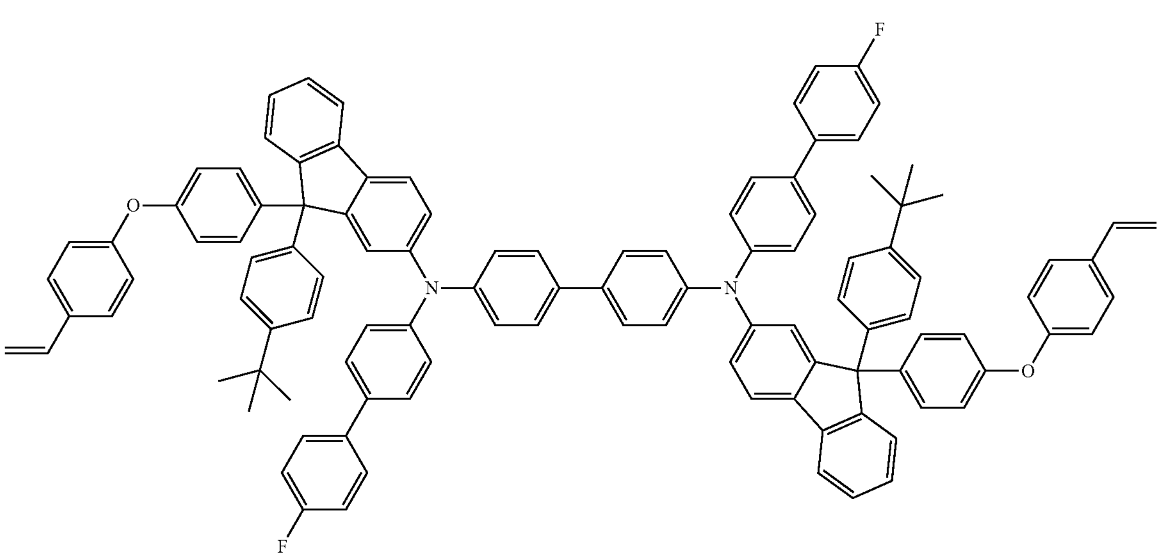

-continued
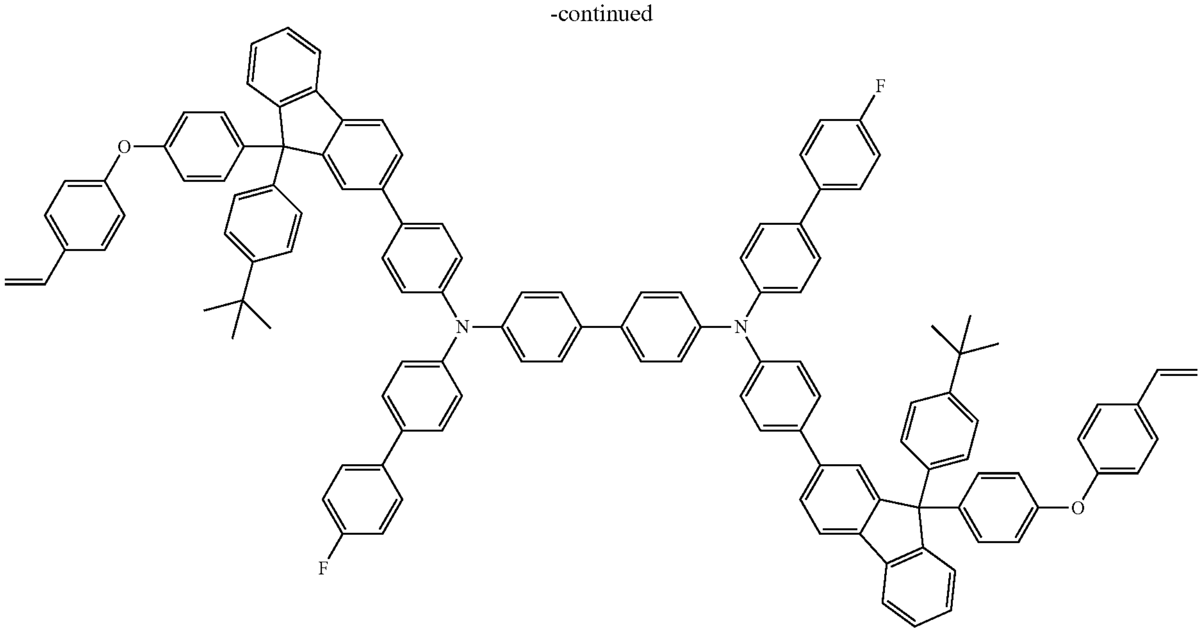
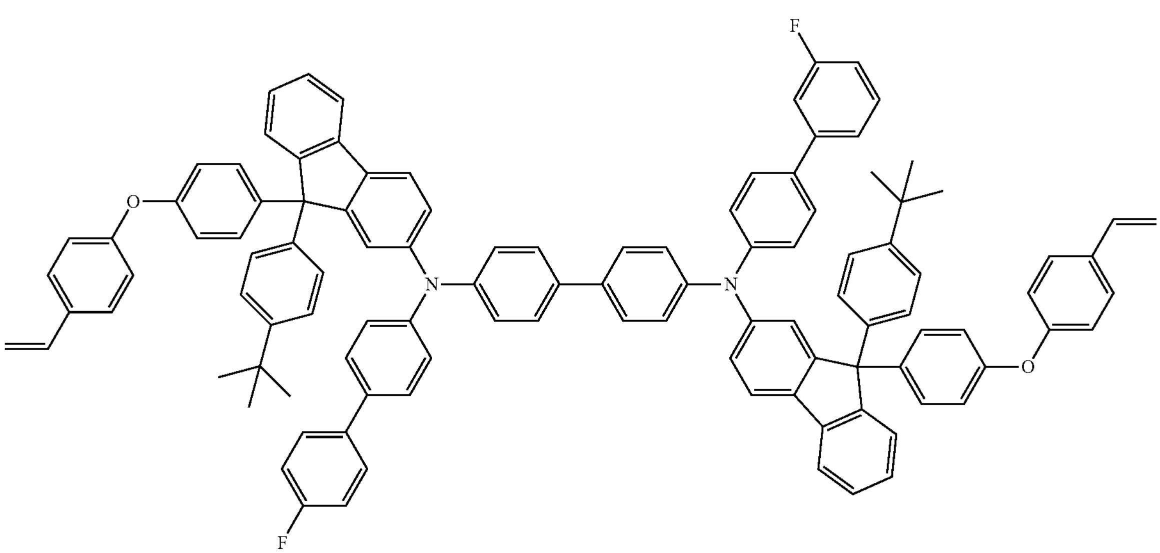

-continued
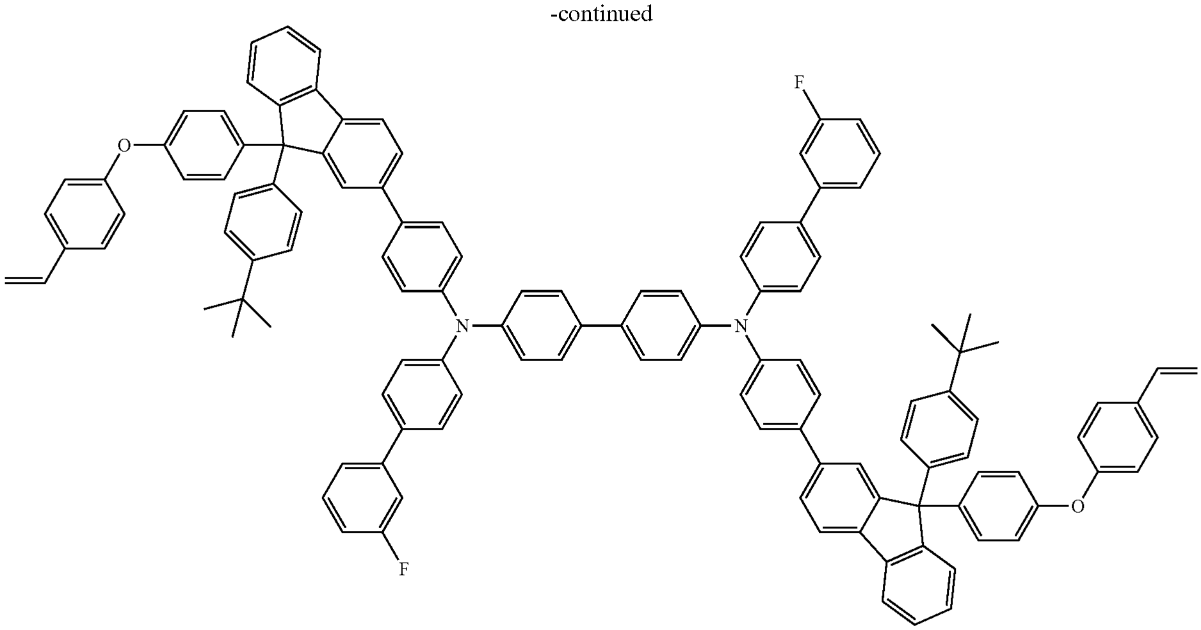
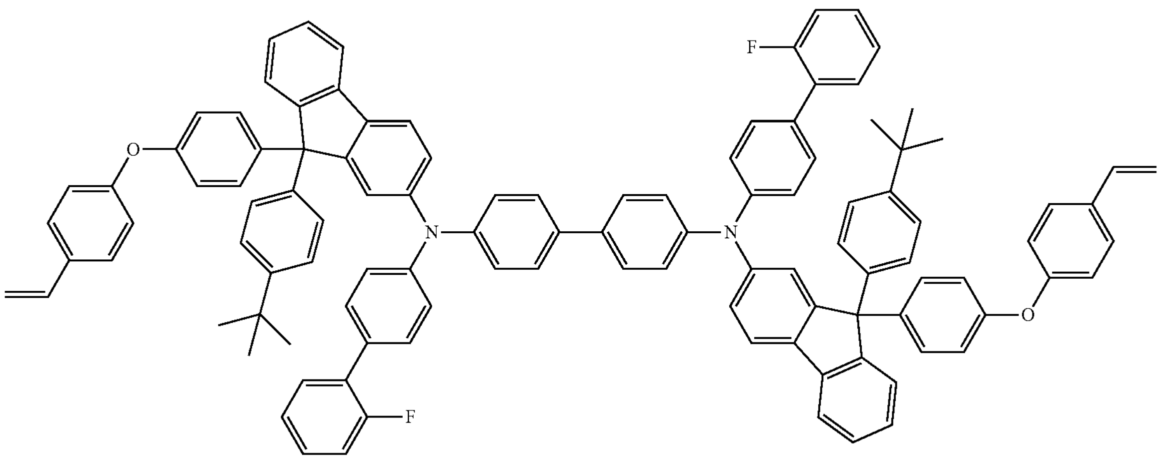
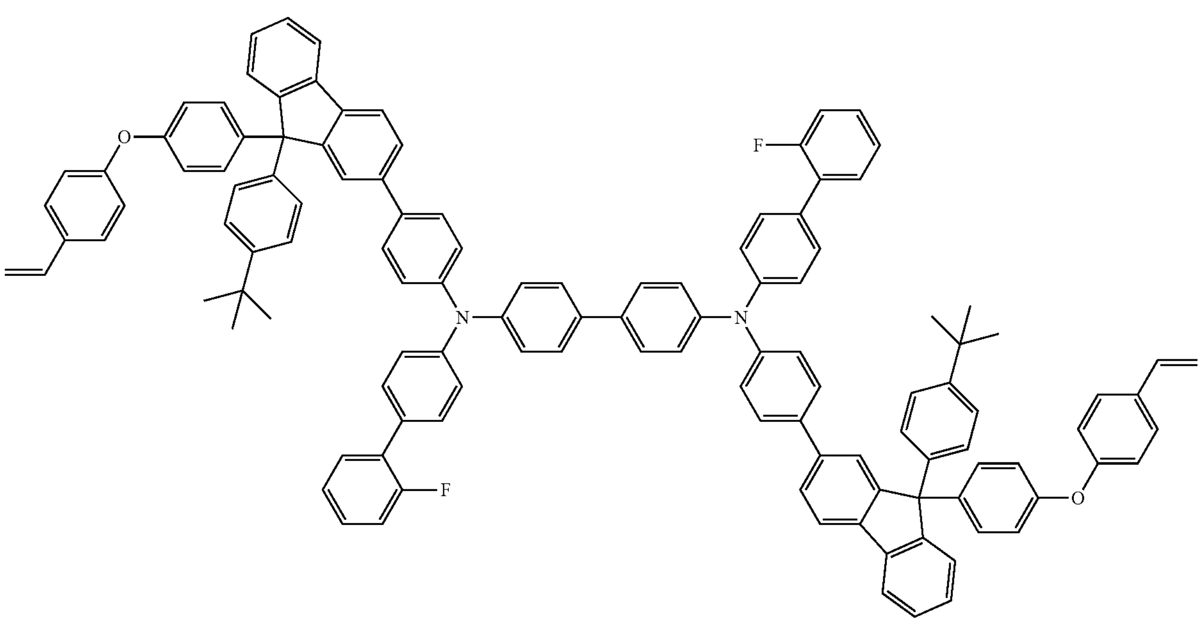

-continued
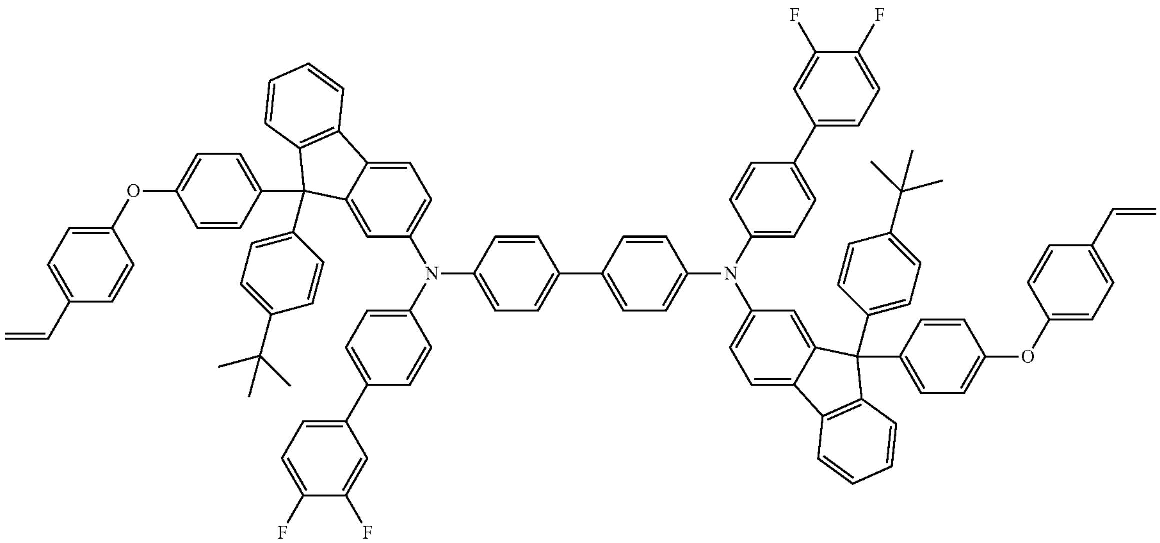
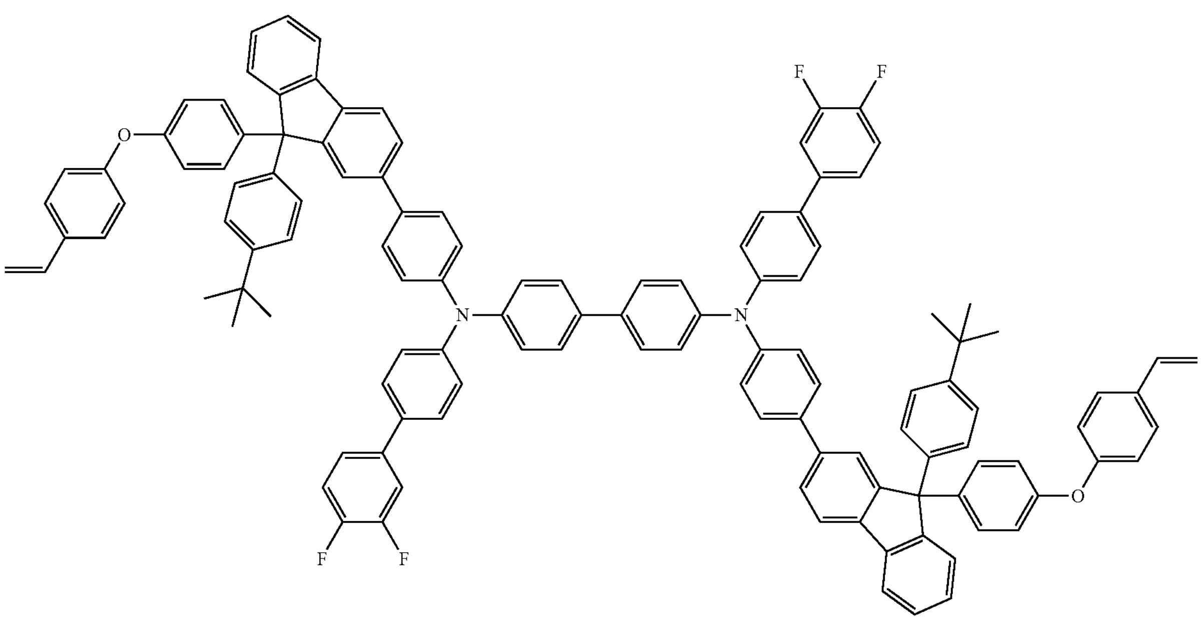
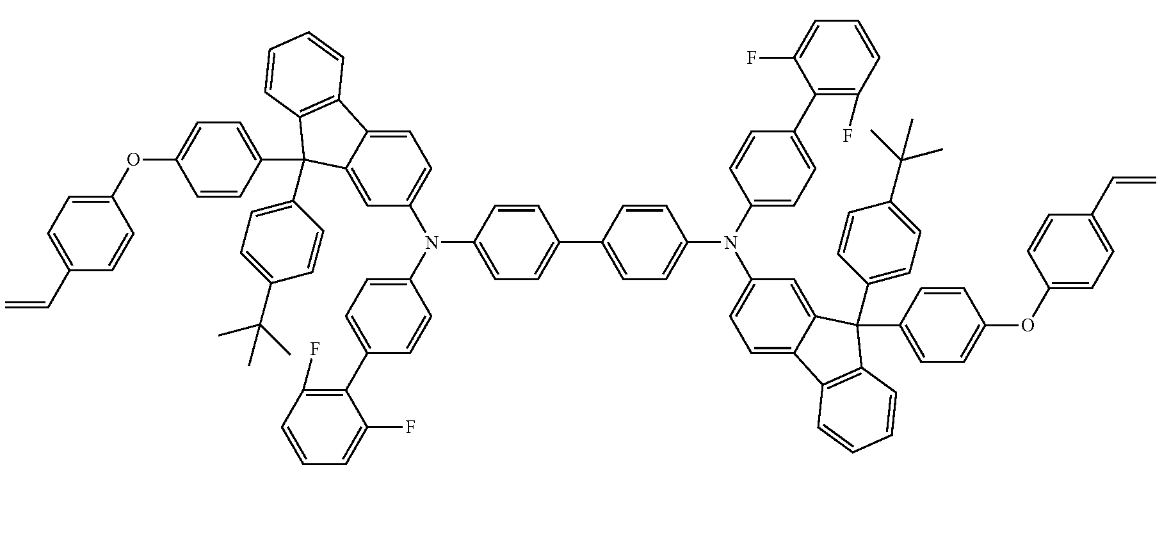

-continued
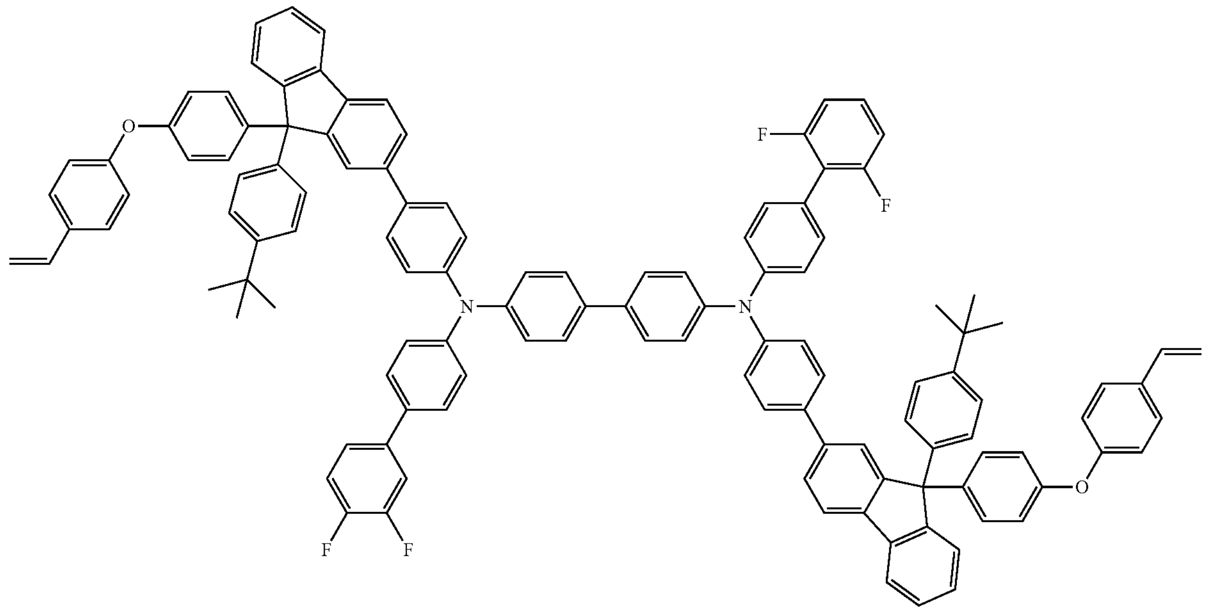
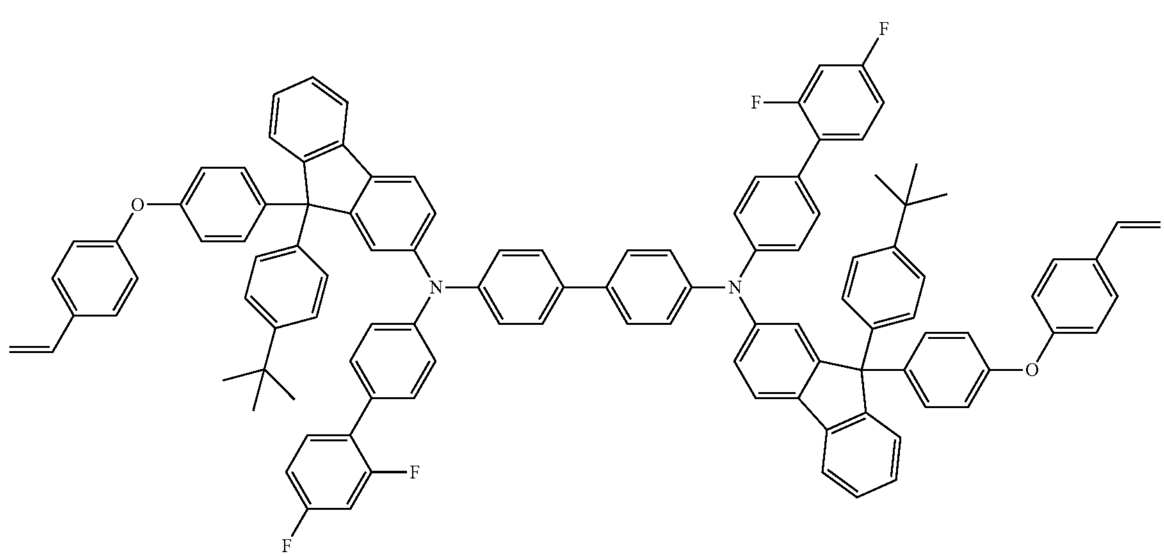

-continued
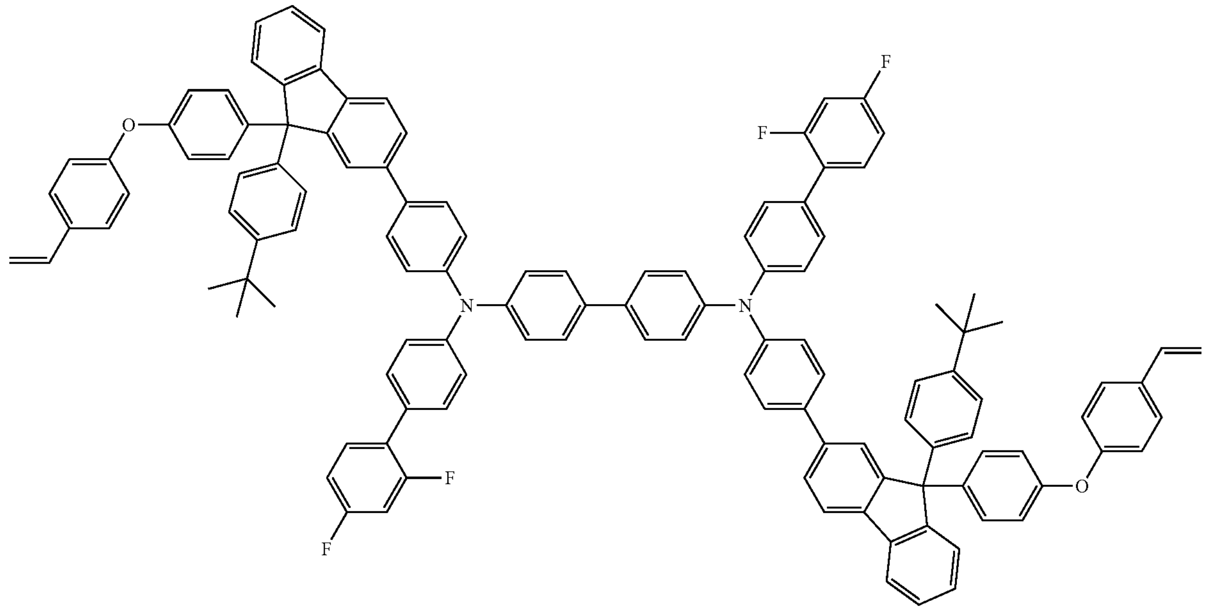
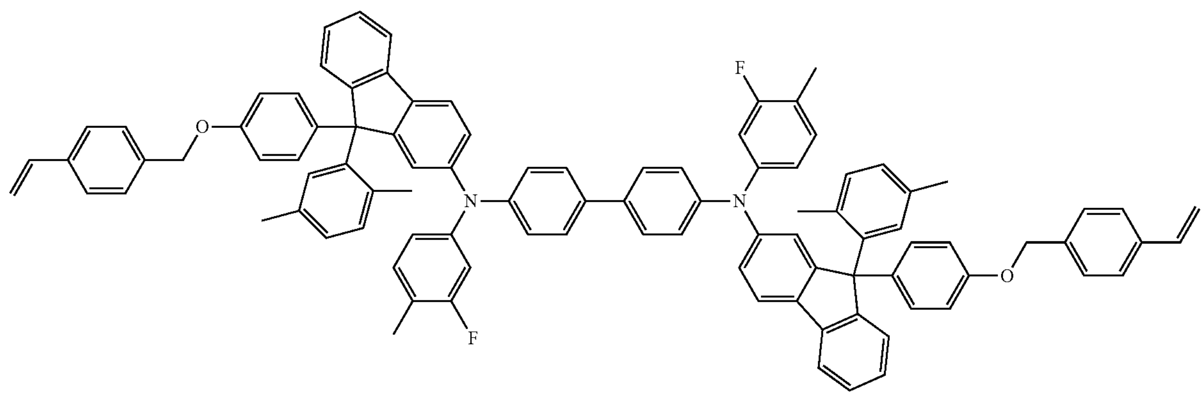
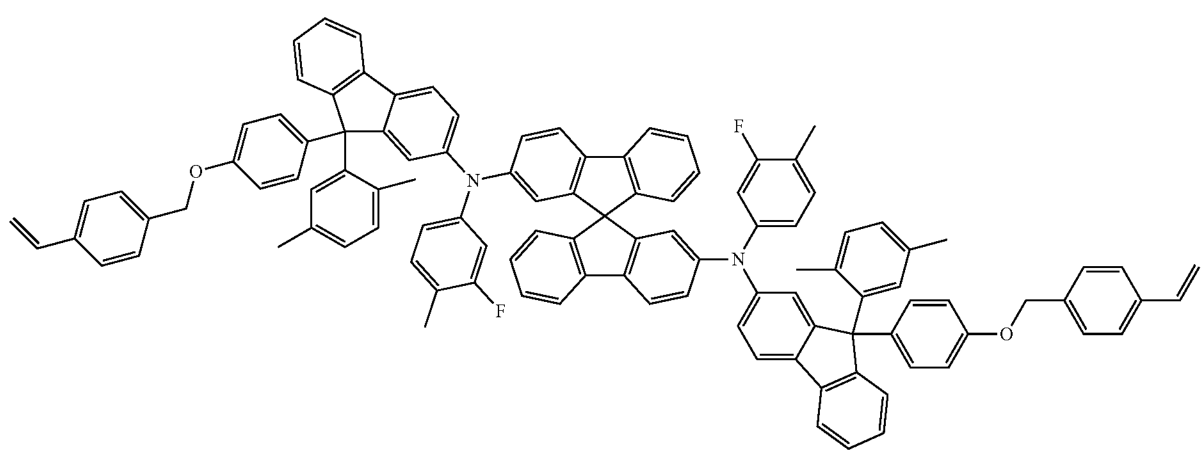

-continued
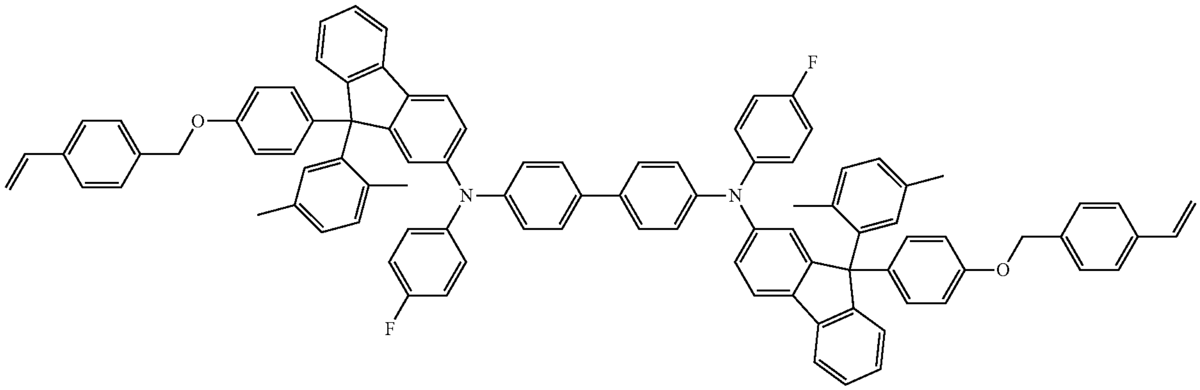
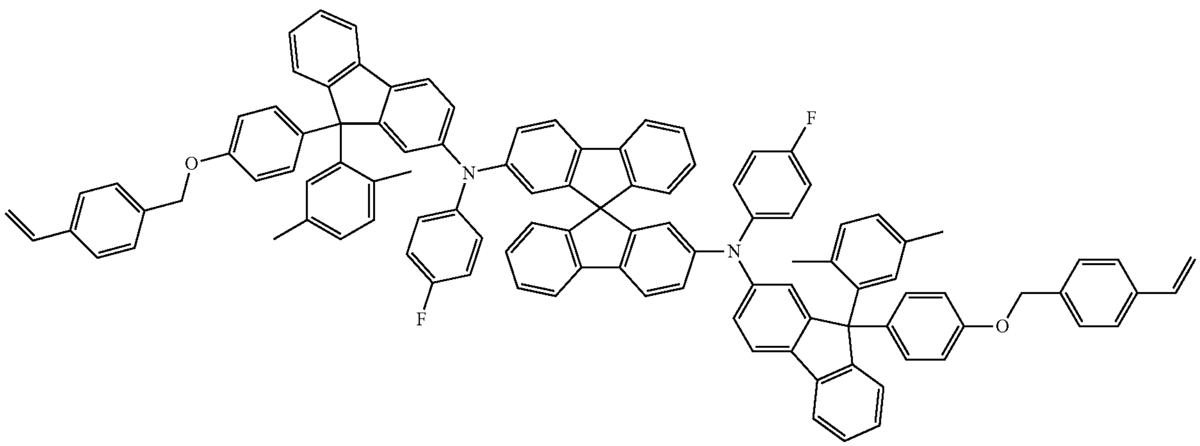
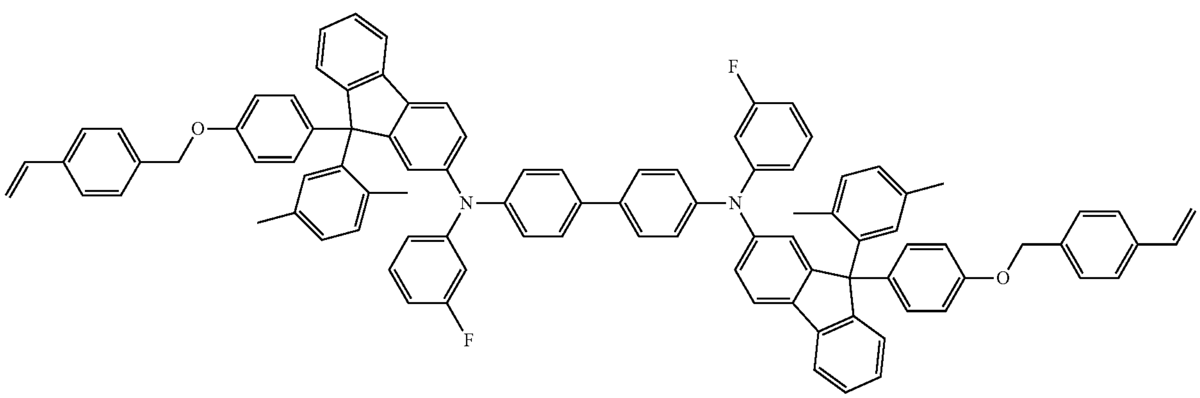
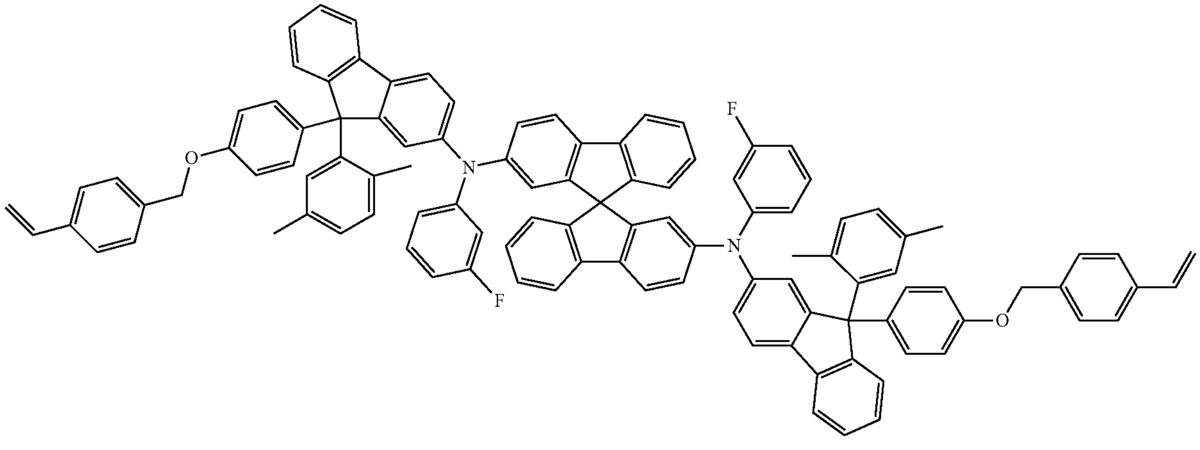

-continued
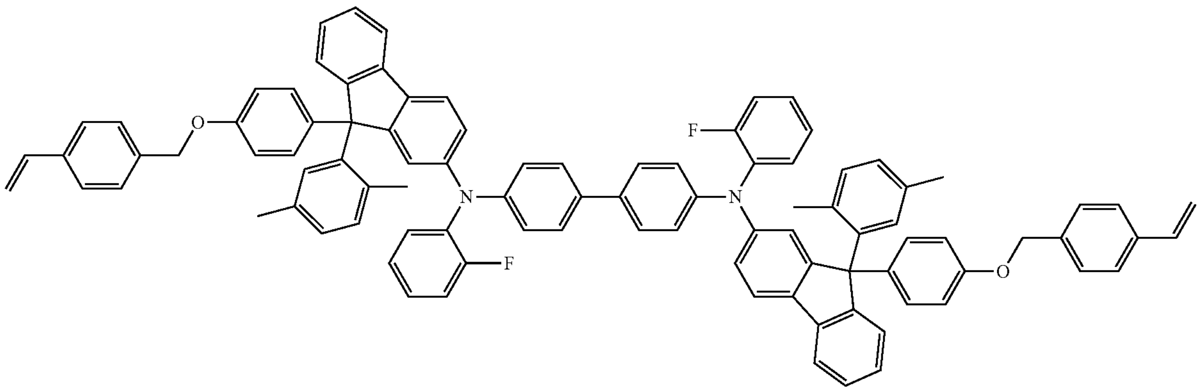
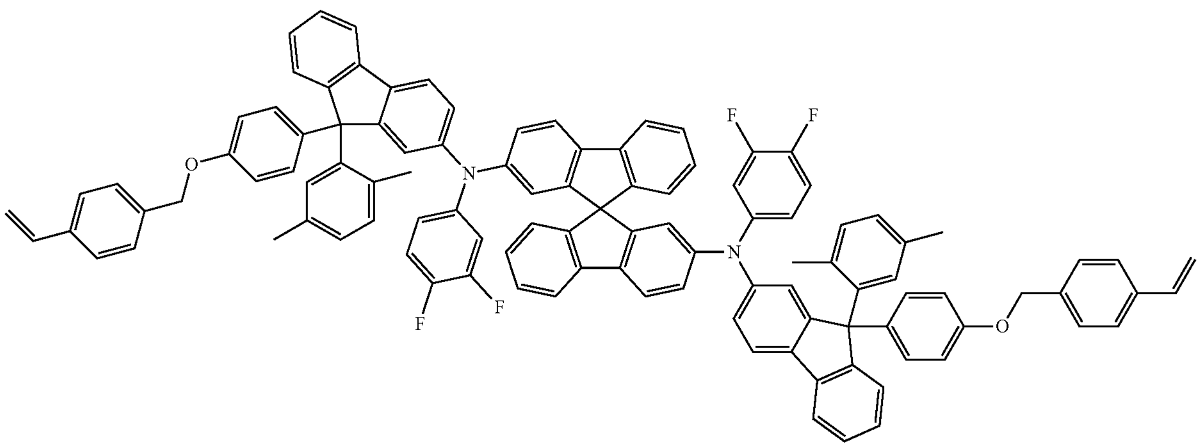
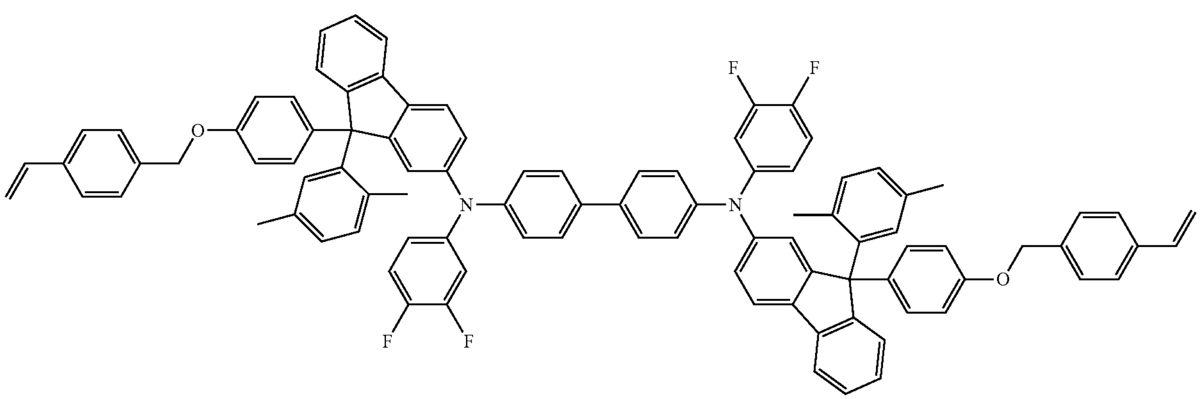
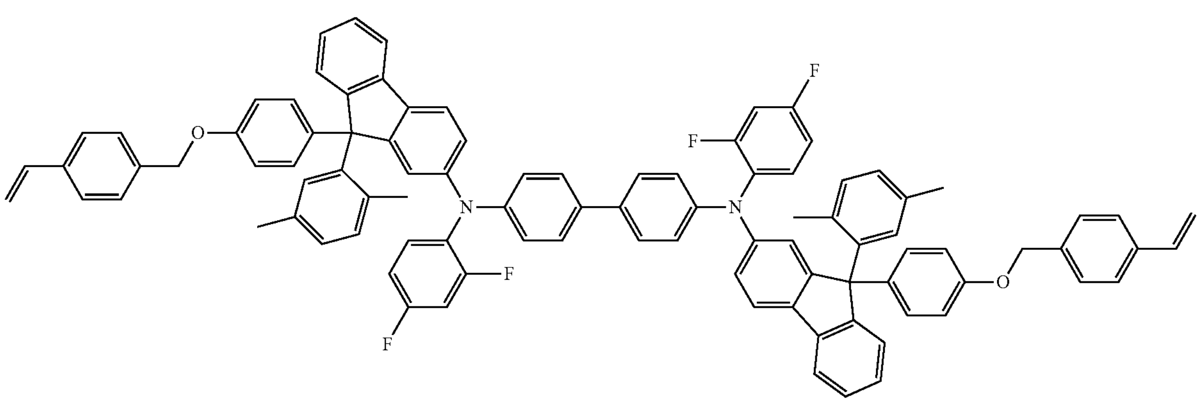

-continued
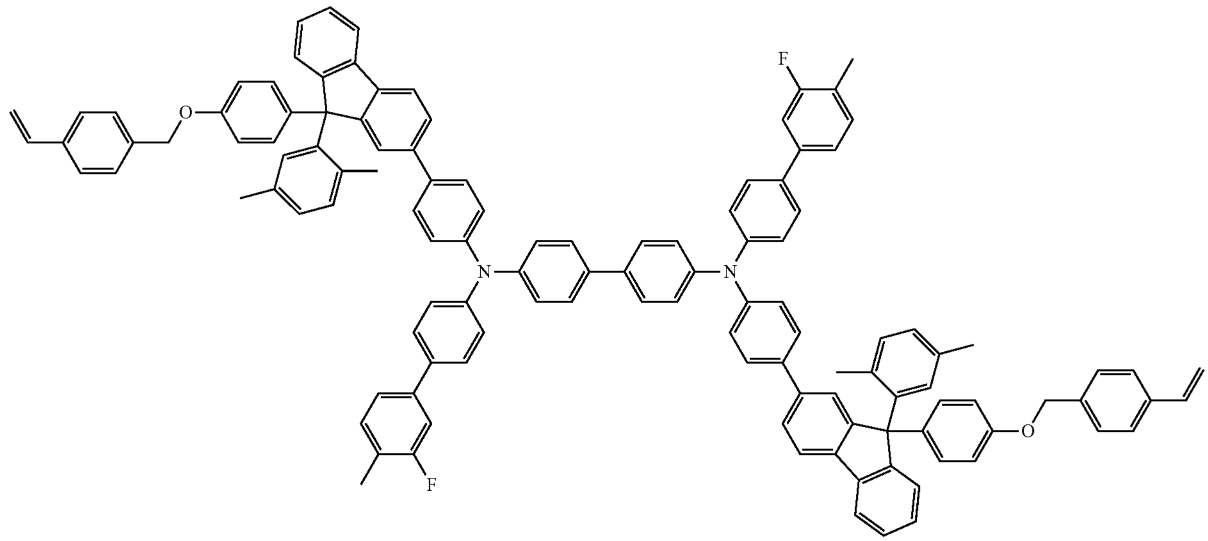
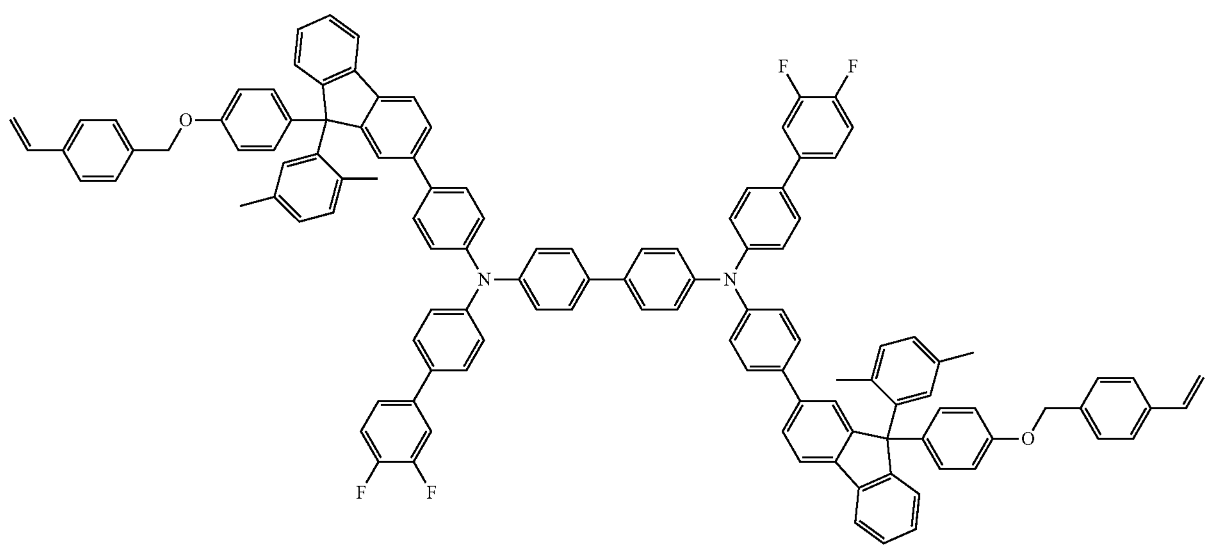
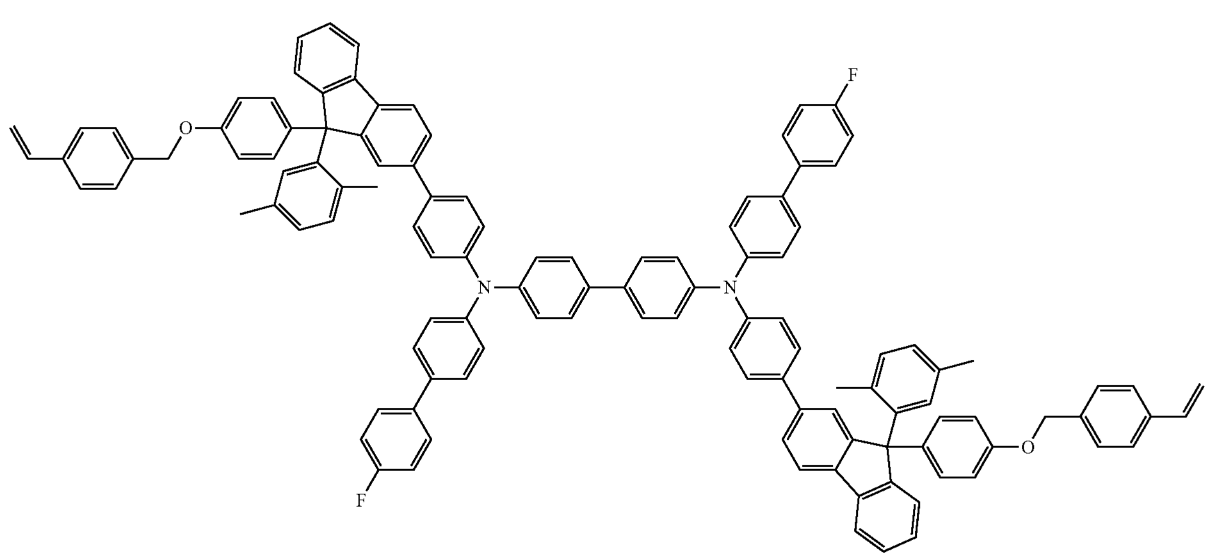

-continued
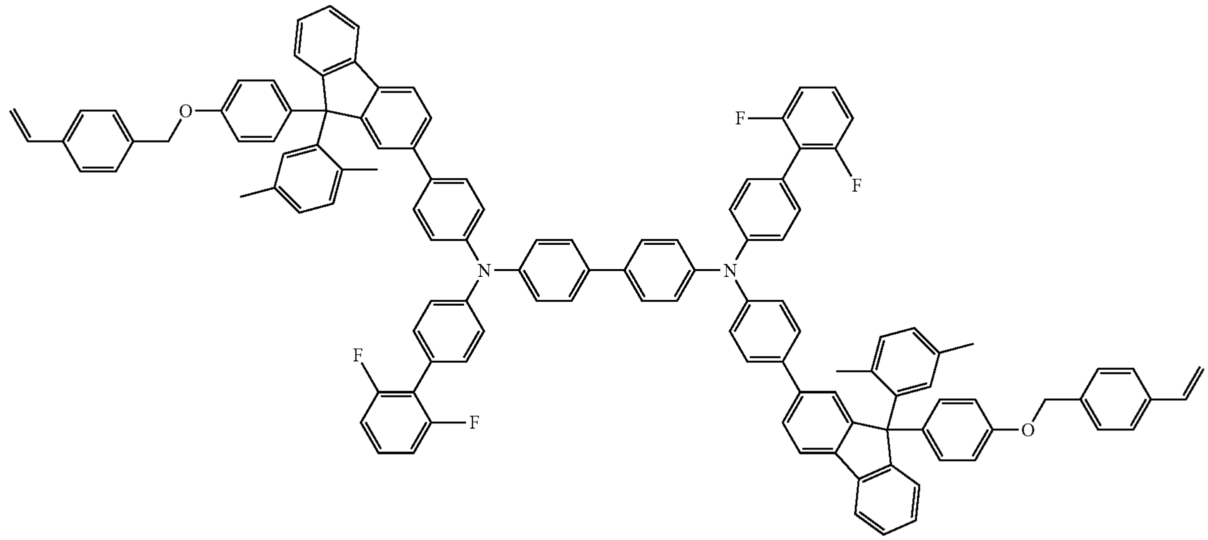
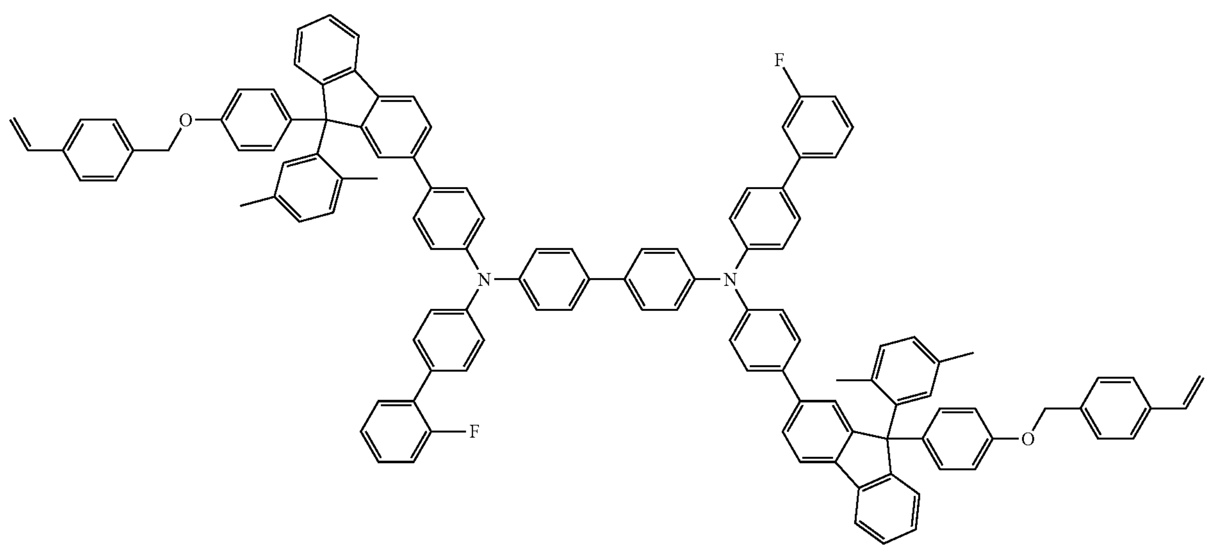
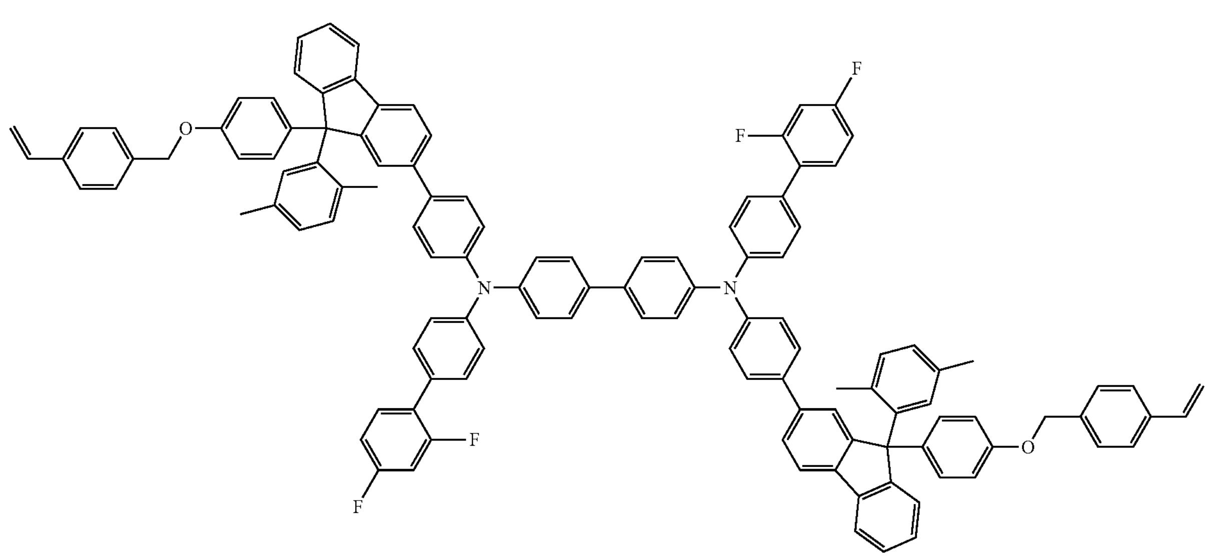

-continued
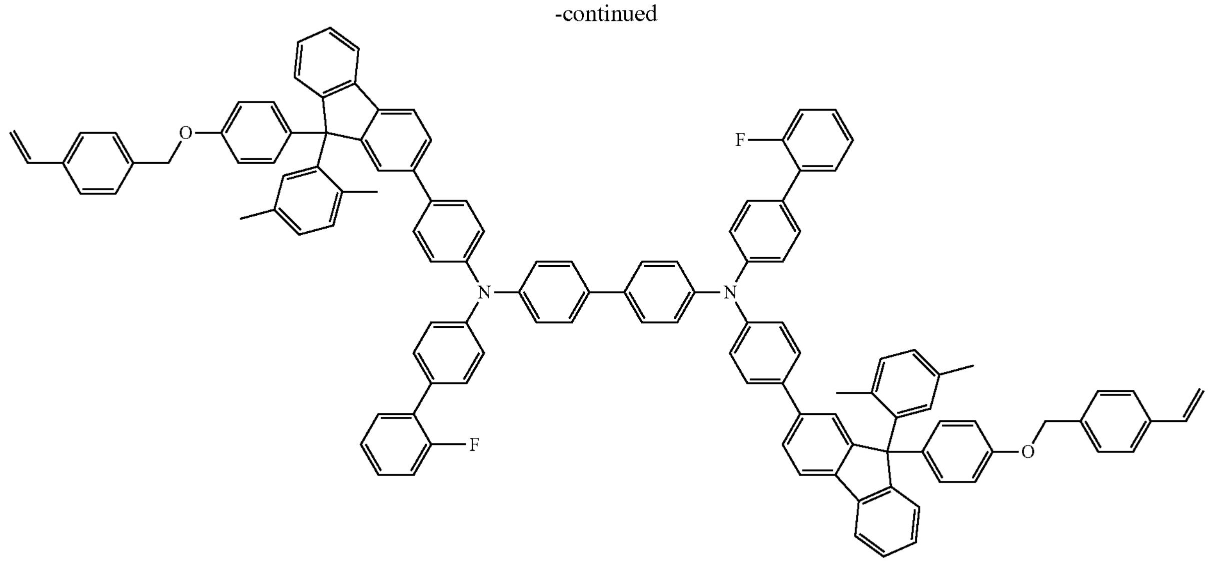
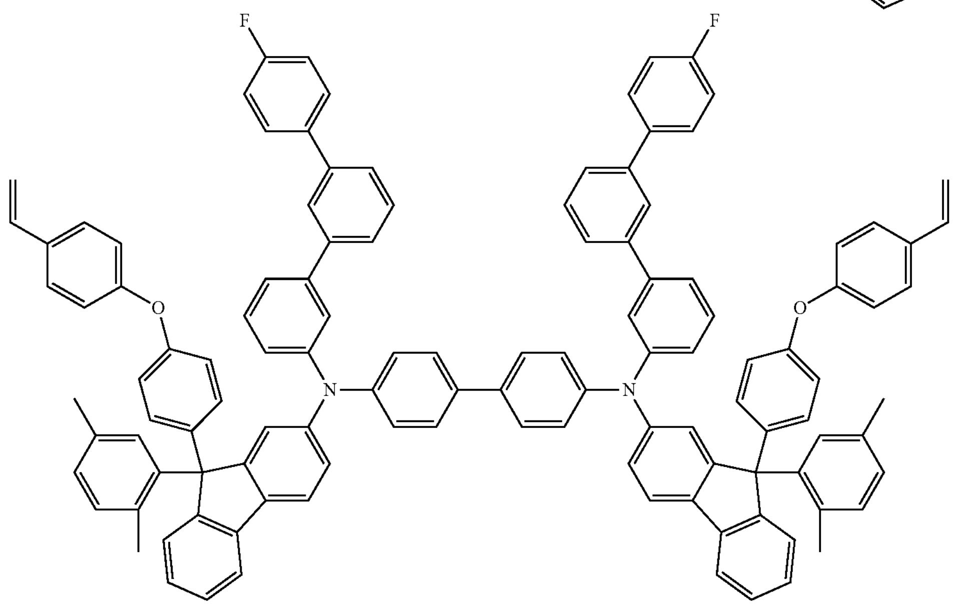
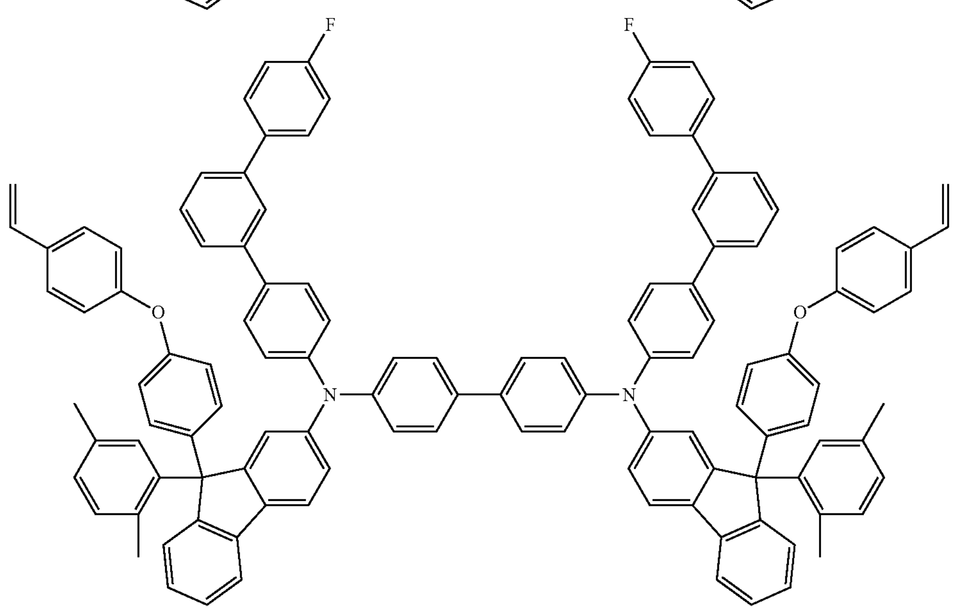

-continued
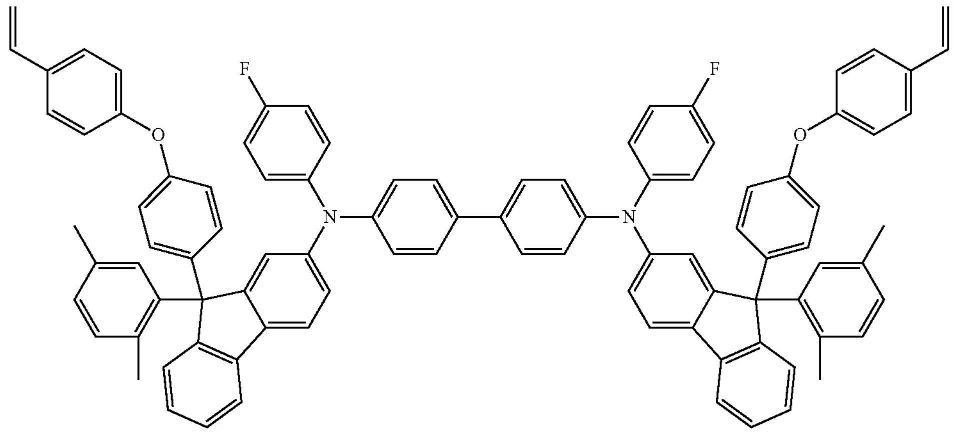
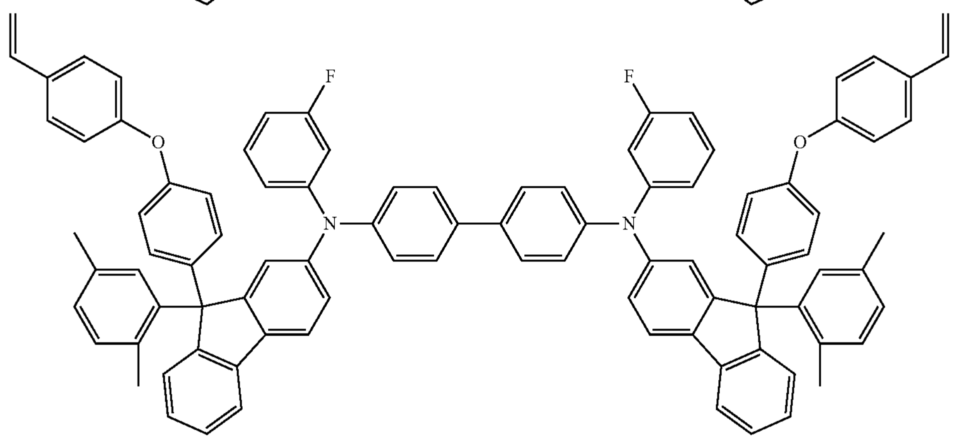
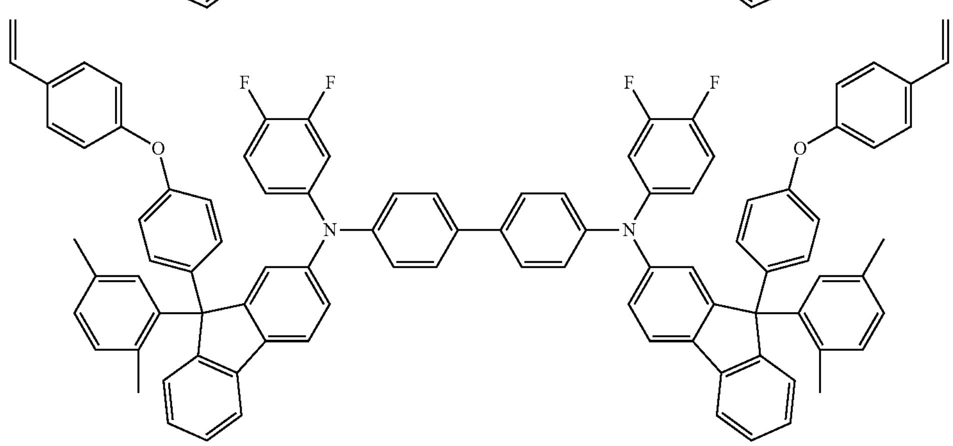
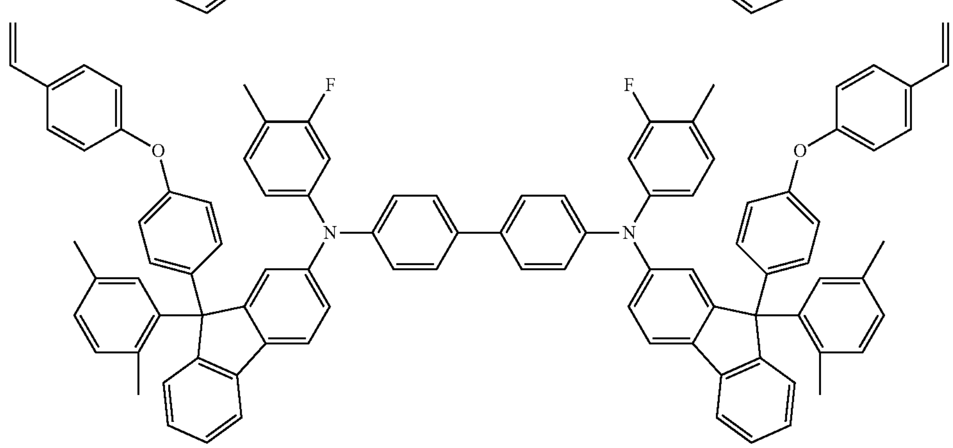

-continued
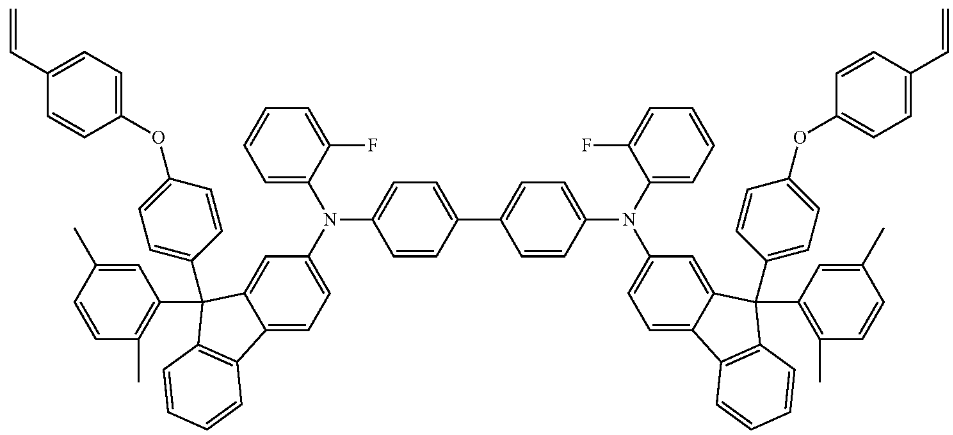
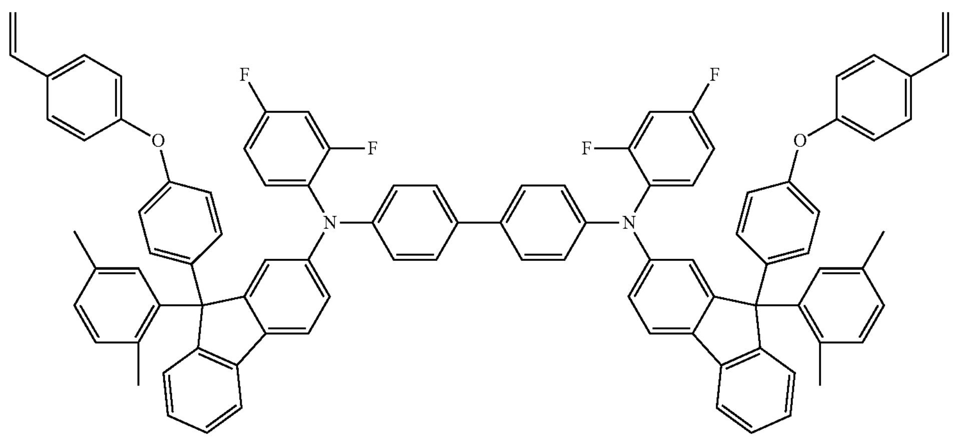
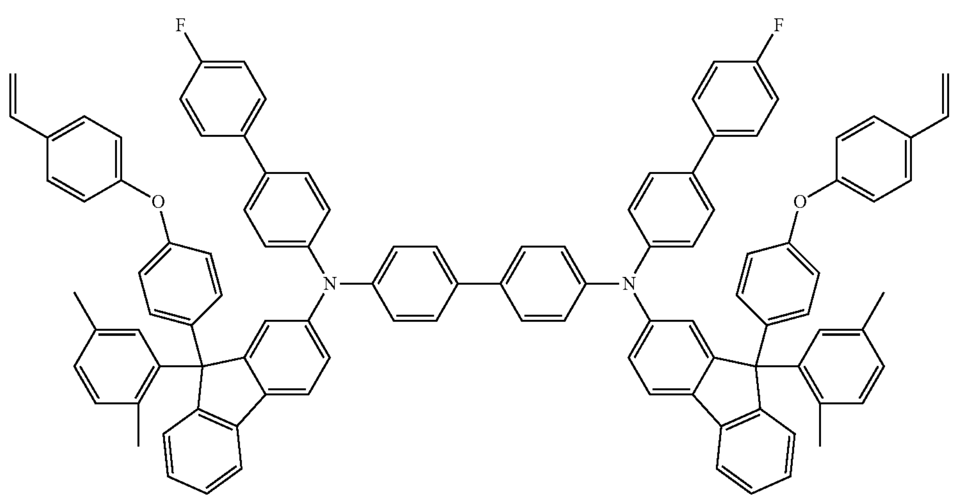

-continued
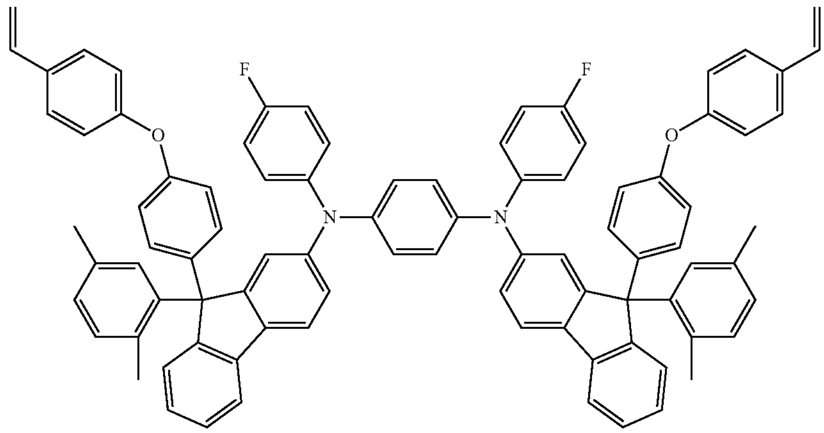
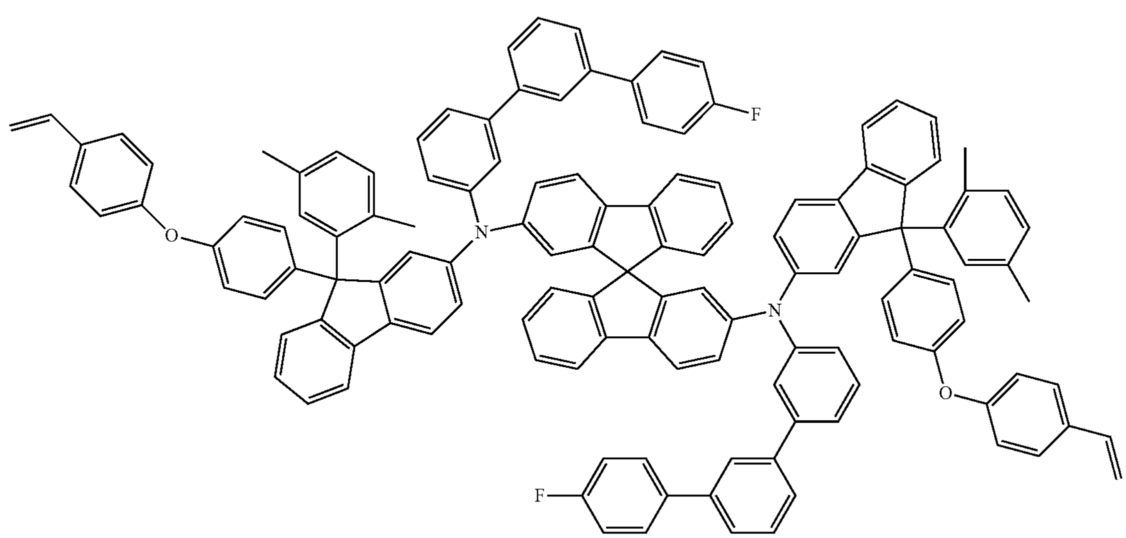

-continued
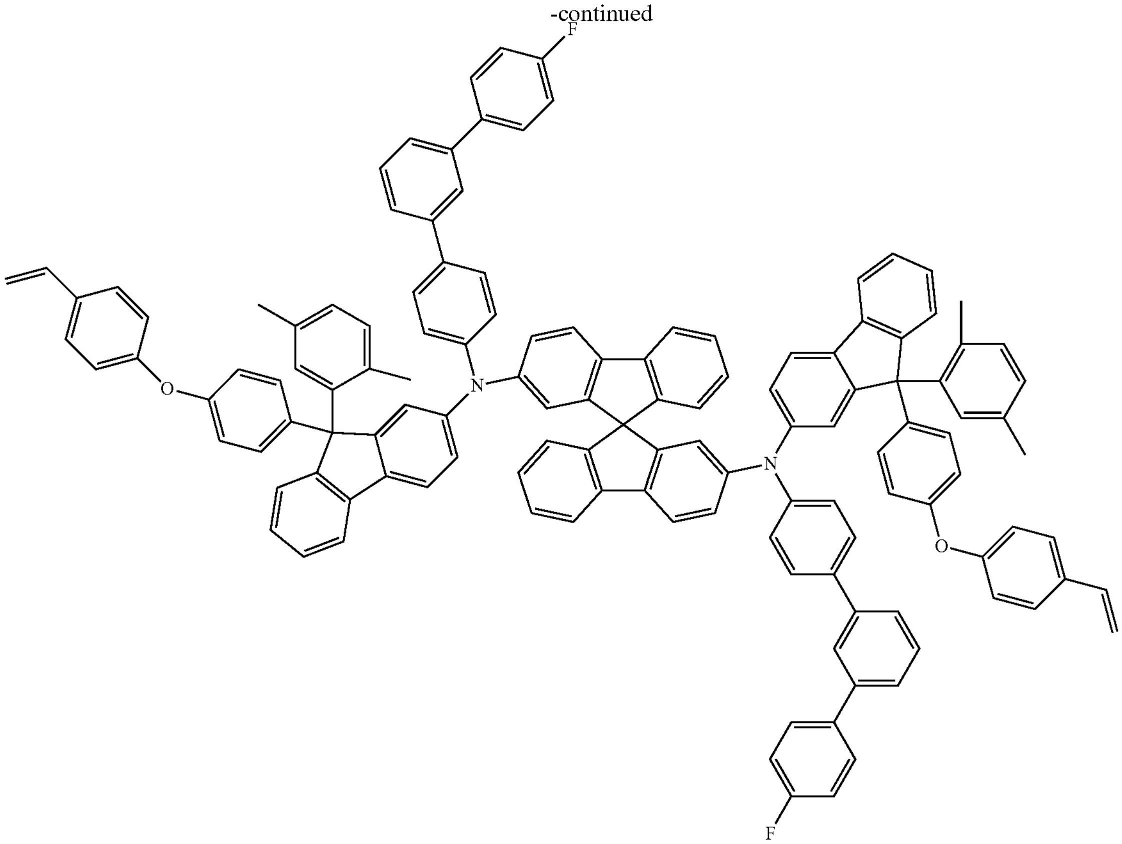
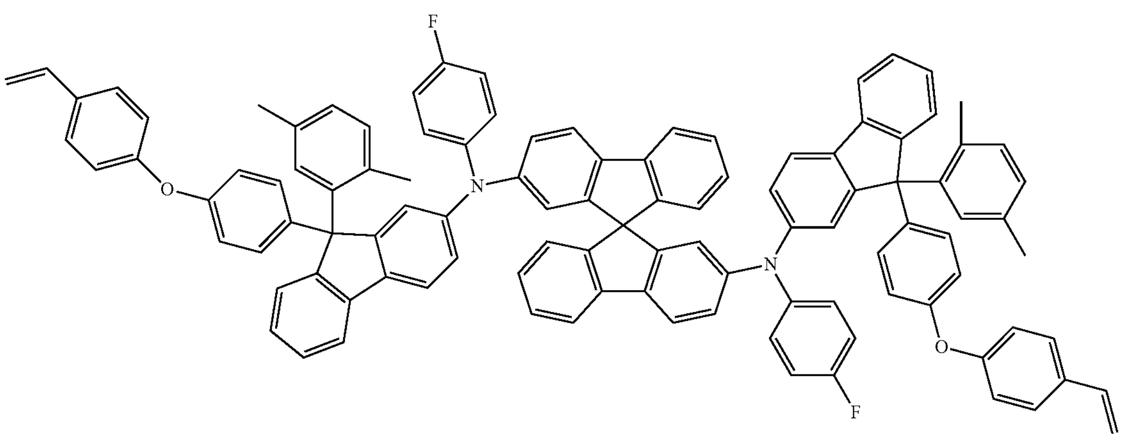
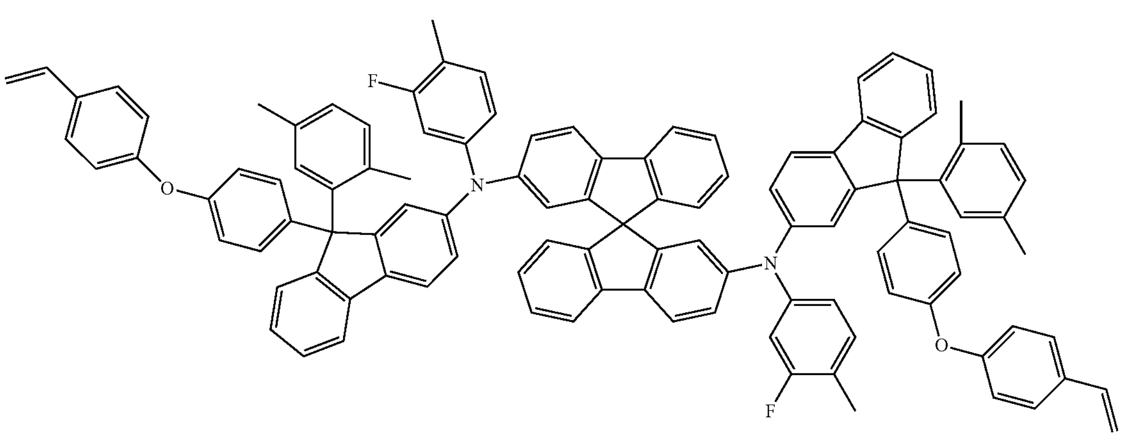

-continued
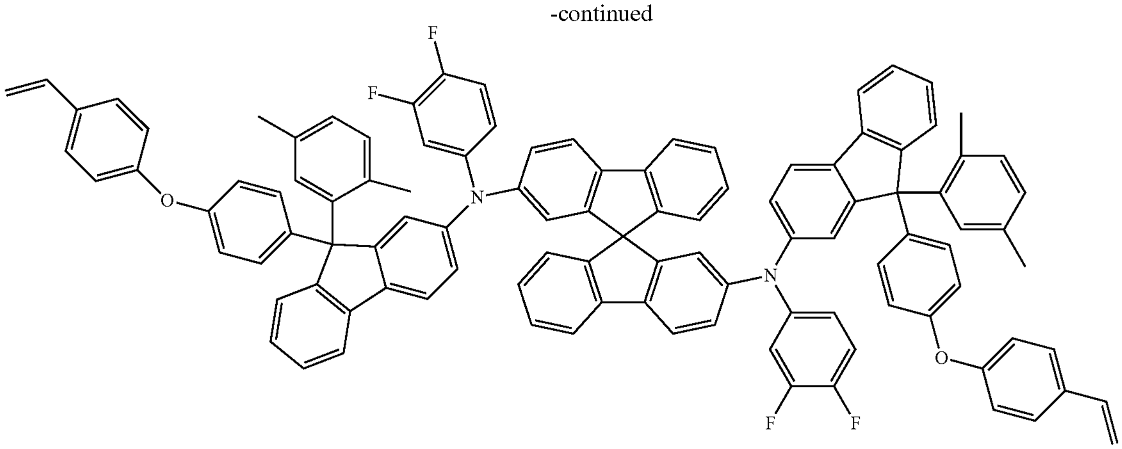
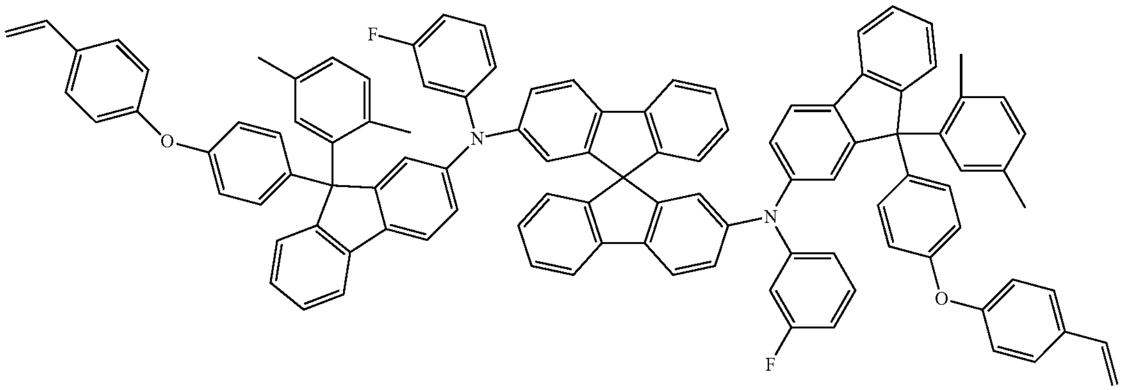
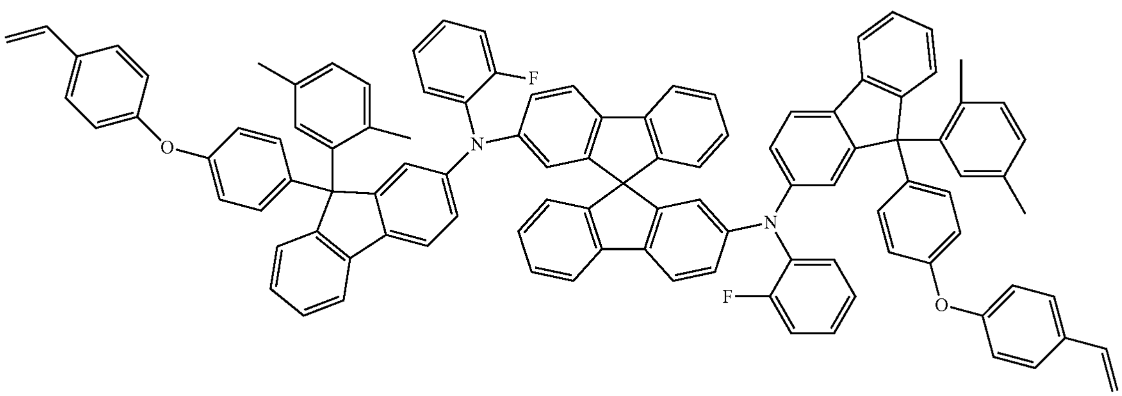
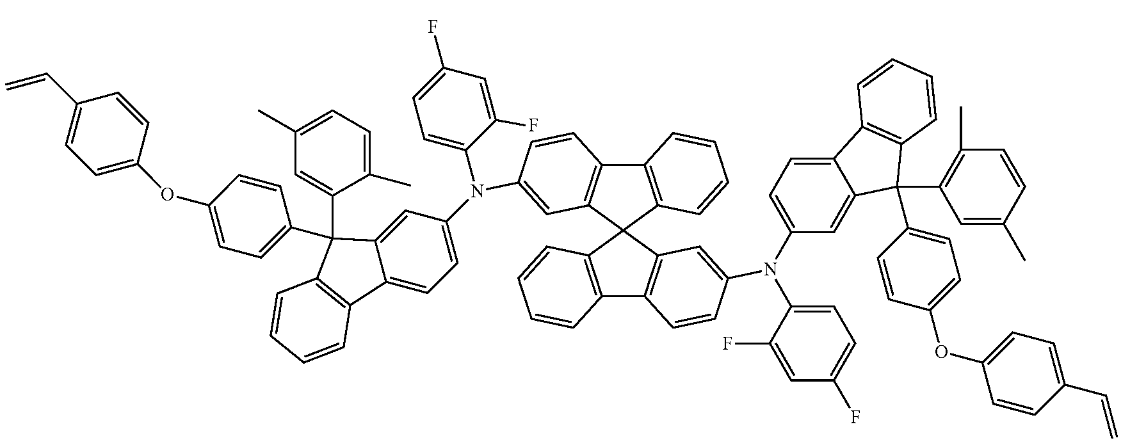

-continued
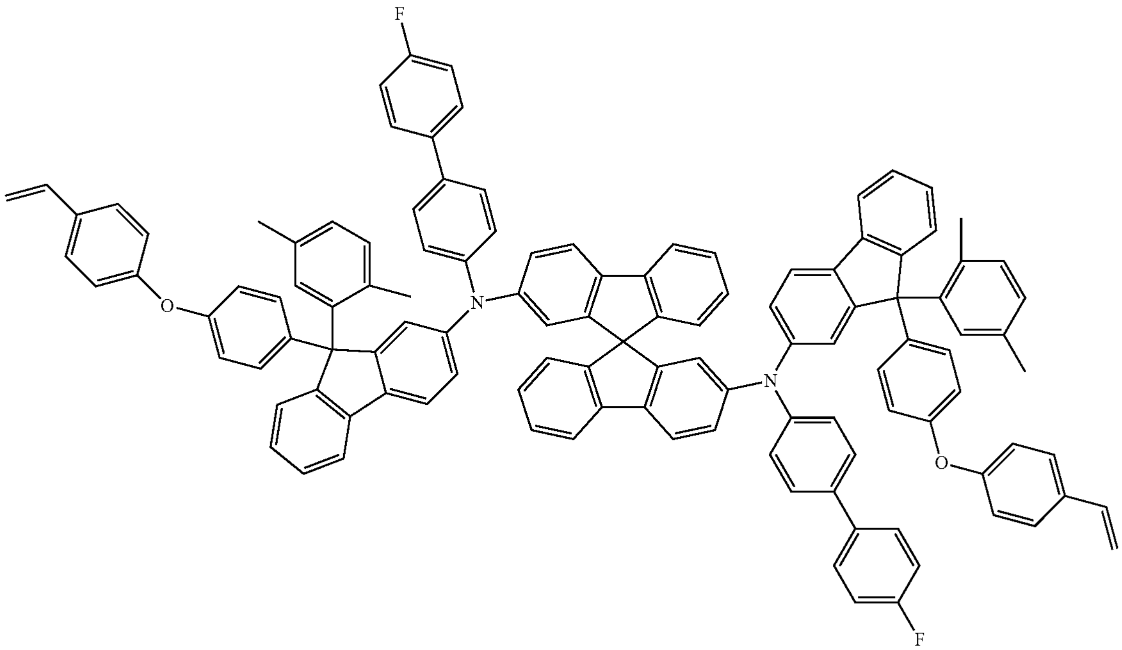
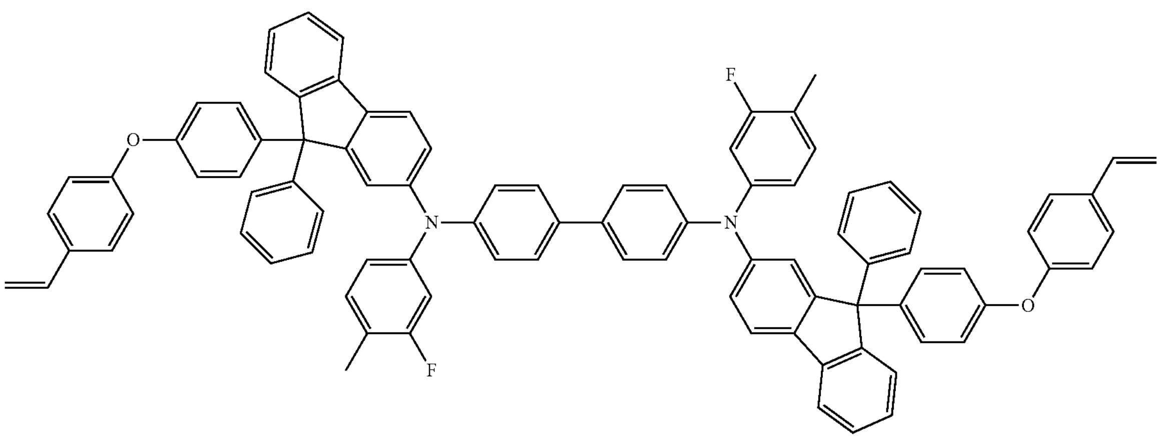
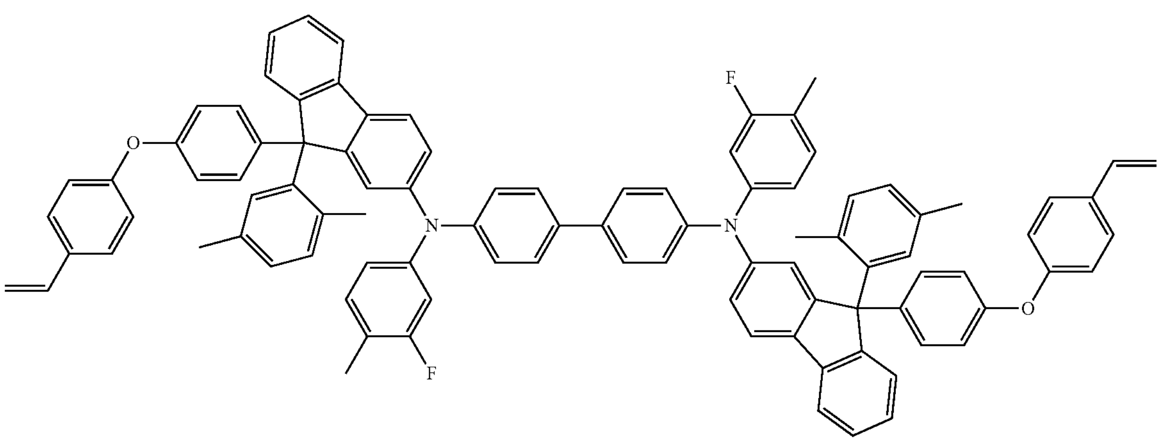

-continued
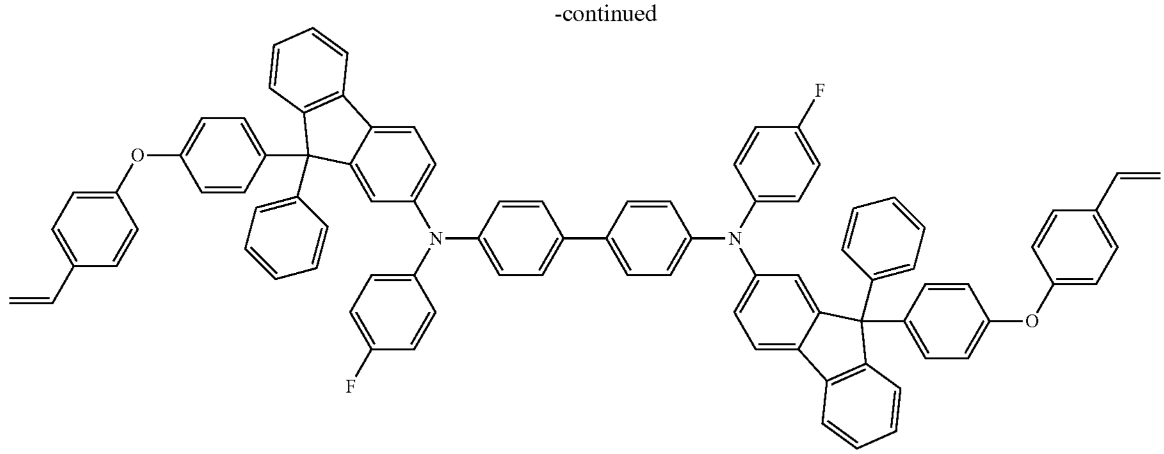
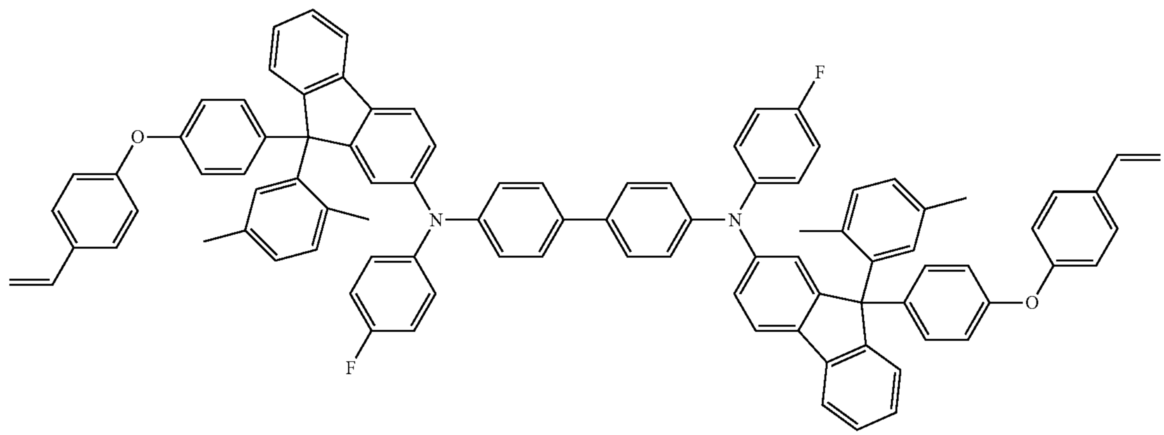
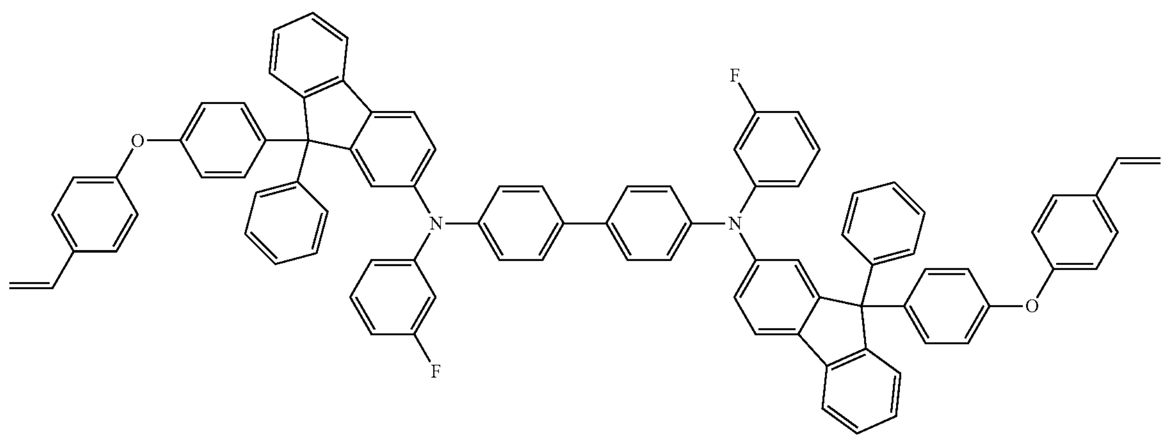
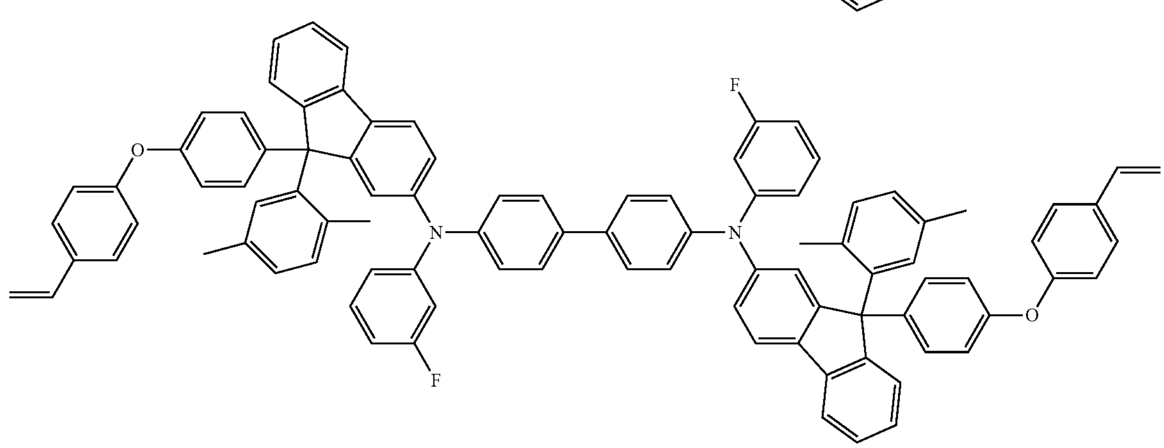

-continued
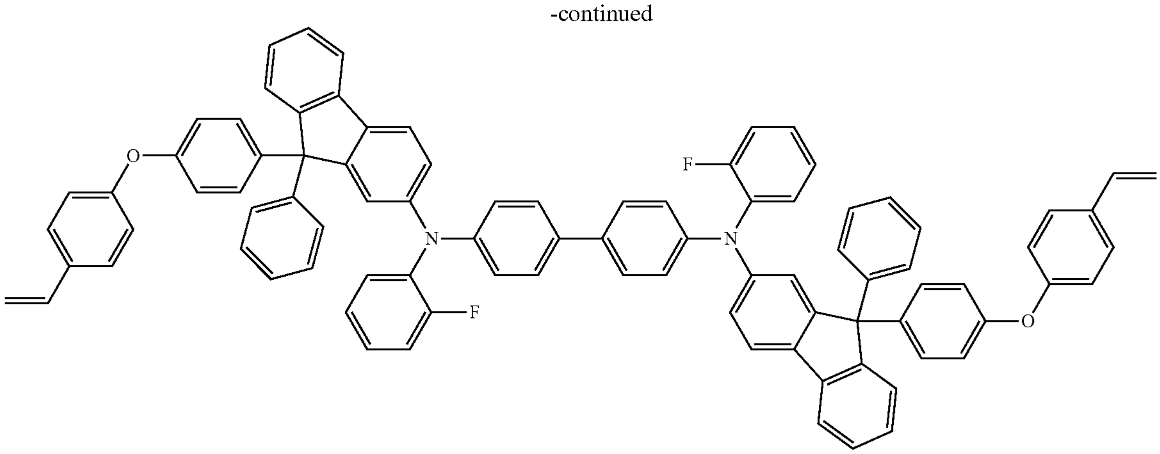
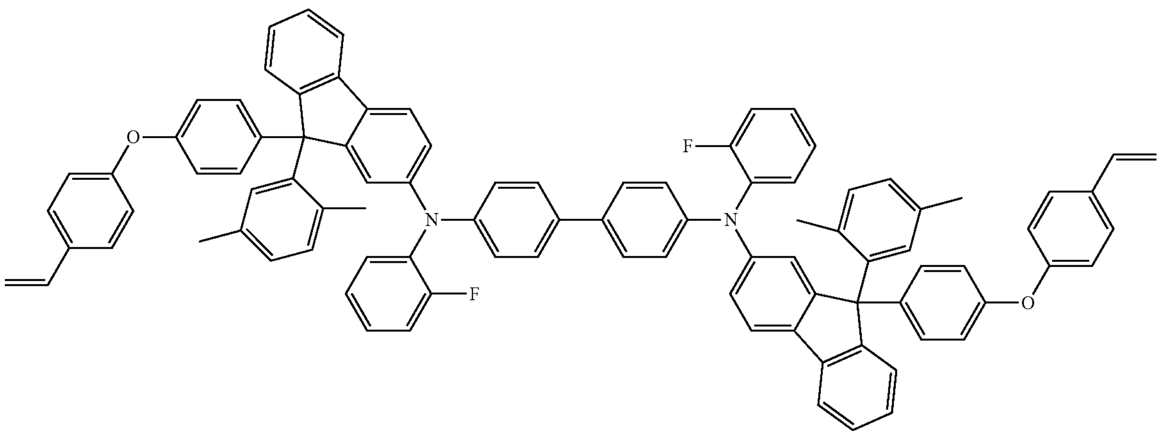
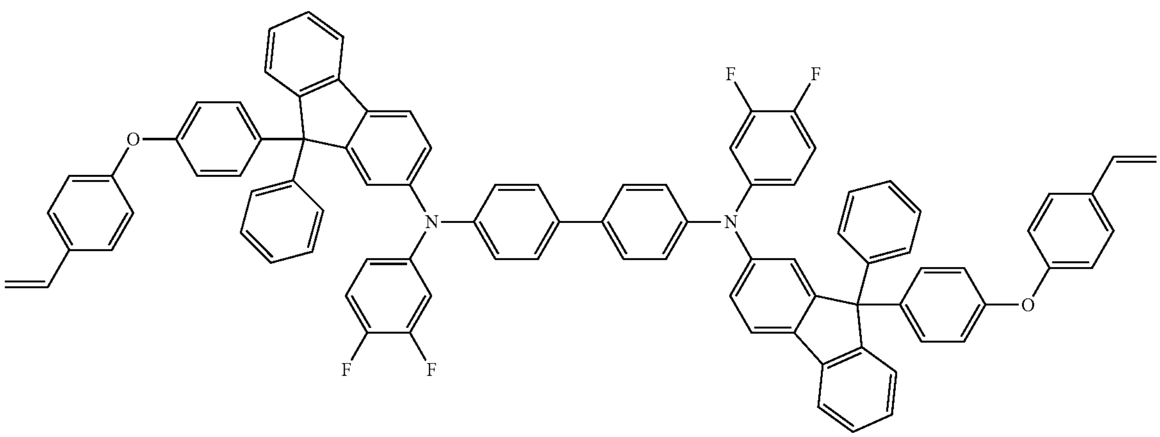
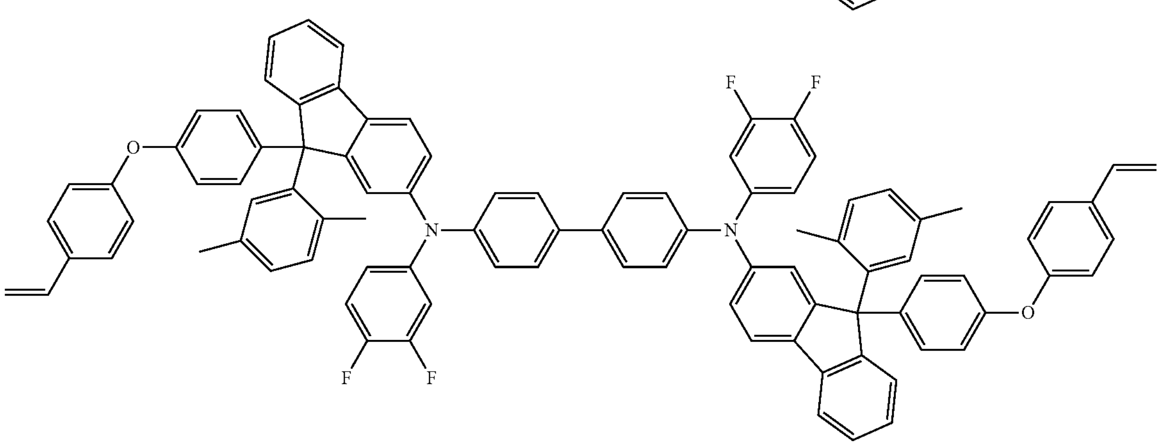

-continued
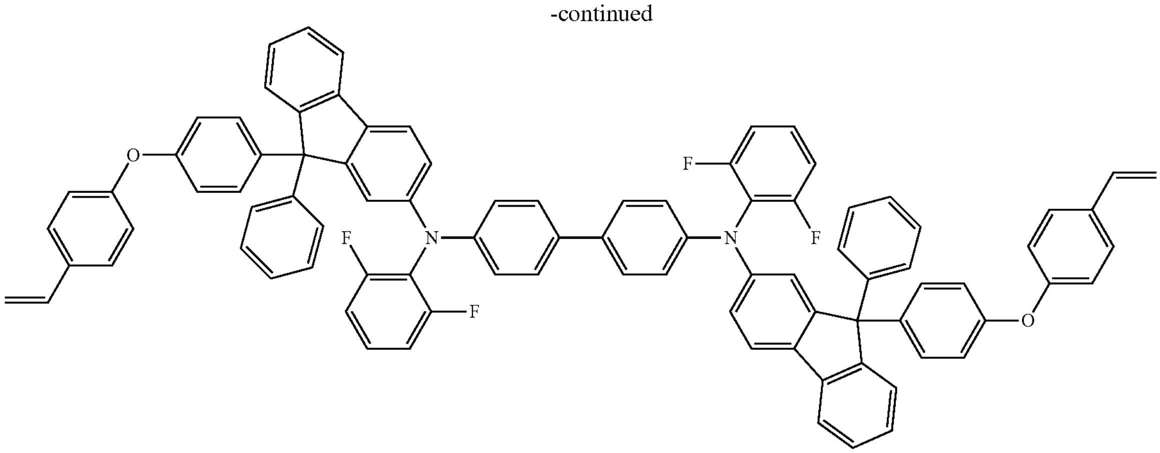
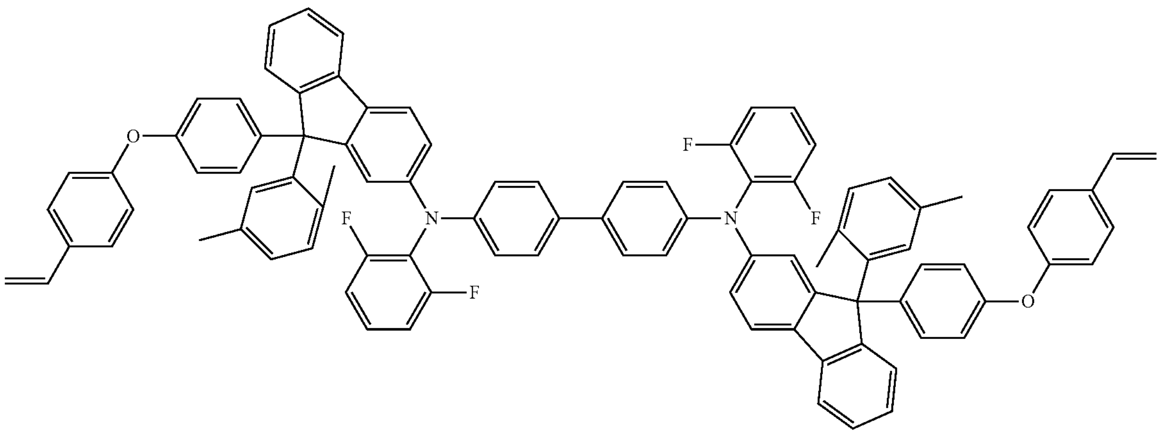
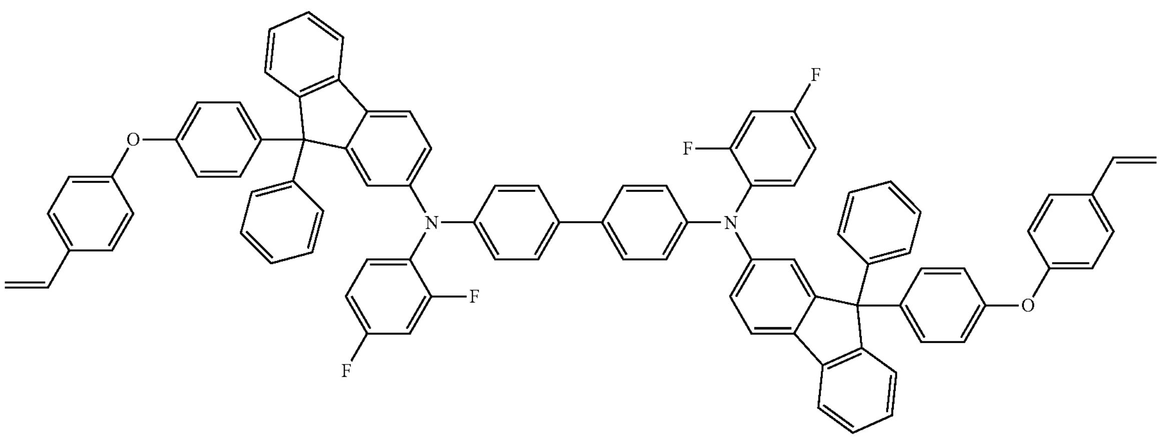
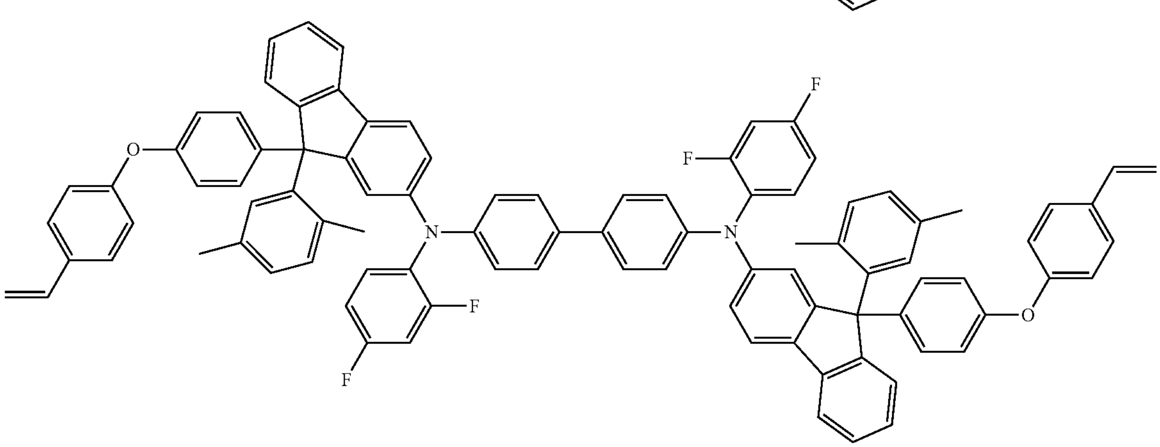

-continued
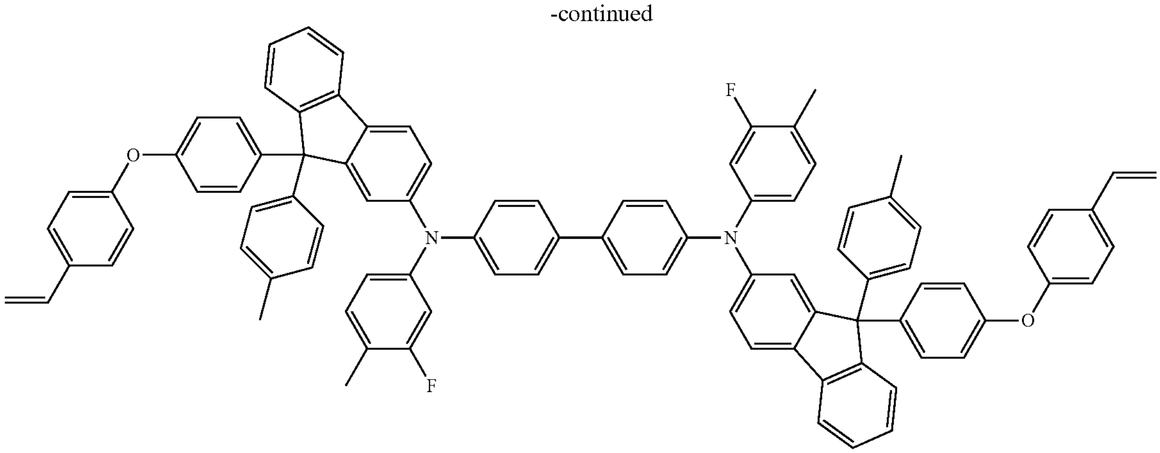
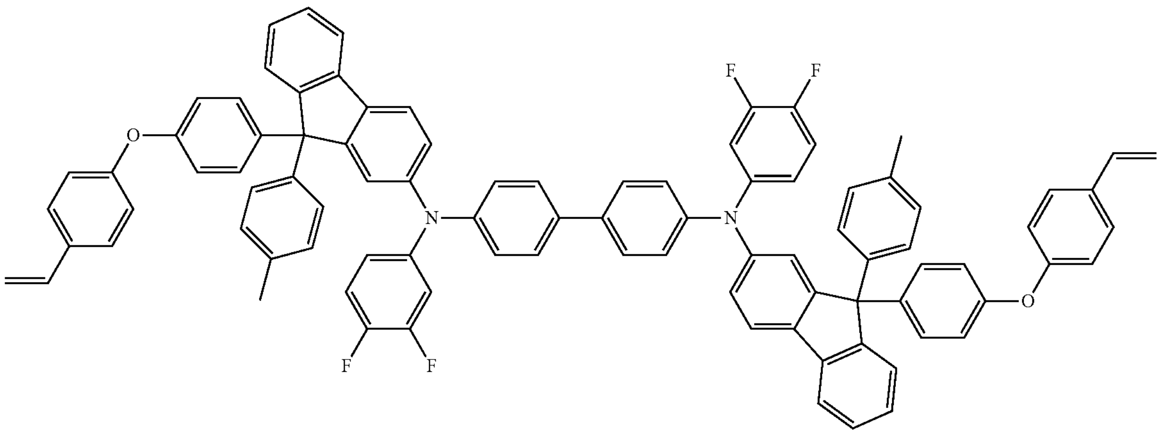
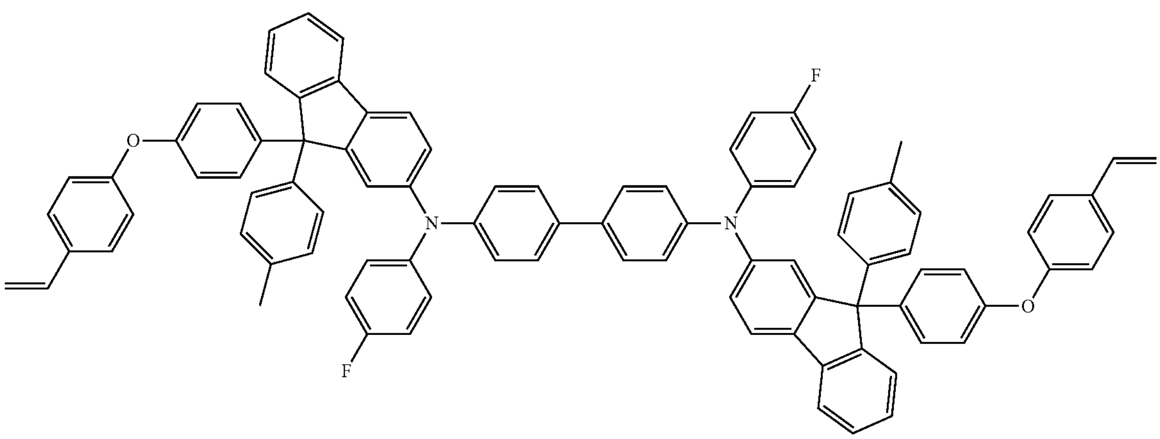
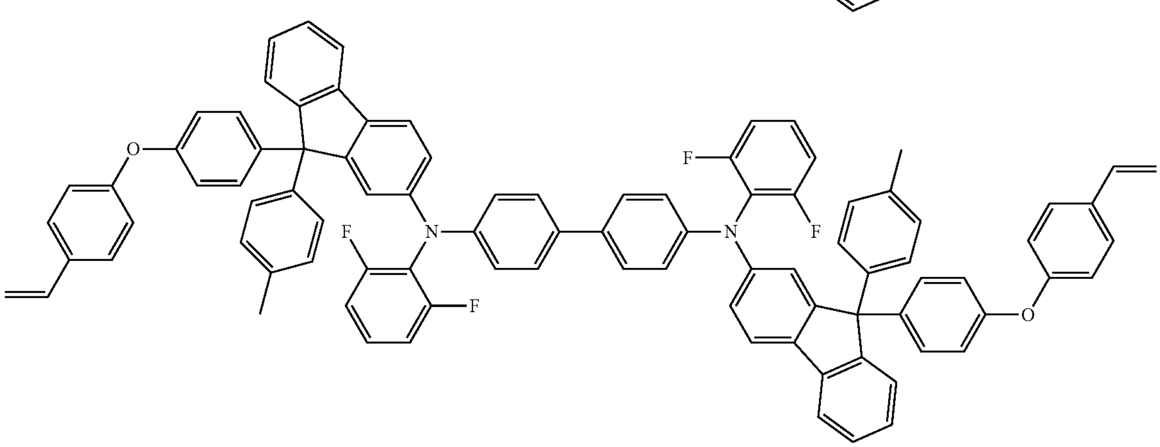

-continued
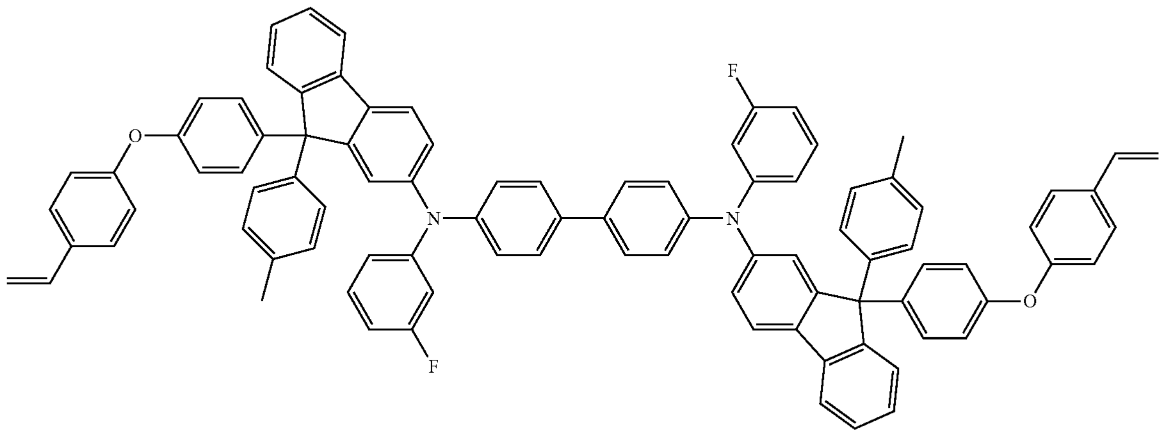
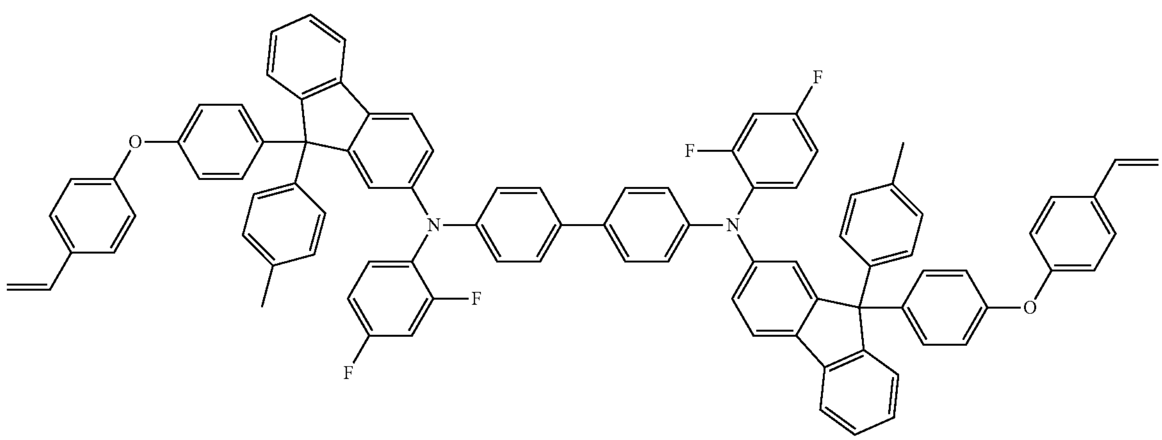
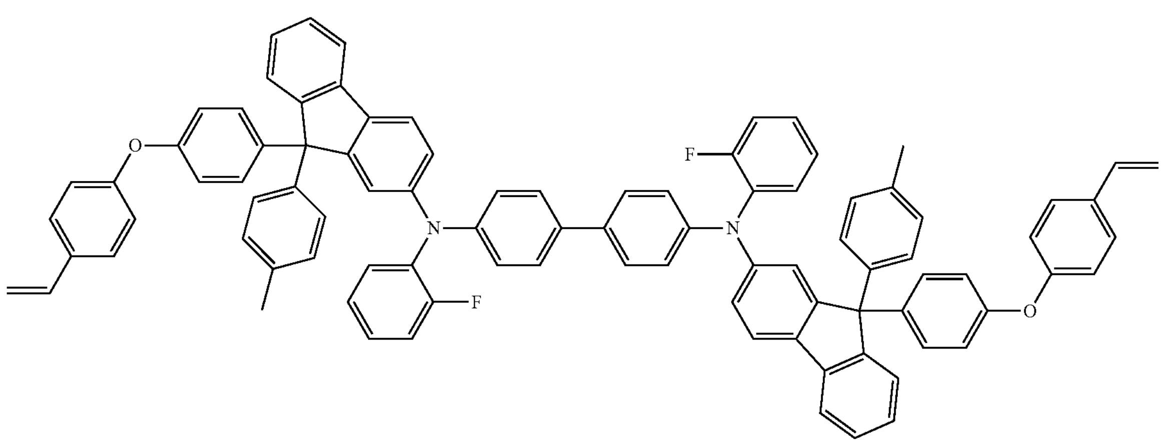

-continued
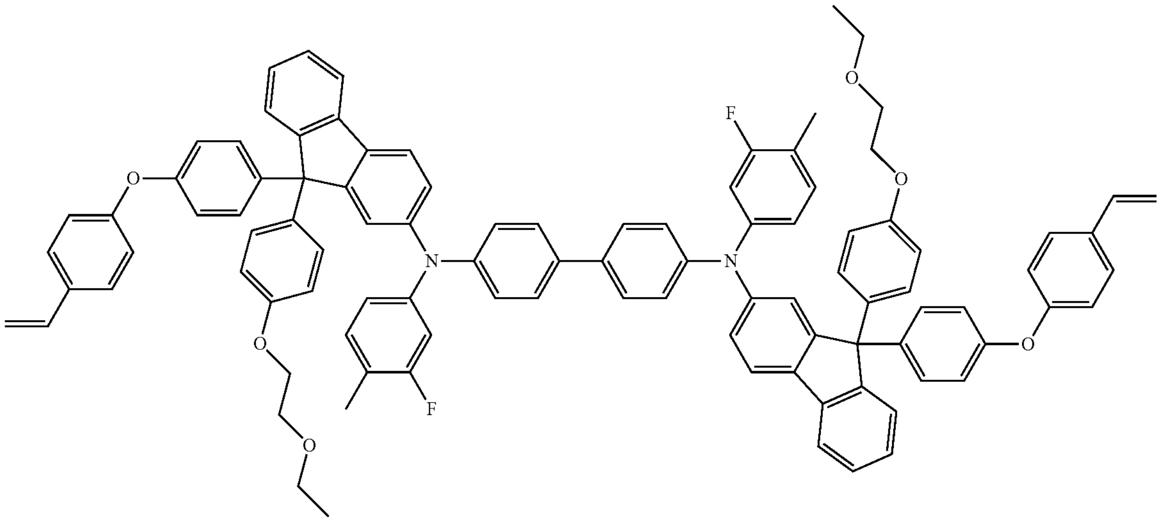
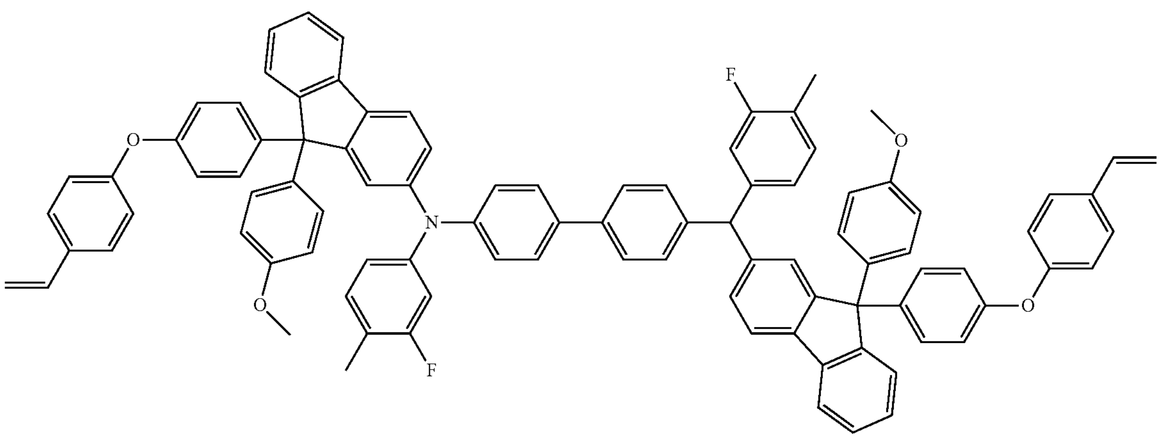
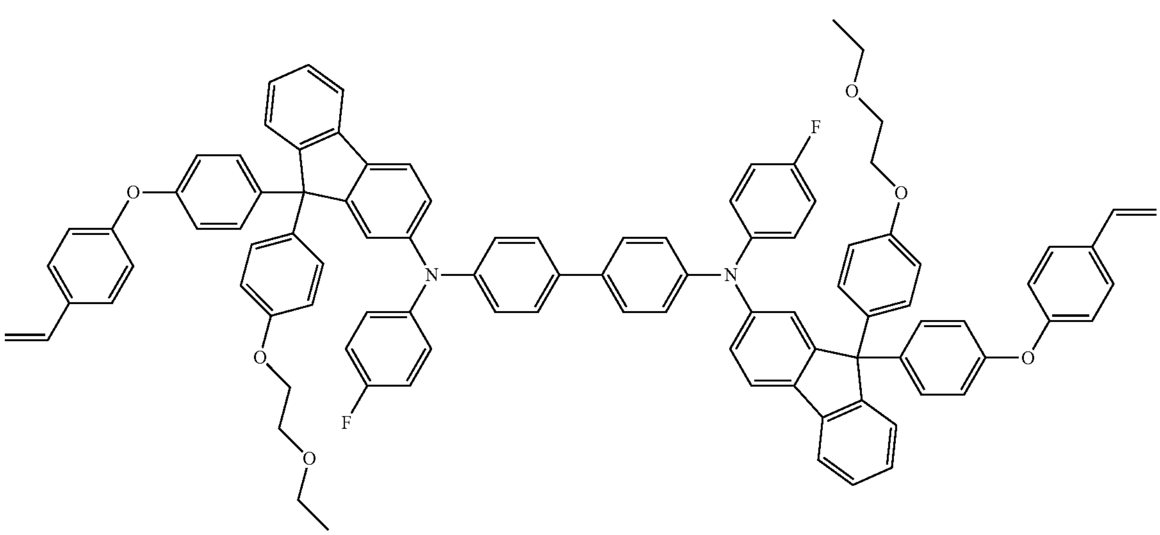

-continued
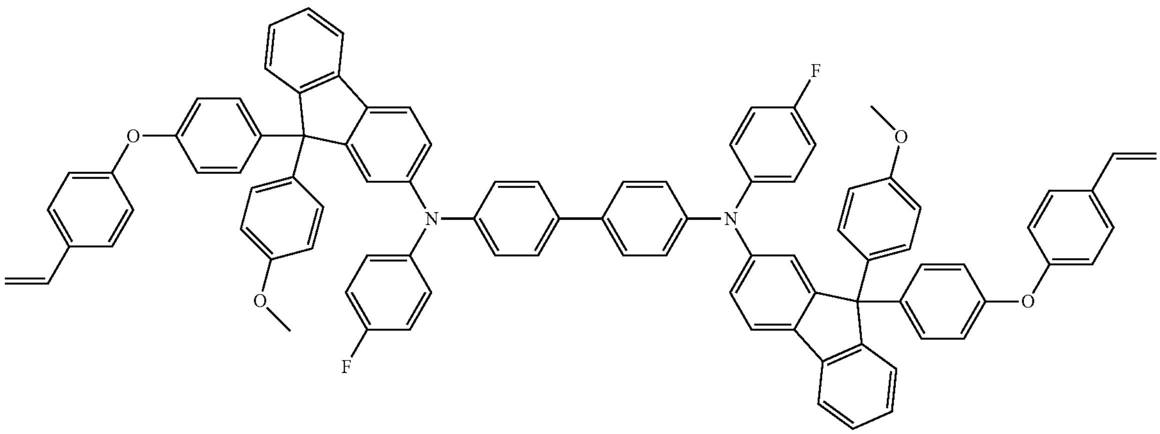
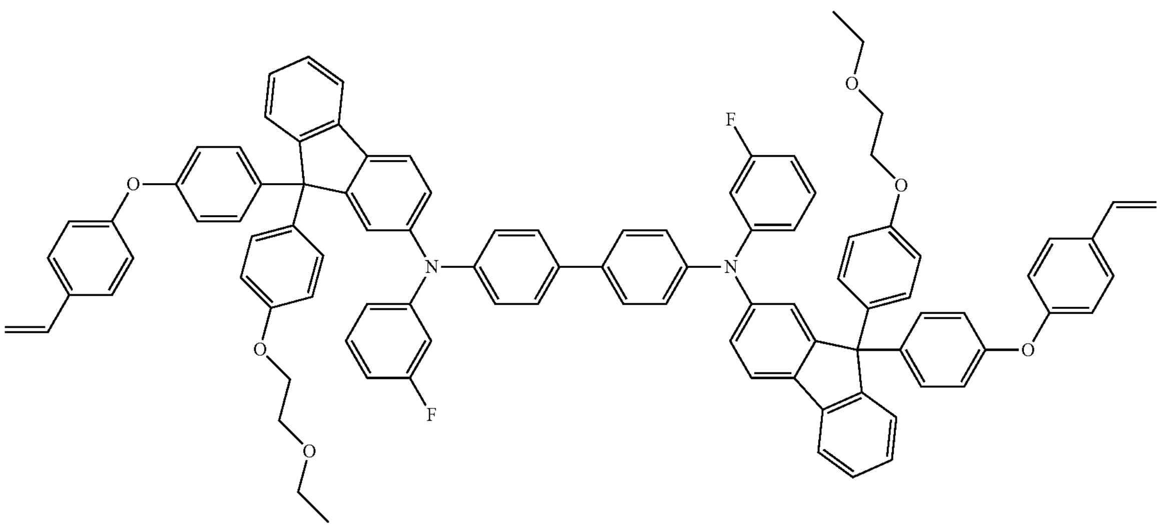
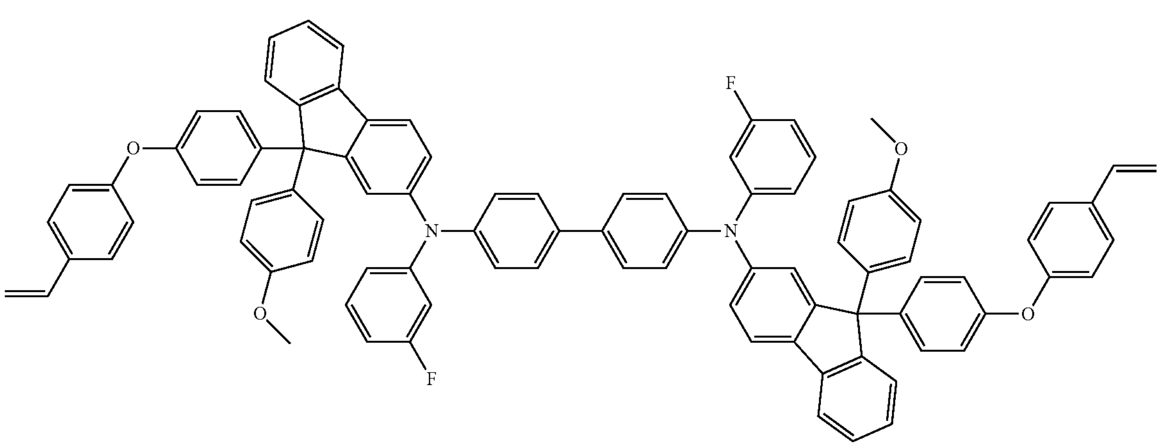

-continued
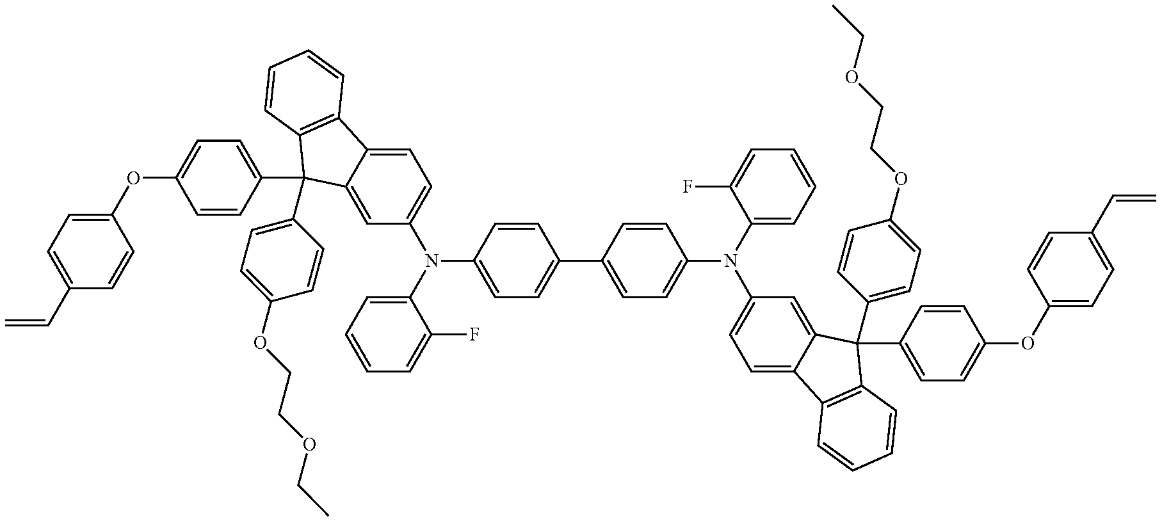
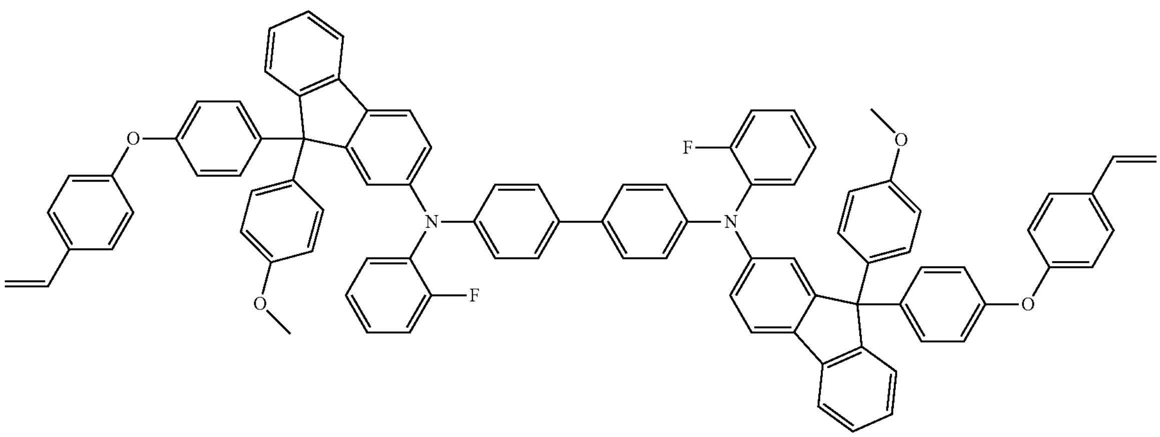
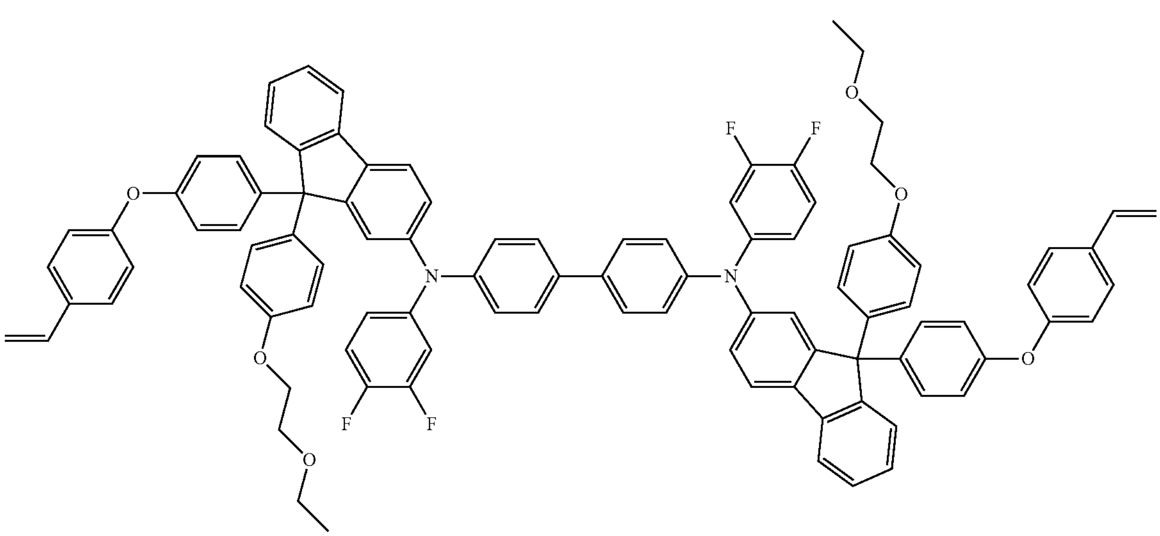

-continued
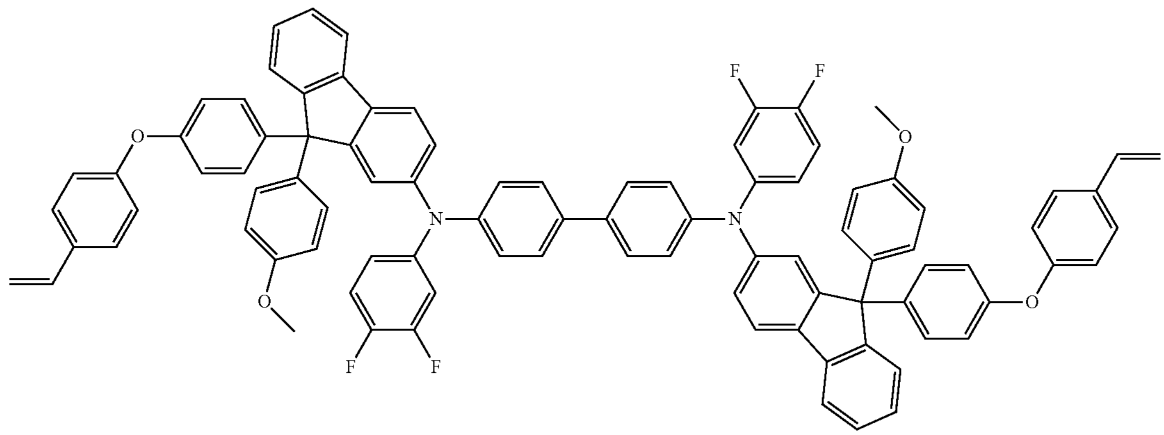
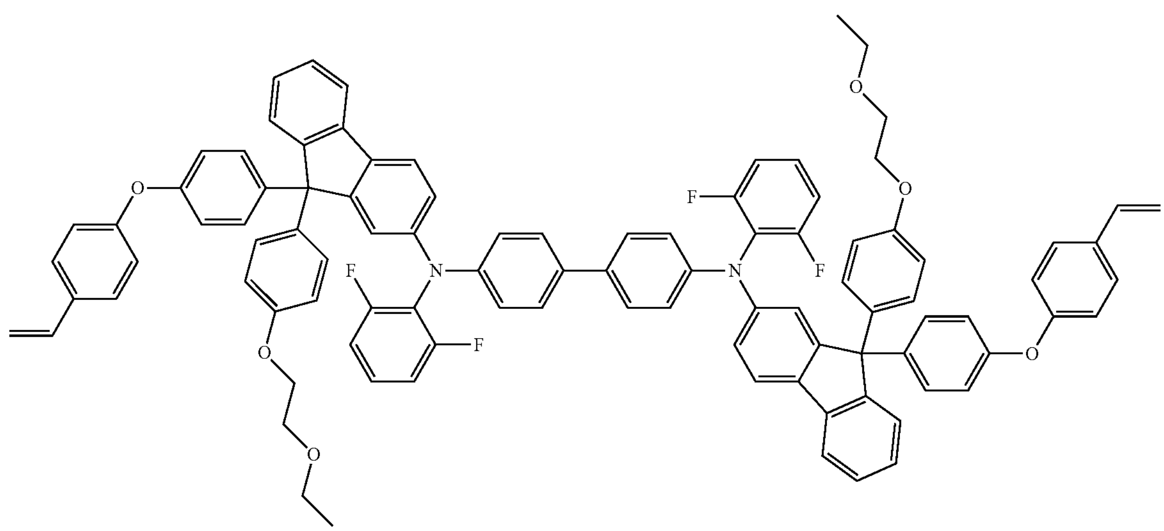
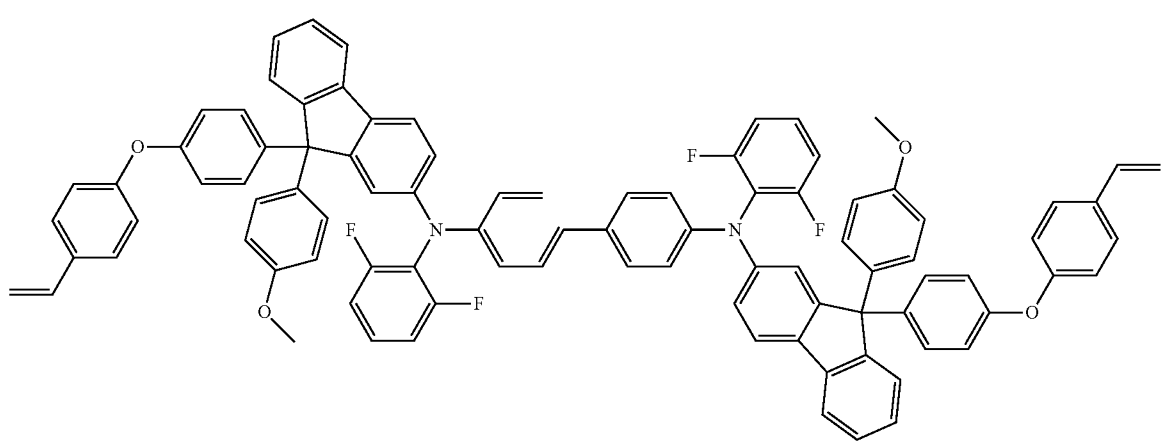

-continued
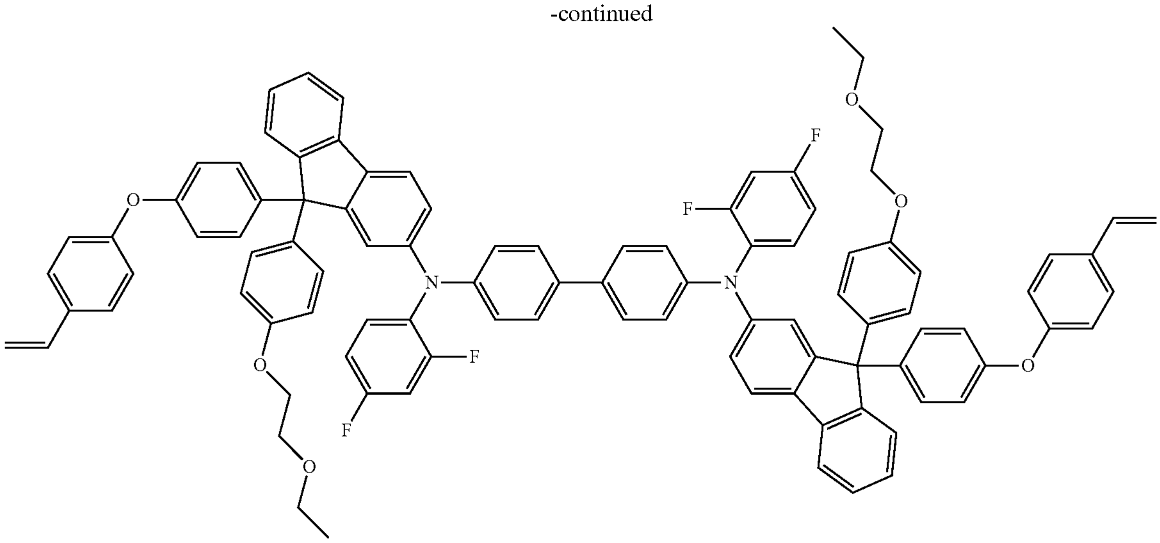
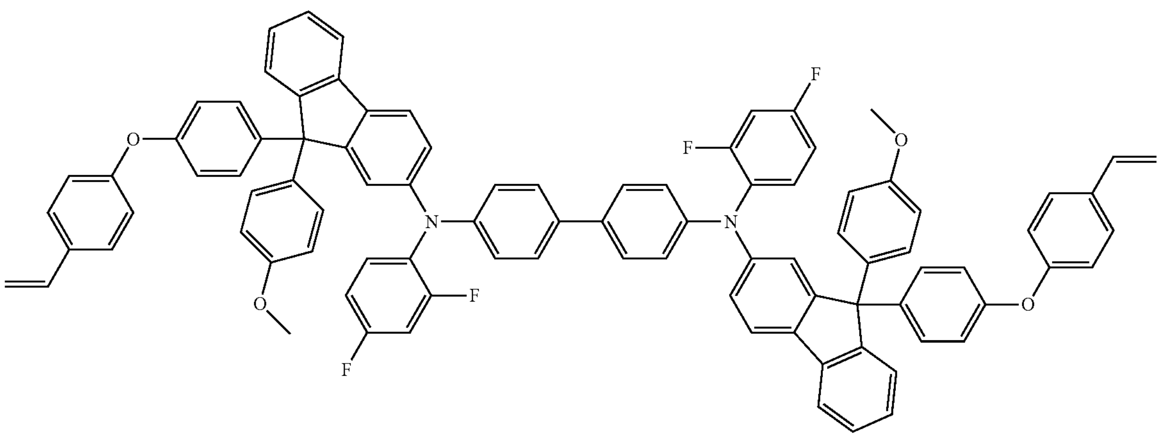
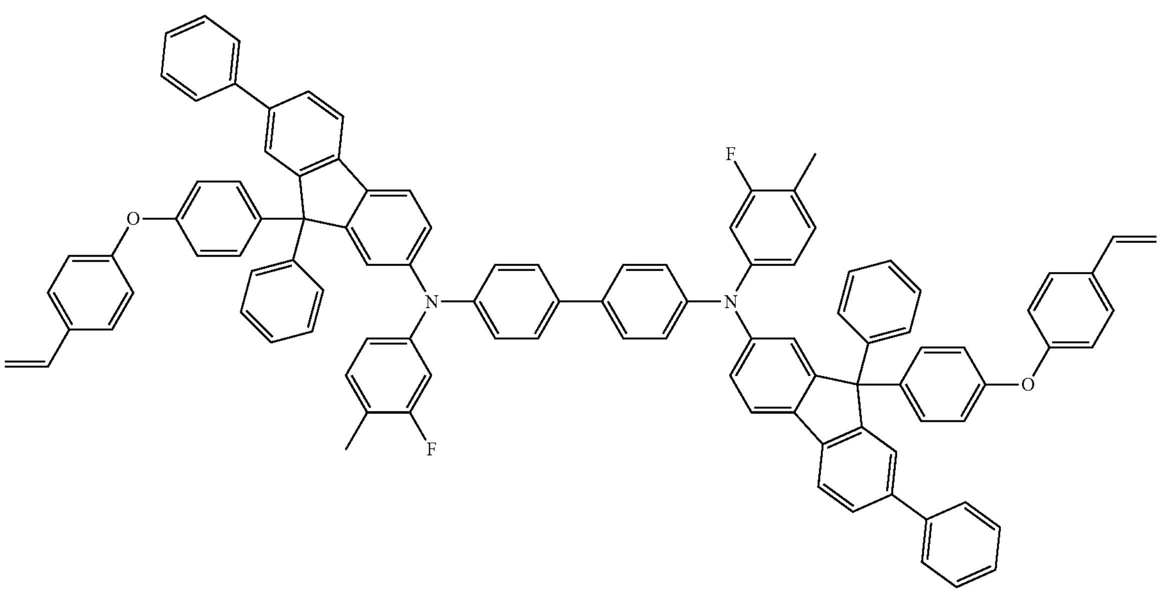

-continued
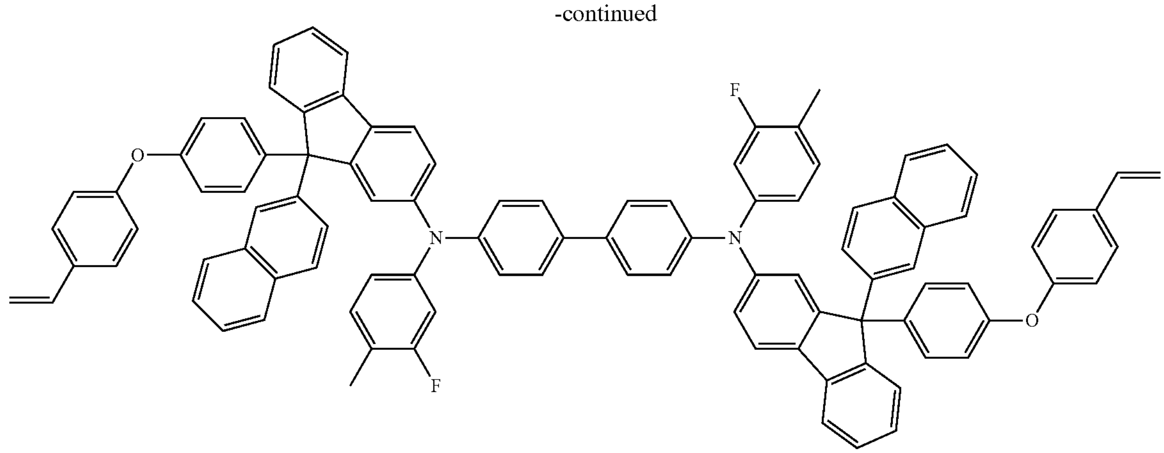
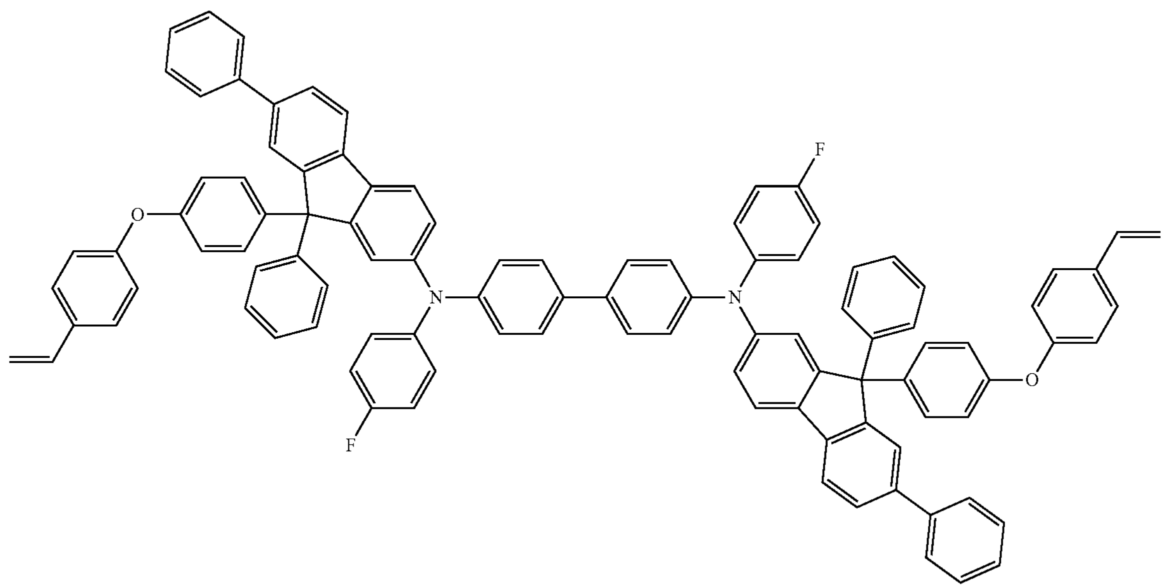
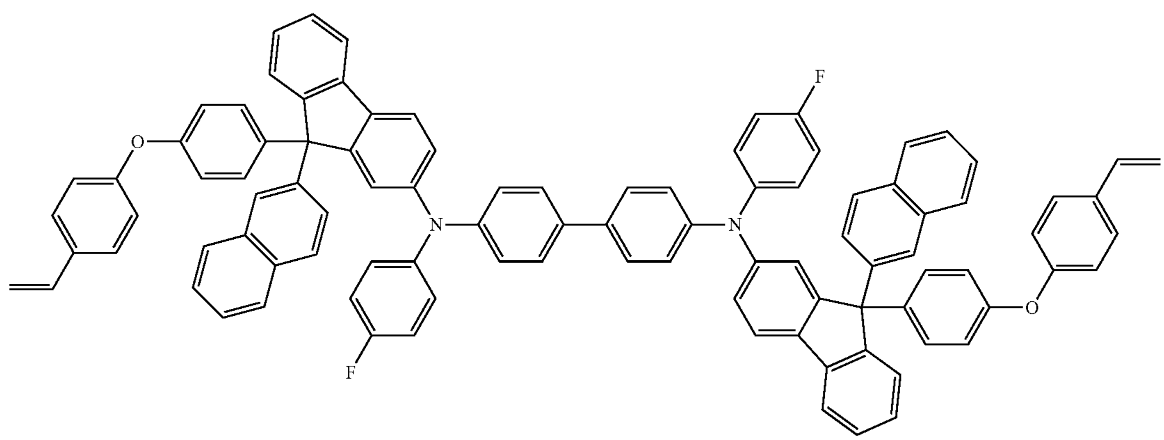

-continued
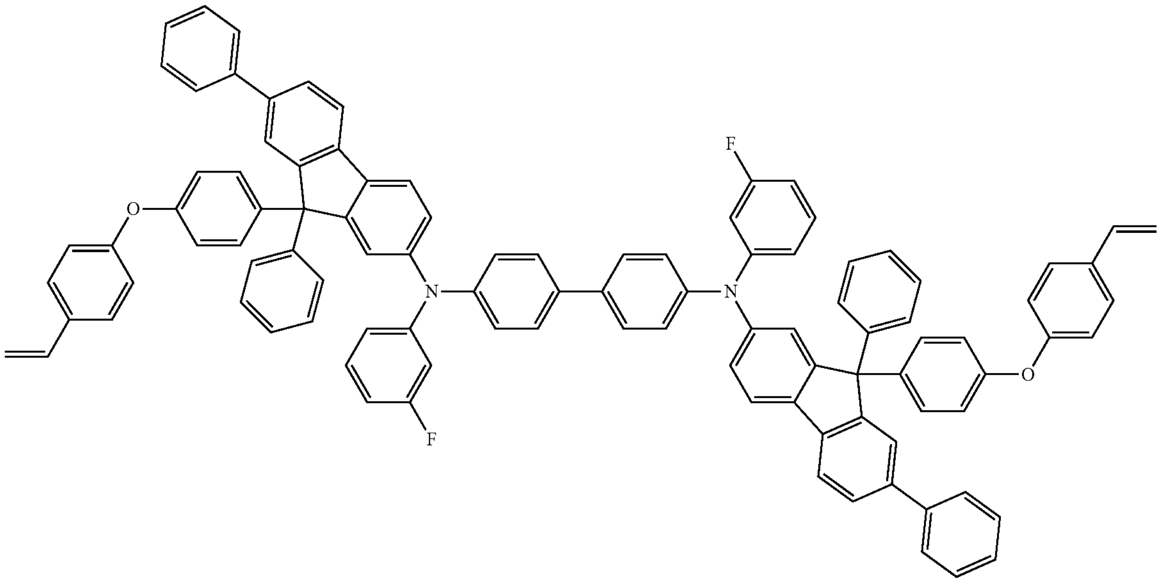
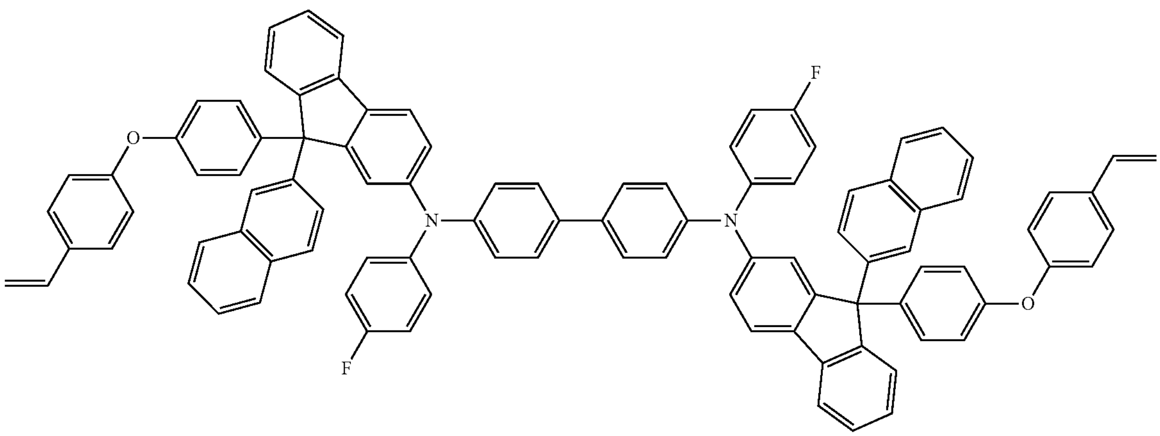
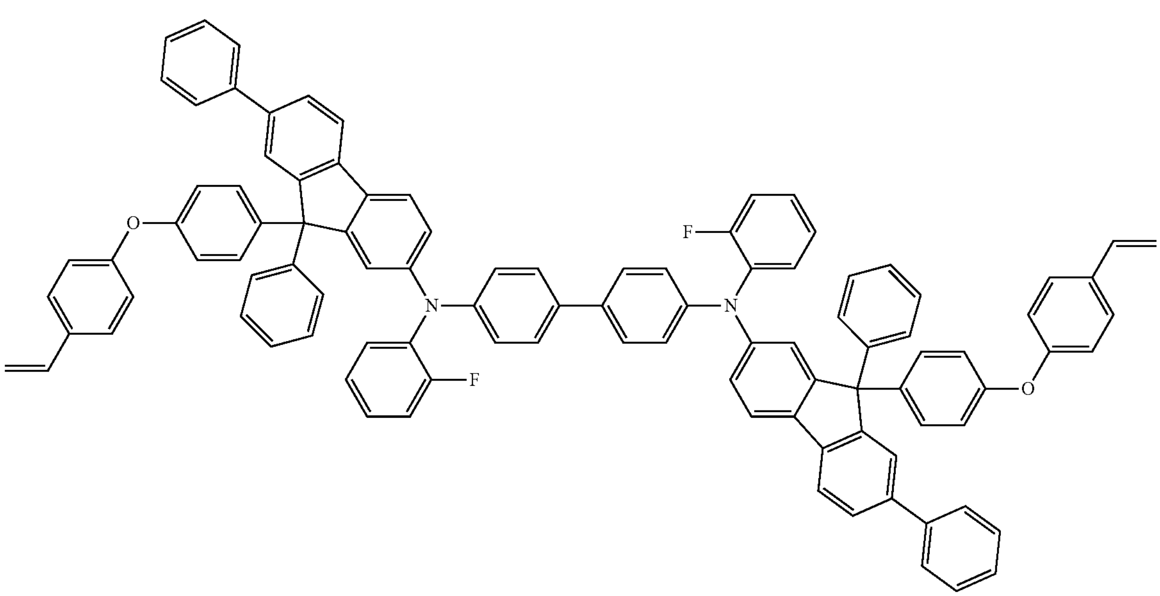

-continued
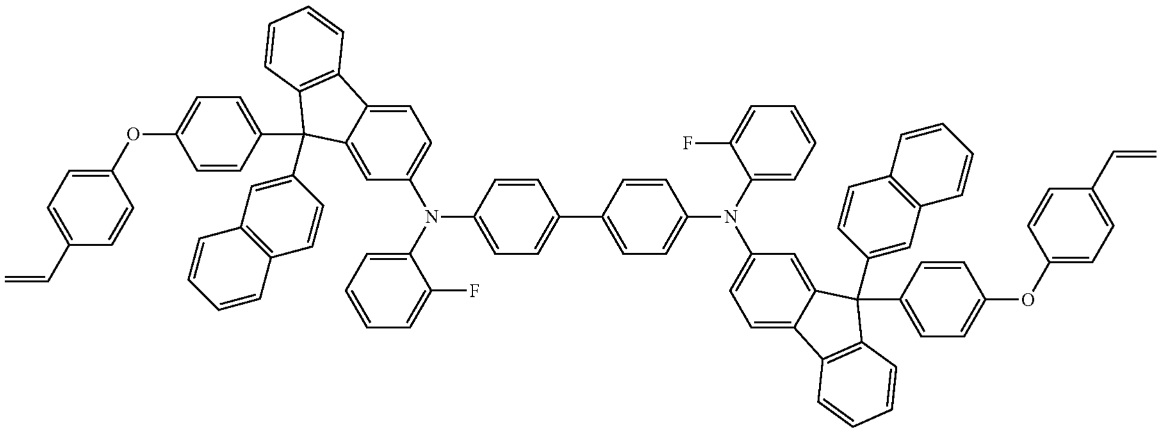
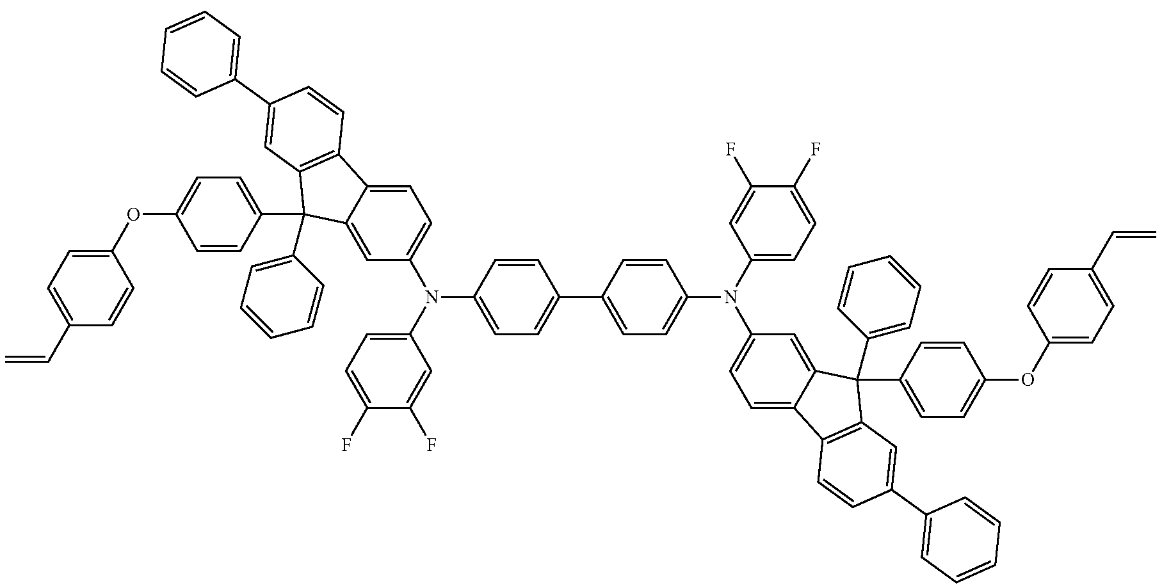
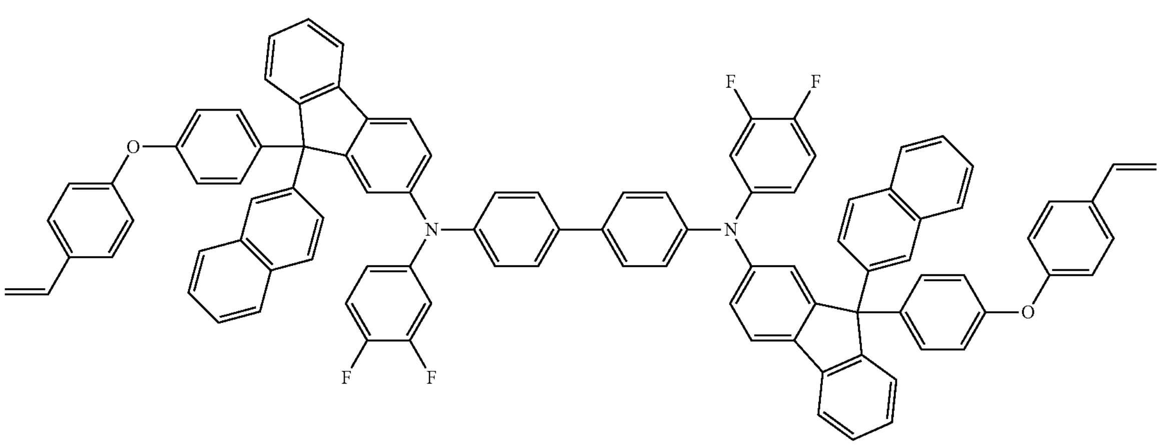

-continued
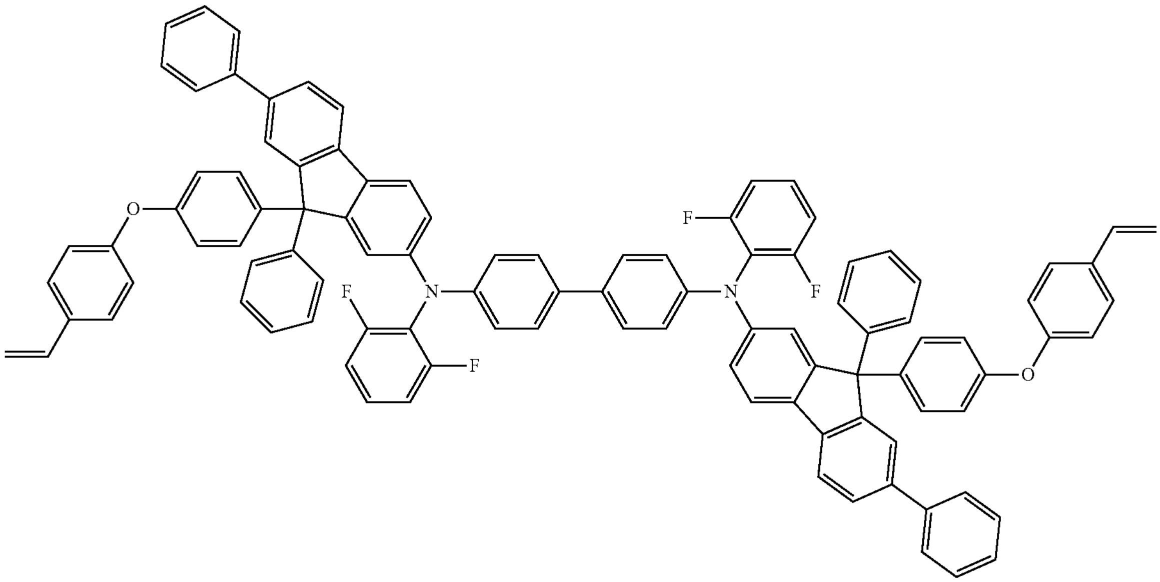
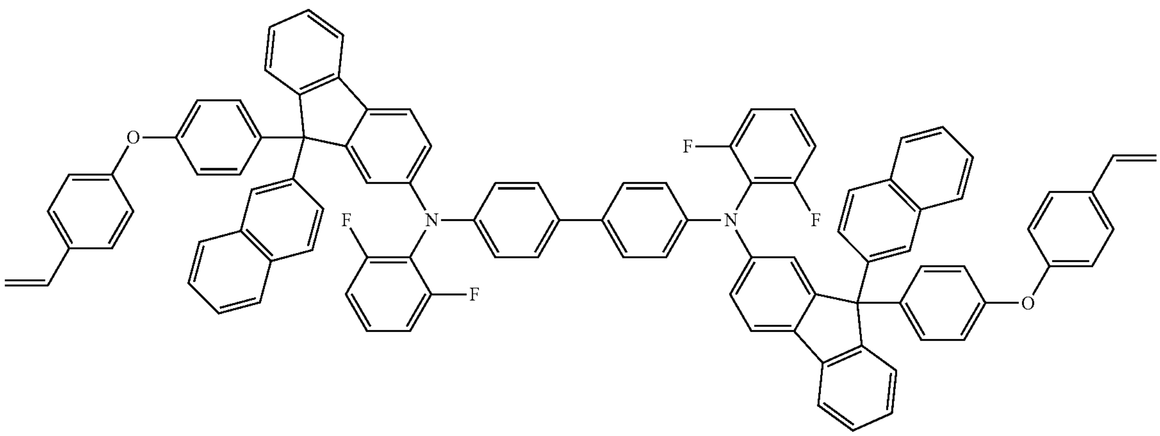
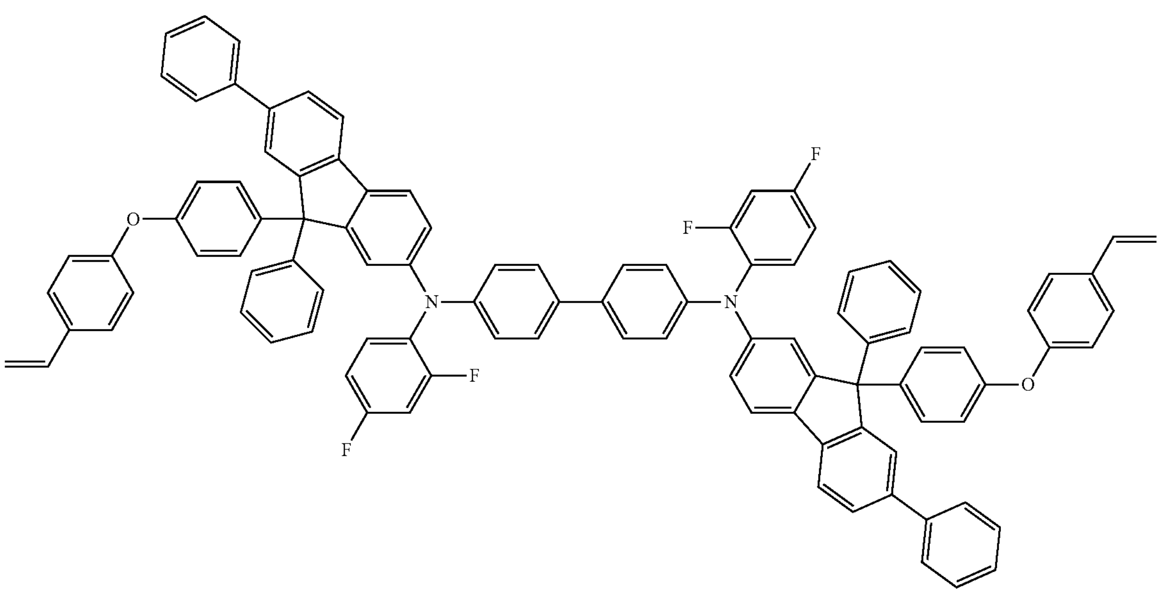

-continued
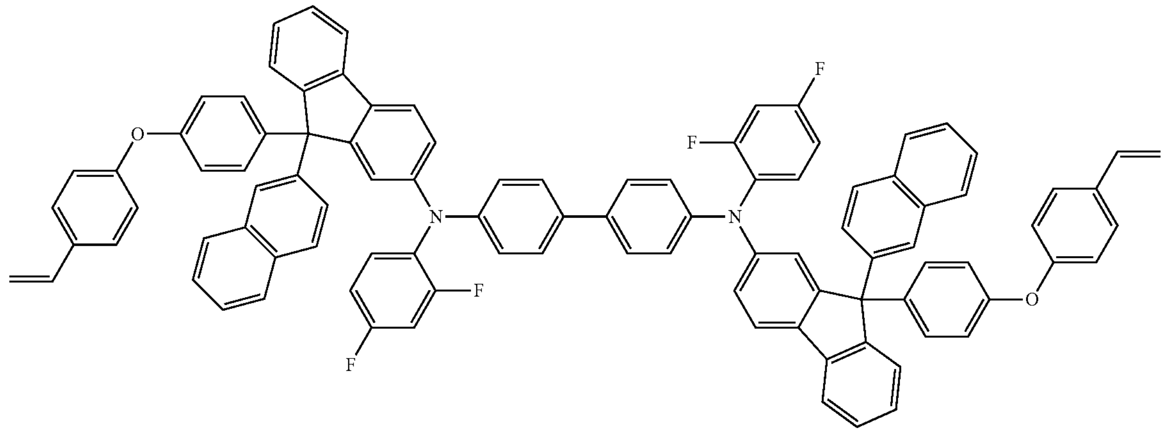
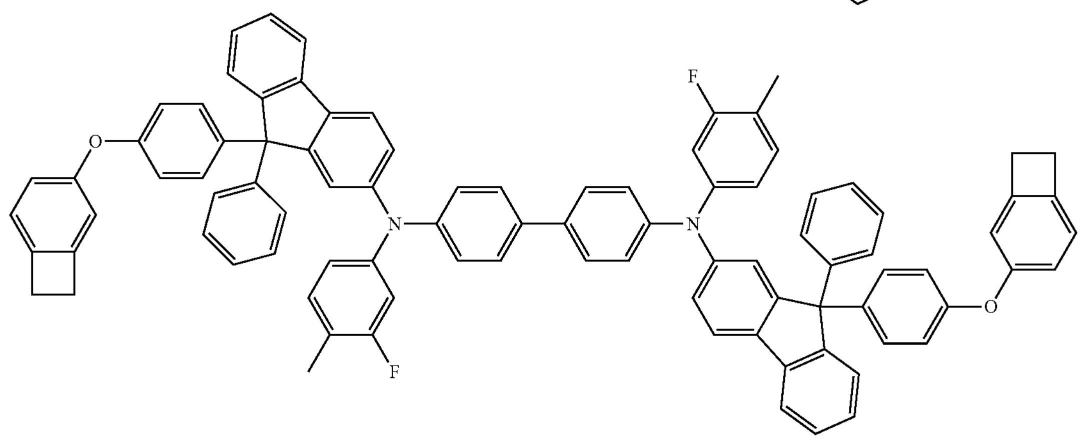
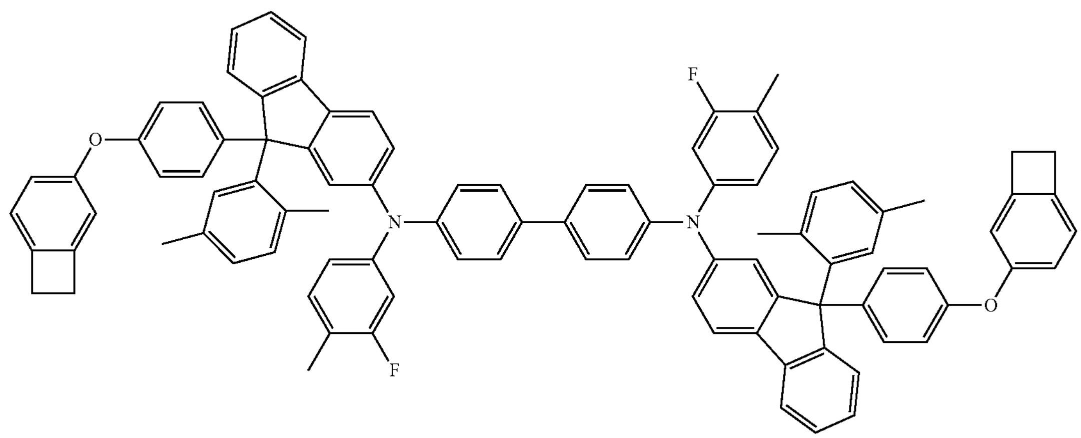
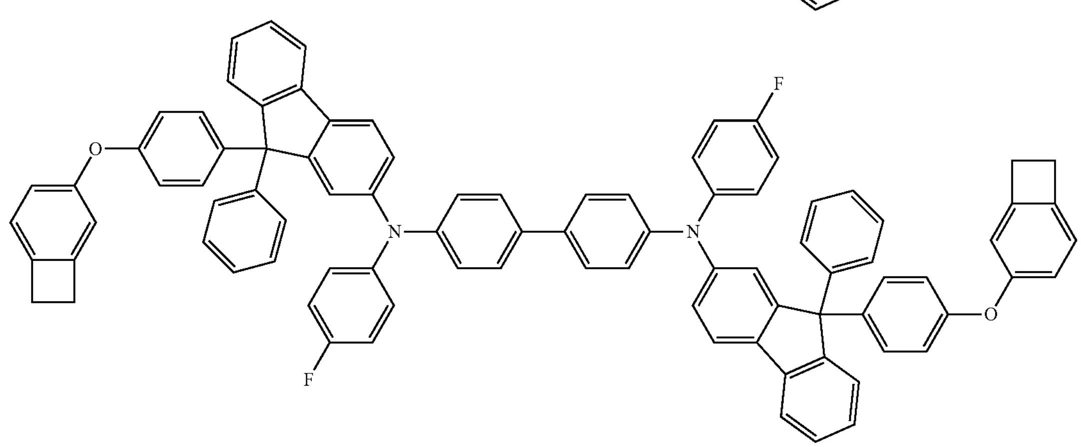

-continued
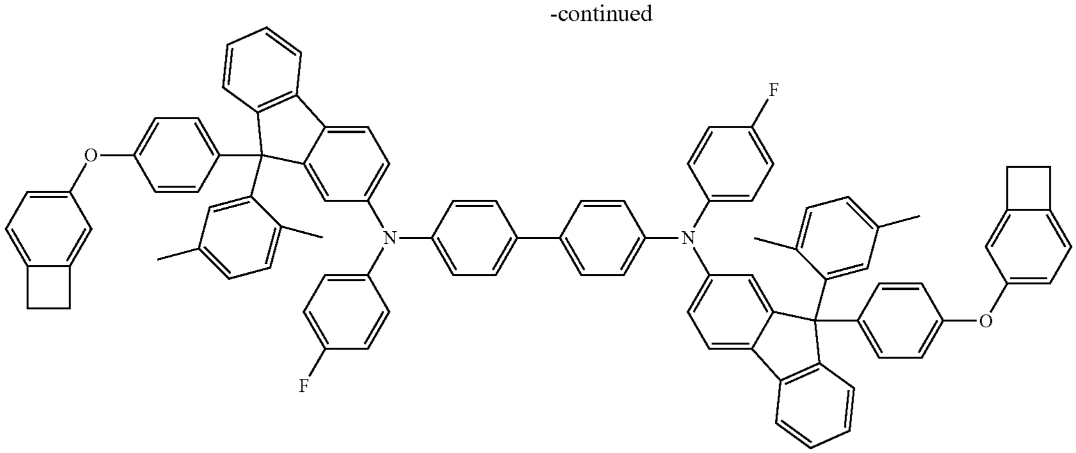
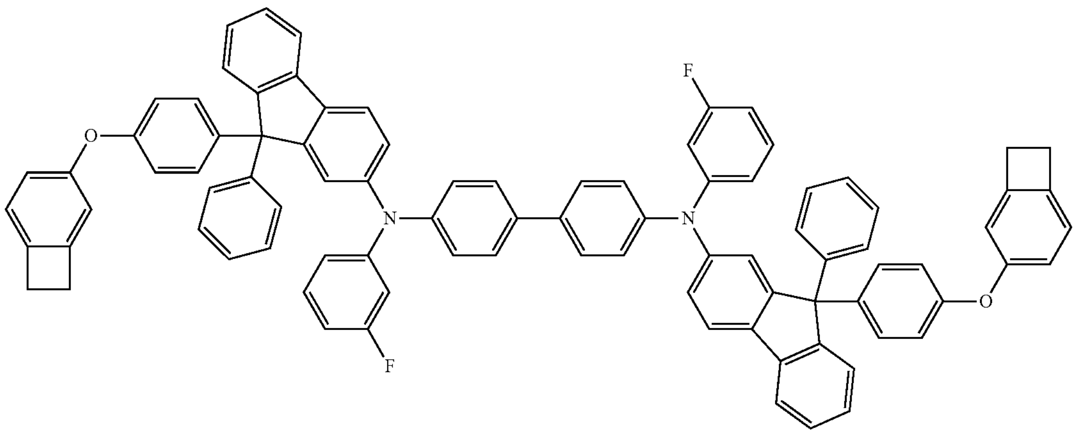
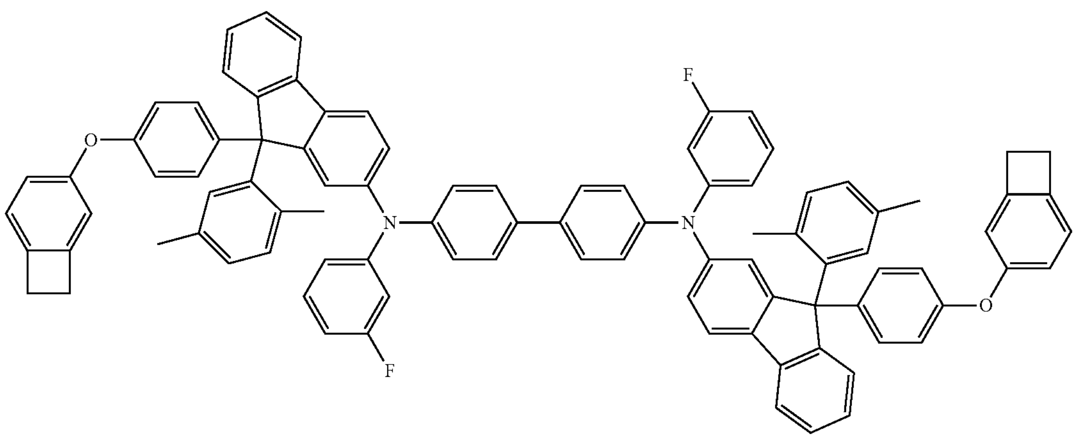
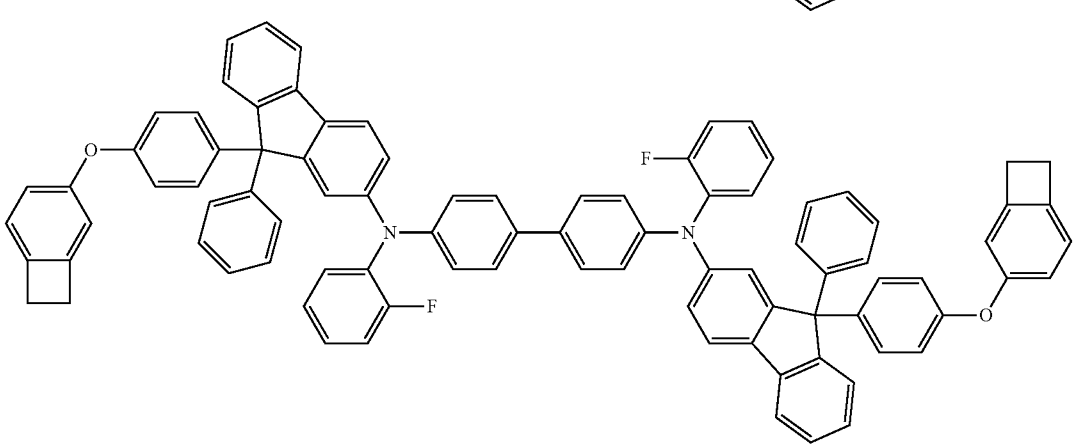

-continued
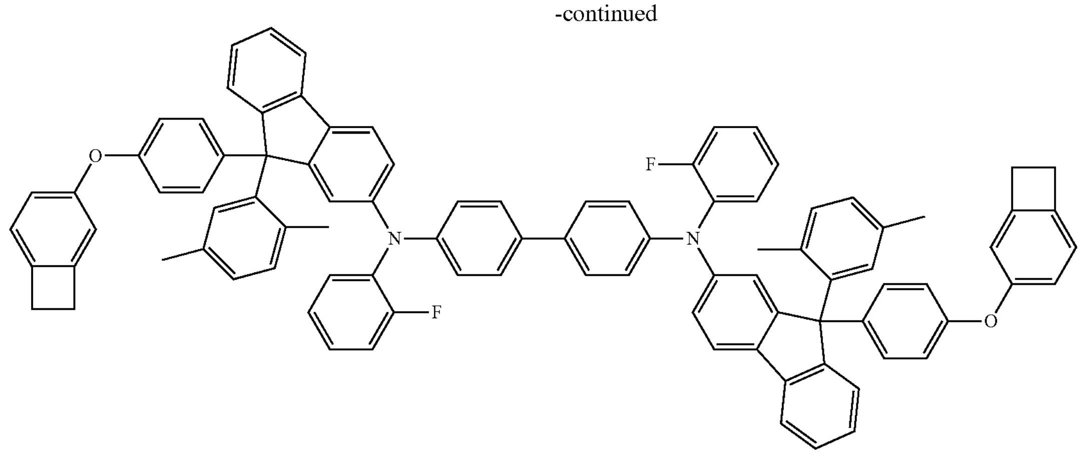
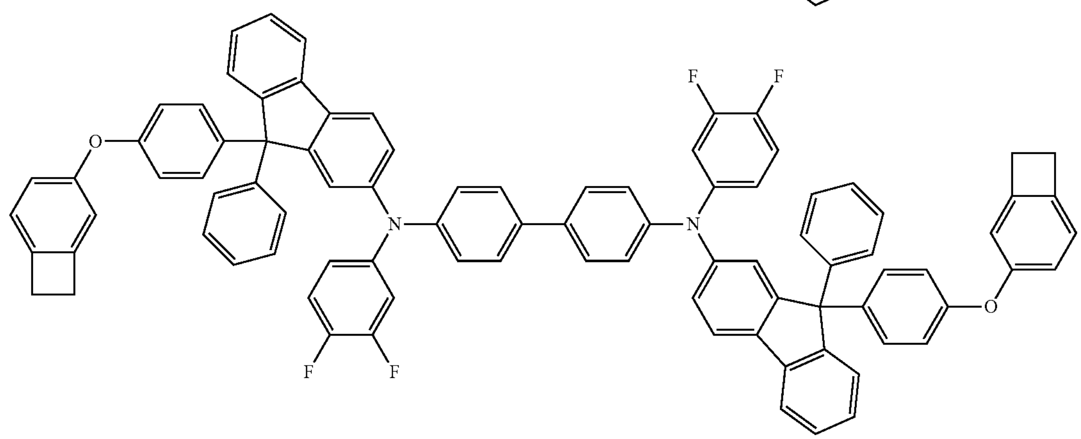
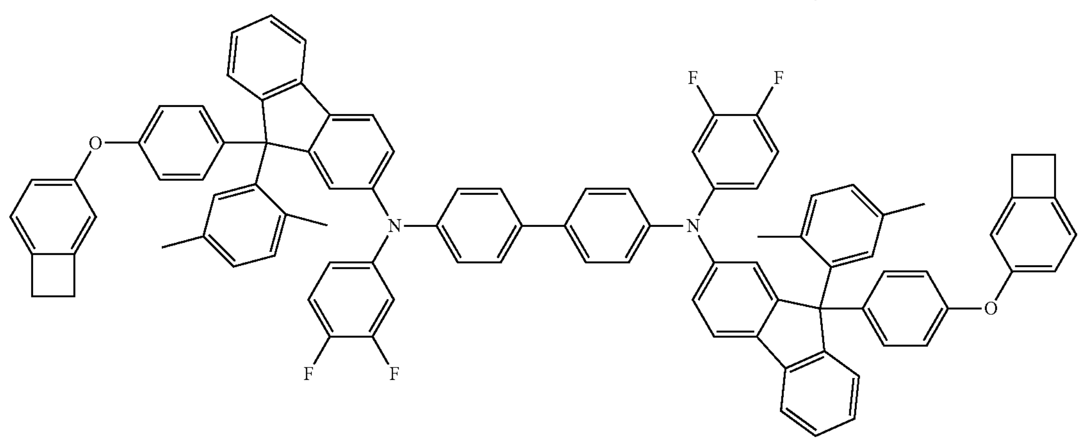
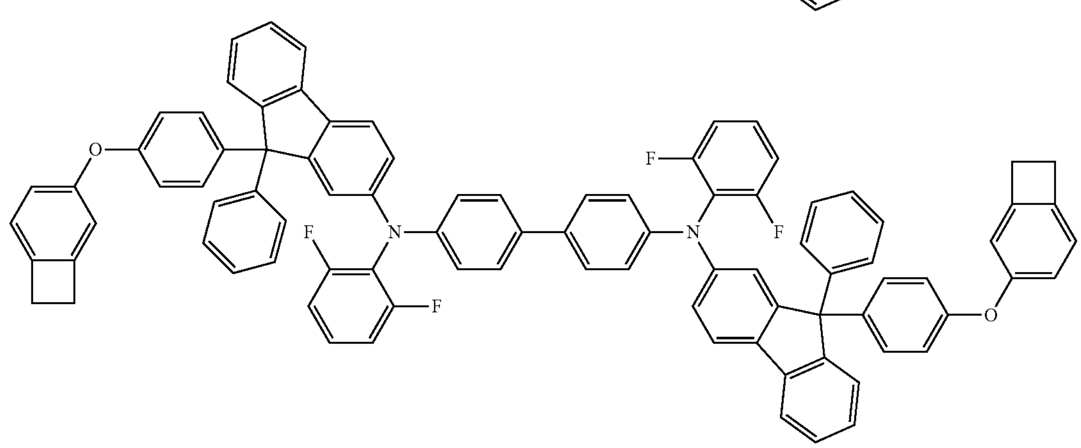

-continued
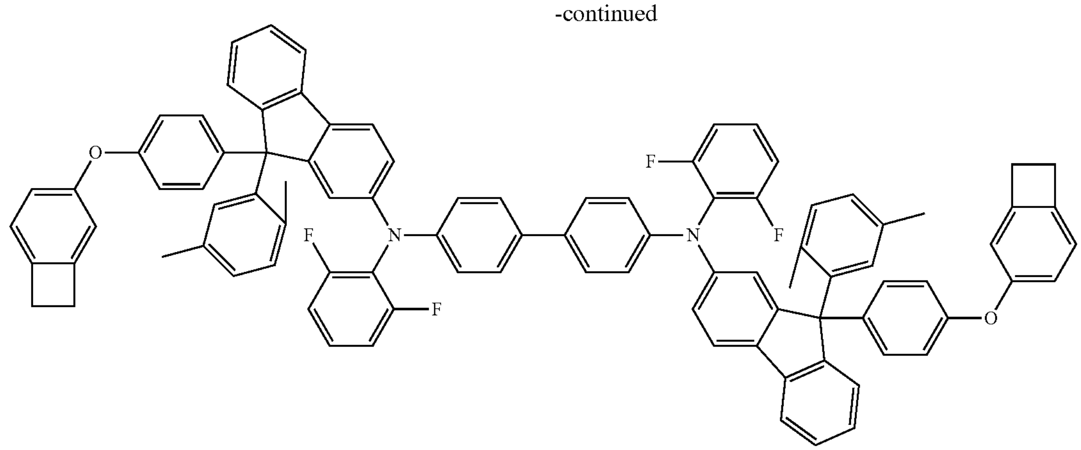
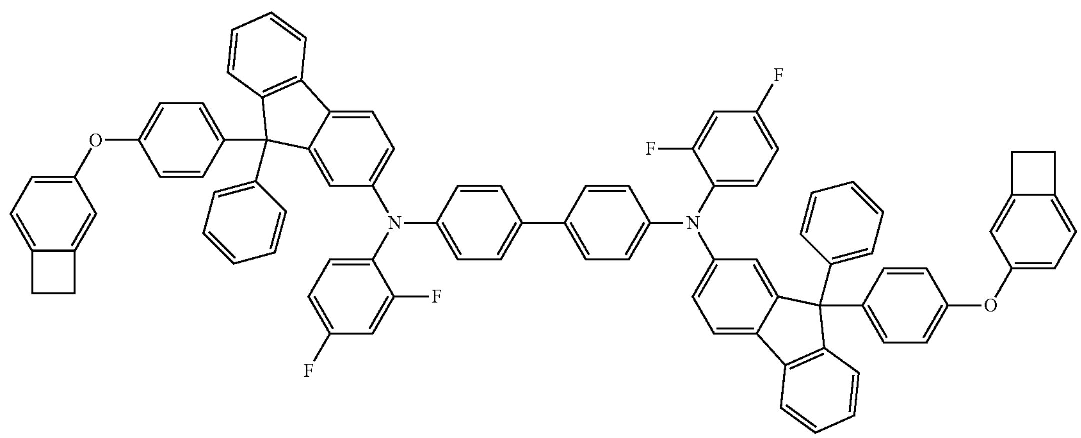
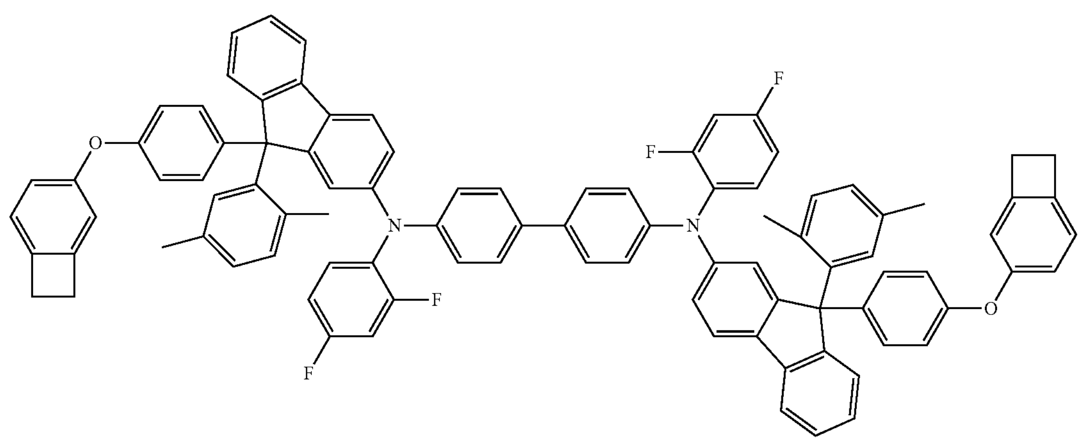

-continued
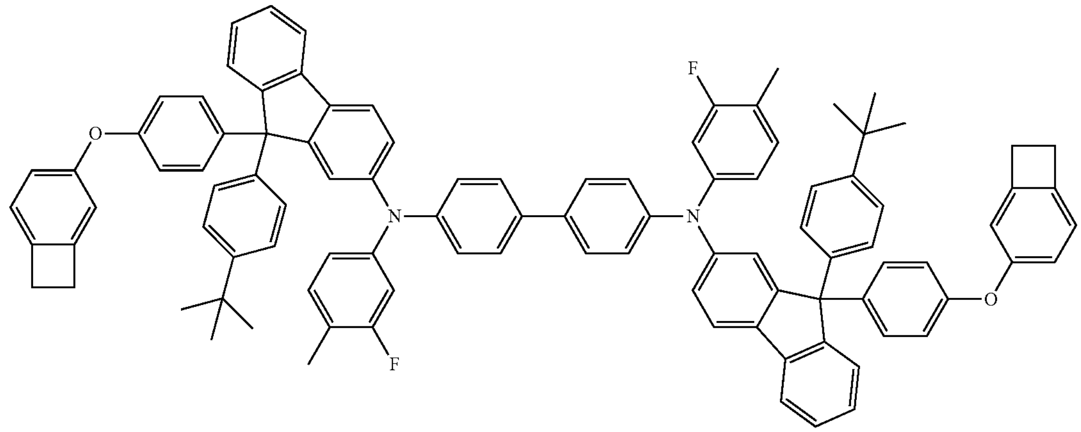
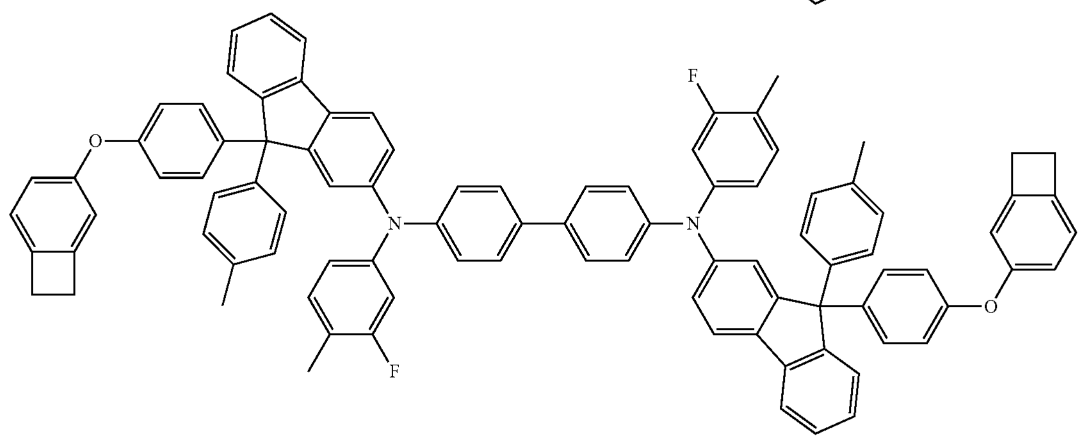
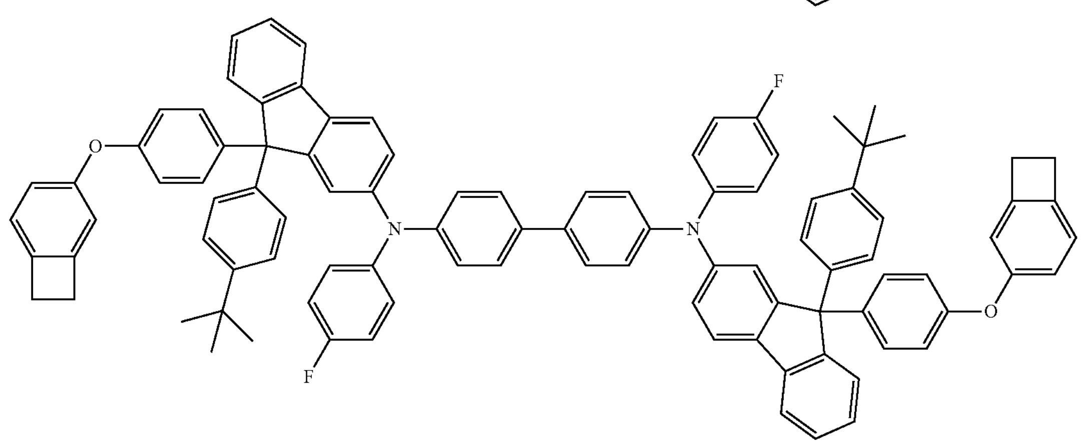
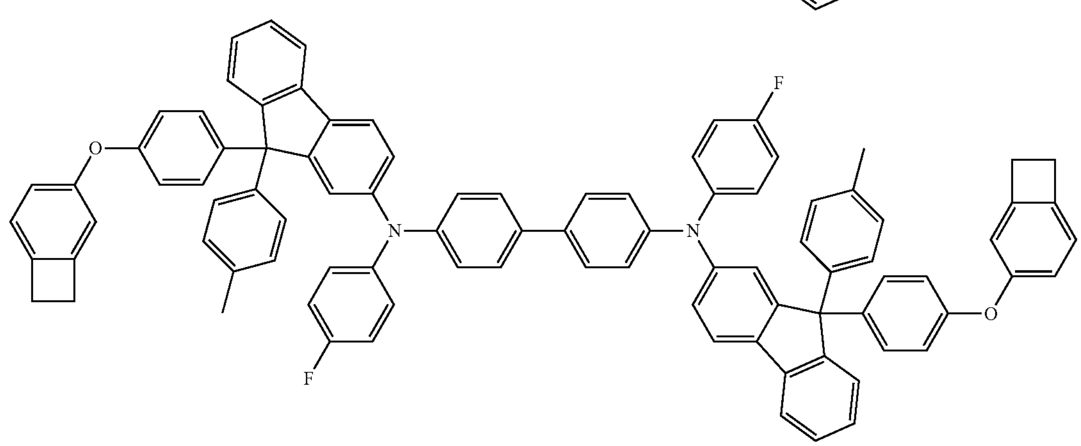

-continued
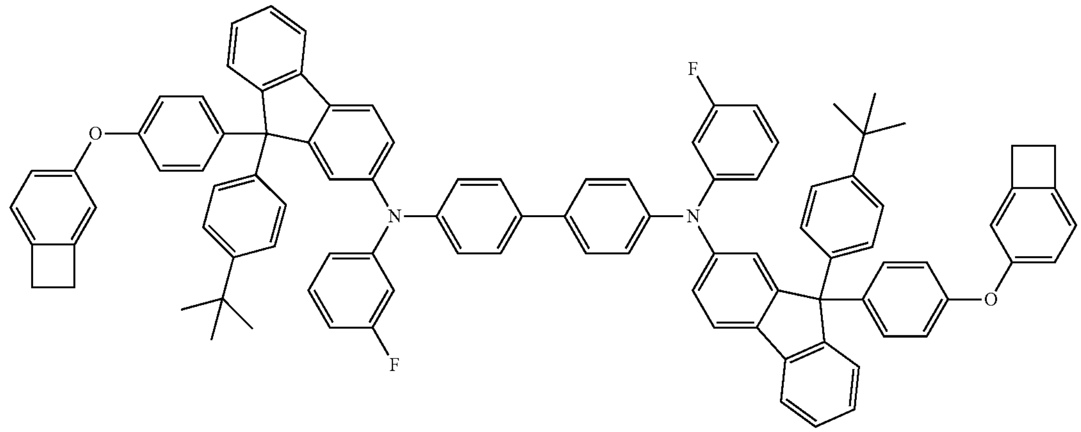
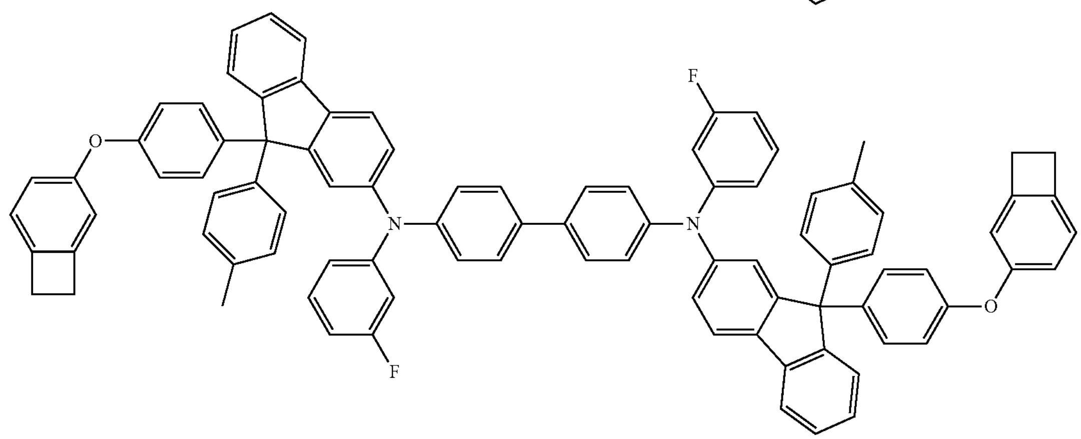
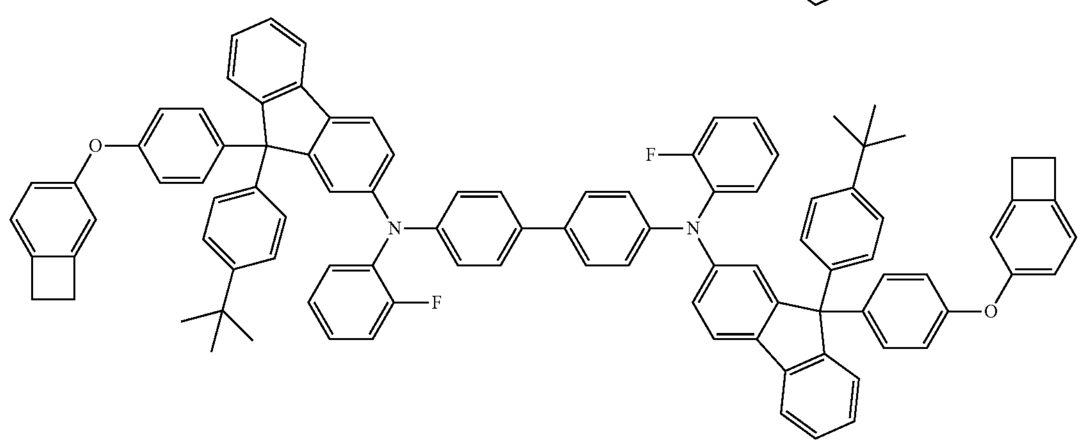
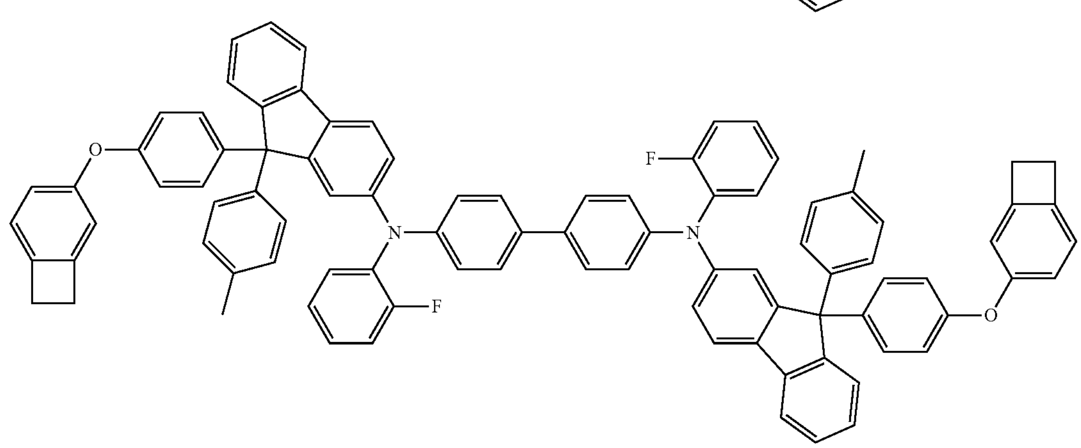

-continued
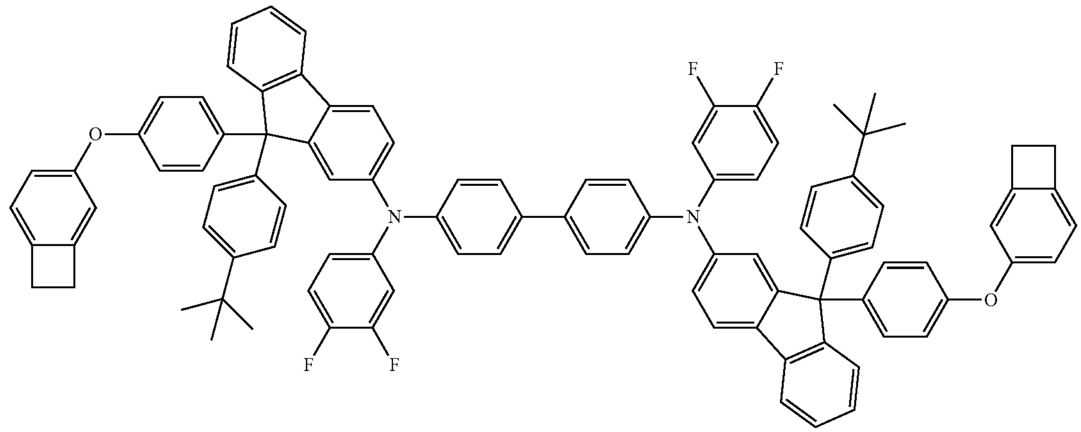
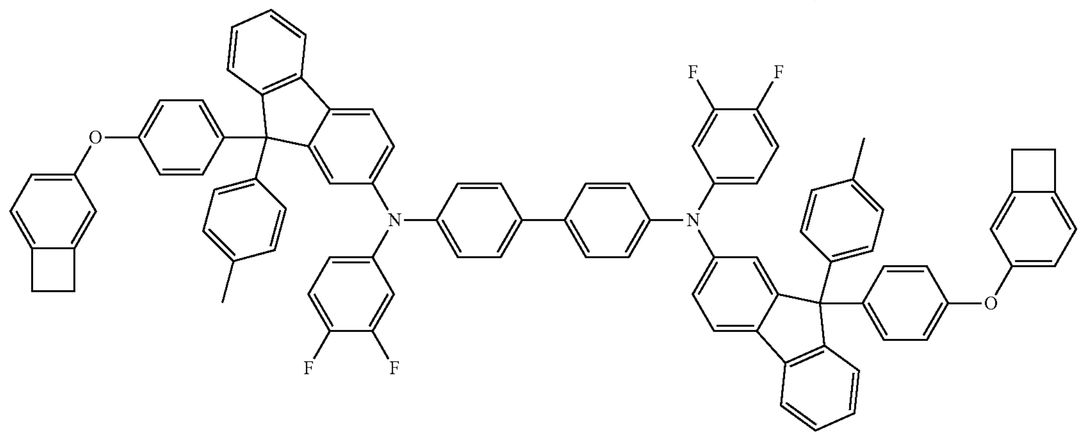
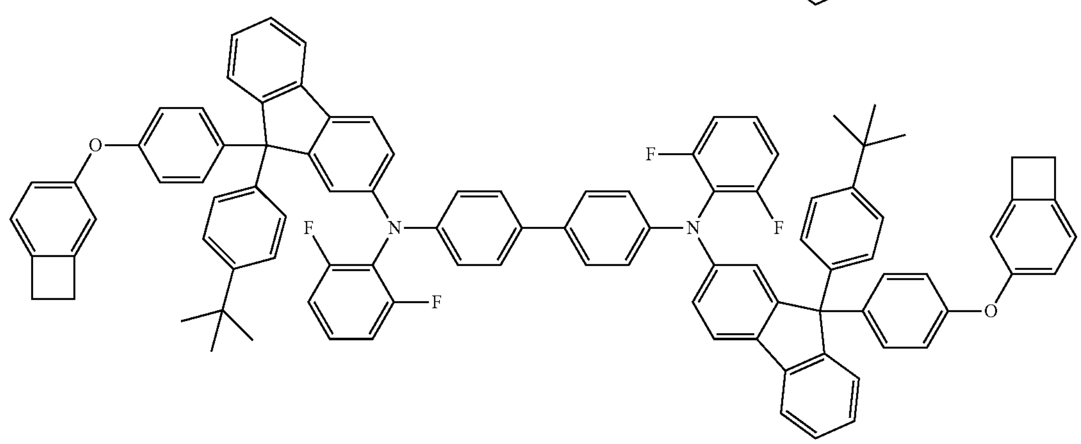
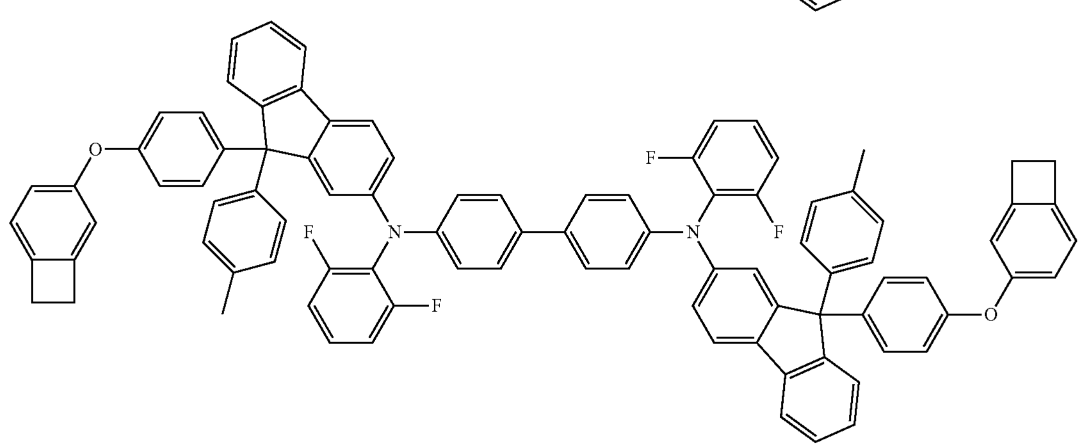

-continued
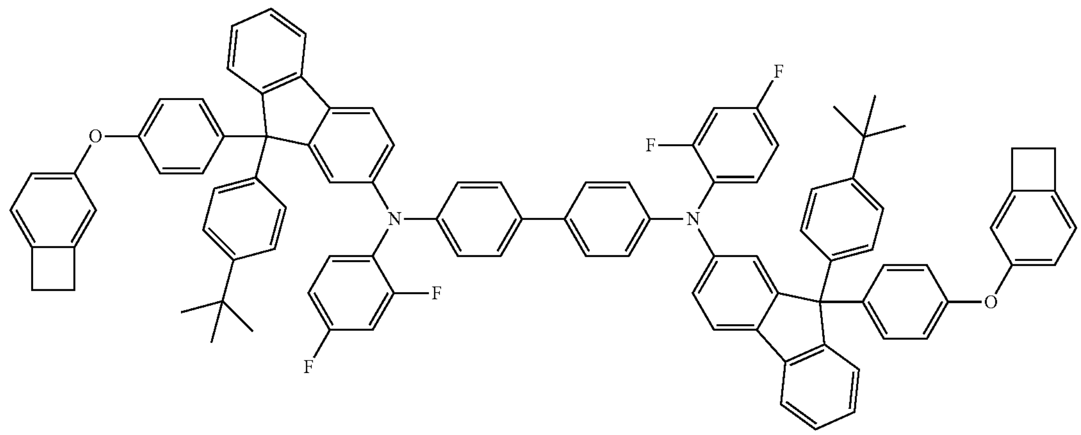
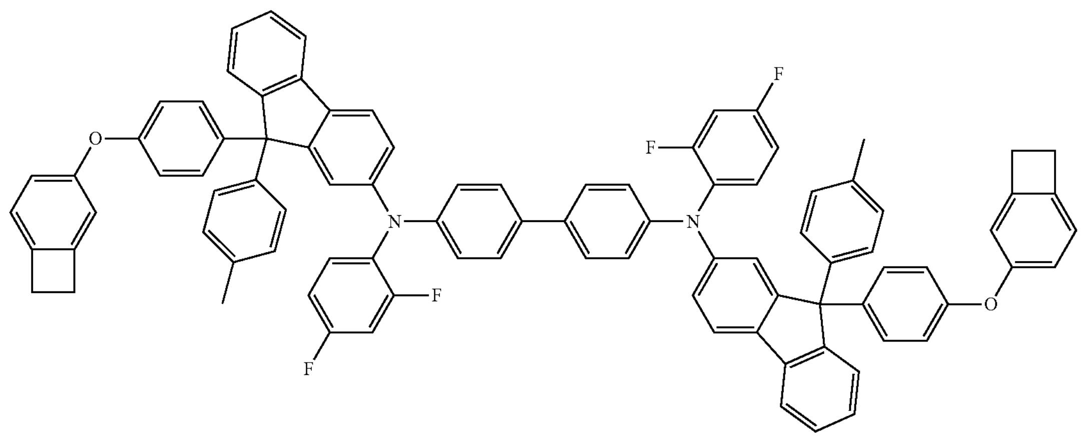
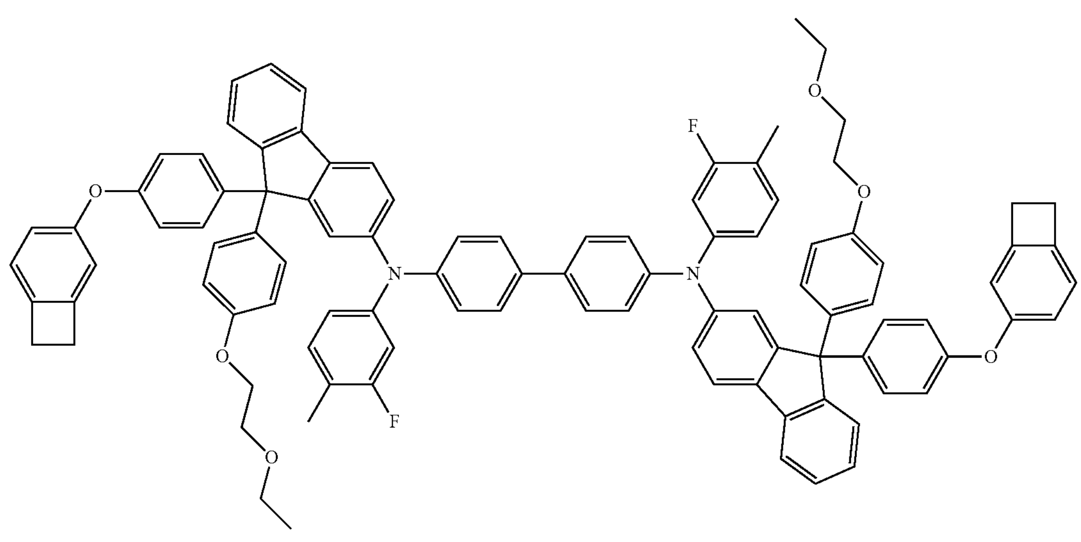

-continued
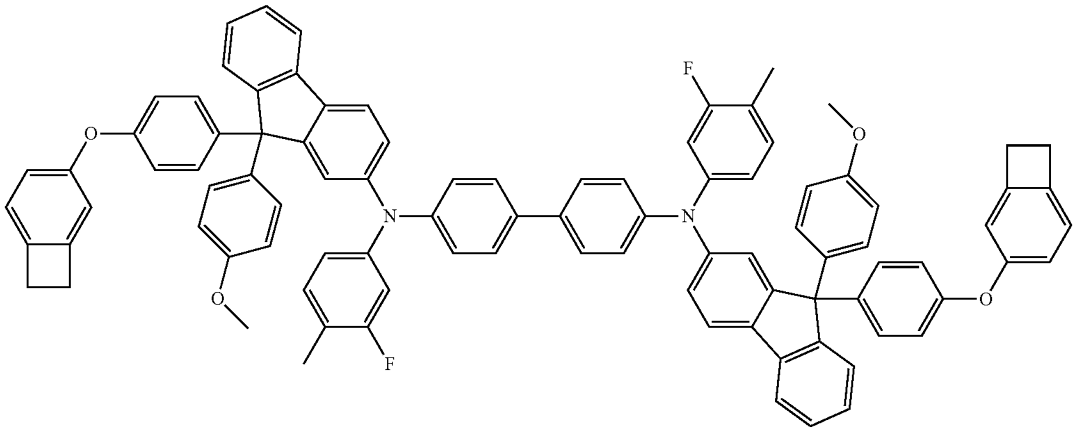
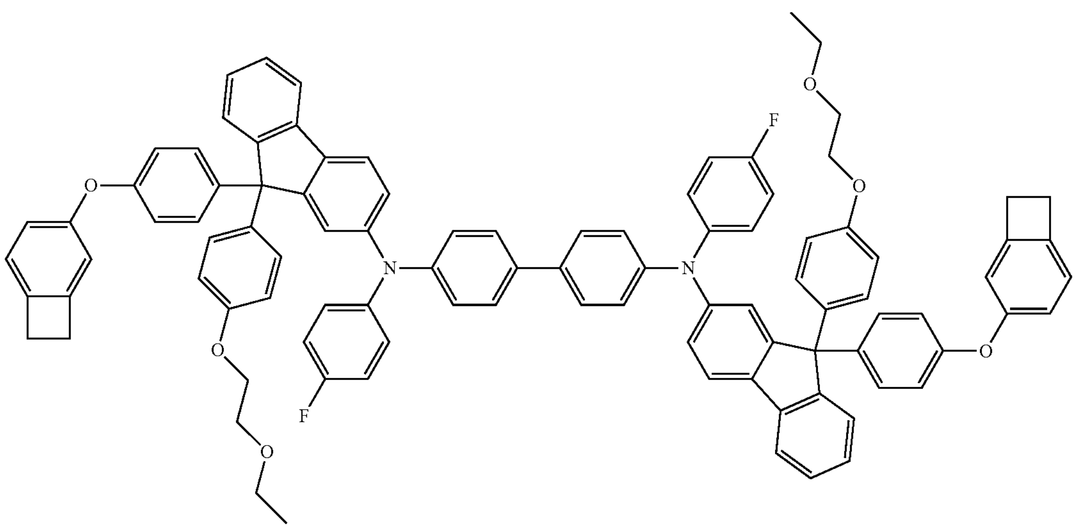
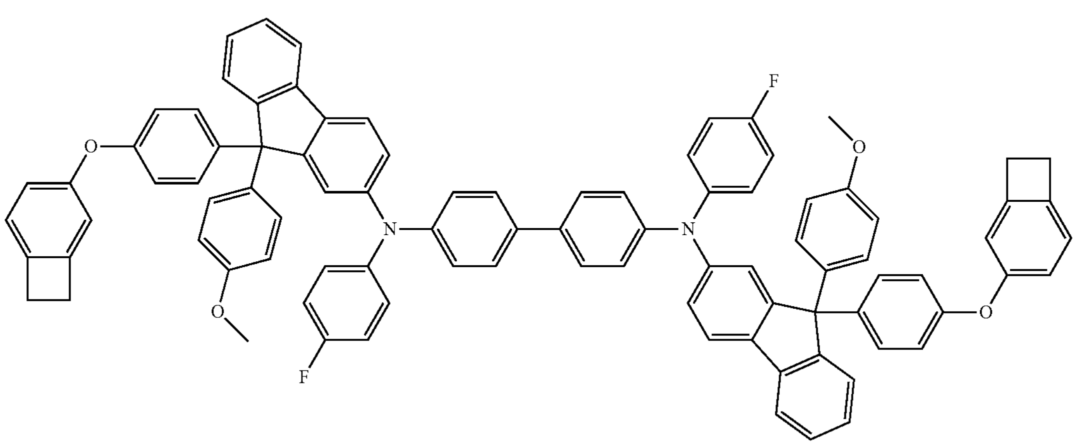

-continued
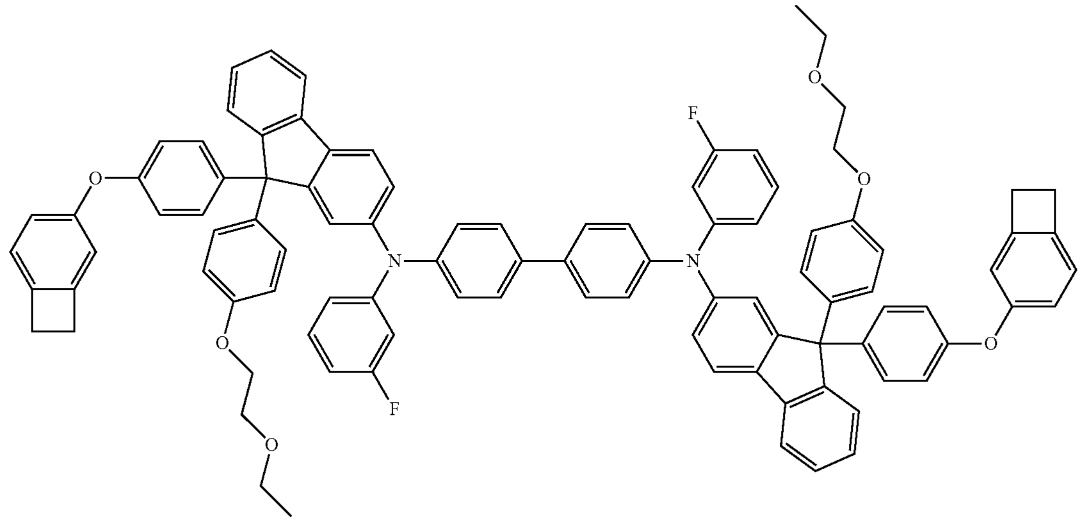
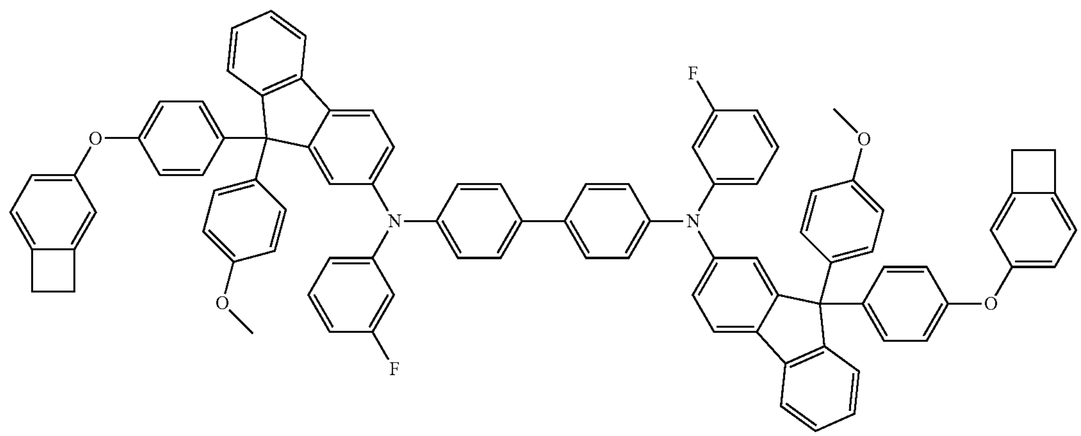
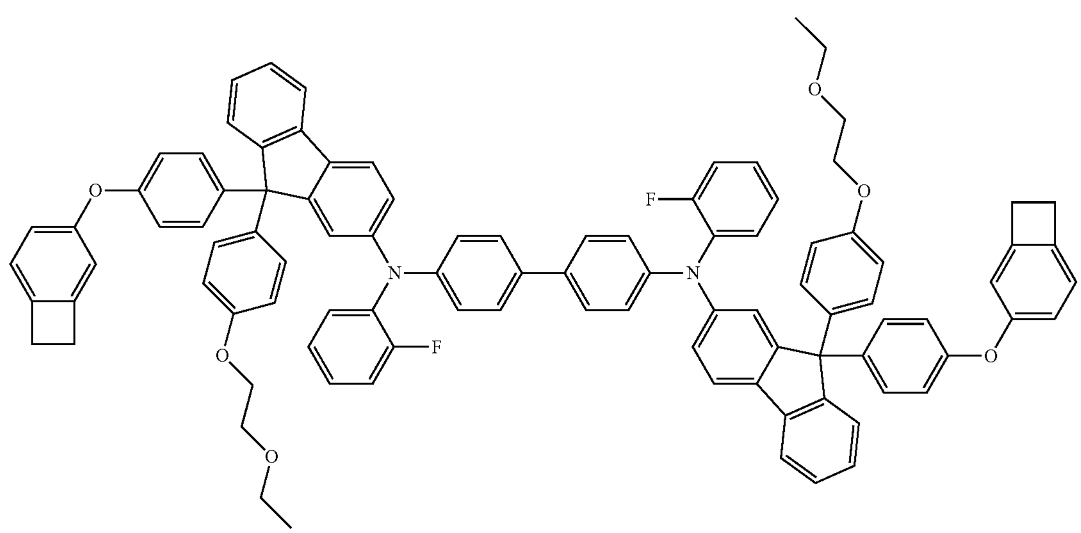

-continued
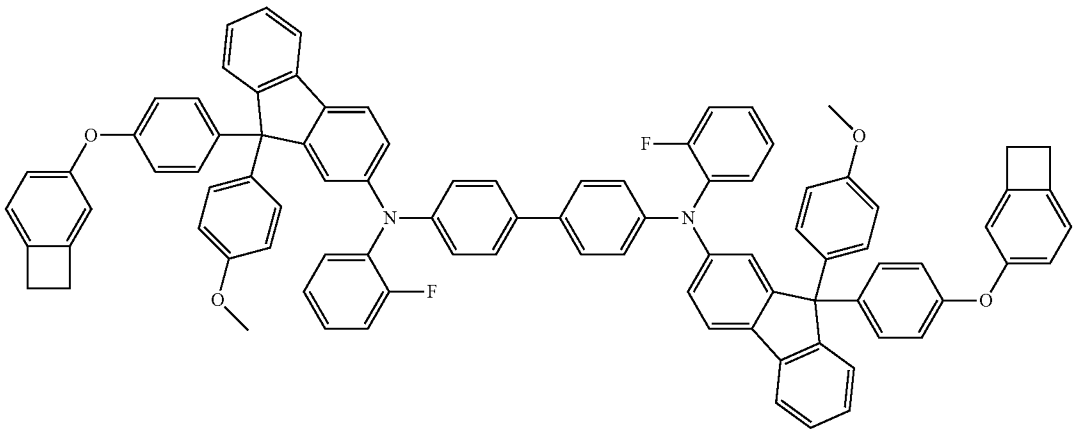
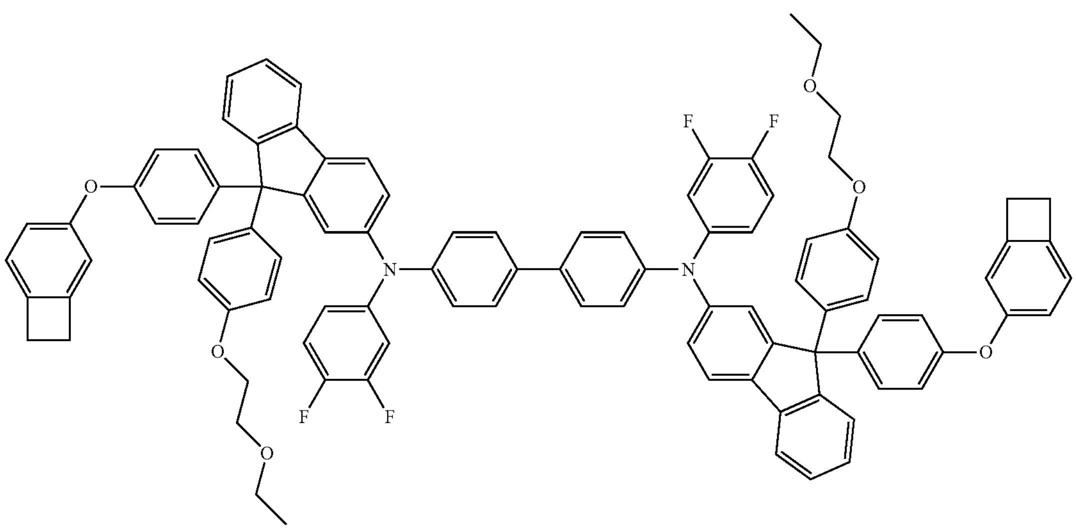
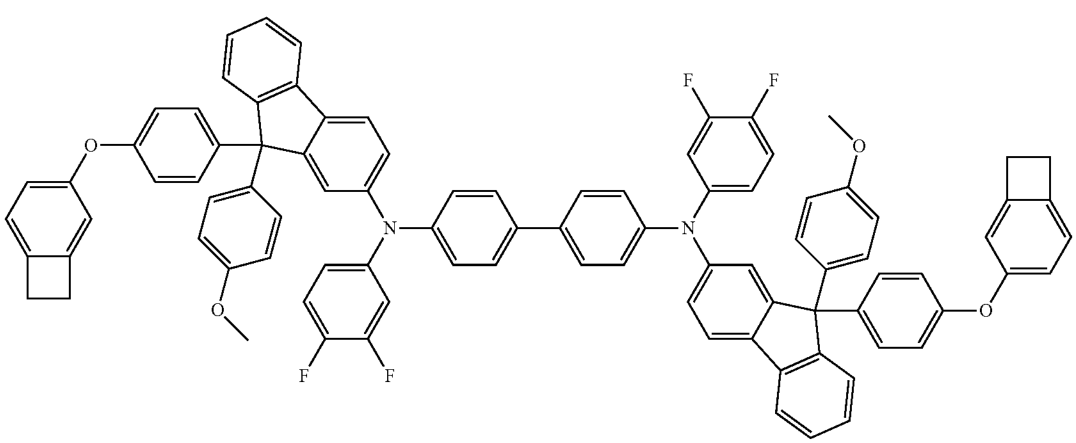

-continued
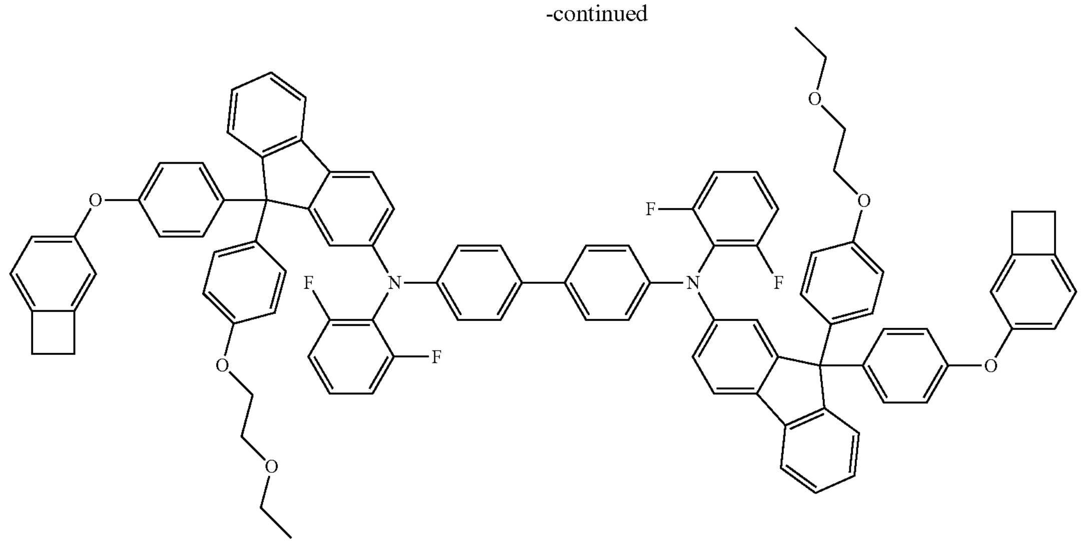
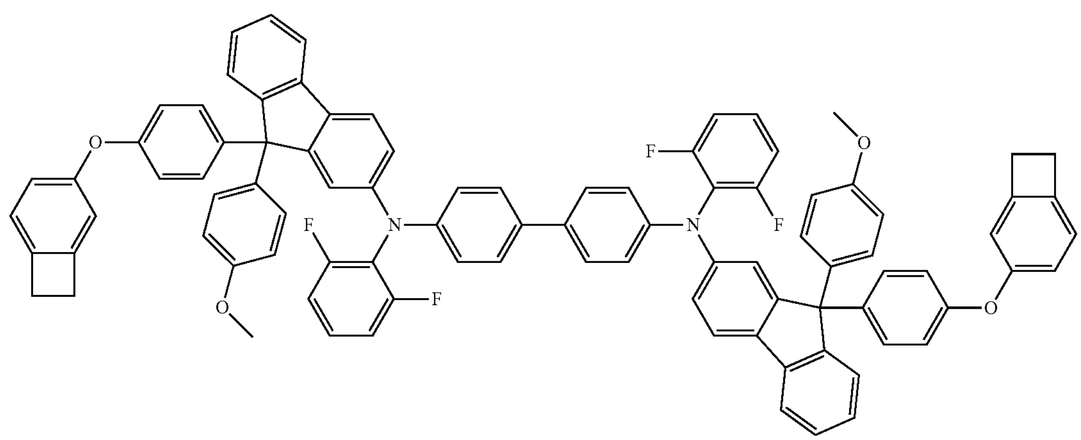
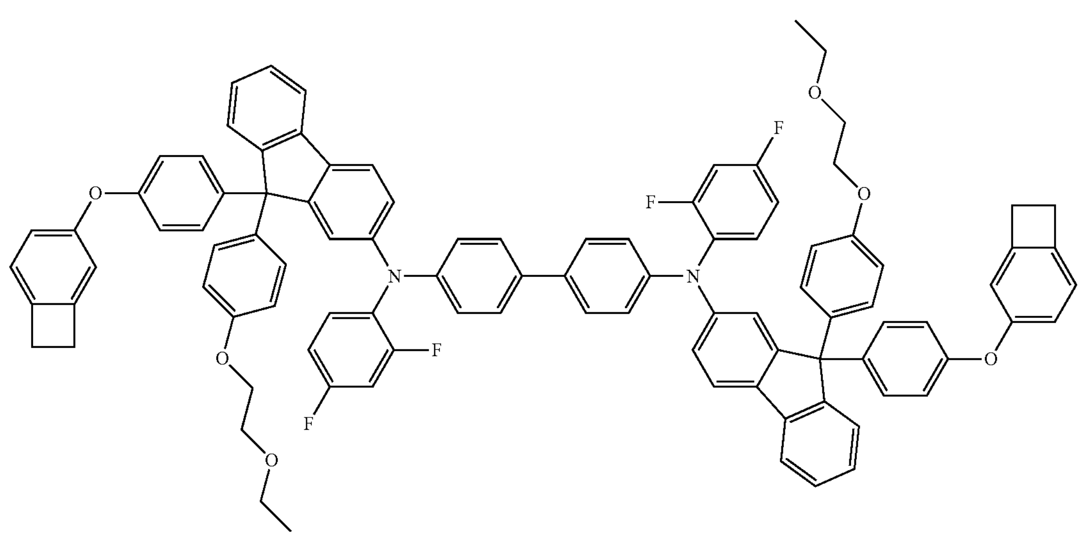

-continued
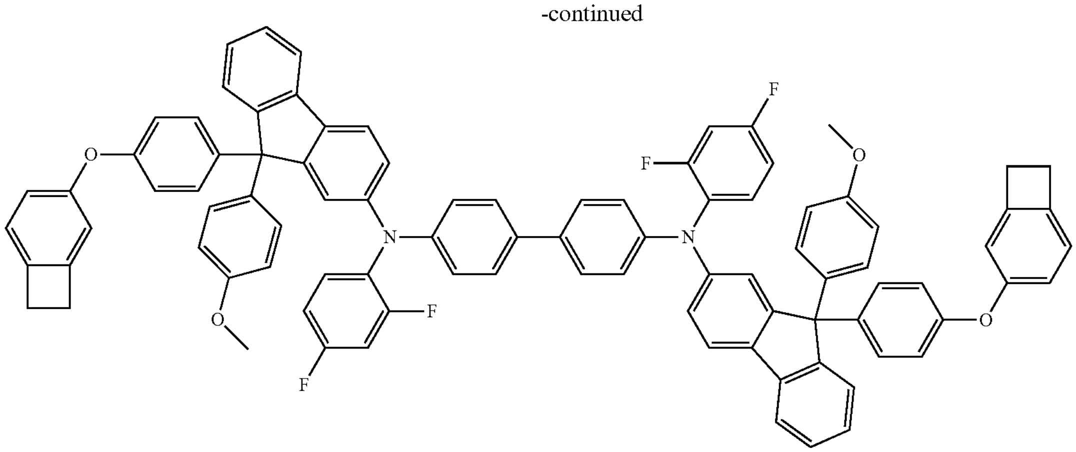
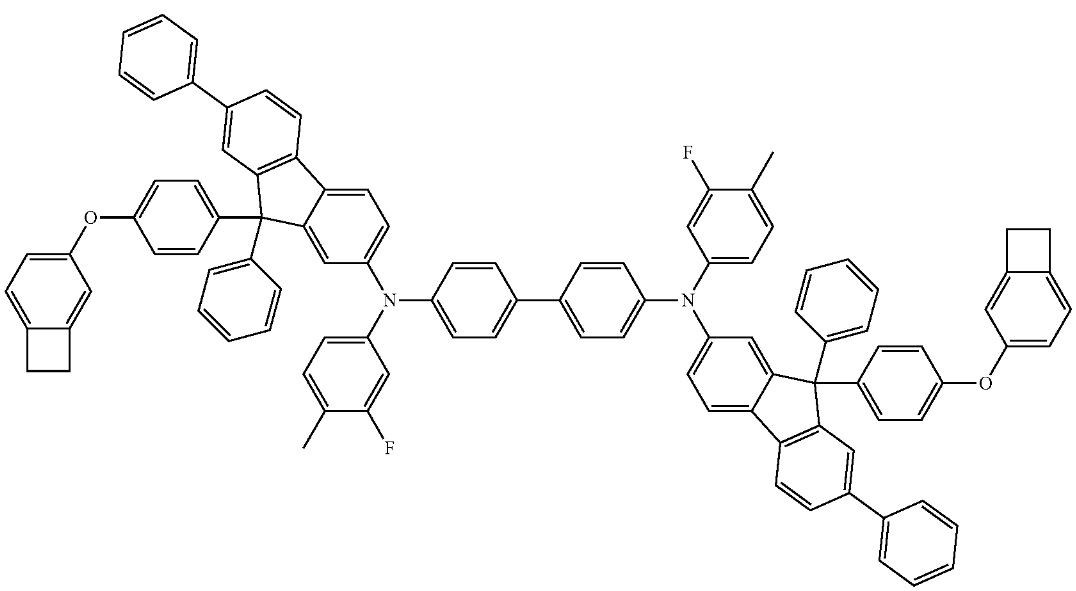
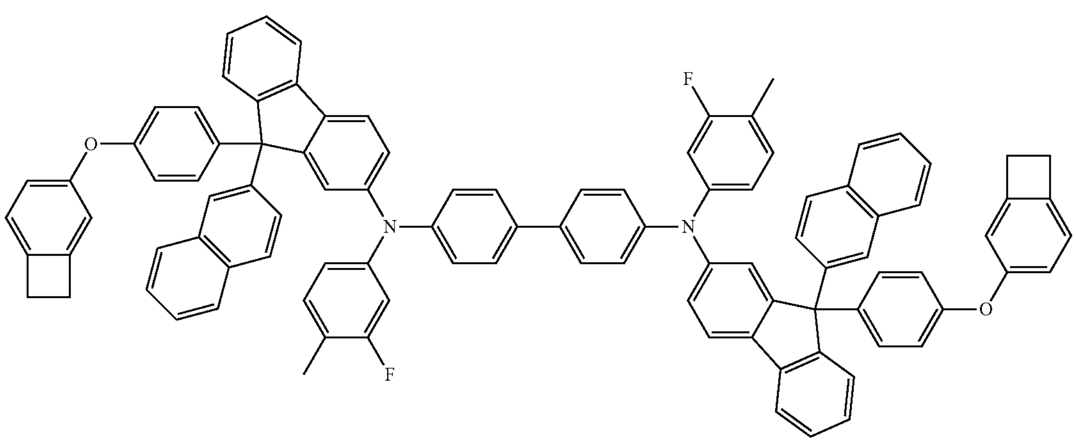

-continued
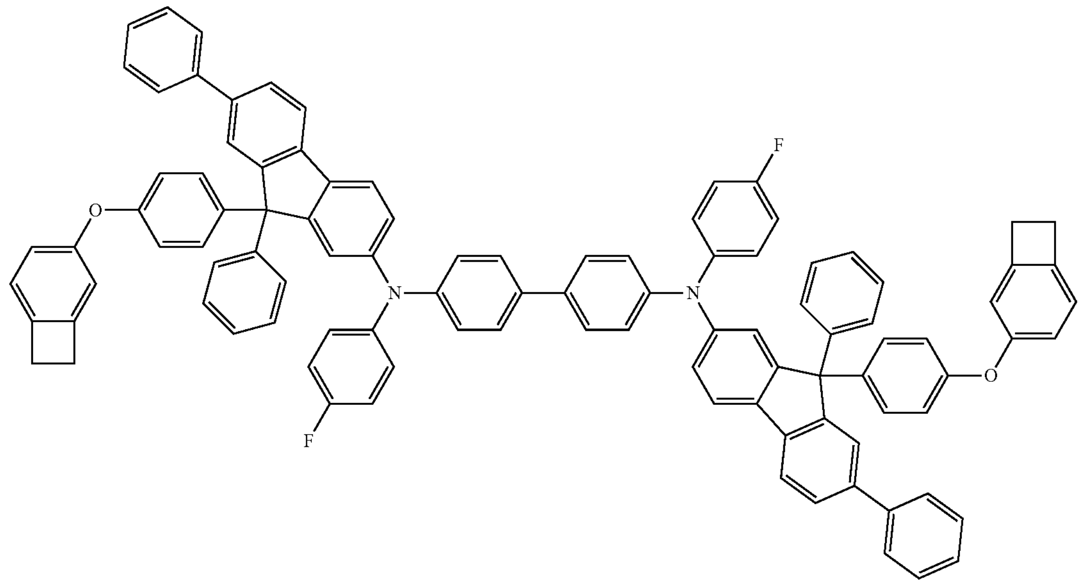
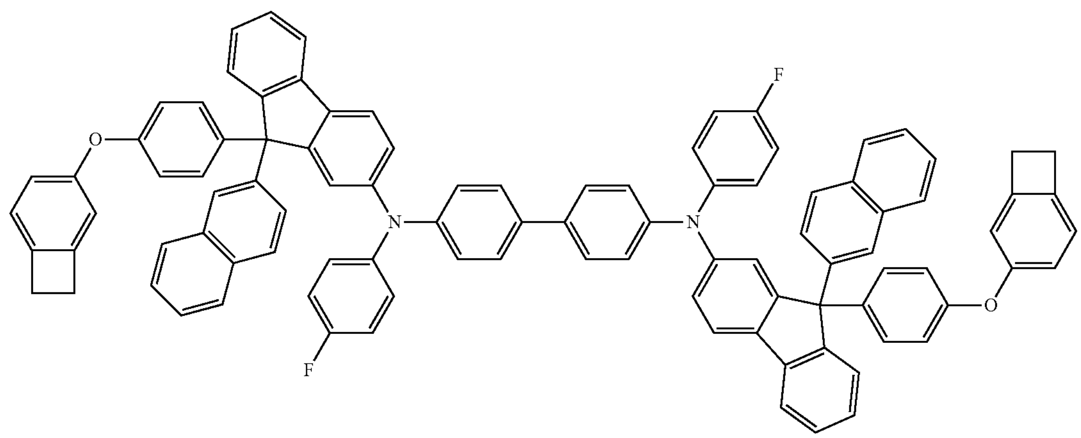
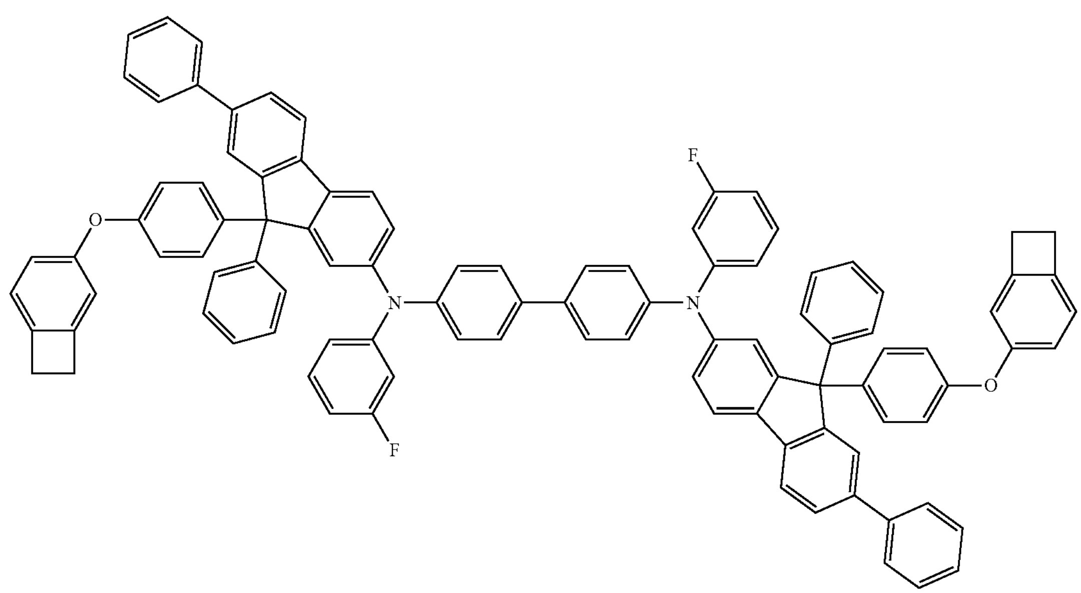

-continued
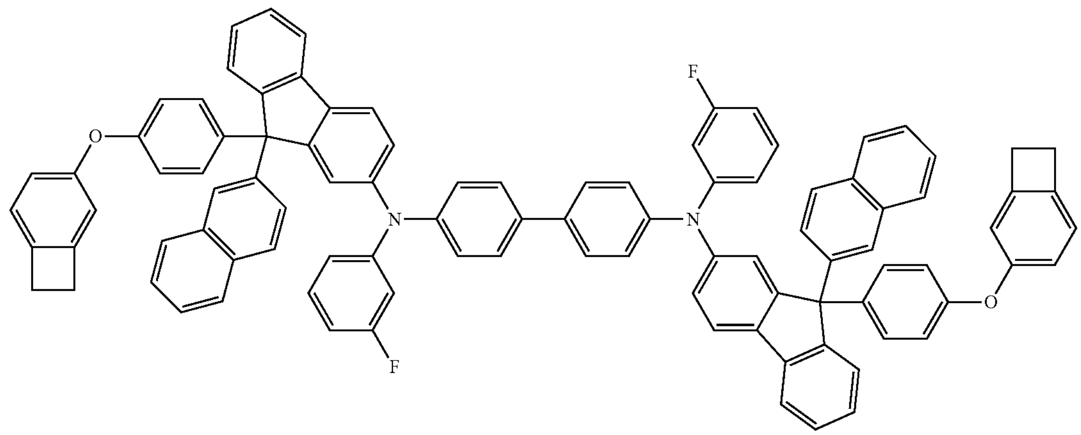
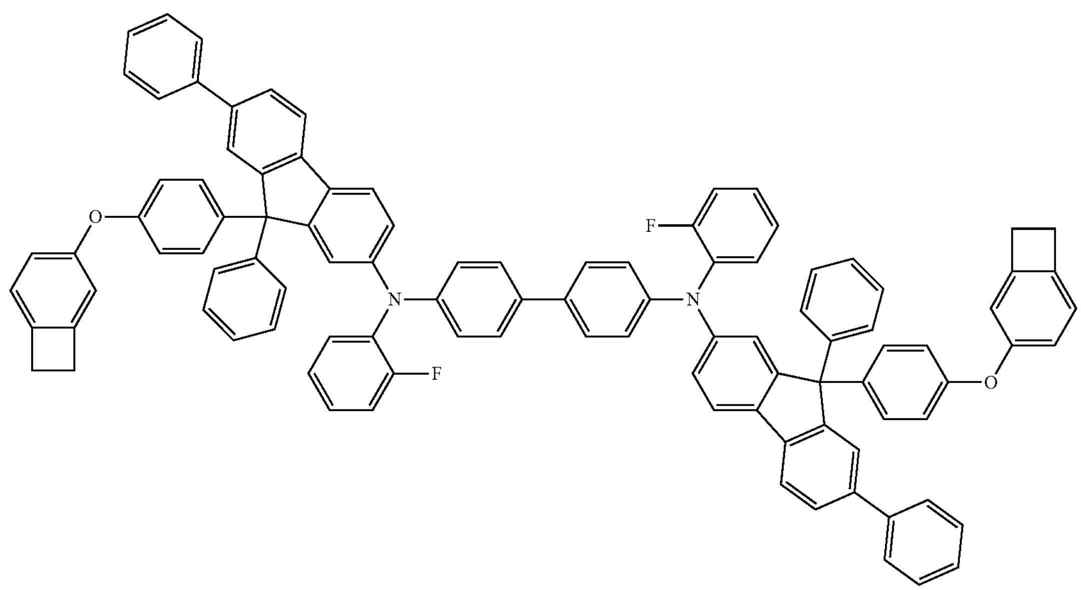
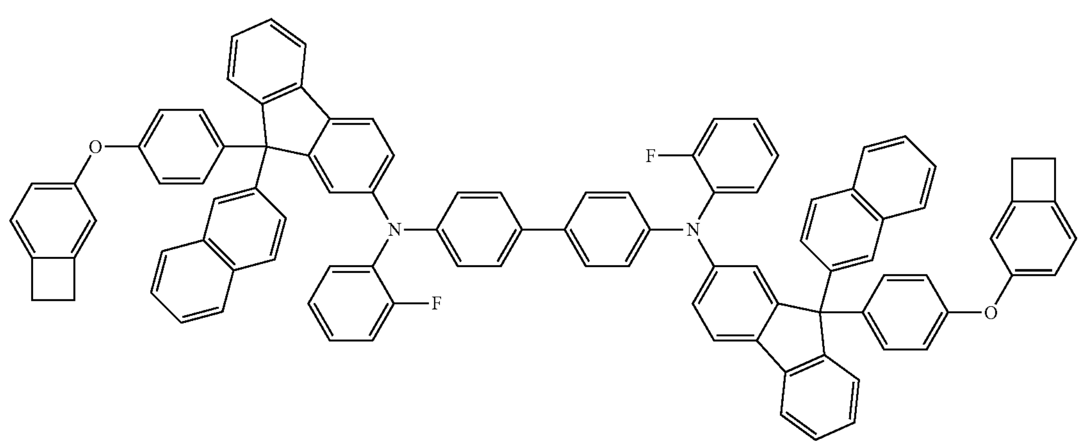

-continued
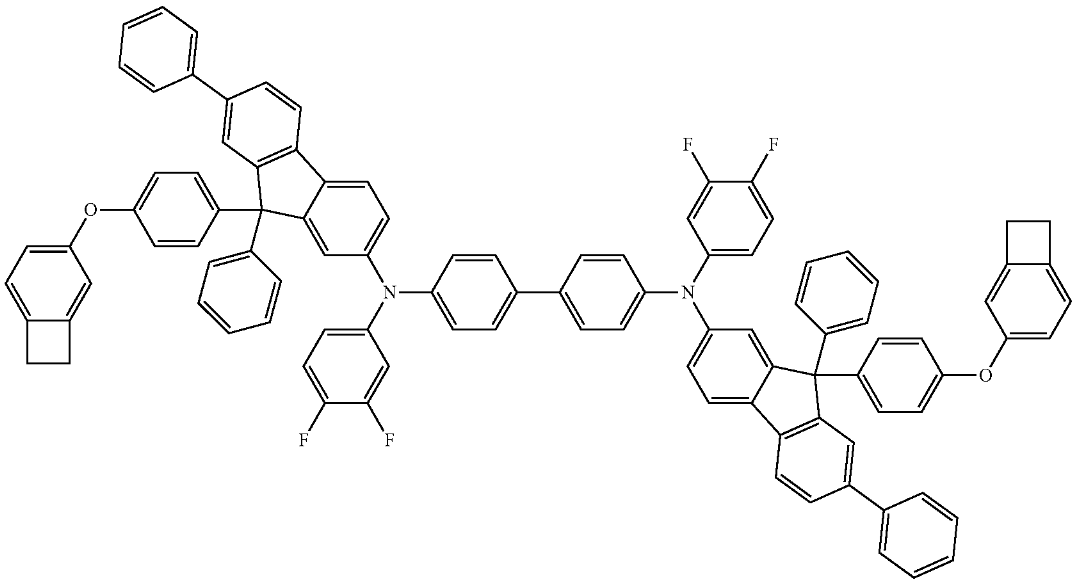
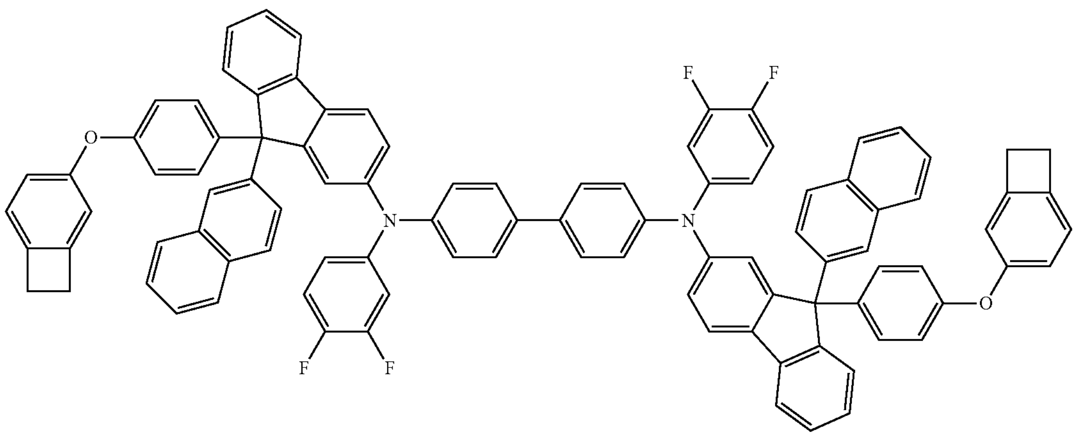
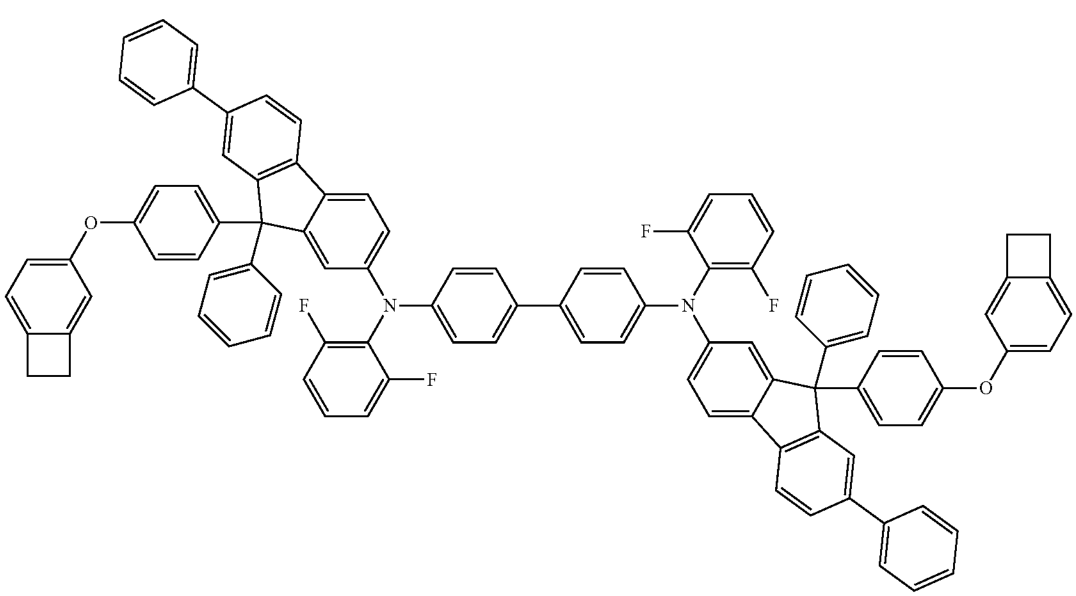

-continued
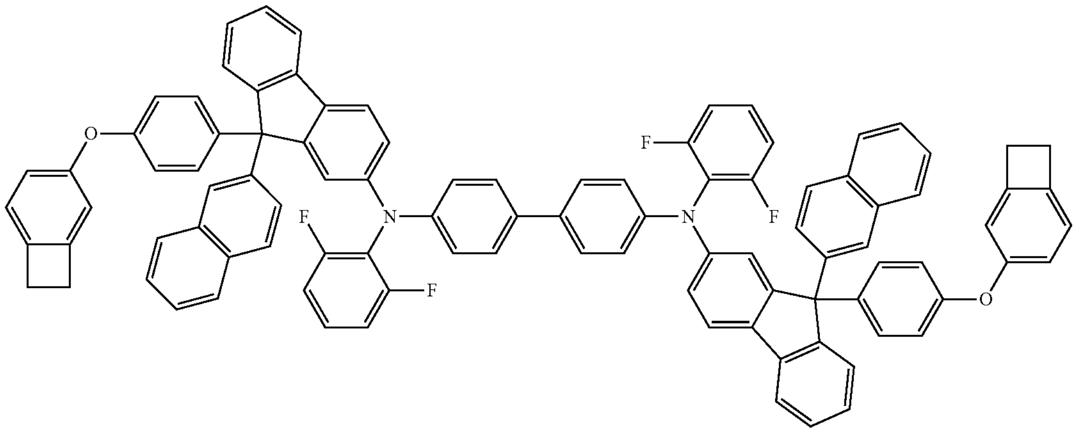
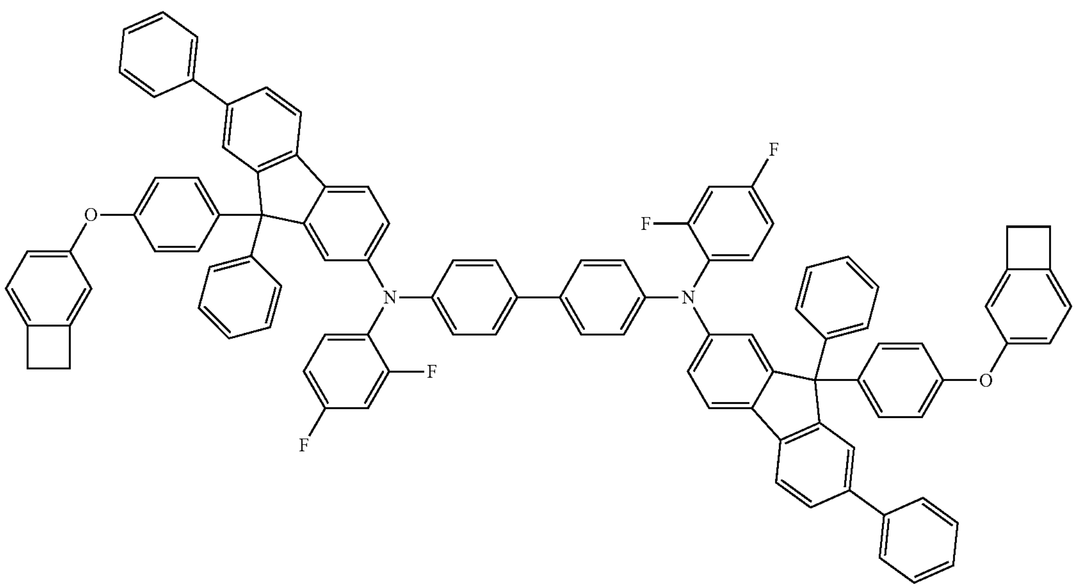
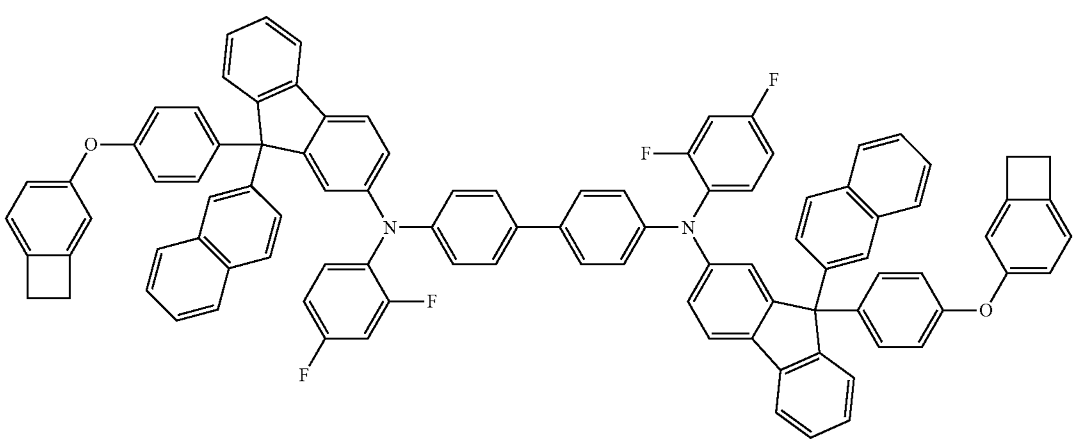

-continued
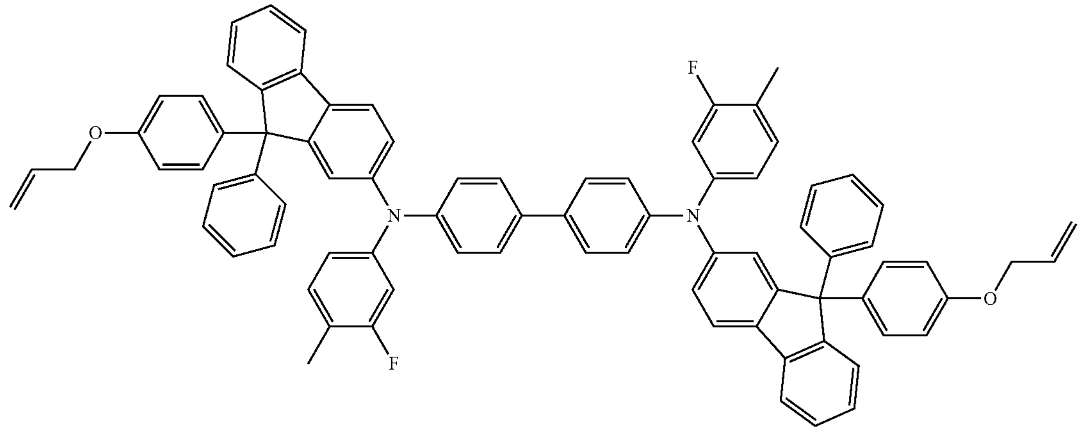
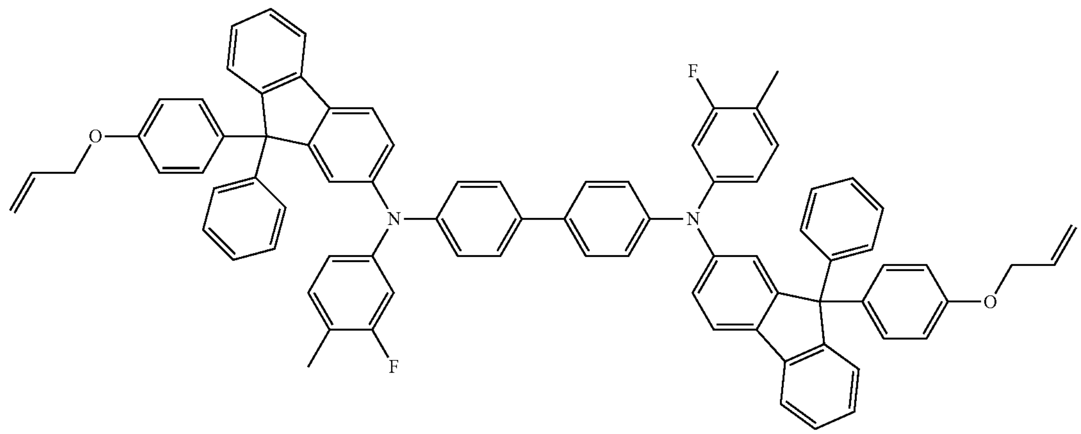
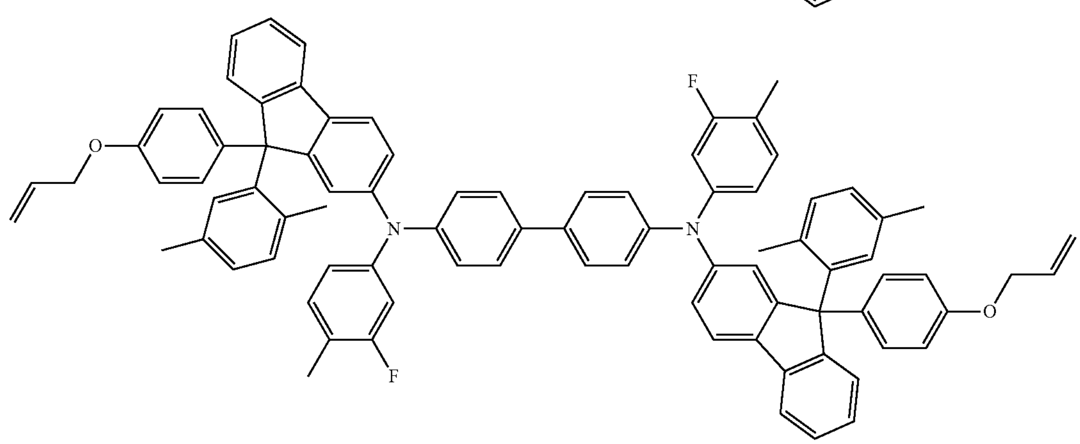
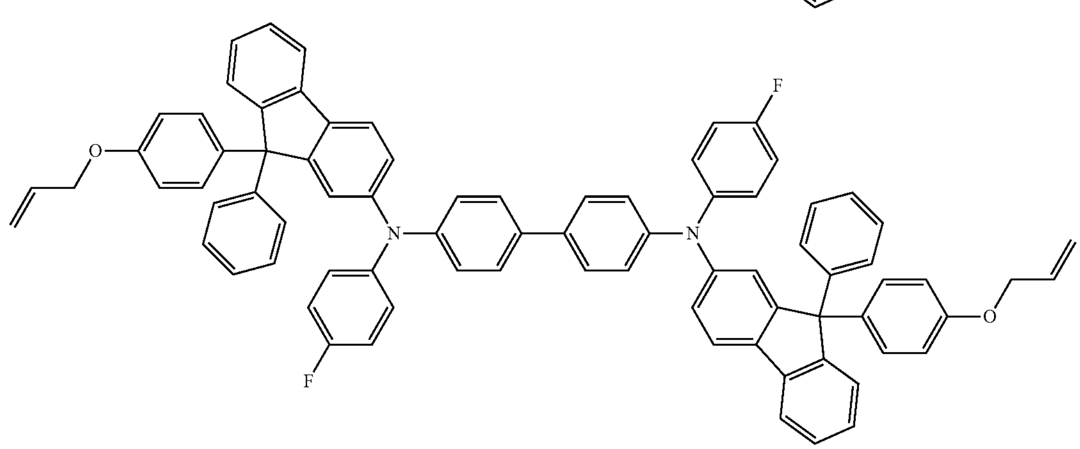

-continued
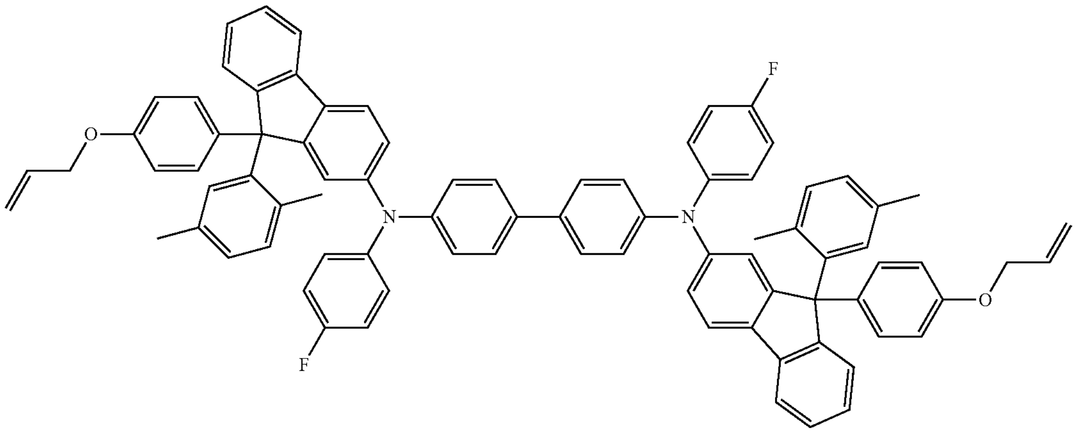
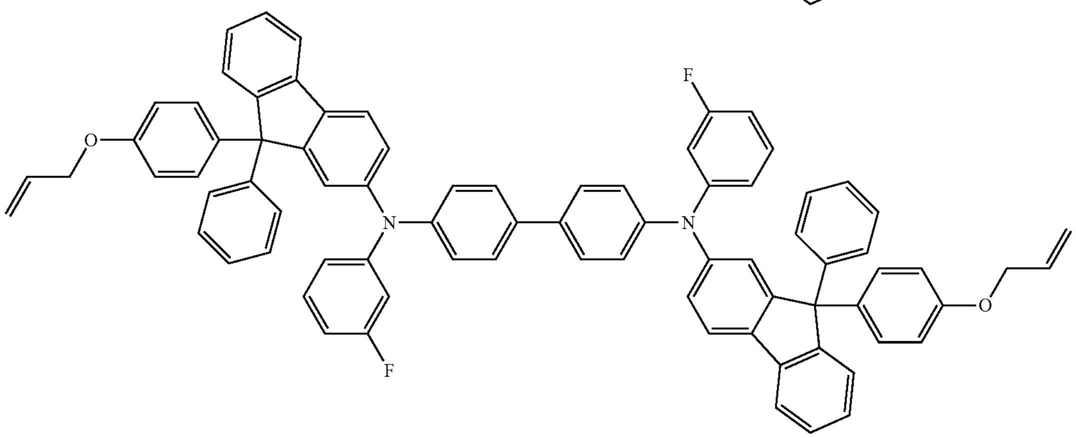
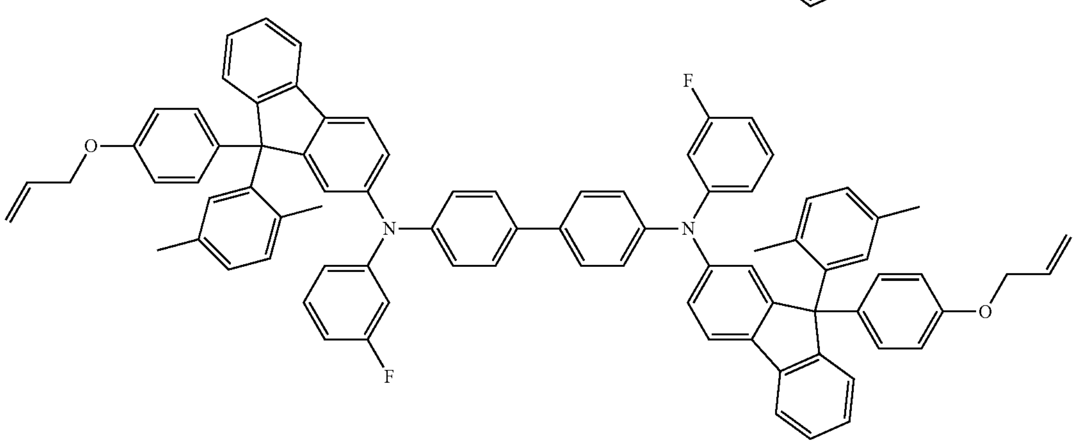
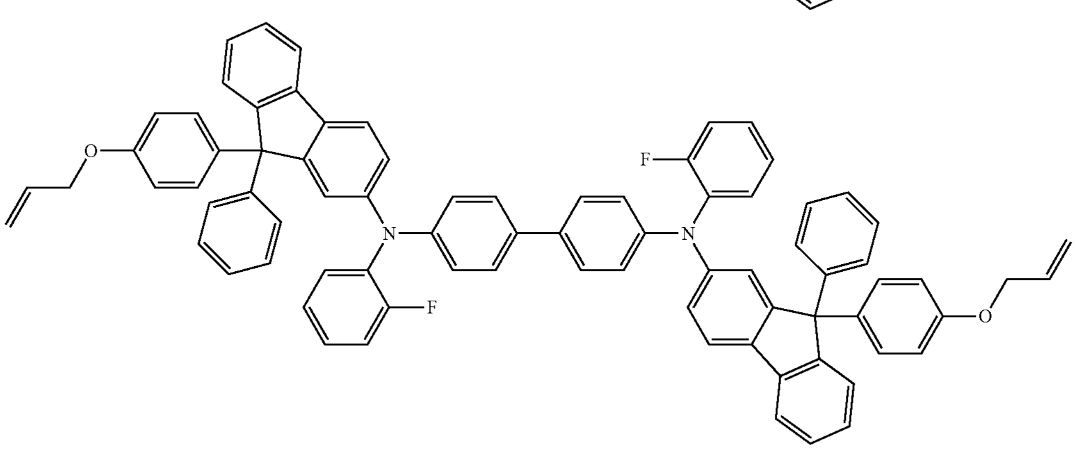

-continued
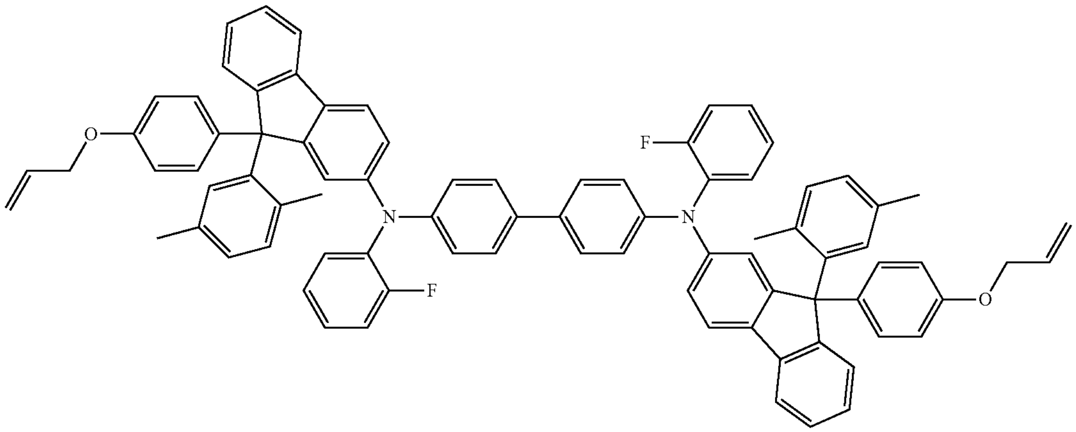
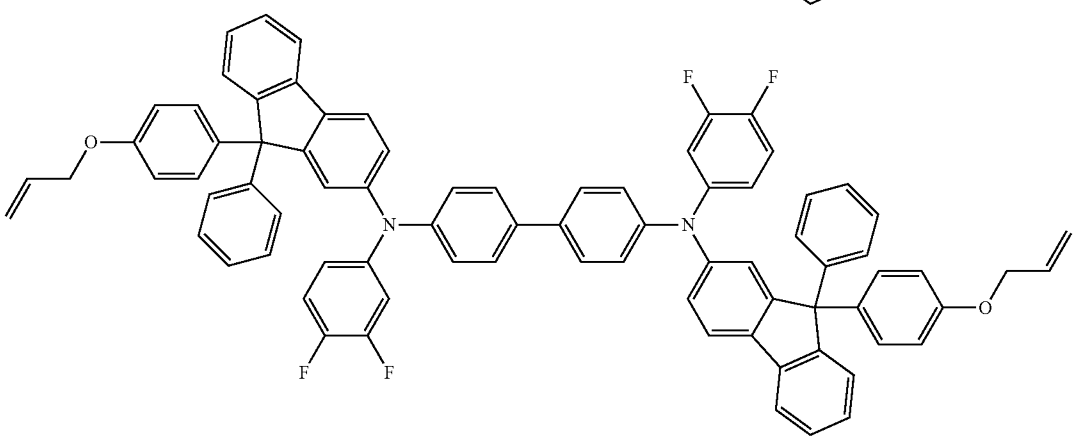
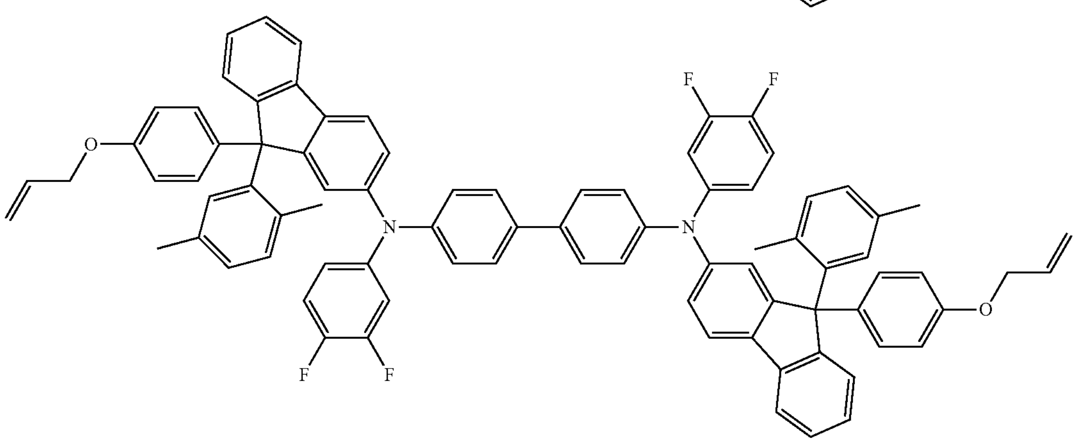
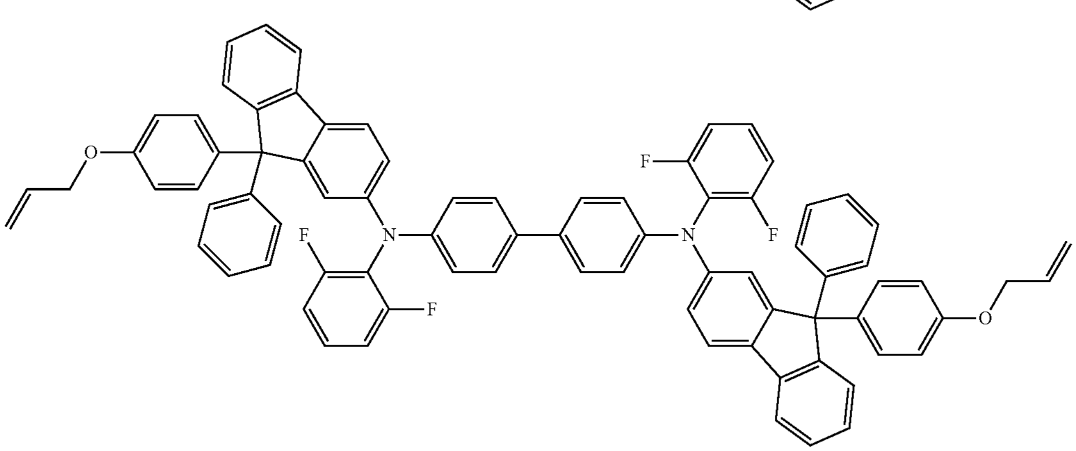

-continued
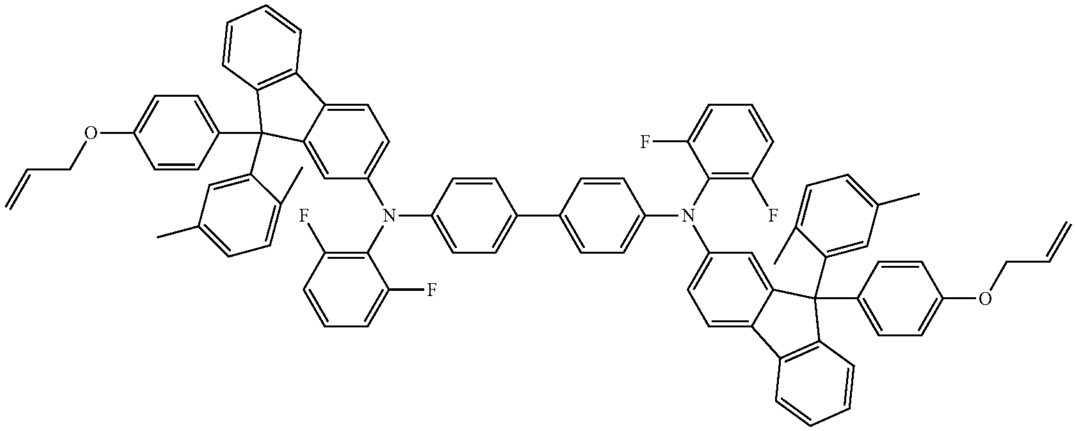
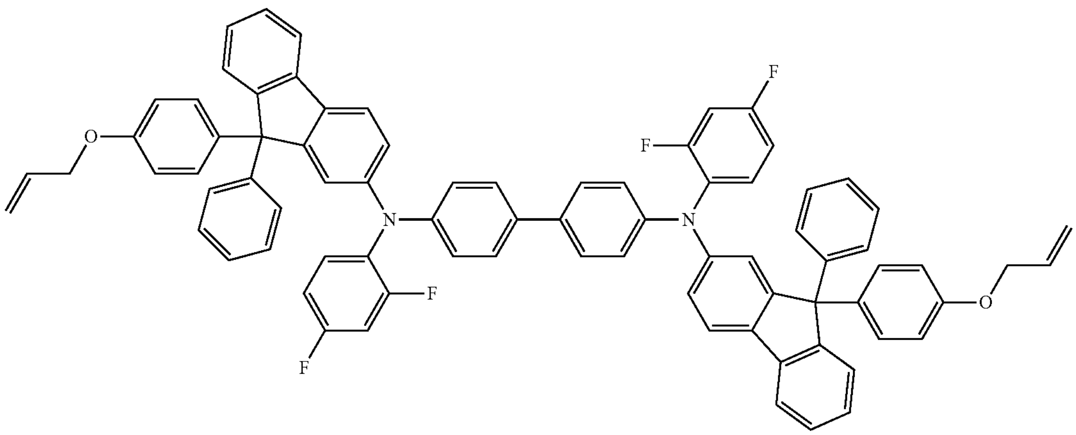
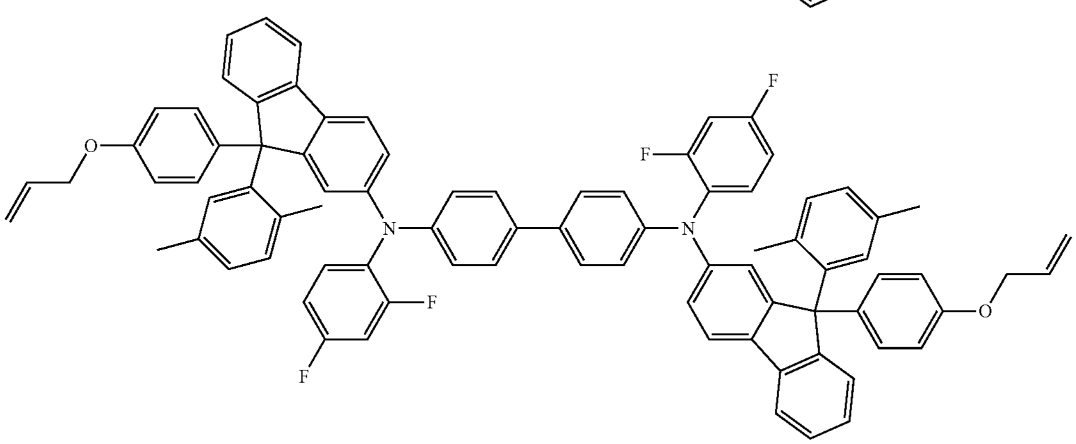
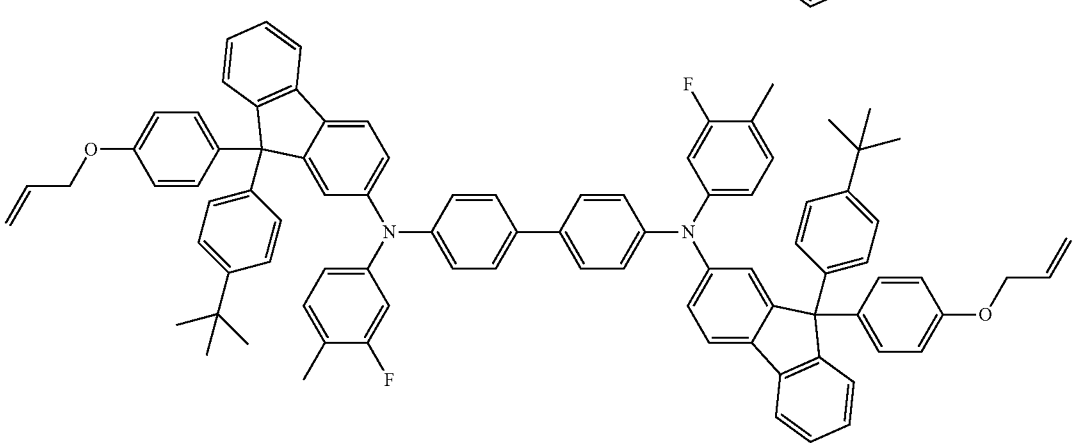

-continued
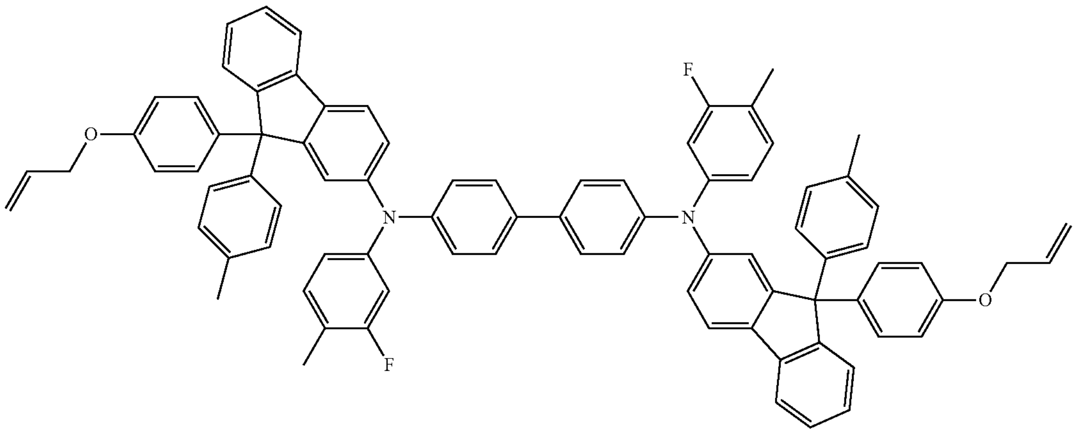
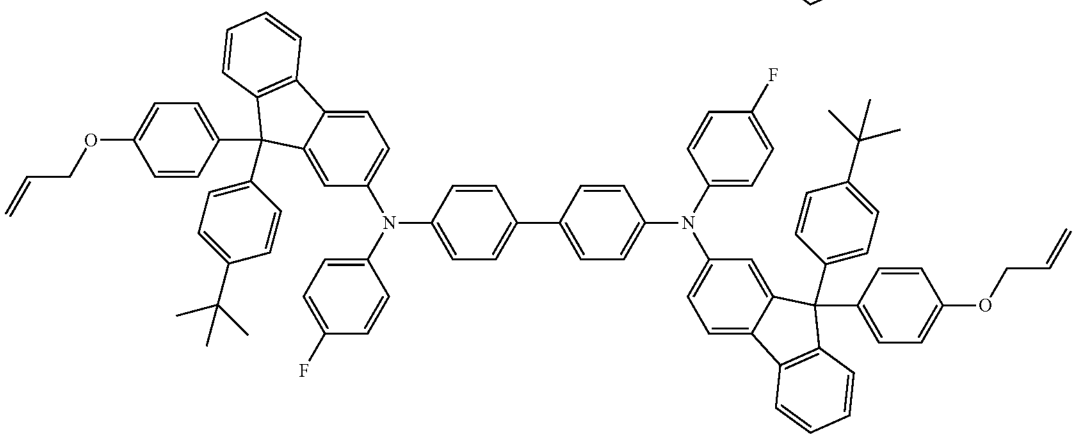
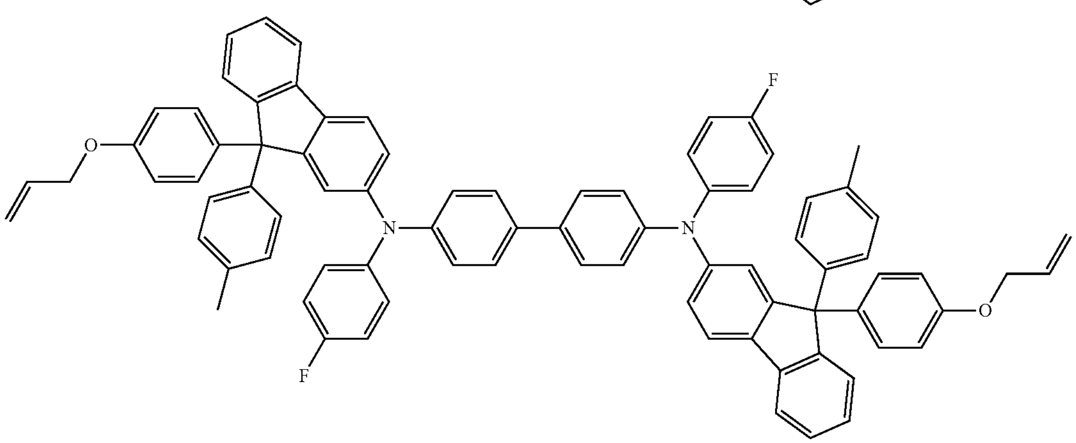
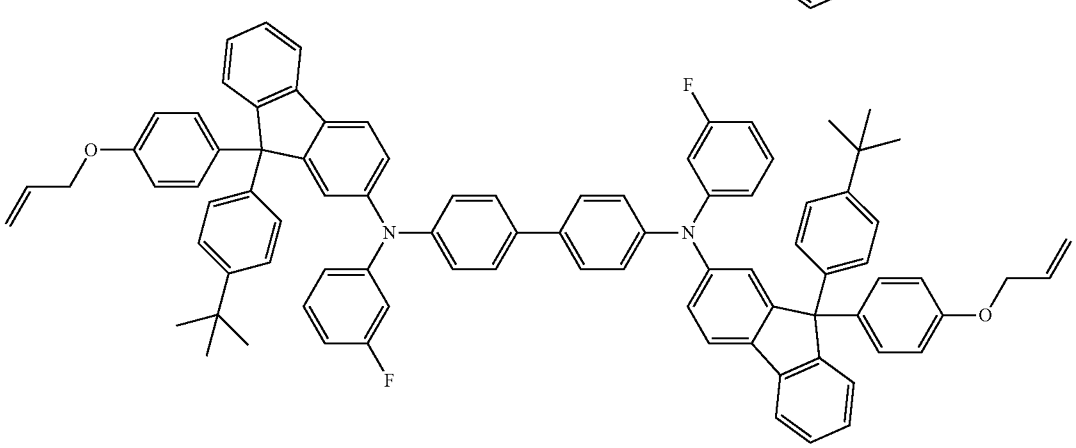

-continued
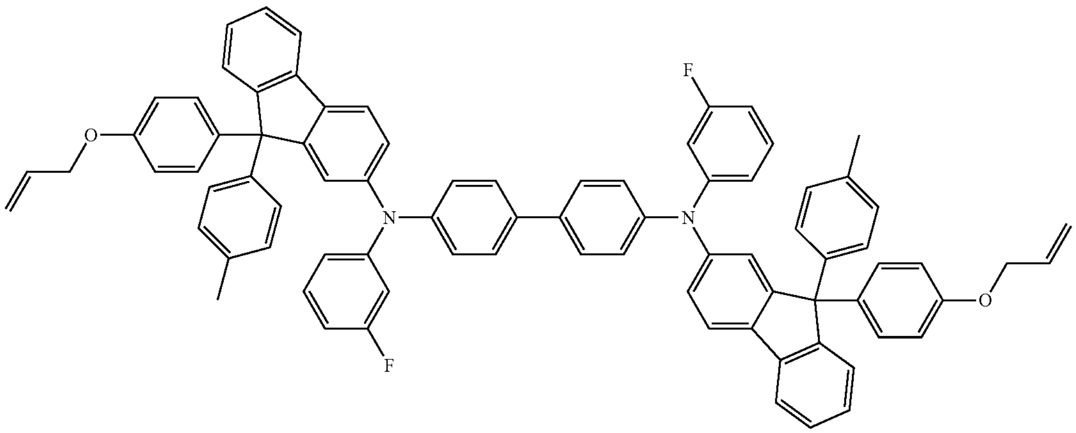
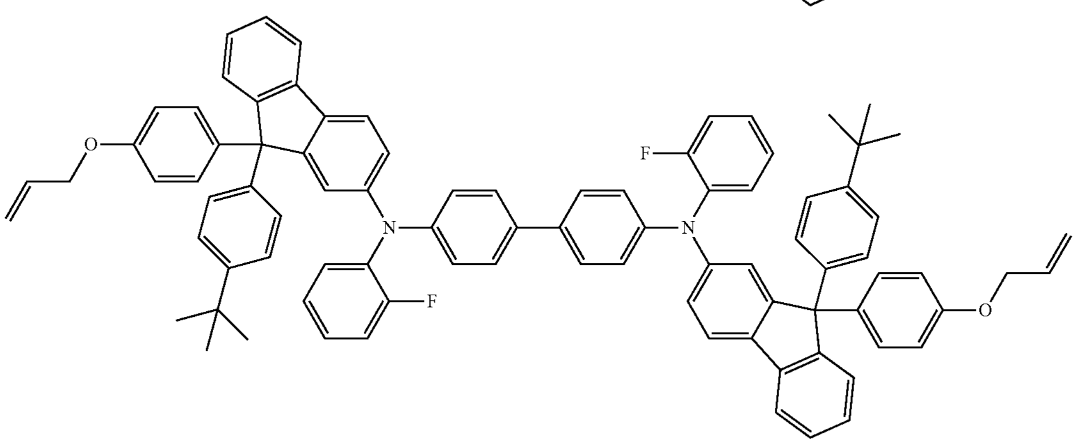
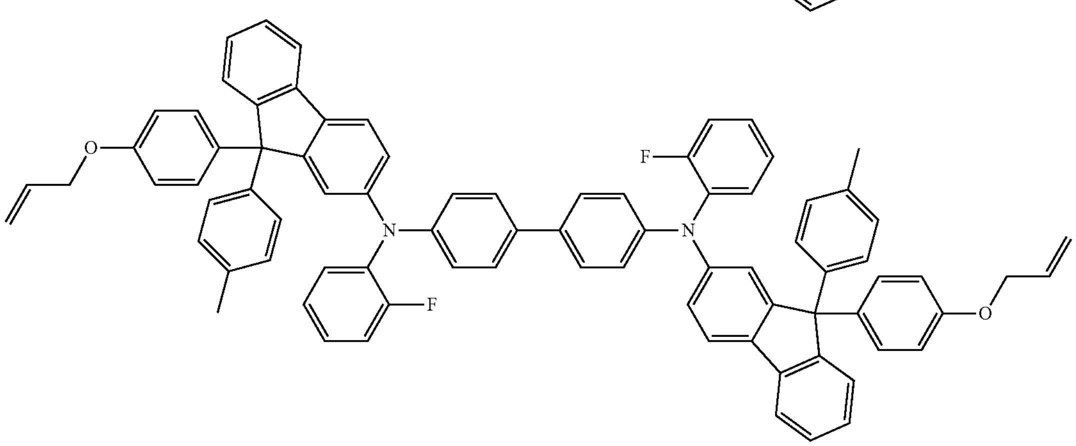
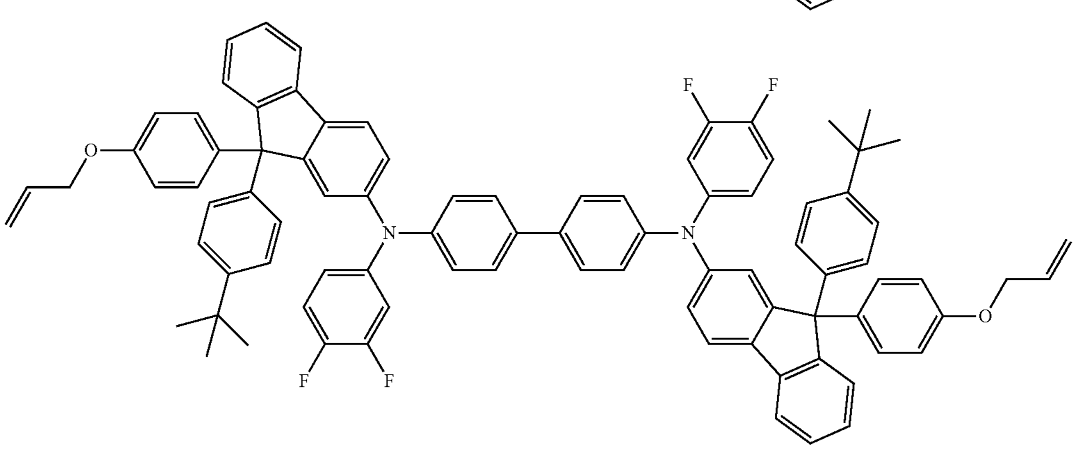

-continued
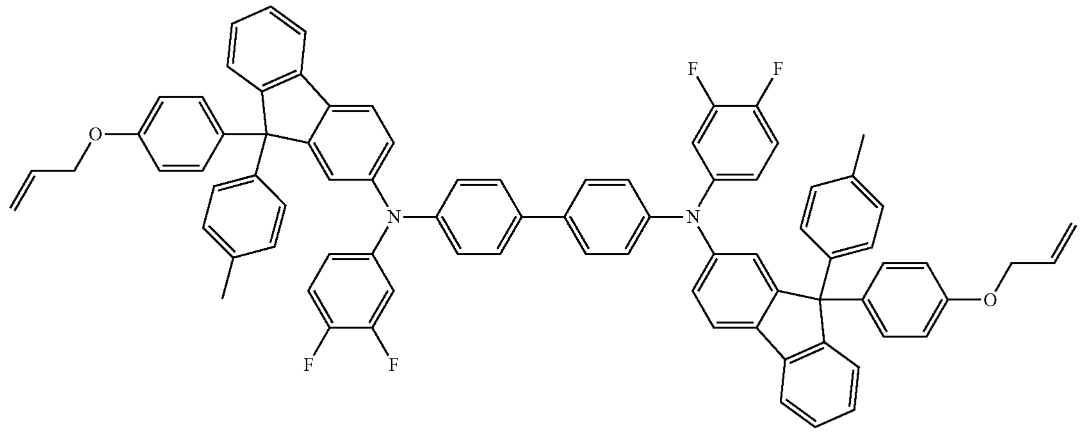
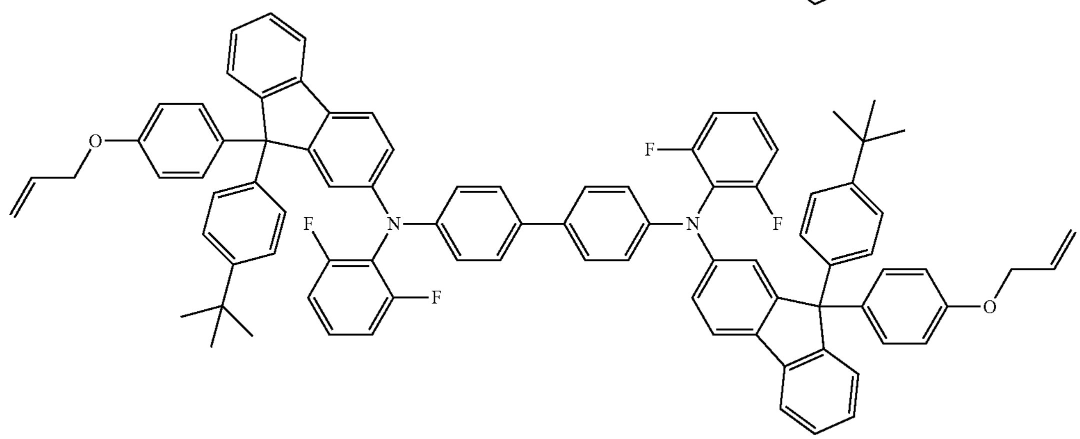
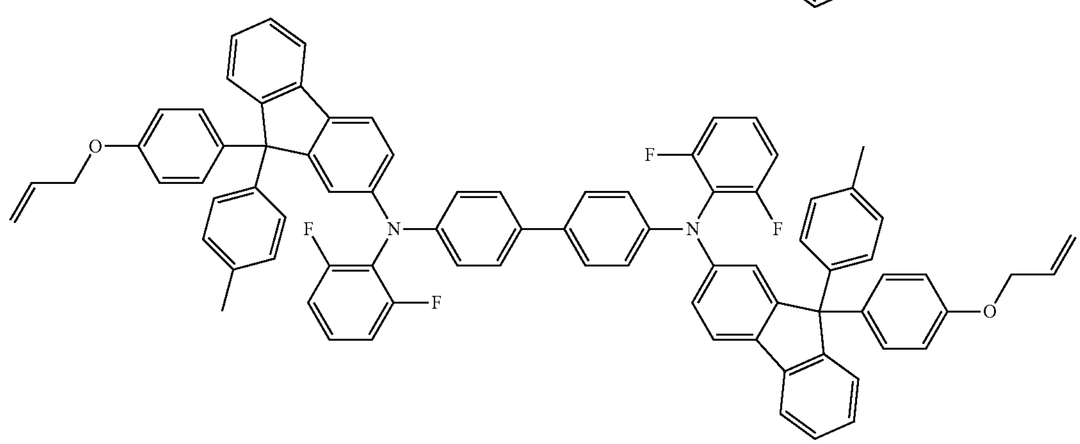
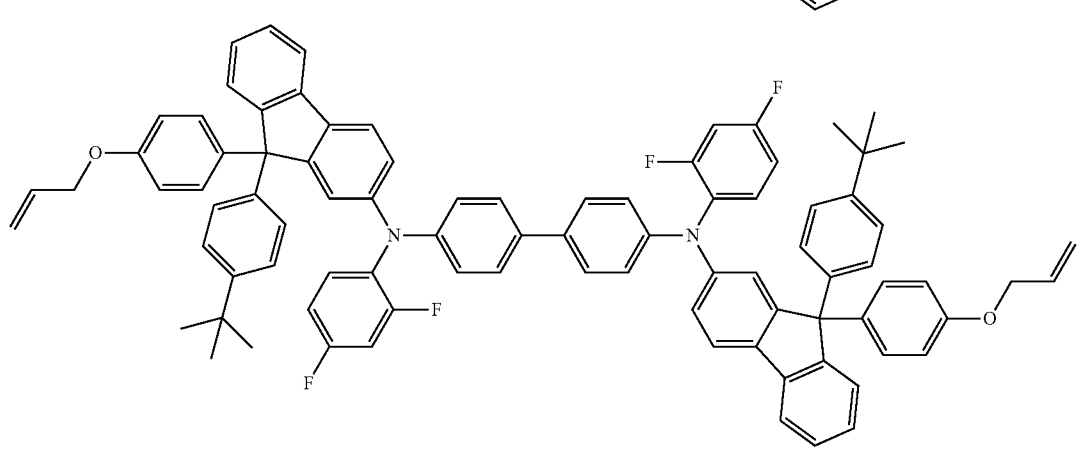

-continued
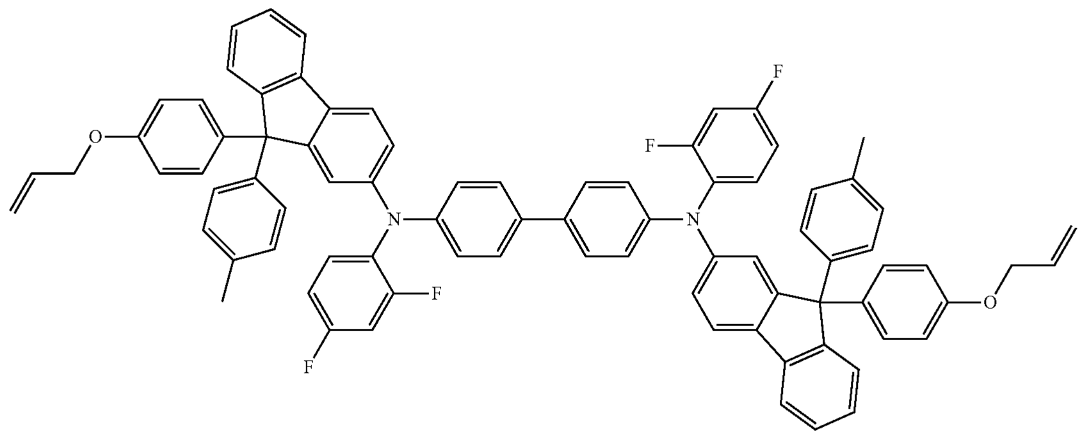
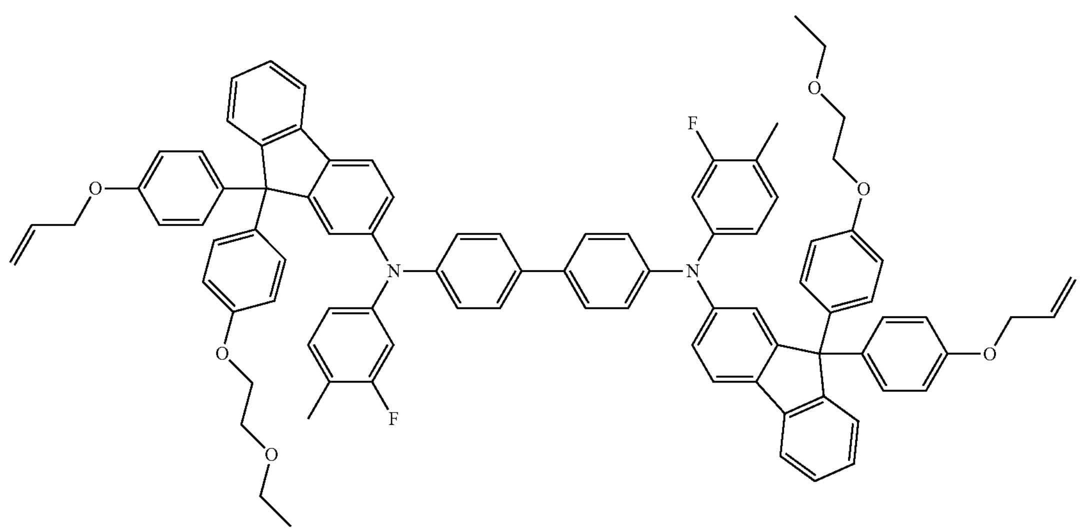
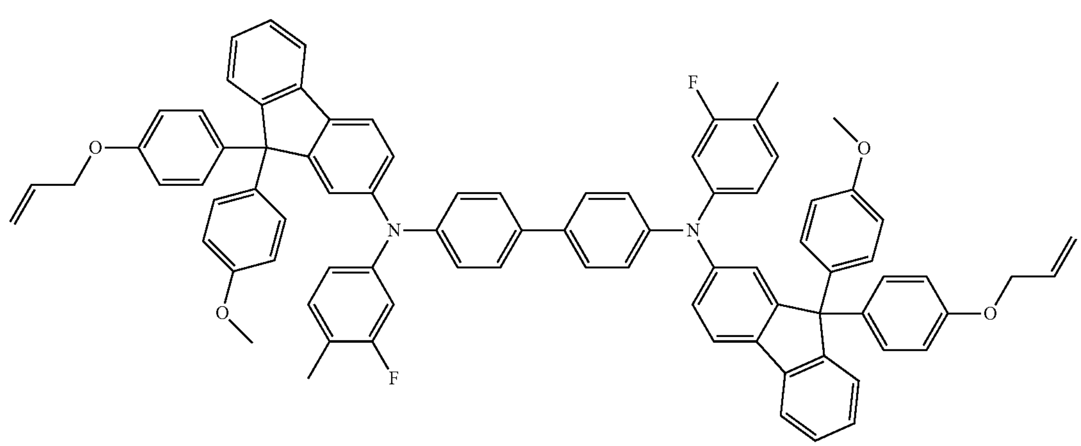

-continued
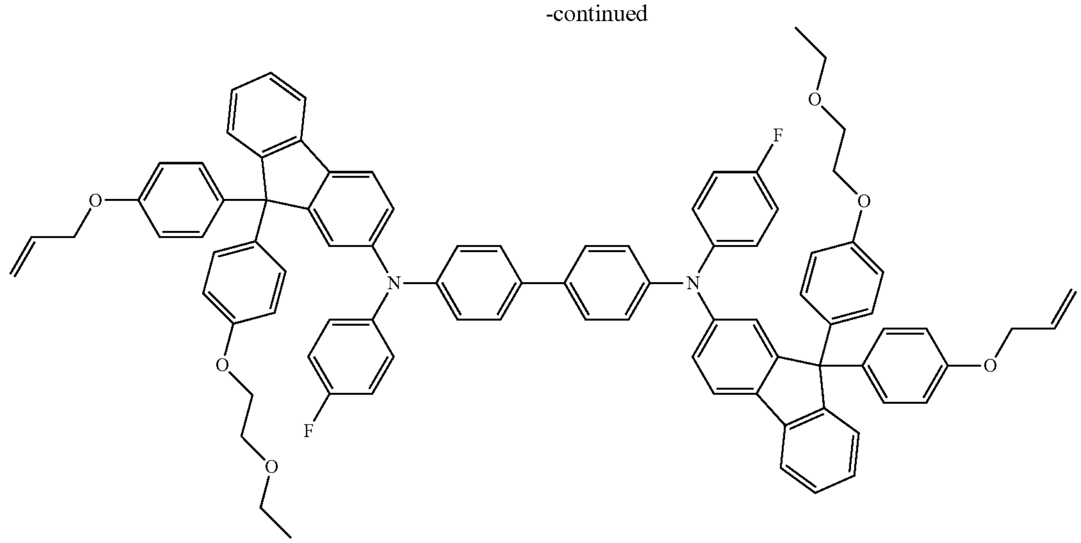
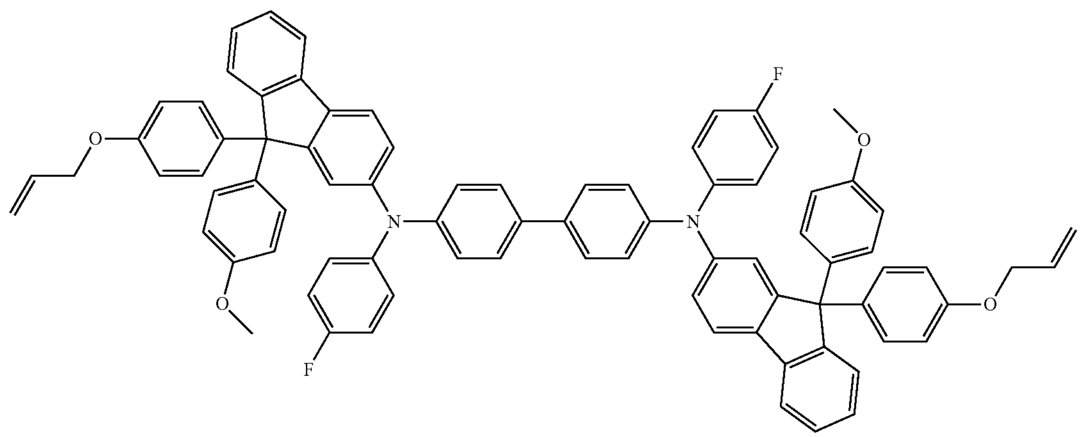
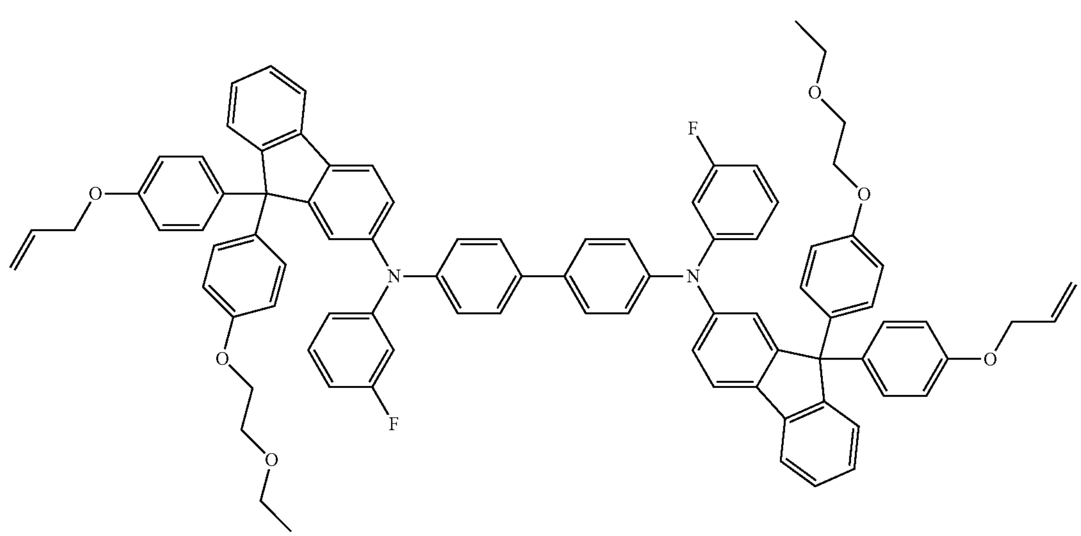

-continued
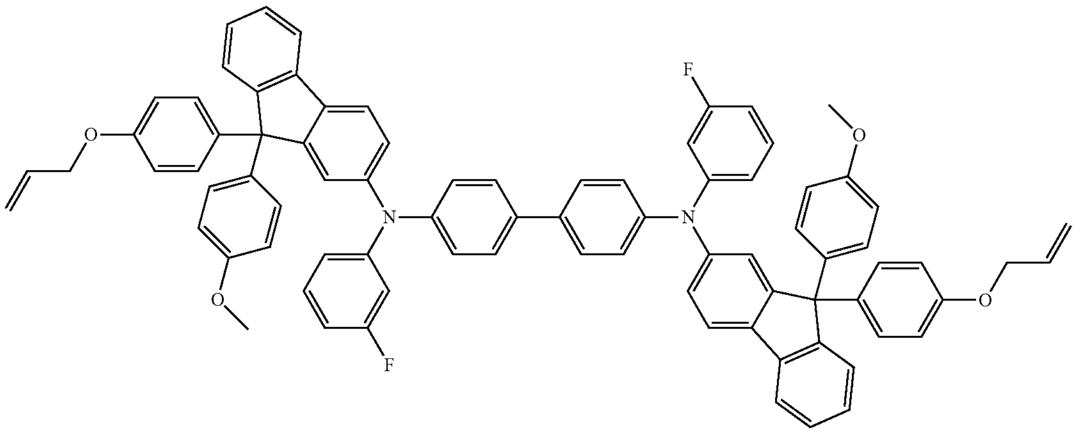
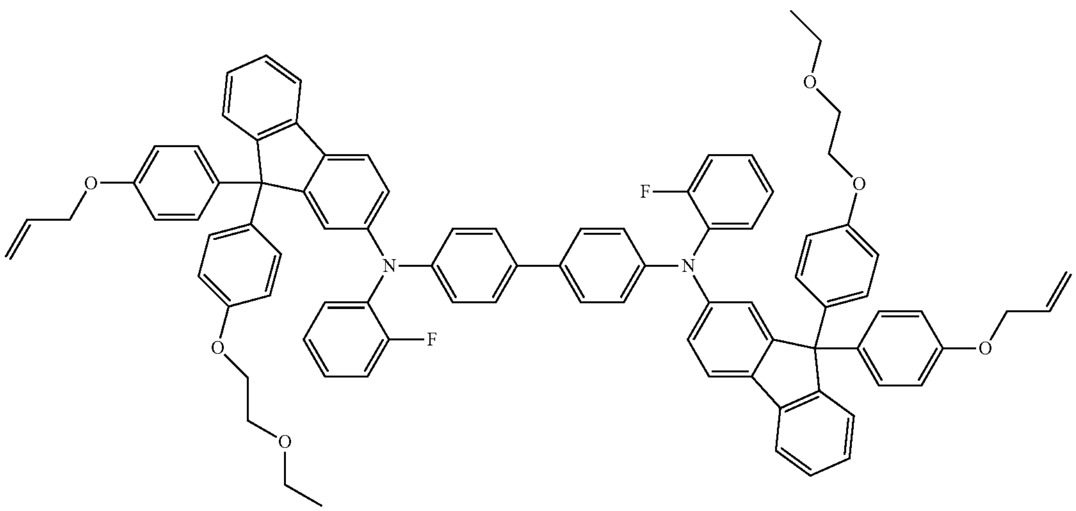
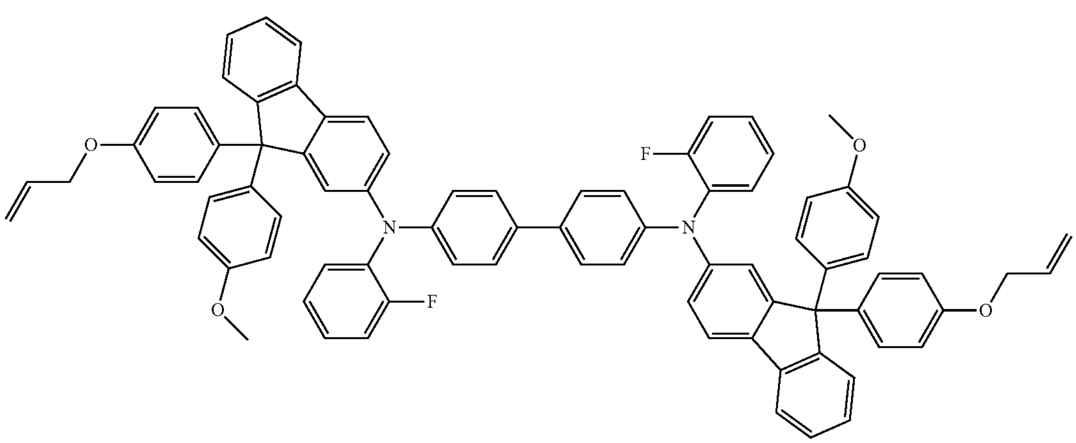

-continued
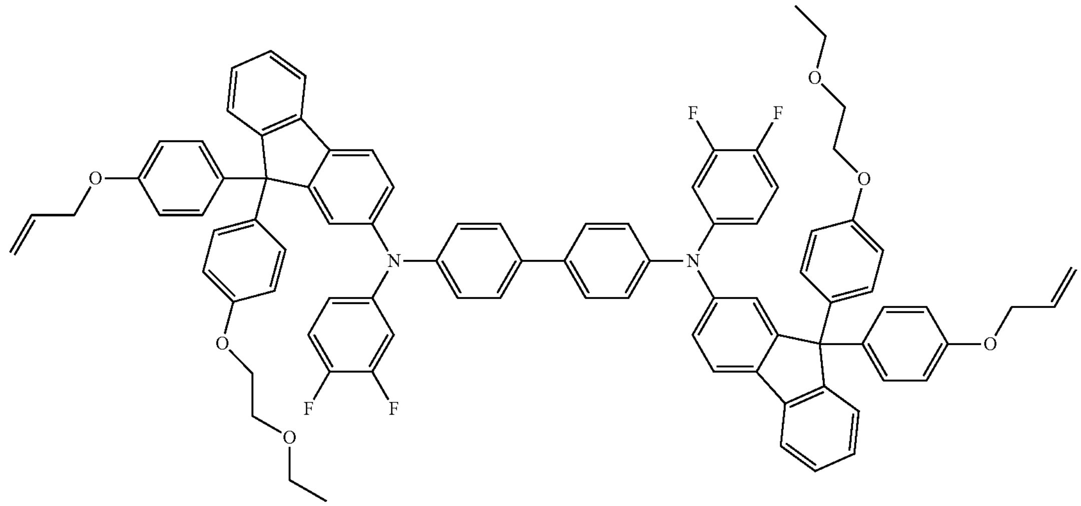
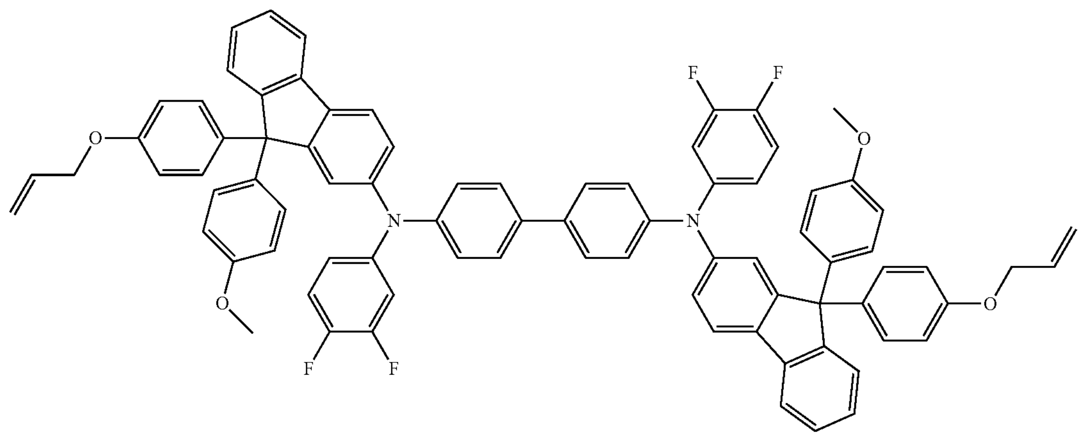
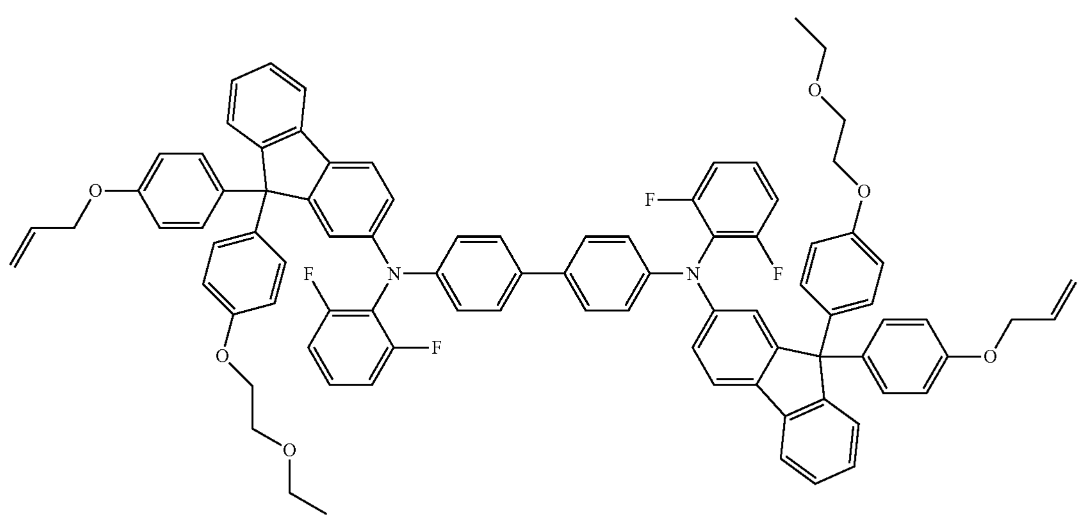

-continued
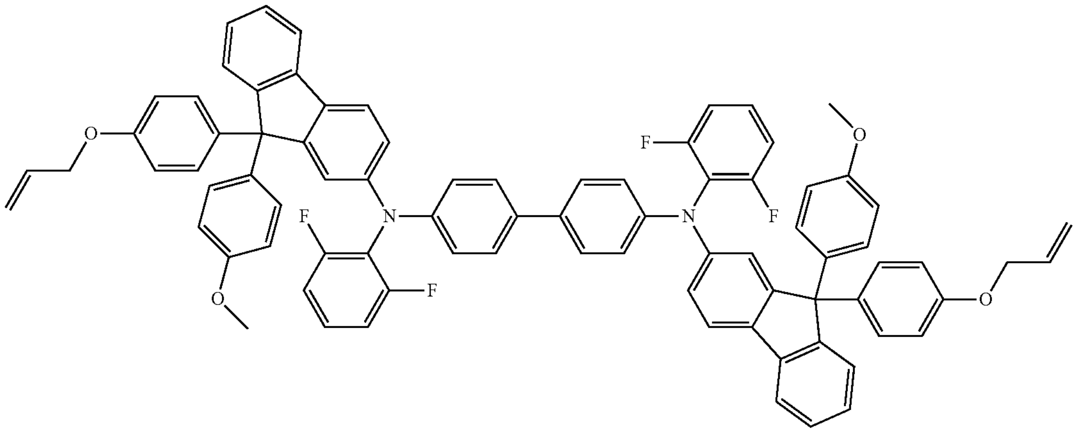
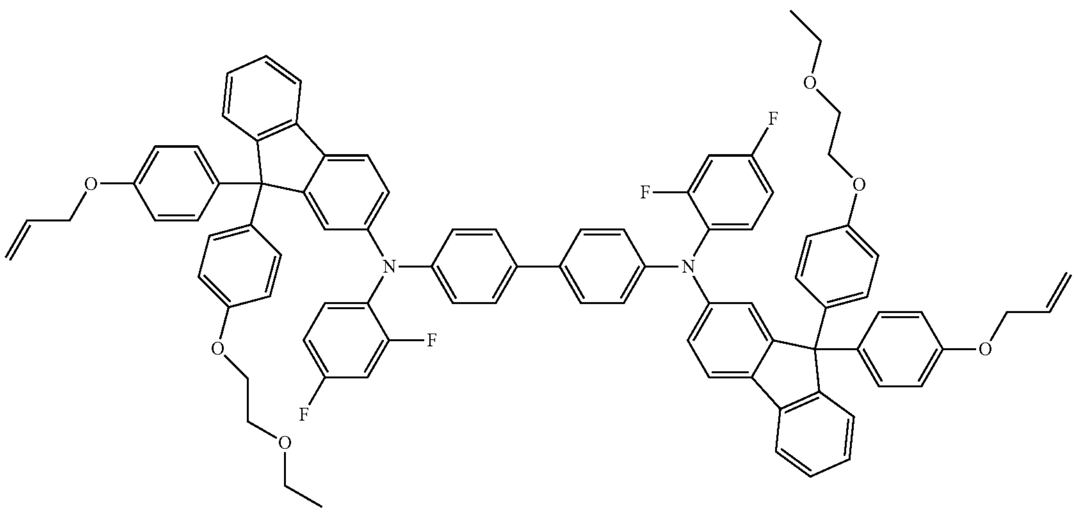
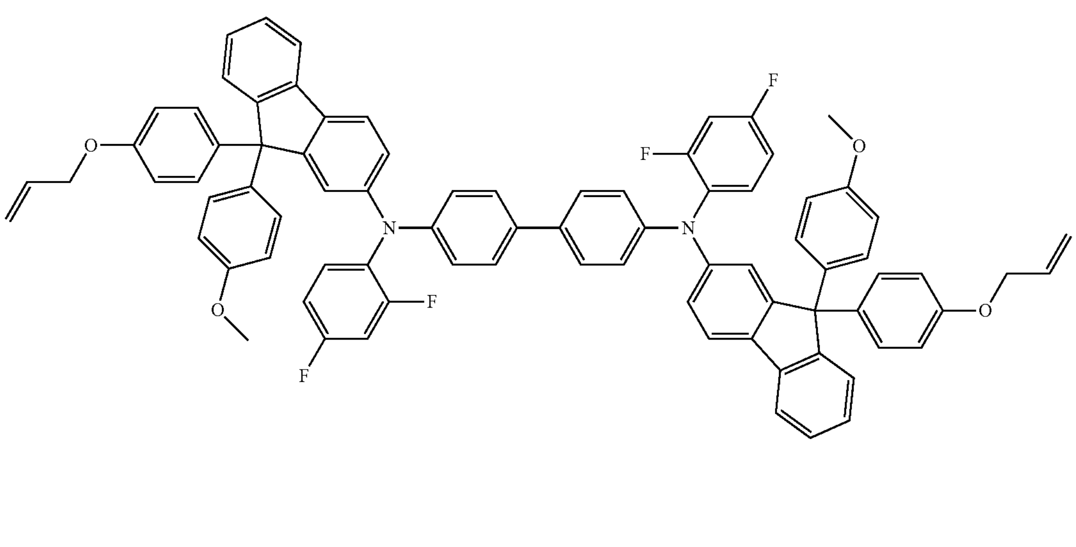

-continued
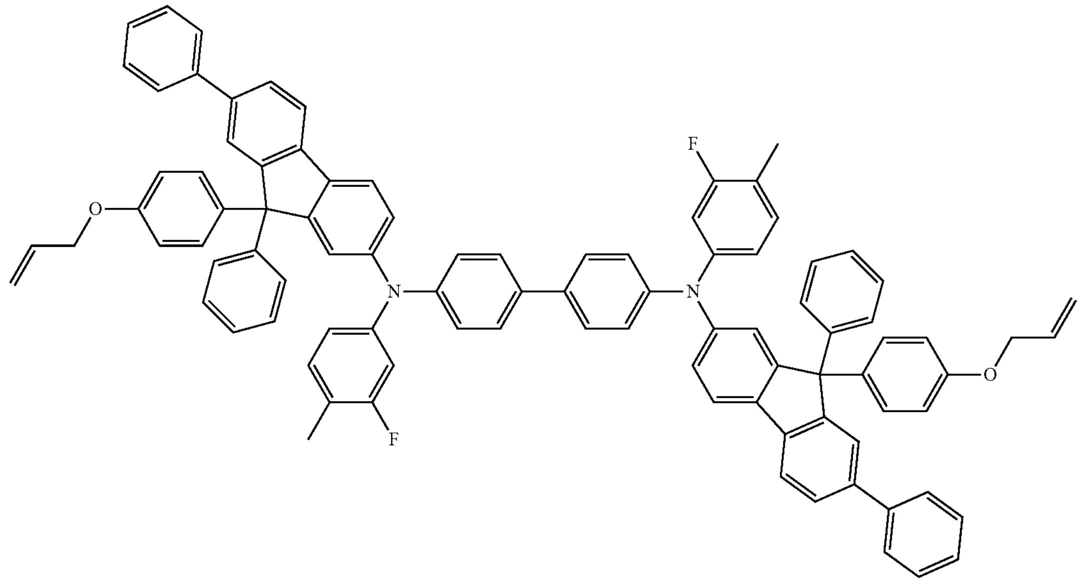
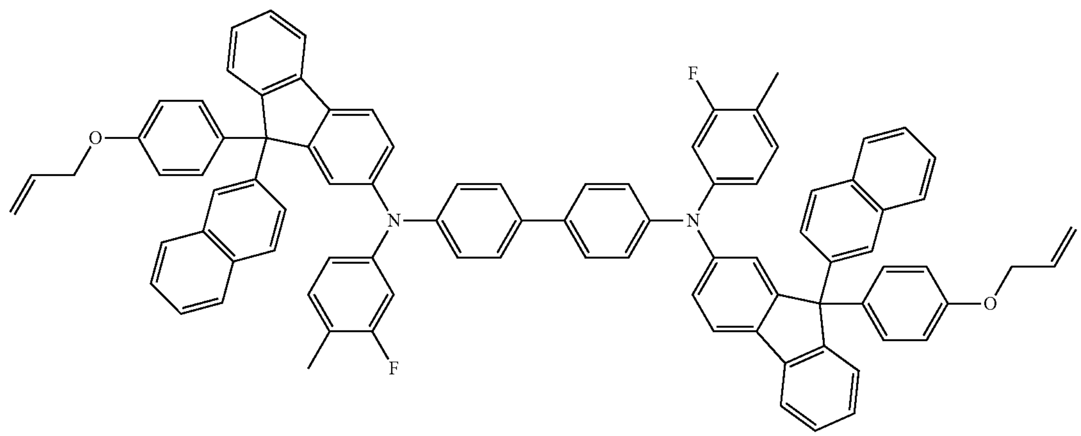
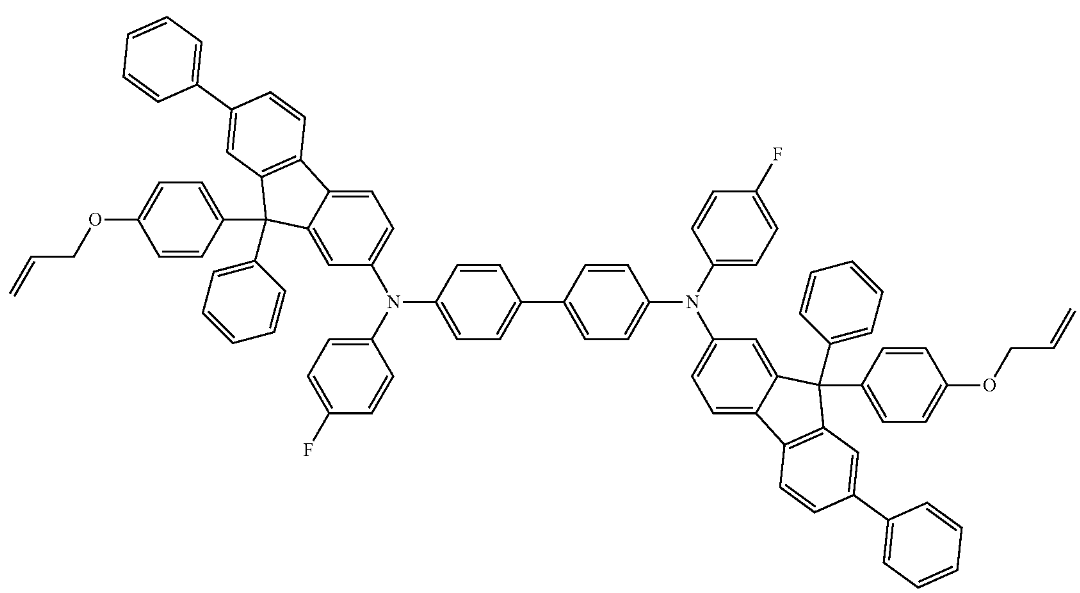

-continued
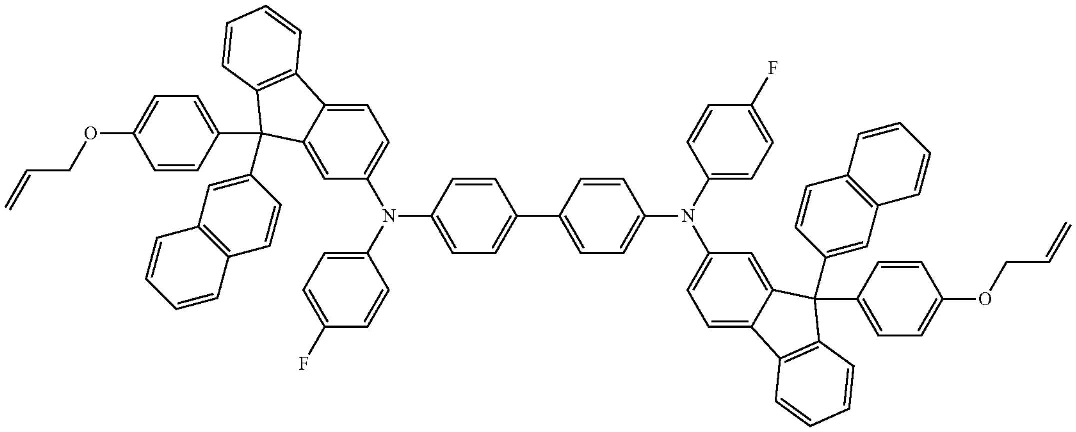
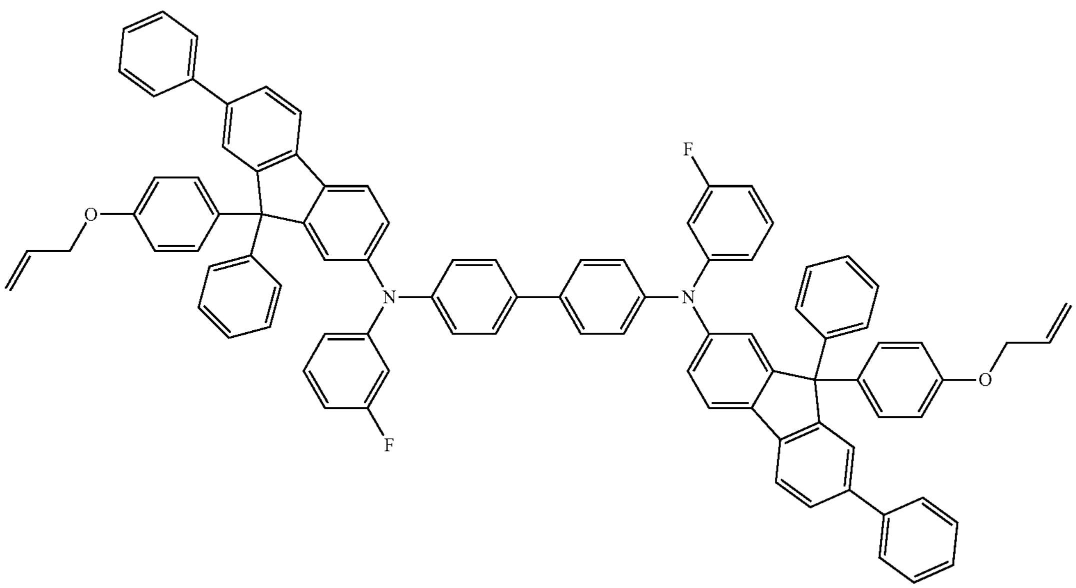
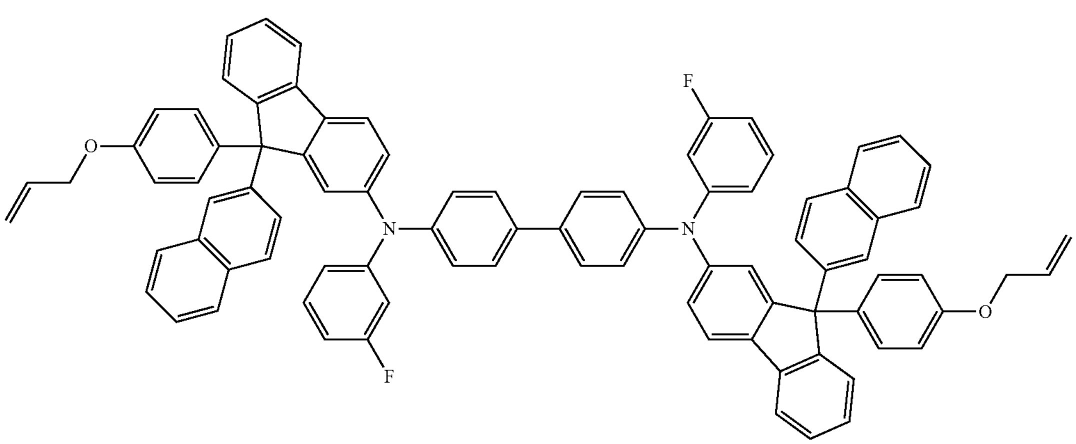

-continued
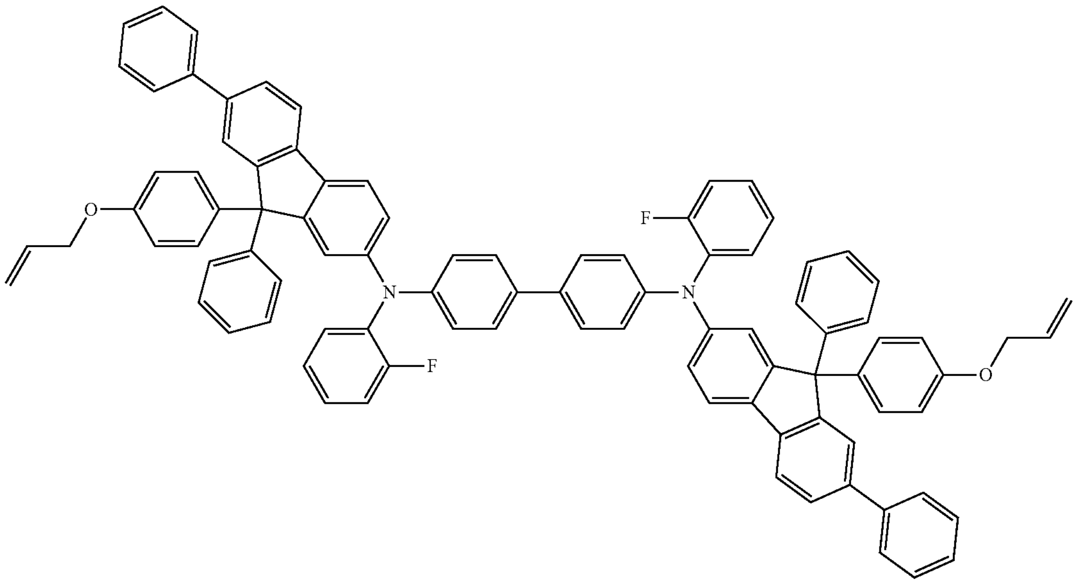
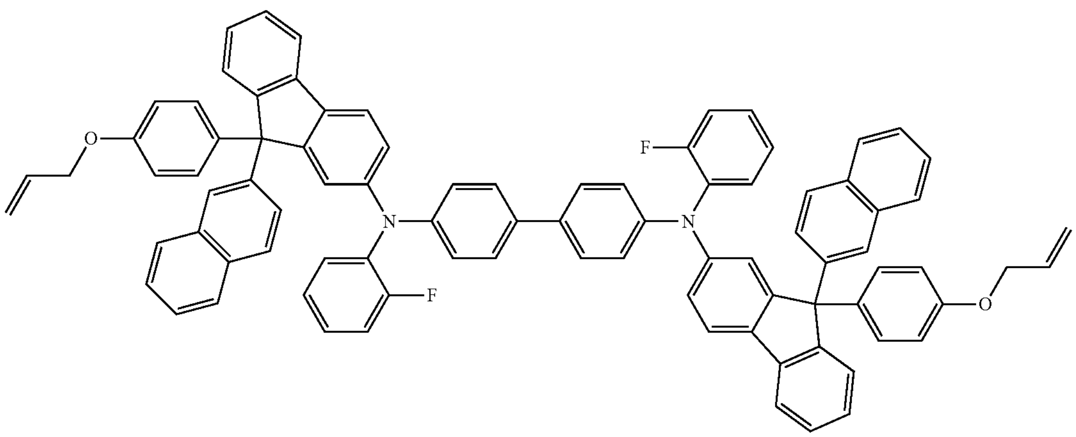
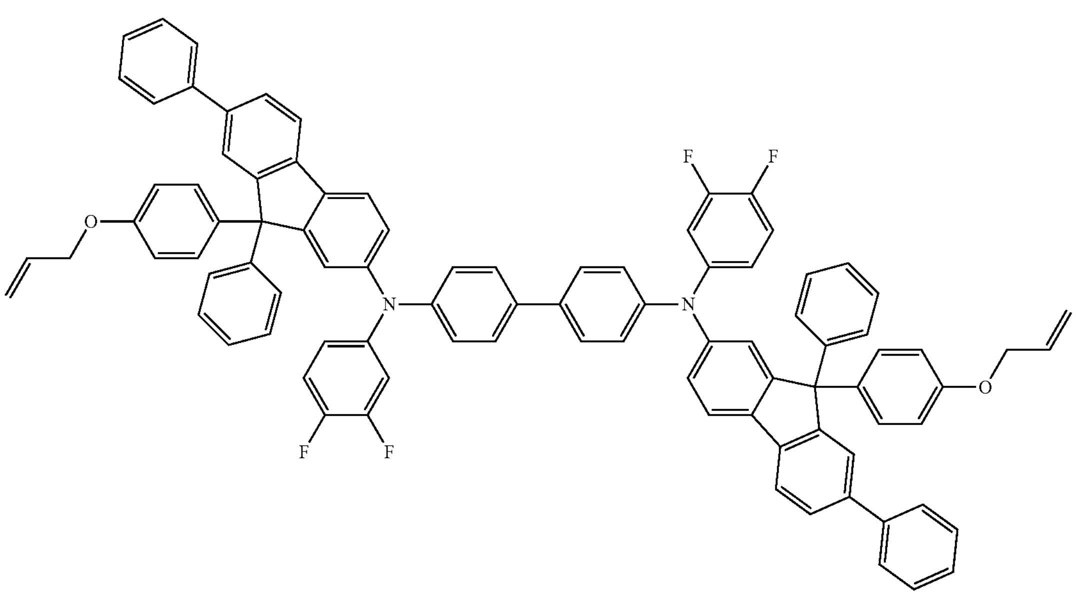

-continued
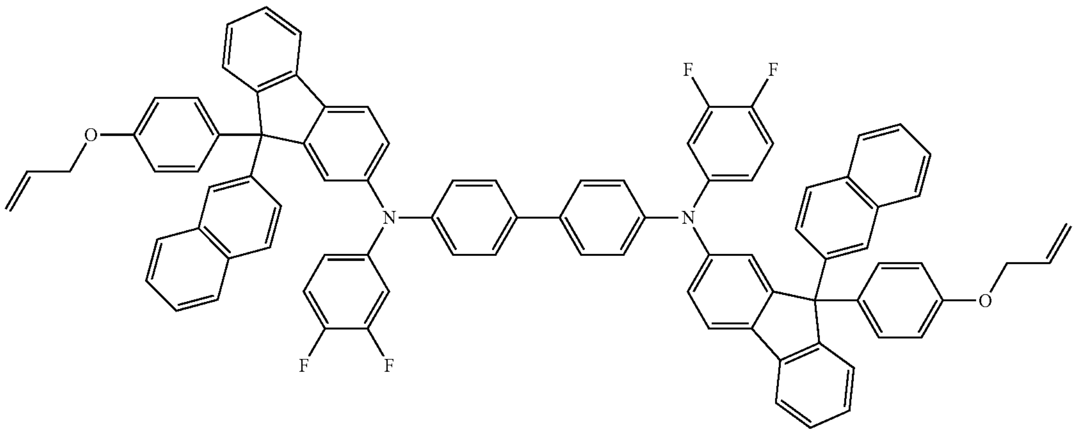
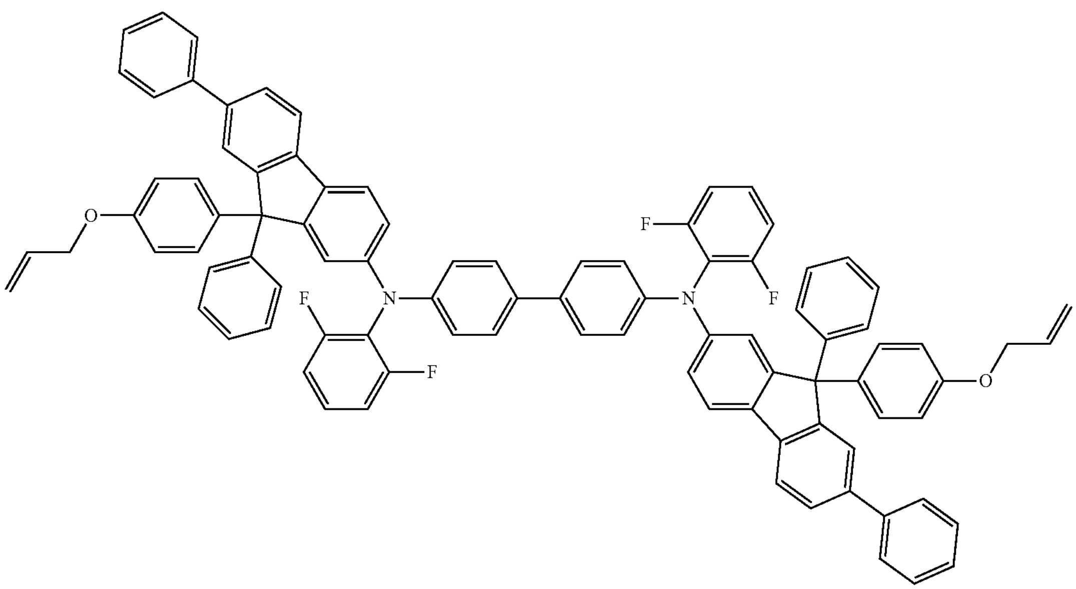
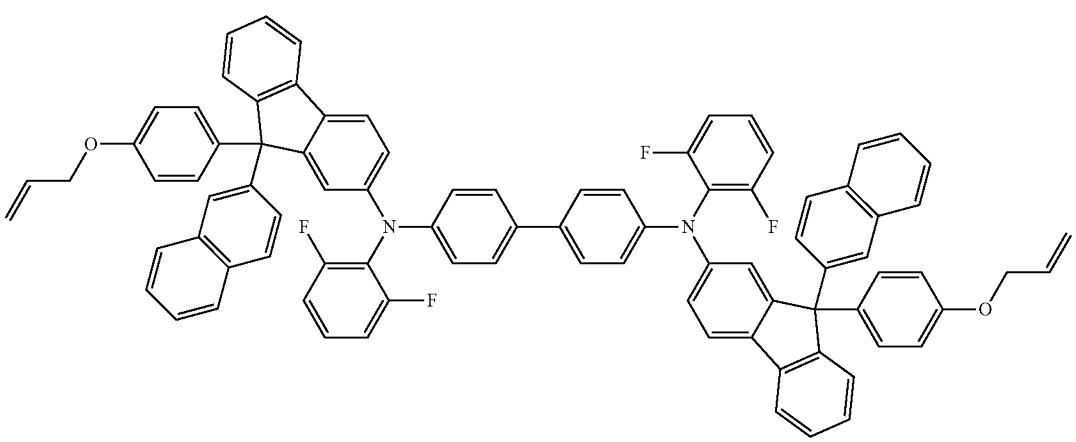

-continued
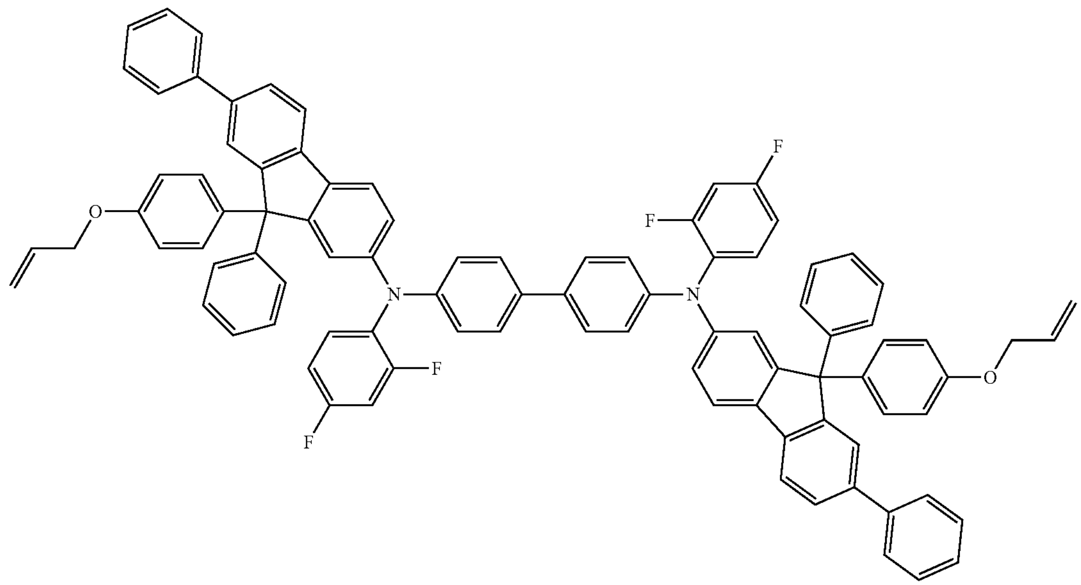
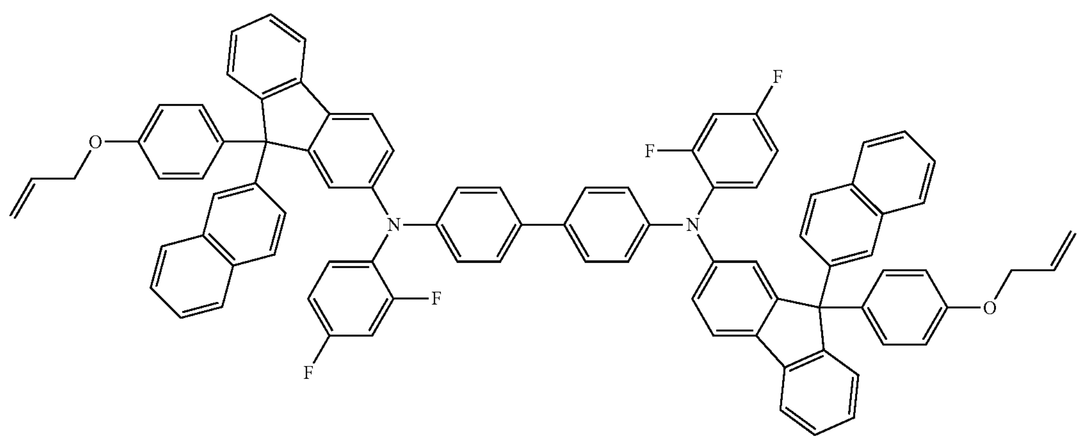
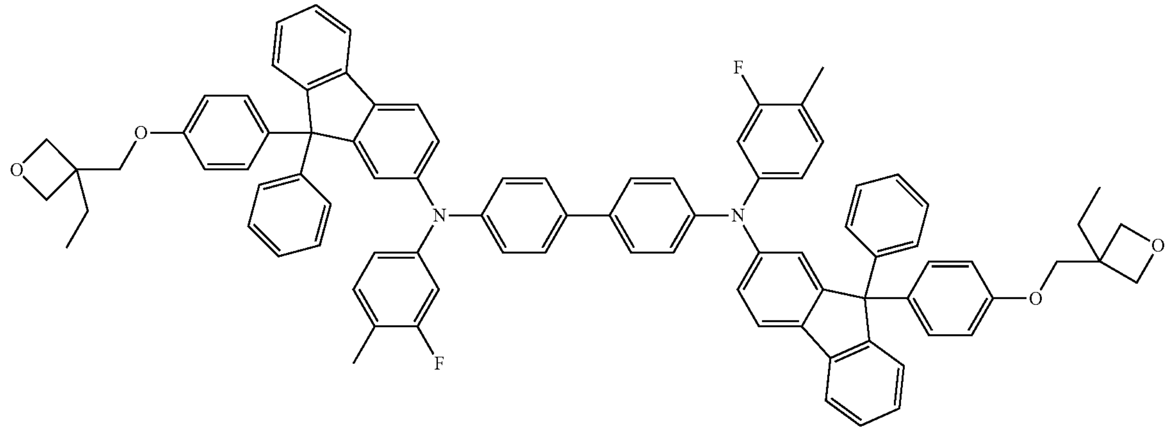

-continued
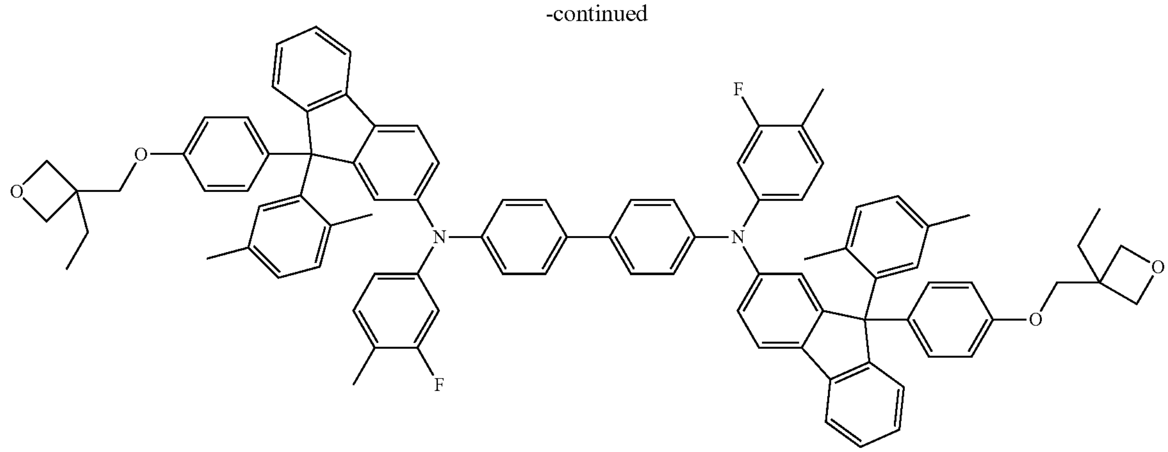
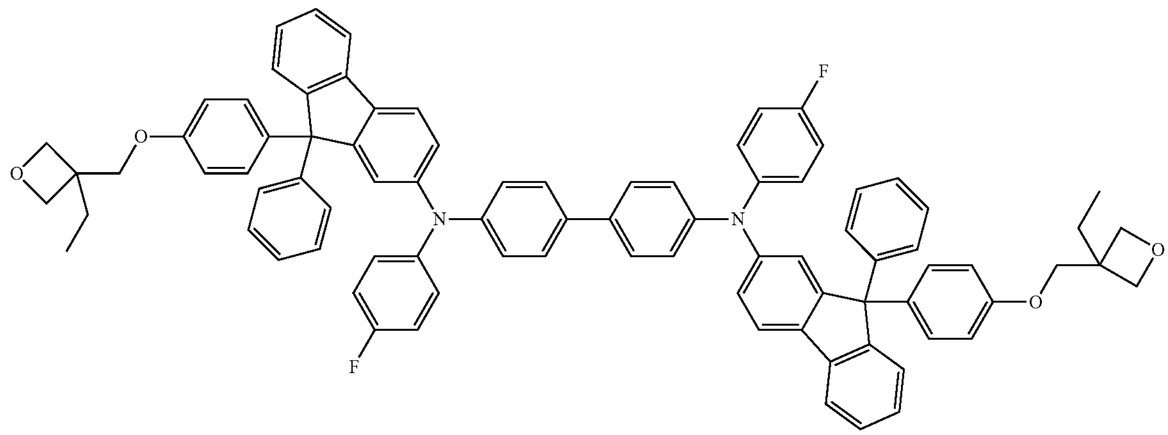
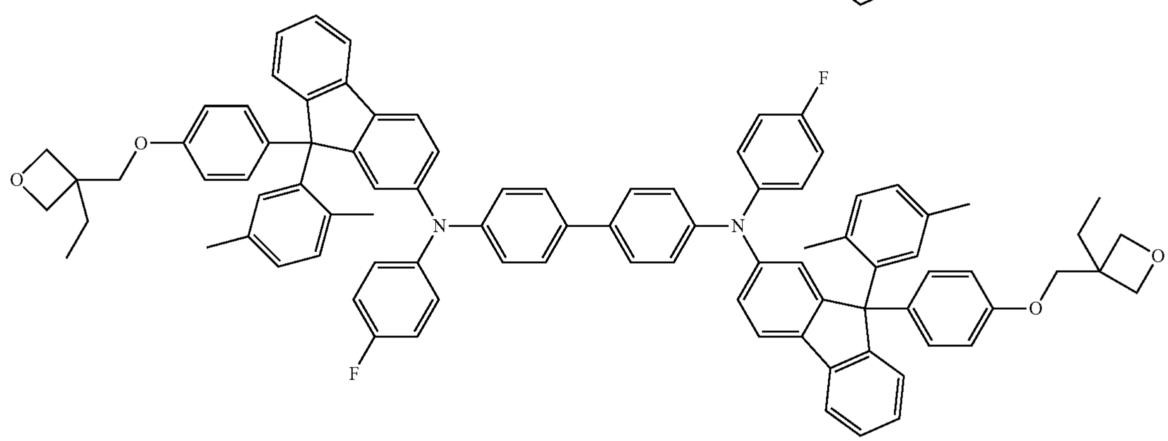
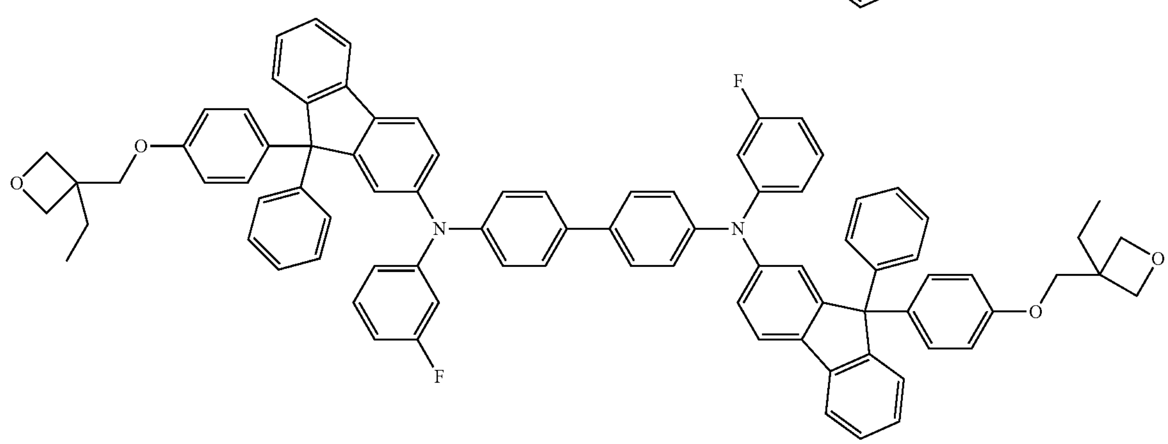

-continued
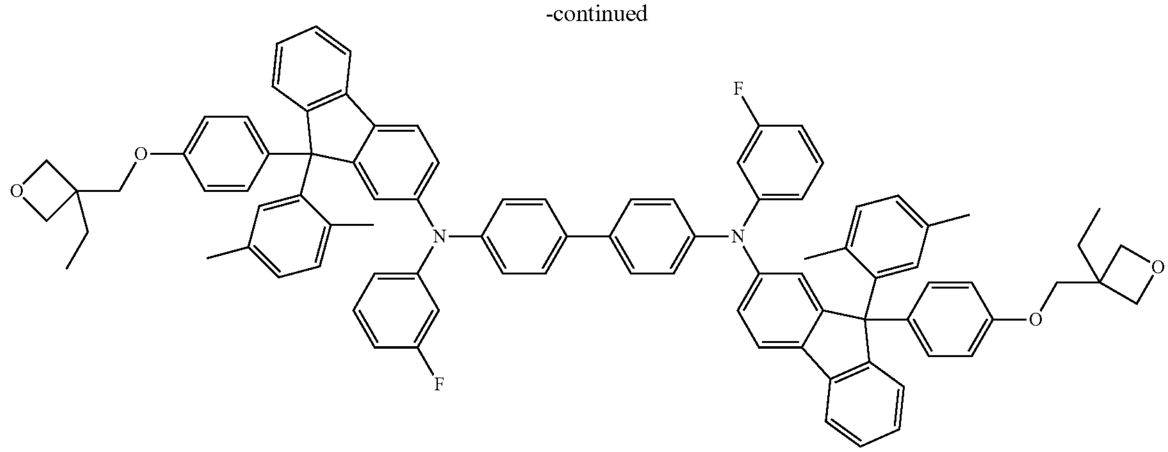
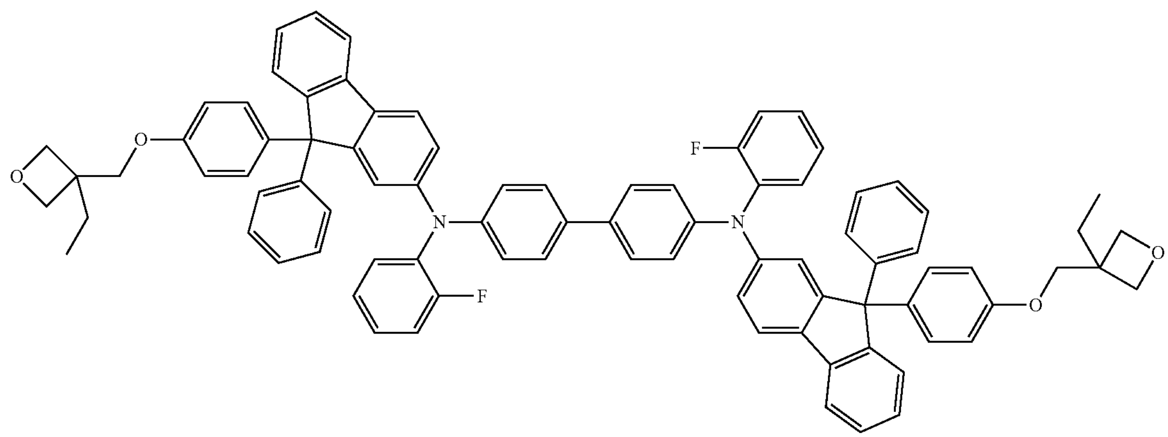
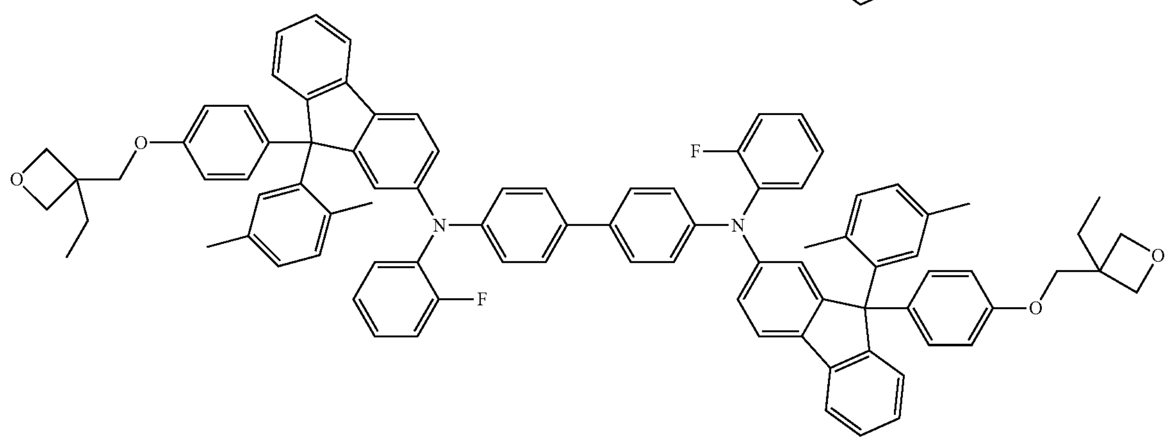
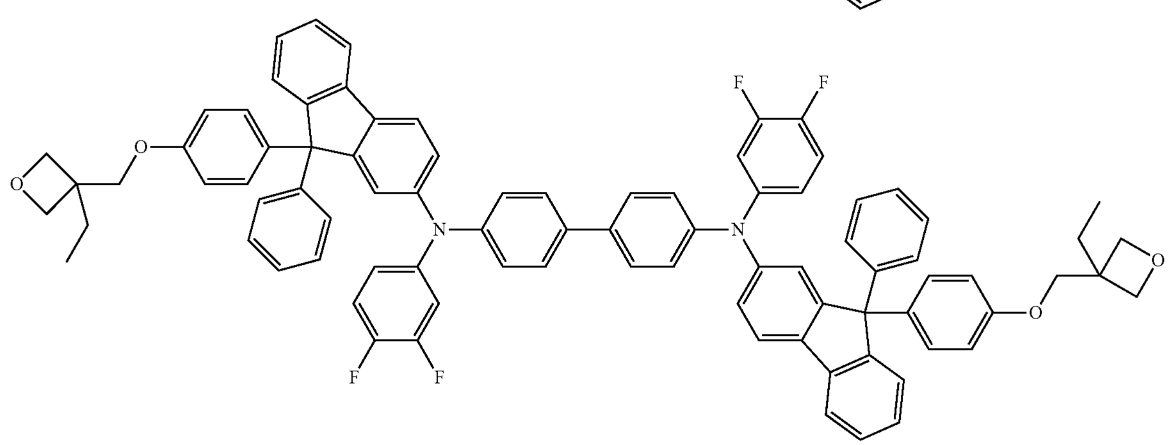

-continued
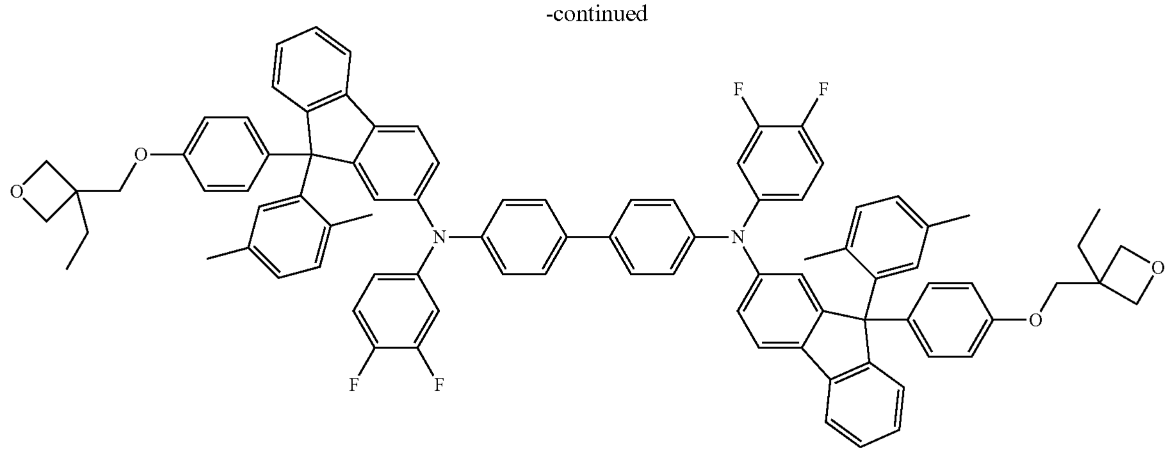
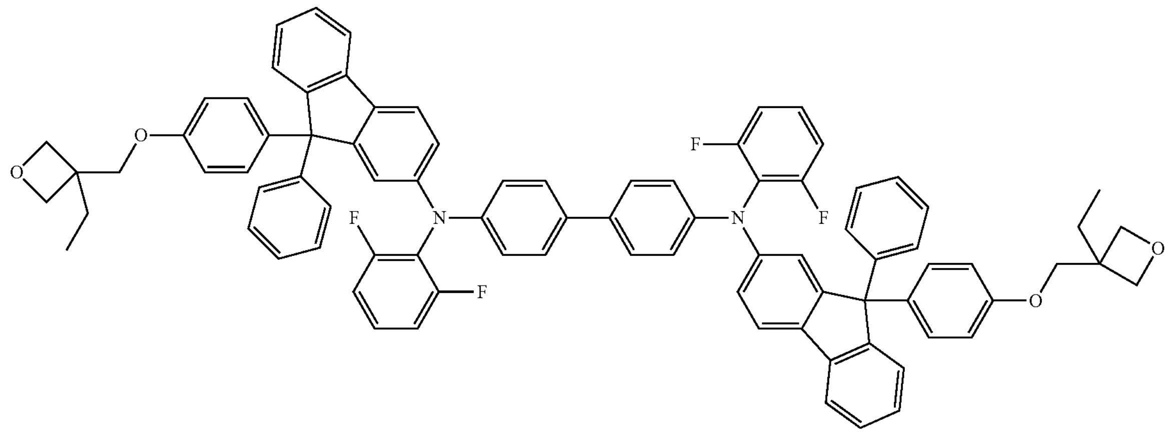
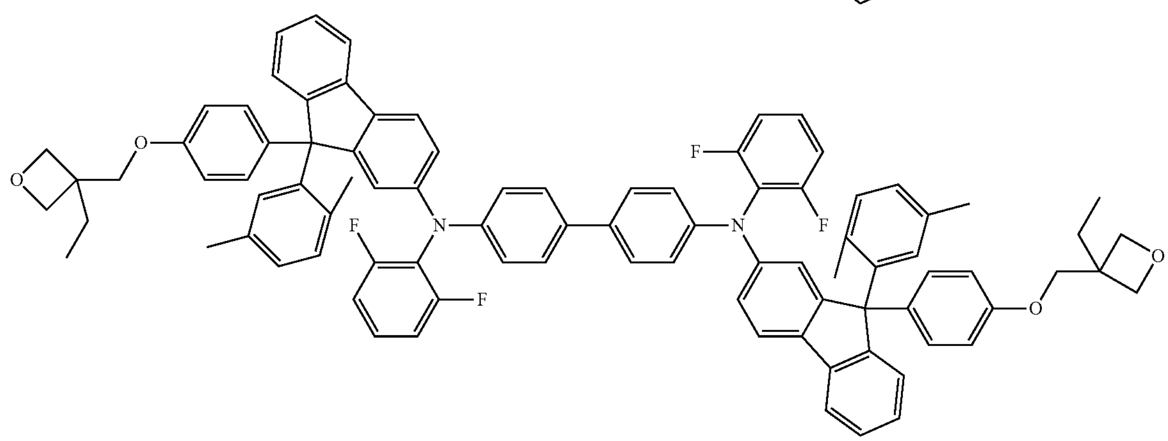
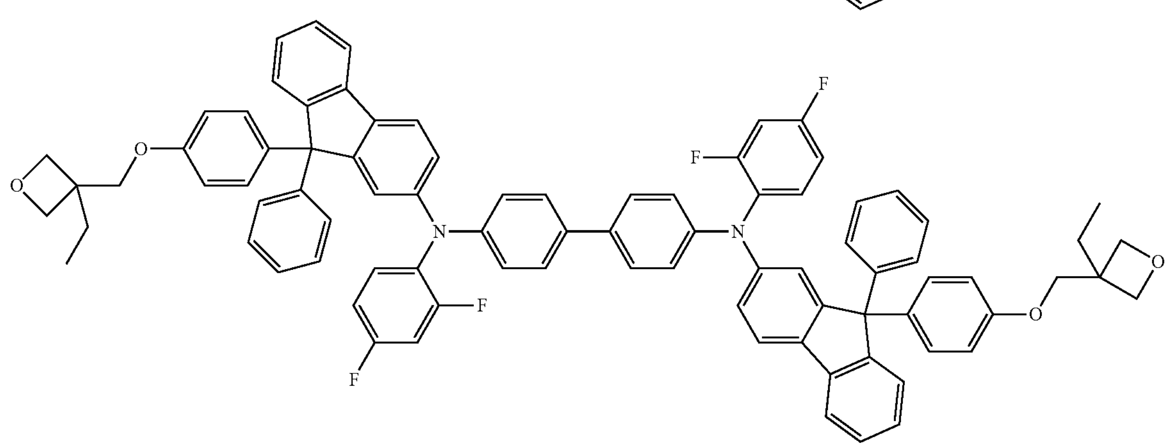

-continued
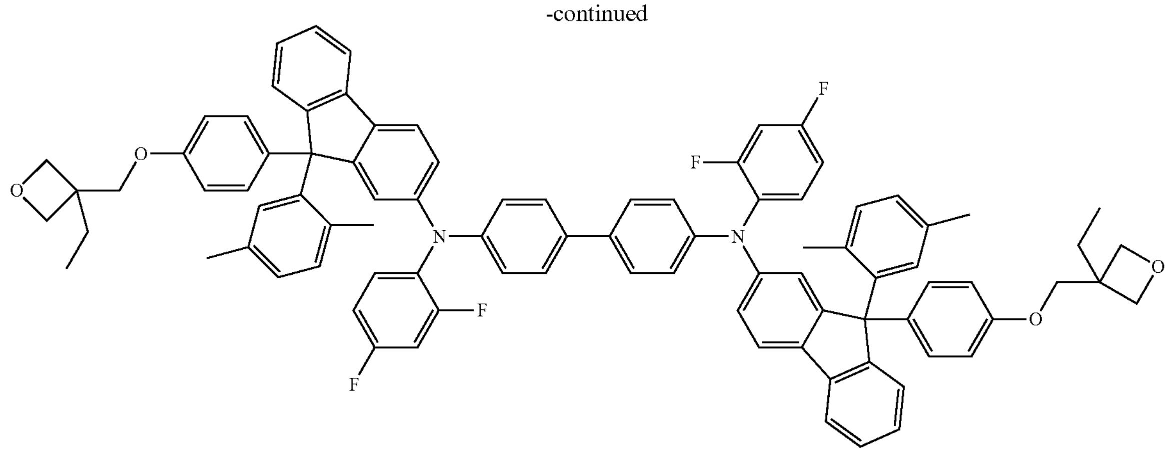
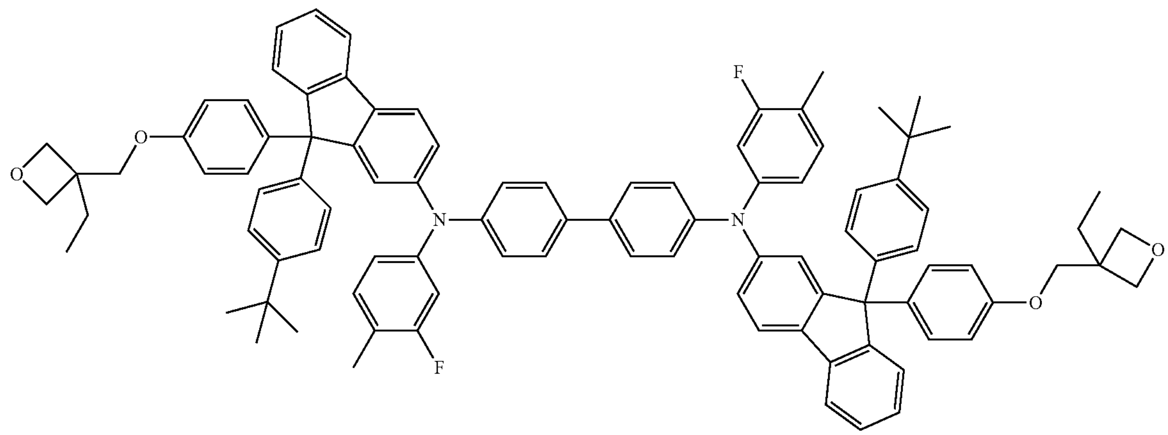
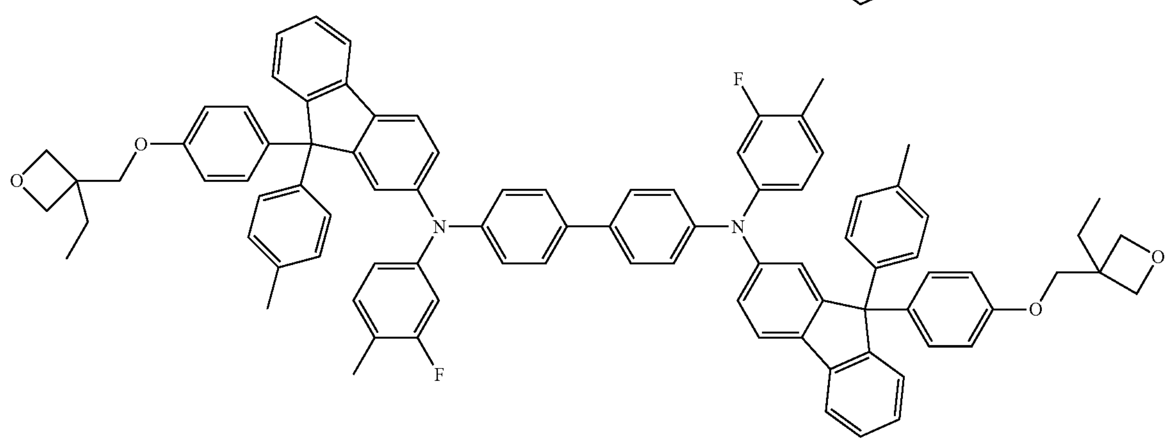
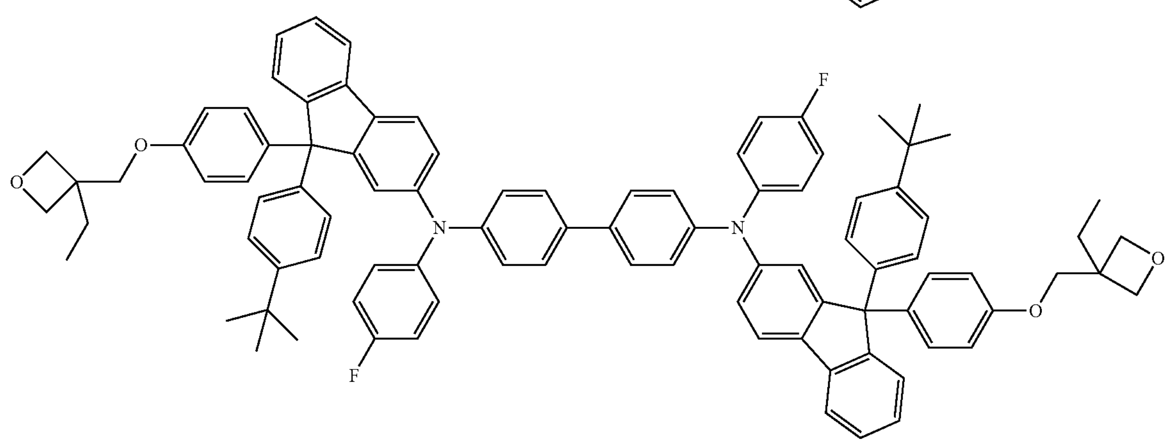

-continued
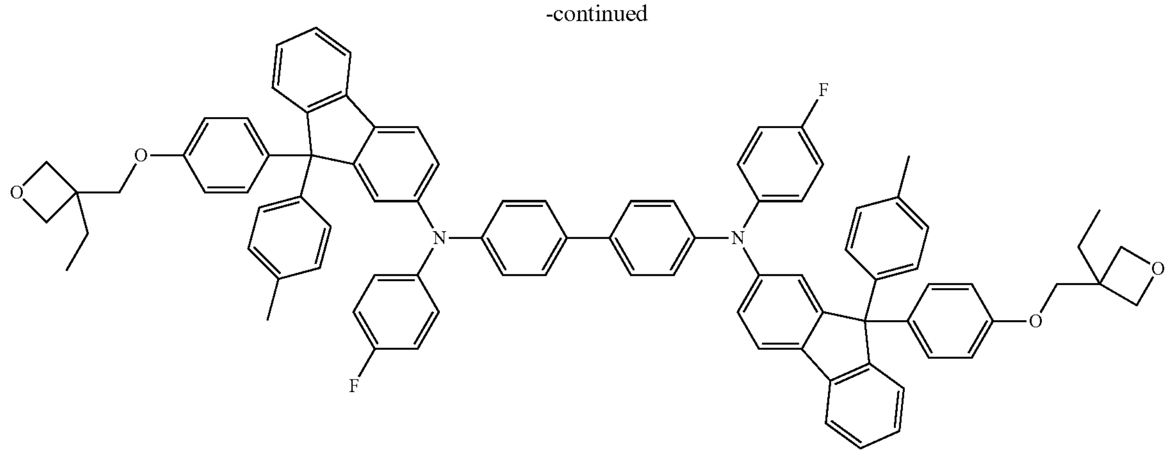
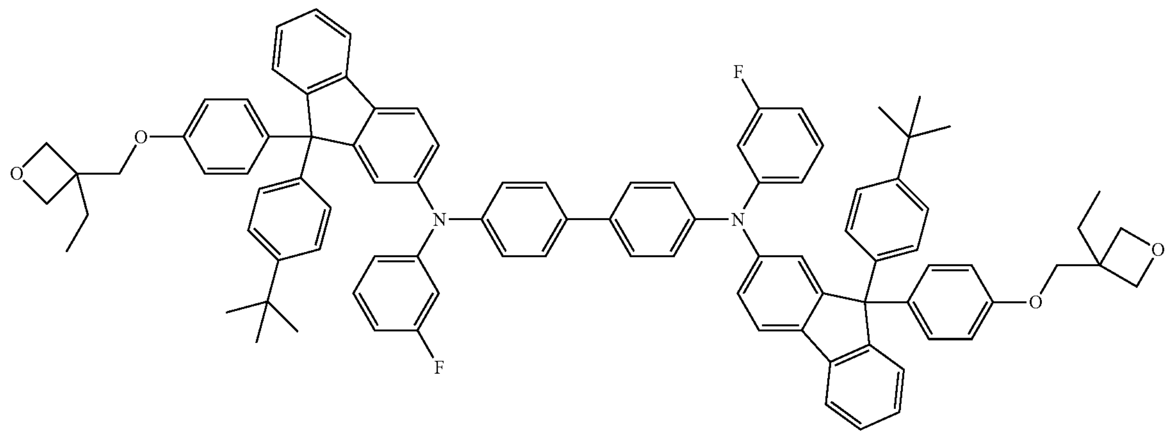
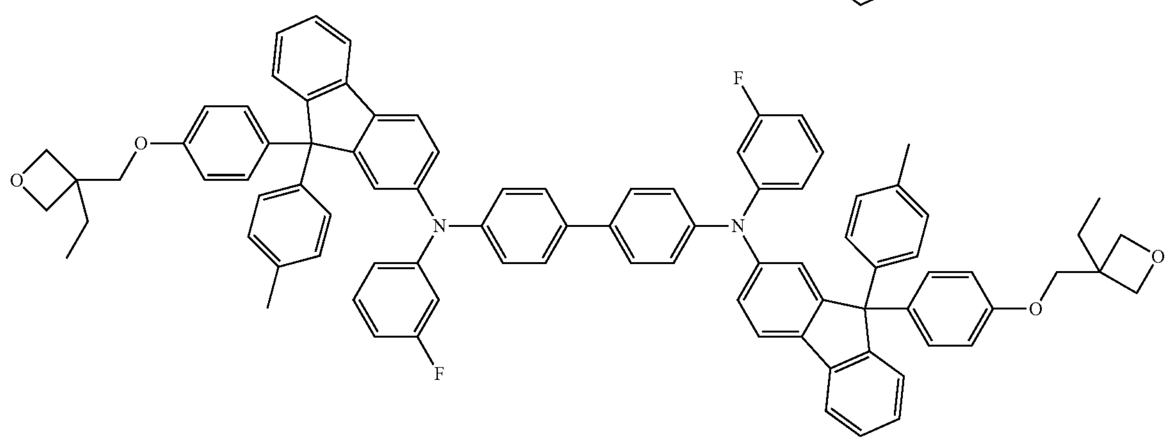
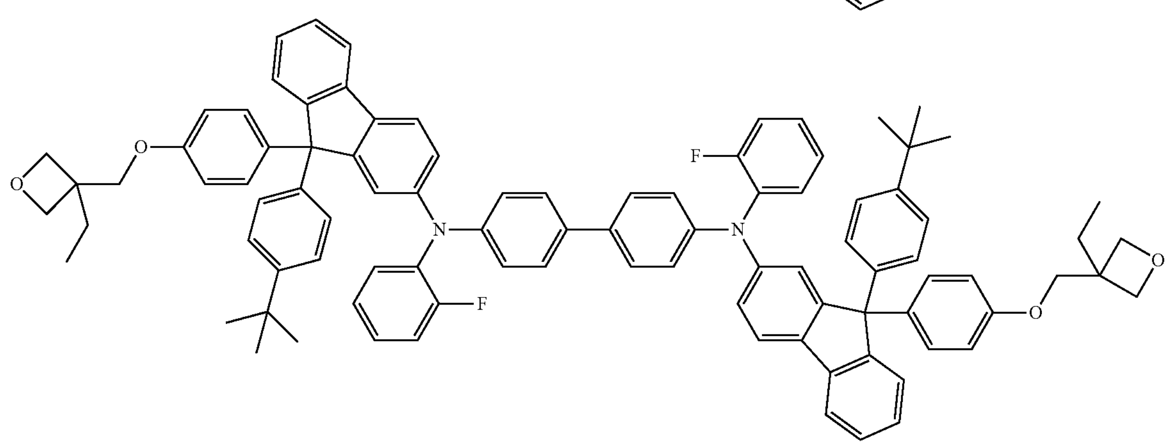

-continued
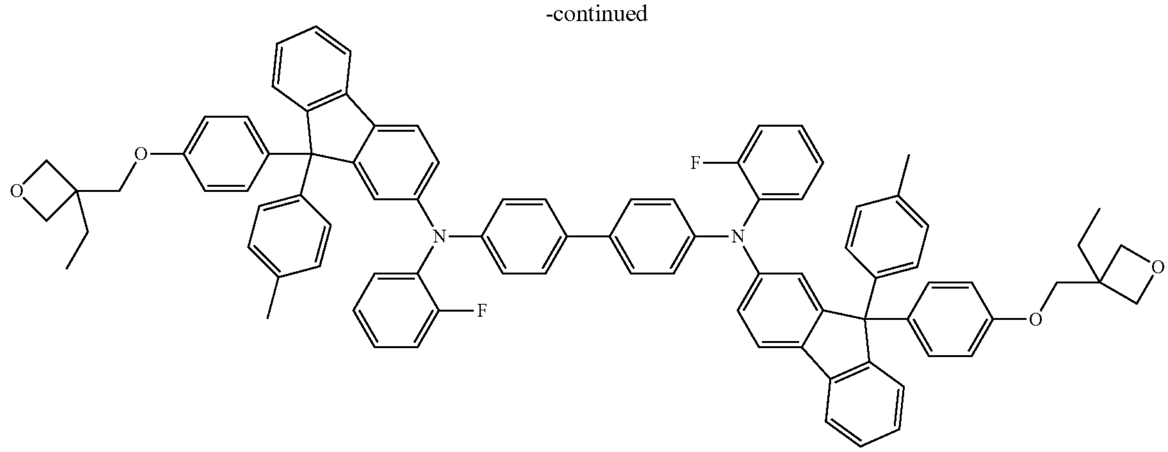
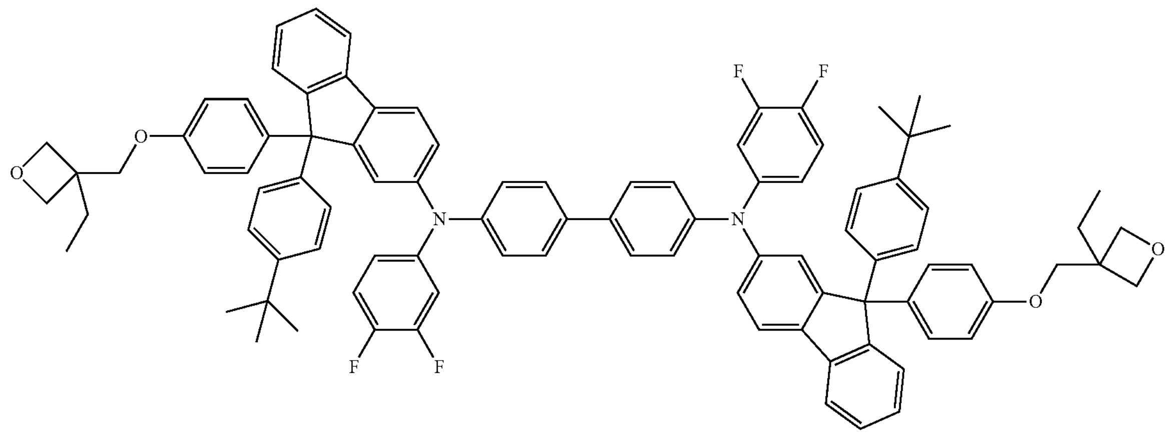
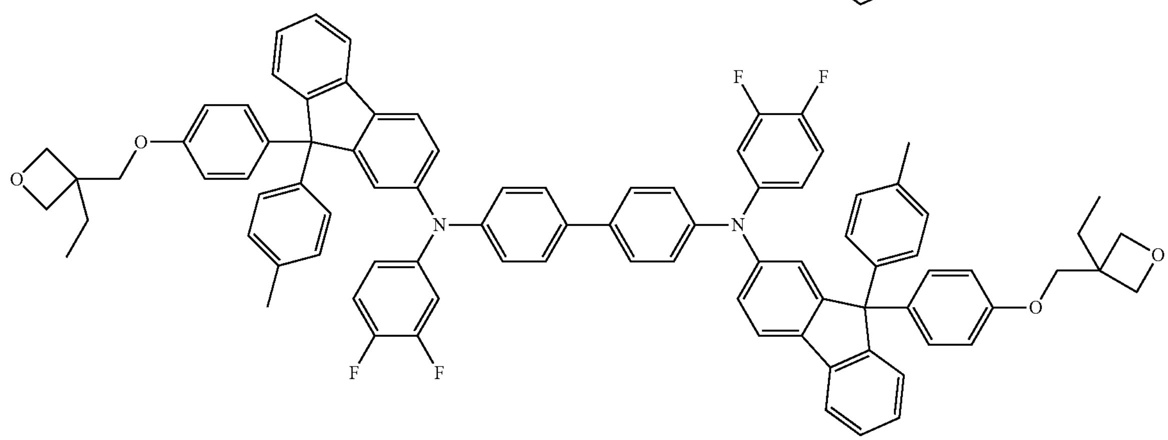
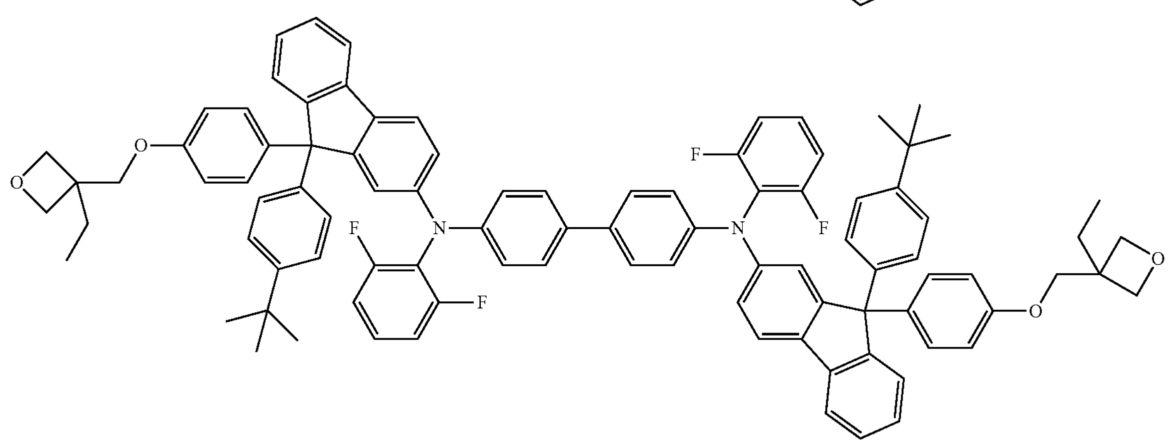

-continued
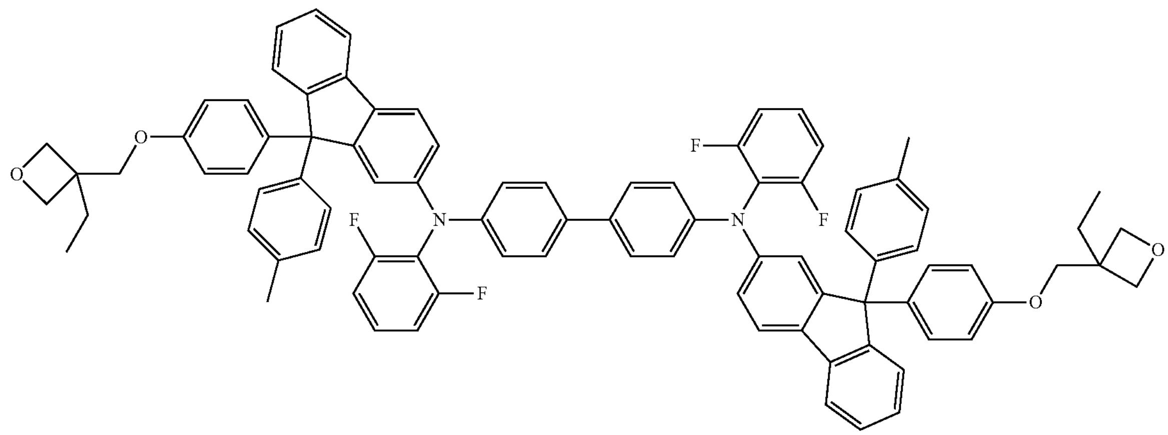
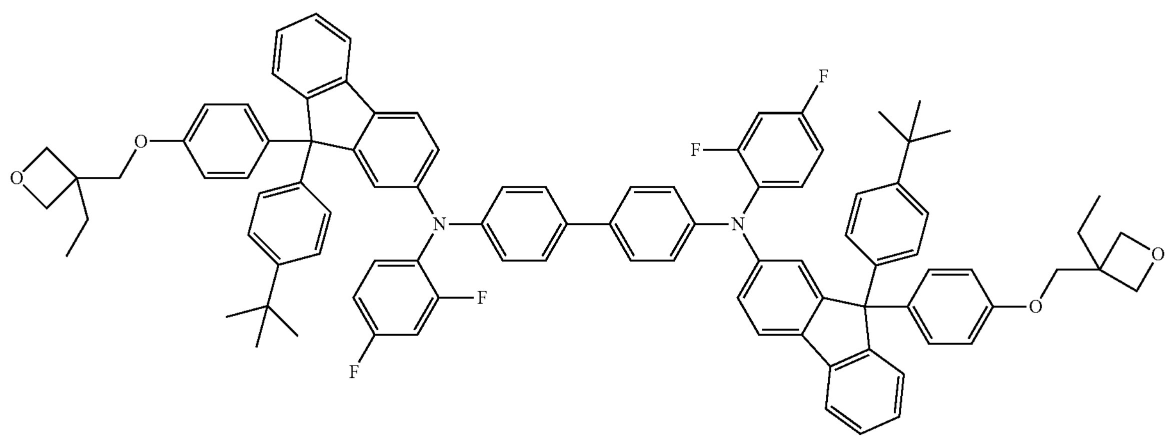
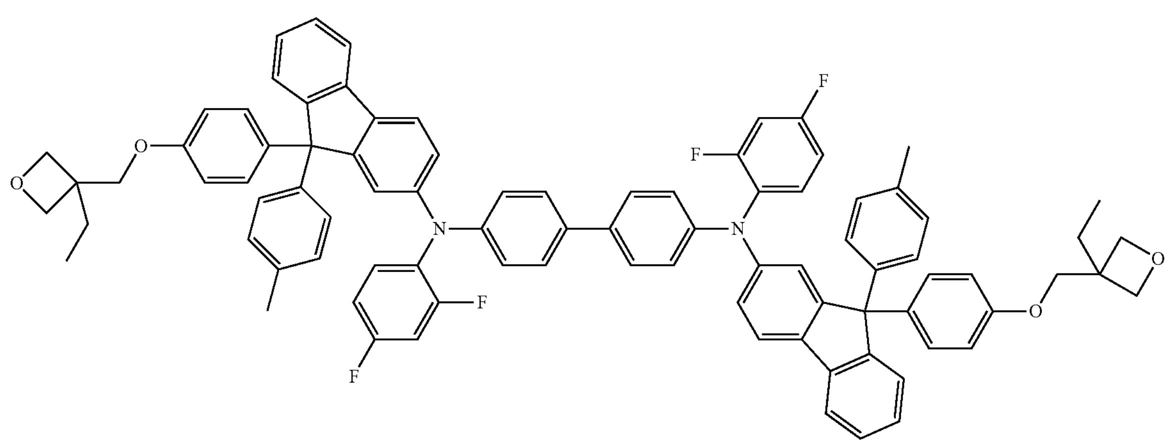

-continued
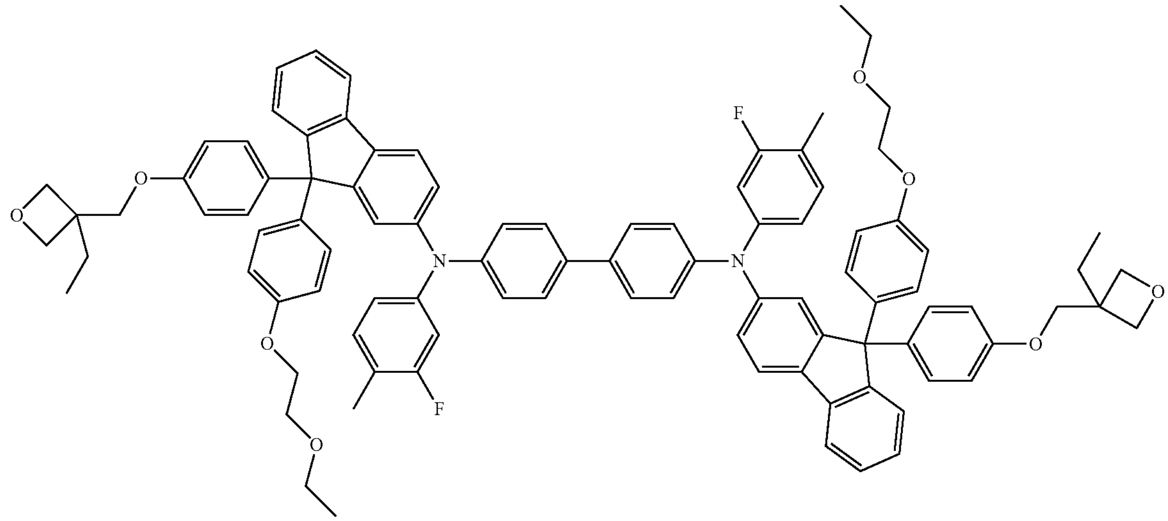
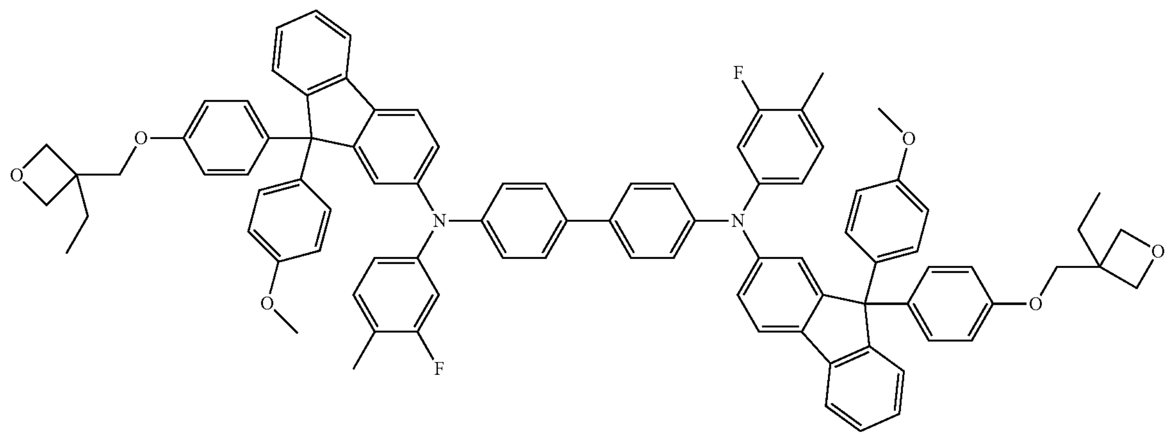
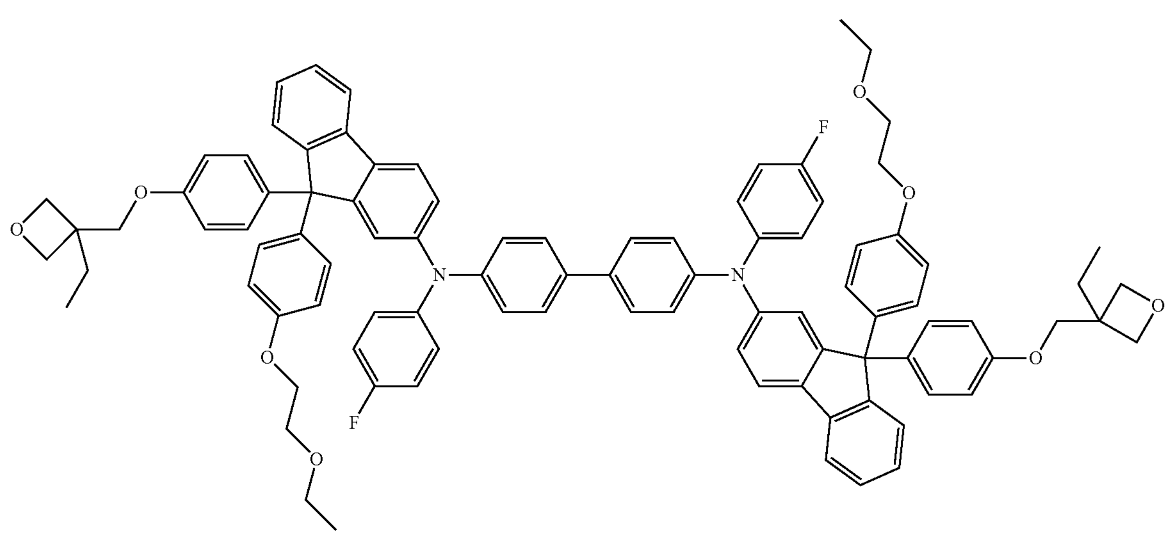

-continued
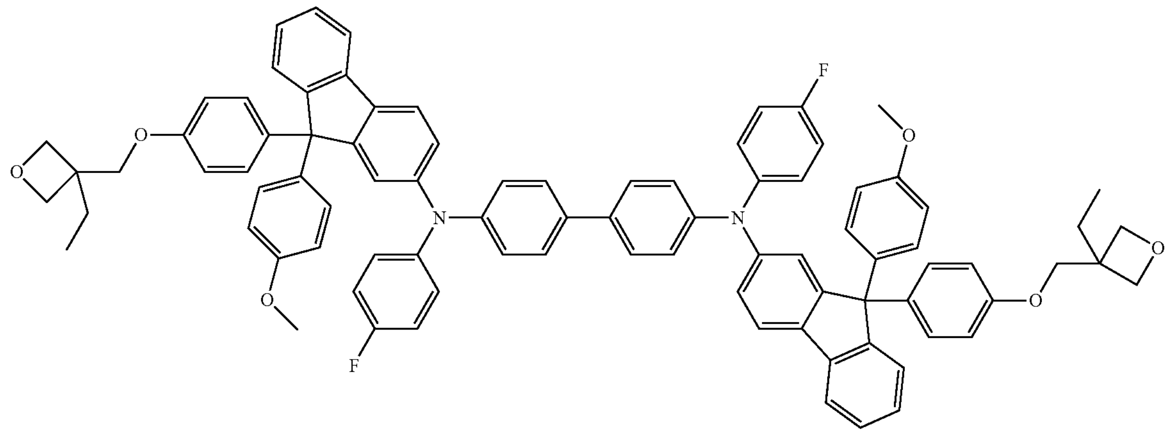
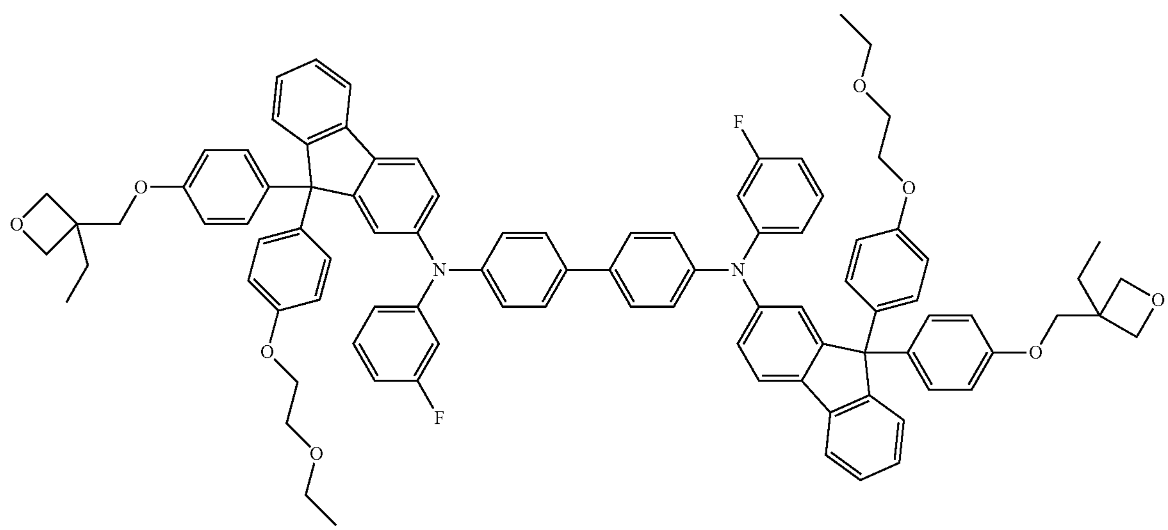
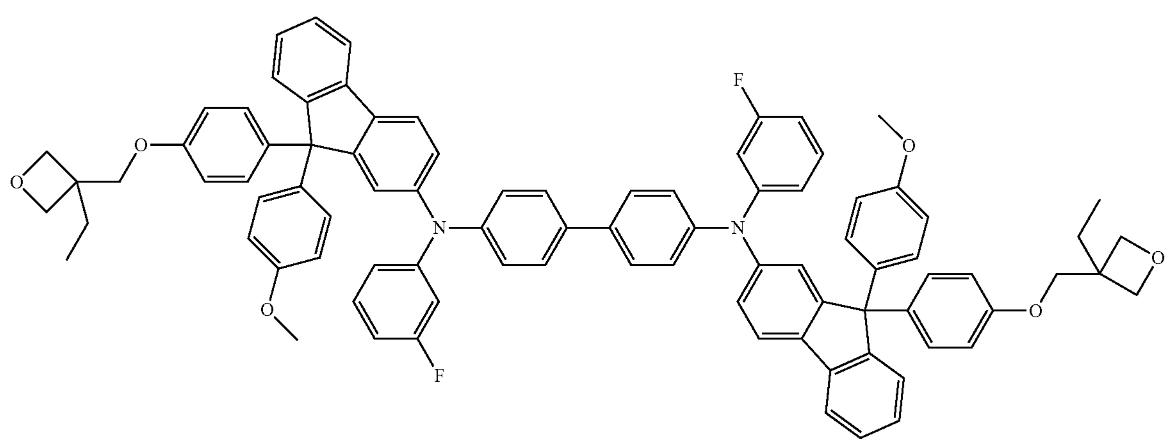

-continued
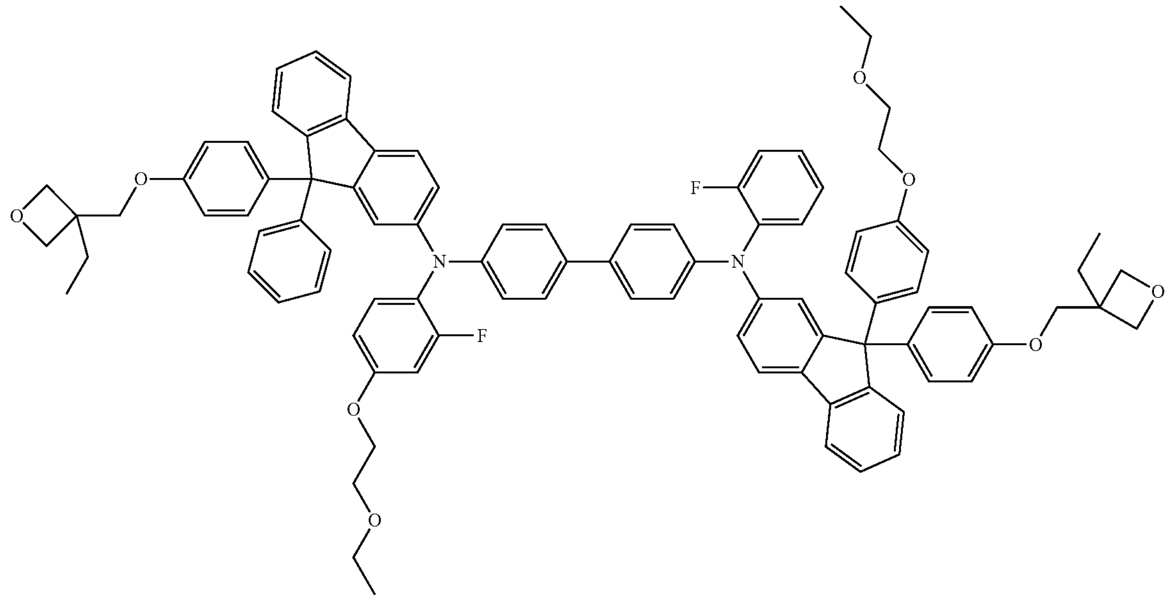
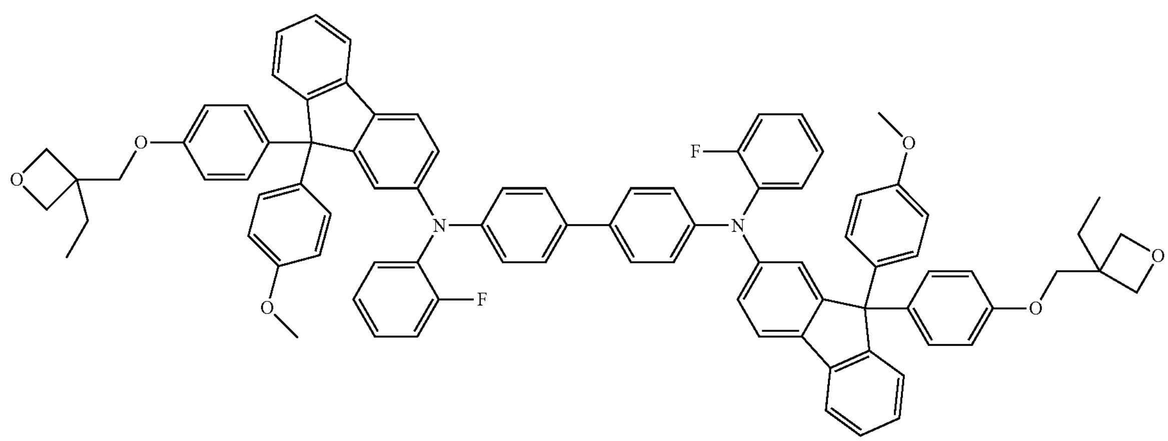
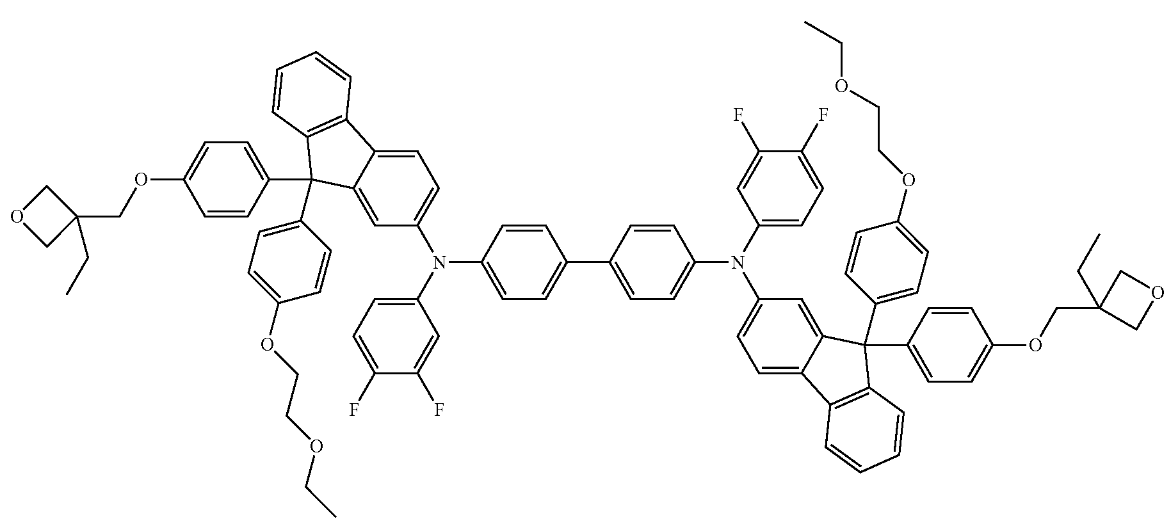

-continued
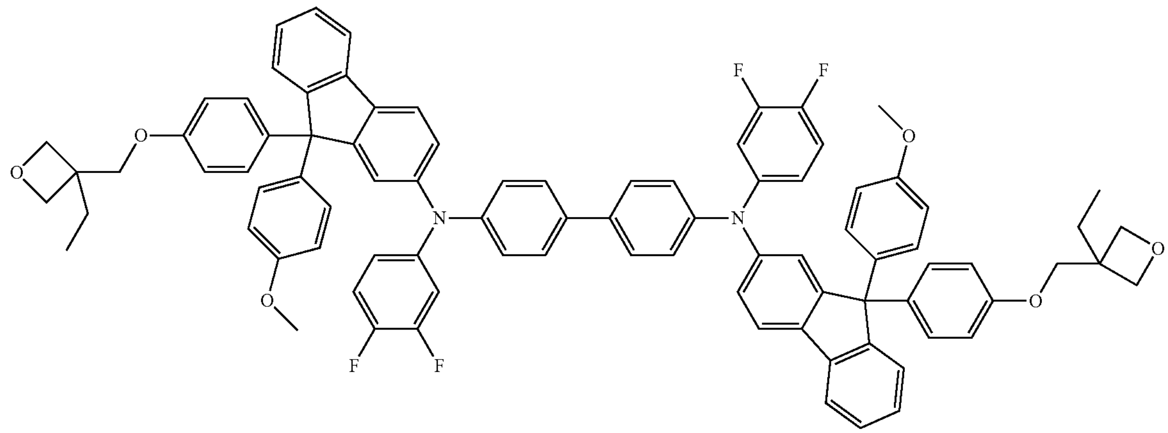
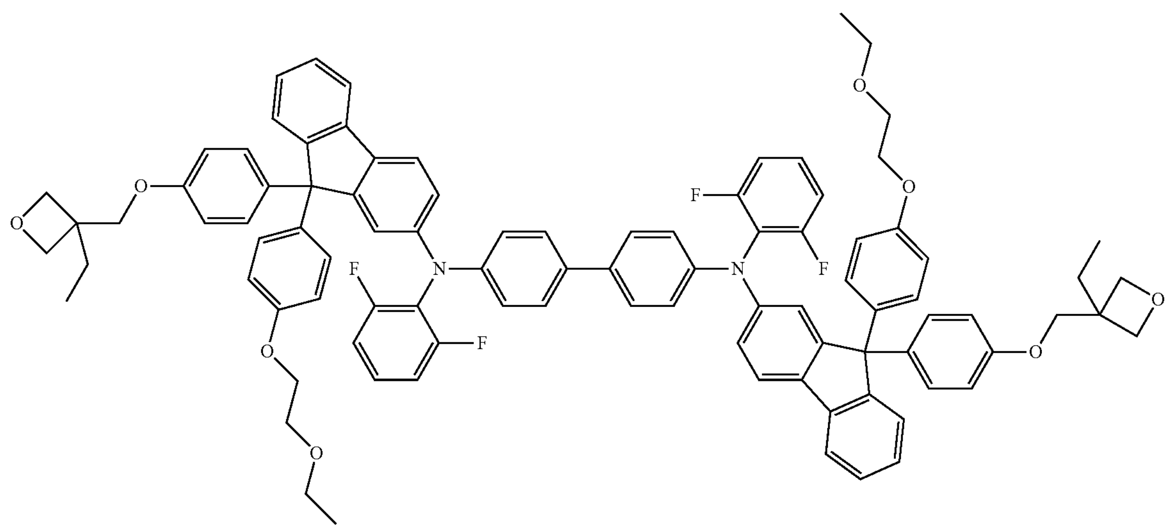
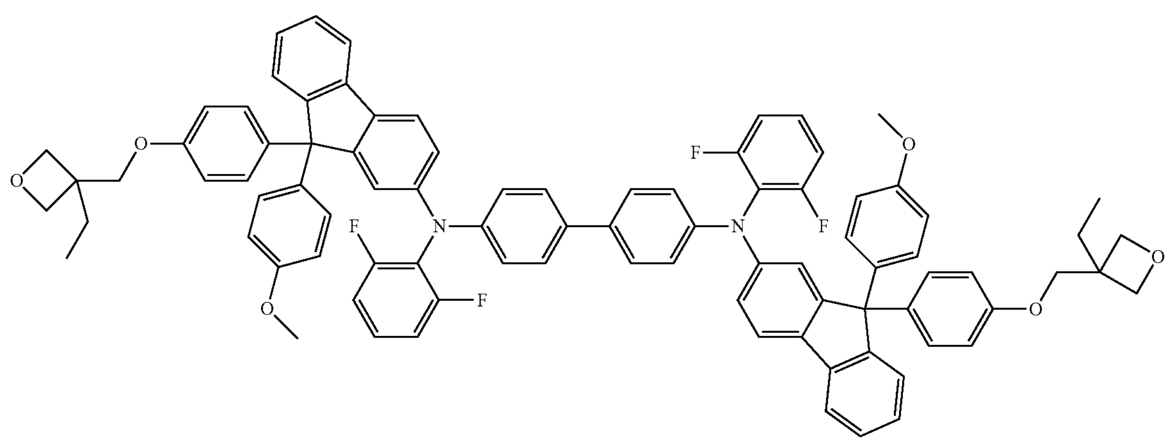

-continued
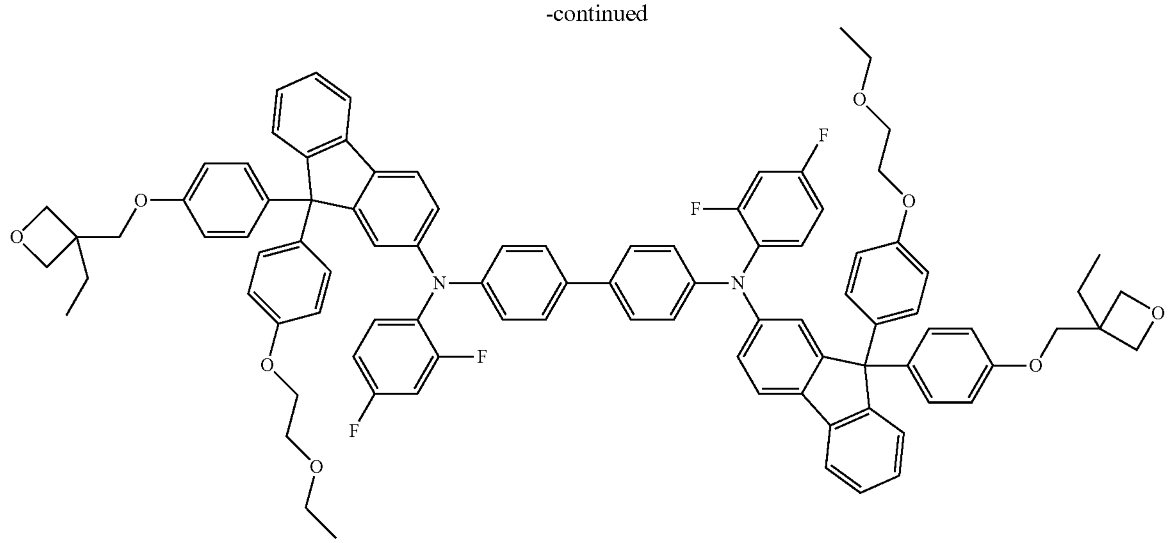
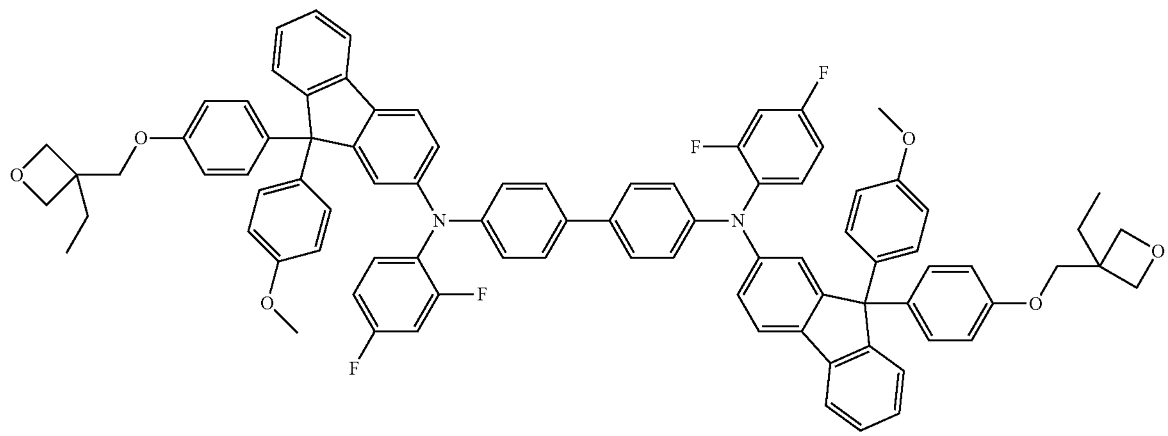
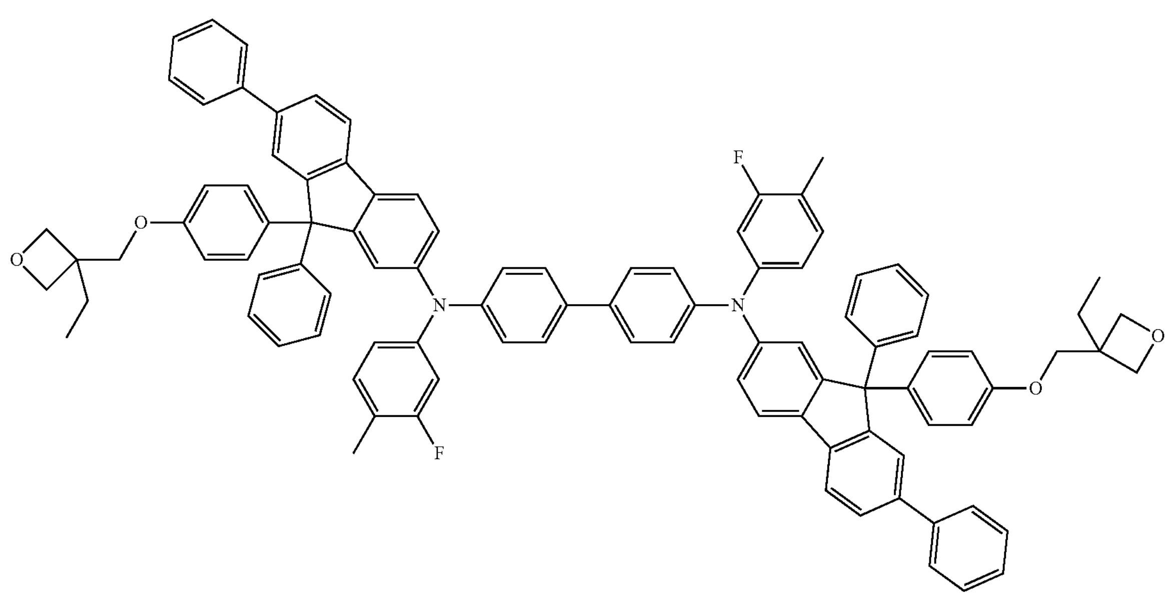

-continued
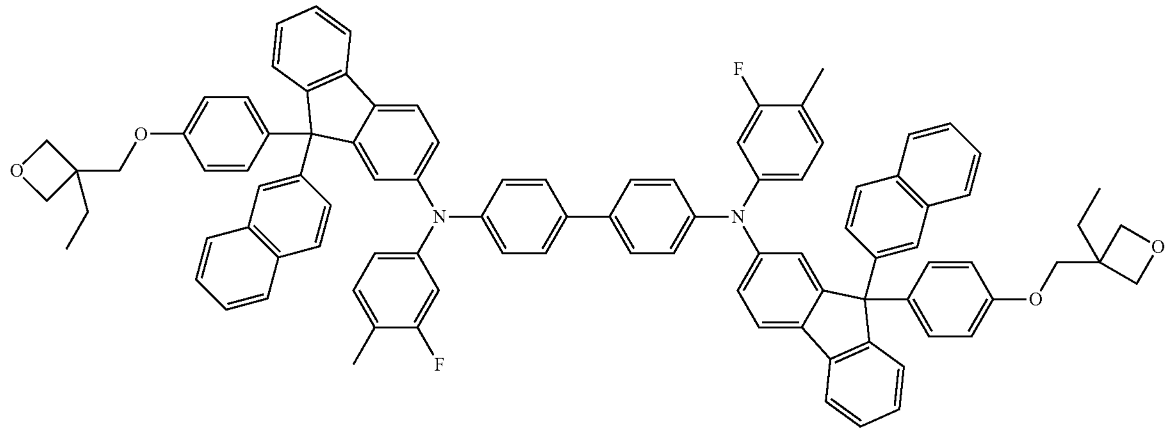
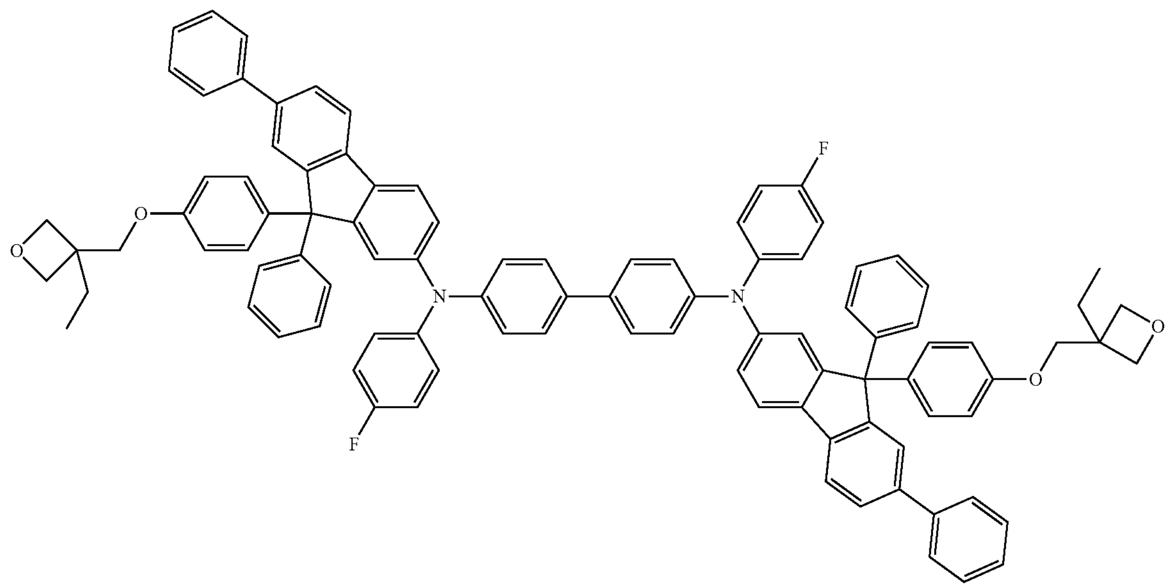
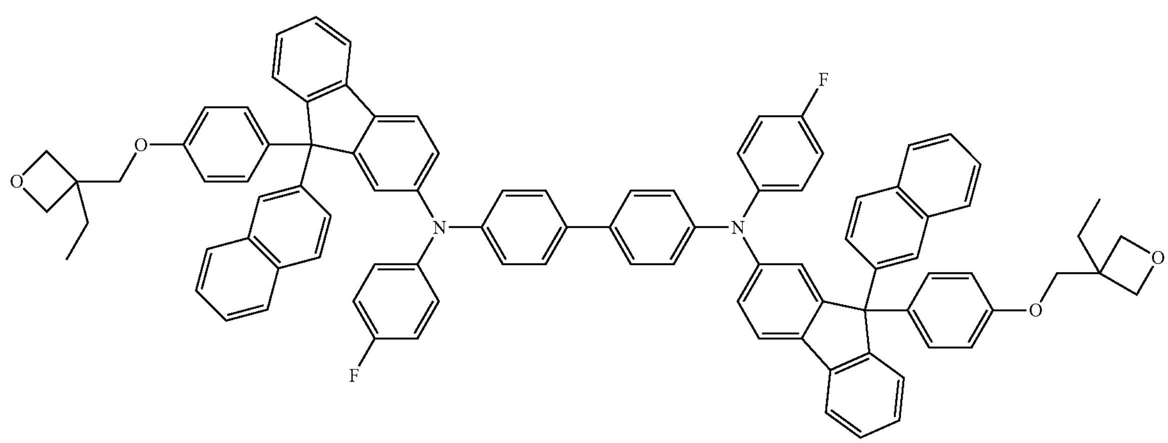

-continued
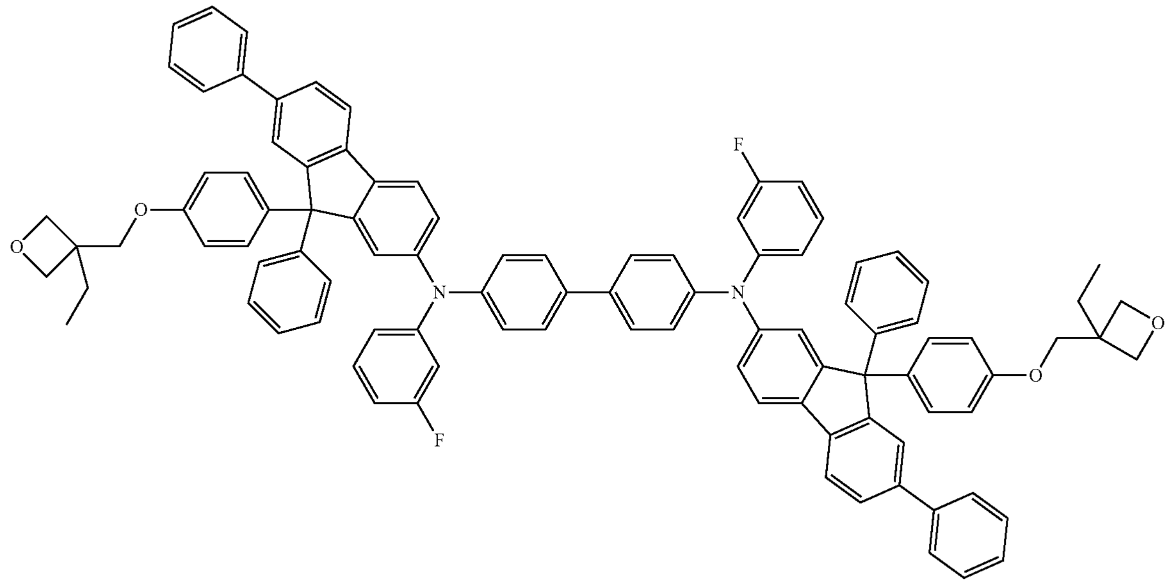
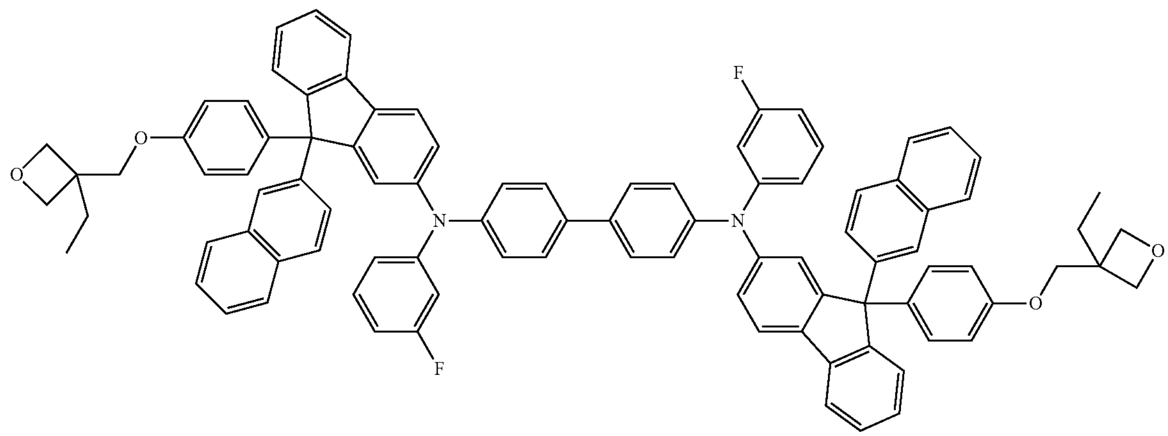
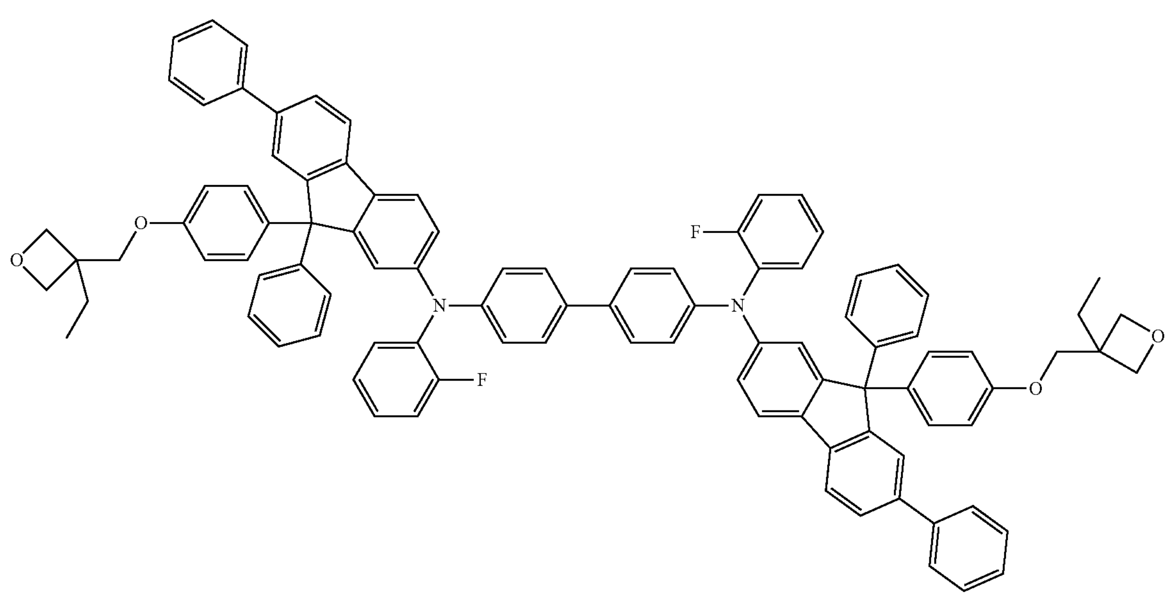

-continued
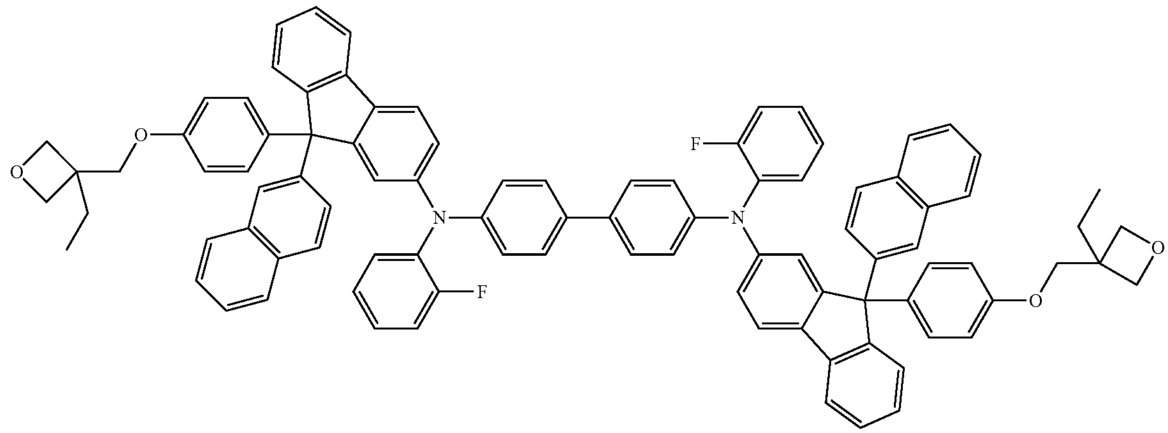
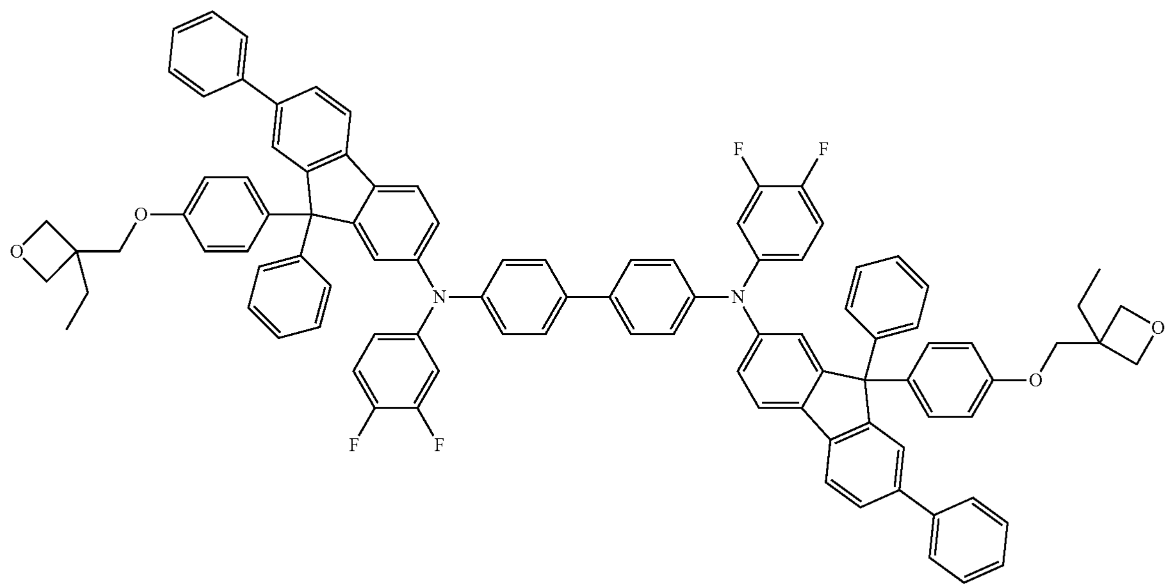
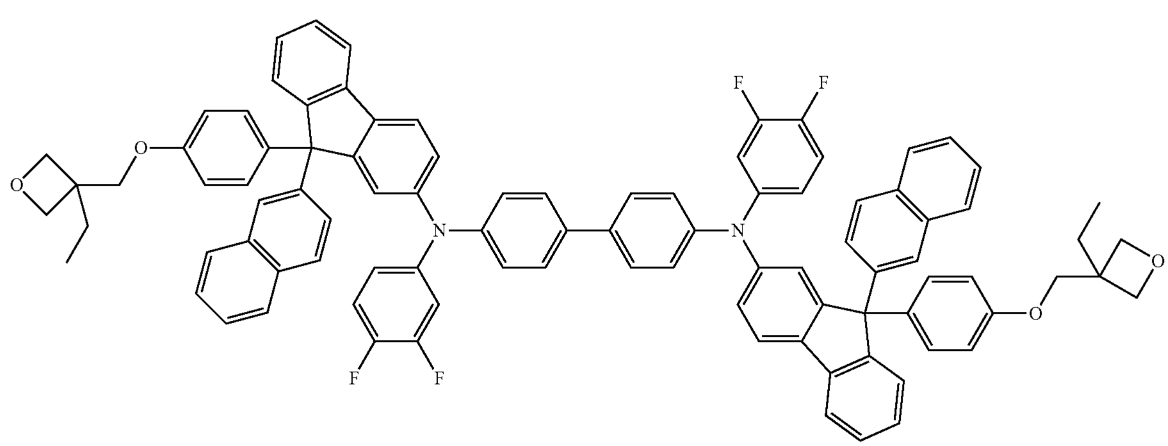

-continued
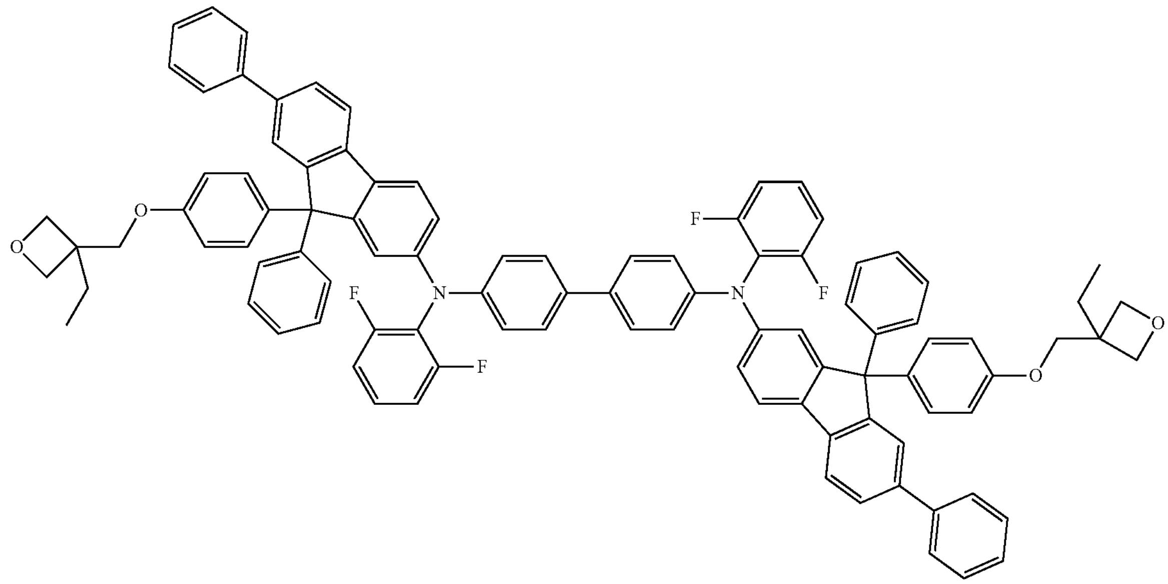
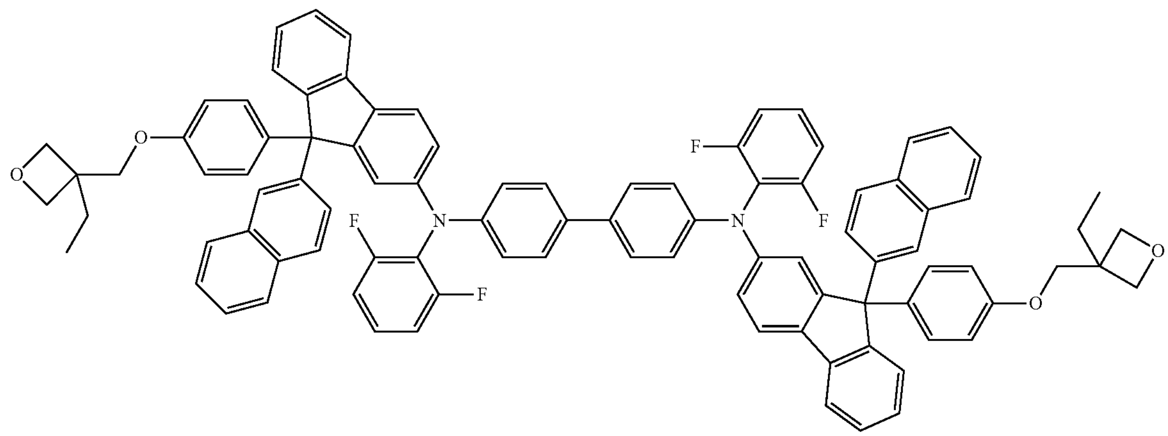
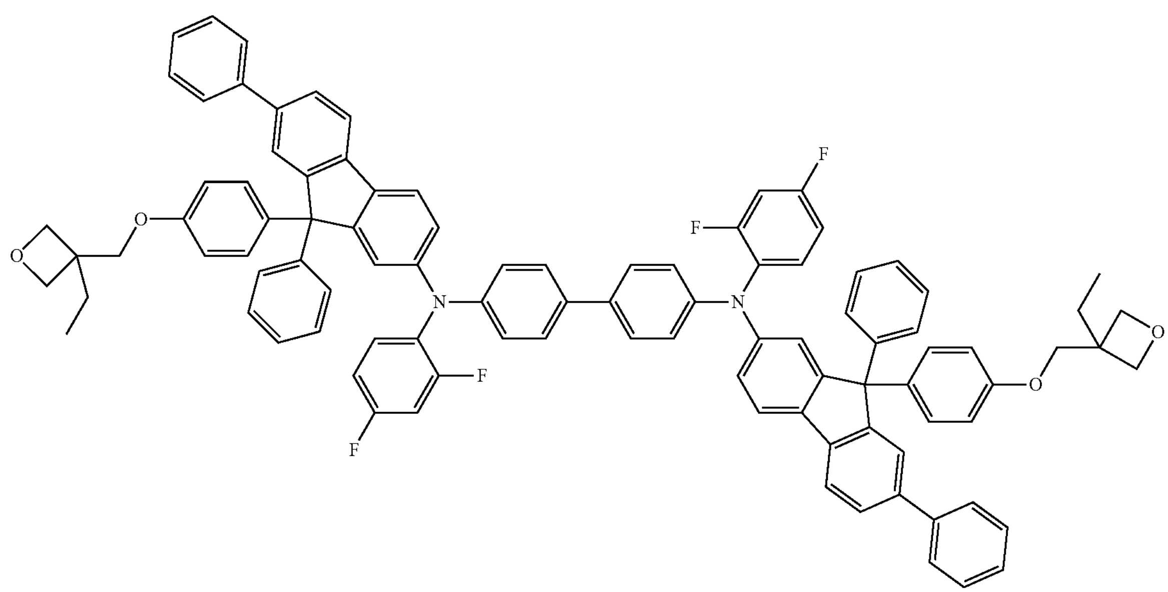

-continued

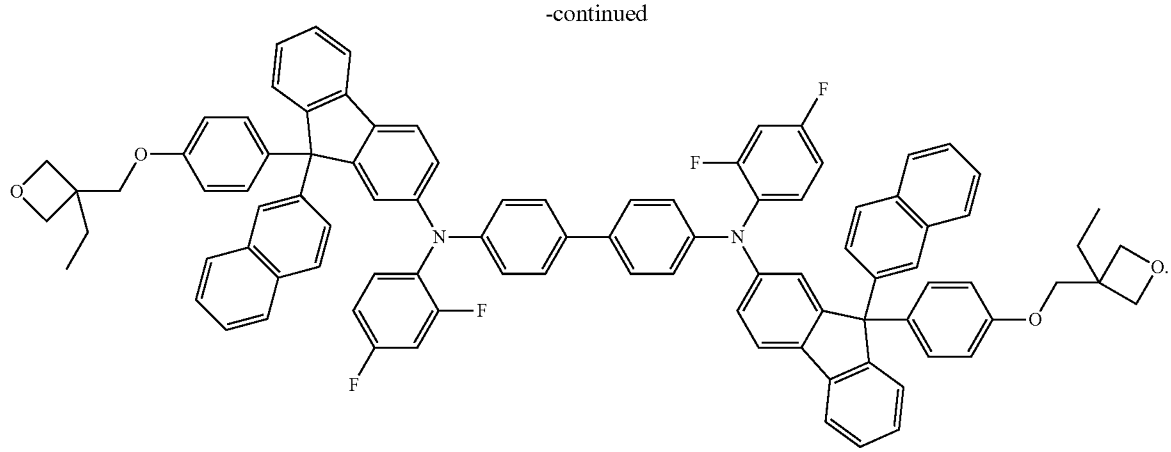

According to an exemplary embodiment of the present invention, a composition which includes the compound of Chemical Formula 1 or a cured product thereof may further include an ionic compound including an anionic group of the following Chemical Formula 3.

[Chemical Formula 3]

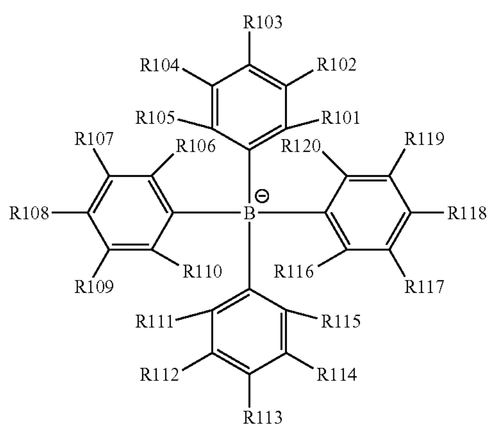

In Chemical Formula 3, at least one of R101 to R120 is a curable group, at least one of the other R101 to R120, which are not the curable group, is F; a cyano group; or a substituted or unsubstituted fluoroalkyl group, the other R101 to R20, which are not a curable group; F; a cyano group; or a substituted or unsubstituted fluoroalkyl group, are the same as or different from each other, and are each independently hydrogen; deuterium; a nitro group; —C(O) $R_{201}$; —OR—$_{202}$; —$SR_{203}$; —$SO_3R_{204}$; —$COOR_{205}$; —OC(O)$R_{206}$; —C(O)$NR_{207}R_{208}$; a substituted or unsubstituted alkyl group; a substituted or unsubstituted alkenyl group; a substituted or unsubstituted amine group; a substituted or unsubstituted aryl group; or a substituted or unsubstituted heterocyclic group, and $R_{201}$ to $R_{208}$ are the same as or different from each other, and are each independently hydrogen; deuterium; or a substituted or unsubstituted alkyl group.

According to an exemplary embodiment of the present invention, the anionic group represented by Chemical Formula 3 includes a curable group in at least one of R101 to R120.

According to an exemplary embodiment of the present invention, the number of curable groups of the anionic group represented by Chemical Formula 3 is 1 to 4.

In another exemplary embodiment, the number of curable groups of the anionic group represented by Chemical Formula 3 is 1.

In still another exemplary embodiment, the number of curable groups of the anionic group represented by Chemical Formula 3 is 2.

In yet another exemplary embodiment, the number of curable groups of the anionic group represented by Chemical Formula 3 is 4. Since the anionic group represented by Chemical Formula 3 is not cured when there is no curable group, the characteristics of a device are reduced due to the movement of the cationic group and anionic group of the present invention between the electrode layers. Further, when the number of curable groups increases, the curing rate of the coating composition increases and the film retention rate is improved, so that a compound having four curable groups is more desirable.

In an exemplary embodiment of the present invention, the number of F's; cyano groups; or substituted or unsubstituted fluoroalkyl groups of the anionic group represented by Chemical Formula 3 is 8 to 19.

According to an exemplary embodiment of the present invention, based on 100 parts by weight of the anionic group represented by Chemical Formula 3, the part by weight of F in the anionic group is 15 parts by weight to 50 parts by weight.

According to an exemplary embodiment of the present invention, the number of F's in the anionic group represented by Chemical Formula 3 is 8 to 19.

In an exemplary embodiment of the present invention, the first organic material layer may be a hole injection layer, and the ionic compound may be used as a dopant. In this case, when the content of F of the anionic group is increased, the force of attracting electrons from another compound (host compound) is increased, and holes are more proficiently produced in the host, so that the performance in the hole injection layer is improved.

According to an exemplary embodiment of the present invention, the content of F may be analyzed using COSA AQF-100 combustion furnace coupled to a Dionex ICS 2000 ion-chromatograph, or may be confirmed through 19F NMR which is a method generally used in the F analysis.

In an exemplary embodiment of the present invention, at least one benzene ring of a benzene ring to which R101 to R105 are bonded, a benzene ring to which R106 to R110 are bonded, a benzene ring to which R111 to R115 are bonded, and a benzene ring to which R116 to R120 are bonded in Chemical Formula 3 is selected from the following structural formulae.

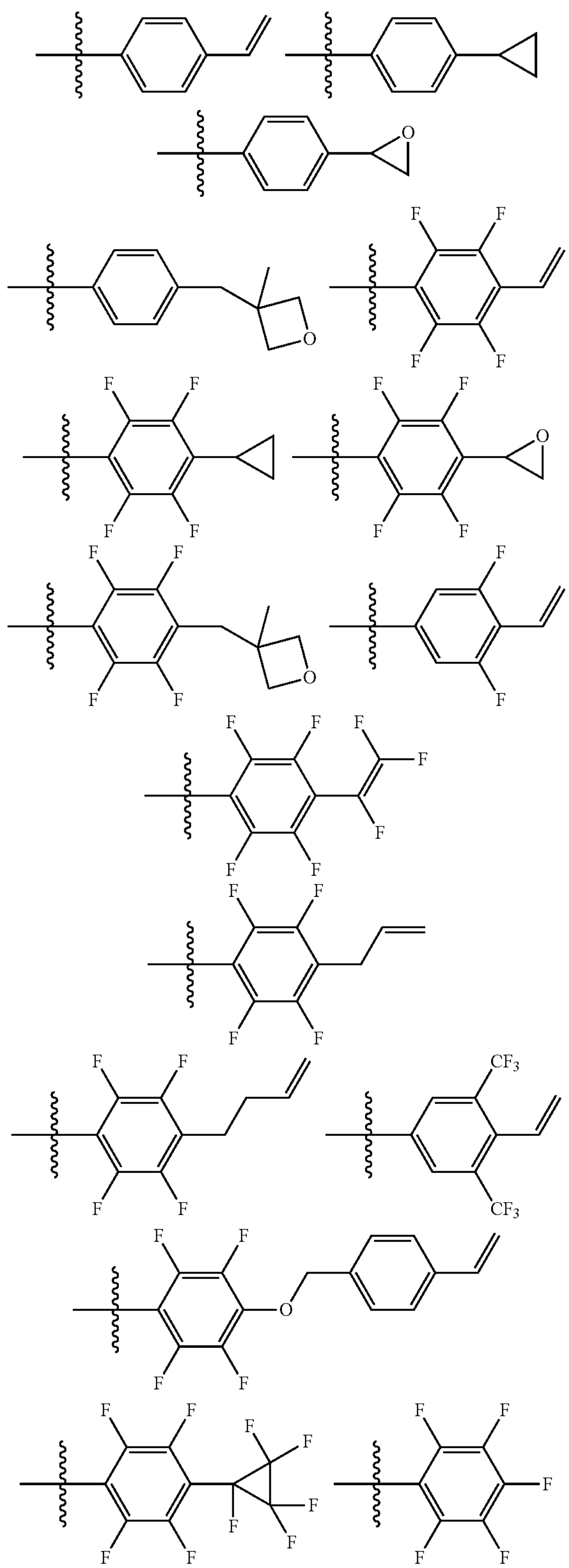

-continued

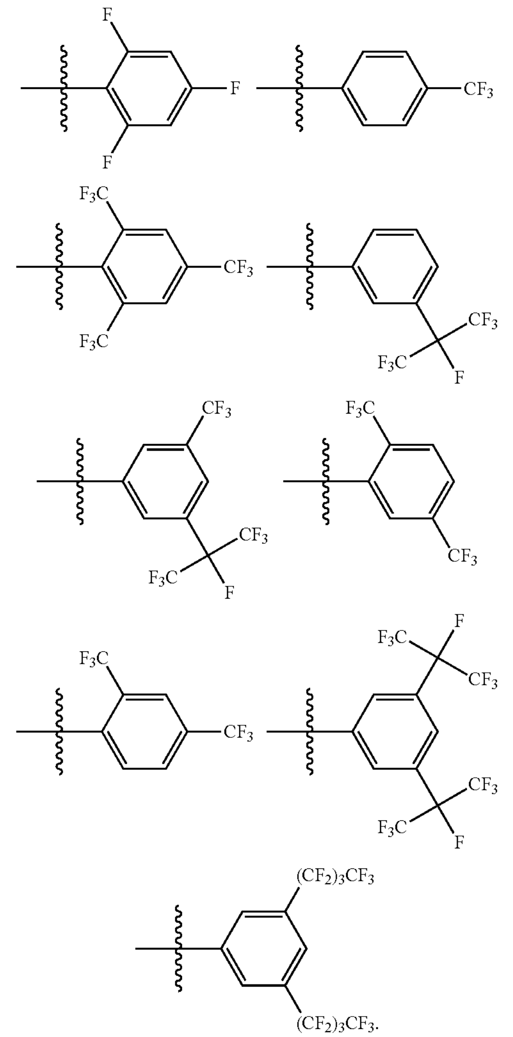

According to an exemplary embodiment of the present invention, the ionic compound includes a cationic group, and the cationic group is selected from a monovalent cationic group, an onium compound, or the following structural formulae.

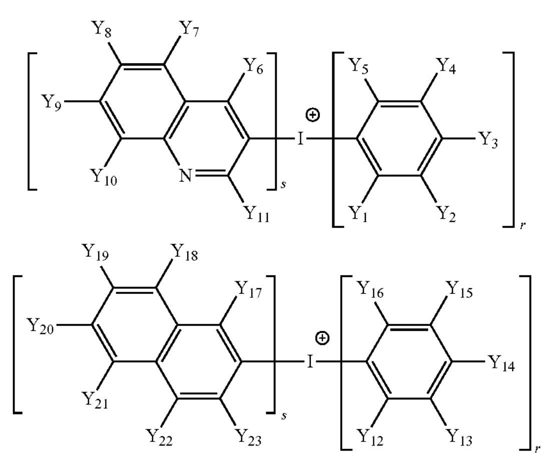

-continued

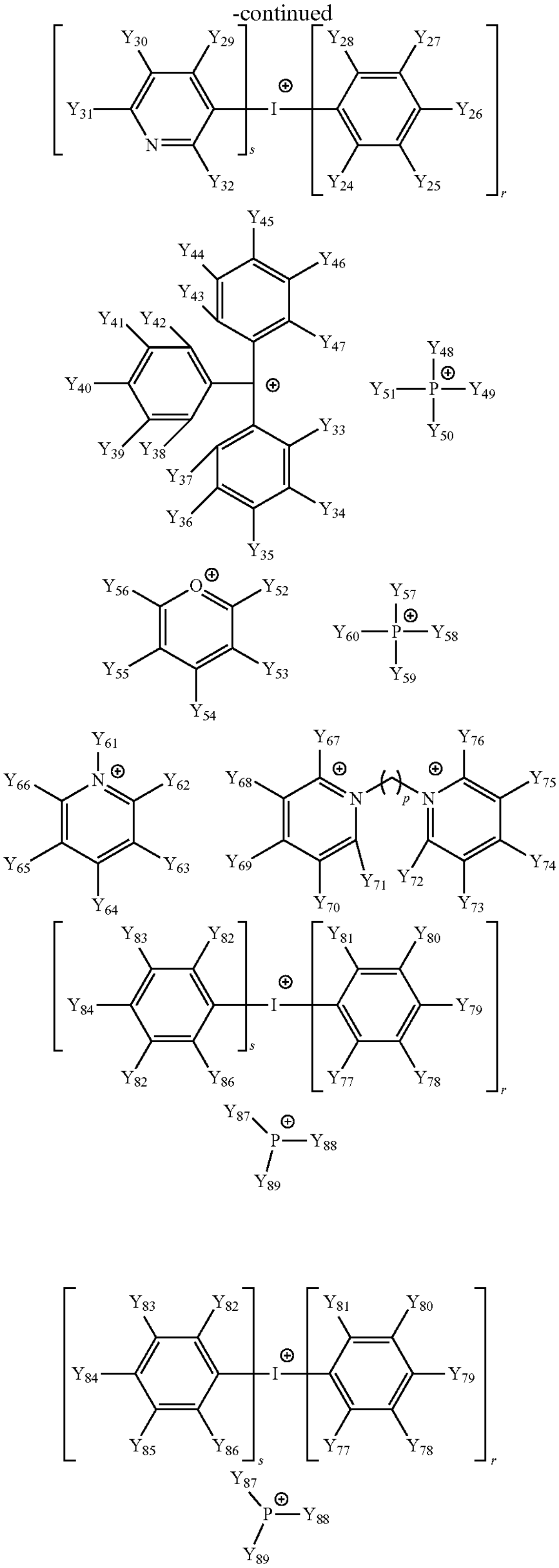

In the structural formulae, $Y_1$ to $Y_{89}$ are the same as or different from each other, and are each independently hydrogen; a cyano group; a nitro group; a halogen group; a hydroxyl group; —$COOR_{305}$; a substituted or unsubstituted alkyl group; a substituted or unsubstituted alkoxy group; a substituted or unsubstituted aryloxy group; a substituted or unsubstituted cycloalkyl group; a substituted or unsubstituted fluoroalkyl group; a substituted or unsubstituted aryl group; or a curable group, $R_{305}$ is hydrogen; deuterium; or a substituted or unsubstituted alkyl group, p is an integer from 0 to 10, and r is 1 or 2, s is 0 or 1, and r+s=2.

In the present invention, the onium compound means a compound produced by coordinating a hydrogen ion or another radical to an unshared electron pair such as iodine, oxygen, sulfur, nitrogen, and phosphorus.

According to an exemplary embodiment of the present invention, $Y_1$ to $Y_{89}$ are the same as or different from each other, and are each independently hydrogen; a cyano group; a nitro group; F; Cl; a hydroxyl group; —$COOR_{305}$; a methyl group; a methyl group substituted with a phenylmethoxy group; an ethyl group; a propyl group; a butyl group; a pentyl group; a hexyl group; a methoxy group; a phenyl-substituted methoxy group; a phenyloxy group; a cyclopropyl group; an ethoxyethoxy group; a phenyl group; a naphthyl group; or a curable group, and $R_{305}$ is a methyl group.

According to an exemplary embodiment of the present invention, examples of the monovalent cationic group include $Na^+$, $Li^+$, $K^+$, and the like, but are not limited thereto.

In an exemplary embodiment of the present invention, the cationic group is selected from the following structural formulae.

1-1

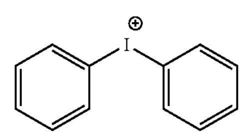

1-2

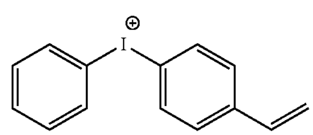

1-3

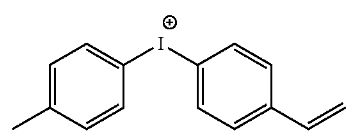

1-4

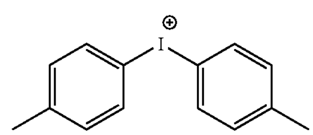

1-5

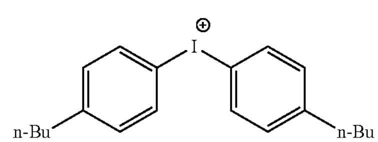

1-6

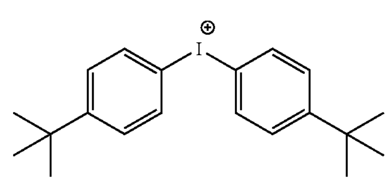

-continued
1-7
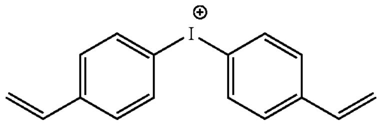
1-8
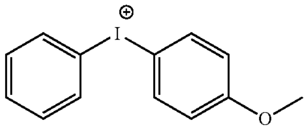
1-9
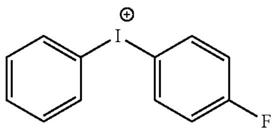
1-10
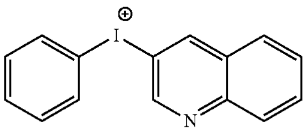
1-11
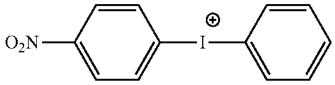
1-12
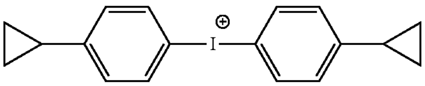
1-13
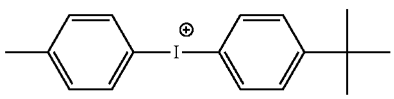
1-14
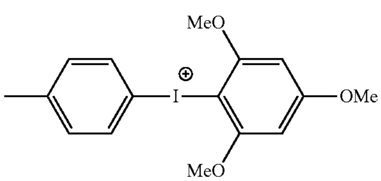
1-15
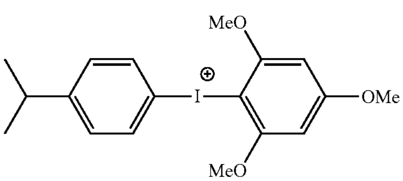
1-16
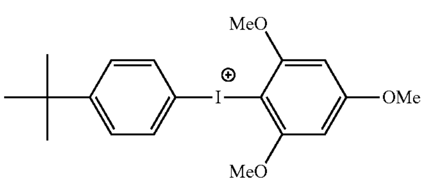
1-17
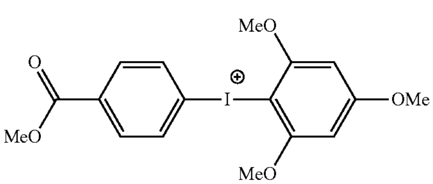
-continued
1-18
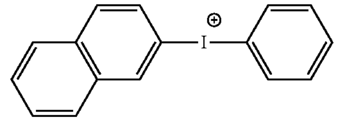
1-19
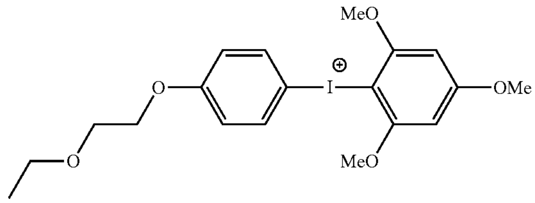
1-20
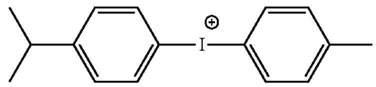
1-21
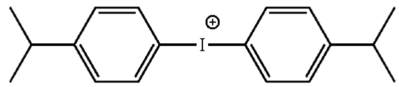
1-22
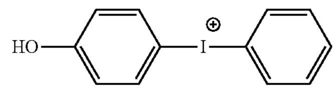
1-23
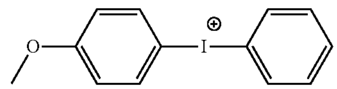
1-24
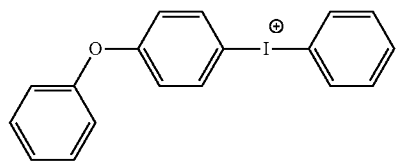
1-25
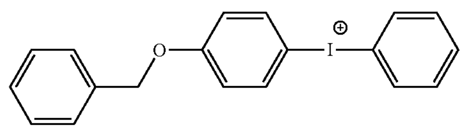
1-26
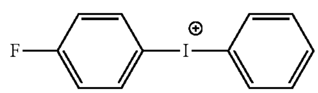
1-27
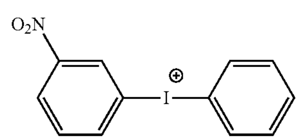
1-28
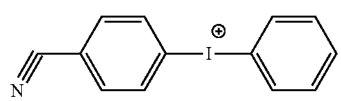
1-29
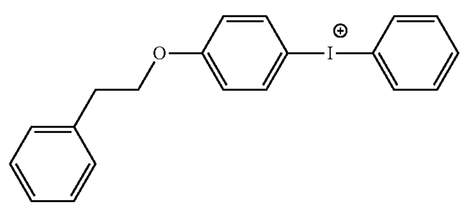

-continued
1-30
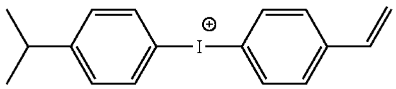
3-1
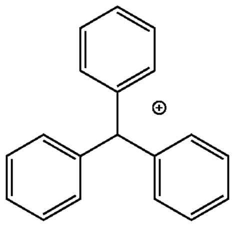
3-2
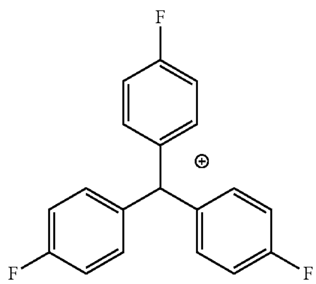
3-3
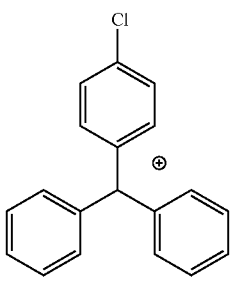
4-1
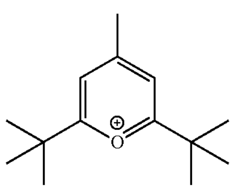
4-2
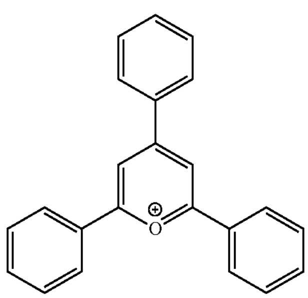
4-3
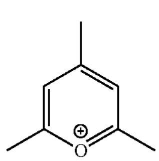
-continued
5-1
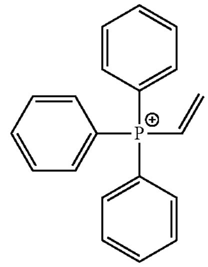
5-2
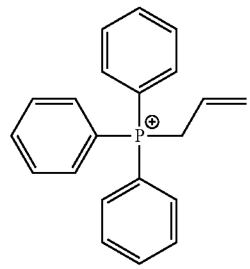
5-3
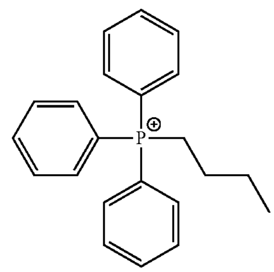
5-4
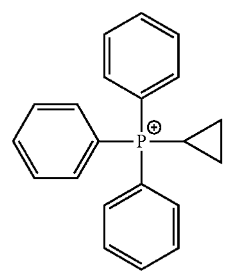
5-5
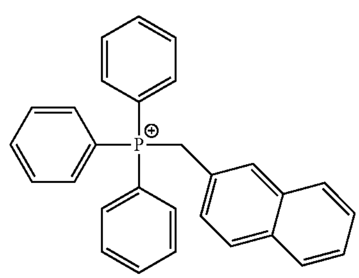

-continued
5-6
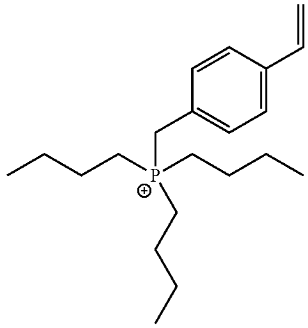
5-7
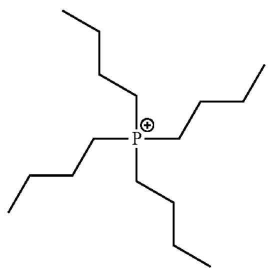
5-8
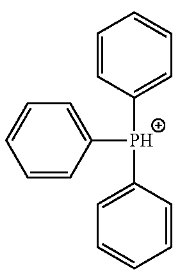
6-1
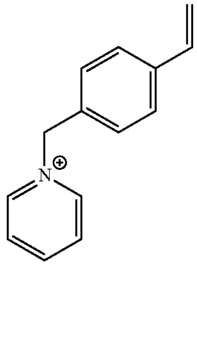
-continued
6-2
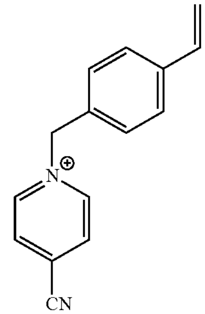
6-3
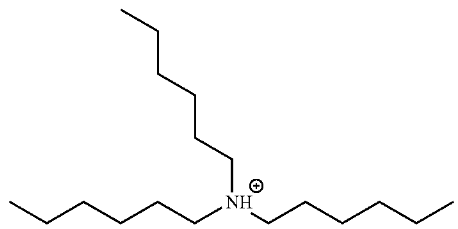
6-4
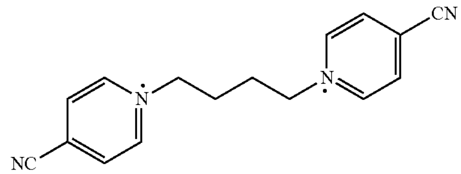
6-5
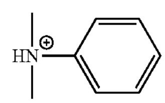
6-6
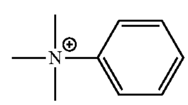
6-7
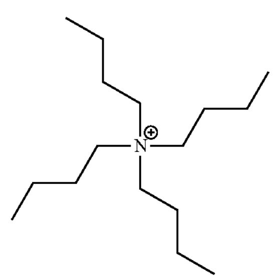
According to an exemplary embodiment of the present invention, the ionic compound is selected from the following structures.

[Chemical Formula 1-1]
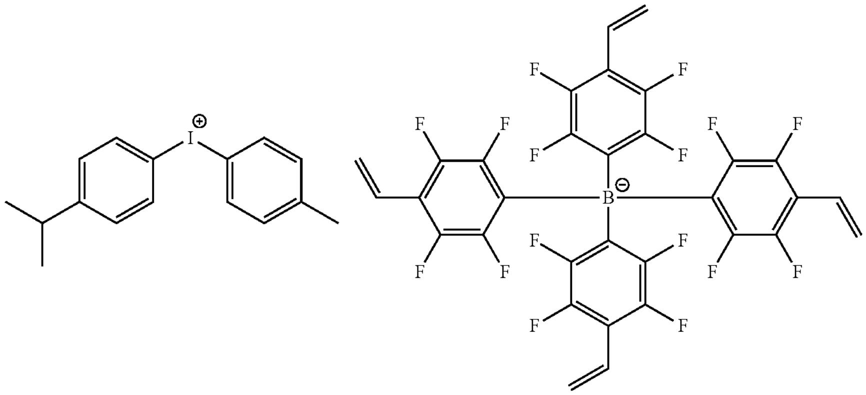
[Chemical Formula 1-1-2]
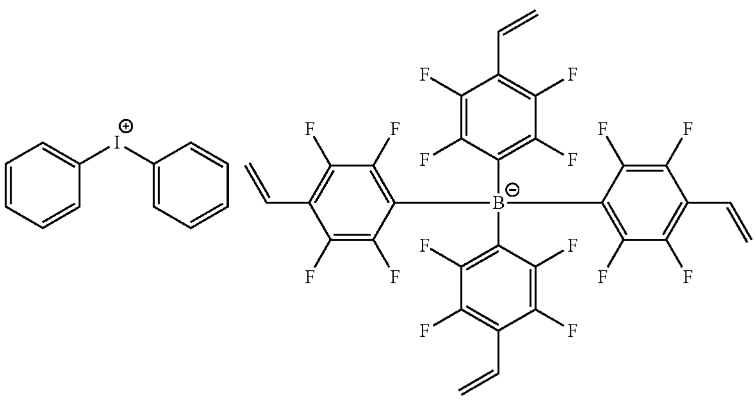
[Chemical Formula 1-1-3]
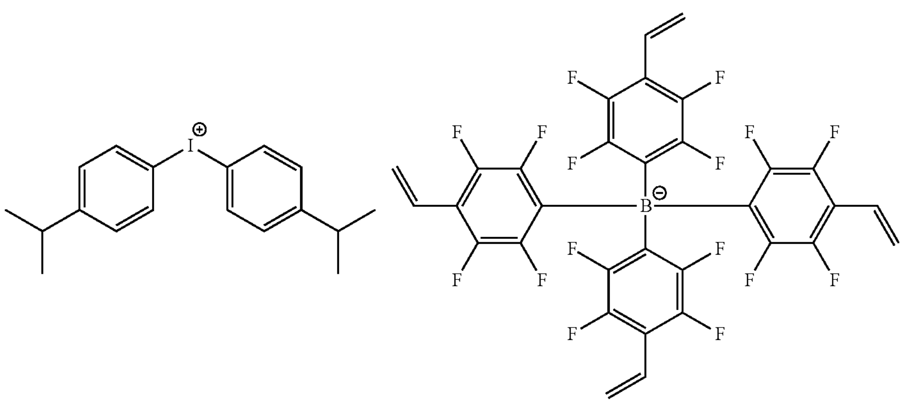
[Chemical Formula 1-1-4]
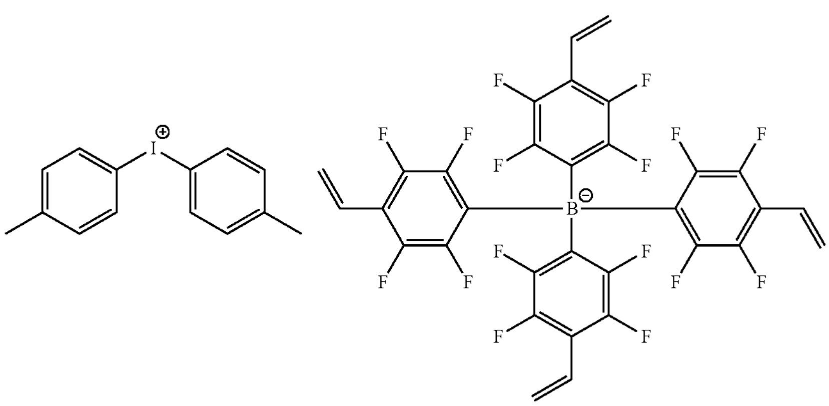

-continued
[Chemical Formula 1-1-5]
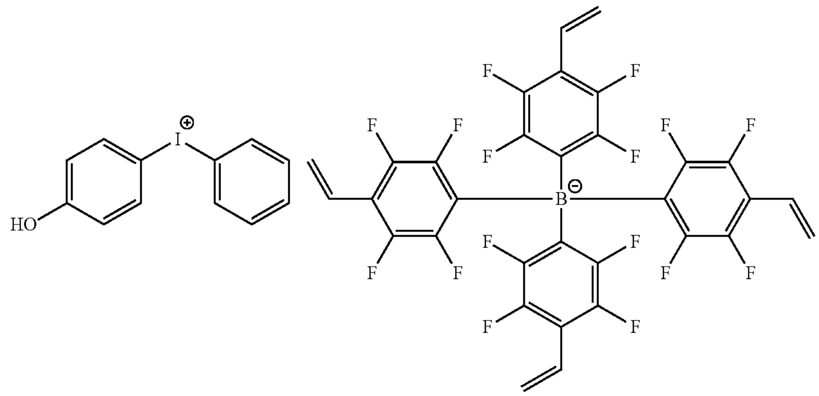
[Chemical Formula 1-1-6]
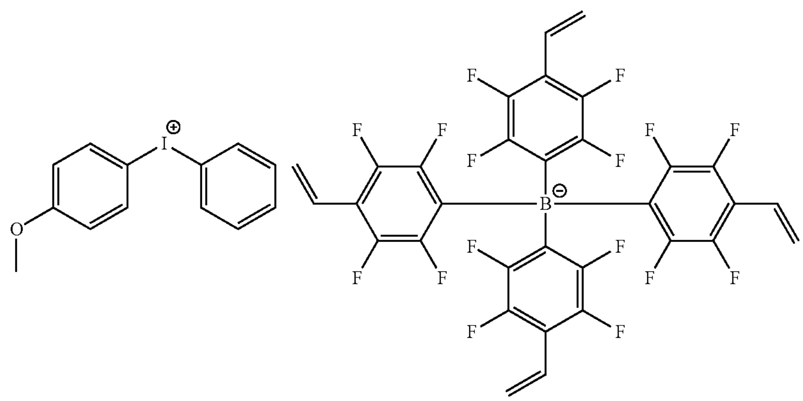
[Chemical Formula 1-1-7]
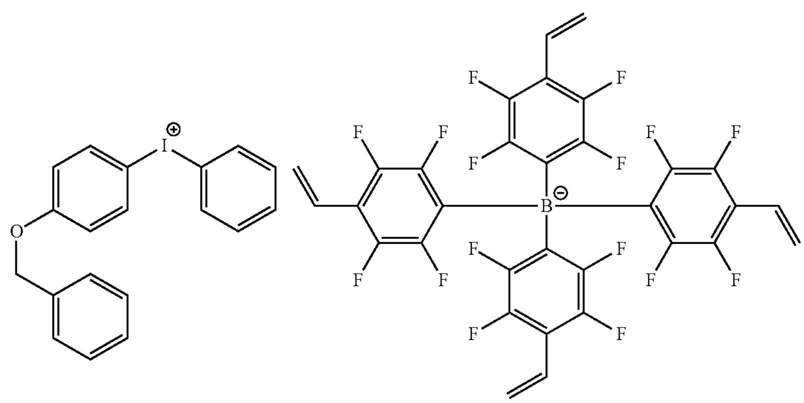
[Chemical Formula 1-1-8]
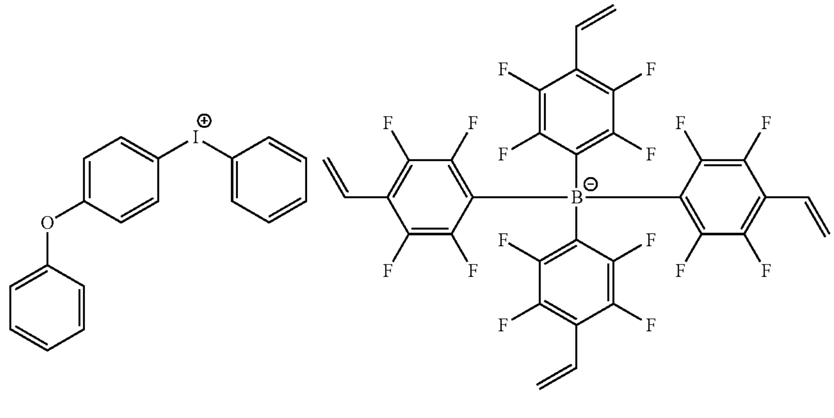

-continued
[Chemical Formula 1-1-9]
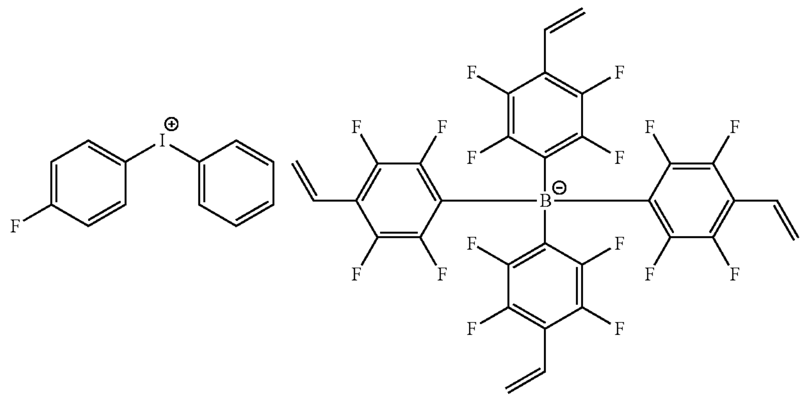
[Chemical Formula 1-1-10]
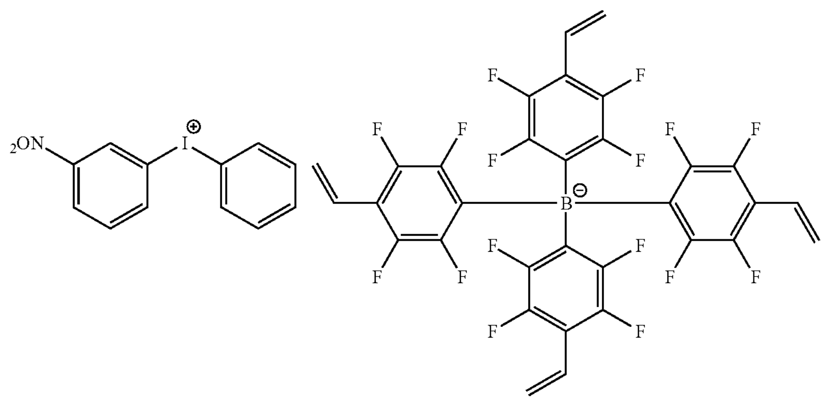
[Chemical Formula 1-1-11]
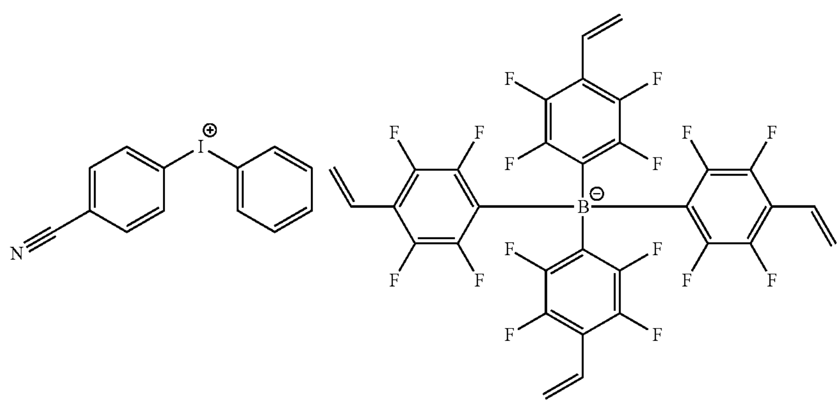
[Chemical Formula 1-1-12]
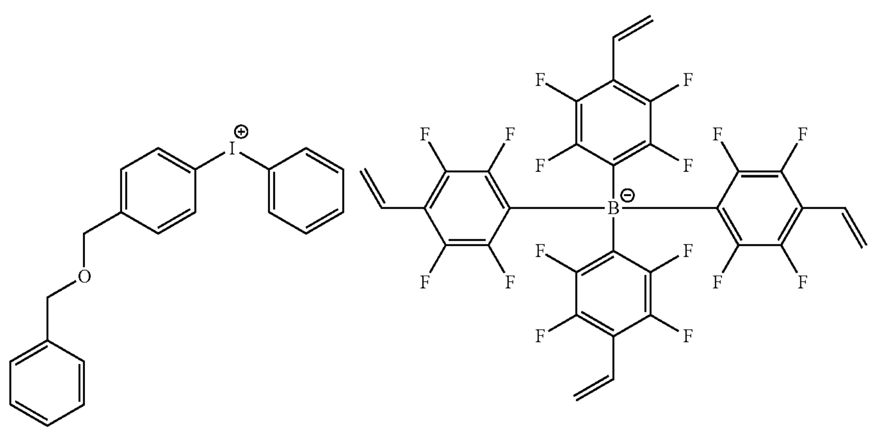

-continued
[Chemical Formula 1-1-13]
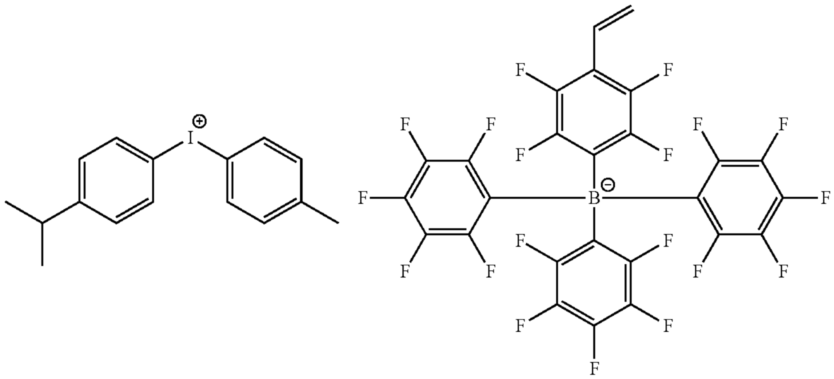
[Chemical Formula 1-1-14]
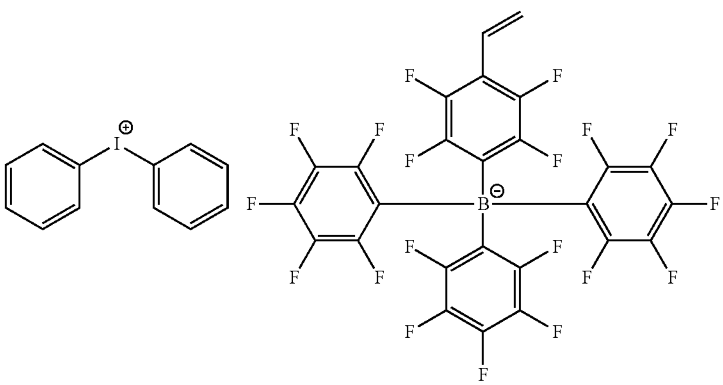
[Chemical Formula 1-1-15]
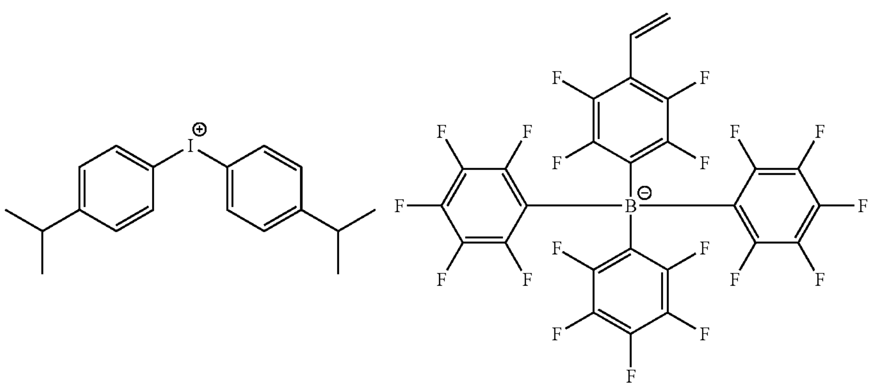
[Chemical Formula 1-1-16]
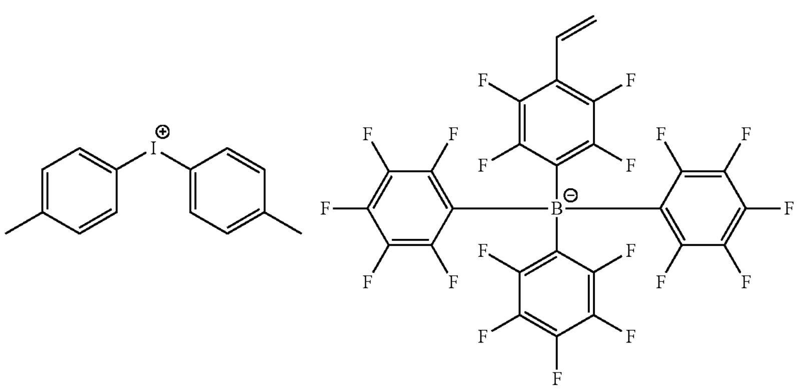

-continued
[Chemical Formula 1-1-17]
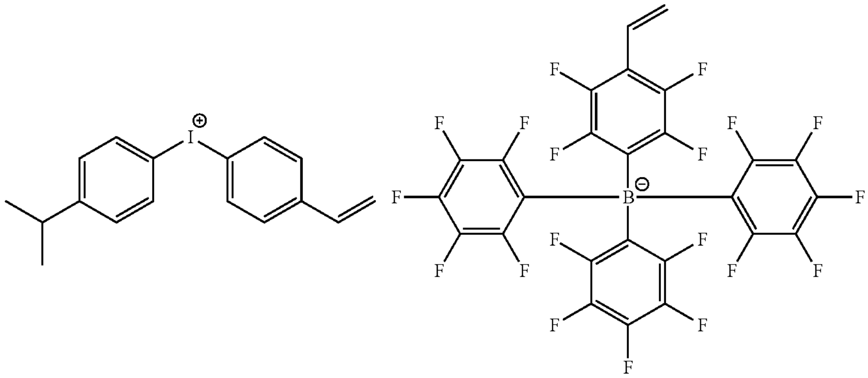
[Chemical Formula 1-1-18]
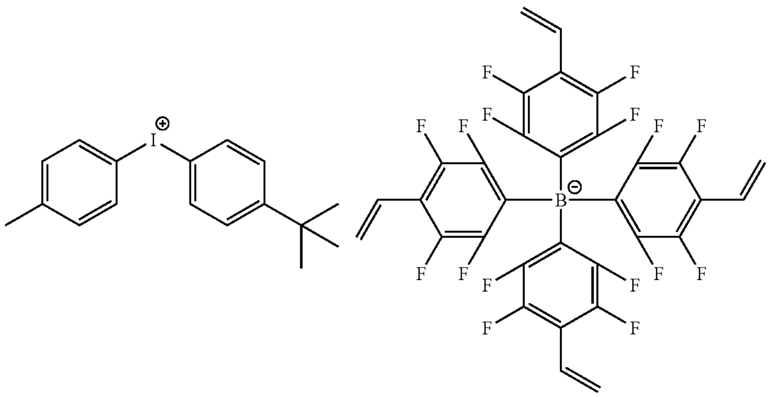
[Chemical Formula 1-1-19]
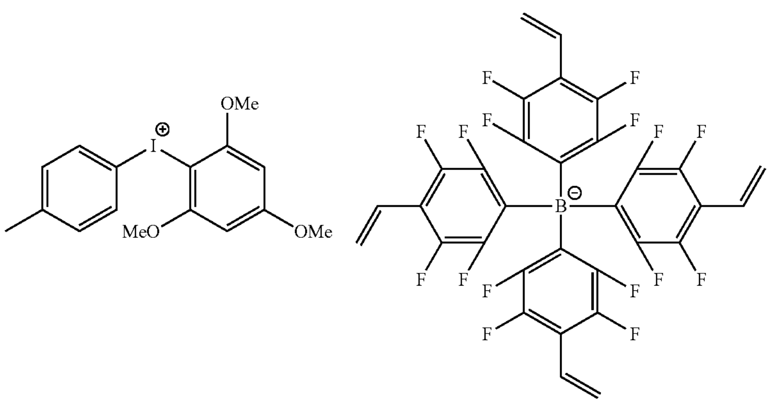
[Chemical Formula 1-1-20]
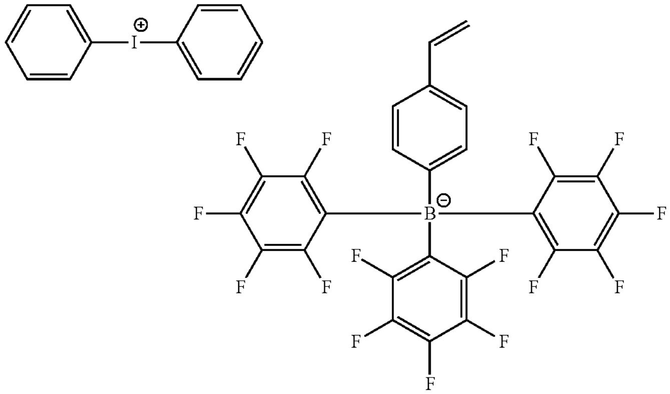

-continued
[Chemical Formula 1-1-21]
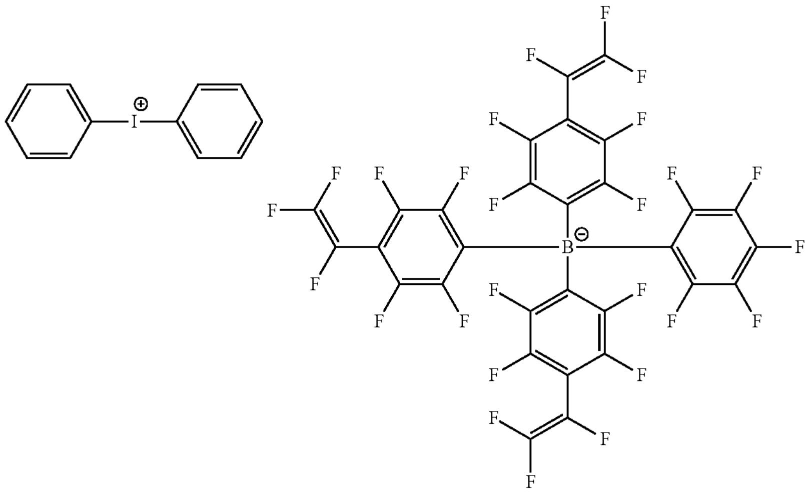
[Chemical Formula 1-1-22]
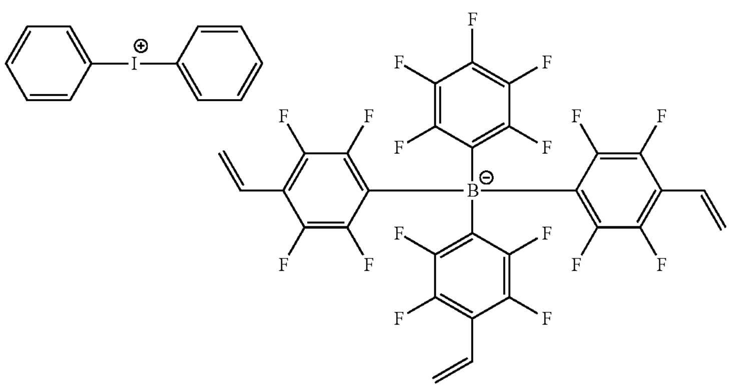
[Chemical Formula 1-1-23]
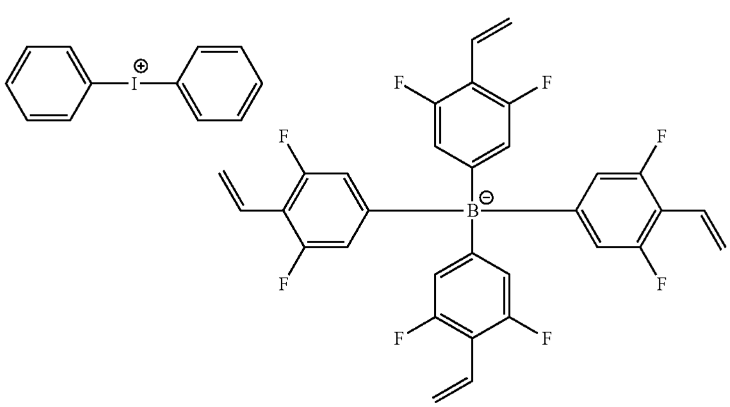

-continued
[Chemical Formula 1-1-24]
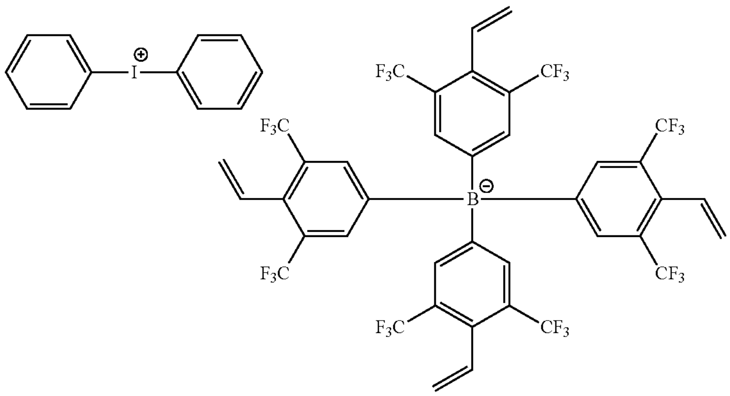
[Chemical Formula 1-1-25]
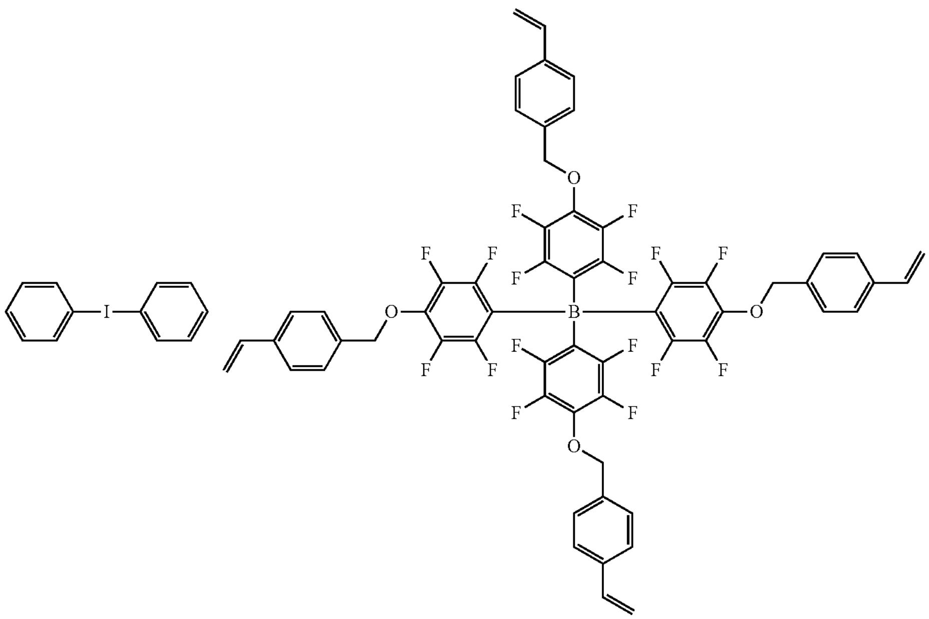
[Chemical Formula 1-1-26]
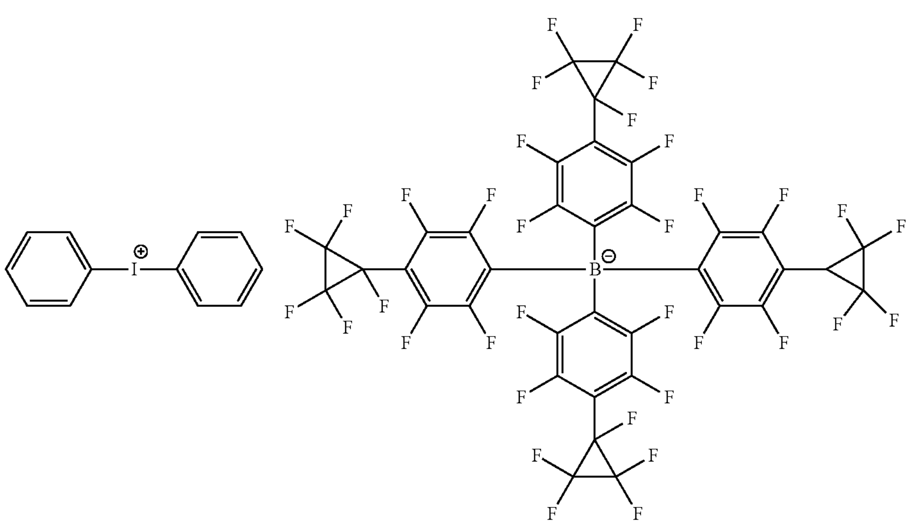

-continued
[Chemical Formula 1-1-27]
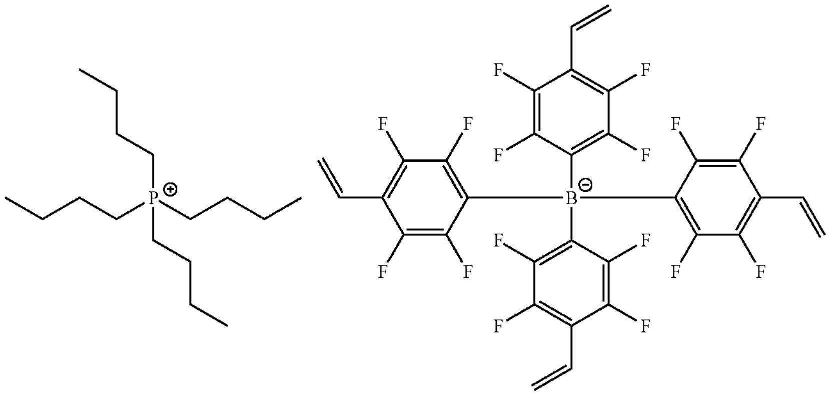
[Chemical Formula 1-1-28]
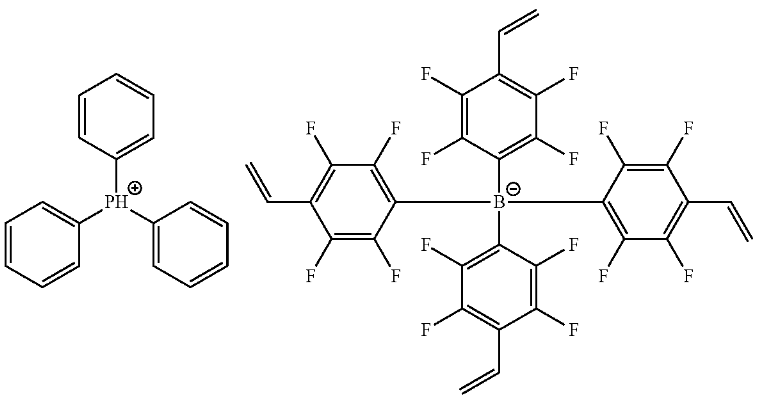
[Chemical Formula 1-1-29]
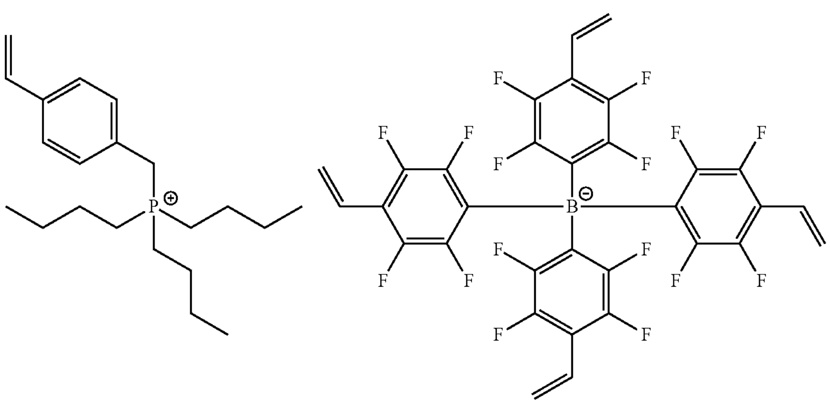
[Chemical Formula 1-1-30]
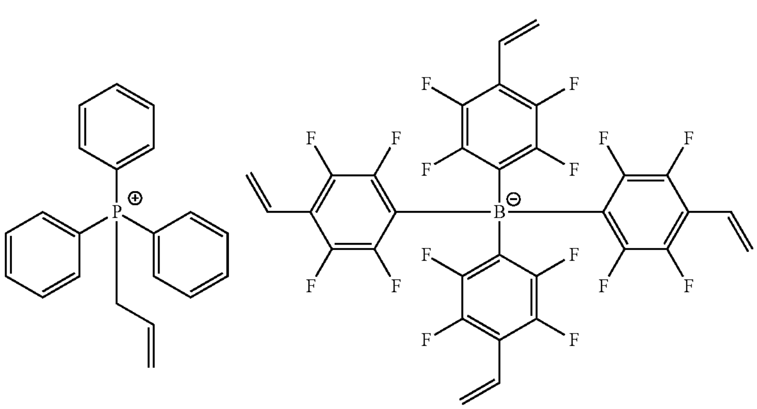

-continued
[Chemical Formula 1-1-31]
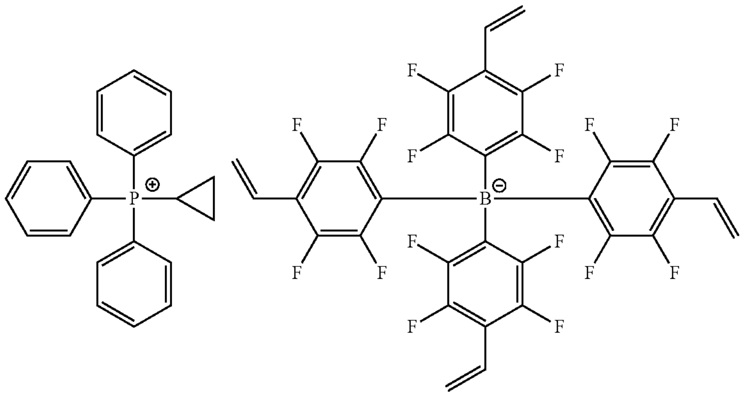
[Chemical Formula 1-1-32]
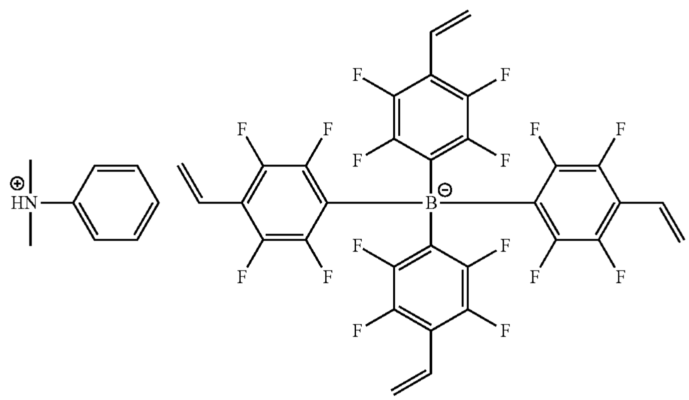
[Chemical Formula 1-1-33]
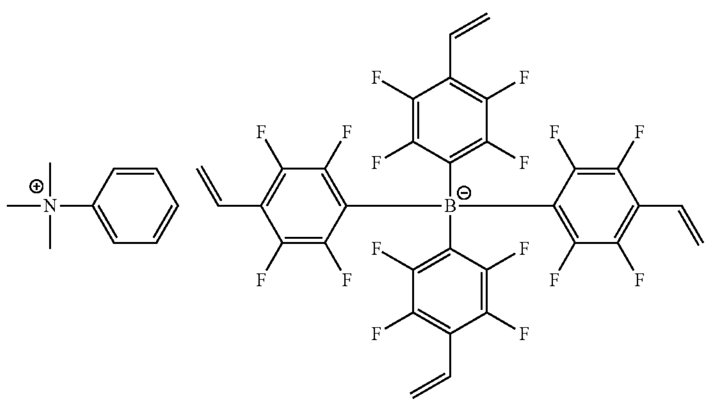
[Chemical Formula 1-1-34]
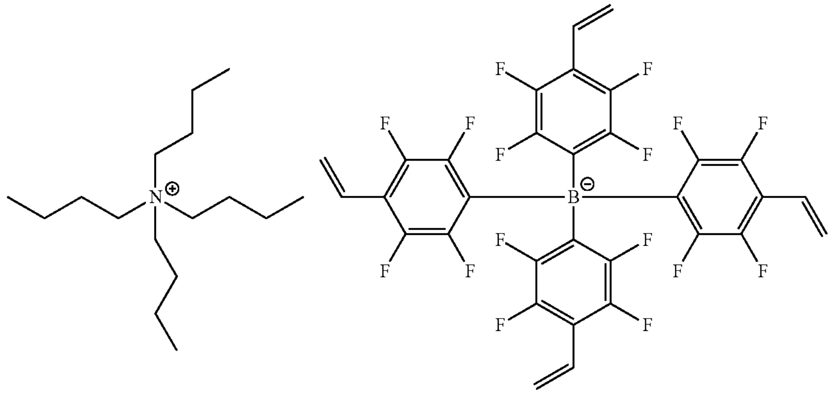

-continued
[Chemical Formula 1-1-35]
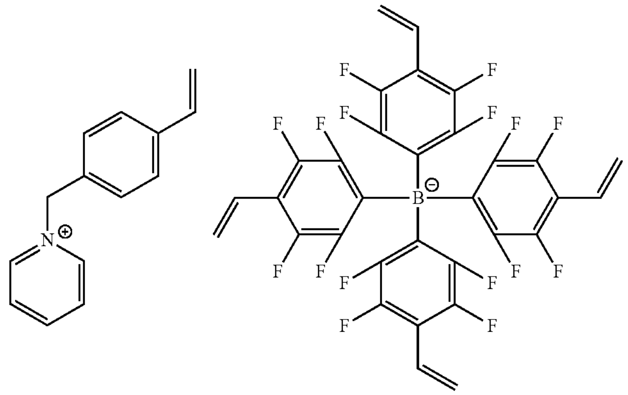
[Chemical Formula 1-1-36]
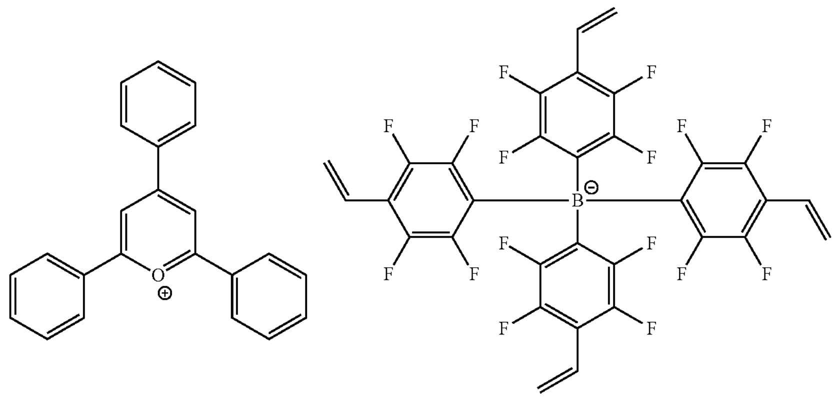
[Chemical Formula 1-1-37]
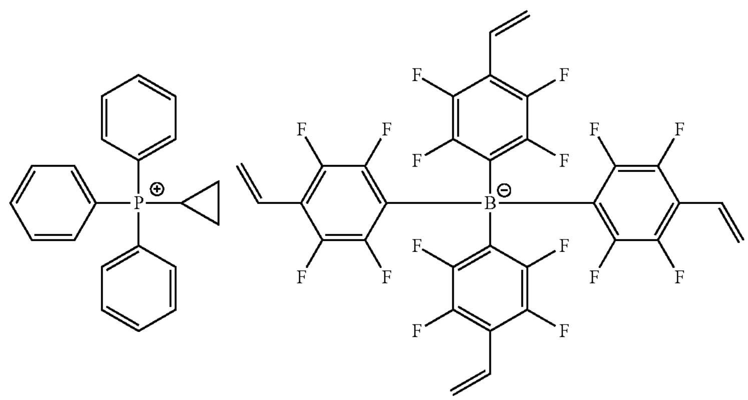
[Chemical Formula 1-1-38]
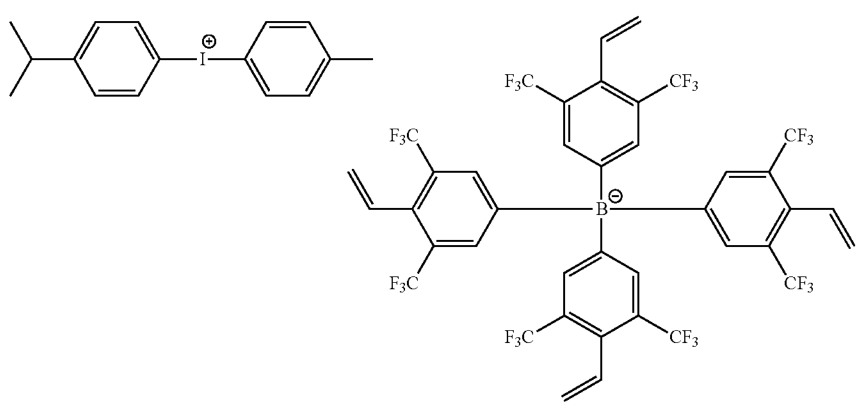

In an exemplary embodiment of the present invention, a composition including the compound of Chemical Formula 1 and an ionic compound which includes the anionic group of Chemical Formula 3 includes the ionic compound which includes the anionic group of Chemical Formula 3 in an amount of 5 parts by weight to 50 parts by weight based on 100 parts by weight of the compound of Chemical Formula 1.

Hereinafter, a copolymer of Chemical Formula 2 will be described.

According to an exemplary embodiment of the present invention, the copolymer of Chemical Formula 2 is represented as follows.

[Chemical Formula 2]

$$E\text{-}\!\left[A\right]_{a}\!\text{-}\!\left[B'\right]_{b}\!\text{-}\!\left[C'\right]_{c}\!\text{-}E$$

In Chemical Formula 2,

A is a monomer unit including at least one triarylamine group,

B' is a monomer unit having at least three binding points in a copolymer,

C' is an aromatic monomer unit or a deuterated analog thereof,

E is each independently selected from the group consisting of hydrogen; deuterium; a halogen group; a substituted or unsubstituted alkyl group; a substituted or unsubstituted silyl group; a substituted or unsubstituted germanium group; a substituted or unsubstituted aryl group; a substituted or unsubstituted arylamino group; a substituted or unsubstituted siloxane group; and a substituted or unsubstituted curable group, and a, b and c are a mole fraction, a+b+c=1, a≠0, and b≠0.

a, b, and c are the same as or different from each other.

According to another exemplary embodiment, Chemical Formula 2 may be represented by the following Chemical Formula 2'.

[Chemical Formula 2']

$$\left[ *\!\left(A\right)_{a1}\!* \quad (*)_{z1}\!\left(B'\right)_{b1} \quad *\!\left(C'\right)_{c1}\!* \quad *\!\left(E\right)_{e1} \right]$$

In Chemical Formula 2',

A is a monomer unit including at least one triarylamine group,

B' is a monomer unit having at least three binding points in a copolymer,

C' is an aromatic monomer unit or a deuterated analog thereof,

E is each independently selected from the group consisting of hydrogen; deuterium; a halogen group; a substituted or unsubstituted alkyl group; a substituted or unsubstituted aryl group; a substituted or unsubstituted arylamino group; a substituted or unsubstituted siloxane group; and a substituted or unsubstituted curable group, a1, b1, c1, and e1 are a mole fraction, a1+b1+c1+e1=1, a1≠0, and b1≠0, z1 is an integer of 3 or higher, and

* means an attachment point in the copolymer.

a1, b1, c1, and e1 are the same as or different from each other.

According to an exemplary embodiment of the present invention, all exemplary embodiments for A, B', C', and E described below for Chemical Formula 2 are applied equally to Chemical Formula 2'.

In an exemplary embodiment of the present invention, the A, B', and selective C' units are arranged in a regular alternating pattern.

In an exemplary embodiment of the present invention, the A, B', and selective C' units are arranged in blocks.

In an exemplary embodiment of the present invention, the A, B', and selective C' units are randomly arranged.

According to an exemplary embodiment of the present invention, the copolymer of Chemical Formula 2 may be deuterated. In this case, deuteration may be present on one or more monomer units A, B', and C'. In addition, deuteration may be present on a copolymer skeleton, on a pendant group (substituent), or both.

According to an exemplary embodiment of the present invention, the copolymer of Chemical Formula 2 may have a weight average molecular weight (Mw) of 10,000 g/mol to 5,000,000 g/mol, 10,000 g/mol to 2,000,000 g/mol, or 10,000 g/mol to 500,000 g/mol.

In the present invention, the term weight average molecular weight (Mw) means a molecular weight converted with respect to standard polystyrene measured using gel permeation chromatography (GPC).

In the present invention, the monomer unit A is a monomer unit including at least one triarylamine group. The monomer unit A has two binding points in the copolymer.

According to an exemplary embodiment of the present invention, A is represented by the following Chemical Formula A-1.

[Chemical Formula A-1]

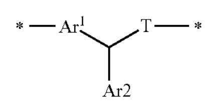

In Chemical Formula A-1,

Ar1 is a substituted or unsubstituted aryl group or a deuterated aryl group,

Ar2 is a substituted or unsubstituted aryl group or a deuterated aryl group,

T is selected from the group consisting of a direct bond; a substituted or unsubstituted aryl group; and a deuterated aryl group, and

* indicates a binding point in the copolymer.

In an exemplary embodiment of the present invention, A is represented by the following Chemical Formula A-2.

[Chemical Formula A-2]

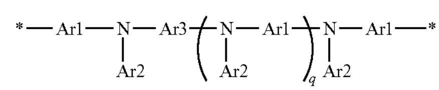

In Chemical Formula A-2,

Ar1 is each independently a substituted or unsubstituted aryl group or a deuterated aryl group, Ar2 is each independently a substituted or unsubstituted aryl group or a deuterated aryl group, Ar3 is a substituted or unsubstituted aryl group or a deuterated aryl group, q is an integer of 0 or higher, and

* indicates a binding point in the copolymer.

According to an exemplary embodiment of the present invention, Chemical Formula A-2 is represented by the following Chemical Formula A-2-1.

[Chemical Formula A-2-1]

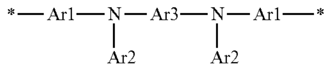

The definition of the substituent of Chemical Formula A-2-1 is the same as that in Chemical Formula A-2.

According to an exemplary embodiment of the present invention, Chemical Formula A-2 is represented by the following Chemical Formula A-2-2.

[Chemical Formula A-2-2]

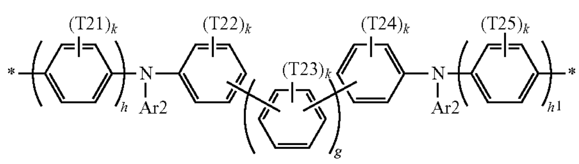

In Chemical Formula A-2-2,

Ar2 is each independently a substituted or unsubstituted aryl group or a deuterated aryl group, T21 to T25 are the same as or different from each other, and are each independently selected from the group consisting of hydrogen; deuterium; F; a cyano group; an alkyl group; a fluoroalkyl group; an aryl group; a heteroaryl group; an amino group; a silyl group; a germanium group; an alkoxy group; an aryloxy group; a fluoroalkoxy group; a siloxane group; a siloxy group; a deuterated alkyl group; a deuterated moiety-fluorinated alkyl group; a deuterated aryl group; a deuterated heteroaryl group; a deuterated amino group; a deuterated silyl group; a deuterated germanium group; a deuterated alkoxy group; a deuterated aryloxy group; a deuterated fluoroalkoxy group; a deuterated siloxane group; a deuterated siloxy group; and a curable group, where adjacent groups selected from T21 to T25 may be bonded to each other to form a 5-membered or 6-membered aromatic ring, k is each an integer from 0 to 4, g is an integer from 0 to 3, and h and h1 are each 1 or 2, and

* indicates a binding point in the copolymer.

In an exemplary embodiment of the present invention, A is represented by the following Chemical Formula A-3.

[Chemical Formula A-3]

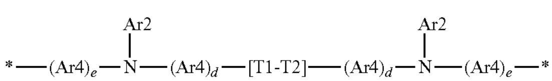

In Chemical Formula A-3,

Ar2 is each independently a substituted or unsubstituted aryl group or a deuterated aryl group, Ar4 is each independently selected from the group consisting of a substituted or unsubstituted phenylene group; a substituted or unsubstituted naphthylene group; and deuterated analogs thereof, T1 and T2 are the same as or different from each other, and are each independently a conjugated moiety linked in a non-planar configuration, or a deuterated analog thereof, d is each an integer from 1 to 6, e is each an integer from 1 to 6, and

* indicates a binding point in the copolymer.

In an exemplary embodiment of the present invention, A is represented by the following Chemical Formula A-4 or A-5.

[Chemical Formula A-4]

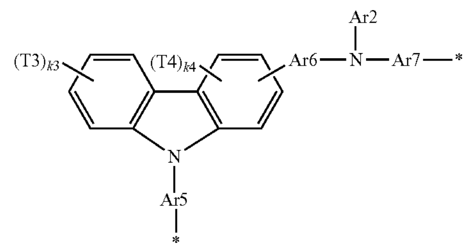

[Chemical Formula A-5]

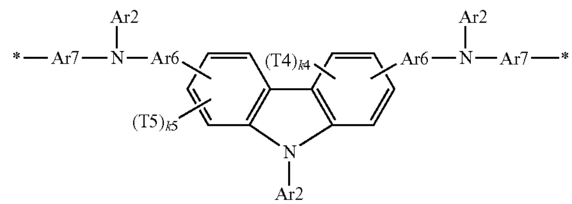

In Chemical Formulae A-4 and A-5,

Ar2 is each independently a substituted or unsubstituted aryl group or a deuterated aryl group, Ar5, Ar6, and Ar7 are the same as or different from each other, and are each independently a substituted or unsubstituted aryl group or a deuterated aryl group, T3 to T5 are the same as or different from each other, and are each independently selected from the group consisting of hydrogen; deuterium; F; a cyano group; an alkyl group; a fluoroalkyl group; an aryl group; a heteroaryl group; an amino group; a silyl group; a germanium group; an alkoxy group; an aryloxy group; a fluoroalkoxy group; a siloxane group; a siloxy group; a deuterated alkyl group; a deuterated moiety-fluorinated alkyl group; a deuterated aryl group; a deuterated heteroaryl group; a deuterated amino group; a deuterated silyl group; a deuterated germanium group; a deuterated alkoxy group; a deuterated aryloxy group; a deuterated fluoroalkoxy group; a deuterated siloxane group; a deuterated siloxy group; and a curable group, where adjacent groups selected from T3, T4, and T5 may be bonded to each other to form a ring, k3 is an integer from 0 to 4, and k4 and k5 are each an integer from 0 to 3, and

* indicates a binding point in the copolymer.

According to an exemplary embodiment of the present invention, Ar1 is selected from the group consisting of a naphthyl group, an anthracenyl group, a naphthylphenyl group, a phenylnaphthyl group, a fluorenyl group, substituted derivatives thereof, and deuterated analogs thereof.

According to an exemplary embodiment of the present invention, Ar1 is an aryl group substituted with one or more substituents selected from the group consisting of deuterium; F; a cyano group; an alkyl group; a fluoroalkyl group; an aryl group; a heteroaryl group; an amino group; a silyl group; a germanium group; an alkoxy group; an aryloxy group; a fluoroalkoxy group; a siloxane group; a siloxy group; a curable group; a deuterated alkyl group; a deuterated moiety-fluorinated alkyl group; a deuterated aryl group; a deuterated heteroaryl group; a deuterated amino group; a deuterated silyl group; a deuterated germanium group; a deuterated alkoxy group; a deuterated aryloxy group; a deuterated fluoroalkoxy group; a deuterated siloxane group; a deuterated siloxy group; and a deuterated curable group. According to another exemplary embodiment, the substituent is selected from the group consisting of deuterium, an alkyl group, an arylamino group, an aryl group, a deuterated alkyl group, a deuterated arylamino group, and a deuterated aryl group.

According to an exemplary embodiment of the present invention, Ar1 is an aryl group.

According to an exemplary embodiment of the present invention, Ar1 is selected from the group consisting of a phenyl group; a biphenyl group; a terphenyl group; a 1-naphthyl group; a 2-naphthyl group; an anthracenyl group; a fluorenyl group; deuterated analogs thereof, and derivatives thereof having one or more substituents. According to another exemplary embodiment, the one or more substituents are selected from the group consisting of a fluoro group, an alkyl group, an alkoxy group, a silyl group, a germanium group, a siloxy group, a substituent having a curable group, and deuterated analogs thereof.

According to an exemplary embodiment of the present invention, Ar1 is an aryl group having 6 to 30 carbon atoms, which is unsubstituted or substituted with an alkyl group having 1 to 20 carbon atoms or an arylamine group having 6 to 30 carbon atoms.

In another exemplary embodiment, Ar1 is a phenyl group which is unsubstituted or substituted with an alkyl group having 1 to 20 carbon atoms or an arylamine group having 6 to 30 carbon atoms; a biphenyl group which is unsubstituted or substituted with an alkyl group having 1 to 20 carbon atoms or an arylamine group having 6 to 30 carbon atoms; a terphenyl group which is unsubstituted or substituted with an alkyl group having 1 to 20 carbon atoms or an arylamine group having 6 to 30 carbon atoms; or a naphthyl group which is unsubstituted or substituted with an alkyl group having 1 to 20 carbon atoms or an arylamine group having 6 to 30 carbon atoms.

The description on the exemplary embodiments of Ar1 is applied equally to Ar3, Ar5, Ar6, and Ar7.

According to an exemplary embodiment of the present invention, Ar2 is selected from the group consisting of a naphthyl group, an anthracenyl group, a naphthylphenyl group, a phenylnaphthyl group, a fluorenyl group, substituted derivatives thereof, and deuterated analogs thereof.

According to an exemplary embodiment of the present invention, Ar2 is an aryl group.

According to an exemplary embodiment of the present invention, Ar2 is selected from the group consisting of a phenyl group; a biphenyl group; a terphenyl group; a 1-naphthyl group; a 2-naphthyl group; an anthracenyl group; a fluorenyl group; deuterated analogs thereof, and derivatives thereof having one or more substituents.

According to another exemplary embodiment, the one or more substituents are selected from the group consisting of a fluoro group, an alkyl group, an alkoxy group, a silyl group, a germanium group, a siloxy group, a substituent having a curable group, and deuterated analogs thereof.

According to an exemplary embodiment of the present invention, Ar2 is an aryl group having 6 to 30 carbon atoms, which is unsubstituted or substituted with an alkyl group having 1 to 20 carbon atoms or an arylamine group having 6 to 30 carbon atoms.

In another exemplary embodiment, Ar2 is a phenyl group which is unsubstituted or substituted with an alkyl group having 1 to 20 carbon atoms or an arylamine group having 6 to 30 carbon atoms; a biphenyl group which is unsubstituted or substituted with an alkyl group having 1 to 20 carbon atoms or an arylamine group having 6 to 30 carbon atoms; a terphenyl group which is unsubstituted or substituted with an alkyl group having 1 to 20 carbon atoms or an arylamine group having 6 to 30 carbon atoms; or a naphthyl group which is unsubstituted or substituted with an alkyl group having 1 to 20 carbon atoms or an arylamine group having 6 to 30 carbon atoms.

According to an exemplary embodiment of the present invention, T is a direct bond; or an aryl group having 6 to 30 carbon atoms.

According to an exemplary embodiment of the present invention, T3 to T5 are the same as or different from each other, and are each independently hydrogen or deuterium.

According to an exemplary embodiment of the present invention, when d is 2 or higher, each Ar4 in $(Ar4)_d$ is the same as or different from each other.

According to an exemplary embodiment of the present invention, d is 1 or 2.

According to an exemplary embodiment of the present invention, when e is 2 or higher, each Ar4 in $(Ar4)_e$ is the same as or different from each other.

According to an exemplary embodiment of the present invention, e is 1 or 2.

According to an exemplary embodiment of the present invention, when k3 to k5 are each 2 or higher, each T3 to T5 is the same as or different from each other, respectively.

According to an exemplary embodiment of the present invention, when q is 2 or higher, each NAr1Ar2 is the same as or different from each other.

According to an exemplary embodiment of the present invention, q is an integer from 0 to 2.

According to another exemplary embodiment, q is 0 or 1.

According to an exemplary embodiment of the present invention, T21 to T25 are the same as or different from each other, and are each independently hydrogen; deuterium; a $C_{1-10}$ alkyl group; or a deuterated $C_{1-10}$ alkyl group.

According to another exemplary embodiment, T21 to T25 are the same as or different from each other, and are each independently a $C_{1-10}$ silyl group; or a deuterated $C_{1-10}$ silyl group.

In another exemplary embodiment, T21 to T25 are the same as or different from each other, and are each independently a $C_{6-20}$ aryl group; a deuterated $C_{6-20}$ aryl group; or a $C_{3-20}$ heteroaryl group.

In still another exemplary embodiment, T21 to T25 are the same as or different from each other, and are each independently an amino group; or a deuterated amino group.

According to an exemplary embodiment of the present invention, when k, g, h, and h1 are 2 or 2 or higher, each structure in the unit is the same as or different from each other, respectively.

According to an exemplary embodiment of the present invention, k is an integer from 0 to 2.

According to an exemplary embodiment of the present invention, g is an integer from 0 to 2.

In an exemplary embodiment of the present invention, g is 1.

According to an exemplary embodiment of the present invention, T1 and T2 are the same as or different from each other, and are each independently a substituted or unsubstituted aryl group having 6 to 30 carbon atoms.

According to another exemplary embodiment, T1 and T2 are the same as or different from each other, and are each independently an aryl group having 6 to 30 carbon atoms, which is unsubstituted or substituted with an alkyl group having 1 to 20 carbon atoms.

According to still another exemplary embodiment, T1 and T2 are the same as or different from each other, and are each independently a naphthyl group which is unsubstituted or substituted with an alkyl group having 1 to 20 carbon atoms.

According to an exemplary embodiment of the present invention, the monomer unit A may be any one of the following structures.

A1

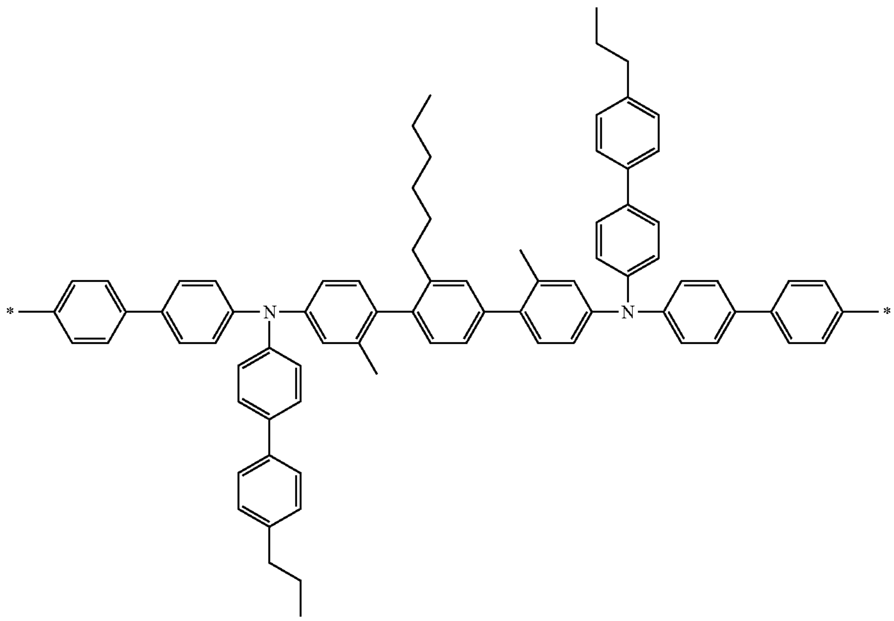

A2

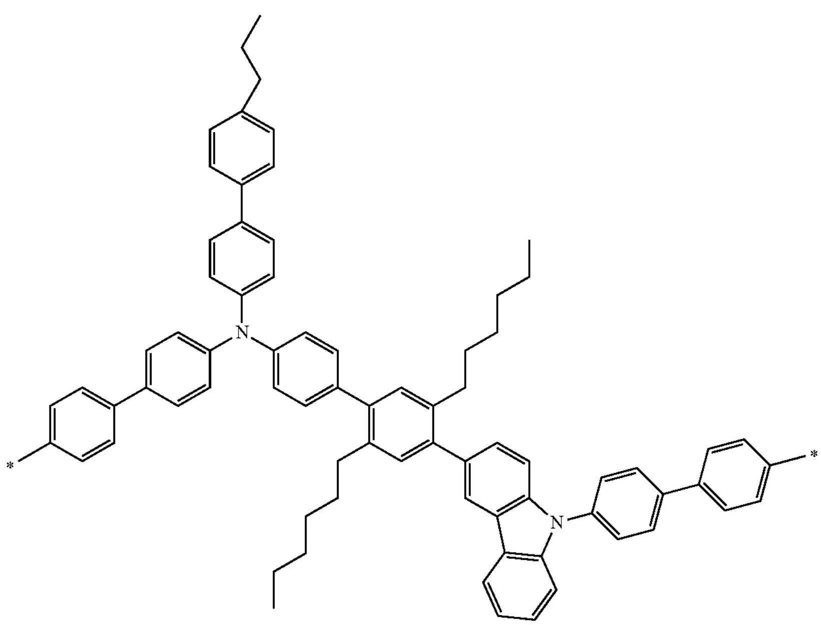

-continued
A3
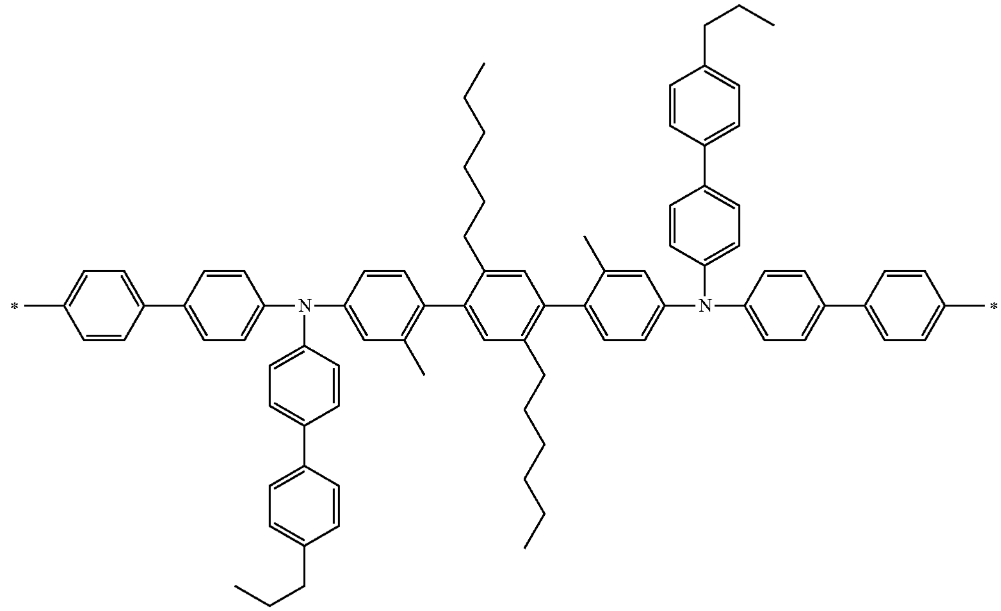
A4
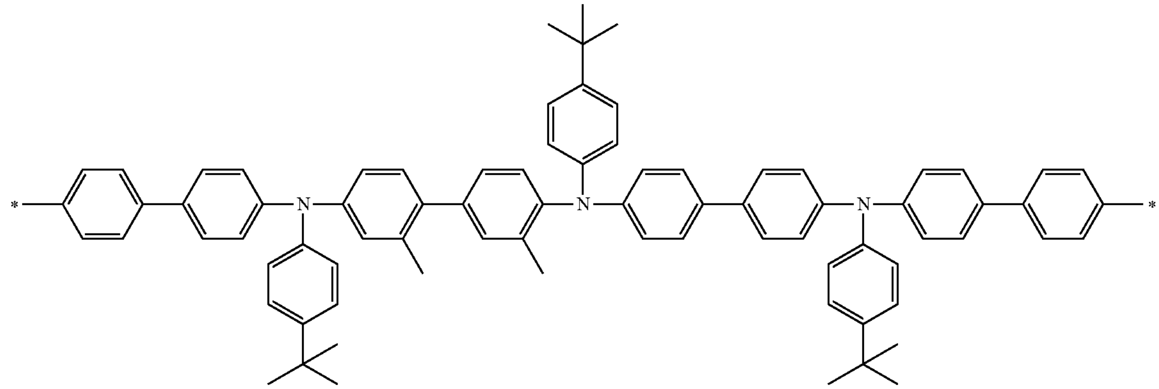
A5
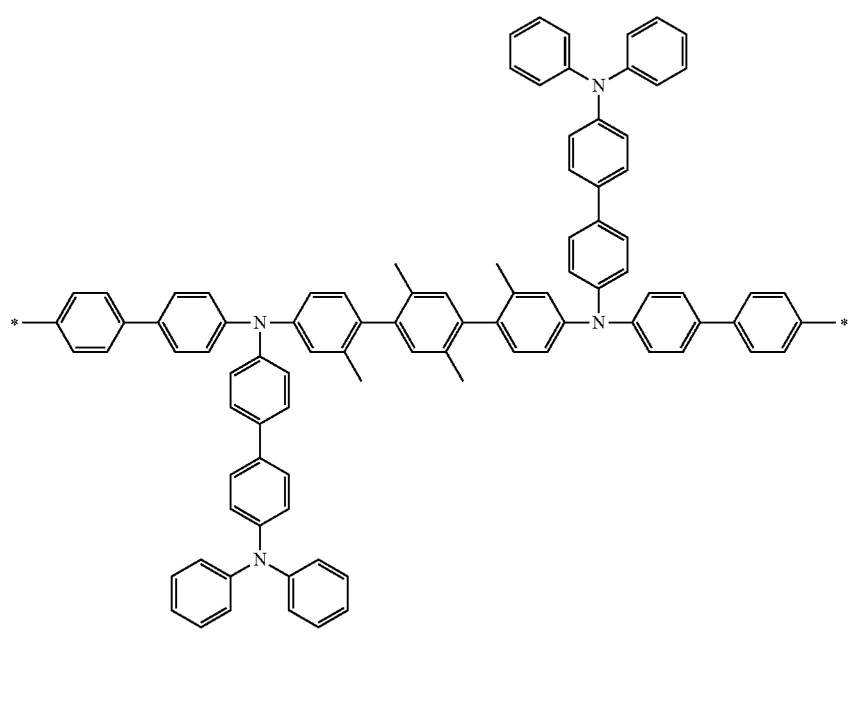

-continued

A6

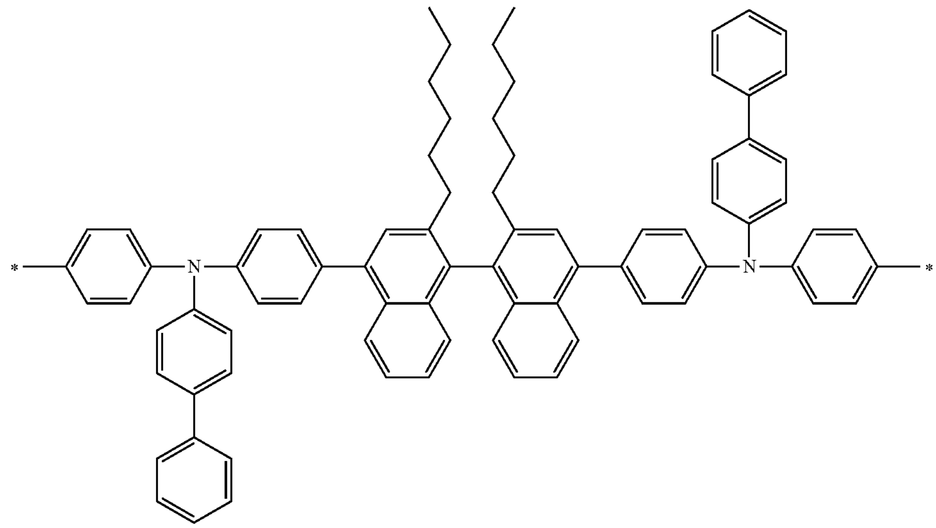

A7

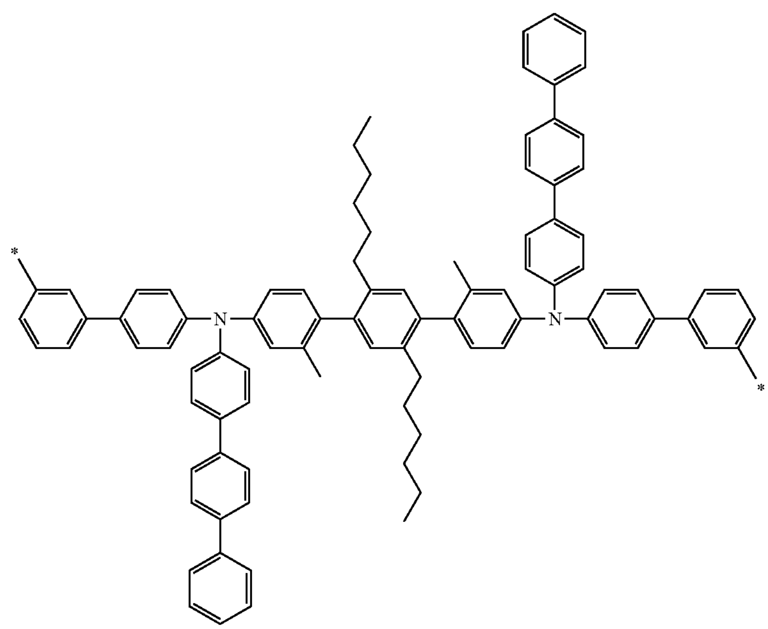

In an exemplary embodiment of the present invention, a monomer unit B' is a polyfunctional monomer unit having at least three binding points in the copolymer.

According to another exemplary embodiment, the monomer unit B' has 3 to 6 binding points.

In another exemplary embodiment, the monomer unit B' has three binding points.

In still another exemplary embodiment, the monomer unit B' has four binding points.

In yet another exemplary embodiment, the monomer unit B' has five binding points.

In yet another exemplary embodiment, the monomer unit B' has six binding points.

According to an exemplary embodiment of the present invention, the monomer unit B' is represented by the following Chemical Formula B'-A.

Cy1-(Cy2-*)*s* [Chemical Formula B'-A]

In Chemical Formula B'-A,

Cy1 is selected from the group consisting of C, Si, Ge, N, an aliphatic cyclic group, an aromatic cyclic group, a deuterated aliphatic cyclic group, and a deuterated aromatic cyclic group, each of which has at least three binding positions, Cy2 is each independently a direct bond; an alkyl group; an aryl group; a deuterated alkyl group; or a deuterated aryl group, provided that when Cy2 is a direct bond, an alkyl group, or a deuterated alkyl group, Cy1 is an aromatic cyclic group or a deuterated aromatic cyclic group, s is an integer from 3 to the maximum number of available binding positions of Cy1, and

* indicates a binding point in the copolymer.

According to an exemplary embodiment of the present invention, Cy1 is C, Si, N, an aliphatic cyclic group having 3 to 30 carbon atoms, or an aromatic cyclic group having 6 to 30 carbon atoms.

According to an exemplary embodiment of the present invention, s is an integer from 3 to 5, and each Cy2 is the same as or different from each other.

In yet another exemplary embodiment, s is 3 or 4.

According to an exemplary embodiment of the present invention, each Cy2 is the same as or different from each other, and each independently a direct bond; or an aryl group having 6 to 30 carbon atoms.

In yet another exemplary embodiment, each Cy2 is the same as or different from each other, and each independently a direct bond; a phenyl group; or a biphenyl group.

In an exemplary embodiment of the present invention, the monomer unit B' is represented by any one of the following Chemical Formulae B'-1 to B'-9.

[Chemical Formula B'-1]

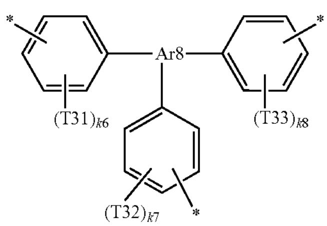

[Chemical Formula B'-2]

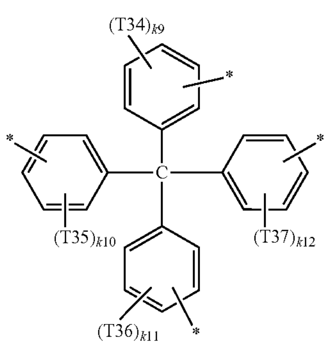

[Chemical Formula B'-3]

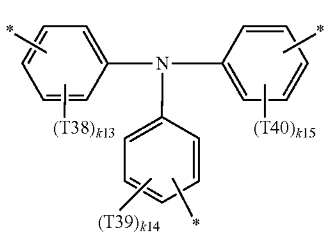

-continued

[Chemical Formula B'-4]

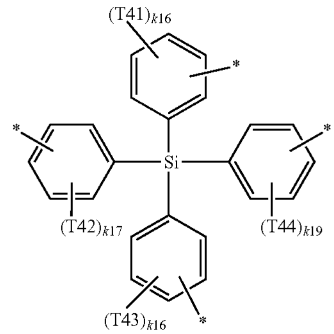

[Chemical Formula B'-5]

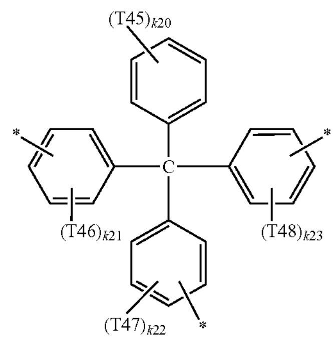

[Chemical Formula B'-6]

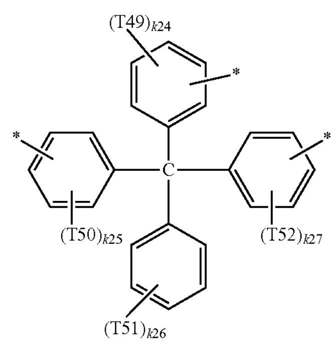

[Chemical Formula B'-7]

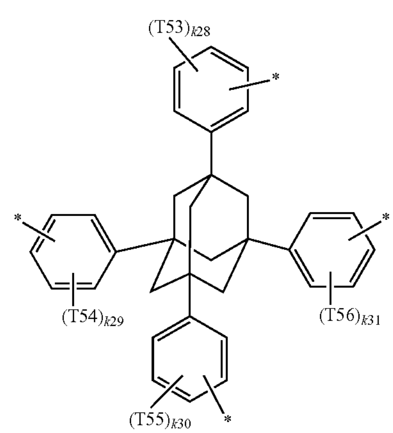

-continued

[Chemical Formula B′-8]

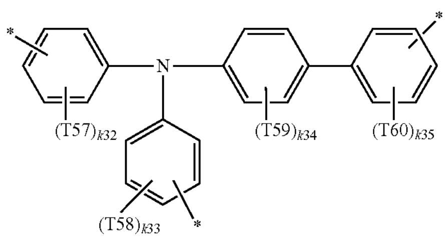

[Chemical Formula B′-9]

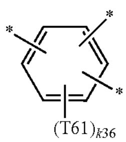

In Chemical Formulae B'-1 to B'-9,

Ar8 is an aromatic cyclic group or deuterated aromatic cyclic group having at least three binding points, T31 to T61 are the same as or different from each other, and are each independently selected from the group consisting of hydrogen, deuterium; F; a cyano group; an alkyl group; a fluoroalkyl group; an aryl group; a heteroaryl group; an amino group; a silyl group; a germanium group; an alkoxy group; an aryloxy group; a fluoroalkoxy group; a siloxane group; a siloxy group; a deuterated alkyl group; a deuterated moiety-fluorinated alkyl group; a deuterated aryl group; a deuterated heteroaryl group; a deuterated amino group; a deuterated silyl group; a deuterated germanium group; a deuterated alkoxy group; a deuterated aryloxy group; a deuterated fluoroalkoxy group; a deuterated siloxane group; a deuterated siloxy group; and a curable group, where adjacent groups selected from T31 to T61 may be bonded to each other to form a 5-membered or 6-membered aromatic ring, k6 to k19, k21 to k25, and k27 to k35 are the same as or different from each other, and are each independently an integer from 0 to 4, k20 and k26 are the same as or different from each other, and are each interpedently an integer from 0 to 5, and k36 is an integer from 0 to 3, and

* indicates a binding point in the copolymer.

According to an exemplary embodiment of the present invention, when k6 to k36 are each 2 or higher, each T31 to T61 is the same as or different from each other, respectively.

According to an exemplary embodiment of the present invention, Ar8 is a benzene having at least three binding points.

According to an exemplary embodiment of the present invention, T31 to T61 are each hydrogen or deuterium.

According to an exemplary embodiment of the present invention, the monomer unit B' may be any one of the following structures.

B1

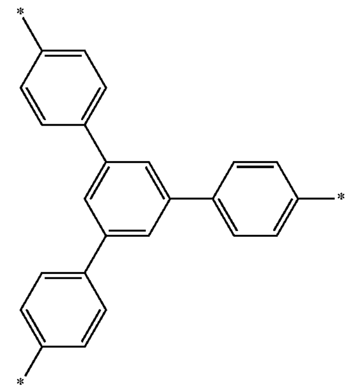

B2

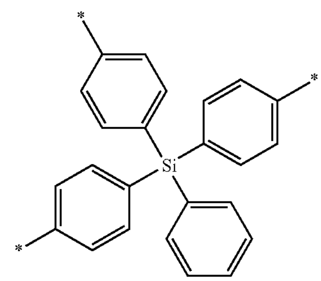

B3

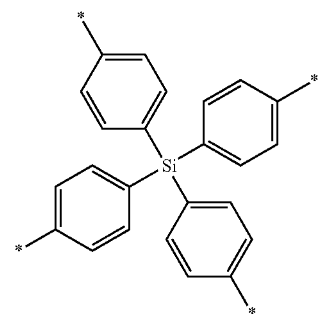

B4

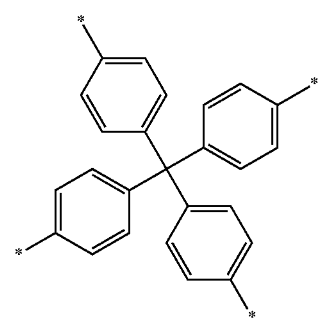

B5

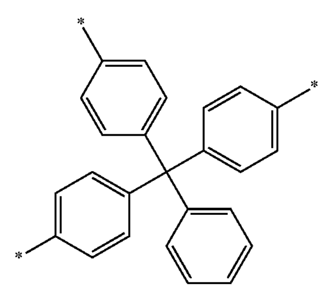

-continued

B6

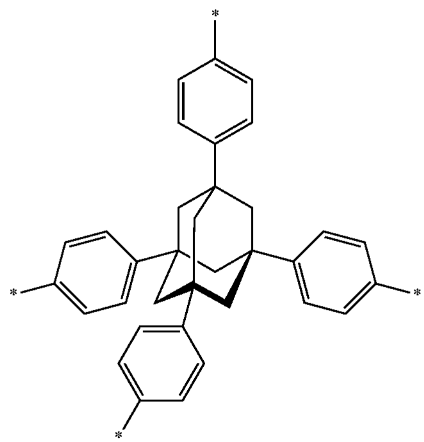

B7

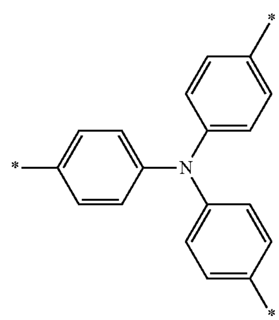

B8

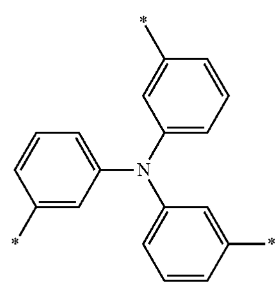

B9

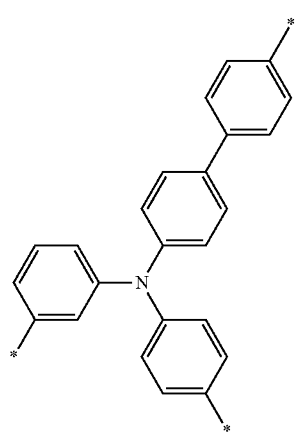

B10

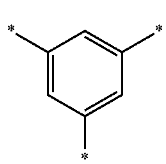

-continued

B11

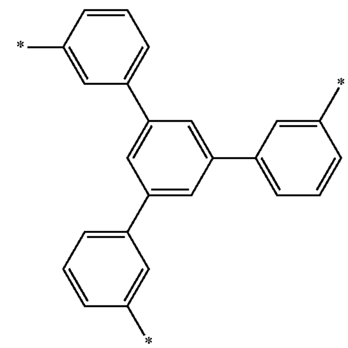

According to an exemplary embodiment of the present invention, the monomer unit C' is an aromatic monomer unit or a deuterated analog thereof.

In an exemplary embodiment of the present invention, the monomer unit C' is a difunctional monomer unit having two binding points.

According to an exemplary embodiment of the present invention, the monomer unit C' includes a curable group or a deuterated curable group.

In an exemplary embodiment of the present invention, the monomer unit C' may be one of the following chemical formulae.

M1

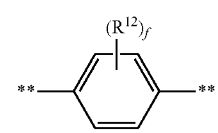

M2

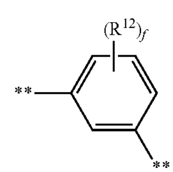

M3

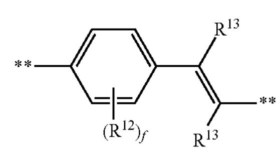

M4

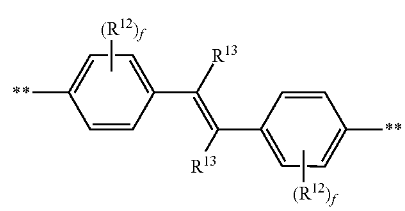

M5

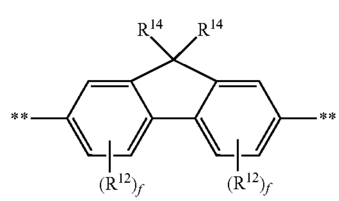

-continued
M6
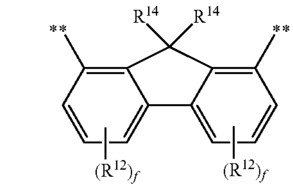
M7
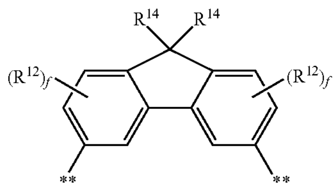
M8
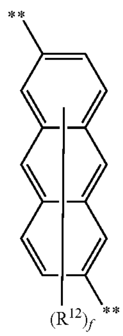
M9
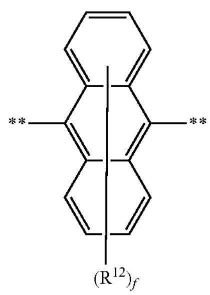
M10
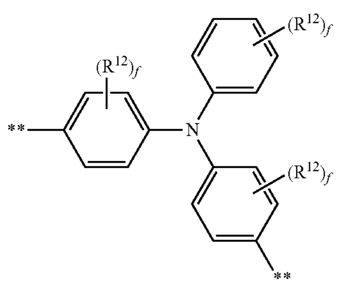
M11
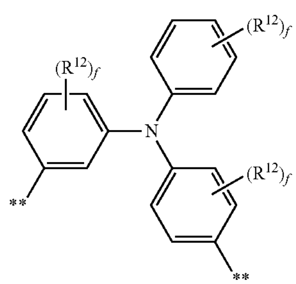
-continued
M12
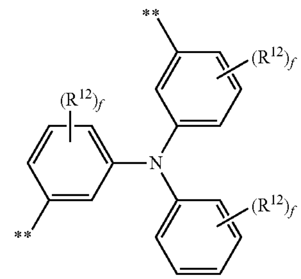
M13
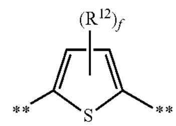
M14
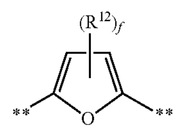
M15
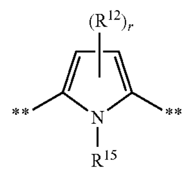
M16
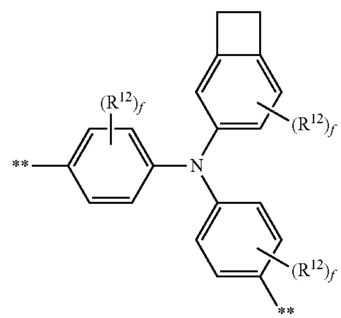
M17
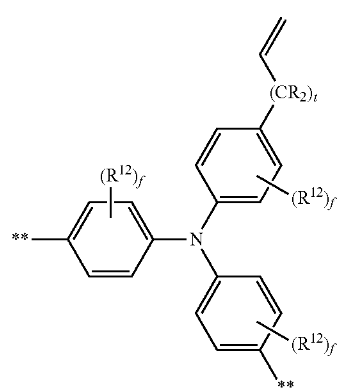

-continued

M18

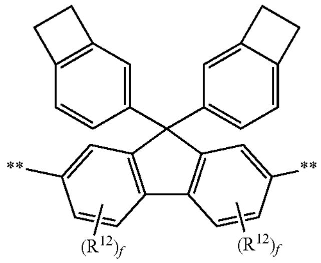

M19

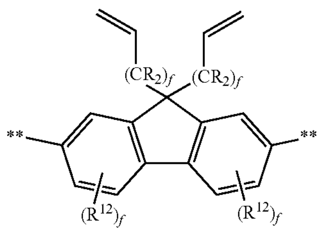

M20

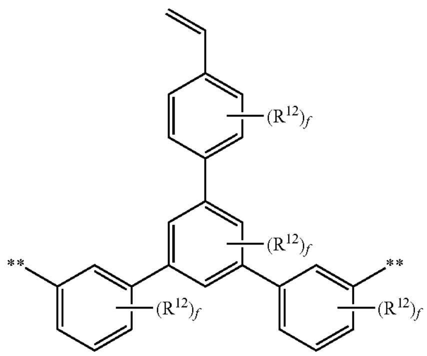

In Chemical Formulae M1 to M20, $R^{12}$ is each independently selected from the group consisting of hydrogen; deuterium; an alkyl group; a silyl group; a germanium group; an aryl group; a deuterated alkyl group; a deuterated silyl group; a deuterated germanium group; and a deuterated aryl group, $R^{13}$ is each independently selected from the group consisting of hydrogen; deuterium; an alkyl group; and a deuterated alkyl group, $R^{14}$ is each independently selected from the group consisting of an alkyl group; an aryl group; and deuterated analogs thereof, $R^{15}$ is selected from the group consisting of an aryl group and a deuterated aryl group, R is each independently hydrogen; deuterium; or an alkyl group, f is each independently an integer from 0 to the maximum number of available binding positions of the substituent, t is each independently an integer from 0 to 20, and

** means a binding point.

In an exemplary embodiment of the present invention, when f and t are each 2 or higher, each $R^{12}$ and R is the same as or different from each other, respectively.

According to an exemplary embodiment of the present invention, f is each independently an integer from 0 to 2.

In an exemplary embodiment of the present invention, t is each independently an integer from 1 to 3.

In an exemplary embodiment of the present invention, each $R^{12}$ is the same as or different from each other, and each independently deuterium; an alkyl group having 1 to 20 carbon atoms; or an aryl group having 6 to 30 carbon atoms.

In an exemplary embodiment of the present invention, each $R^{13}$ is the same as or different from each other, and each independently hydrogen; deuterium; an alkyl group having 1 to 20 carbon atoms; or a deuterated alkyl group having 1 to 20 carbon atoms.

In an exemplary embodiment of the present invention, $R^{15}$ is an alkyl group having 6 to 30 carbon atoms; or a deuterated aryl group having 6 to 30 carbon atoms.

In an exemplary embodiment of the present invention, each $R^{14}$ is the same as or different from each other, and each independently an alkyl group having 1 to 20 carbon atoms; or an aryl group having 6 to 30 carbon atoms.

According to an exemplary embodiment of the present invention, each R is the same as or different from each other, and each independently hydrogen; deuterium; or an alkyl group having 1 to 20 carbon atoms.

According to an exemplary embodiment of the present invention, the monomer unit C' may be selected from the following structures.

C1

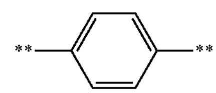

C2

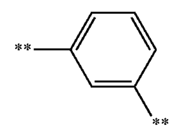

C3

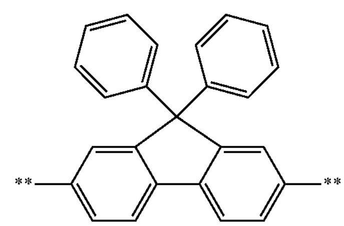

C4

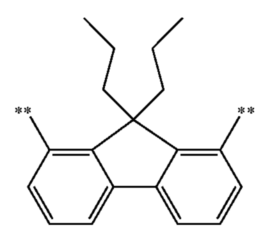

C5

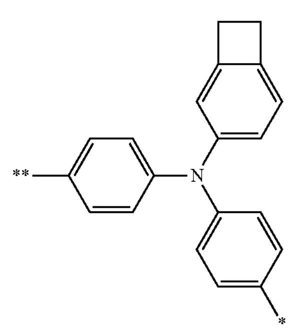

-continued

C6

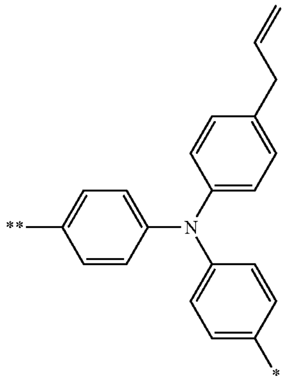

C7

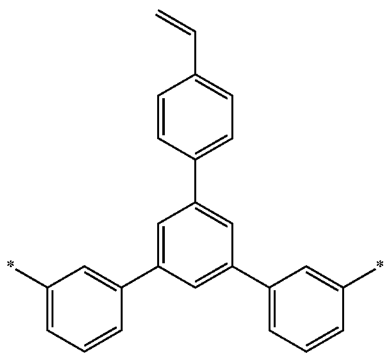

According to an exemplary embodiment of the present invention, the unit E is each independently an end-capping unit for a copolymer.

In an exemplary embodiment of the present invention, the unit E is each independently a monofunctional unit having one binding point.

According to an exemplary embodiment of the present invention, the unit E is each independently hydrogen or deuterium.

According to an exemplary embodiment of the present invention, the unit E is each independently a monofunctional monomer unit.

According to an exemplary embodiment of the present invention, the unit E is each independently a curable group or a deuterated curable group.

According to an exemplary embodiment of the present invention, the unit E is each independently an aryl group or a deuterated aryl group.

According to an exemplary embodiment of the present invention, the unit E is each independently selected from an aryl group; an arylamino group; a curable group; and deuterated analogs thereof.

According to an exemplary embodiment of the present invention, the unit E is each independently selected from the group consisting of a phenyl group; a biphenyl group; a diphenylamino group; substituted derivatives thereof and deuterated analogs thereof. In this case, the substituent is a $C_{1-10}$ alkyl group, a curable group, or deuterated analogs thereof.

According to an exemplary embodiment of the present invention, the unit E may be each independently any one of the following structures.

E1

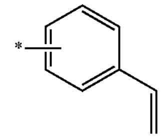

E2

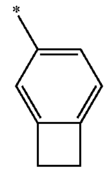

E3

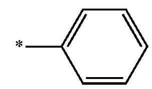

E4

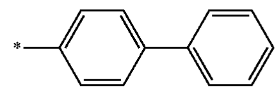

E5

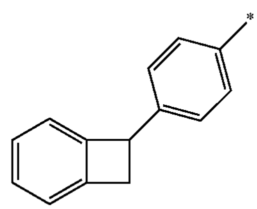

E6

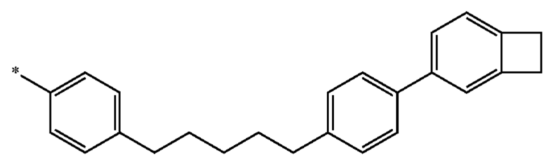

E7

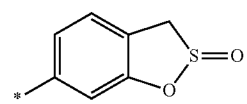

E8

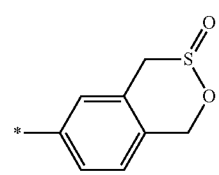

E9

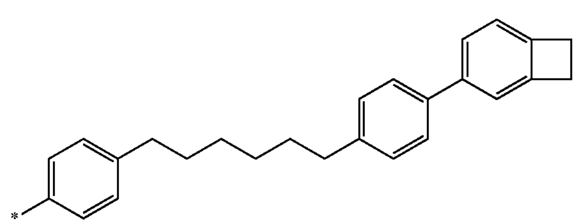

E10

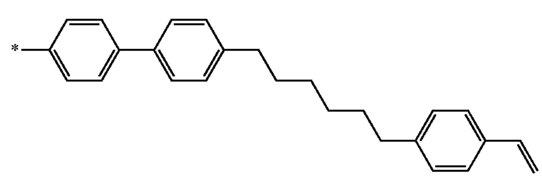

-continued

E11

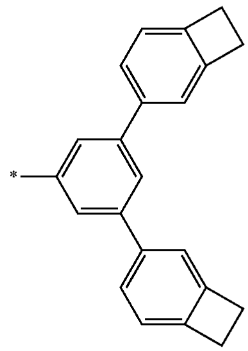

E12

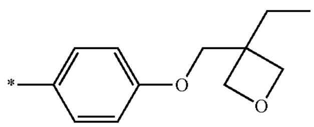

E13

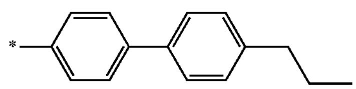

E14

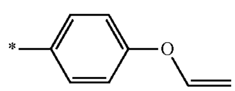

In this case, * indicates a binding point in the copolymer.

According to an exemplary embodiment of the present invention, a of Chemical Formula 2 is 0.50 or higher.

According to an exemplary embodiment of the present invention, a of Chemical Formula 2 is 0.50 to 0.99.

According to an exemplary embodiment of the present invention, a of Chemical Formula 2 is 0.60 to 0.90.

According to an exemplary embodiment of the present invention, a of Chemical Formula 2 is 0.65 to 0.80.

According to an exemplary embodiment of the present invention, b of Chemical Formula 2 is 0.05 or higher, and according to some exemplary embodiments, b is 0.10 or higher.

According to an exemplary embodiment of the present invention, b of Chemical Formula 2 is 0.01 to 0.50.

According to an exemplary embodiment of the present invention, b of Chemical Formula 2 is 0.05 to 0.45.

According to an exemplary embodiment of the present invention, b of Chemical Formula 2 is 0.10 to 0.40.

According to an exemplary embodiment of the present invention, b of Chemical Formula 2 is 0.20 to 0.35.

According to an exemplary embodiment of the present invention, c of Chemical Formula 2 is 0.

According to an exemplary embodiment of the present invention, c of Chemical Formula 2 is 0 to 0.20.

According to an exemplary embodiment of the present invention, c of Chemical Formula 2 is 0.01 to 0.20.

According to an exemplary embodiment of the present invention, c of Chemical Formula 2 is 0.05 to 0.15.

In an exemplary embodiment of the present invention, a mole ratio of A+B' to E is in a range of 40:60 to 98:2; or 50:50 to 90:10 or 60:40 to 80:20.

According to an exemplary embodiment of the present invention, in Chemical Formula 2', a1 is 0.30 to 0.90.

According to an exemplary embodiment of the present invention, in Chemical Formula 2', a1 is 0.40 to 0.80.

According to an exemplary embodiment of the present invention, in Chemical Formula 2', a1 is 0.50 to 0.80.

According to an exemplary embodiment of the present invention, in Chemical Formula 2', b1 is 0.05 to 0.40.

According to an exemplary embodiment of the present invention, in Chemical Formula 2', b1 is 0.10 to 0.30.

According to an exemplary embodiment of the present invention, in Chemical Formula 2', b1 is 0.10 to 0.20.

According to an exemplary embodiment of the present invention, in Chemical Formula 2', c1 is 0.

According to an exemplary embodiment of the present invention, in Chemical Formula 2', c1 is 0 to 0.15.

According to an exemplary embodiment of the present invention, in Chemical Formula 2', c1 is 0.01 to 0.15.

According to an exemplary embodiment of the present invention, in Chemical Formula 2', c1 is 0.05 to 0.12.

According to an exemplary embodiment of the present invention, in Chemical Formula 2', c1 is 0.05 to 0.60.

According to an exemplary embodiment of the present invention, in Chemical Formula 2', c1 is 0.10 to 0.50.

According to an exemplary embodiment of the present invention, in Chemical Formula 2', c1 is 0.15 to 0.35.

According to an exemplary embodiment of the present invention, in Chemical Formula 2', e1 is 0.05 to 0.60.

According to an exemplary embodiment of the present invention, in Chemical Formula 2', e1 is 0.10 to 0.50.

According to an exemplary embodiment of the present invention, in Chemical Formula 2', e1 is 0.15 to 0.35.

According to an exemplary embodiment of the present invention, an example of the copolymer of Chemical Formula 2 is shown below using the form of Chemical Formula 2'.

[Copolymer Type 1]
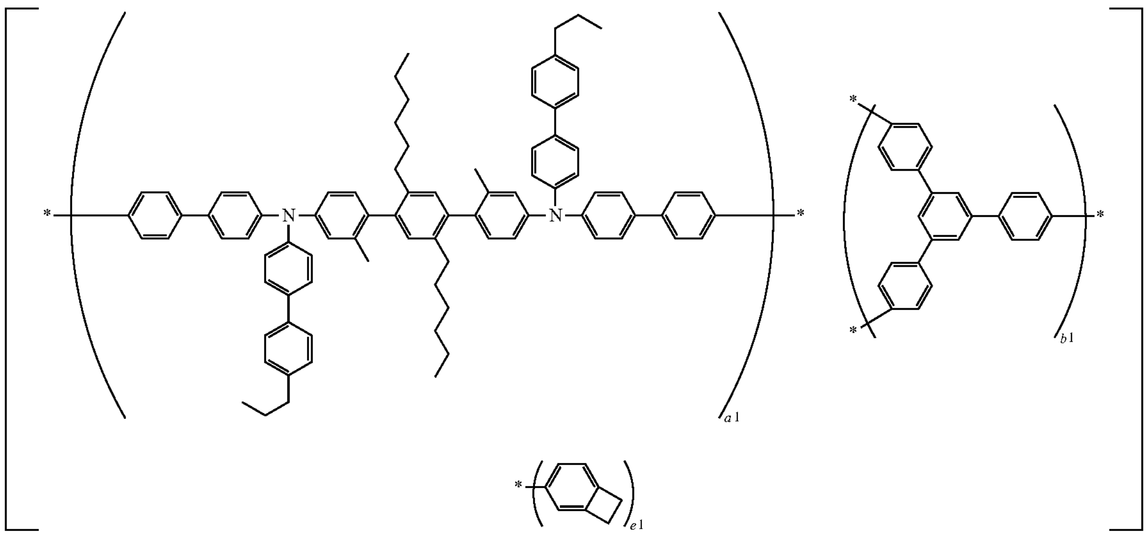
In Copolymer Type 1, c1 is 0 and the monomer unit C' is not present. The end-capping unit E is a curable group.
[Copolymer Type 2]
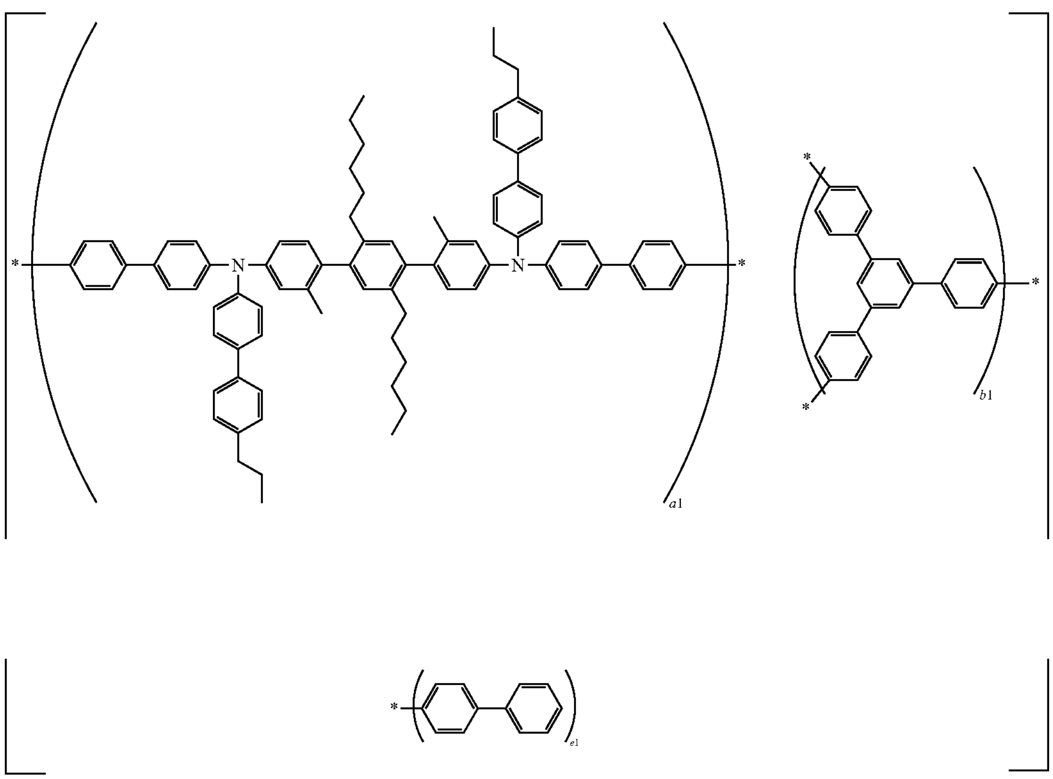
In Copolymer Type 2, c1 is 0 and the monomer unit C' is not present. The end-capping unit E is an aryl group.

[Copolymer Type 3]
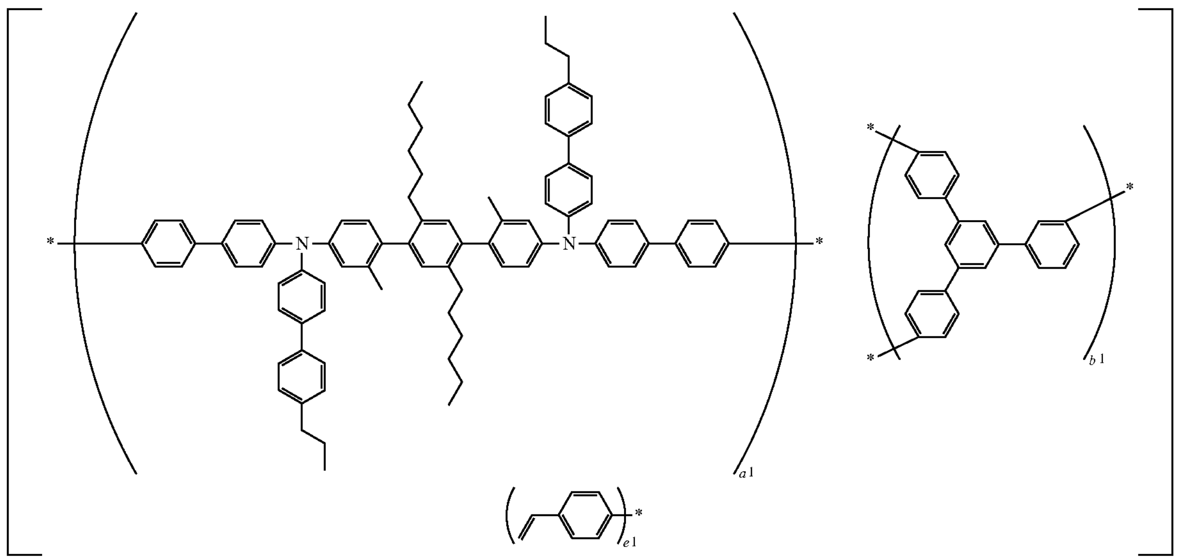
In Copolymer Type 3, c1 is 0 and a monomer unit C' is not present. The end-capping unit E is a curable group.
[Copolymer Type 4]
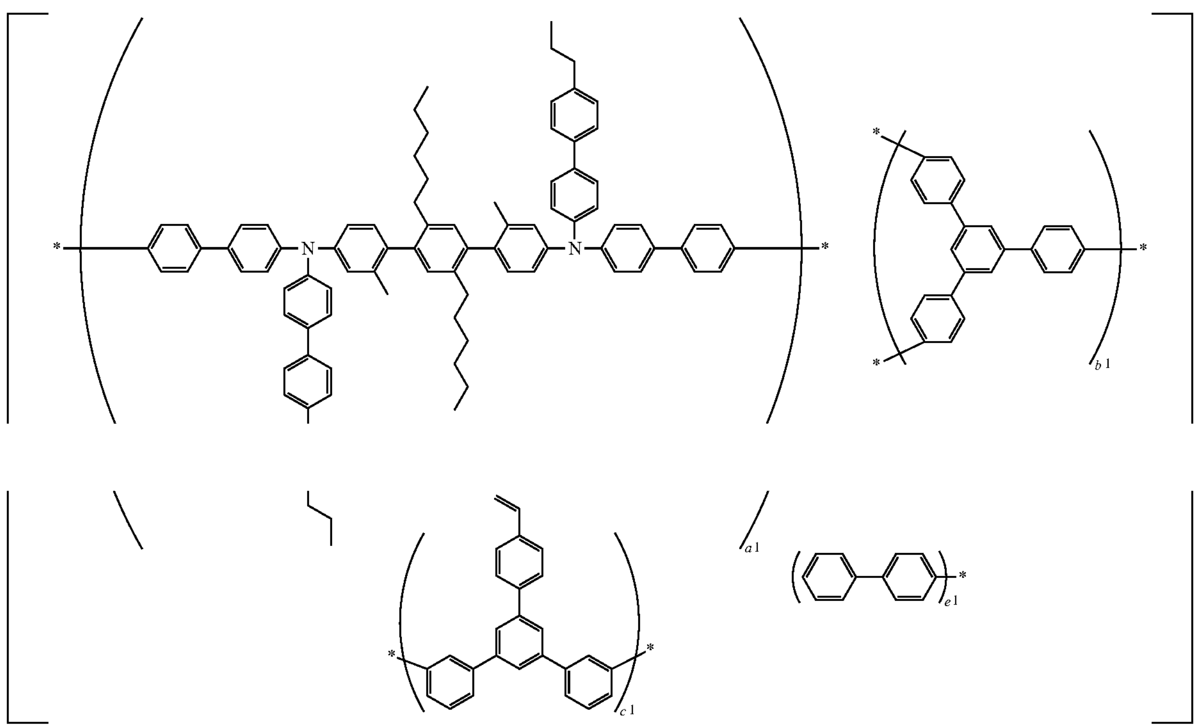
In Copolymer Type 4, the monomer unit C' is present and includes a curable group. The end-capping unit E is an aryl group.

[Copolymer Type 5]
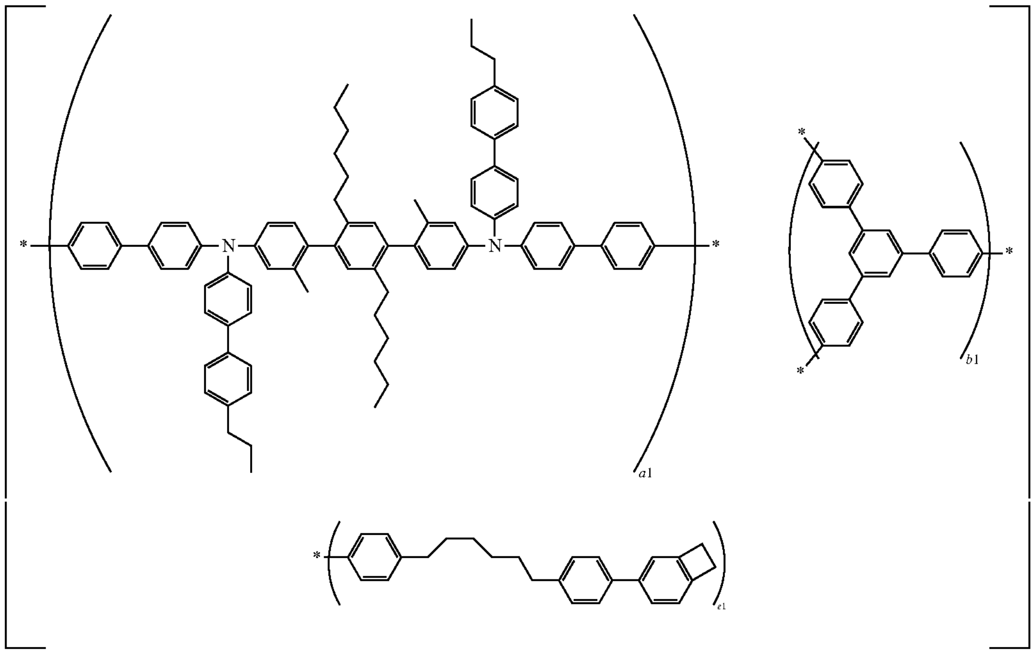
In Copolymer Type 5, c1 is 0 and the monomer unit C' is not present. The end-capping unit E is a curable group.
[Copolymer Type 6]
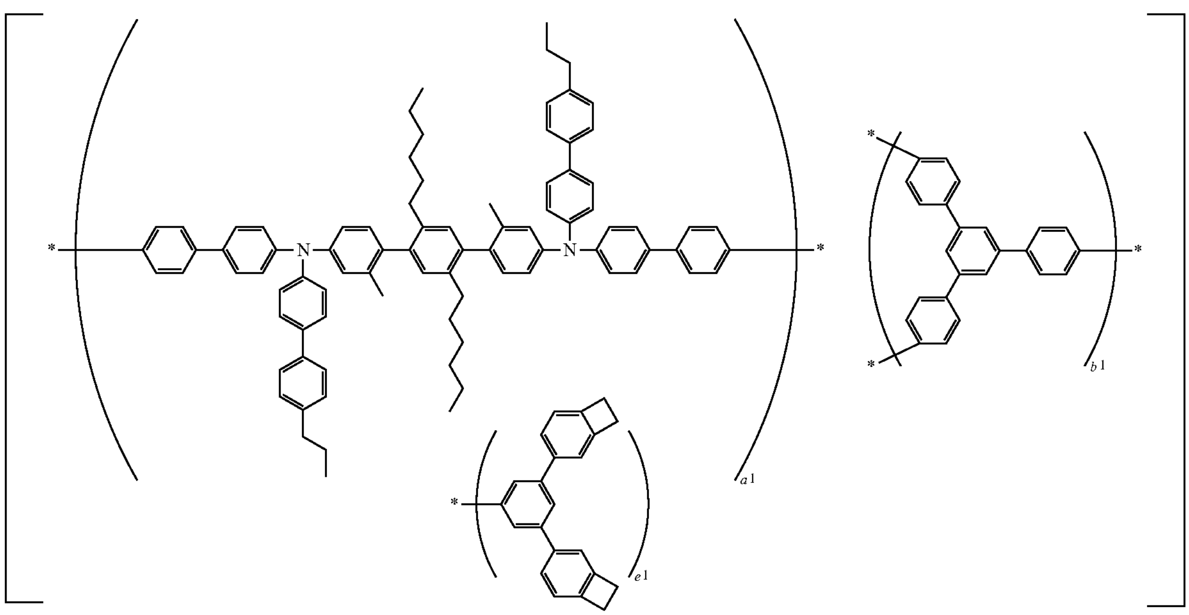
In Copolymer Type 6, c1 is 0 and the monomer unit C' is not present. The end-capping unit E is a curable group.

[Copolymer Type 7]
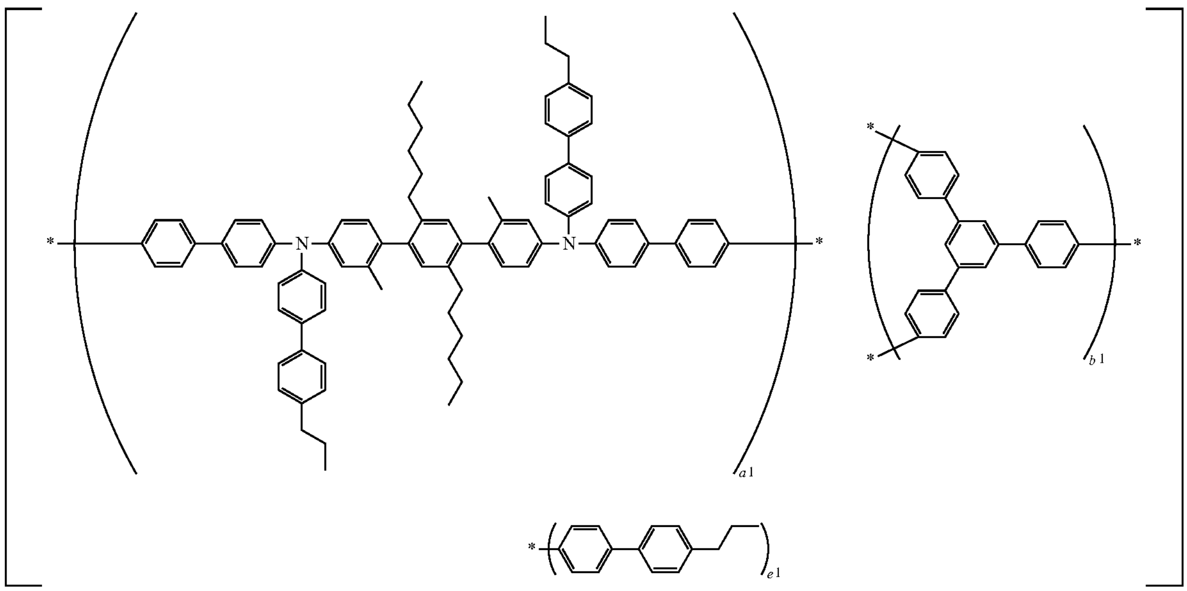
In Copolymer Type 7, c1 is 0 and the monomer unit C' is not present. The end-capping unit E is an aryl group.
[Copolymer Type 8]
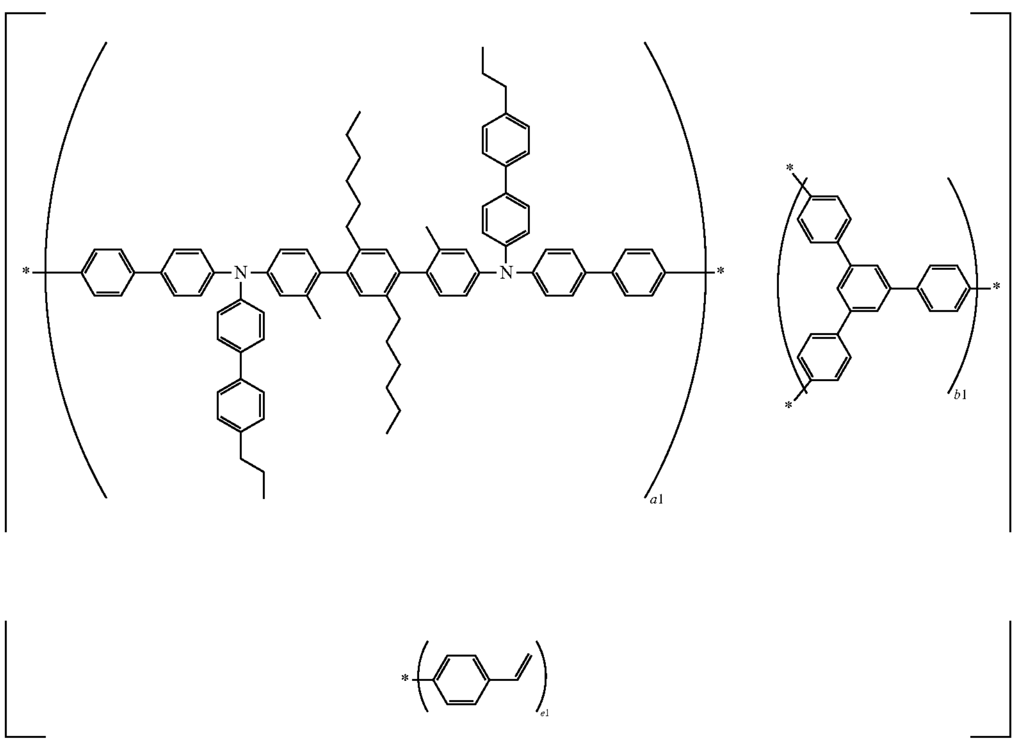
In Copolymer Type 8, c1 is 0 and the monomer unit C' is not present. The end-capping unit E is a curable group.

[Copolymer Type 9]
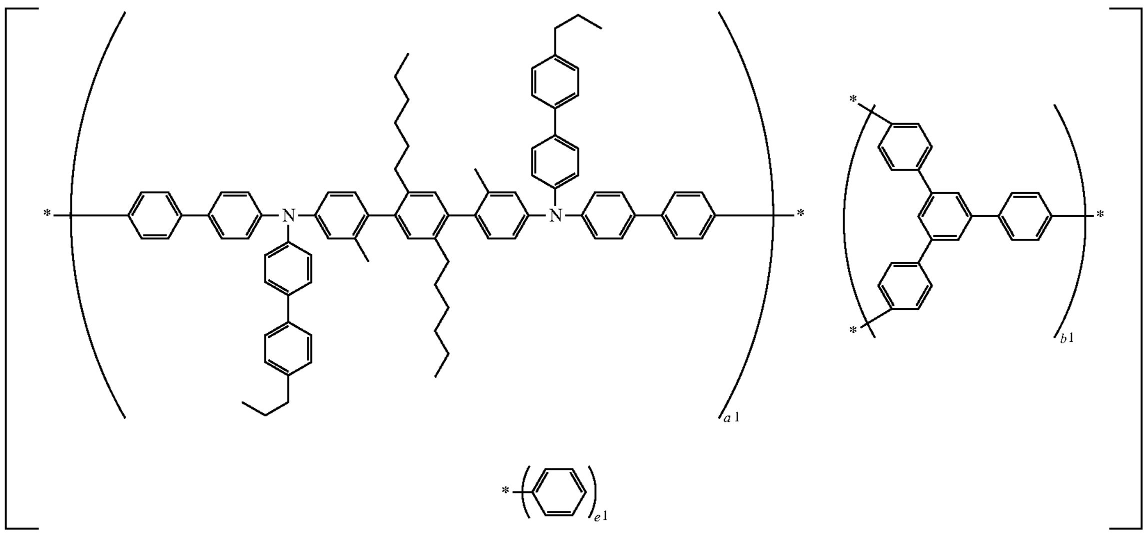
In Copolymer Type 9, c1 is 0 and the monomer unit C' is not present. The end-capping unit E is an aryl group.
[Copolymer Type 10]
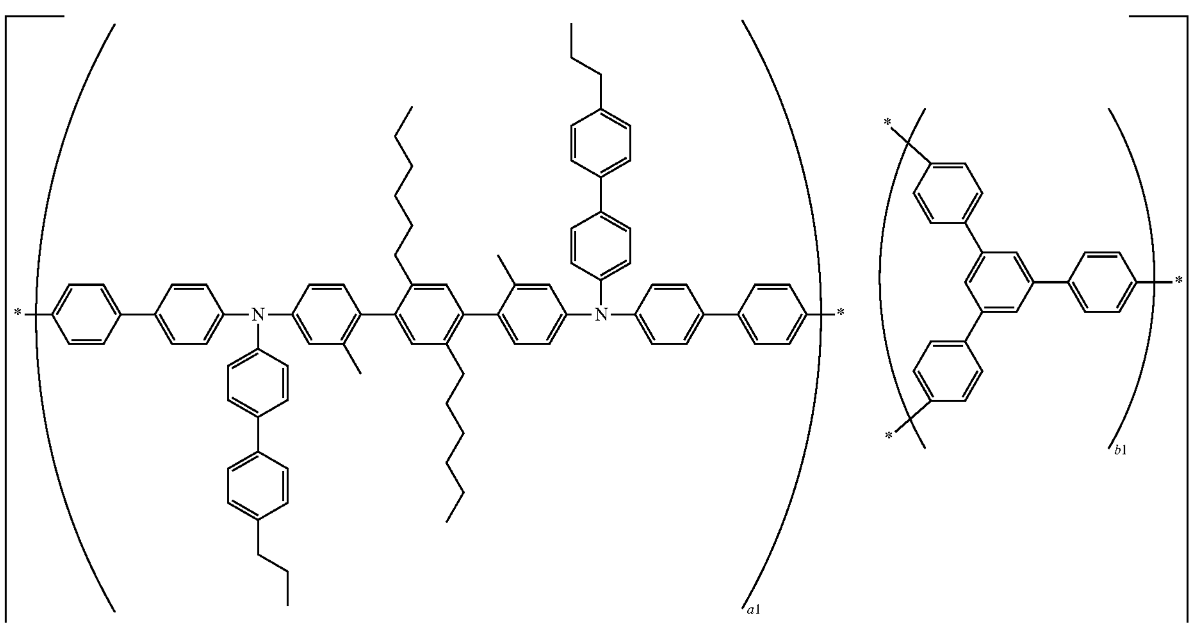

-continued
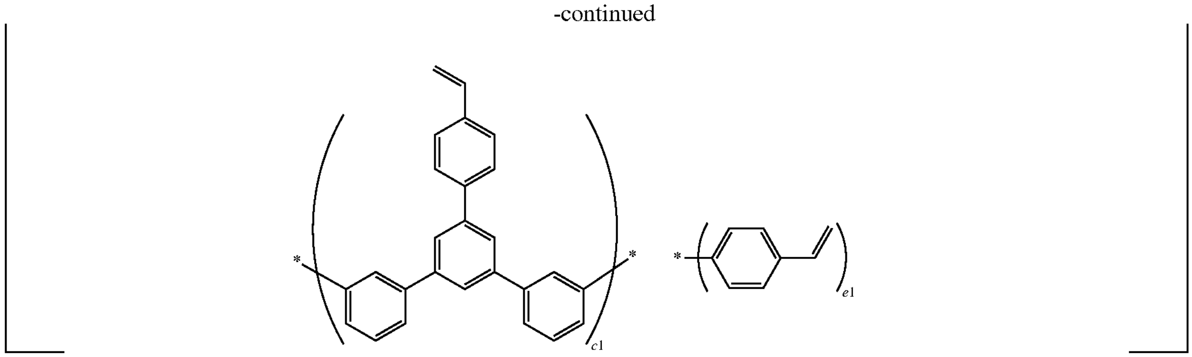
In Copolymer Type 10, the monomer unit C' is present and includes a curable group. The end-capping unit E is a curable group.
[Copolymer Type 11]
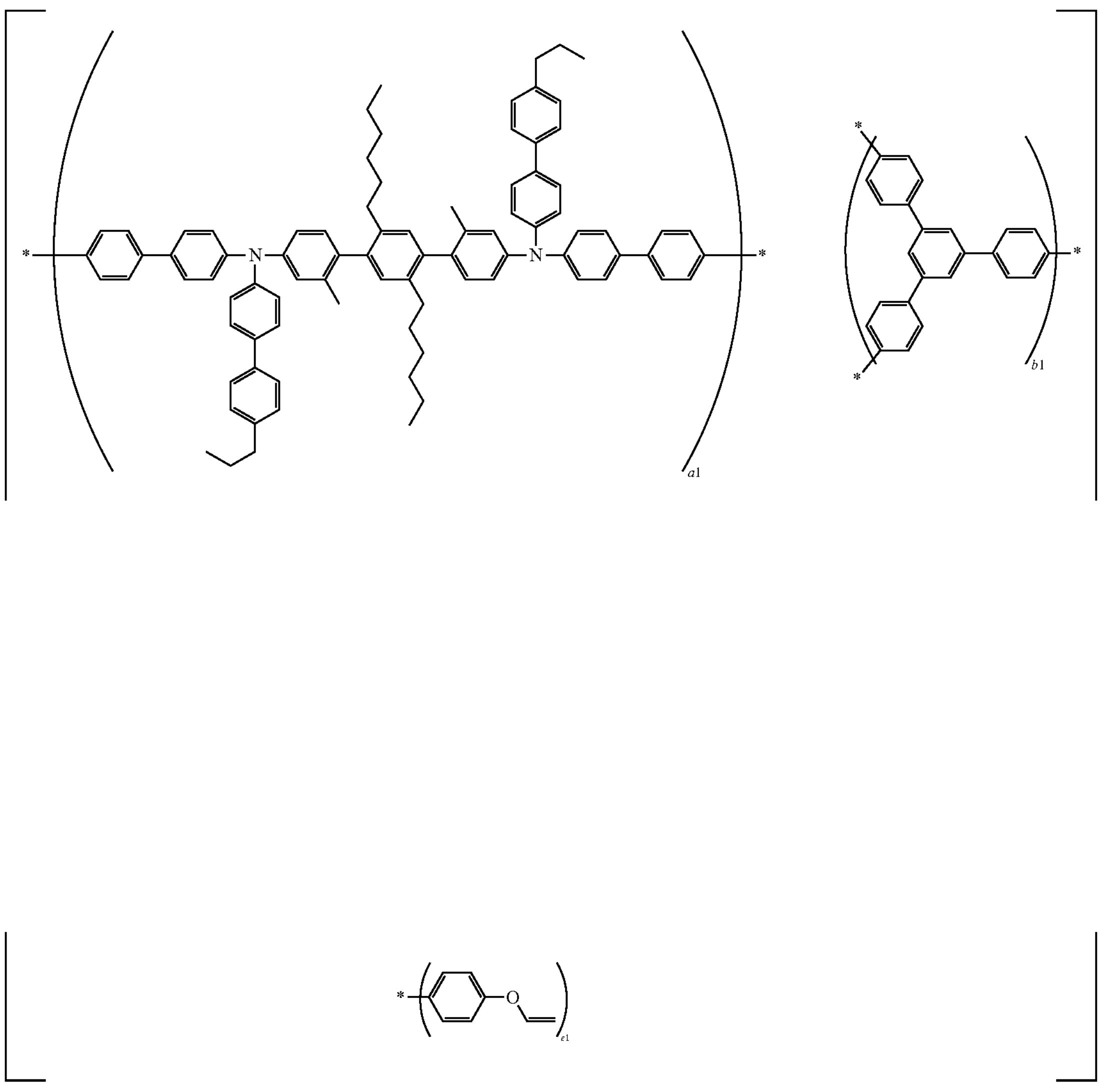
In Copolymer Type 11, c1 is 0 and the monomer unit C' is not present. The end-capping unit E is a curable group.

[Copolymer Type 12]
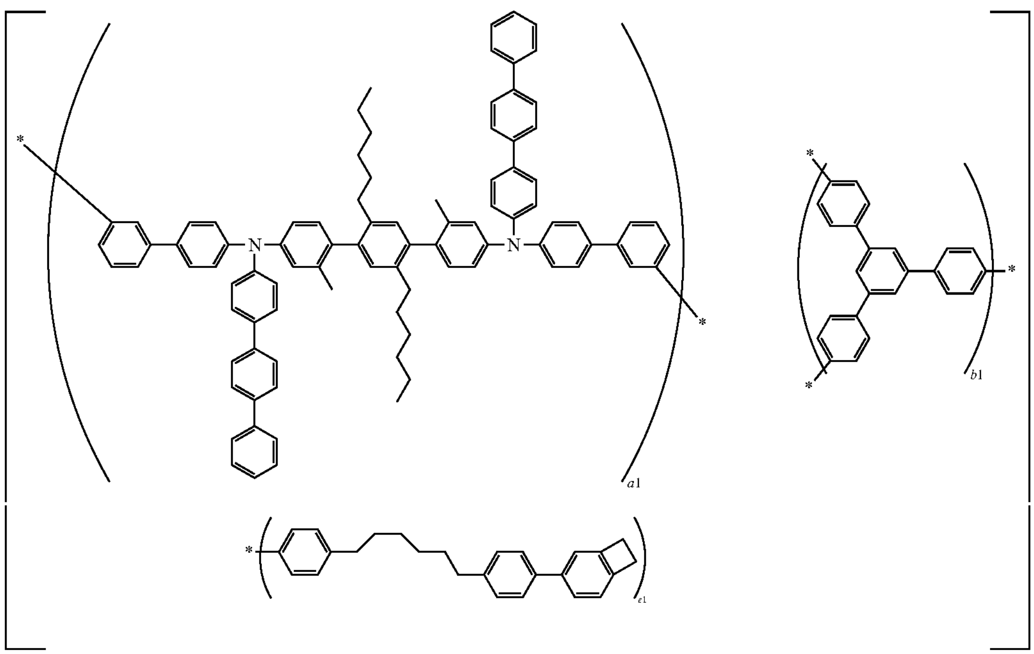
In Copolymer Type 12, c1 is 0 and the monomer unit C' is not present. The end-capping unit E includes a curable group.
[Copolymer Type 13]
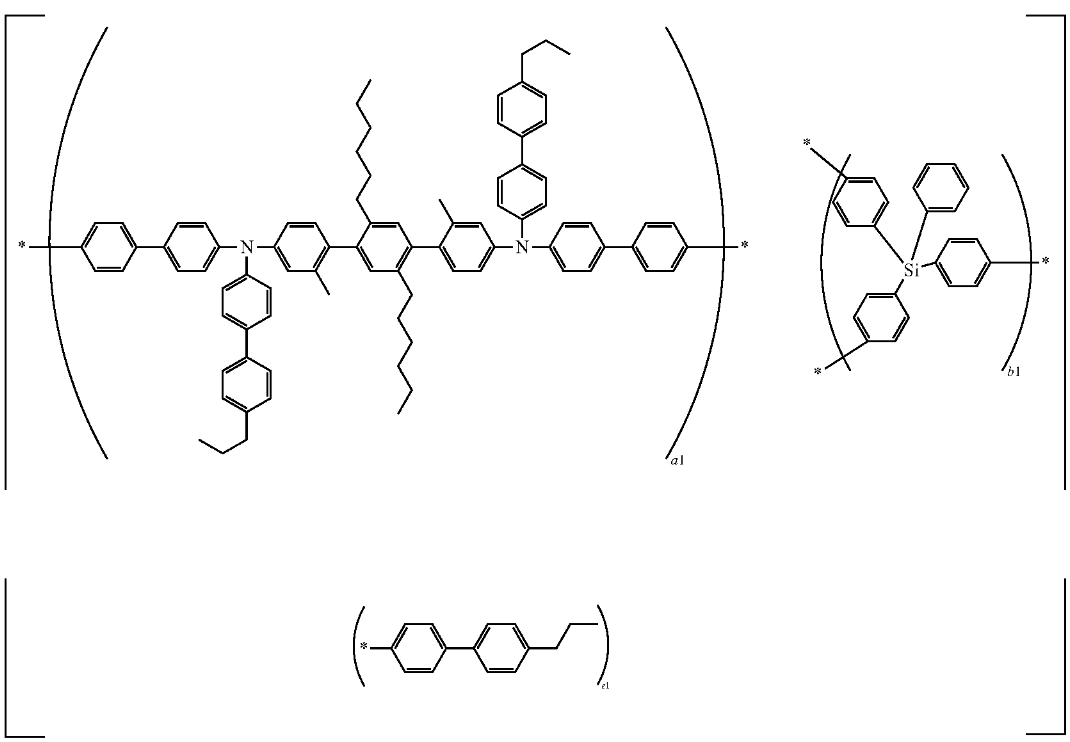
In Copolymer Type 13, c1 is 0 and the monomer unit C' is not present. The end-capping unit E is an aryl group.

[Copolymer Type 14]
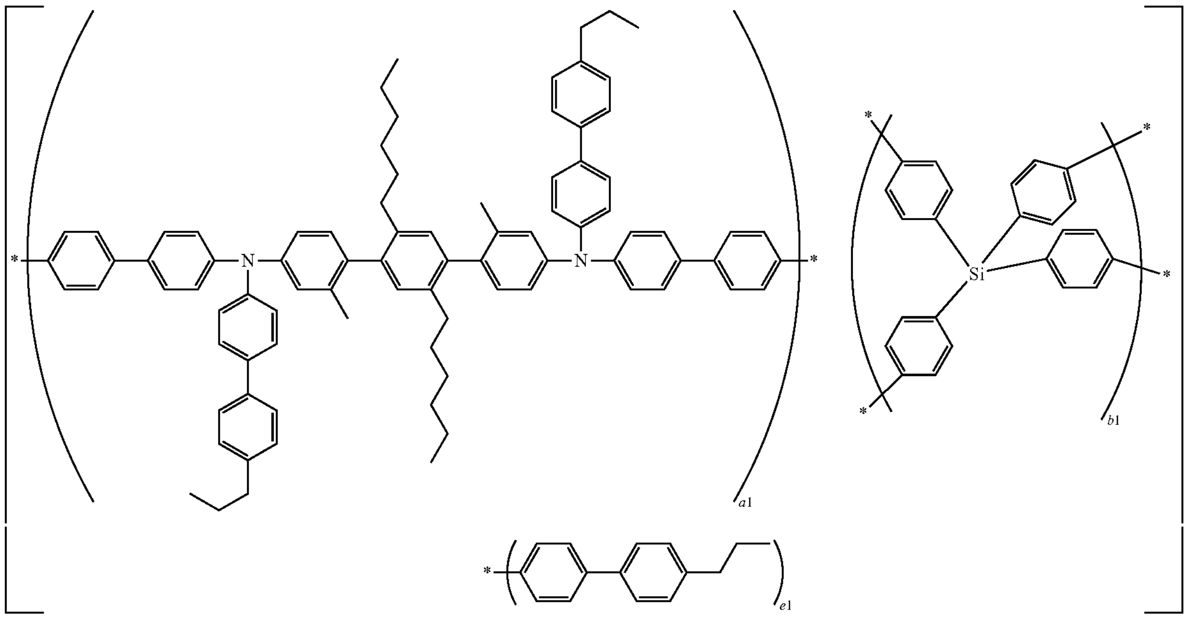
In Copolymer Type 14, c1 is 0 and the monomer unit C' is not present. The monomer unit B' is tetrafunctional. The end-capping unit E is an aryl group.
[Copolymer Type 15]
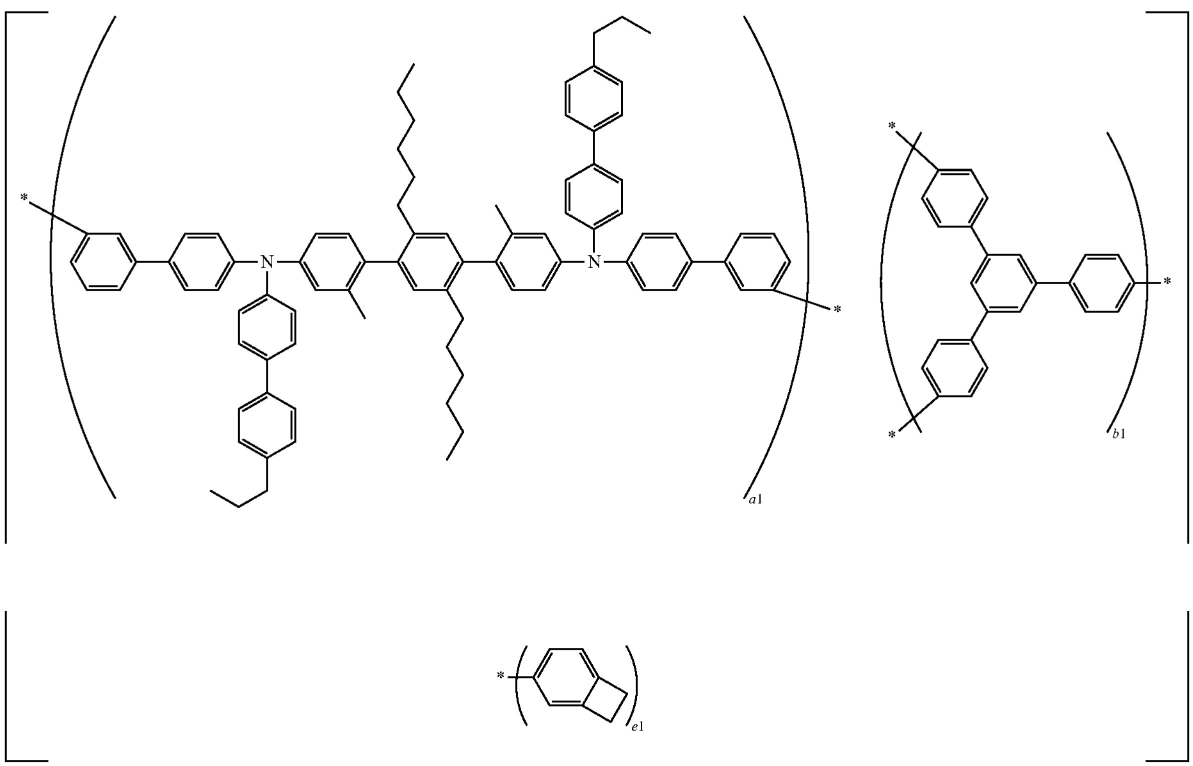
In Copolymer Type 15, c1 is 0 and the monomer unit C' is not present. The end-capping unit E is a curable group.

[Copolymer Type 16]
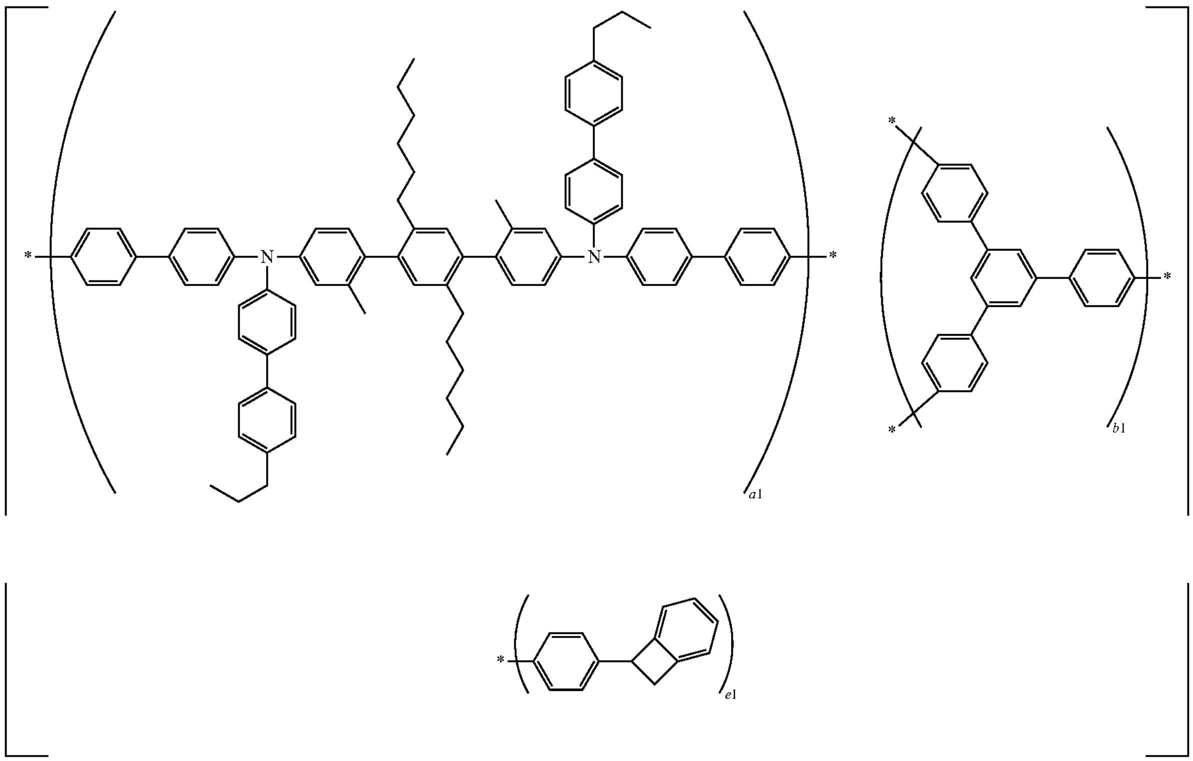
In Copolymer Type 16, c1 is 0 and the monomer unit C' is not present. The end-capping unit E is a curable group.
[Copolymer Type 17]
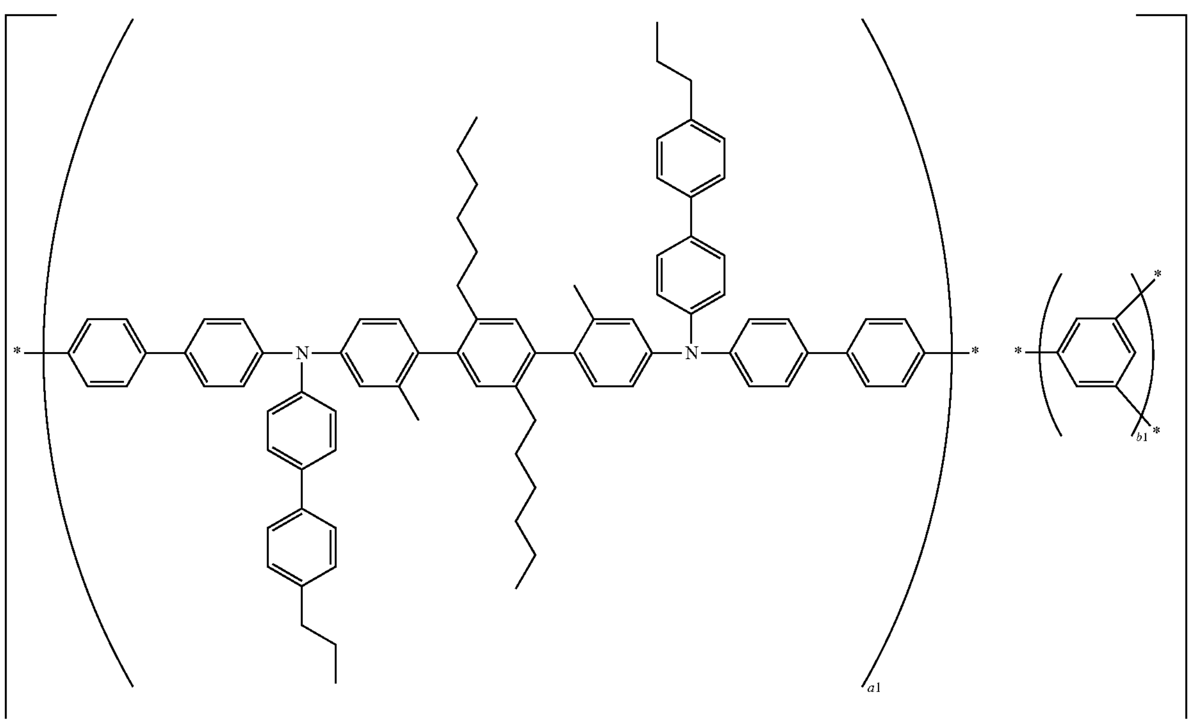

-continued
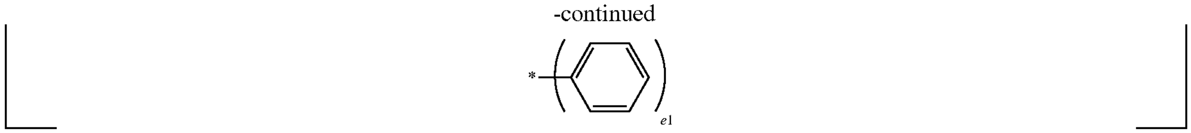
In Copolymer Type 17, c1 is 0 and the monomer unit C' is not present. The end-capping unit E is an aryl group.
[Copolymer Type 18]
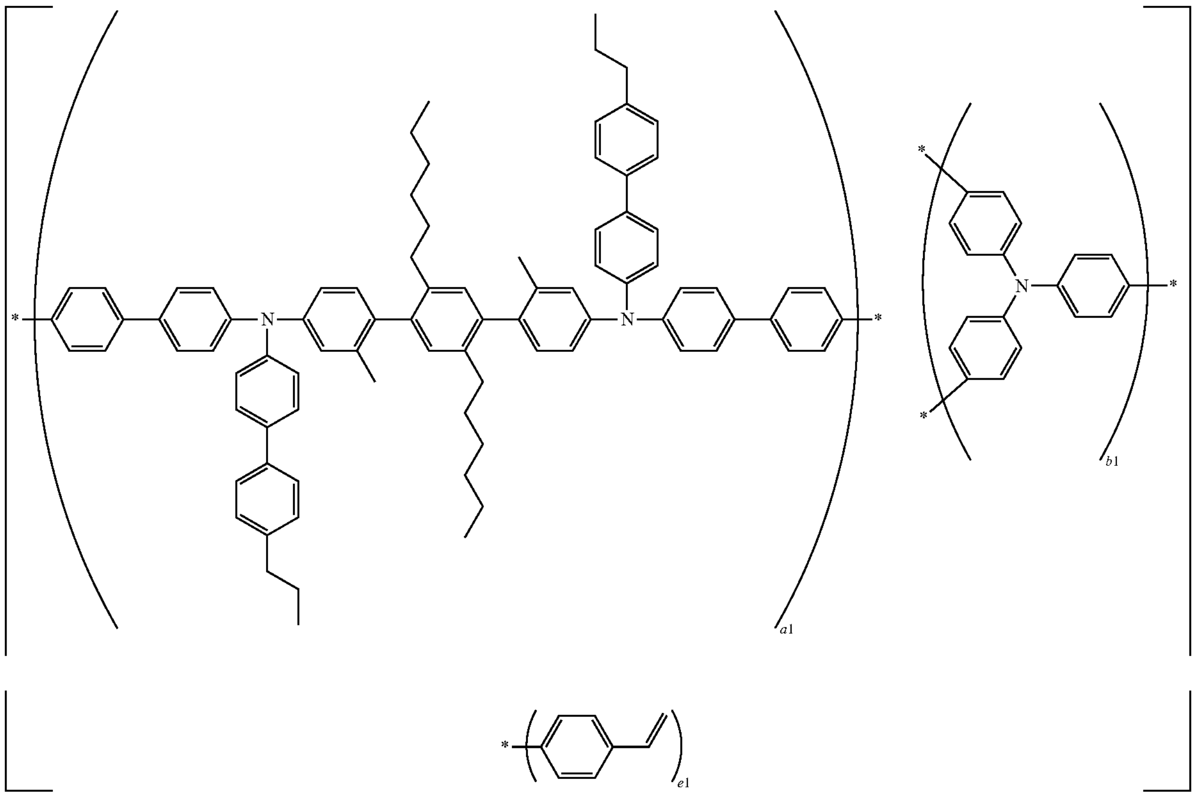
In Copolymer Type 18, c1 is 0 and the monomer unit C' is not present. The end-capping unit E is a curable group.
[Copolymer Type 19]
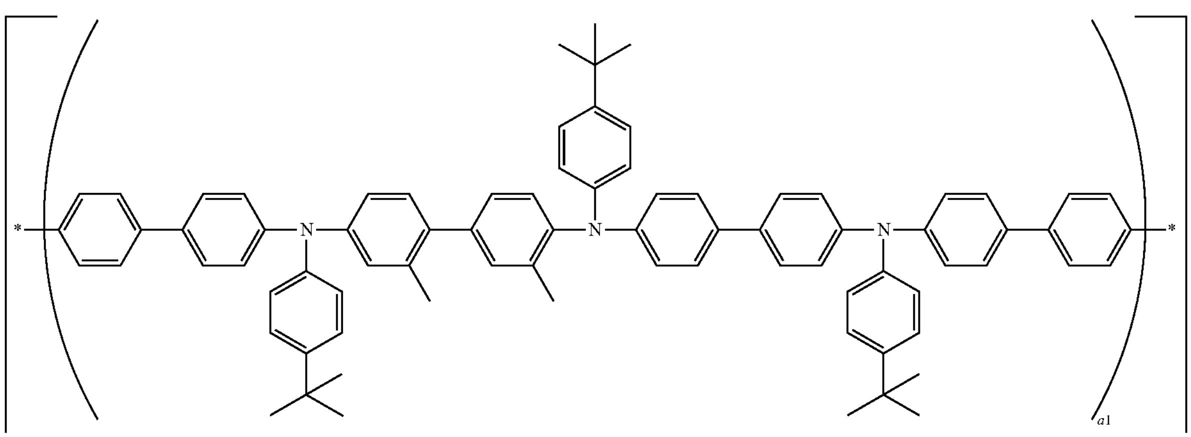

-continued
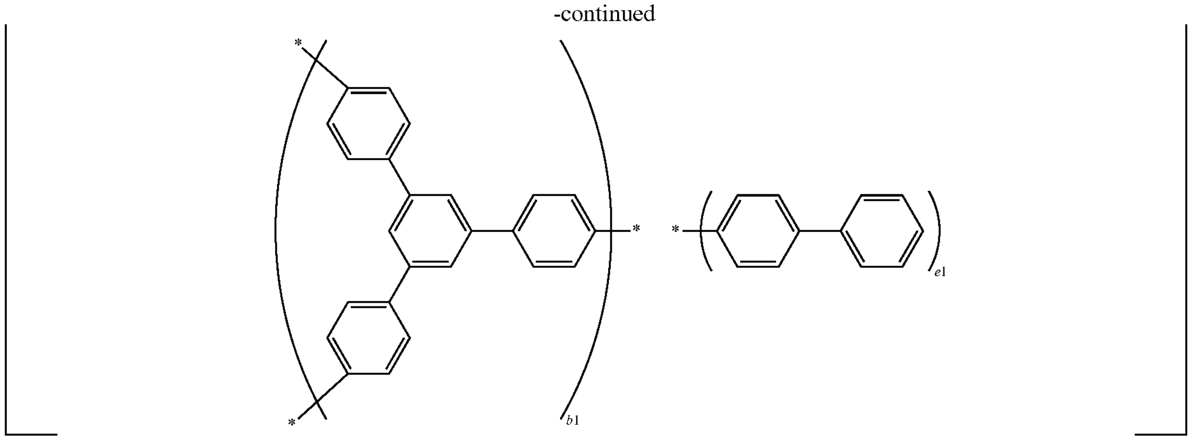
In Copolymer Type 19, c1 is 0 and the monomer unit C' is not present. The end-capping unit E is an aryl group.
In Copolymer Type 20, c1 is 0 and the monomer unit C' is not present. The end-capping unit E is a curable group.
[Copolymer Type 20]
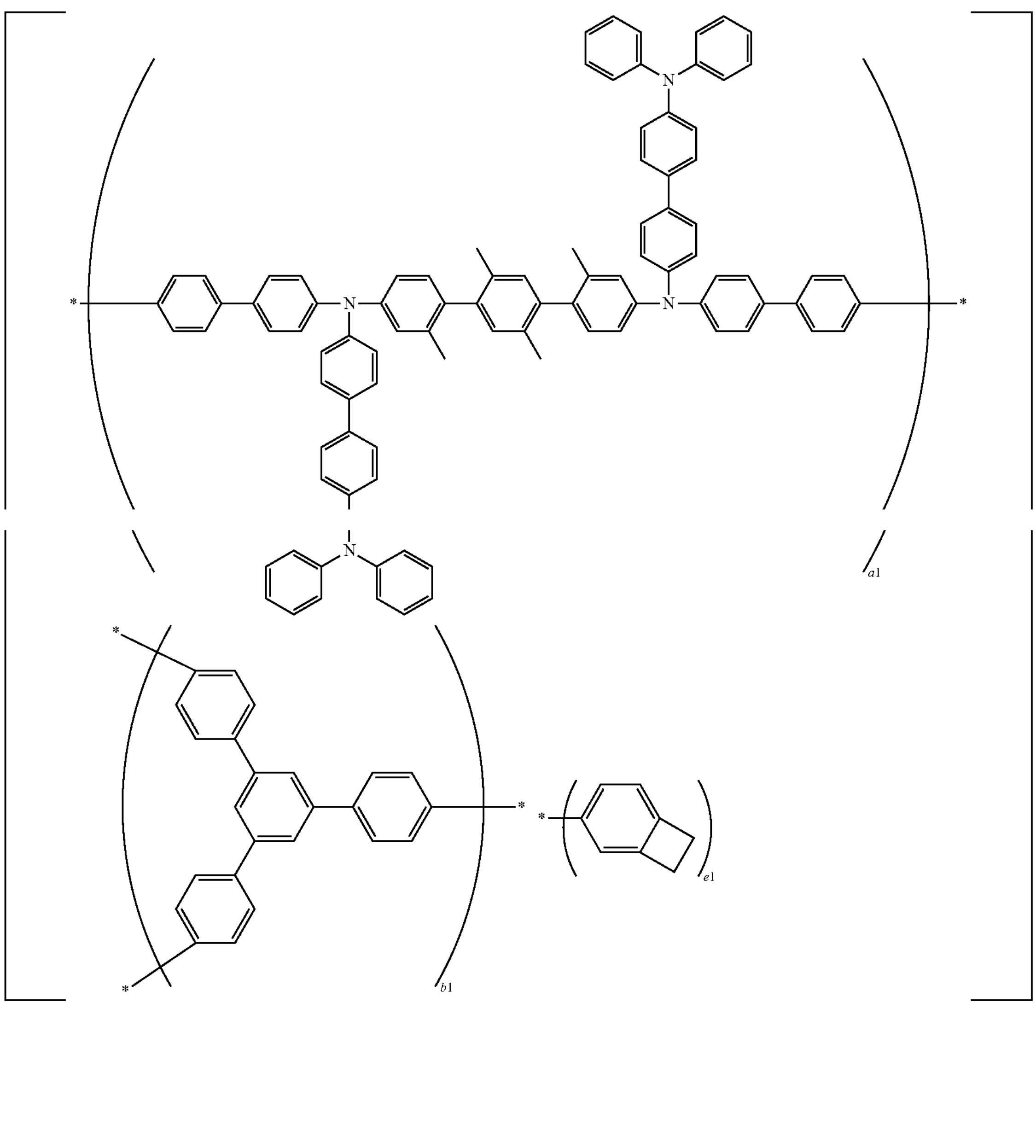

[Copolymer Type 21]

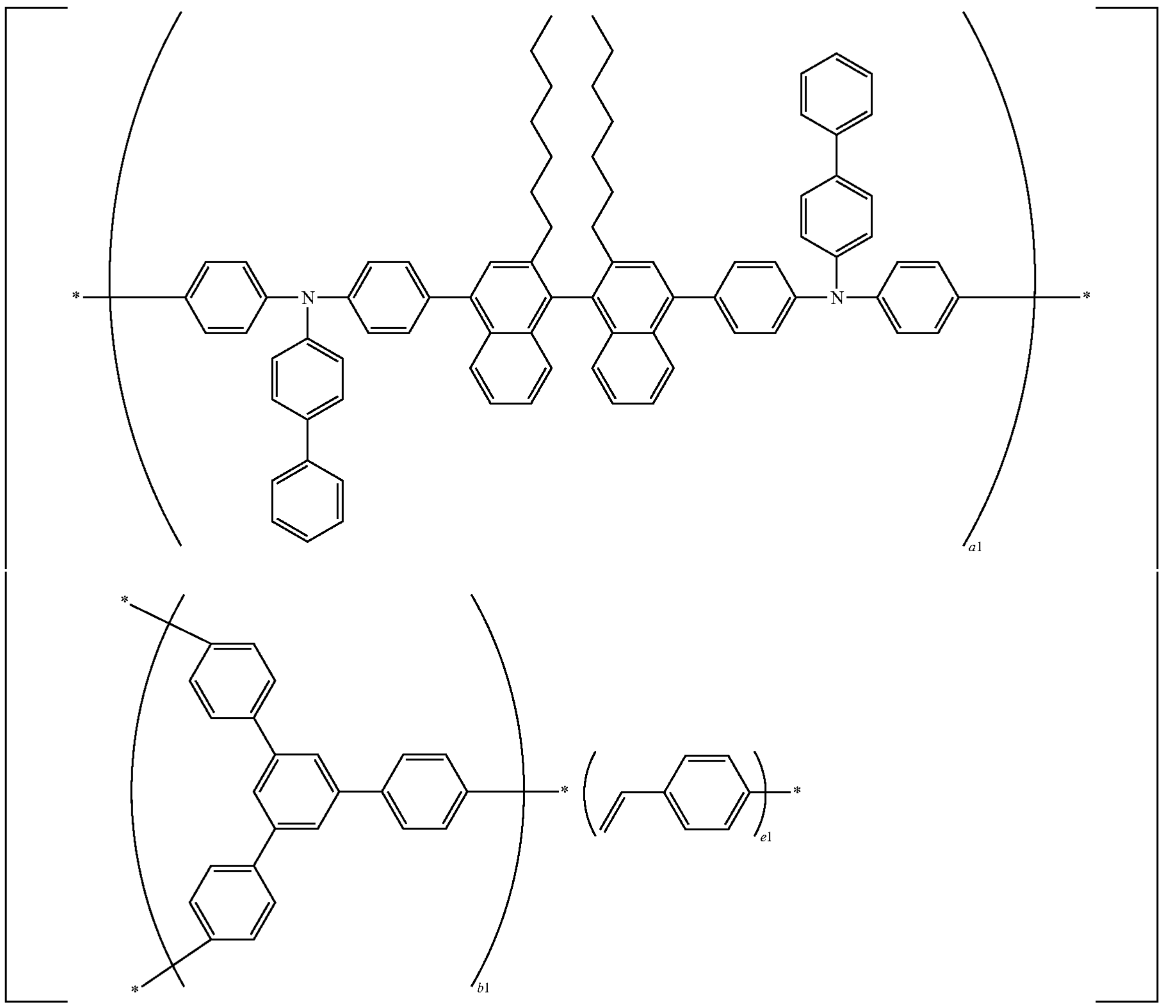

In Copolymer Type 21, c1 is 0 and the monomer unit C' is not present. The end-capping unit E is a curable group.

The copolymer of Chemical Formula 2 may be prepared using any technique for calculating a C—C or C—N bond and a known polymerization technique. Various techniques are known, such as Suzuki, Yamamoto, Stille, and metal-catalyzed C—N couplings, as well as metal-catalyzed oxidative direct arylation.

A technique for controlling the molecular weight of the copolymer of the present invention is well known in this art. The molecular weight of the copolymer described in the present invention may be generally controlled by the ratio of monomers in the polymerization reaction. According to another exemplary embodiment, the molecular weight may be controlled using a quenching reaction.

In an exemplary embodiment of the present invention, the composition may be in a liquid phase. The "liquid phase" means that the composition is in a liquid state at room temperature under atmospheric pressure.

In an exemplary embodiment of the present invention, a composition including the compound of Chemical Formula 1 further includes a solvent.

According to an exemplary embodiment of the present invention, a composition including the compound of Chemical Formula 1 and an ionic compound which includes the anionic group of Chemical Formula 3 further includes a solvent.

According to an exemplary embodiment of the present invention, a composition including the copolymer of Chemical Formula 2 further includes a solvent.

In an exemplary embodiment of the present invention, the solvent is exemplified as, for example, a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; an aliphatic hydrocarbon-based solvent such as cyclohexane, methylcyclohexane, n-pentane, n-hexane, n-heptane, n-octane, n-nonane, and n-decane; a ketone-based solvent such as acetone, methyl ethyl ketone, cyclohexanone, isophorone, tetralone, decalone, and acetylacetone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol, and derivatives thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; and a solvent such as tetralin, but the solvent is sufficient as long as the solvent may dissolve or disperse the compound of Chemical Formula 1 according to an exemplary embodiment of the present invention, and is not limited thereto.

In another exemplary embodiment, the solvents may be used either alone or in a mixture of two or more solvents.

In still another exemplary embodiment, a boiling point of the solvent is preferably 40° C. to 250° C., and more preferably 60° C. to 230° C., but is not limited thereto.

In yet another exemplary embodiment, the composition including the compound of Chemical Formula 1 has a viscosity of 2 cP to 15 cP at room temperature.

According to another exemplary embodiment, a composition including the compound of Chemical Formula 1 and an ionic compound which includes the anionic group of Chemical Formula 3 has a viscosity of 2 cP to 15 cP at room temperature.

In yet another exemplary embodiment, a composition including the copolymer of Chemical Formula 2 has a viscosity of 2 cP to 15 cP at room temperature.

In an exemplary embodiment of the present invention, a concentration of the composition including the compound of Chemical Formula 1 is 0.5 to 10 wt/w %.

In an exemplary embodiment of the present invention, a concentration of the composition including the compound of Chemical Formula 1 and the ionic compound which includes the anionic group of Chemical Formula 3 is 0.5 to 10 wt/v %.

In an exemplary embodiment of the present invention, a concentration of the composition including the copolymer of Chemical Formula 2 is 0.1 to 10 wt/v %.

In an exemplary embodiment of the present invention, the composition may further include one or two or more additives selected from the group consisting of a thermal polymerization initiator and a photopolymerization initiator.

Examples of the thermal polymerization initiator include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5,5-trimethylhexanoyl peroxide, lauryl peroxide, benzoyl peroxide, p-kroll benzoyl peroxide, dicumyl peroxide, 2,5-dimethyl-2,5-(t-butyl oxy)-hexane, 1,3-bis(t-butyl peroxy-isopropyl) benzene, t-butyl cumyl peroxide, di-t-butyl peroxide, 2,5-dimethyl-2,5-(di-t-butyl peroxy) hexane-3, tris-(t-butyl peroxy) triazine, 1,1-di-t-butyl peroxy-3,3,5-trimethyl cyclohexane, 1,1-di-t-butylperoxy cyclohexane, 2,2-di(t-butyl peroxy) butane, 4,4-di-t-butylperoxyvaleric acid n-butyl ester, 2,2-bis(4,4-t-butyl peroxy cyclohexyl) propane, t-butyl peroxy isobutyrate, di-t-butyl peroxy hexahydro terephthalate, t-butyl peroxy-3,5,5-trimethylhexanoate, t-butyl peroxybenzoate, and di-t-butyl peroxy trimethyl adipate, or an azo-based thermal polymerization initiator such as azobisisobutyronitrile, azobisdimethylvaleronitrile, and azobiscyclohexyl nitrile, but the examples are not limited thereto.

Examples of the photopolymerization initiator include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl) butanon-1,2-hydroxy-2-methyl-1-phenylpropan-1-one, 2-methyl-2-morpholino(4-methylthiophenyl)propan-1-one, and 1-phenyl-1,2-propanedion-2-(o-ethoxycarbonyl)oxime, benzoin ether-based photopolymerization initiators such as benzoin, benzoin methyl ether, benzoin ethyl ether, benzoin isobutyl ether, and benzoin isopropyl ether, benzophenone-based photopolymerization initiators such as benzophenone, 4-hydroxybenzophenone, 2-benzoylnaphthalene, 4-benzoylbiphenyl, 4-benzoyl phenyl ether, acrylated benzophenone, and 1,4-benzoylbenzene, thioxanthone-based photopolymerization initiators such as 2-isopropylthioxanthone, 2-chlorothioxanthone, 2,4-dimethylthioxanthone, 2,4-diethylthioxanthone, and 2,4-dichlorothioxanthone, and examples of other photopolymerization initiators include ethylanthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxybenzoyl)-2,4,4-trimethylpentylphosphine oxide, methyl phenyl glyoxy ester, 9,10-phenanthrene, acridine-based compounds, triazine-based compounds, and imidazole-based compounds, but are limited thereto.

Further, compounds having photopolymerization promoting effects may be used either alone or in combination with the photopolymerization initiators. Examples thereof include triethanolamine, methyldiethanolamine, ethyl 4-dimethylaminobenzoate, isoamyl 4-dimethylaminobenzoate, (2-dimethylamino)ethyl benzoate, 4,4'-dimethylamino benzophenone, and the like, but are not limited thereto.

According to an exemplary embodiment of the present invention, the first organic material layer is a hole injection layer, and the second organic material layer is a hole transport layer.

According to an exemplary embodiment of the present invention, the first organic material layer is provided to be brought into contact with the anode, and the second organic material layer is provided to be brought into contact with the first organic material layer.

In another exemplary embodiment, the first organic material layer is a hole injection layer, the second organic material layer is a hole transport layer, the first organic material layer is provided to be brought into contact with the anode, and the second organic material layer is provided to be brought into contact with the first organic material layer. As a hole injection layer including the compound of Chemical Formula 1 and a hole transport layer including the copolymer of Chemical Formula 2 are provided to be brought into contact with each other, holes are smoothly injected and transported in a device, so that it is possible to obtain a device having a low driving voltage and a long service life.

In an exemplary embodiment of the present invention, a third organic material layer may be included between the second organic material layer and the light emitting layer.

According to an exemplary embodiment of the present invention, the organic light emitting device may further include one layer or two or more layers selected from the group consisting of a hole injection layer, a hole transport layer, an electron transport layer, an electron injection layer, a light emitting layer, an electron injection and transport layer, a hole injection and transport layer, an electron blocking layer, and a hole blocking layer in addition to a first organic material layer, a second organic material layer, and a light emitting layer.

In another exemplary embodiment, the organic light emitting device may be a normal type organic light emitting device in which an anode, an organic material layer having one or more layers, and a cathode are sequentially stacked on a substrate.

In still another exemplary embodiment, the organic light emitting device may be an inverted type organic light emitting device in which a cathode, an organic material layer having one or more layers, and an anode are sequentially stacked on a substrate.

The organic material layer of the organic light emitting device of the present invention may be composed of a single-layered structure, but may be composed of a multi-layered structure in which two or more organic material layers are stacked. For example, the organic light emitting device of the present invention may have a structure including a hole injection layer, a hole transport layer, a light emitting layer, an electron transport layer, an electron injection layer, a hole injection and transport layer, an electron injection and transport layer, and the like as organic material layers. However, the structure of the organic light emitting device is not limited thereto, and may include a fewer number of organic layers.

For example, the structure of the organic light emitting device according to an exemplary embodiment of the present invention is exemplified in FIG. 1.

FIG. 1 exemplifies a structure of an organic light emitting device in which an anode 201, a hole injection layer 301, a hole transport layer 401, a light emitting layer 501, an electron injection and transport layer 601, and a cathode 701 are sequentially stacked on a substrate 101. Here, the electron injection and transport layer means a layer which simultaneously injects and transports electrons. The hole injection layer 301 of FIG. 1 may include a composition including the compound of Chemical Formula 1 or a cured product thereof, and the hole transport layer 401 may include a composition including the copolymer of Chemical Formula 2 or a cured product thereof.

FIG. 1 exemplifies an organic light emitting device, and the organic light emitting device is not limited thereto.

When the organic light emitting device includes a plurality of organic material layers, the organic material layers may be formed of the same material or different materials.

The organic light emitting device of the present invention may be manufactured by the materials and methods known in the art, except that among the organic material layers, the first organic material layer is formed using the compound of Chemical Formula 1 and the second organic material layer is formed using the composition including the copolymer of Chemical Formula 2.

For example, the organic light emitting device of the present invention may be manufactured by sequentially stacking an anode, an organic material layer, and a cathode on a substrate. In this case, the organic light emitting device may be manufactured by depositing a metal or a metal oxide having conductivity, or an alloy thereof on a substrate to form an anode, forming an organic material layer including one or more layers of a hole injection layer, a hole transport layer, a light emitting layer, an electron injection layer, an electron transport layer, a hole injection and transport layer, and an electron injection and transport layer thereon through a deposition process, a solution process, a deposition process, the like, and then depositing a material, which may be used as a cathode, thereon, by using a physical vapor deposition (PVD) method such as sputtering or e-beam evaporation. In addition to the method described above, an organic light emitting device may be made by sequentially depositing a cathode material, an organic material layer, and an anode material on a substrate.

The present invention also provides a method for manufacturing an organic light emitting device formed by using the compositions.

Specifically, an exemplary embodiment of the present invention includes: preparing a substrate; forming an anode on the substrate; forming a first organic material layer on the anode; forming a second organic material layer on the first organic material layer; forming a light emitting layer on the second organic material layer; and forming a cathode on the light emitting layer.

In an exemplary embodiment of the present invention, the first organic material layer and/or the second organic material layer are/is formed by using spin coating or ink-jetting.

In an exemplary embodiment of the present invention, the first organic material layer and/or the second organic material layer are/is formed by using a printing method.

In exemplary embodiments of the present invention, examples of the printing method include inkjet printing, nozzle printing, offset printing, transfer printing or screen printing, and the like, but are not limited thereto.

According to an exemplary embodiment of the present invention, as a method of forming the first organic material layer and the second organic material layer, a solution process is suitable, so that there is an economic effect in terms of time and costs when a device is manufactured because the first organic material layer and the second organic material layer may be formed by spin coating, ink-jetting, and the printing method.

In an exemplary embodiment of the present invention, the forming of the first organic material layer includes: coating the composition of the first organic material layer; and heat-treating or light-treating the coated composition.

In an exemplary embodiment of the present invention, the forming of the second organic material layer includes: coating the composition of the second organic material layer; and heat-treating or light-treating the coated composition.

In an exemplary embodiment of the present invention, the heat-treating of the coated composition may be performed through a heat treatment, and the heat treatment temperature in the heat-treating of the coated composition may be 85° C. to 250° C., may be 100° C. to 250° C. according to an exemplary embodiment, and may be 150° C. to 250° C. in another exemplary embodiment.

In another exemplary embodiment, the heat treatment time in the heat-treating of the coated composition may be 1 minute to 2 hours, may be 1 minute to 1 hour according to an exemplary embodiment, and may be 20 minutes to 1 hour in another exemplary embodiment.

According to an exemplary embodiment of the present invention, the atmosphere for heat treatment in the process of forming the first organic material layer and/or the second organic material layer may be an inert gas atmosphere such as argon or nitrogen, or in the atmosphere, but is not limited thereto.

When the forming of the first organic material layer and the second organic material layer includes the heat-treating or light-treating of the coated composition, a plurality of the compounds included in the composition may form a cross-linkage, thereby providing an organic material layer including a thin-filmed structure. In this case, it is possible to prevent the organic material layer from being dissolved, morphologically affected or decomposed by a solvent when another layer is stacked on the surface of the organic material layer formed by using the composition.

Therefore, when the organic material layer formed by using the composition is formed by a method including the heat-treating or light-treating of the coated composition, resistance to a solvent is increased, so that a plurality of layers may be formed by repeatedly performing solution deposition and cross-linking methods, and stability is increased, so that the service life characteristic of the device may be increased.

In an exemplary embodiment of the present invention, as the composition including the compound of Chemical Formula 1 or the composition including the copolymer of Chemical Formula 2, a composition mixed and dispersed in a polymer binder may be used.

In an exemplary embodiment of the present invention, as the polymer binder, those which do not extremely suppress charge transport are preferred, and those which are not strong in absorption to visible light are preferably used. As the polymer binder, poly(N-vinylcarbazole), polyaniline, and derivatives thereof, polythiophene and derivatives thereof, poly(p-phenylene vinylene) and derivatives thereof, poly(2,5-thienylene vinylene) and derivatives thereof, polycarbonate, polyacrylate, polymethyl acrylate, polymethyl methacrylate, polystyrene, polyvinyl chloride, polysiloxane, and the like are exemplified.

For the composition of the first organic material layer according to an exemplary embodiment of the present invention, the compound of Chemical Formula 1 may further include an ionic compound including the above-described anionic group of Chemical Formula 3 or another monomer (compound).

The composition of the second organic material layer according to an exemplary embodiment of the present invention may use the copolymer of Chemical Formula 2 alone, or may include other monomers or other copolymers.

As the anode material, materials having a high work function are usually preferred so as to facilitate the injection of holes into an organic material layer. Specific examples of the anode material which may be used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer such as poly(3-methylthiophene), poly[3,4-(ethylene-1,2-dioxy)thiophene] (PEDOT), polypyrrole, and polyaniline; and the like, but are not limited thereto.

As the cathode material, materials having a low work function are usually preferred so as to facilitate the injection of electrons into an organic material layer. Specific examples of the cathode material include: a metal such as barium, magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which injects holes from an electrode, and a hole injection material is preferably a compound which has a capability of transporting holes and thus has an effect of injecting holes at an anode and an excellent effect of injecting holes into a light emitting layer or a light emitting material, prevents excitons produced from the light emitting layer from moving to an electron injection layer or an electron injection material, and is also excellent in the ability to form a thin film. The highest occupied molecular orbital (HOMO) of the hole injection material is preferably a value between the work function of the anode material and the HOMO of the neighboring organic material layer. Specific examples of the hole injection material include the above-described compound of Chemical Formula 1, metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based electrically conductive polymers, and the like, but are not limited thereto.

The hole transport layer is a layer which accepts holes from a hole injection layer and transports the holes to a light emitting layer, and a hole transport material is suitably a material having high hole mobility which may accept holes from an anode or a hole injection layer and transfer the holes to a light emitting layer. Specific examples thereof include arylamine-based organic materials, conductive polymers, block copolymers having both conjugated portions and non-conjugated portions, and the like, and the above-described copolymer of Chemical Formula 2 may be used, but the present invention is not limited thereto.

The hole injection and transport layer may include materials for the above-described hole transport layer and hole injection layer.

The light emitting material is a material which may receive holes and electrons from a hole transport layer and an electron transport layer, and combine the holes and the electrons to emit light in a visible ray region, and is preferably a material having high quantum efficiency for fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene, lubrene, and the like, but are not limited thereto.

The light emitting layer may include a host material and a dopant material. Examples of the host material include fused aromatic ring derivatives, or hetero ring-containing compounds, and the like. Specifically, examples of the fused aromatic ring derivatives include anthracene derivatives, pyrene derivatives, naphthalene derivatives, pentacene derivatives, phenanthrene compounds, fluoranthene compounds, and the like, and examples of the hetero ring-containing compounds include carbazole derivatives, dibenzofuran derivatives, ladder-type furan compounds, pyrimidine derivatives, and the like, but the examples thereof are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamino group, and examples thereof include a pyrene, an anthracene, a chrysene, a periflanthene, and the like, which have an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specific examples thereof include styrylamine, styryldiamine, styryltriamine, styryltetramine, and the like, but are not limited thereto. Further, examples of the metal complexes include an iridium complex, a platinum complex, and the like, but are not limited thereto.

The electron transport layer is a layer which accepts electrons from an electron injection layer and transports the electrons to a light emitting layer, and an electron transport material is suitably a material having high electron mobility which may proficiently accept electrons from a cathode and transfer the electrons to a light emitting layer. Specific examples thereof include: Al complexes of 8-hydroxyquinoline; complexes including $Alq_3$; organic radical compounds; hydroxyflavone-metal complexes, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and an electron injection material is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like and derivatives thereof, metal complex compounds, nitrogen-containing 5-membered ring derivatives, and the like, but are not limited thereto.

The electron injection and transport layer may include materials for the above-described electron transport layer and electron injection layer.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato)(o-cresolato) gallium, bis(2-methyl-8-quinolinato)(1-naphtholato) aluminum, bis(2-methyl-8-quinolinato)(2-naphtholato) gallium, and the like, but are not limited thereto.

The hole blocking layer is a layer which blocks holes from reaching a cathode, and may be generally formed under the same conditions as those of the hole injection layer. Specific examples thereof include oxadiazole derivatives or triazole derivatives, phenanthroline derivatives, BCP, aluminum complexes, and the like, but are not limited thereto.

The electron blocking layer is a layer which blocks electrons from reaching an anode, and materials known in the art may be used.

The organic light emitting device according to the present invention may be a top emission type, a bottom emission type, or a dual emission type according to the material to be used.

Hereinafter, the present invention will be described in detail with reference to Examples for specifically describing the present invention. However, the Examples according to the present invention may be modified into various different forms, and it should not be interpreted that the scope of the present invention is limited to the Examples to be described below. The Examples of the present invention are provided for more completely explaining the present invention to the person with ordinary skill in the art.

Preparation Examples of Compound of Chemical Formula 1

Preparation Example 1. Synthesis of Compound A

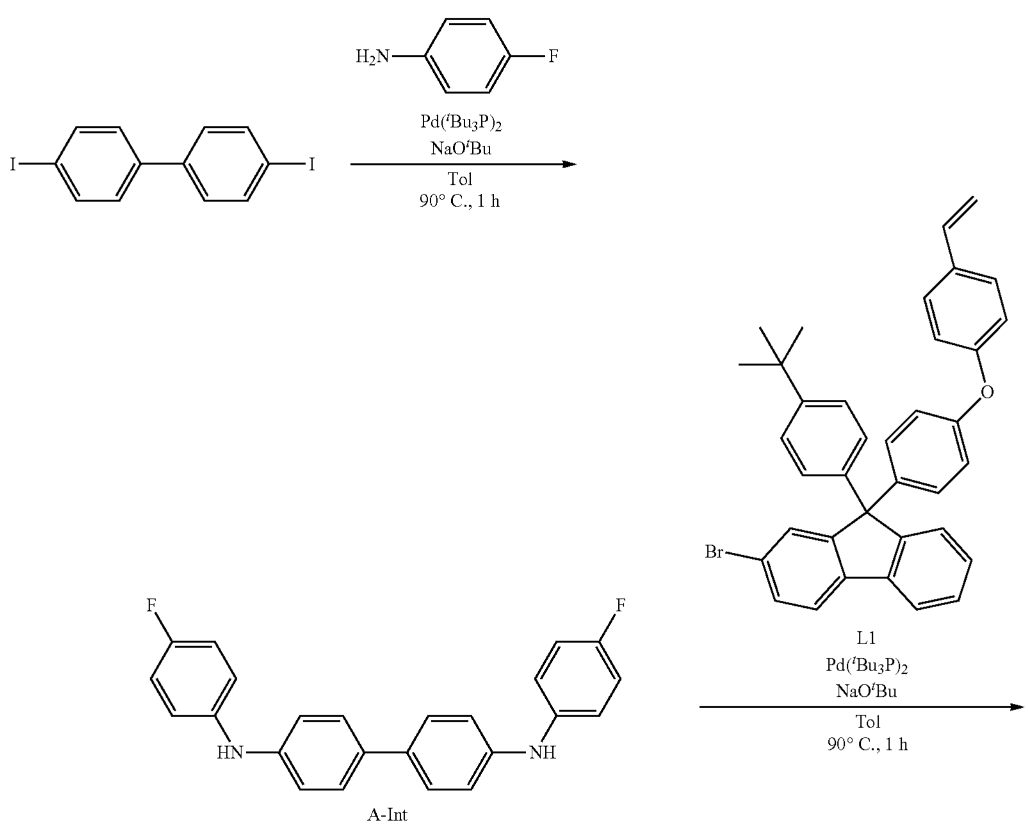

-continued

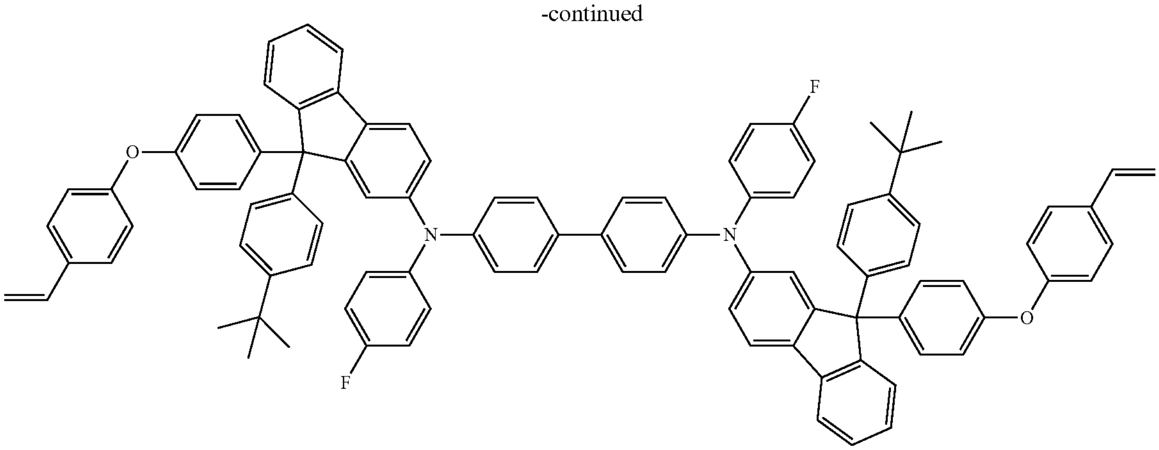

A

Synthesis of A-Int: diiodobiphenyl (10.0 g, 24.6 mmol), 4-fluoroaniline (5.12 mL, 54.2 mmol), and sodium tert butoxide [hereinafter, referred to as NaOtBu] (7.10 g, 73.9 mmol) were put into a round bottom flask (RBF), and then toluene (120 mL) was introduced therein. After Pd($^t$Bu$_3$P)$_2$ (0.629 g, 1.23 mmol) was introduced therein, the resulting mixture was stirred at 90° C. for 1 hour. Thereafter, water was added thereto, an organic layer was extracted with ethyl acetate (EA), and then dried over $MgSO_4$, dichloromethane (DCM) was put thereinto, and the resulting mixture was filtered to obtain A-Int (6.10 g).

Synthesis of A: A-Int (1.50 g, 4.03 mmol), L1 (4.83 g, 8.46 mmol), and NaOtBu (1.16 g, 12.1 mmol) were put into a round bottom flask (RBF), and then toluene (30 mL) was introduced therein. After the resulting mixture was warmed to 90° C., Pd($^t$Bu$_3$P)$_2$ (0.144 g, 0.282 mmol) was introduced therein, and the resulting mixture was stirred for 1 hour. Water was added thereto, and an organic layer was extracted with dichloromethane (DCM), and then dried over $MgSO_4$, and column purified with dichloromethane/hexane to obtain high-purity Compound A (3.43 g). $[M+H]^+$=1354

$^1$H NMR: δ 7.71-7.69 (d, 2H), 7.65-7.63 (d, 2H), 7.39-7.33 (m, 12H), 7.26-7.22 (m, 6H), 7.18 (m, 2H), 7.11-7.02 (m, 18H), 6.98-6.92 (m, 8H), 6.85-6.83 (m, 4H), 6.67-6.61 (dd, 2H), 5.64-5.60 (d, 2H), 5.15-5.12 (d, 2H), 1.27 (m, 18H)

Preparation Example 2. Synthesis of Compound B

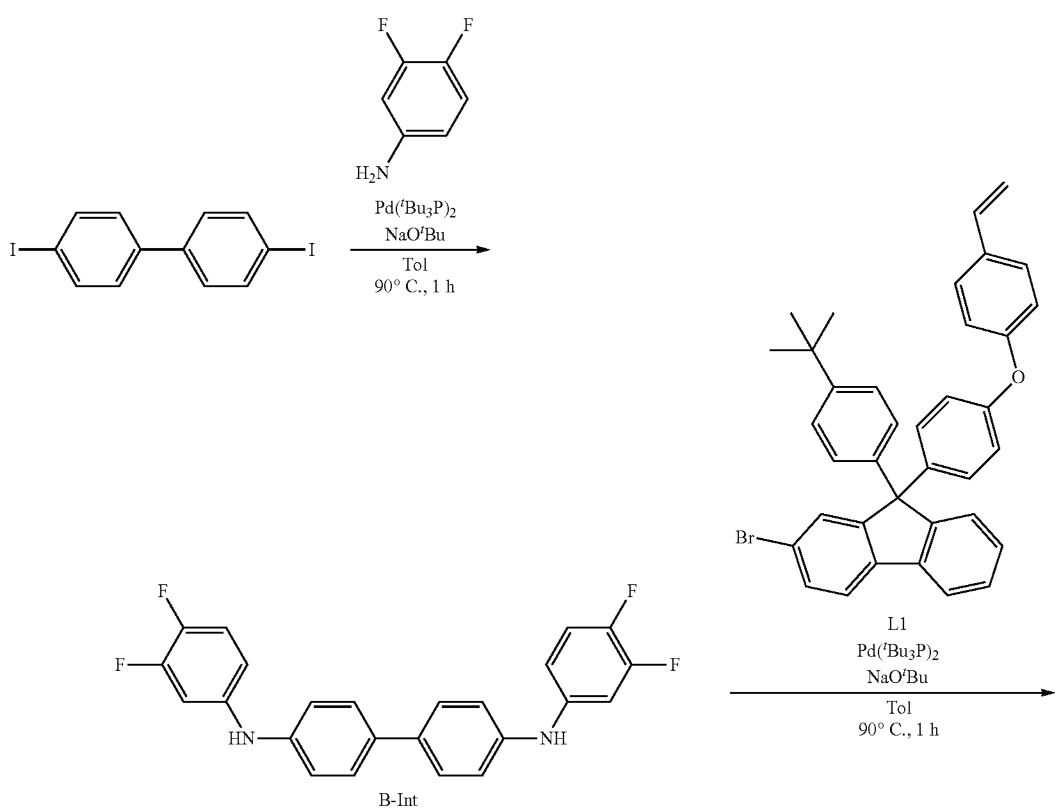

-continued

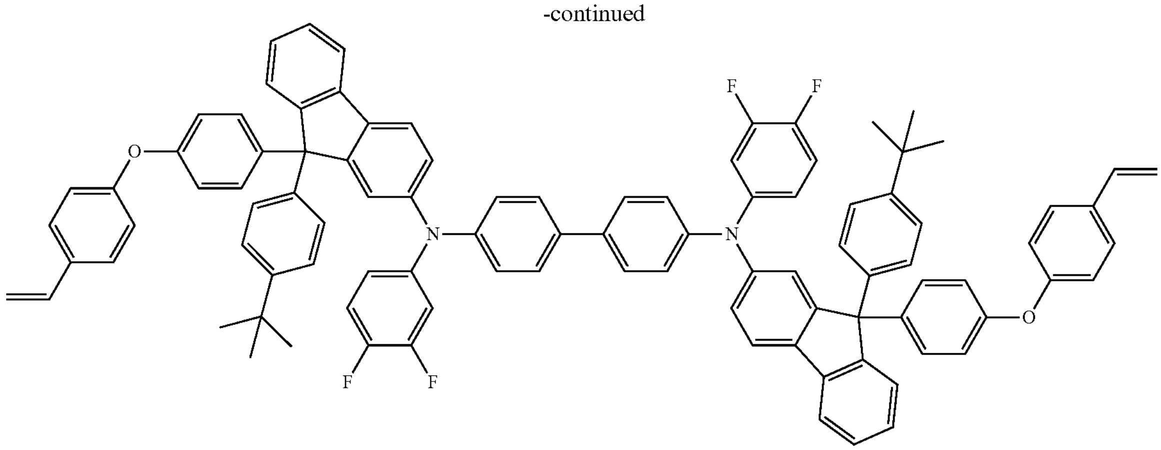

B

Synthesis of B-Int: diiodobiphenyl (12.0 g, 29.6 mmol), 3,4-difluoroaniline (6.45 mL, 65.0 mmol), and NaOtBu (8.52 g, 88.7 mmol) were put into a round bottom flask (RBF), and then toluene (150 mL) was introduced therein. After $Pd(^tBu_3P)_2$ (0.755 g, 1.48 mmol) was introduced therein, the resulting mixture was stirred at 90° C. for 1 hour. Thereafter, water was added thereto, an organic layer was extracted with ethyl acetate (EA), and then dried over $MgSO_4$, dichloromethane (DCM) was put thereinto, and the resulting mixture was filtered to obtain B-Int (9.56 g).

Synthesis of B: B-Int (0.600 g, 1.47 mmol), L1 (1.70 g, 2.98 mmol), and NaOtBu (0.424 g, 4.41 mmol) were put into a round bottom flask (RBF), and then toluene (20 mL) was introduced therein. After the resulting mixture was warmed to 90° C., $Pd(^tBu_3P)_2$ (0.0526 g, 0.103 mmol) was introduced therein, and the resulting mixture was stirred for 1 hour. Water was added thereto, and an organic layer was extracted with dichloromethane (DCM), and then dried over $MgSO_4$, and column purified with dichloromethane/hexane to obtain high-purity Compound B (1.17 g). $[M+H]^+$=1390

$^1H$ NMR: δ 7.73-7.71 (d, 2H), 7.68-7.66 (d, 2H), 7.43-7.41 (m, 4H), 7.38-7.33 (m, 8H), 7.27-7.23 (m, 6H), 7.19 (m, 2H), 7.11-7.00 (m, 16H), 6.94-6.92 (m, 6H), 6.86-6.80 (m, 6H), 6.67-6.61 (dd, 2H), 5.64-5.61 (d, 2H), 5.15-5.13 (d, 2H), 1.26 (m, 18H)

Preparation Example 3. Synthesis of Compound C

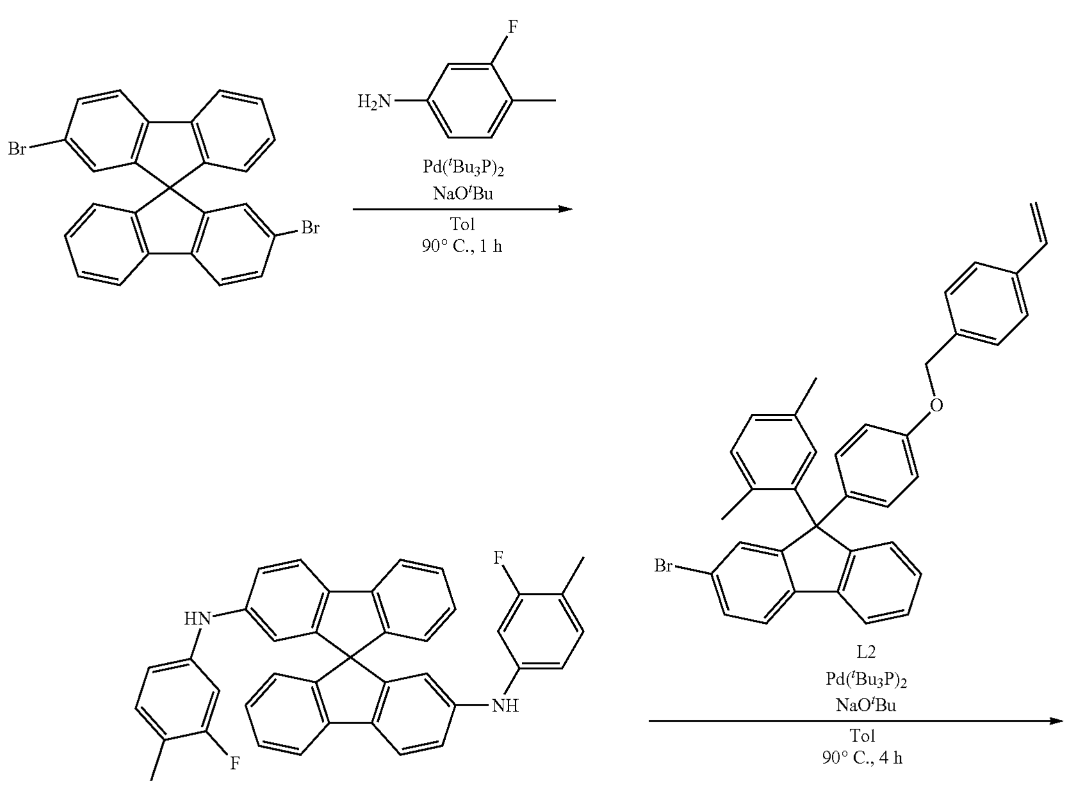

C-Int

-continued

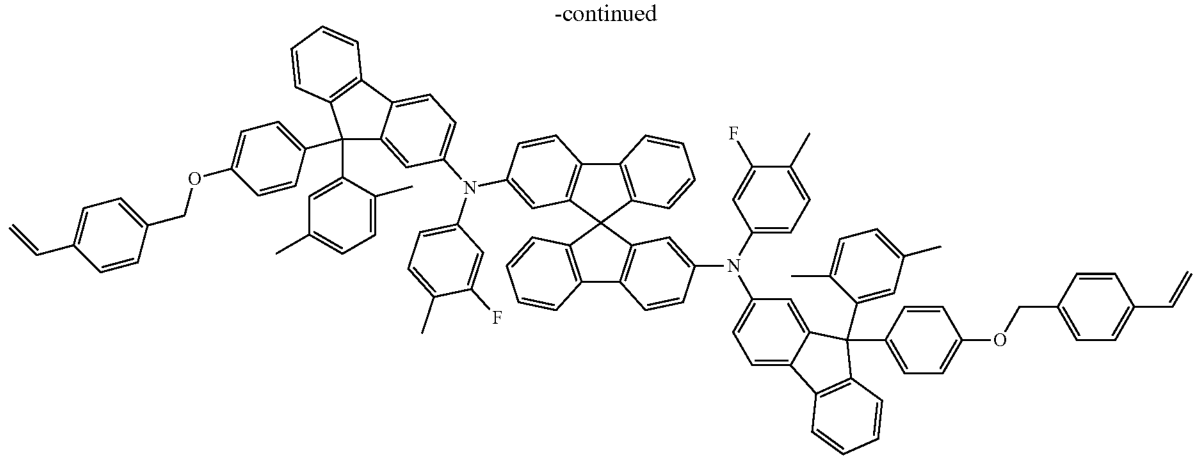

C

Synthesis of C-Int: 2,2'-dibromo-9,9'-spirobifluorene (8.00 g, 16.9 mmol), 3-fluoro-4-methylaniline (4.25 mL, 37.1 mmol), and NaOtBu (4.86 g, 50.6 mmol) were put into a round bottom flask (RBF), and then toluene (160 mL) was introduced therein. After $Pd(^tBu_3P)_2$ (0.431 g, 0.844 mmol) was introduced therein, the resulting mixture was stirred at 90° C. for 1 hour. Thereafter, water was added thereto, an organic layer was extracted with ethyl acetate (EA), and then dried over $MgSO_4$, dichloromethane (DCM) was put thereinto, and the resulting mixture was filtered to obtain C-Int (6.64 g).

Synthesis of C: C-Int (2.00 g, 3.56 mmol), L2 (4.16 g, 7.47 mmol), and NaOtBu (1.02 g, 10.7 mmol) were put into a round bottom flask (RBF), and then toluene (70 mL) was introduced therein. After the resulting mixture was warmed to 90° C., $Pd(^tBu_3P)_2$ (0.127 g, 0.249 mmol) was introduced therein, and the resulting mixture was stirred for 4 hours. Water was added thereto, and an organic layer was extracted with dichloromethane (DCM), and then dried over $MgSO_4$, and column purified with dichloromethane/hexane to obtain high-purity Compound C (2.69 g). $[M+H]^+=1516$ $^1H$ NMR: δ 7.71-7.70 (m, 4H), 7.65-7.63 (m, 4H), 7.40-7.34 (m, 12H), 7.27-7.21 (m, 8H), 7.11-7.03 (m, 16H), 6.95-6.91 (m, 4H), 6.84-6.82 (m, 4H), 6.79-6.76 (m, 4H), 6.68-6.62 (dd, 2H), 5.64-5.60 (d, 2H), 5.14-5.12 (d, 2H), 4.81 (s, 4H), 2.22 (br s, 6H), 2.18 (m, 12H)

Preparation Example 4. Synthesis of Compound D

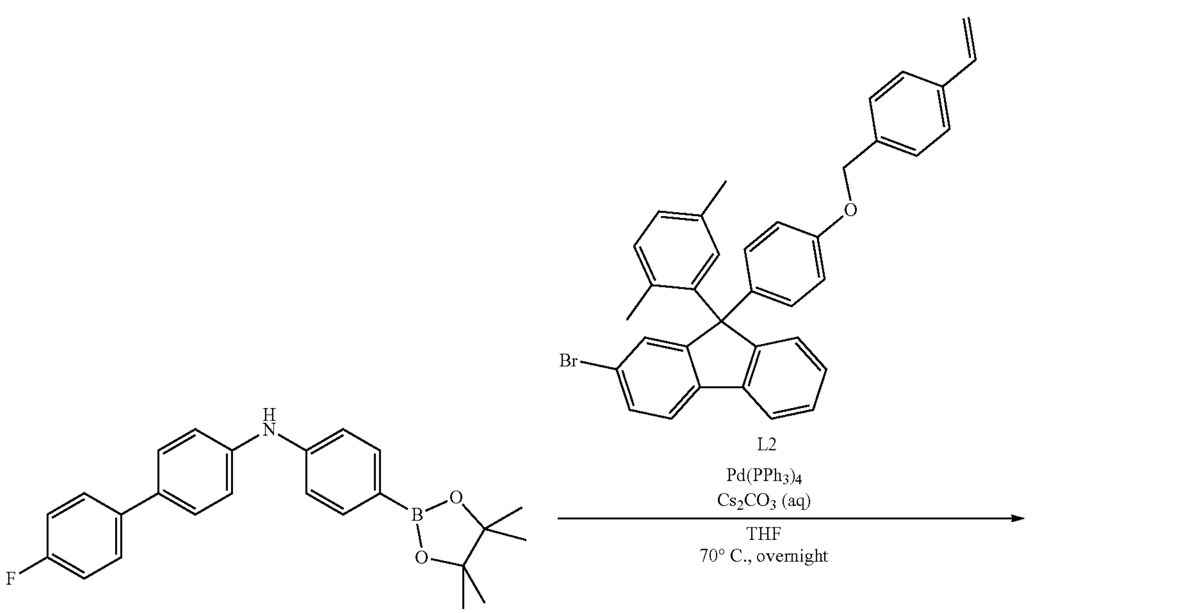

D-Int-1

-continued

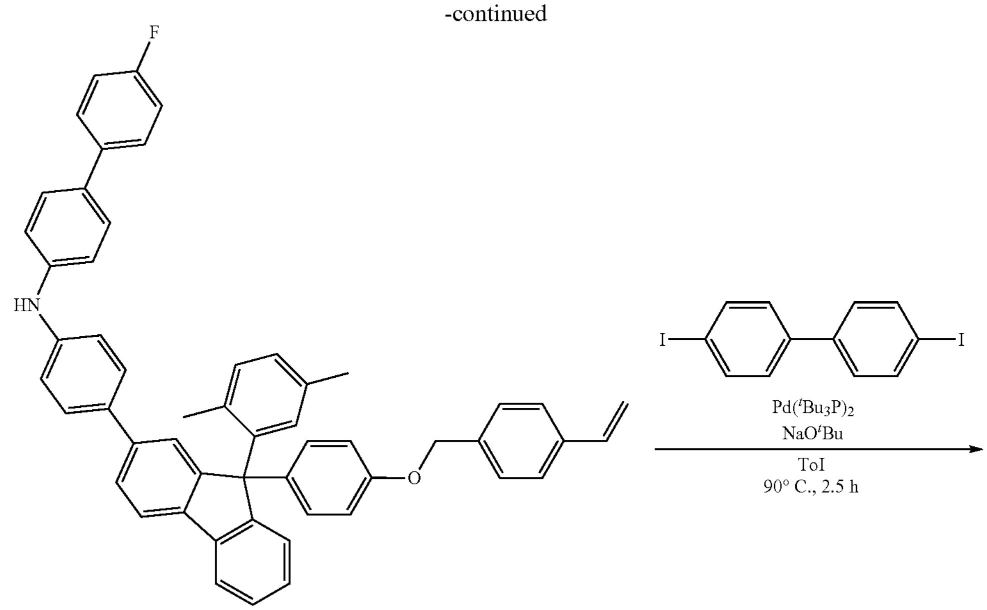

D-Int-2

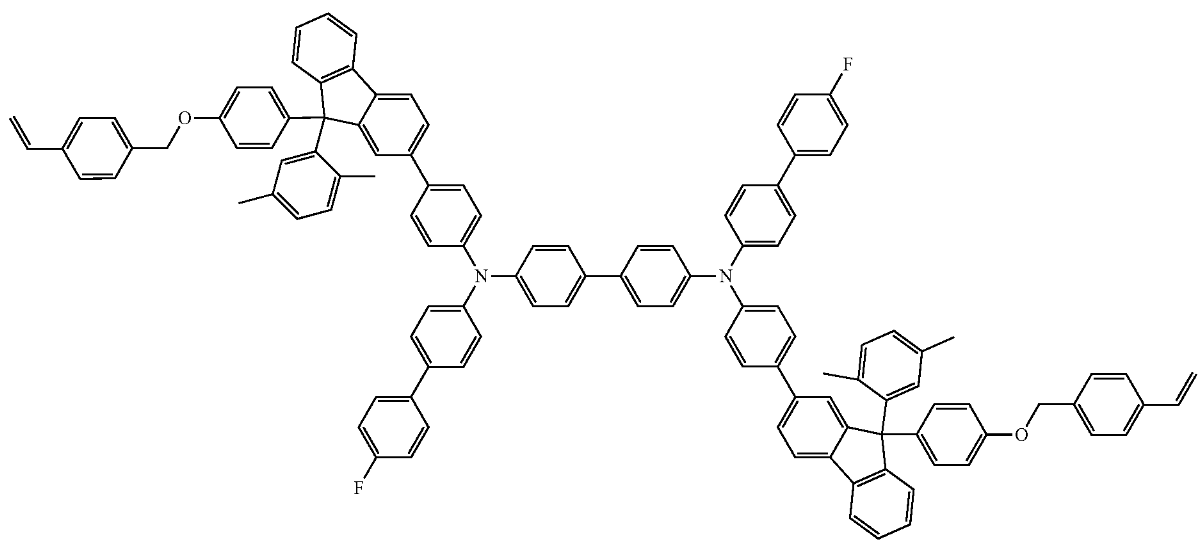

D

Synthesis of D-Int-2: D-Int-1 (4.00 g, 10.3 mmol) and L2 (11.7 g, 21.1 mmol) were put into a round bottom flask (RBF), and then tetrahydrofuran (THF) (100 mL) was introduced therein. $Cs_2CO_3$ (10.0 g, 30.8 mmol) and $Pd(PPh_3)_4$ (0.831 g, 0.719 mmol) dissolved in 25 mL of water were introduced therein in this order, and then the resulting mixture was stirred at 70° C. overnight. Water was added thereto, and an organic layer was extracted with dichloromethane (DCM), and then dried over $MgSO_4$, and column purified with dichloromethane/hexane to obtain Compound D-Int-2 (5.32 g).

Synthesis of D: diiodobiphenyl (1.20 g, 2.96 mmol), D-Int-2 (4.59 g, 6.21 mmol), and NaOtBu (0.852 g, 8.87 mmol) were put into a round bottom flask (RBF), and then toluene (60 mL) was introduced therein. After the resulting mixture was warmed to 90° C., $Pd(^tBu_3P)_2$ (0.106 g, 0.207 mmol) was introduced therein, and the resulting mixture was stirred for 2.5 hours. Water was added thereto, and an organic layer was extracted with dichloromethane (DCM), and then dried over $MgSO_4$, and column purified with dichloromethane/hexane to obtain high-purity Compound D (2.41 g). $[M+H]^+=1630$ $^1H$ NMR: δ 7.74-7.72 (m, 2H), 7.65-7.63 (m, 2H), 7.40-7.32 (m, 12H), 7.30-7.28 (m, 16H), 7.26-7.23 (m, 6H), 7.20 (m, 2H), 7.15-7.05 (m, 18H), 6.98-6.92 (m, 6H), 6.87-6.84 (m, 4H), 6.66-6.60 (dd, 2H), 5.65-5.61 (d, 2H), 5.15-5.12 (d, 2H), 4.80 (s, 4H), 2.17 (m, 12H)

Preparation Examples 1 to 4 exemplify the method for synthesizing the compound of Chemical Formula 1, and the compound of Chemical Formula 1 may be synthesized by adjusting the type, binding position, and number of substituents.

Preparation Examples of Ionic Compound

Preparation Example 1. Preparation of Compound 3-1

Step 1) Preparation of Compound 3-1'

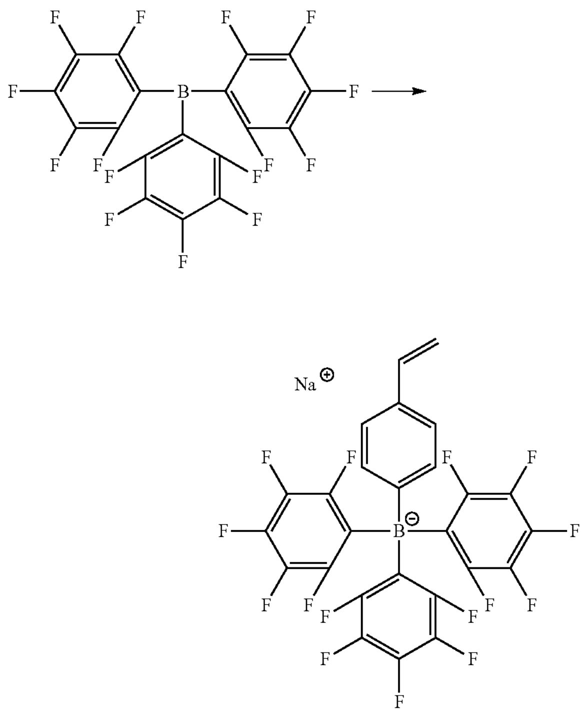

3-1'

Mg (193 mg, 7.92 mmol), $I_2$ (4 mg), and THF (10 mL) were put into a 100-mL round bottom flask under a nitrogen atmosphere, and stirred for 30 minutes. 4-bromostyrene (1.04 mL, 7.92 mmol) was put thereinto, a water bath at 30° C. was placed under the round bottom flask, and the resulting mixture was stirred overnight. It was confirmed that the reaction solution had become black and Mg had been dissolved therein. The reaction solution was diluted by adding ether (5 mL) thereto. Tris(pentafluorophenyl)borane (1 g, 3.96 mmol) was dissolved in ether (5 mL), and the resulting solution was slowly added to the reaction solution for 30 minutes. The solution was stirred overnight. $Na_2CO_3$ (0.1 M, 80 mL, 8.0 mmol) was slowly added to the reaction solution. The organic solvent was extracted by using ethyl acetate (20 mL×3), and the remaining water was removed over $MgSO_4$. Additionally, distillation was conducted with benzene by using a Dean-stock in order to remove the remaining water and impurities. When about 10 mL of the solvent remained, the solution was cooled and filtered to prepare Compound 3-1' (1.6 g, yield 64%).

Step 2) Preparation of Compound 3-1

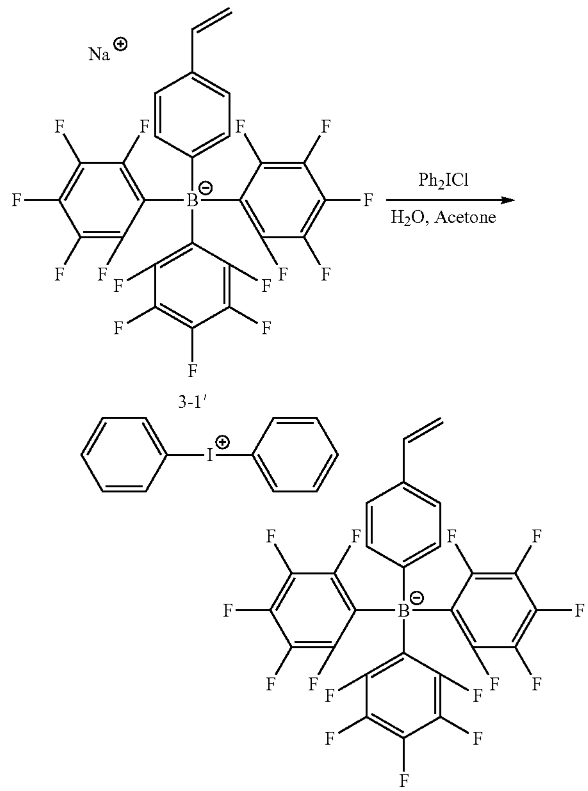

3-1

Compound 3-1' (100 mg, 0.16 mmol), distilled water (10 mL) and $Ph_2ICl$ (60 mg, 0.19 mmol) were put into a 25-mL round bottom flask and stirred for 1 hour. A precipitate was produced by adding acetone (15 mL) to the reaction solution, and the precipitate was filtered and dried to prepare Compound 3-1 (140 mg, yield 100%).

MS: $[M-H]^-$=615 (negative mode)

MS: $[M+H]^+$=281 (positive mode)

Preparation Example 2. Preparation of Compound 3-2

Step 1) Preparation of Compound 3-2'

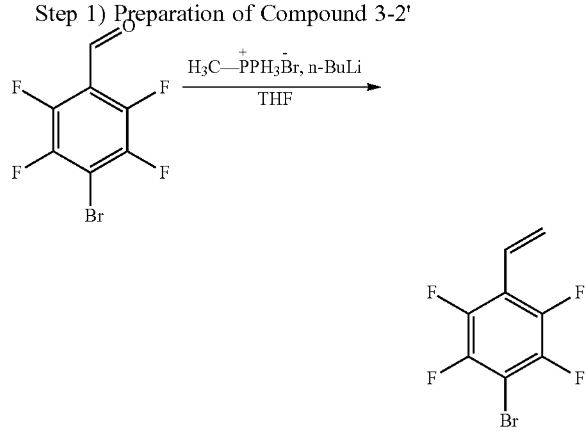

3-2'

Methyltriphenyl potassium bromide (13.90 g, 38.91 mmol) and THF (100 mL) were put into a 250-mL round bottom flask, and the resulting mixture was stirred at 0° C. for 30 minutes. n-BuLi (15.6 mL, 38.91 mmol, 2.5 M in Hexane) was slowly added to the reaction solution, and the resulting mixture was stirred at 0° C. for 30 minutes. 4-formyl-2,3,5,6-tetrafluoro-1-bromobenzene (5.0 g, 19.47 mmol, in 30 mL THF) was slowly added to the reaction solution at 0° C. The reaction solution was stirred while slowly increasing the temperature to room temperature. Ether (100 mL) and a $NH_4Cl$ saturated solution (400 mL) were added to the reaction solution after 3 hours. The organic solvent was extracted by using ether (200 mL×2), and the remaining water was removed over $MgSO_4$. The residue was columned with ethyl acetate:hexane=1:9 (v:v) to prepare Compound 3-2' (1.29 g, yield 26%).

Step 2) Preparation of Compound 3-2"

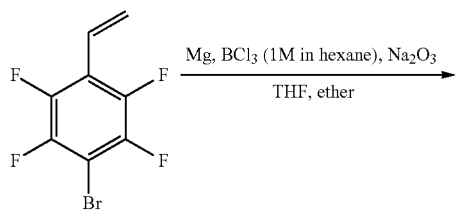

3-2′

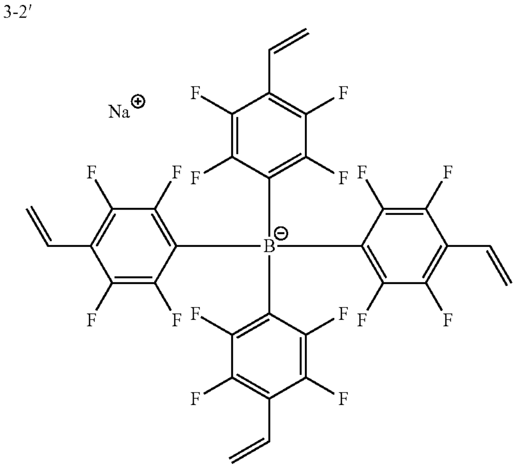

3-2″

Mg (95 mg, 3.92 mmol), THF (10 mL), and 12 (4 mg) were put into a 25-mL round bottom flask and stirred. Compound 3-2' (1.0 g, 3.92 mmol) was put into the reaction solution, and the resulting mixture was stirred at room temperature. After 10 hours, it was confirmed that Mg had been completely dissolved therein as black, and ether (10 mL) and $BCl_3$ (1.3 mL, 1.3 mmol, 1 M in hexane solution) were added thereto over 30 minutes. After the reaction solution was stirred overnight, $Na_2CO_3$ (30 mL, 3.0 mmol, 0.1 M in $H_2O$) was added thereto. After the synthetic material was extracted with ethyl acetate (10 mL×3), the remaining water was removed over $MgSO_4$. After the solvent was thoroughly removed, water was completely removed by means of a Dean-stock using benzene, and the solid was filtered to prepare Compound 3-2" (340 mg, yield 28%).

Step 3) Preparation of Compound 3-2

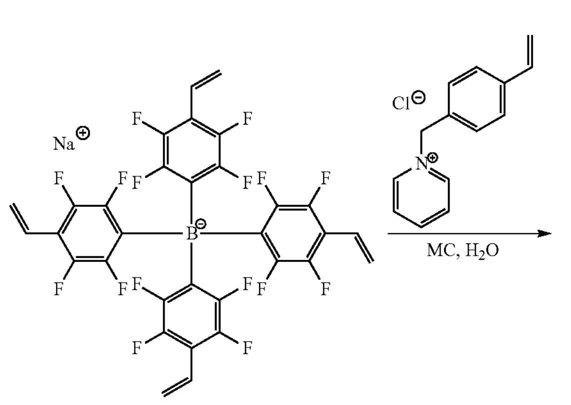

3-2″

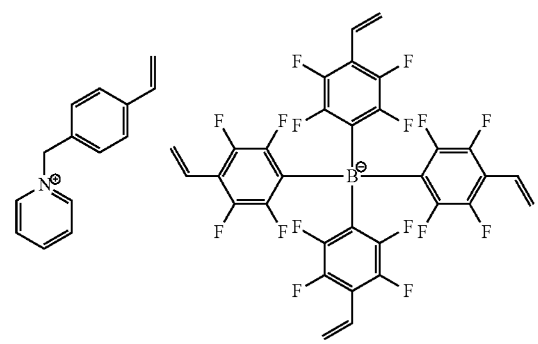

3-2

3-2

Compound 3-2" (200 mg, 0.27 mmol), 1-(4-vinylbenzyl) pyridin-1-ium chloride (69 mg, 0.30 mmol), $H_2O$ (10 mL), and methylene chloride (10 mL) were put into a 25-mL round bottom flask and stirred vigorously for 30 minutes. The organic solvent was extracted by using ether (10 mL×3), and the remaining water was removed over $MgSO_4$. The solvent was removed, and the residue was dried under vacuum to prepare Compound 3-2 (247 mg, yield 100%).

MS: $[M-H]^-$=711 (negative mode)

MS: $[M+H]^+$=196 (positive mode)

Preparation Example 3. Preparation of Compound 3-3

Step 1) Preparation of Compound 3-3'

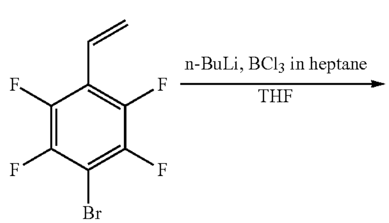

-continued

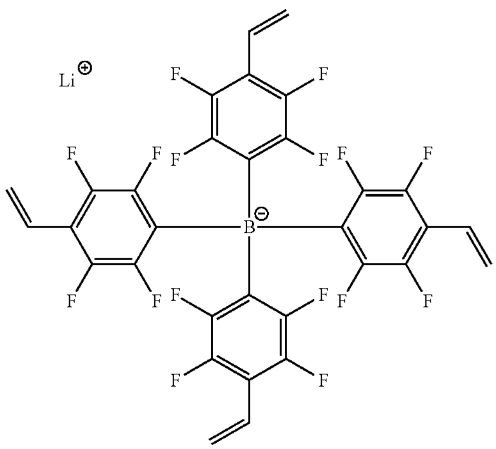

3-3'

1-bromo-2,3,5,6-tetrafluoro-4-(1,2,2-trifluorovinyl)benzene (2 g, 7.84 mmol) was put into THF (20 mL) in a 50-mL round bottom flask, and the resulting solution was stirred at −78° C. for 30 minutes. n-BuLi in hexane (3.45 mL, 8.63 mmol, 2.5 M) was slowly added to the solution, and the resulting mixture was stirred at −78° C. for 30 minutes. $BCl_3$ (2.6 mL, 2.61 mmol, 1 M in hexane solution) was added to the reaction solution at −78° C. for 15 minutes. The resulting solution was slowly warmed to room temperature, the reaction solution was stirred overnight, and then water (30 mL) was added thereto. After the synthetic material was extracted with ethyl acetate (10 mL×3), the solvent was thoroughly removed. Water was completely removed by means of a Dean-stock using benzene, and the solid was filtered to prepare Compound 3-3' (800 mg, yield 43%).

Step 2) Preparation of Compound 3-3

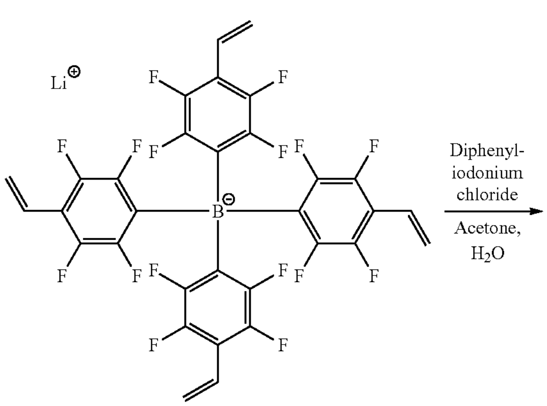

3-3'

-continued

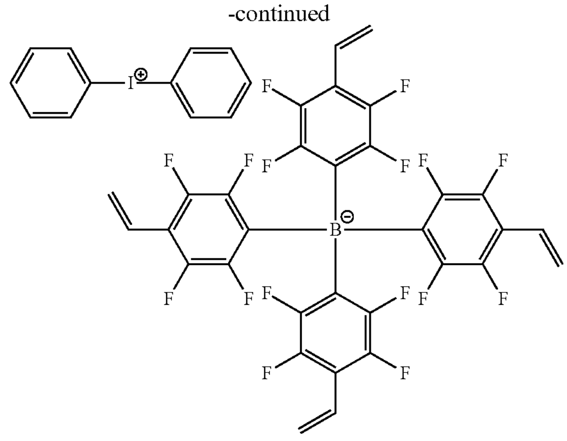

3-3

Compound 3-3' (400 mg, 0.56 mmol), diphenyliodonium chloride (176 mg, 0.56 mmol), water (10 mL), and acetone (10 mL) were put into a 25-mL round bottom flask and stirred vigorously for 30 minutes. Extraction was performed with dichloromethane (10 mL×3) to remove the solvent, and the residue was dried to prepare Compound 3-3 (552 mg, 100% yield).

The NMR spectrum of Compound 3-3 are illustrated in FIG. 2. The Mass spectrum of Compound 3-3 are illustrated in FIG. 3.

MS: $[M-H]^-=711$ (negative mode)

MS: $[M+H]^+=281$ (positive mode)

Preparation Example 4. Preparation of Compound 3-4

Step 1) Preparation of Compound 3-4'

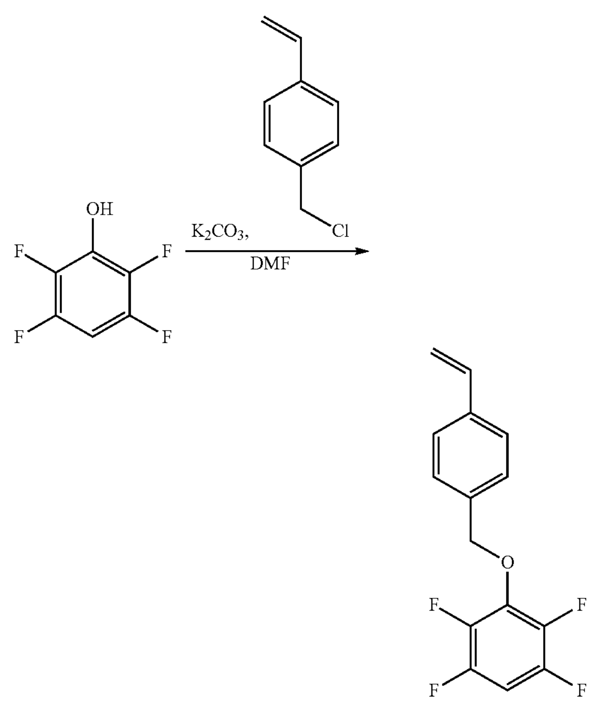

3-4'

Potassium carbonate (10.4 g, 75.3 mmol) was put into a 500-mL round bottom flask, and dimethylformamide (DMF) (200 ml) was added thereto. 2,3,5,6-tetrafluorophenol (10.0 g, 60.22 mmol) was added to the flask, and the resulting mixture was stirred at 60° C. for 30 minutes. 4-vinylbenzyl chloride (7.66 g, 50.18 mmol) was slowly added to the reaction solution, and the resulting mixture was stirred at 60° C. for 16 hours. Then, water (300 mL) and ethyl acetate (200 ml) were added thereto. The organic layer was extracted by using ethyl acetate (200 mL×2), and the remaining water was removed over $MgSO_4$. The residue was columned with ethyl acetate:hexane=1:9 (v:v) to prepare Compound 3-4' (11.2 g, yield 79%).

Step 2) Preparation of Compound 3-4"

Compound 3-4' (10 g, 35.43 mmol) was put into a 250-mL round bottom flask, ether (130 ml) was added thereto, and the resulting mixture was stirred. The reaction solution was cooled at −78° C. and stirred for 30 minutes. n-BuLi (17 ml, 42.52 mmol, 2.5 M in Hexane) was slowly injected thereinto over 30 minutes. The, the resulting mixture was stirred for 1 hour. $BCl_3$ (8.15 ml, 8.15 mmol, 1 M in Hexane) was slowly introduced thereinto over 30 minutes. The reaction solution was slowly warmed to room temperature. After the reaction solution was stirred overnight, water (200 mL) was added thereto. After the synthetic material was extracted with ether (100 mL×3), the solvent was thoroughly removed. Then, water was completely removed by means of a Dean-stock using benzene, and the solid was filtered to prepare Compound 3-4" (6.2 g, yield 66%).

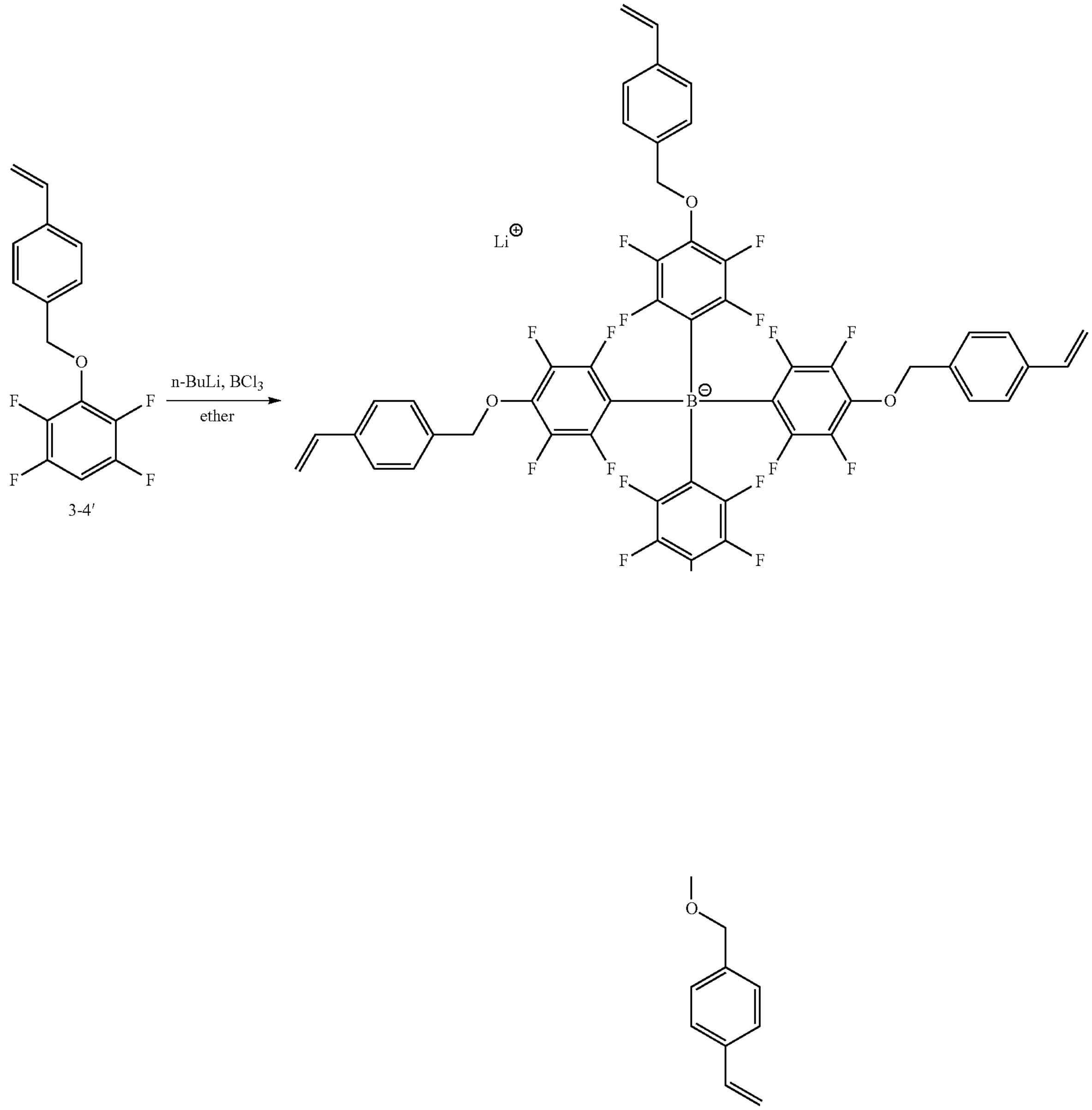

3-4′

3-4″

Step 3) Preparation of Compound 3-4
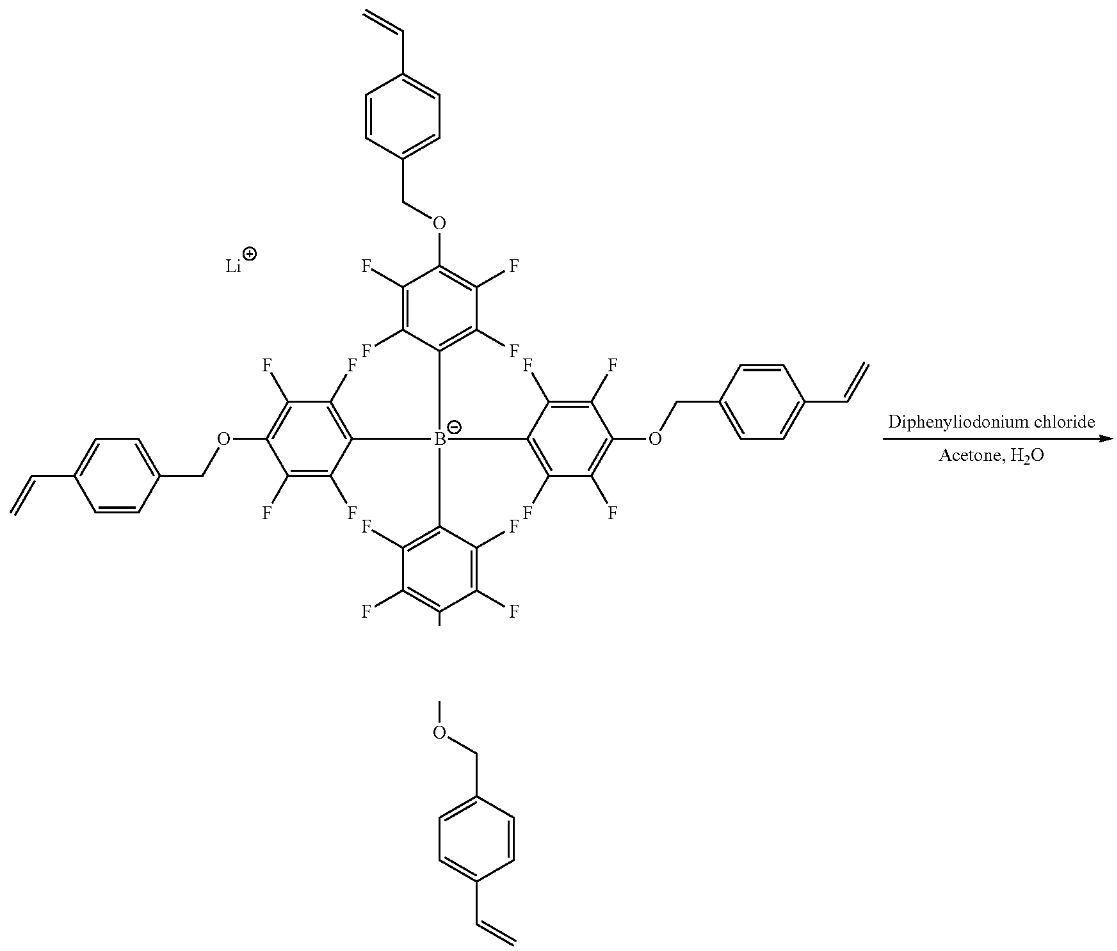
3-4″
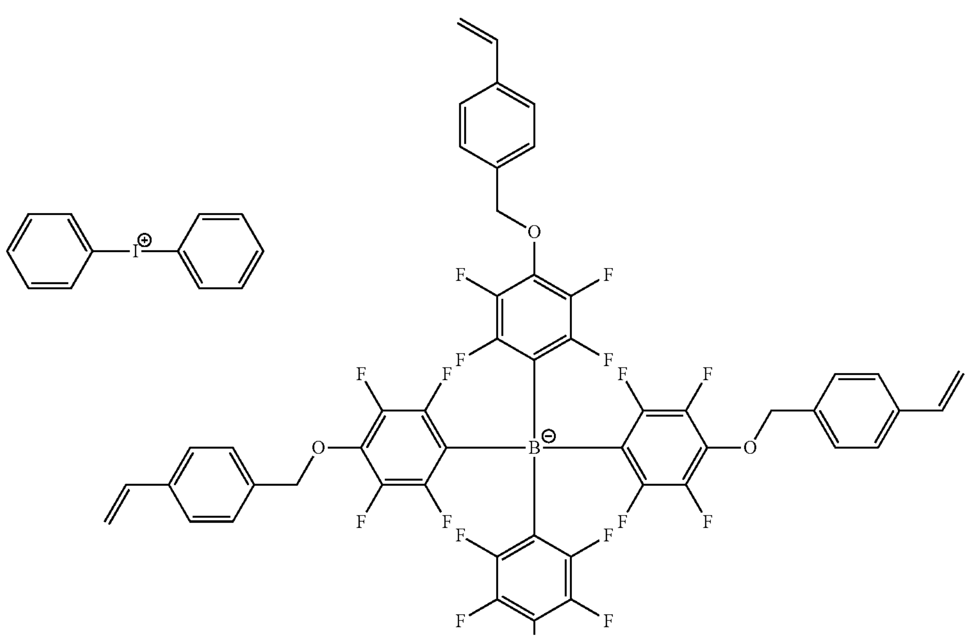

-continued

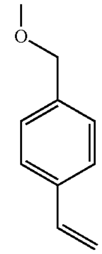

3-4

Compound 3-4" (6.2 g, 5.42 mmol), diphenyliodonium chloride (2.57 g, 8.13 mmol), water (50 mL), and acetone (10 mL) were put into a 25-mL round bottom flask and stirred vigorously for 30 minutes. An organic solvent was extracted by using methylene chloride (20 mL×3), and the solvent was removed. The residue was columned with methylene chloride:acetone=9:1 (v:v) to prepare Compound 3-4 (5.0 g, yield 65%).

MS: $[M-H]^-$=1135 (negative mode)

MS: $[M+H]^+$=281 (positive mode)

Preparation Examples 1 to 4 exemplify the method for synthesizing the ionic compound including the anionic group of Chemical Formula 3, and the ionic compound may be synthesized by adjusting the type, binding position, and number of substituents.

Preparation Examples of Copolymer of Chemical Formula 2

Preparation Example 1. Copolymer Type 5 (a1:b1:e1=58:12:30)

Step 1) Preparation of Intermediate A

Intermediate A

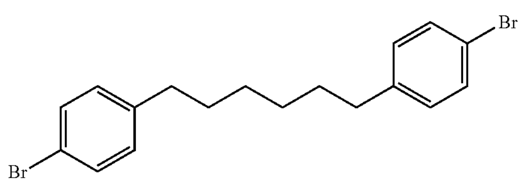

1,4-dibromobenzene (55.84 g, 236.71 mmol) and anhydrous THF (400 mL) were added to an oven-dried 1-L three-neck round bottom flask under nitrogen. Once all starting materials were dissolved, the solution was cooled to −67° C. (internal temperature). A slight precipitate of dibromobenzene was observed. Once the solution was cooled, n-butyllithium (15.16 g, 236.71 mmol) was added via cannula transfer, the solution was allowed to stir at −67° C. for 15 minutes, and careful observation of stirring was required due to lithium salt precipitate. 1,6-diiodohexane (40.00 g, 118.35 mmol) was added thereto and the bath was allowed to slowly warm to room temperature resulting in a clear solution. The solution was allowed to stir at room temperature for 16 hours. The solution was slowly quenched with 1 N HCl (200 mL). A slight exotherm was observed. The layers were separated, and the organic layer was dried over $NaSO_4$ and concentrated via rotary evaporation. Distillation of low molecular weight impurities was achieved by warming the water bath to 55° C. The remaining product (crude) was purified by using flash chromatography (silica, 100% hexane isocratic solvent). A second purification was performed by using flash chromatography (C18, 10% $H_2O$:90% ACN isocratic solvent). A product was precipitated by removing ACN, and was collected by filtration. Intermediate A was obtained as an white solid at 19% yield (8.871 g).

Step 2) Preparation of Intermediate XL1

XL1

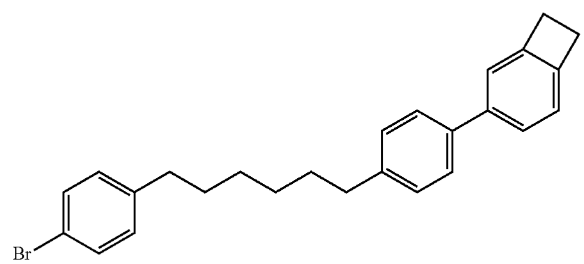

Intermediate A (8.871 g, 22.39 mmol), benzocyclobutene-4-boronic acid (3.313 g, 22.39 mmol), sodium carbonate (7.12 g, 67.17 mmol), and 1:1 m-xylene:water (80 mL) were added to an oven-dried 500-mL three-neck flask under nitrogen. The solution was degassed. Tetrakis(triphenylphosphine)Pd(0) (7.12 g, 67.17 mmol) was added to the solution. The produced mixture was heated to 100° C. for 4 hours. Toluene (100 mL) and water (50 mL) were added to the reaction mixture. The layers were separated, and the organic layer was dried over $NaSO_4$ and filtered through a pad of celite, florisil and silica gel. The crude material was concentrated to give a yellow oil. The yellow oil was purified by using flash chromatography (silica, hexane:DCM 0 to 10%). The pure fractions were concentrated to give a white solid. The resulting material was dissolved in 400 mL of acetonitrile. 50 mL of water was added thereto. The ACN was removed by rotary evaporation resulting in precipitation of the product which was filtered and collected as a white solid (2.854 g, 30% yield).

Step 3) Preparation of Monomer M1
Compound M1
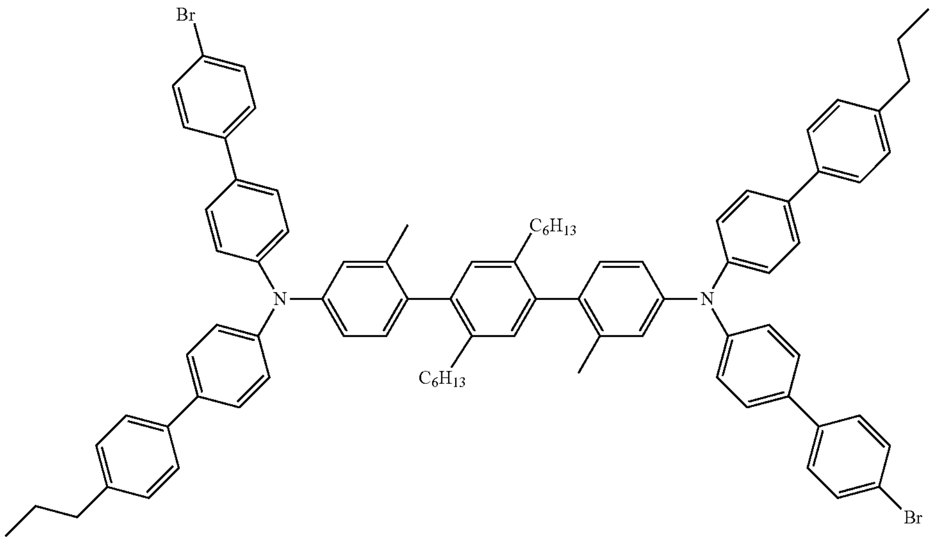
The synthesis of M1 and other monomers has been described in International Publication No. WO 2011/159872. The synthesis can be performed according to the following scheme.
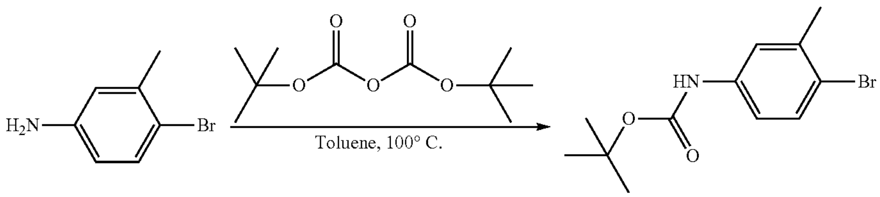
1
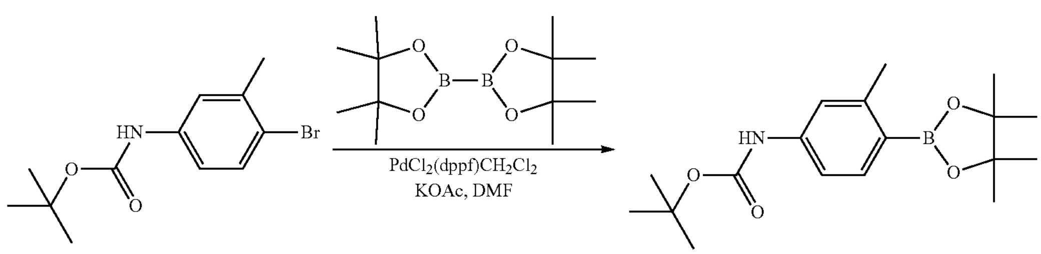
1 3
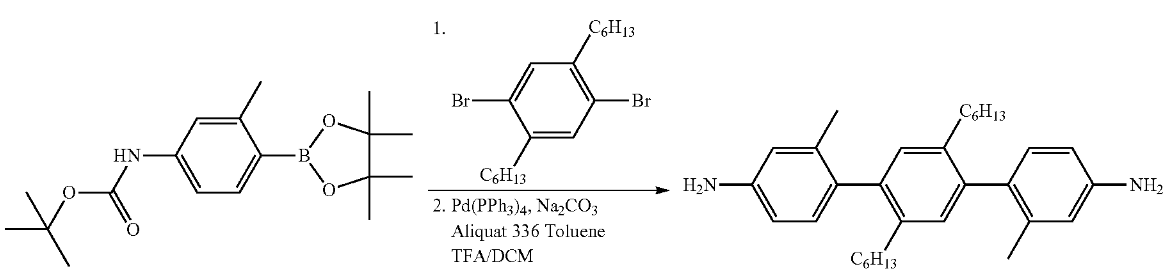
3 7

-continued
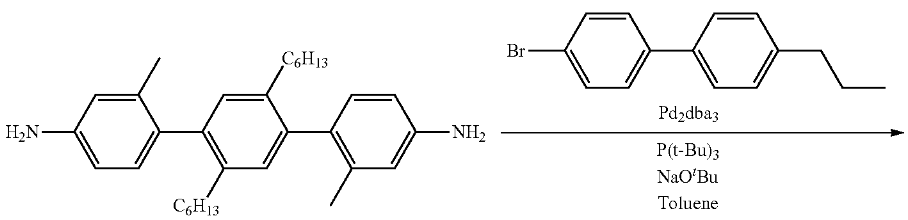
7
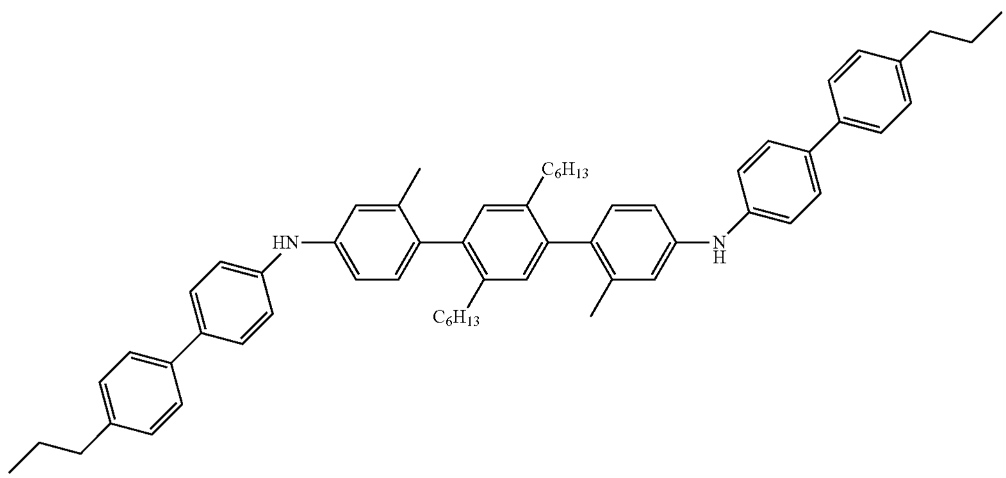
10
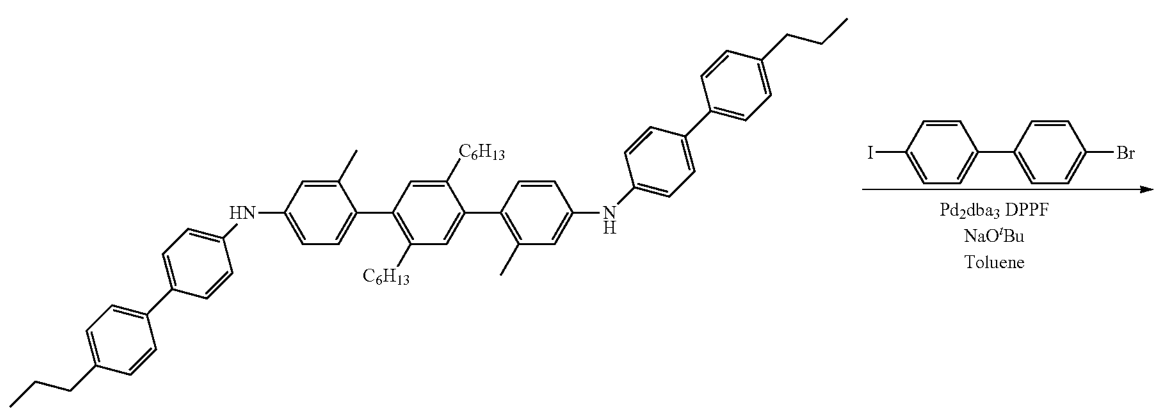
10

-continued
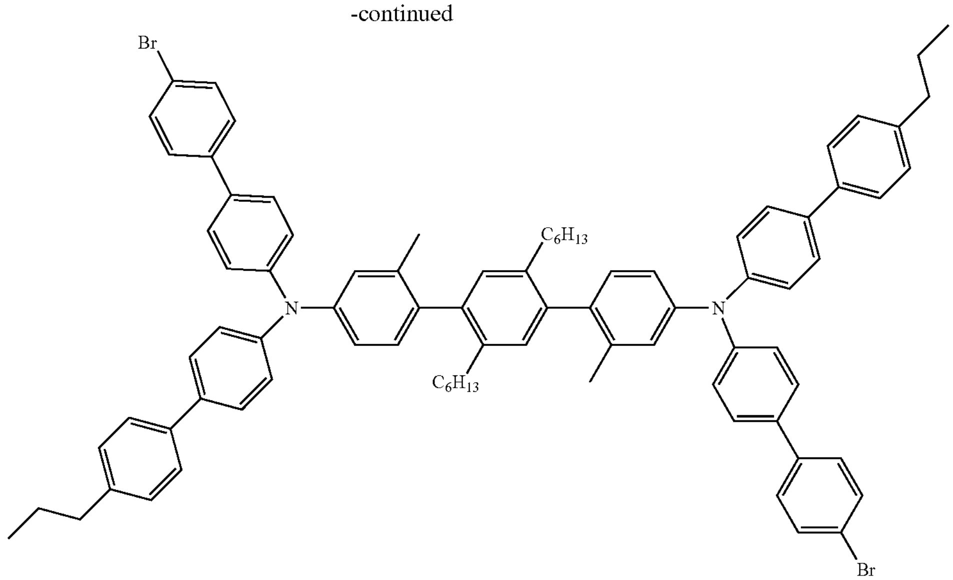
Compound M1
Step 4) Preparation of Copolymer Type 5 (a1:b1:e1=58:12:30)

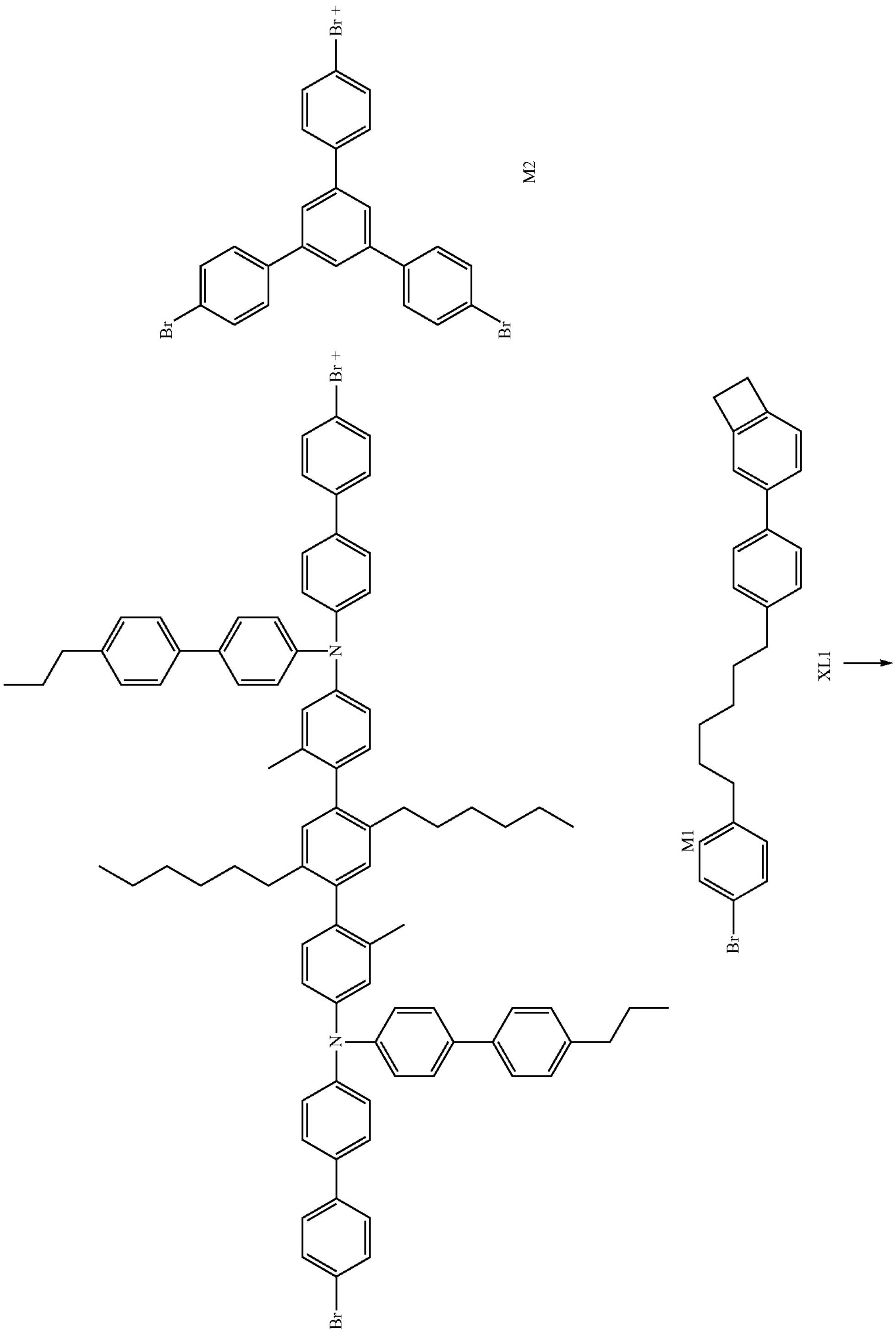
Br +
M2
Br
Br
Br +
N
N
Br
M1
Br
XL1

-continued
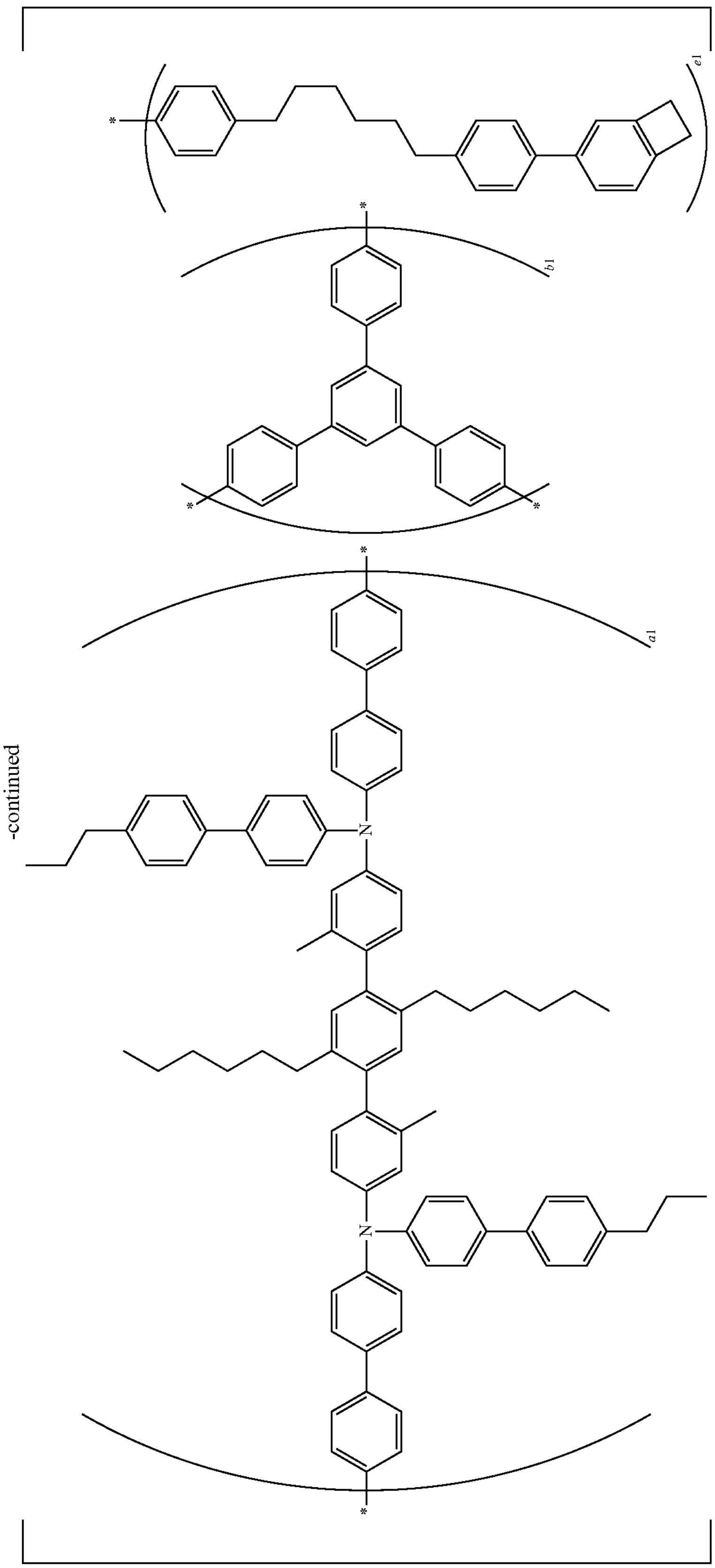

Compound M1 (0.765 mmol), M2 (0.158 mmol), and XL1 (0.396 mmol) were added to a scintillation vial and dissolved in 11 mL toluene. A clean, dry 50 mL Schlenk tube was charged with bis(1,5-cyclooctadiene)nickel(0) (2.42 mmol). 2,2'-dipyridyl (2.42 mmol) and 1,5-cyclooctadiene (2.42 mmol) were weighed into a scintillation vial and dissolved in 5.5 mL of N,N'-dimethylformamide and 11 mL of toluene. The solution was added to the Schlenk tube, which was then inserted into an aluminum block and heated to an internal temperature of 50° C. The catalyst system was held at 50° C. for 30 minutes. The monomer solution in toluene was added to the Schlenk tube, and the tube was sealed.

The polymerization mixture was stirred at 50° C. for 180 minutes. Subsequently, the Schlenk tube was removed from the block and allowed to cool to room temperature. The contents were poured into HCl/methanol (5% v/v, conc. HCl). After stirring for 45 minutes, the polymer was collected by vacuum filtration and dried under high vacuum. The polymer was dissolved in toluene (1% wt/v) and passed through a column containing aluminum oxide, basic (6 gram) layered onto silica gel (6 gram). The polymer/toluene filtrate was concentrated (2.5% wt/v toluene) and triturated with 3-pentanone. The toluene/3-pentanone solution was decanted from the semi-solid polymer, which was then dissolved with 15 mL of toluene before being poured into stirring methanol to yield Copolymer Type 5 (a1:b1:e1=58:12:30) at 60% yield. (Mw: 32,000)

Other Copolymer Types may be prepared in a similar manner using the method described above for preparing Copolymer Type 5 (a1:b1:e1=58:12:30).

The copolymers were characterized by gel permeation chromatography ("GPC") using a multi angle light scattering detector as a detector and an in-line viscometer and using THF as a solvent.

Preparation Example 2. Copolymer Type 17 (a1:b1:e1=47:21:32)

Copolymer Type 17 is prepared by Suzuki coupling as illustrated in the following scheme. In the Suzuki approach, the end capping monomer is charged last after the monomers for units A and B' have been converted to a polymer. This is performed in order to consume all remaining functionalities that remain on the polymer.

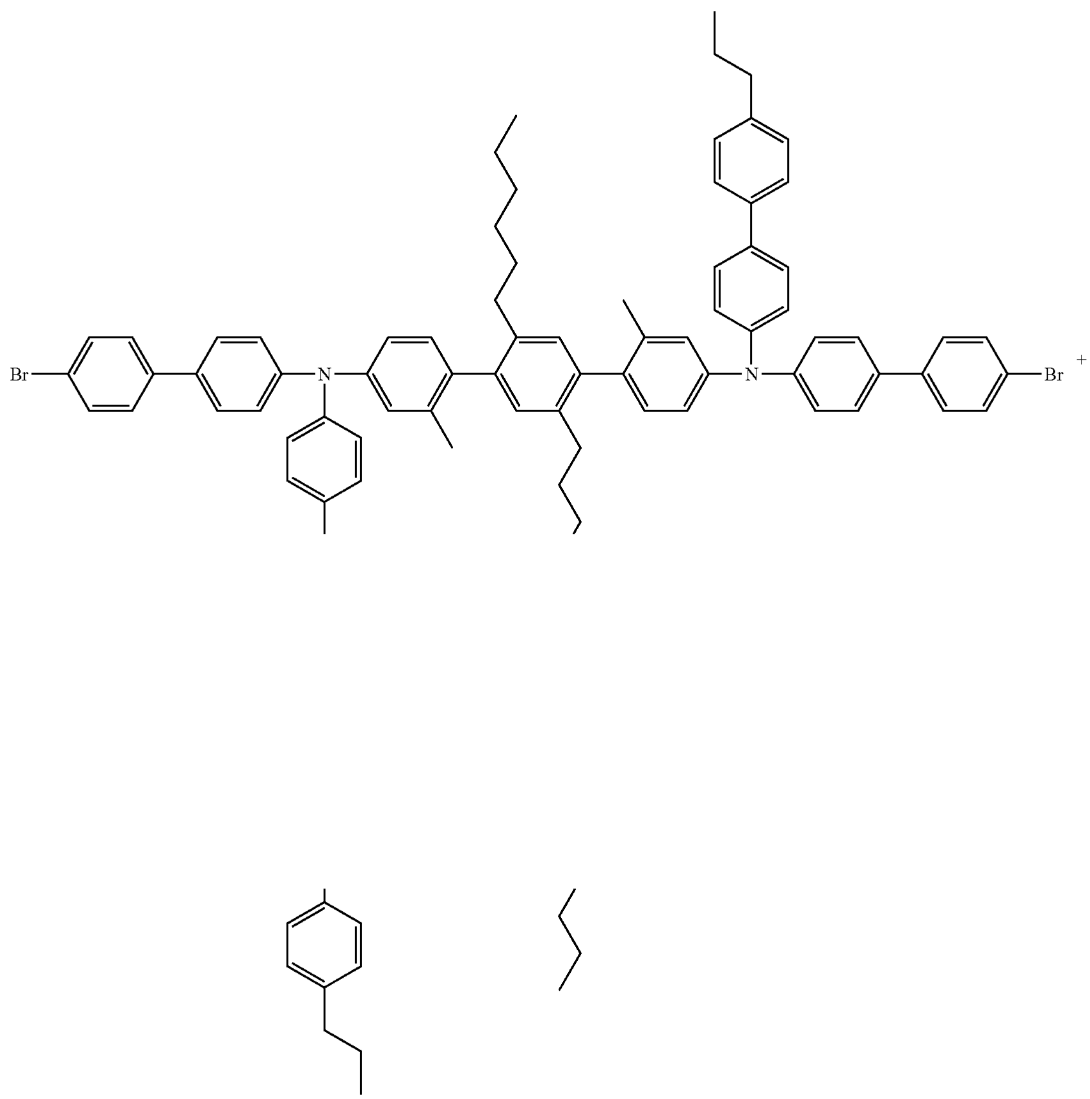

M1

-continued

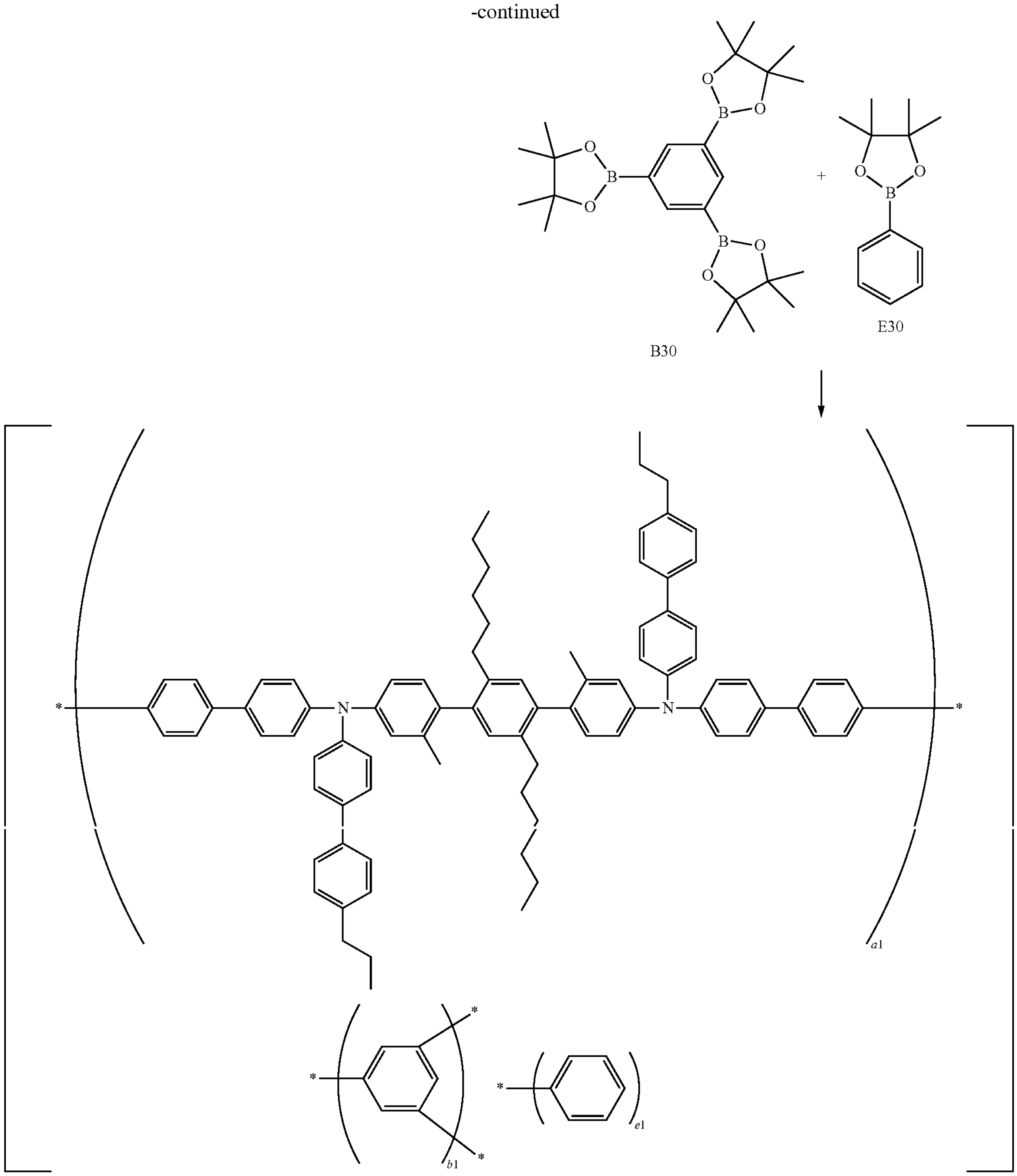

Under inert gas conditions, Compound M1 (0.207 mmol), Compound B30 (0.092 mmol), Aliquat 336 (0.041 mmol), 1.24 mL of an aqueous potassium carbonate solution (0.5M), 0.1 mmol bis(di-tert-butyl(4-dimethylaminophenyl)phosphine)dichloropalladium(II) and a total of 6.0 mL of toluene were added to a scintillation vial equipped with a magnetic stirring bar. The vial was sealed with a screw-cap with septum, inserted into an aluminum block and heated to an external temperature of 105° C. over a period of 30 minutes and stirred at that temperature under gentle reflux for 5 hours. The reactant was then charged with 0.05 μmol bis(di-tert-butyl(4-dimethylaminophenyl)phosphine)dichloropalladium(II), phenylboronic acid pinacol ester E30 (0.138 mmol), and 0.9 ml of toluene. The reactant was heated again at the above specified temperature for 1.5 hours. Next, iodobenzene (0.092 mmol) and 0.6 mL of toluene were added thereto. The reactant was heated fir an additional 1.5 hours and then cooled to room temperature. The aqueous layer was removed and the organic layer was washed twice with each of 20 mL of DI water. The toluene layer was dried by being allowed to pass through 10 g of silica gel as a desiccant and the silica was rinsed with toluene. The solvent was removed to obtain 250 mg of a product. The crude product was further purified by passing a toluene solution through alumina, silica gel, and Florisil®. After concentration, the solvent-wet product was diluted with toluene to about 14 mL and then added to 150 mL of ethyl acetate to obtain about 200 mg of a polymer. Re-precipitation of a product toluene solution into 3-pentanone yielded 145 mg of the final Copolymer Type 17 (a1:b1:e1=47:21:32). (Mw: 232,350)

Preparation Example 3. Copolymer Type 9 (a1:b1:e1=42:17:41)
Copolymer Type 9 is prepared by Suzuki coupling as illustrated in the following scheme.
Step 1) Preparation of Monomer M3
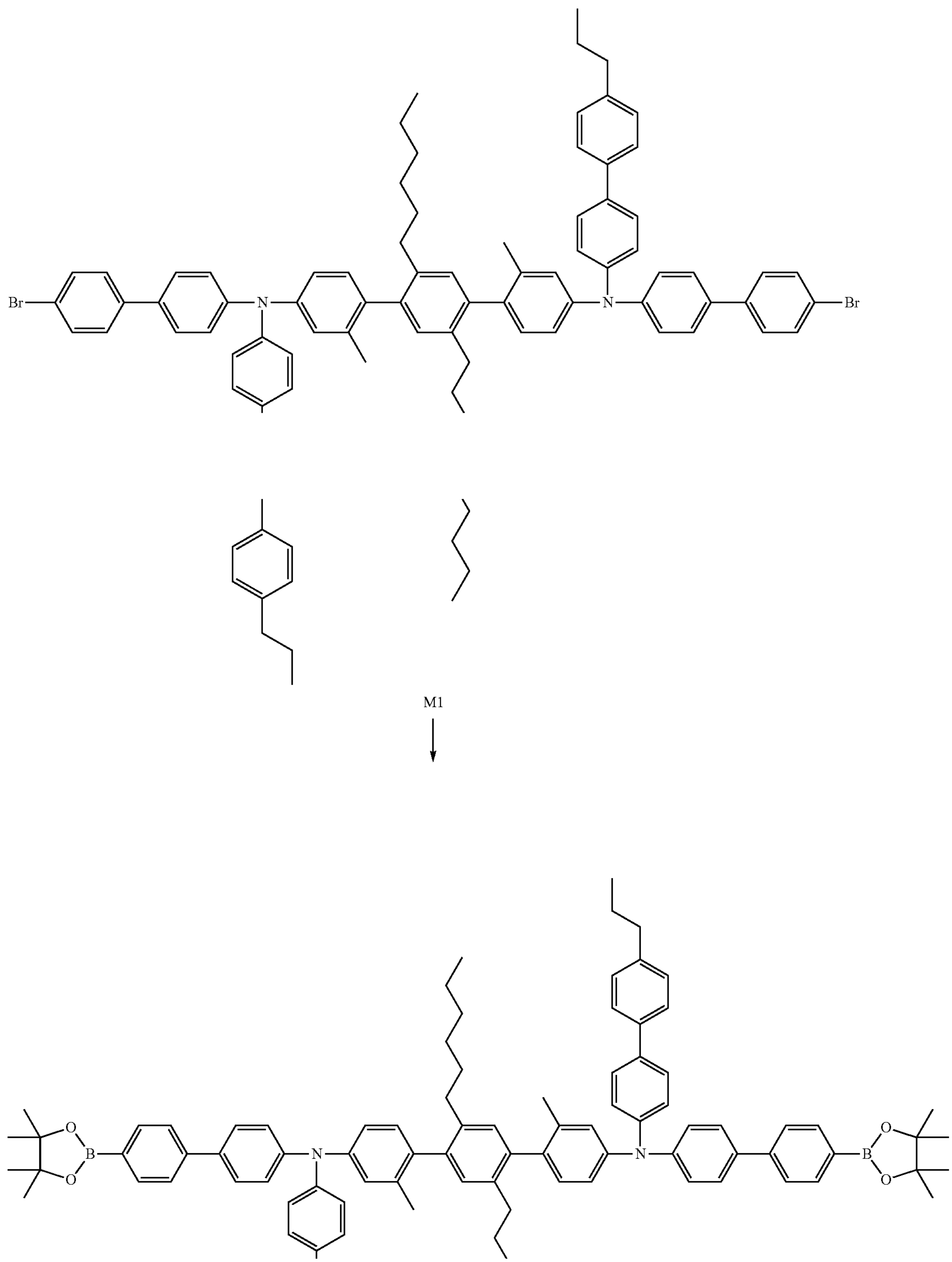

-continued

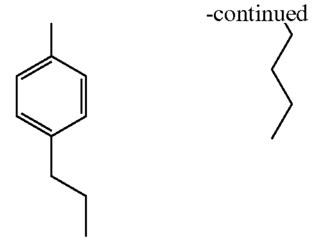

M3

27.81 g of Compound M1 (21.3 mmol), 16.2 g of bis(pinacolato)diboron (63.8 mmol), 8.35 g of potassium acetate (85.1 mmol), and 280 mL of 1,4-dioxane were charged to and inerted in a 1-L jacketed-reactor equipped with an overhead mechanical stirrer and a reflux condenser. Thereafter, 0.70 g of [1,1'-bis(diphenyl-phosphino)ferrocene] dichloropalladium(II) and a complex with dichloromethane were charged under an inert atmosphere and the reaction mixture was heated to an external temperature of about 97° C. over a period of 1 hour. After 10 hours of heating, the reaction was considered to be completed, and cooled to 25° C. The reaction mixture was passed through a bed of Celite, and then washed with 250 mL of dichloromethane/hexanes mixture (1:1 v/v). The solvent was removed and the residue was diluted with 50 mL of dichloromethane/hexanes (1:1, v/v), and addition of dichloromethane aided the loading of the crude mixture onto a column containing 150 g of silica gel previously embedded with boric acid. The collected product fractions were combined and the column purification was repeated by using 300 g of silica-gel embedded with boric acid. 19.1 g of a lightly colored monomer was obtained after the solvent was removed. Further purification was achieved by passing the monomer through a column packed with 190 g of florisil using dichloromethane/hexane. Finally, the monomer was dissolved in toluene/hexane and precipitated into methanol, and 15.4 g of solid monomer M3 was isolated at 52% yield.

Step 2) Preparation of Copolymer Type 9 (a1:b1:e1=42:17:41)

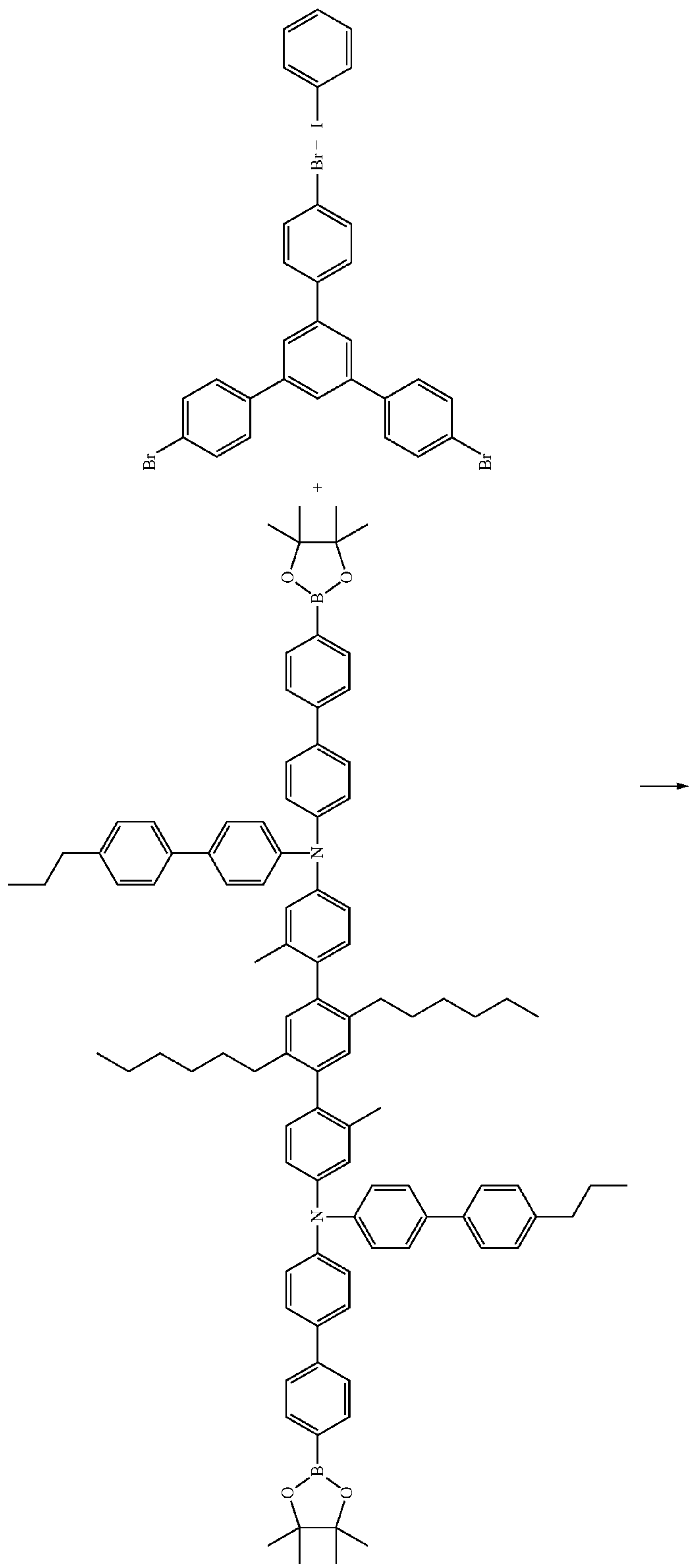

-continued
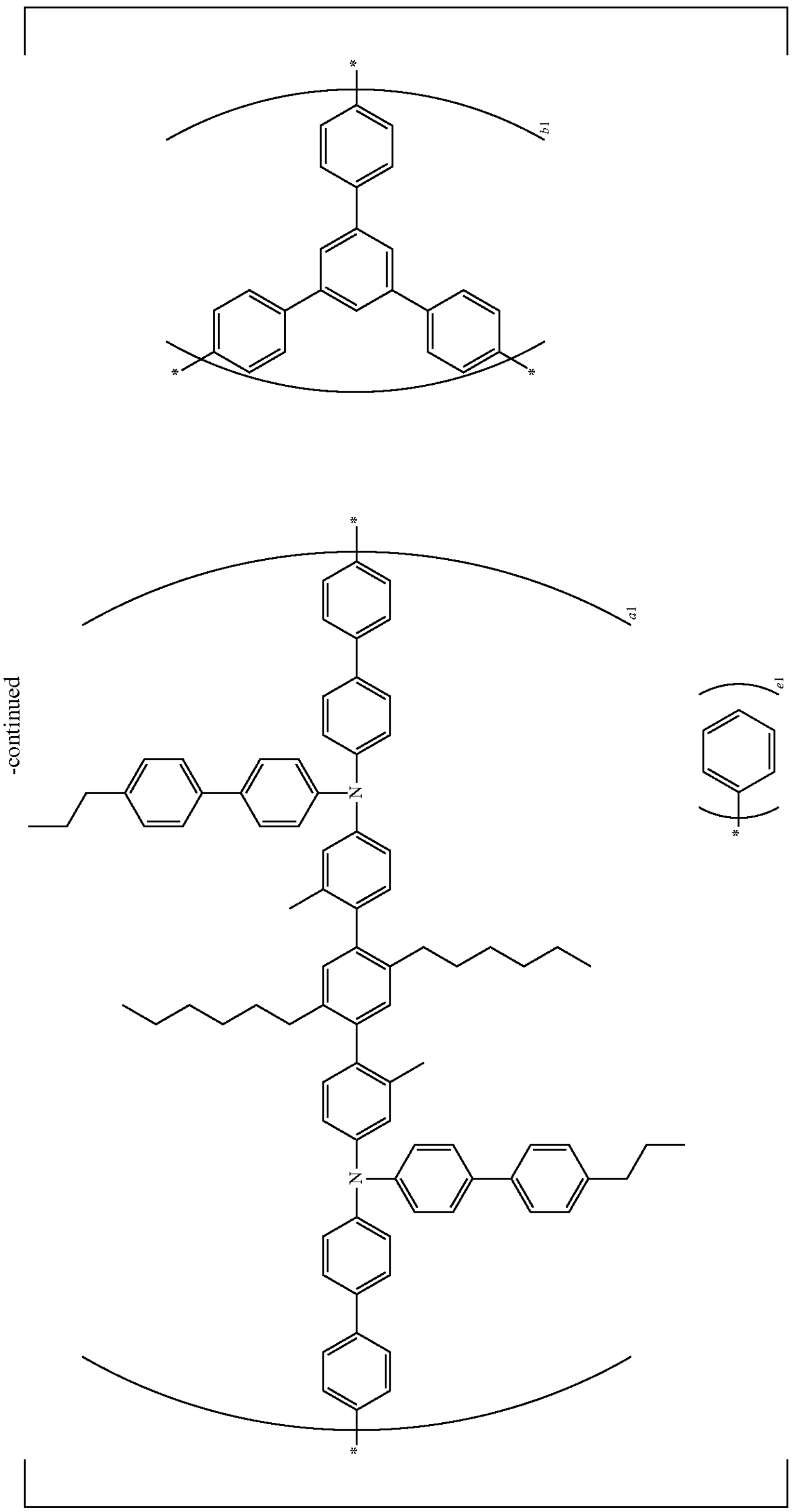

The synthesis was performed in a manner similar to Preparation Example 2. (Mw: 461,000)

In the devices of the following Examples, the copolymers shown in the following Table 1 were used.

TABLE 1

| Spherical copolymer | Copolymer Type | Molar ratio | Weight average molecular weight (Mw) |
|---|---|---|---|
| HTL1-1 | Copolymer Type 1 | 58:12:30 PM | 69,000 |
| HTL1-2 | Copolymer Type 1 | 38:12:50 PM | 13,000 |
| HTL2-1 | Copolymer Type 2 | 76:12:12 PM | 1,600,000 |
| HTL2-2 | Copolymer Type 2 | 68:12:20 PM | 150,000 |
| HTL3-1 | Copolymer Type 3 | 58:12:30 PM | 22,000 |
| HTL3-2 | Copolymer Type 3 | 76:12:12 PM | 53,000 |
| HTL4-1 | Copolymer Type 7 | 52:8:28 PM | 108,800 |
| HTL4-2 | Copolymer Type 7 | 54:8:26 PM | 130,700 |
| HTL5-1 | Copolymer Type 15 | 58:12:30 PM | 15,000 |
| HTL5-2 | Copolymer Type 15 | 52:8:28 PM | 14,000 |

EXPERIMENTAL EXAMPLES

Example 1

A glass substrate on which ITO was thin-film deposited to a thickness of 1500 Å was ultrasonically cleaned with an acetone solvent for 10 minutes. Then, the glass substrate was put into distilled water in which a detergent was dissolved, and washed with ultrasonic waves for 10 minutes, and then the glass substrate was repeatedly ultrasonically washed twice with distilled water for 10 minutes. After the glass substrate was washed with distilled water, the glass substrate was ultrasonically washed with a solvent of isopropyl alcohol for 10 minutes, and then dried. Thereafter, the substrate was transported to a glove box.

A 2 wt % cyclohexanone solution including Compound A and Compound 3-2 prepared in advance at a weight ratio of 8:2 was spin-coated on the ITO transparent electrode prepared as described above, and heat-treated at 230° C. for 30 minutes, thereby forming a hole injection layer having a thickness of 60 nm. A heat treatment was performed at 230° C. for 25 minutes by spin-coating a toluene solution including 0.8 wt % of the copolymer HTL1-1 prepared previously on the hole injection layer, thereby forming a hole transport layer having a thickness of 140 nm.

Then, after the glass substrate was transferred to a vacuum vapor deposition machine, the following HOST1 and the following DOPANT1 were vacuum-deposited on the hole transport layer at a weight ratio of 9:1, thereby forming a light emitting layer having a thickness of 30 nm. The following ETL was vacuum-deposited on the light emitting layer, thereby forming an electron injection and transport layer having a thickness of 40 nm. LiF and aluminum were sequentially deposited on the electron injection and transport layer to have a thickness of 0.5 nm and 100 nm, respectively, thereby forming a cathode.

HOST 1

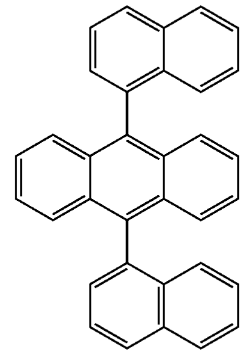

DOPANT 1

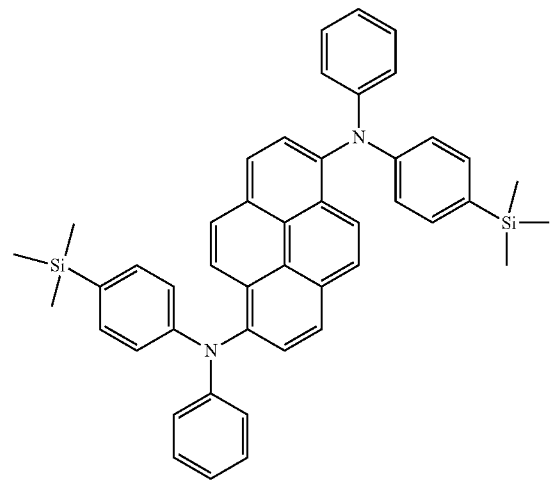

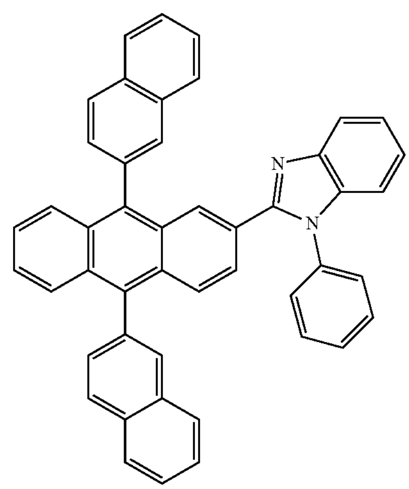

ETL

In the aforementioned procedure, the deposition rate of the organic material was maintained at 0.4 to 1.0 Å/sec, the deposition rates of LiF and aluminum of the cathode were maintained at 0.3 Å/sec and at 2 Å/sec, respectively, and the degree of vacuum during the deposition was maintained at $2\times10^{-8}$ to $5\times10^{-6}$ torr.

Examples 2 to 16 and Comparative Examples 1 to 5
Organic light emitting devices were manufactured in the same manner as in Example 1, except that the materials described in the following Table 2 were used instead of Compound A, Compound 3-2, and Copolymer HTL1-1 in Example 1.
P
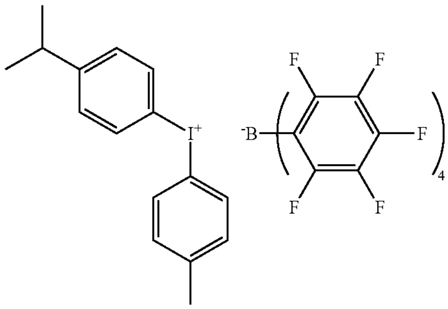
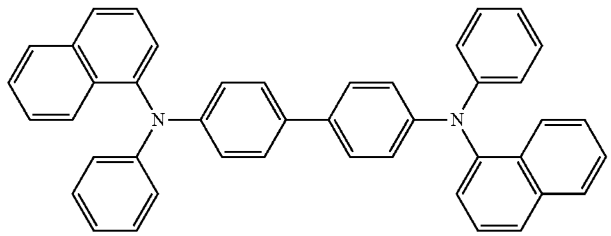
a-NPD
V-1
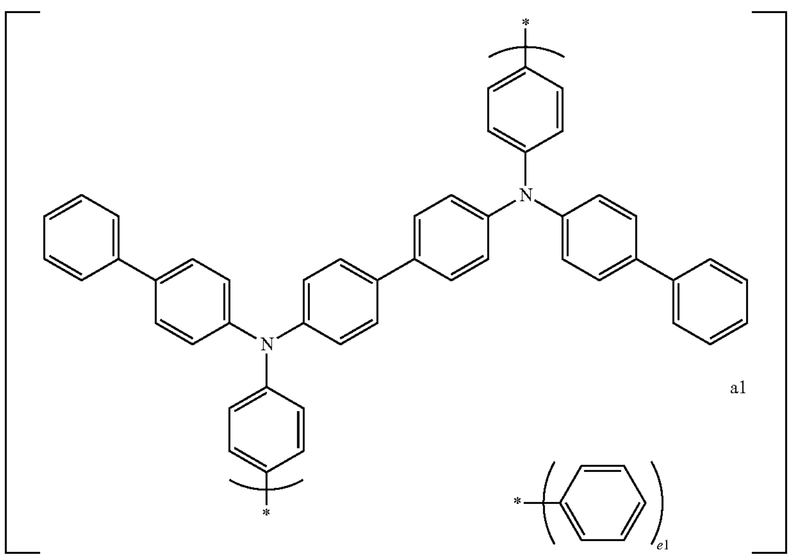
a1:e1=98:10
Mw = 36700
V-2
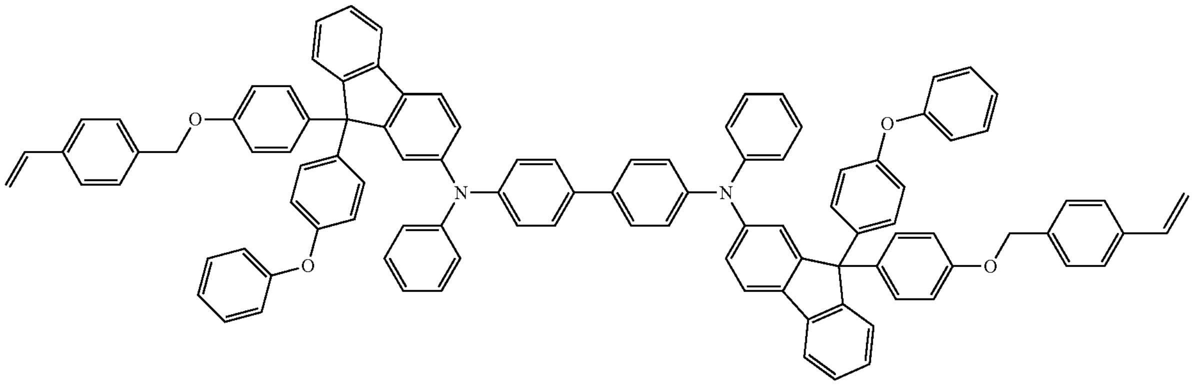

-continued

V-3

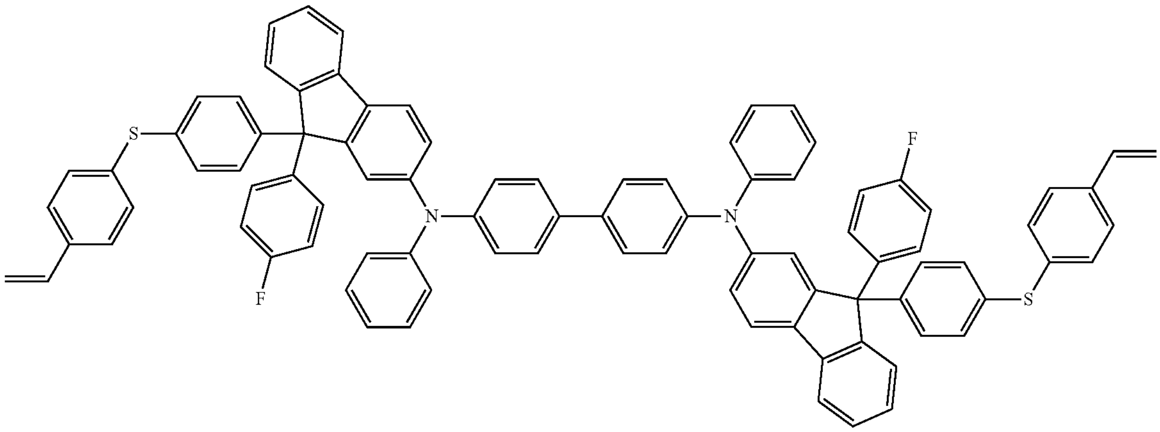

From the organic light emitting device manufactured by the above-described method, the results of measuring the driving voltage and efficiency at a current density of 10 mA/cm$^2$ are shown in the following Table 2. The time taken for the luminance to reach 95% of the initial luminance at a current density of 10 mA/cm$^2$ was measured, and is shown as a service life in the following Table 2.

TABLE 2

| | Hole injection layer compound (Host/Dopant) | Hole transport layer compound | Driving voltage (V) | Current Efficiency (cd/A) | Power efficiency (lm/W) | Service life (95%, h) |
|---|---|---|---|---|---|---|
| Example 1 | A/3-2 | HTL1-1 | 4.05 | 5.31 | 3.18 | 228 |
| Example 2 | A/3-3 | HTL1-2 | 4.03 | 5.36 | 3.21 | 225 |
| Example 3 | A/3-1 | HTL2-1 | 4.08 | 5.41 | 3.24 | 223 |
| Example 4 | A/3-4 | HTL2-2 | 4.10 | 5.28 | 3.16 | 217 |
| Example 5 | B/3-2 | HTL3-1 | 4.45 | 5.36 | 3.21 | 236 |
| Example 6 | B/3-3 | HTL3-2 | 4.38 | 5.19 | 3.11 | 236 |
| Example 7 | B/3-1 | HTL4-1 | 4.35 | 5.41 | 3.24 | 241 |
| Example 8 | B/3-4 | HTL4-2 | 4.26 | 5.28 | 3.16 | 211 |
| Example 9 | C/3-2 | HTL5-1 | 4.31 | 5.37 | 3.22 | 215 |
| Example 10 | C/3-3 | HTL5-2 | 4.33 | 5.21 | 3.12 | 235 |
| Example 11 | C/3-1 | HTL1-1 | 4.28 | 5.29 | 3.17 | 224 |
| Example 12 | C/3-4 | HTL2-1 | 4.26 | 5.36 | 3.21 | 251 |
| Example 13 | D/3-2 | HTL3-1 | 4.25 | 5.27 | 3.16 | 221 |
| Example 14 | D/3-3 | HTL4-1 | 4.21 | 5.38 | 3.22 | 213 |
| Example 15 | D/3-1 | HTL5-1 | 4.19 | 5.28 | 3.16 | 219 |
| Example 16 | D/3-4 | HTL3-1 | 4.22 | 5.25 | 3.14 | 226 |
| Comparative Example 1 | C/Compound P | a-NPD | 4.33 | 5.26 | 3.15 | 124 |
| Comparative Example 2 | A/3-1 | V-1 | 4.75 | 4.48 | 2.78 | 82 |
| Comparative Example 3 | V-2/3-1 | HTL1-1 | 4.56 | 5.10 | 3.07 | 110 |
| Comparative Example 4 | HTL3-1 | B/3-2 | 4.70 | 4.69 | 2.83 | 98 |
| Comparative Example 5 | V-3/3-1 | HTL1-1 | 4.68 | 4.75 | 2.86 | 95 |

From the experimental results in Table 2, it can be confirmed that Examples 1 to 16 which are the organic light emitting devices of the present invention have better driving voltage, efficiency, or service life than Comparative Examples 1 to 5.

In Comparative Example 1, an arylamine-based single molecule compound was used as a material for the hole transport layer instead of the copolymer of Chemical Formula 2, and in Comparative Example 2, a copolymer having a structure different from that of the copolymer of Chemical Formula 2 was used as a material for the hole transport layer.

In Comparative Example 3, a compound having a structure different from that of the compound of Chemical Formula 1 of the present invention was used as a material for the hole injection layer.

In Comparative Example 4, the copolymer of Chemical Formula 2 was used as a material for the hole injection layer (first organic material layer), and the compound of Chemical Formula 1 was used as a material for the hole transport layer (second organic material layer).

In Comparative Example 5, a compound having a structure different from that of the compound of Chemical Formula 1 of the present invention was used as a material for the hole injection layer. Specifically, Compound V-3 used as a host material for the hole injection layer in Comparative Example 5 has a fluoro group introduced into diphenylfluorene bonded to an amine group and no fluoro group introduced into another aryl group bonded to the amine group, and thus has a compound structure different from that of the compound of Chemical Formula 1 of the present invention, in which m1 and m2 are each an integer from 1 to 5. It could be confirmed that in Comparative Example 5 in which a compound having a different structure was used as a material for the hole injection layer, driving voltage, efficiency or service life remarkably deteriorated compared to in Examples 1 to 16 which are the organic light emitting devices of the present invention.

What is claimed is:

1. An organic light emitting device comprising:

an anode;

a cathode; and a light emitting layer provided between the anode and the cathode, wherein a first organic material layer comprising a composition which comprises a compound of the following Chemical Formula 1 or a cured product thereof is comprised between the light emitting layer and the anode, and a second organic material layer comprising a composition which comprises a copolymer of the following Chemical Formula 2 or a cured product thereof is comprised between the first organic material layer and the light emitting layer:

[Chemical Formula 1]

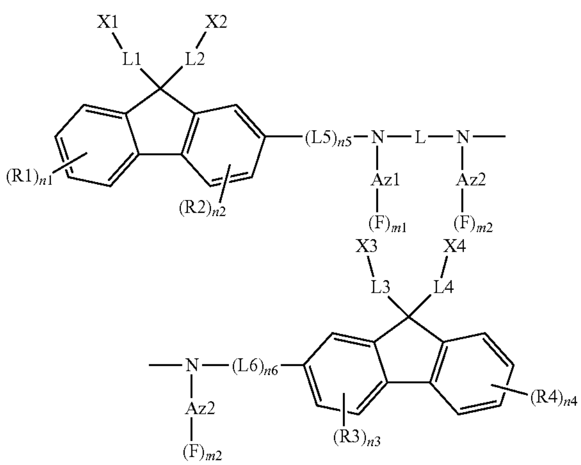

in Chemical Formula 1,

L and L1 to L4 are the same as or different from each other, and are each independently a substituted or unsubstituted arylene group, L5 and L6 are the same as or different from each other, and are each independently a direct bond; or a substituted or unsubstituted arylene group, Az1 and Az2 are the same as or different from each other, and are each independently a substituted or unsubstituted aryl group; or a substituted or unsubstituted heteroaryl group, R1 to R4 are the same as or different from each other, and are each independently hydrogen; deuterium; a substituted or unsubstituted alkyl group; a substituted or unsubstituted alkoxy group; a substituted or unsubstituted aryl group; or a substituted or unsubstituted heteroaryl group, X1 to X4 are the same as or different from each other, and are each independently —(U101)w; or -M-Q, and two or more of X1 to X4 are -M-Q, U101 is hydrogen; deuterium; a halogen group; a substituted or unsubstituted alkyl group; a substituted or unsubstituted alkoxy group; a substituted or unsubstituted aryl group; or a substituted or unsubstituted aryloxy group, w is an integer from 0 to 5, and when w is 2 or higher, each U101 is the same as or different from each other, M is O or S, Q is a curable group, F is fluoro, m1 and m2 are the same as or different from each other, and each independently an integer from 1 to 5, n5 and n6 are the same as or different from each other, and each independently an integer from 0 to 2, n1 and n4 are the same as or different from each other, and each independently an integer from 0 to 4, n2 and n3 are the same as or different from each other, and each independently an integer from 0 to 3, when n5 and n6 are each 2, each L5 and L6 is the same as or different from each other, respectively, and when n1 to n4 are each 2 or higher, each R1 to R4 is the same as or different from each other, respectively,

[Chemical Formula 2]

$$E-[A]_a-[B']_b-[C']_c-E$$

in Chemical Formula 2,

A is a monomer unit including at least one triarylamine group,

B' is a monomer unit having at least three binding points in a copolymer,

C' is an aromatic monomer unit or a deuterated analog thereof,

E is each independently selected from the group consisting of hydrogen; deuterium; a halogen group; a substituted or unsubstituted alkyl group; a substituted or unsubstituted silyl group; a substituted or unsubstituted germanium group; a substituted or unsubstituted aryl group; a substituted or unsubstituted arylamino group; a substituted or unsubstituted siloxane group; and a substituted or unsubstituted curable group, and a, b and c are a mole fraction, a+b+c=1, a≠0, and b≠0.

2. The organic light emitting device of claim 1, wherein at least one of the compound of Chemical Formula 1 or the copolymer of Chemical Formula 2 is 10% to 100% deuterated.

3. The organic light emitting device of claim 1, wherein the copolymer of Chemical Formula 2 is 5% to 100% deuterated.

4. The organic light emitting device of claim 1, wherein Chemical Formula 1 is represented by the following Chemical Formula 1-1:

[Chemical Formula 1-1]

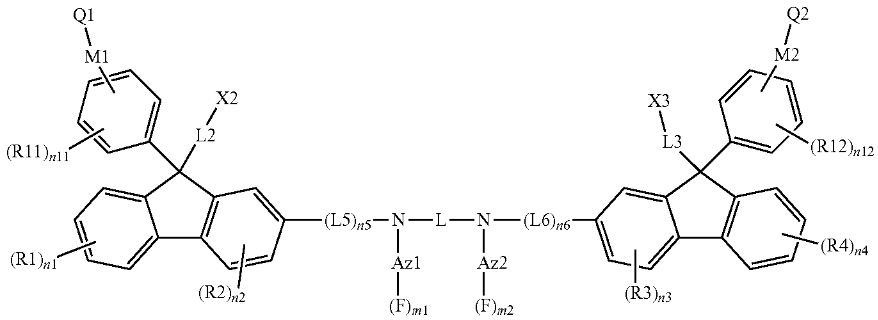

in Chemical Formula 1-1,

R1 to R4, L2, L3, L5, L6, n1 to n6, Az1, Az2, L, X2, X3, m1, and m2 are the same as those defined in Chemical Formula 1, M1 and M2 are the same as or different from each other, and are each independently O or S, Q1 and Q2 are the same as or different from each other, and are each independently a curable group, R11 and R12 are the same as or different from each other, and are each independently hydrogen; deuterium; a halogen group; a substituted or unsubstituted alkyl group; a substituted or unsubstituted alkoxy group; a substituted or unsubstituted aryloxy group; a substituted or unsubstituted aryl group; or a substituted or unsubstituted heteroaryl group, n11 and n12 are the same as or different from each other, and each independently an integer from 0 to 4, and when n11 and n12 are each 2 or higher, each R11 and R12 is the same as or different from each other, respectively.

5. The organic light emitting device of claim 1, wherein the compound of Chemical Formula 1 is any one selected from the group consisting of the following compounds:

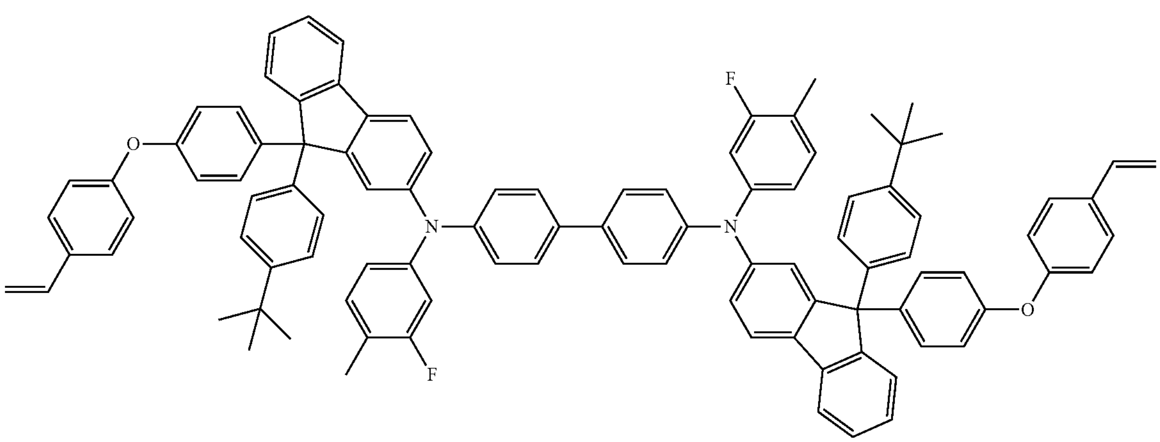

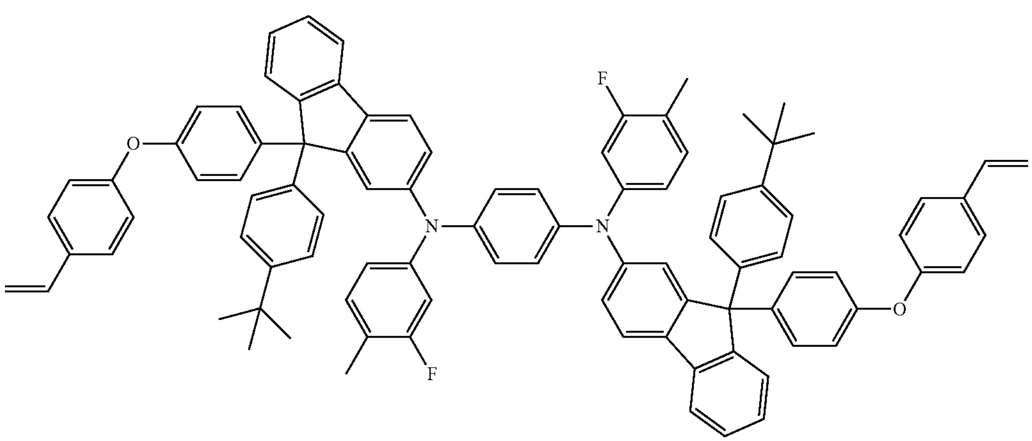

-continued
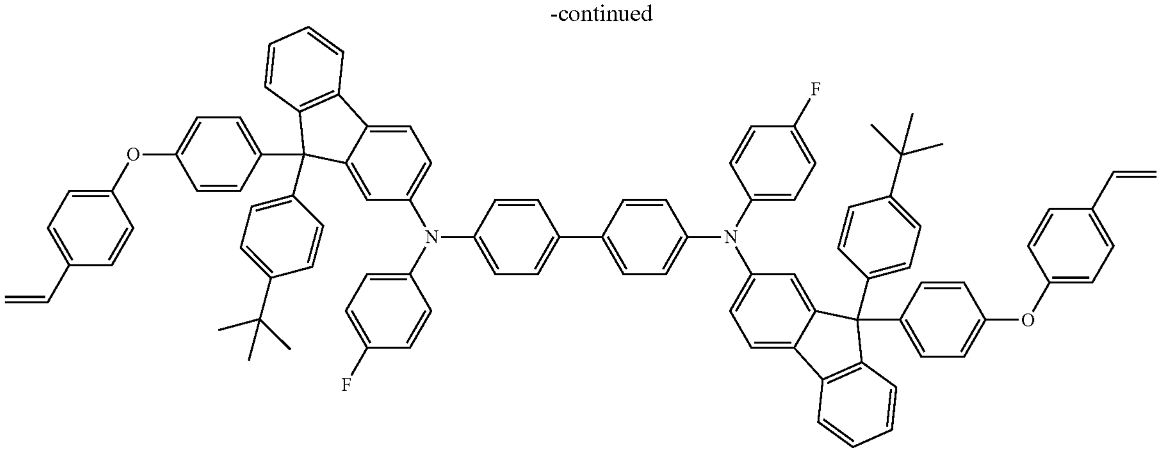
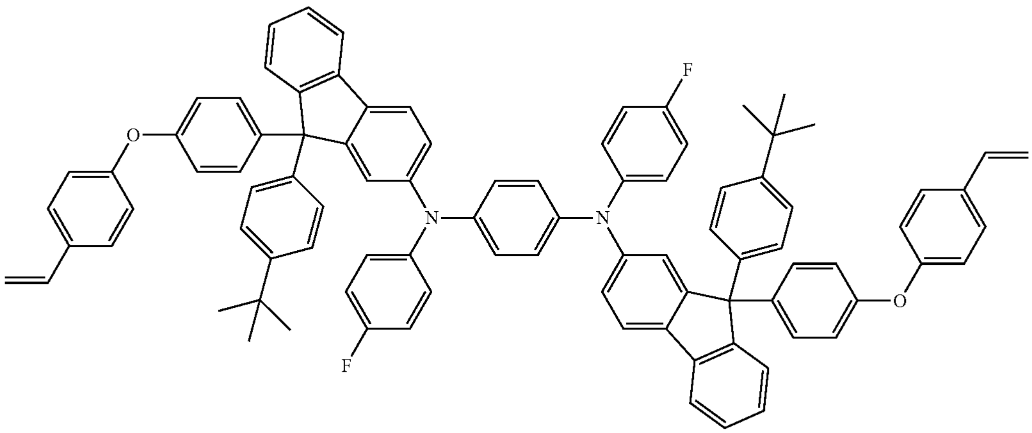
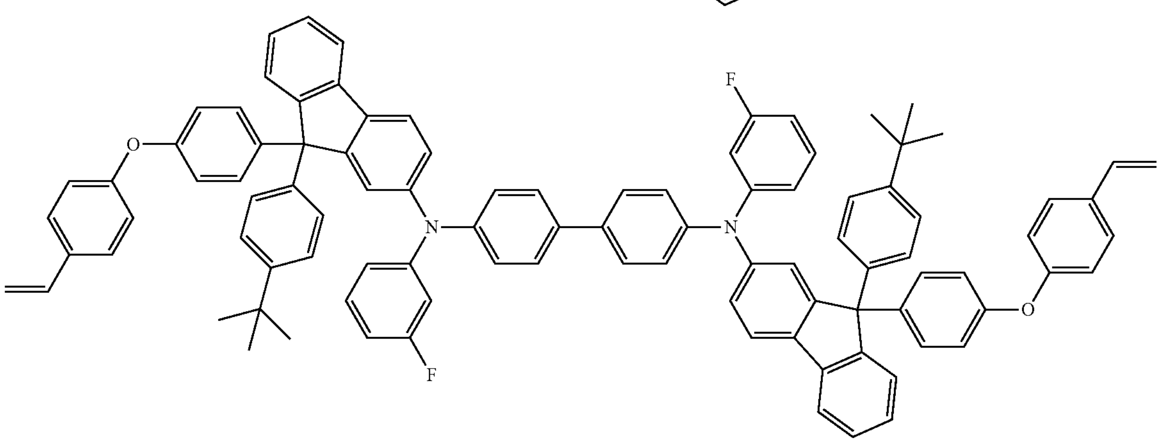
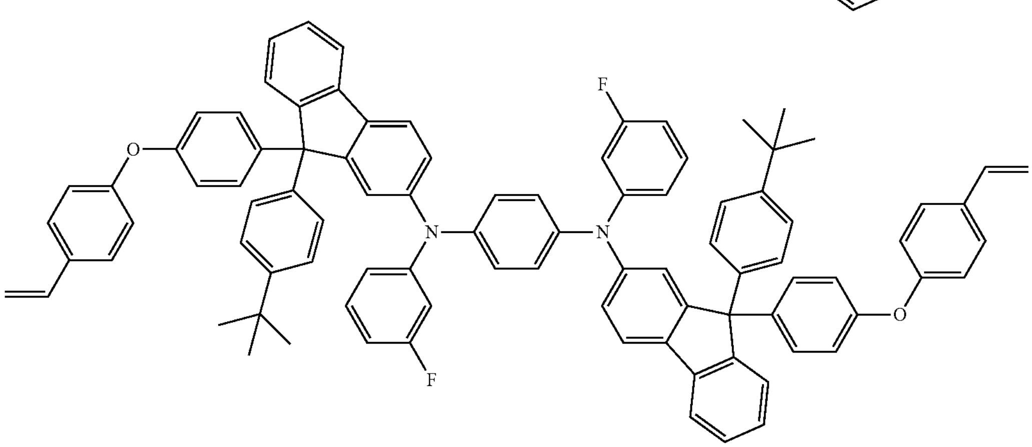

-continued
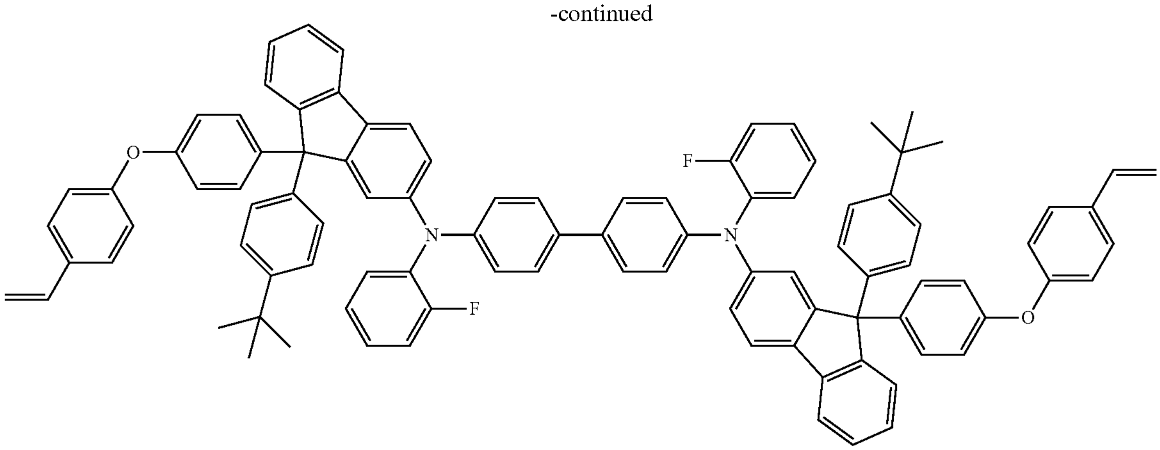
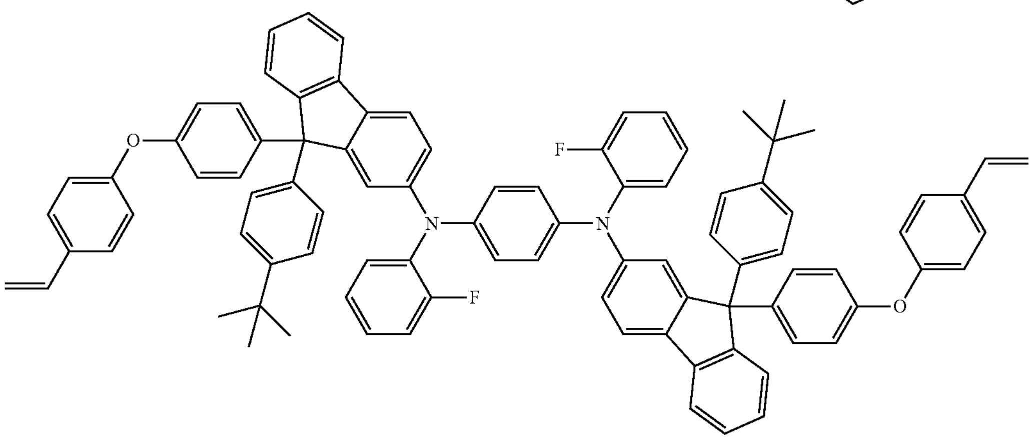
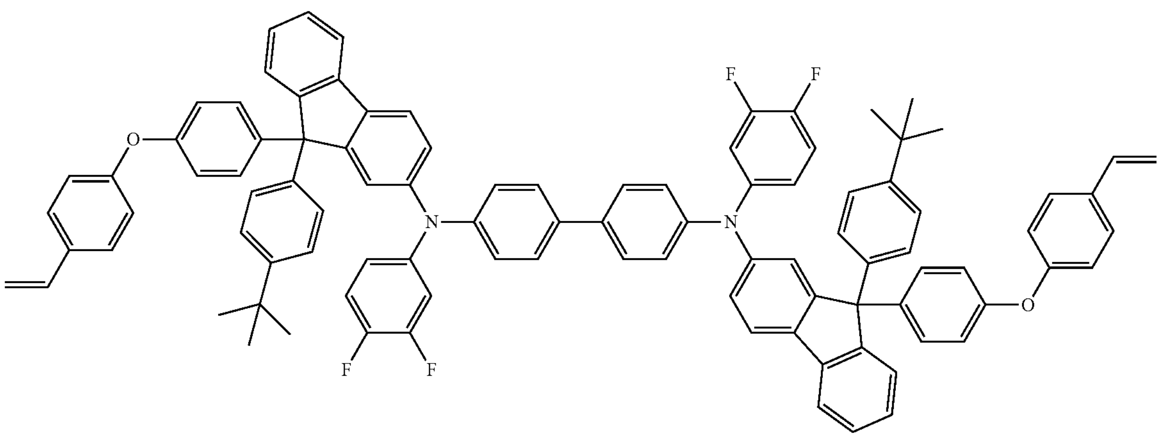
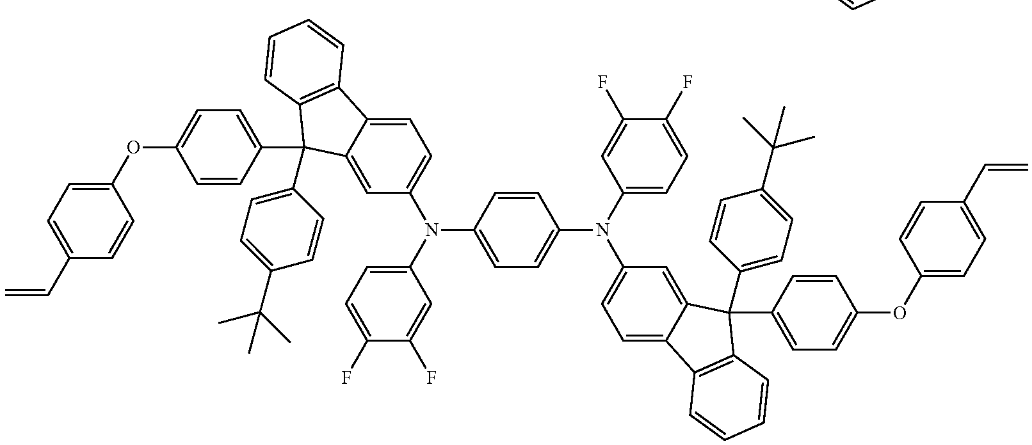

-continued
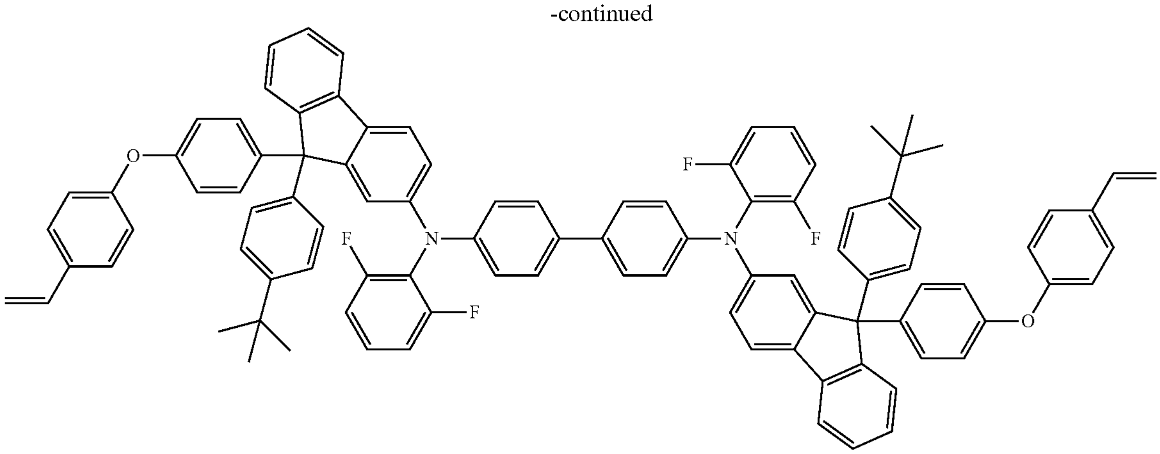
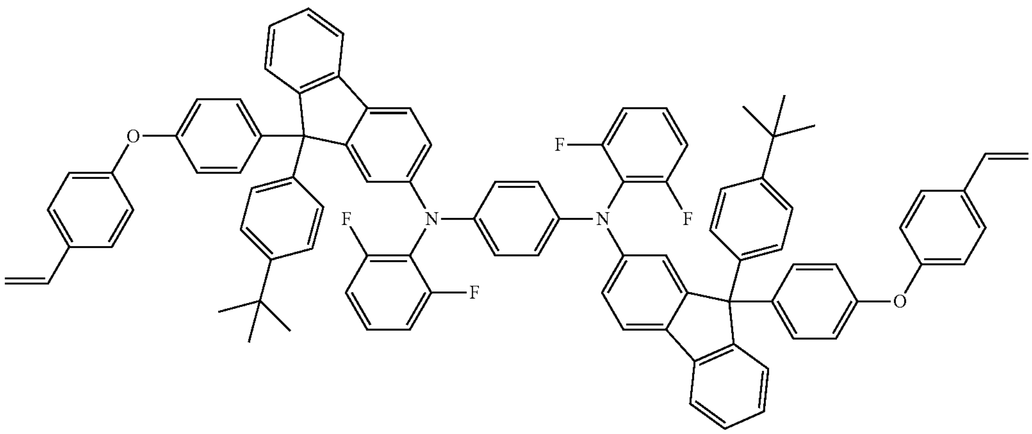
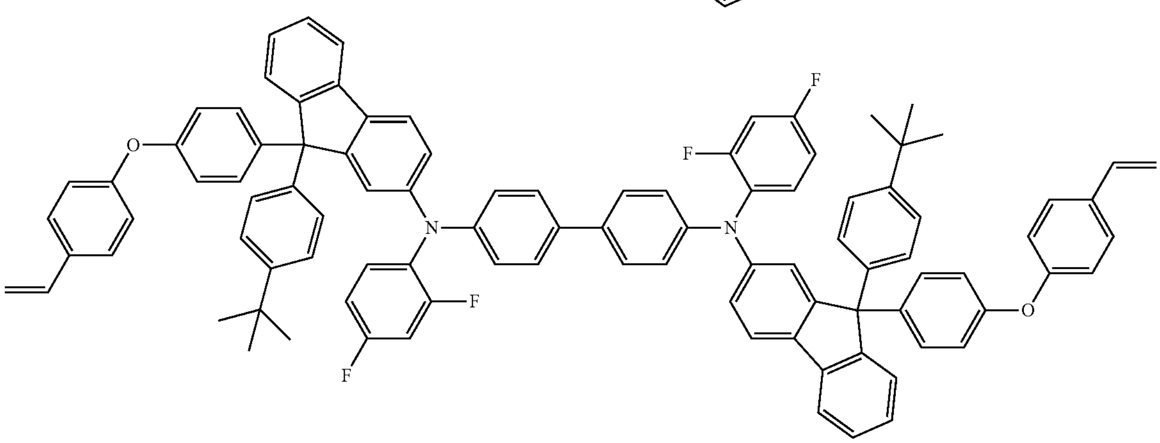
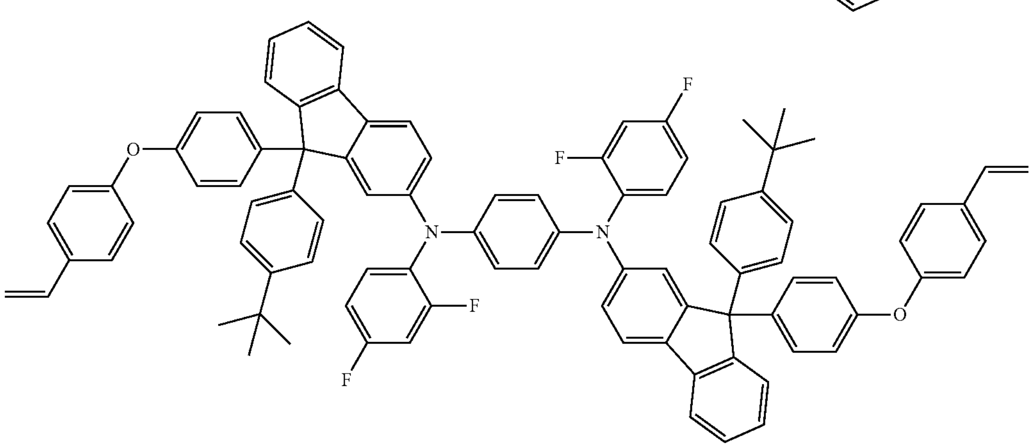

-continued
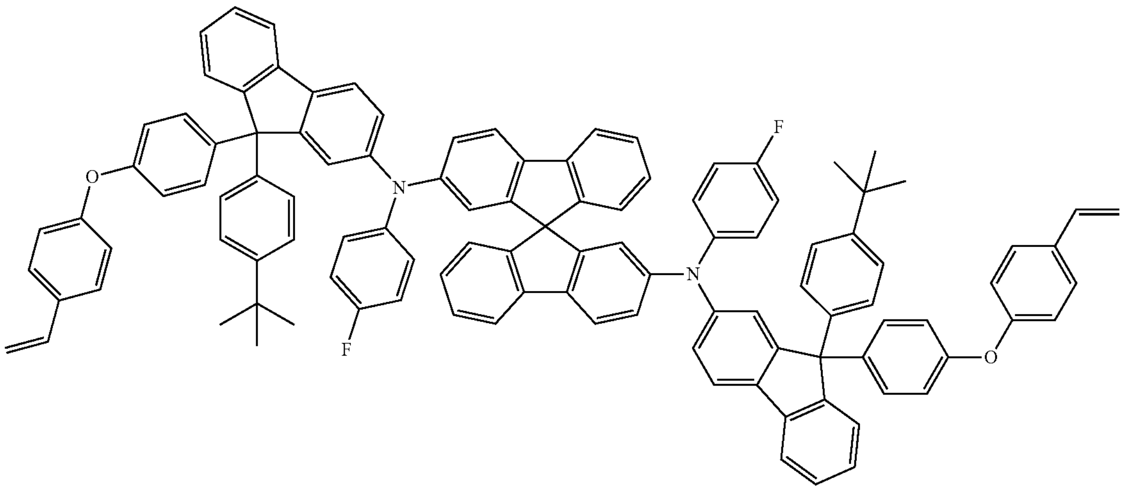
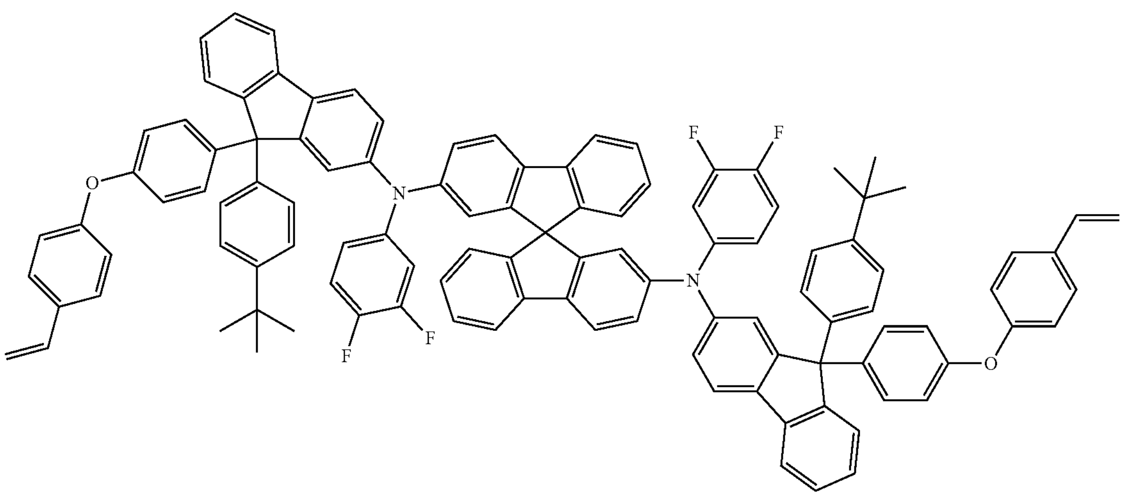
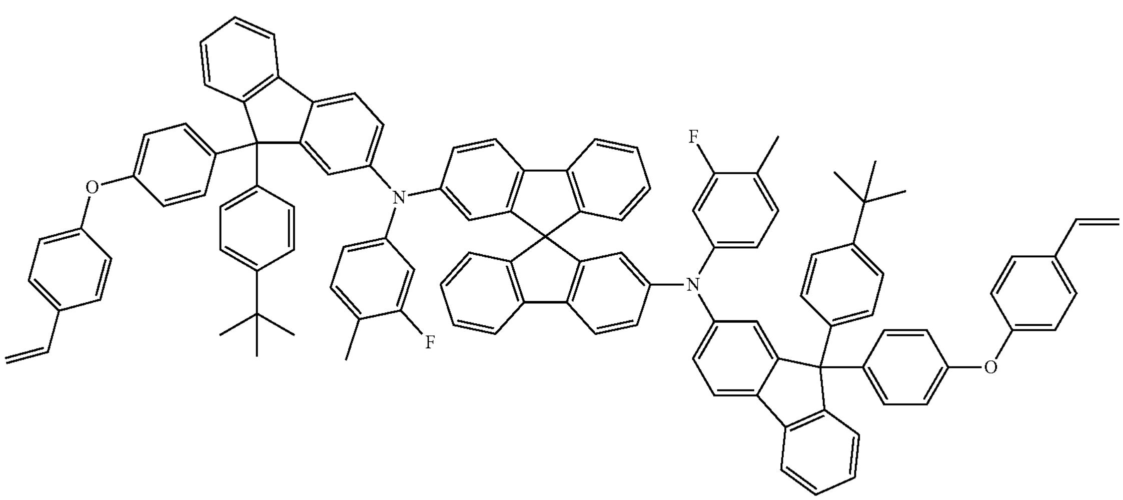

-continued
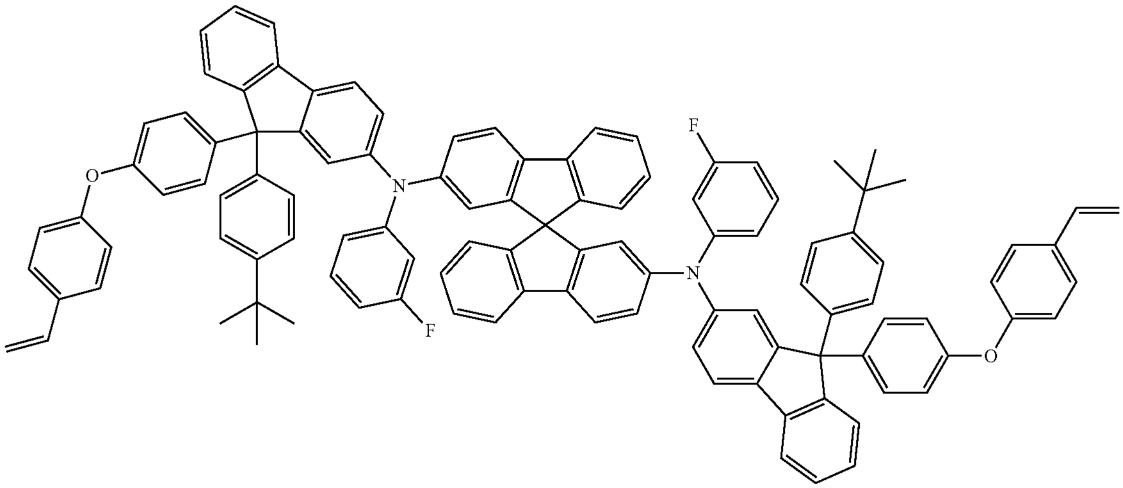
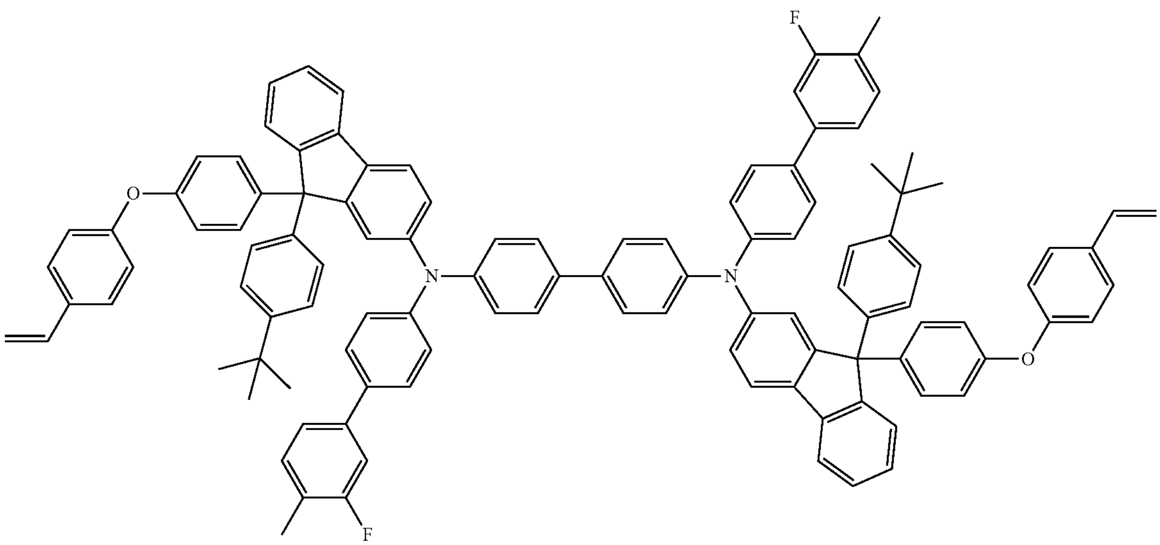
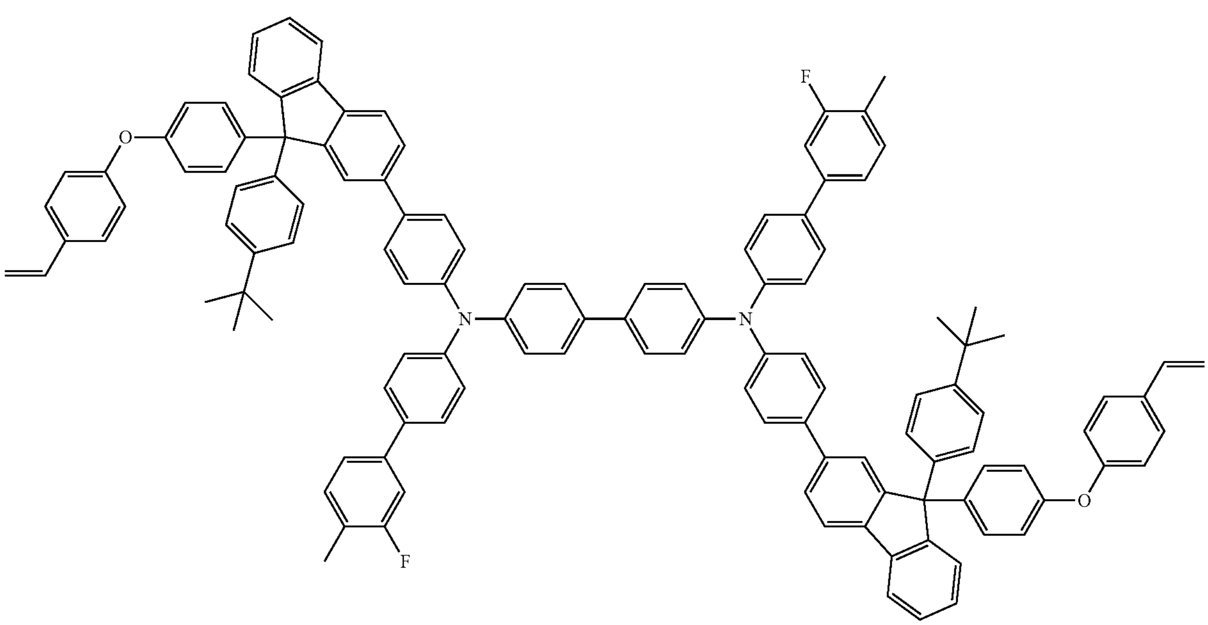

-continued
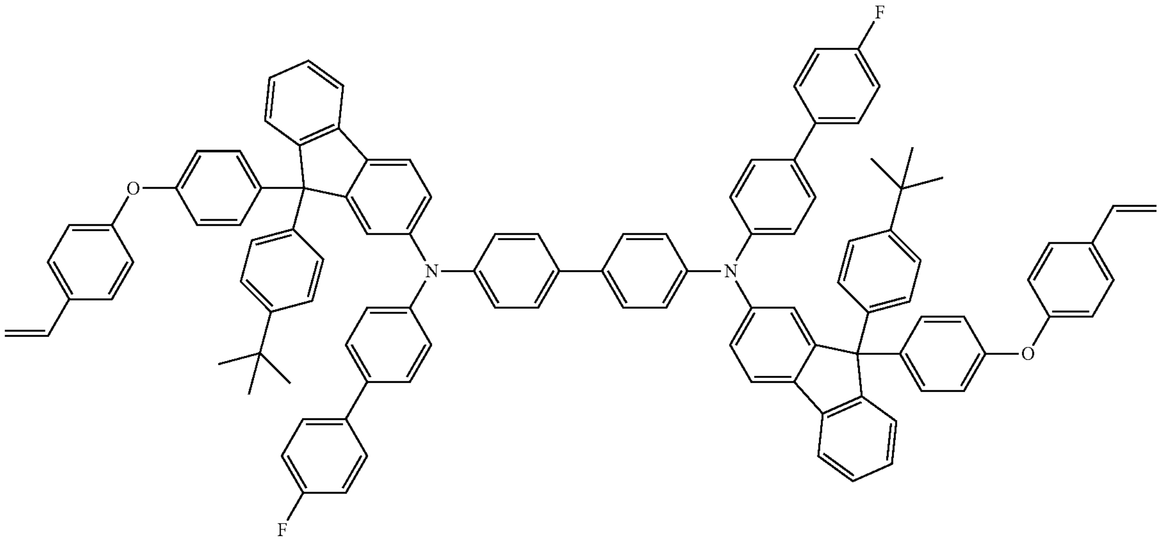
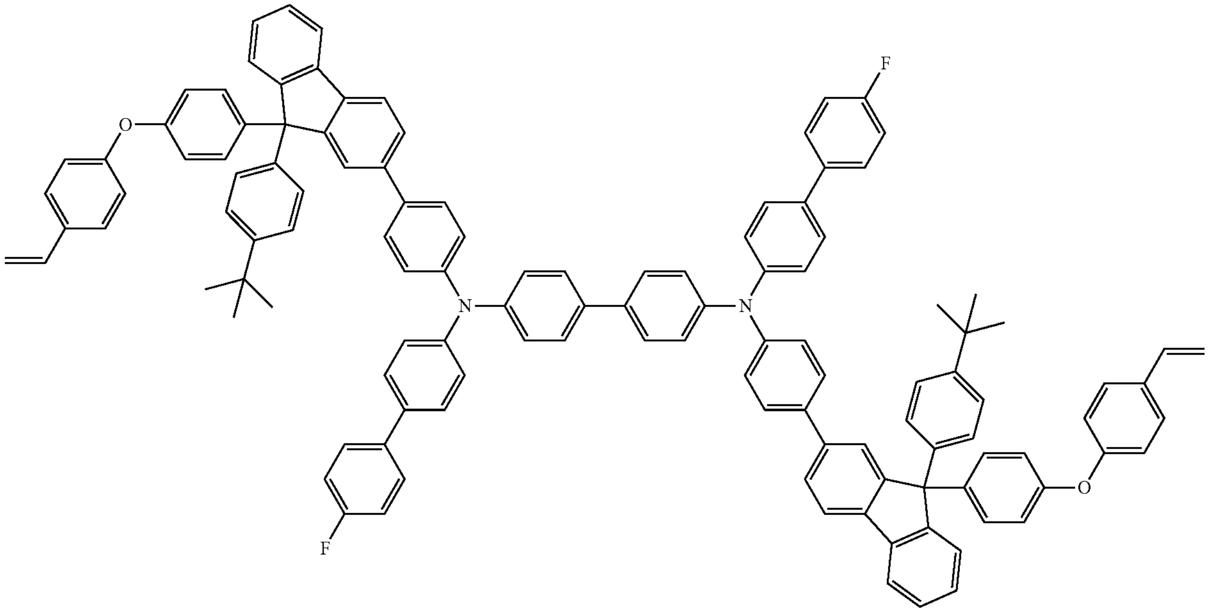
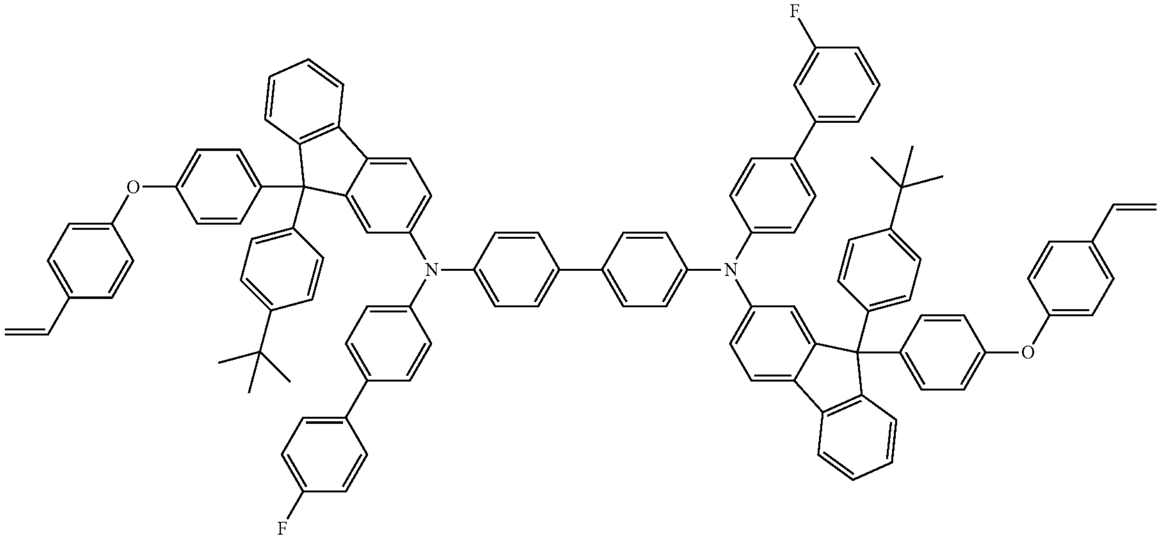

-continued
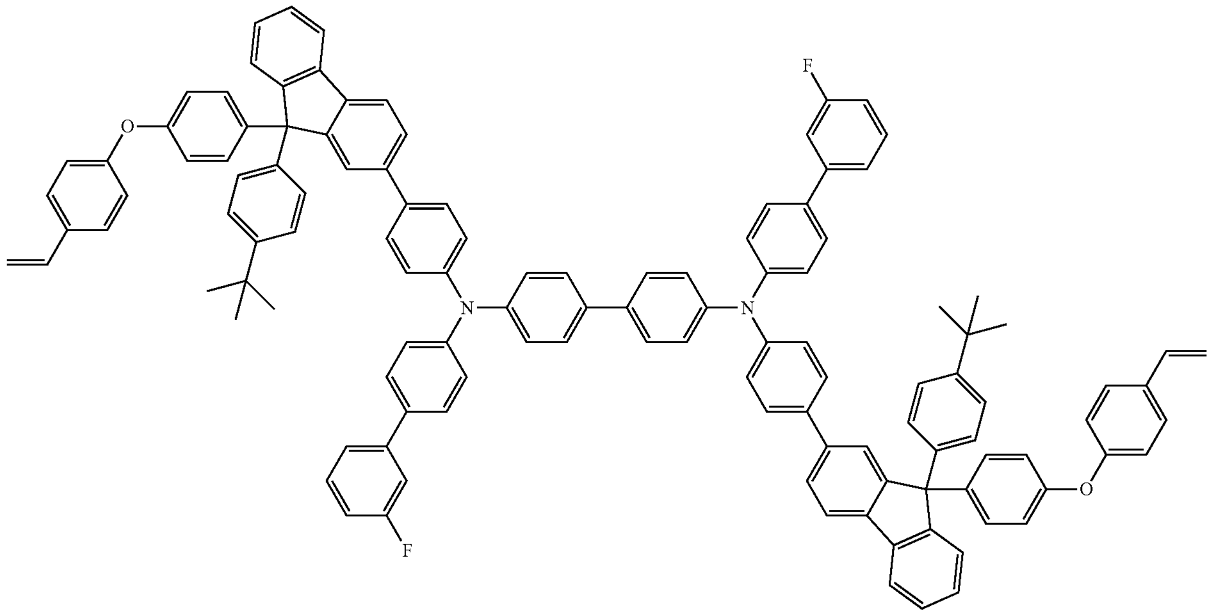
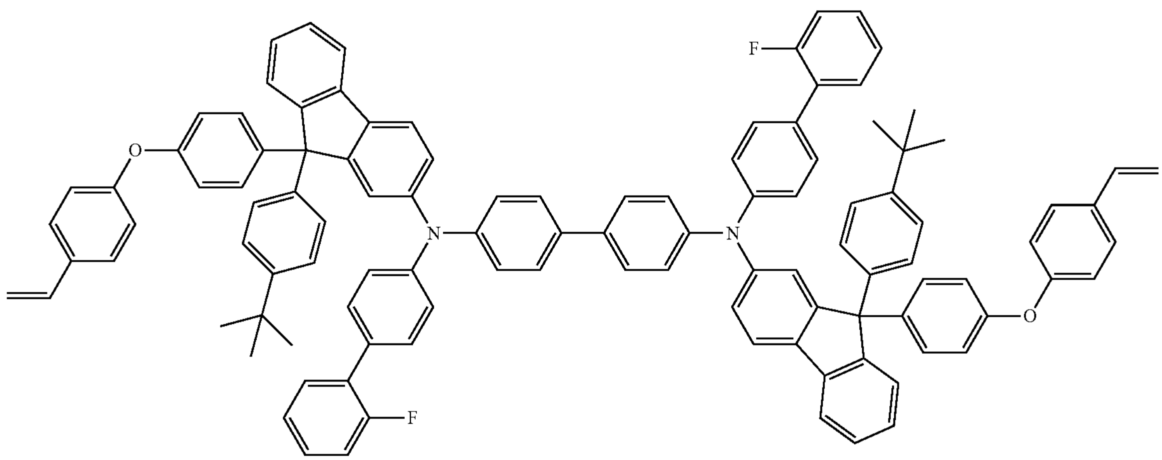
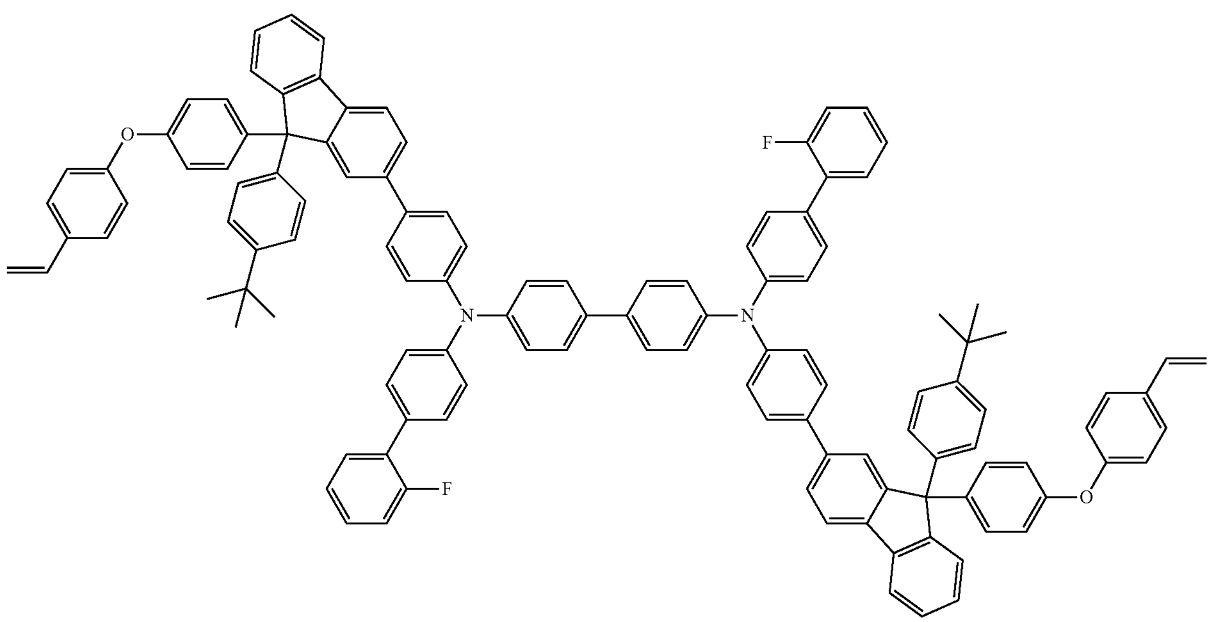

-continued
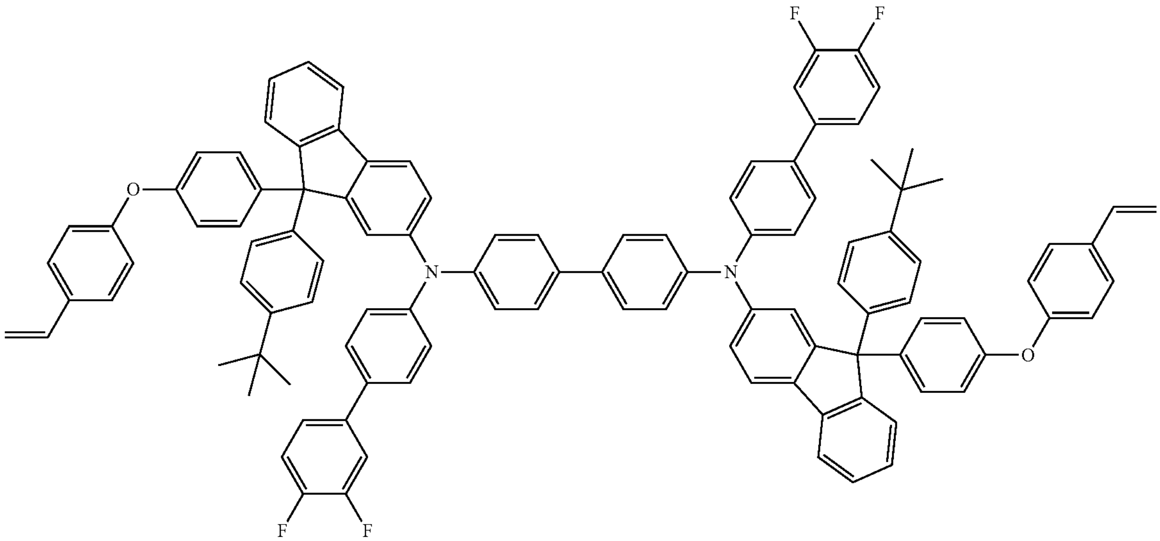
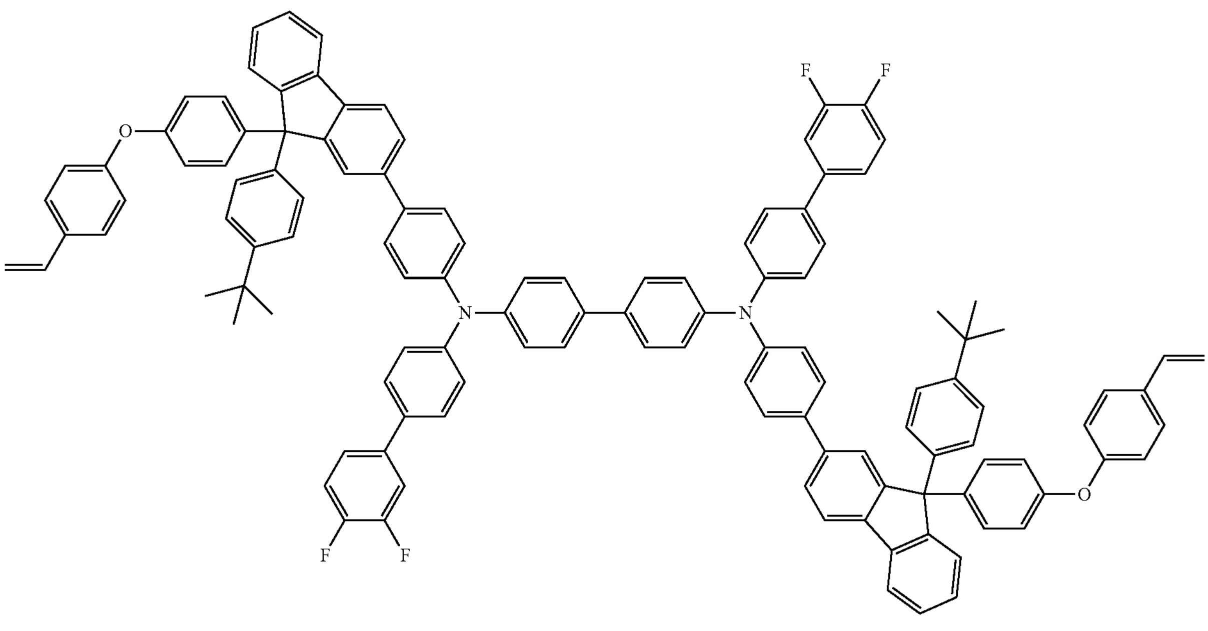
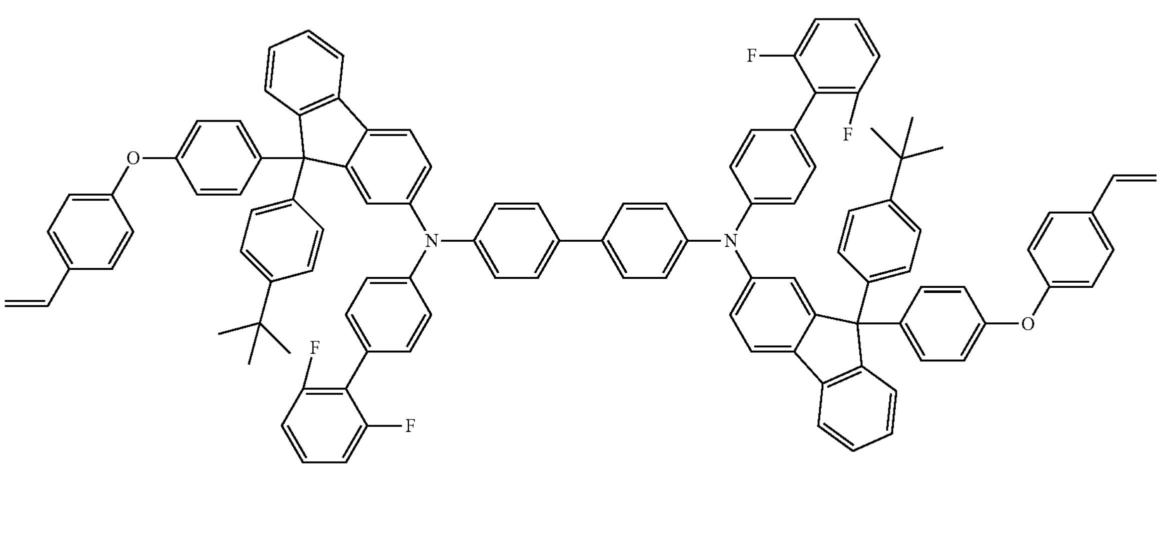

-continued
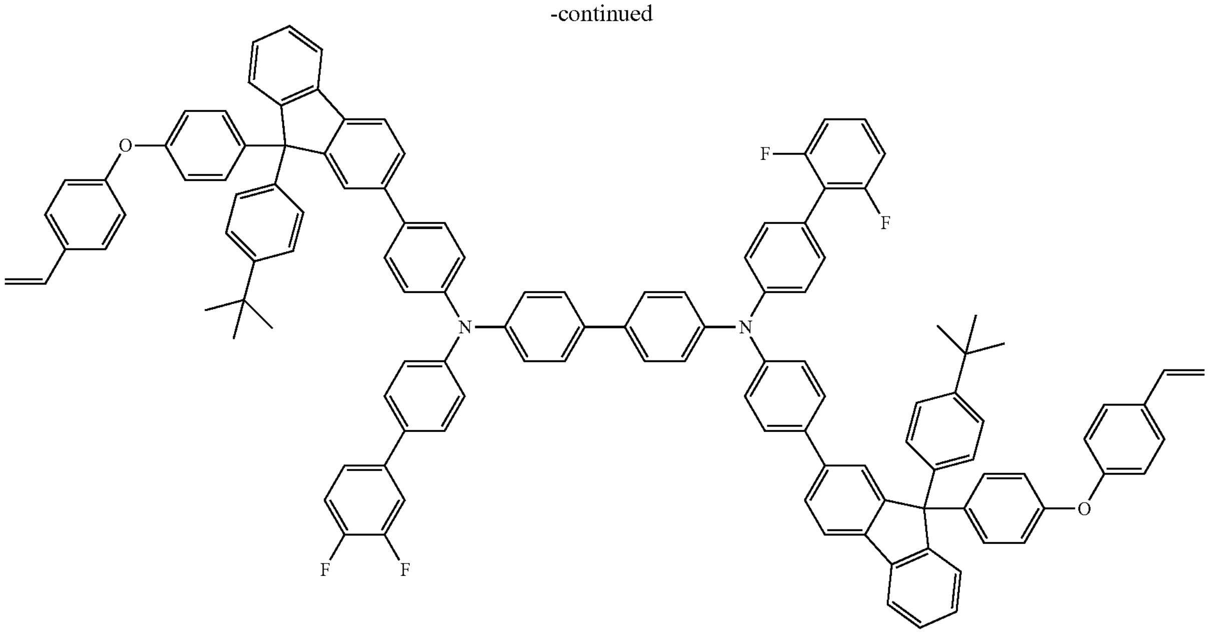
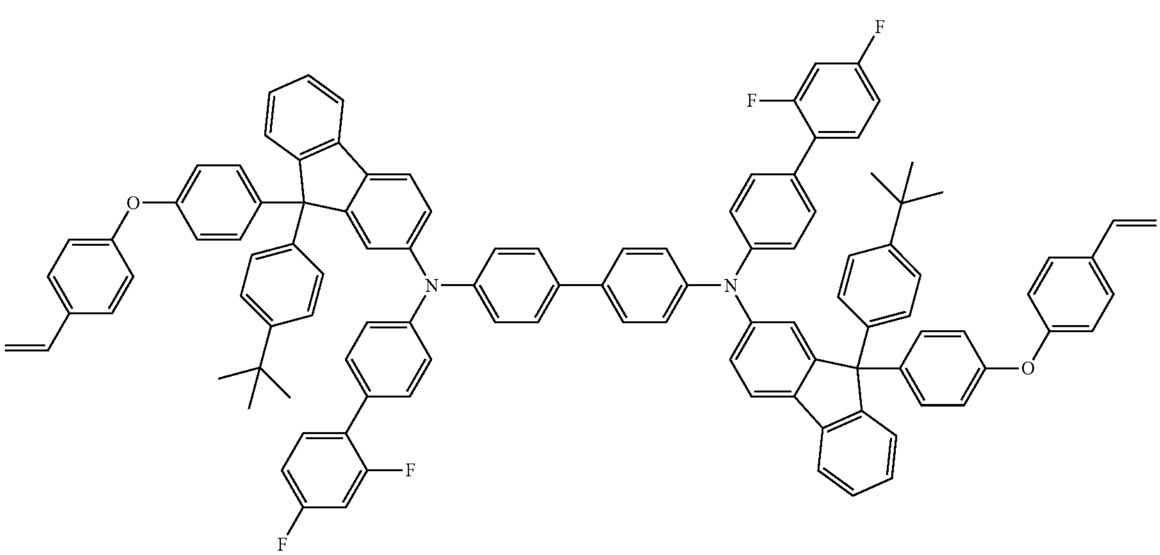

-continued
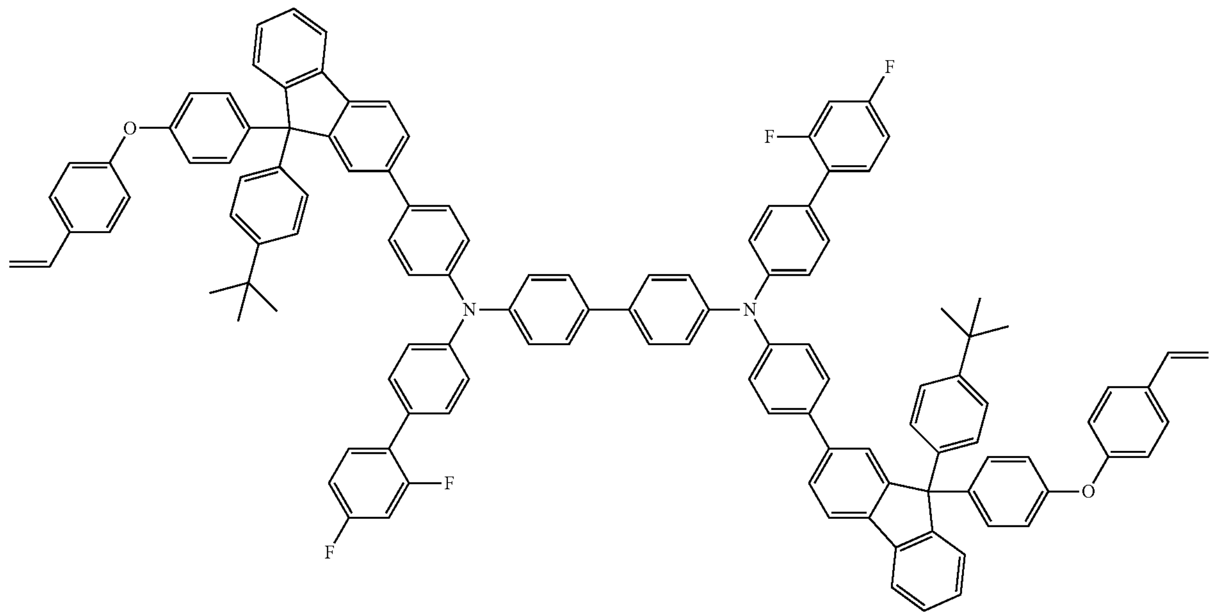
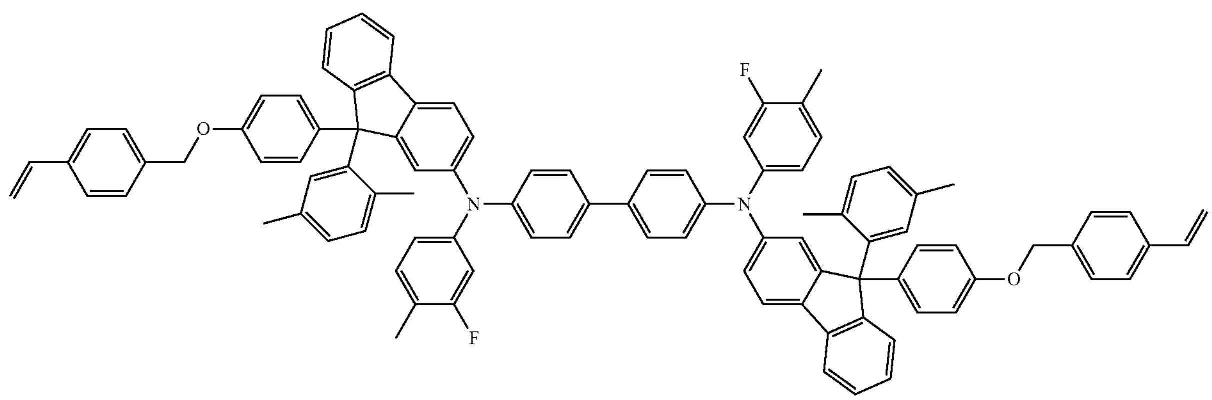
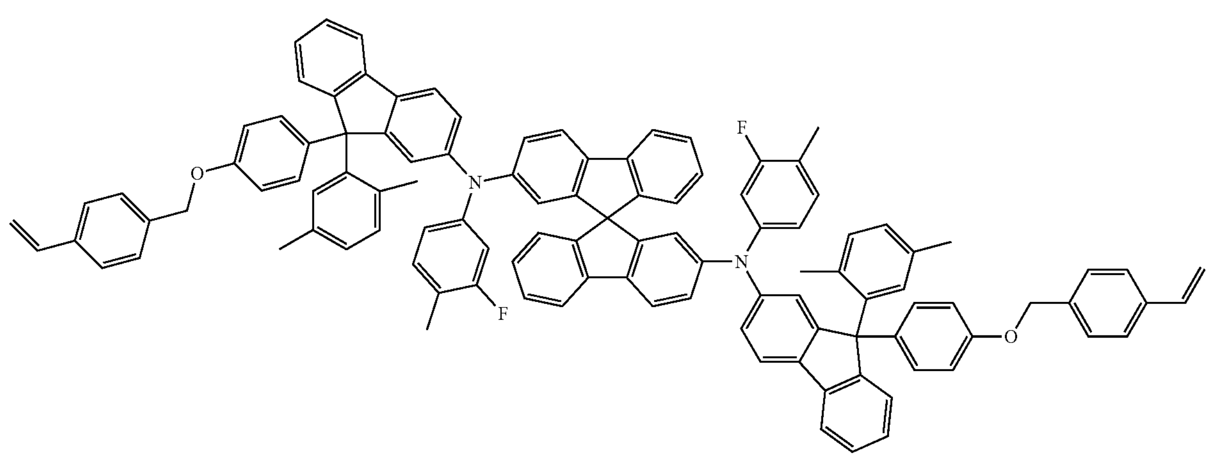

-continued
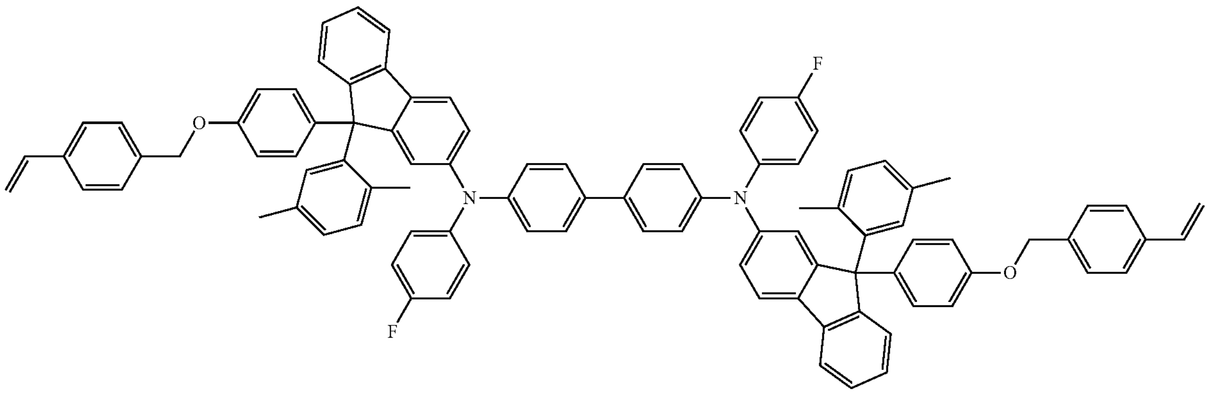
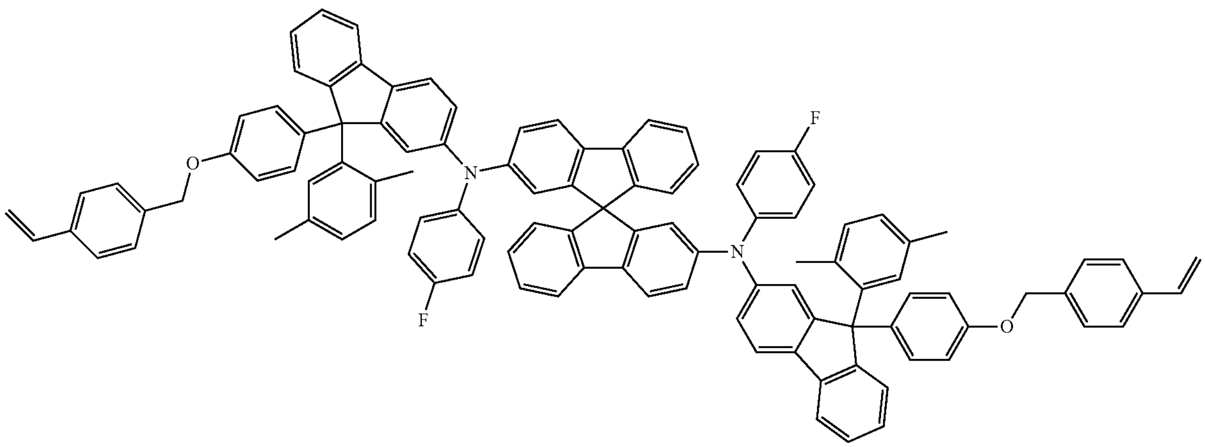
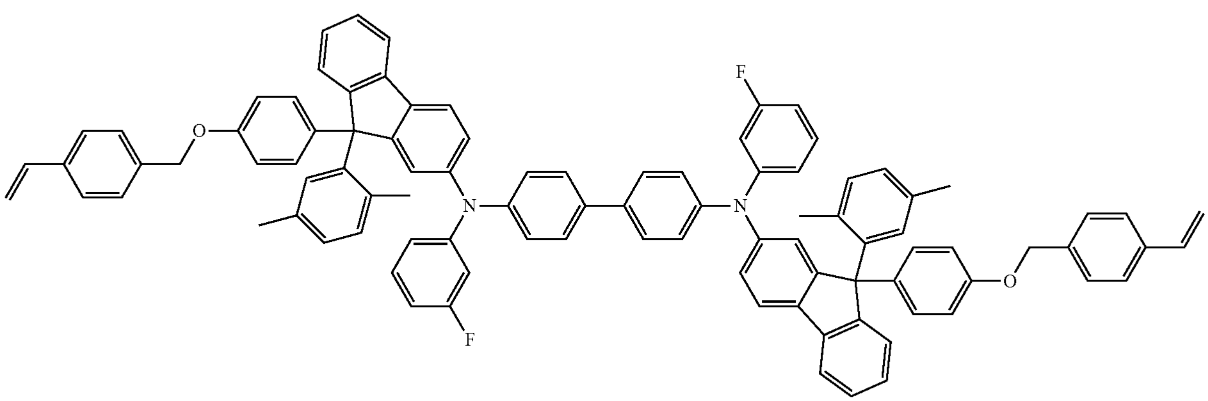
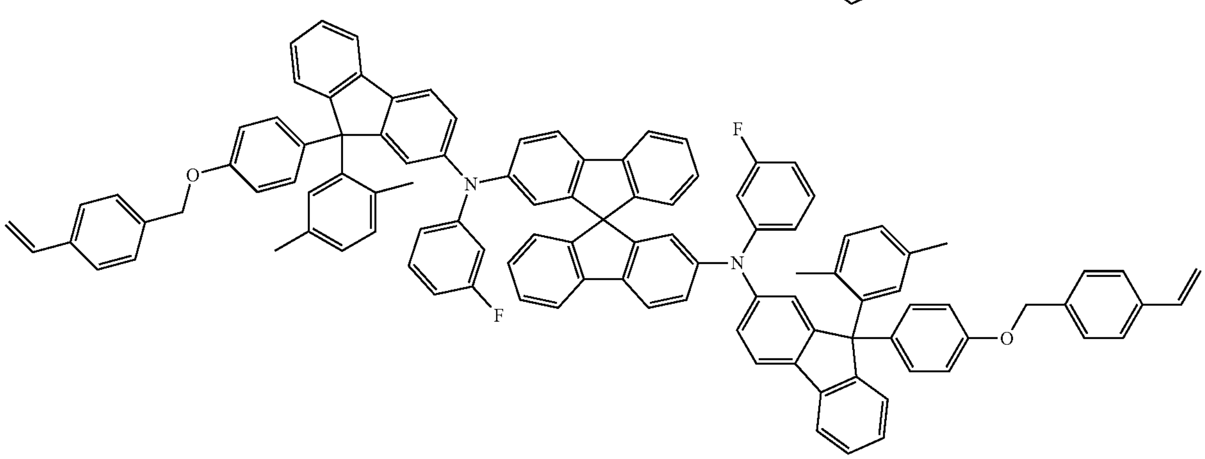

-continued
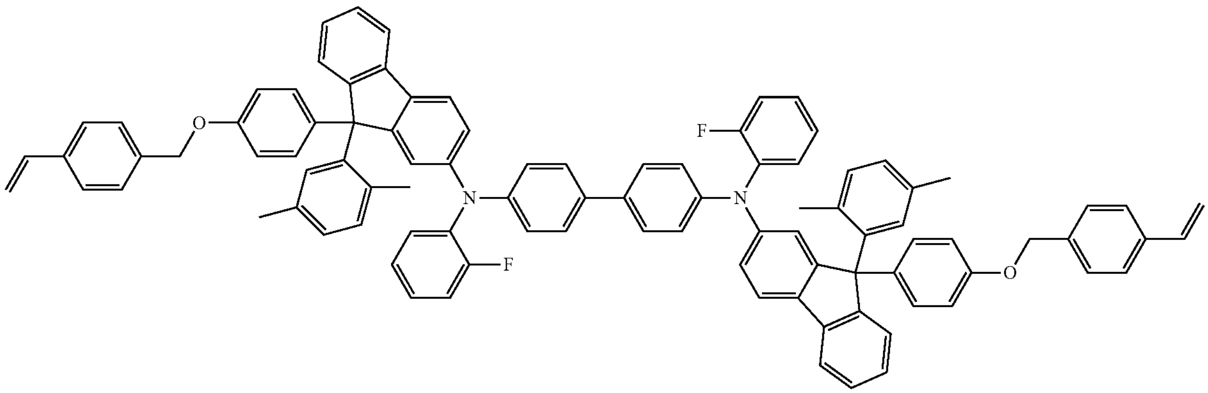
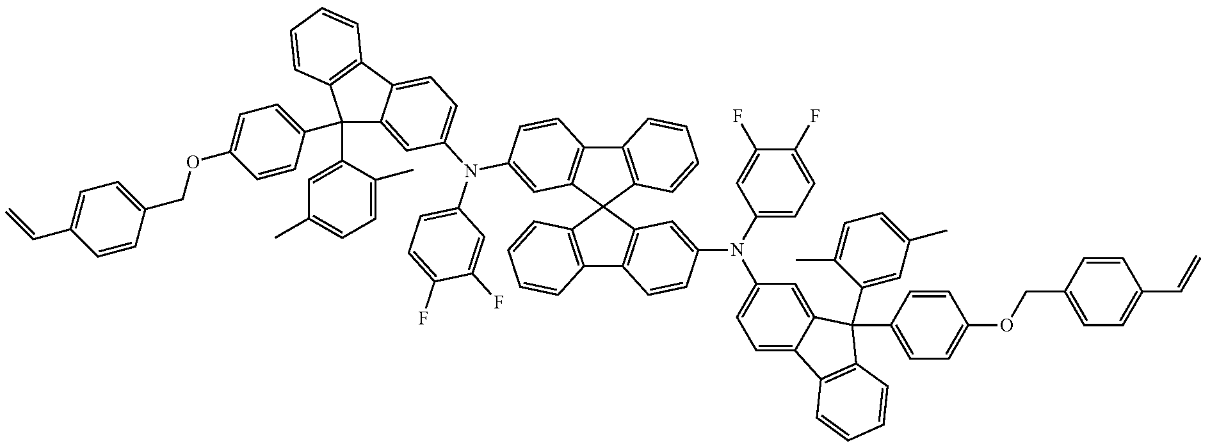
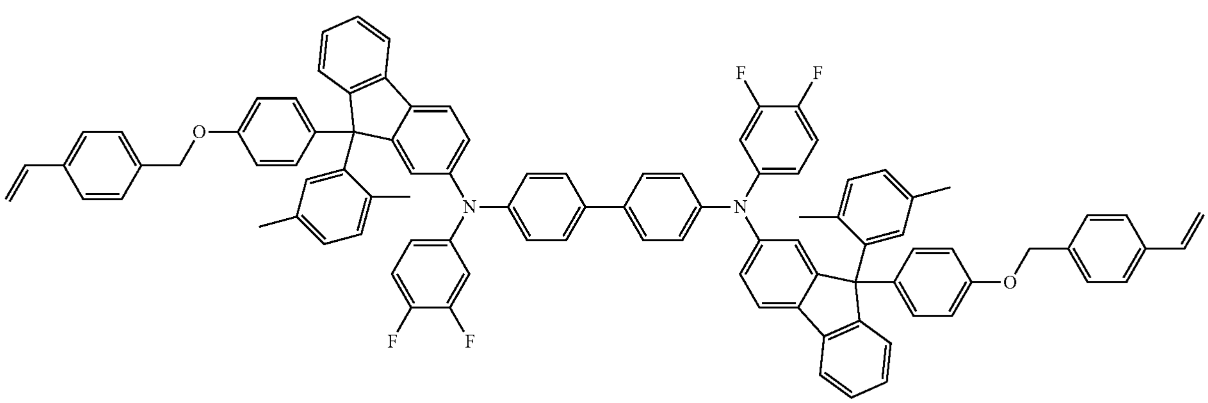
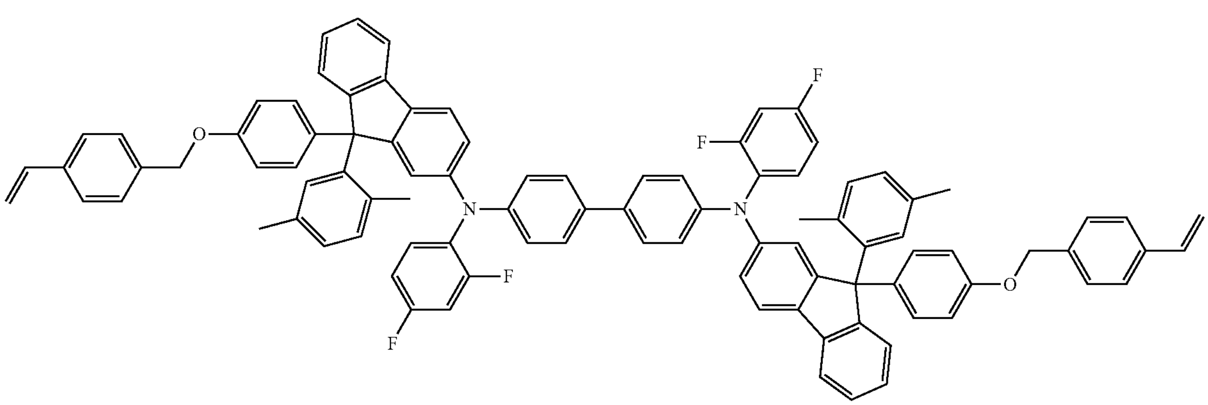

-continued
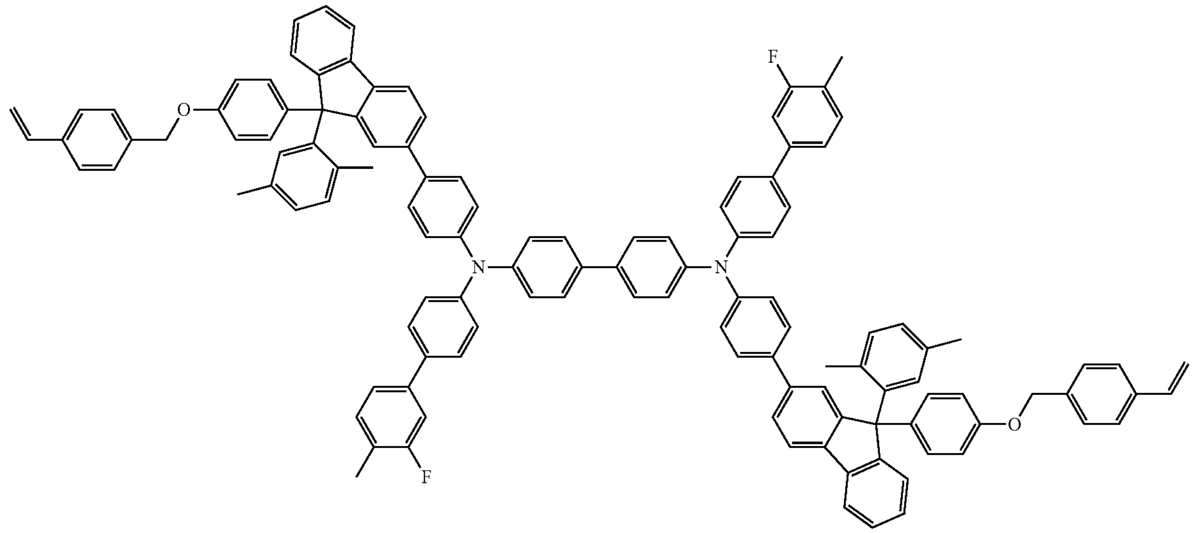
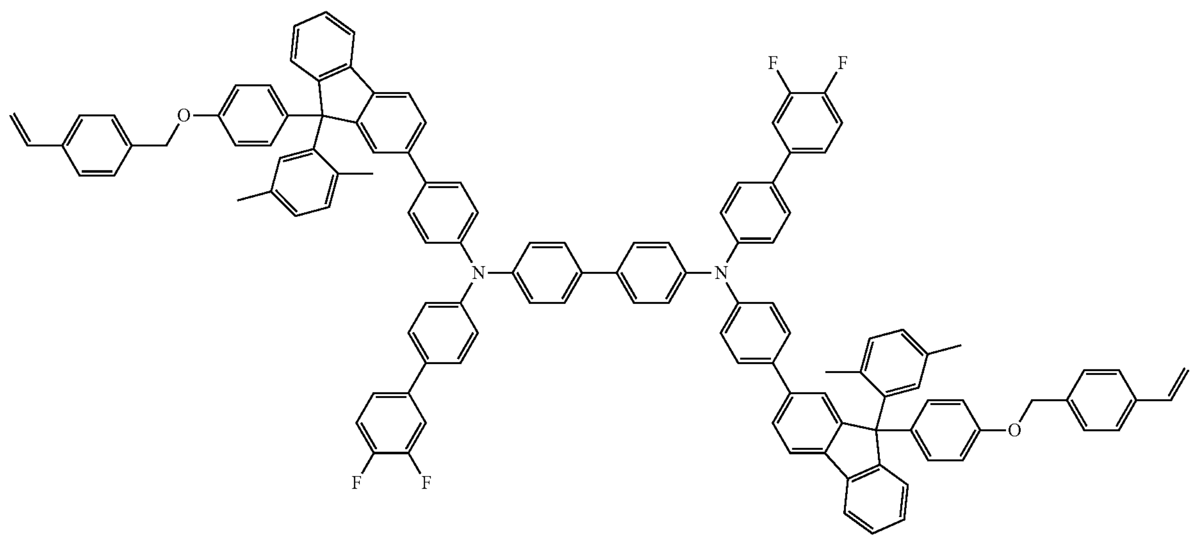
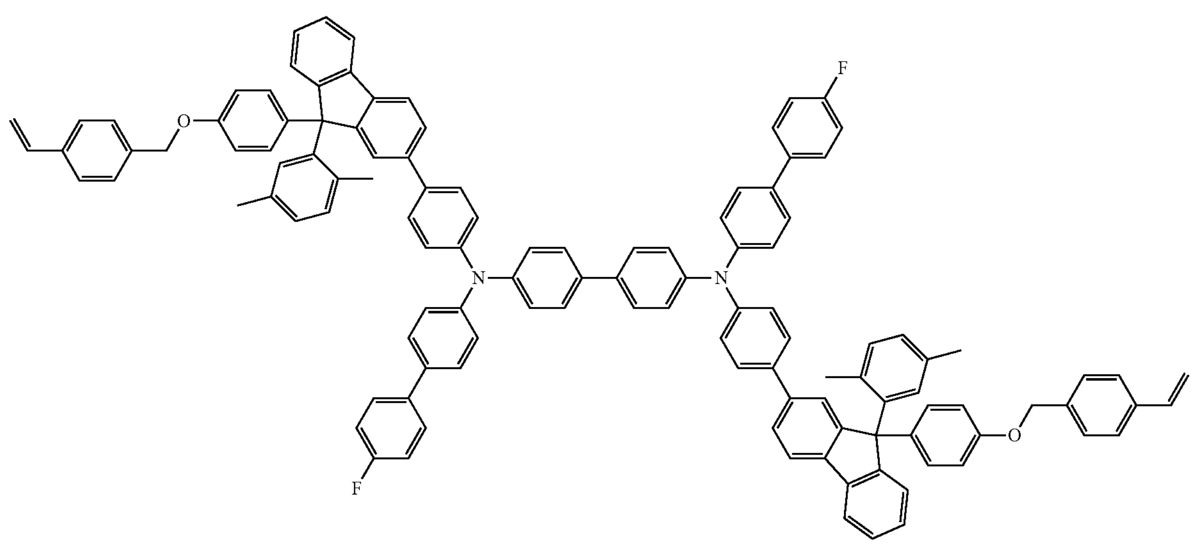

-continued
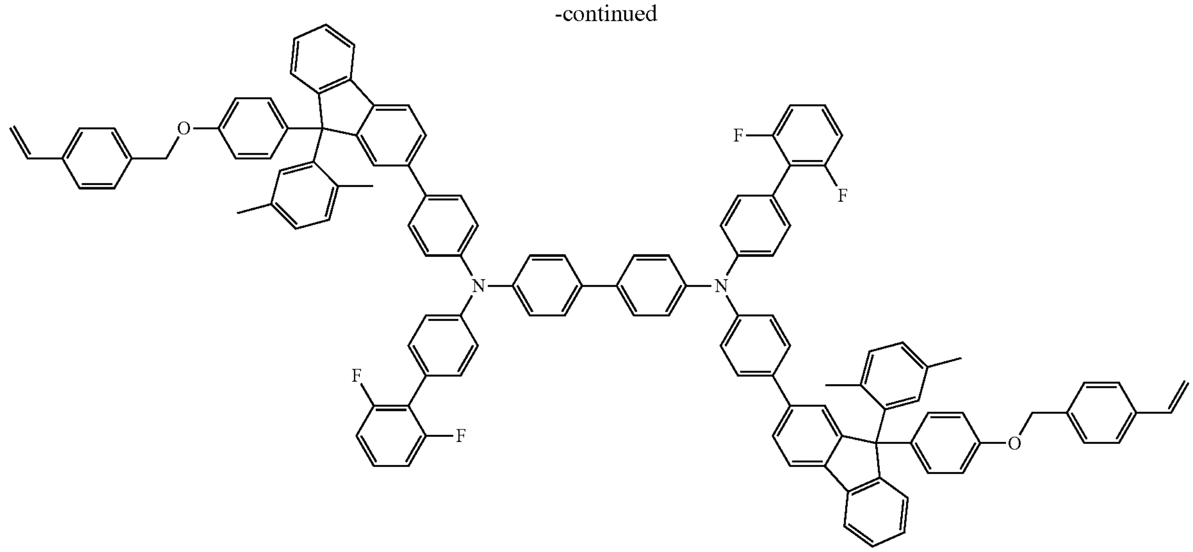
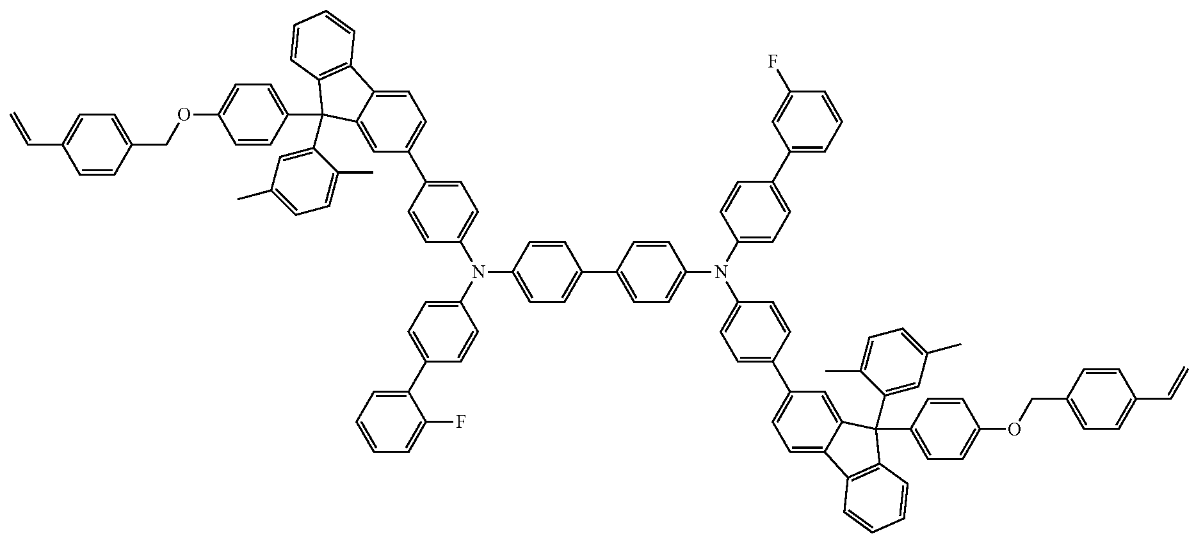
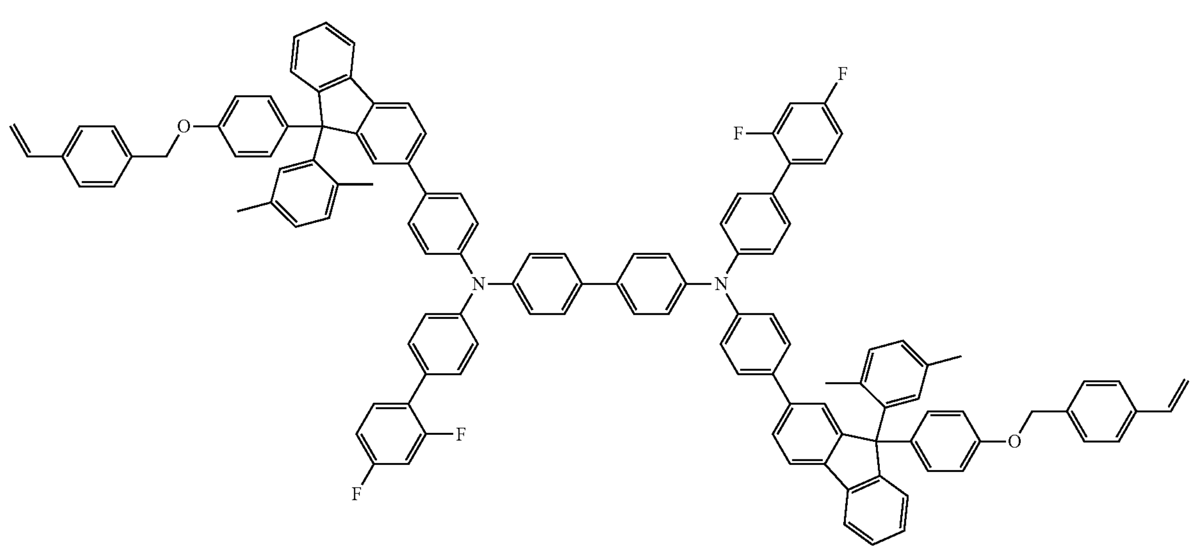

-continued
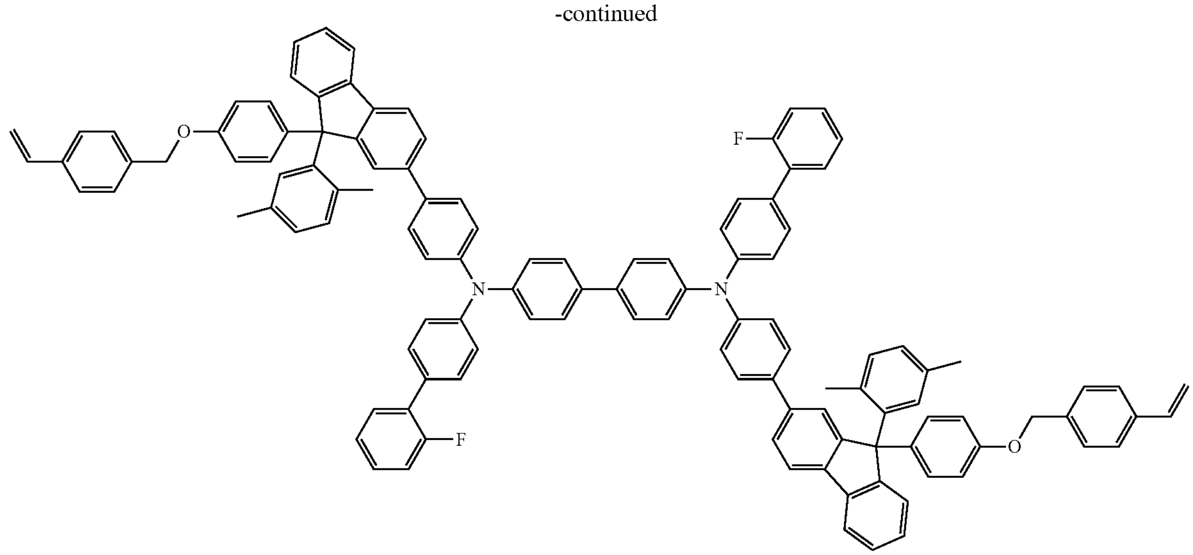
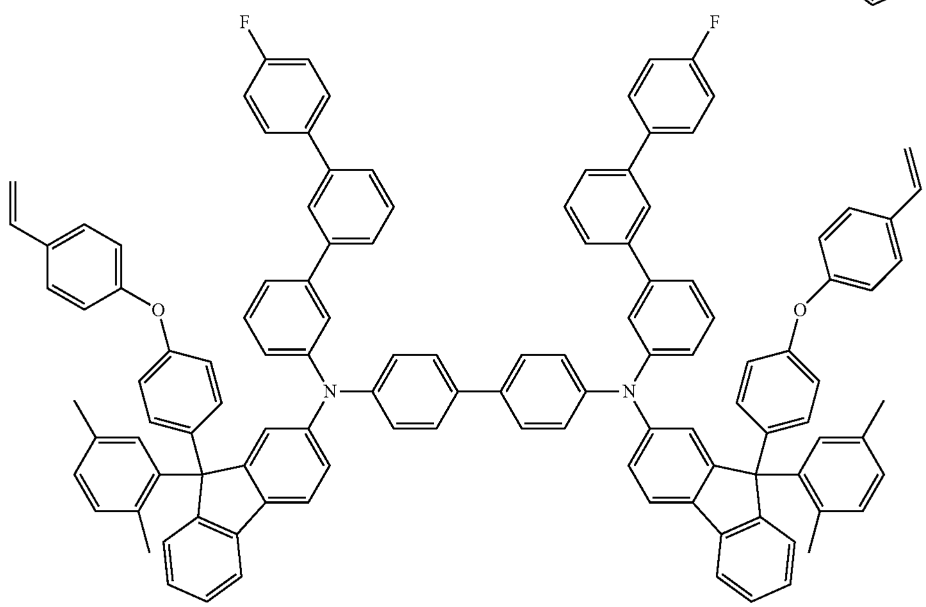
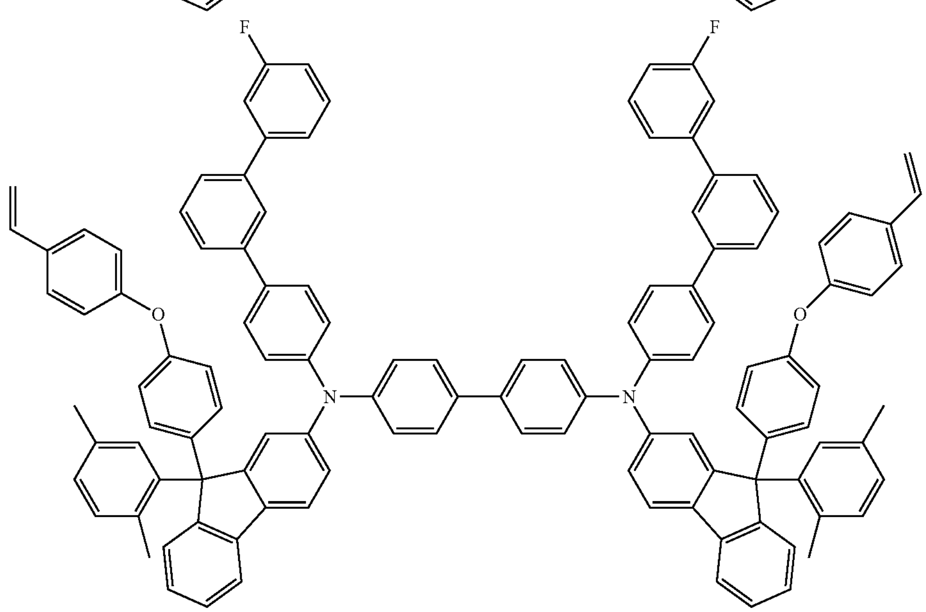

-continued
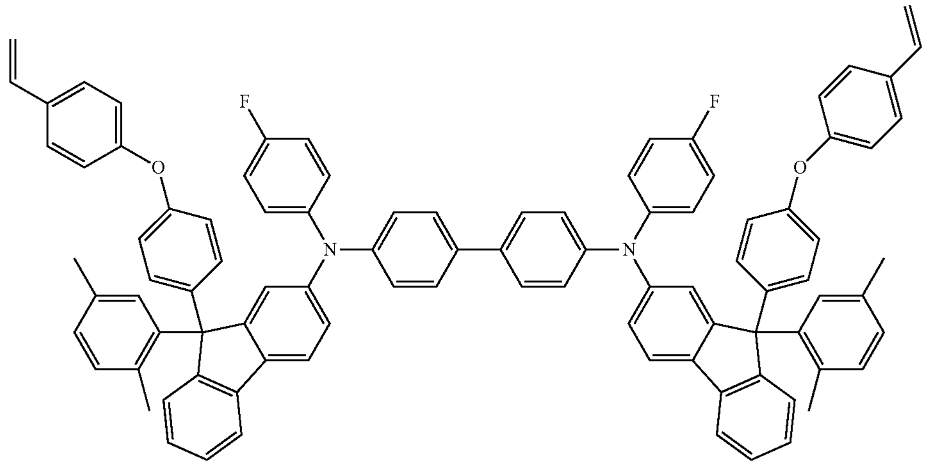
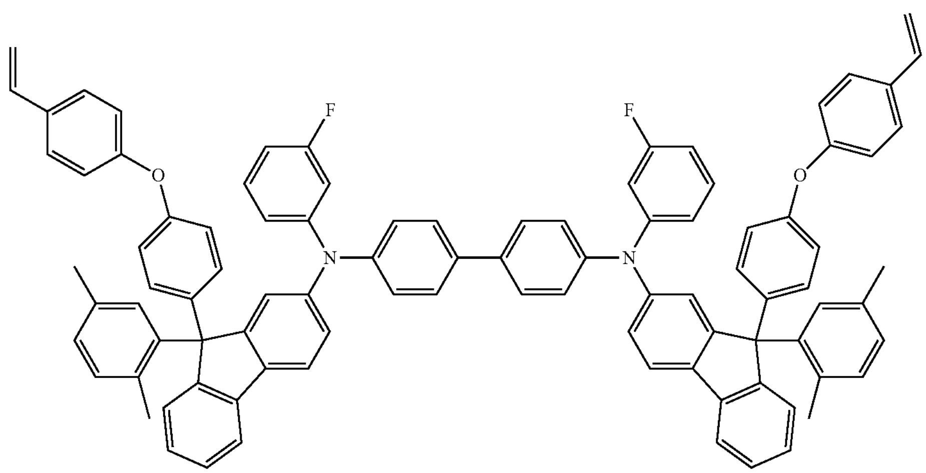
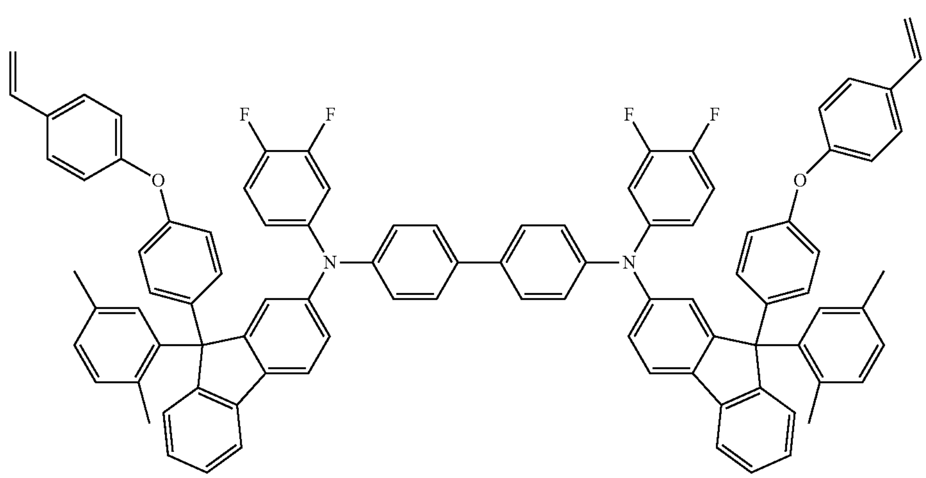

-continued
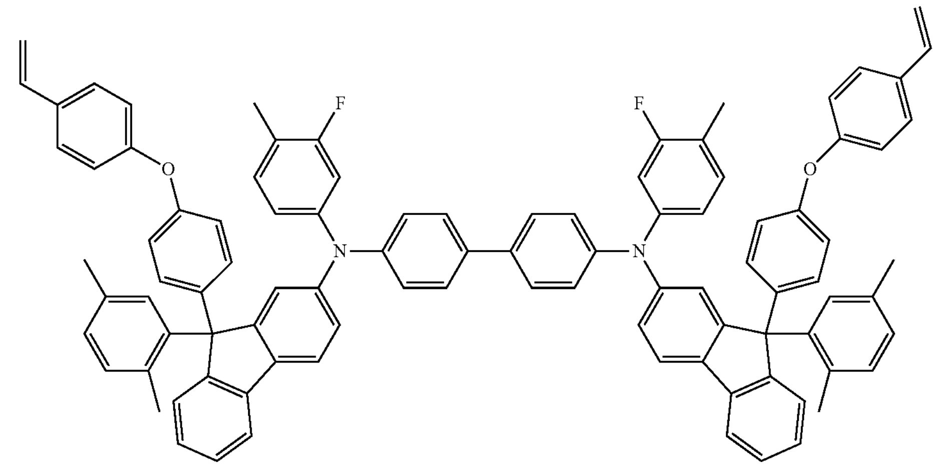
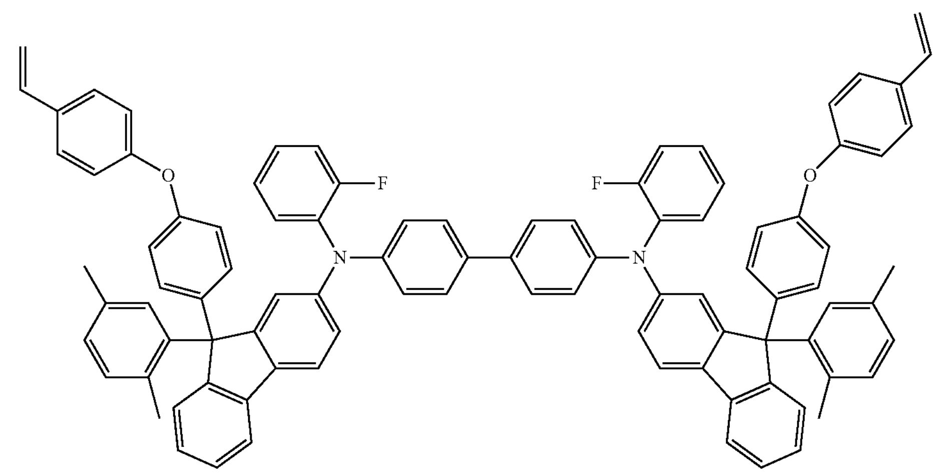
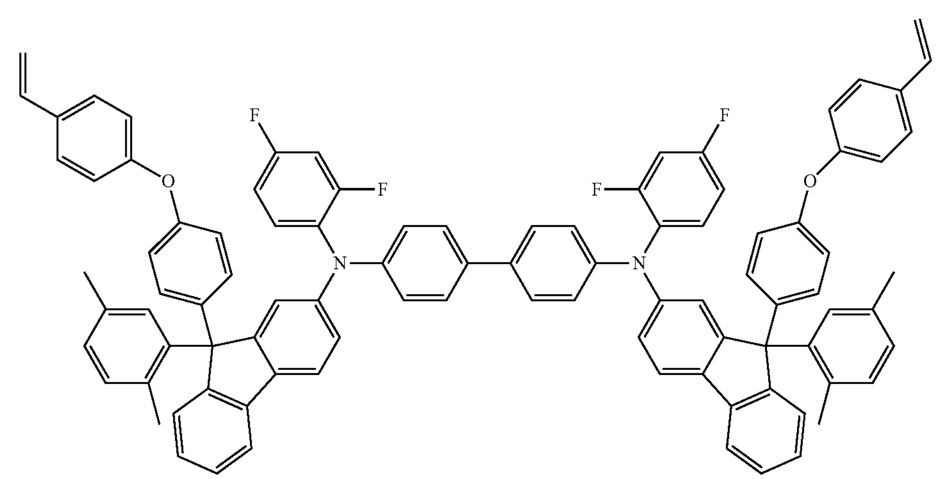

-continued
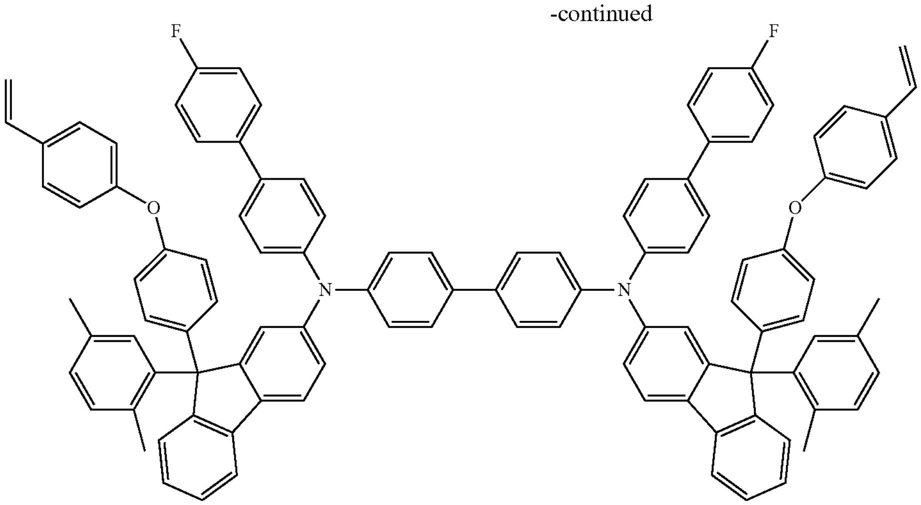
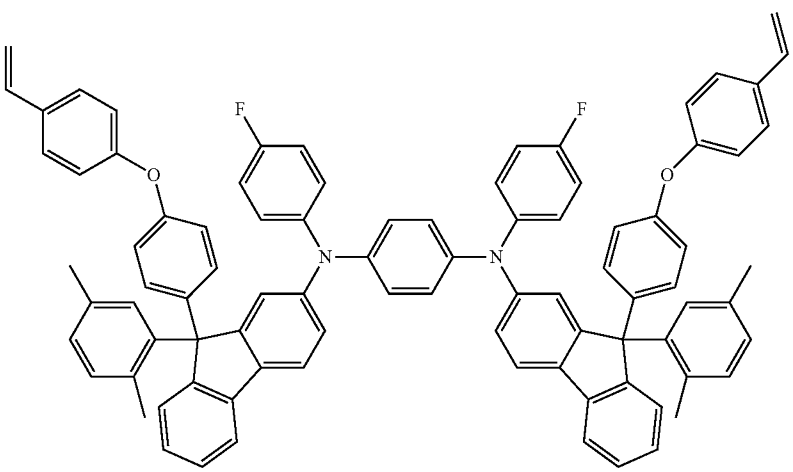
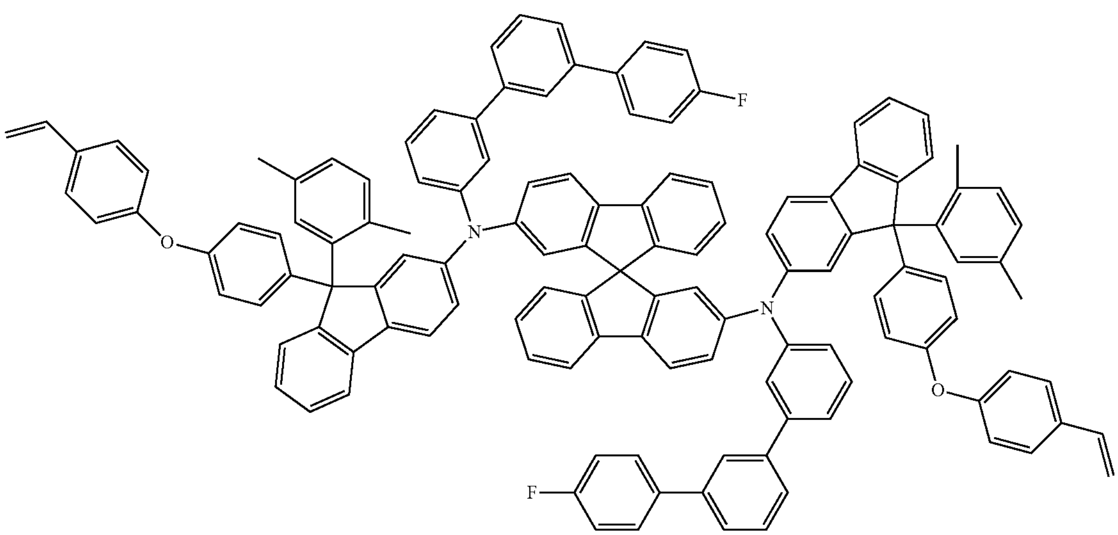

-continued
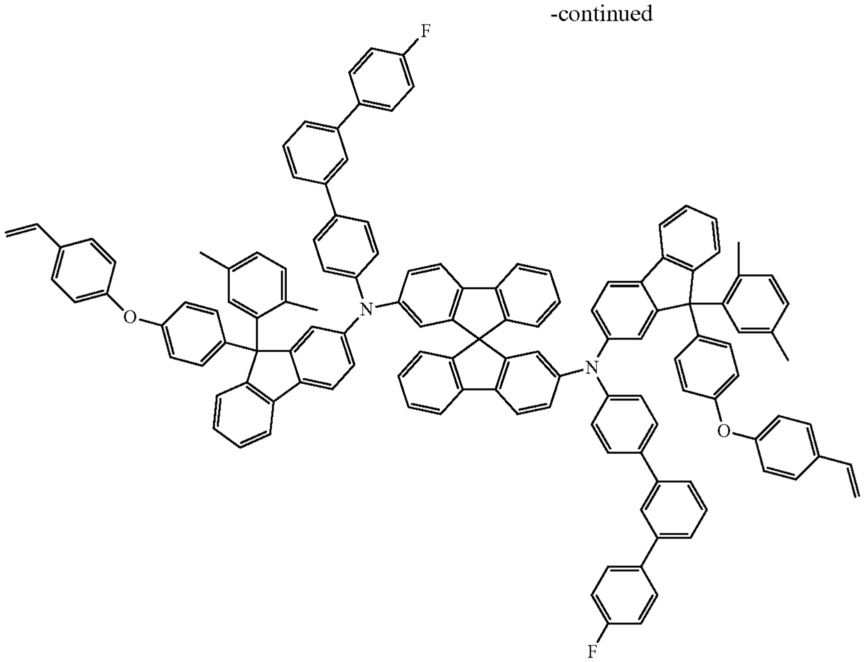
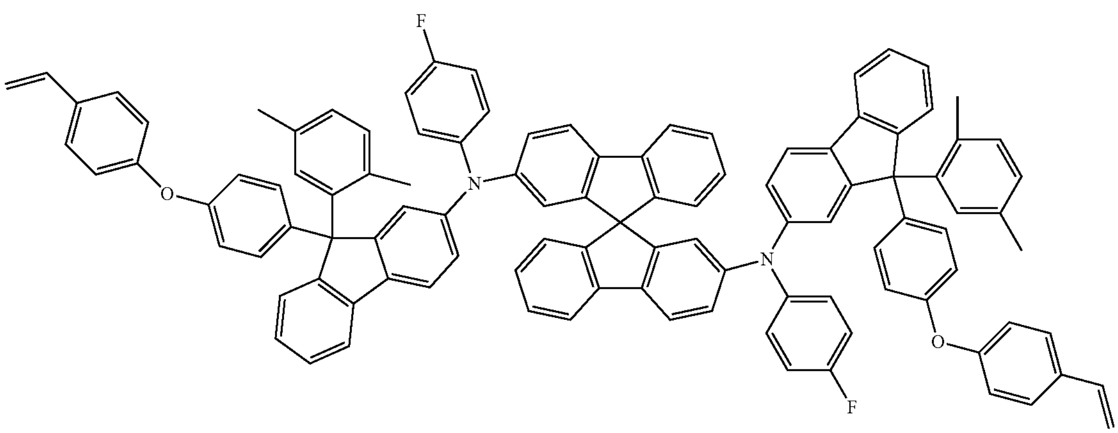
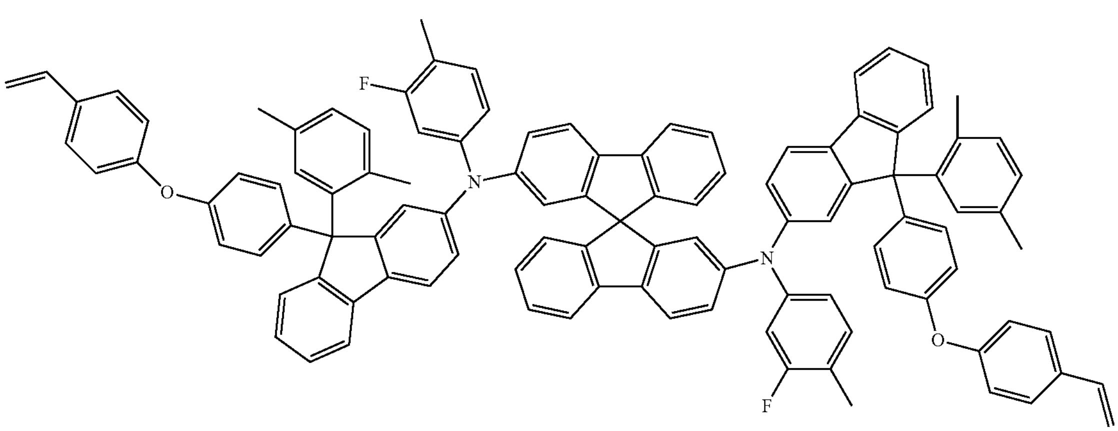

-continued
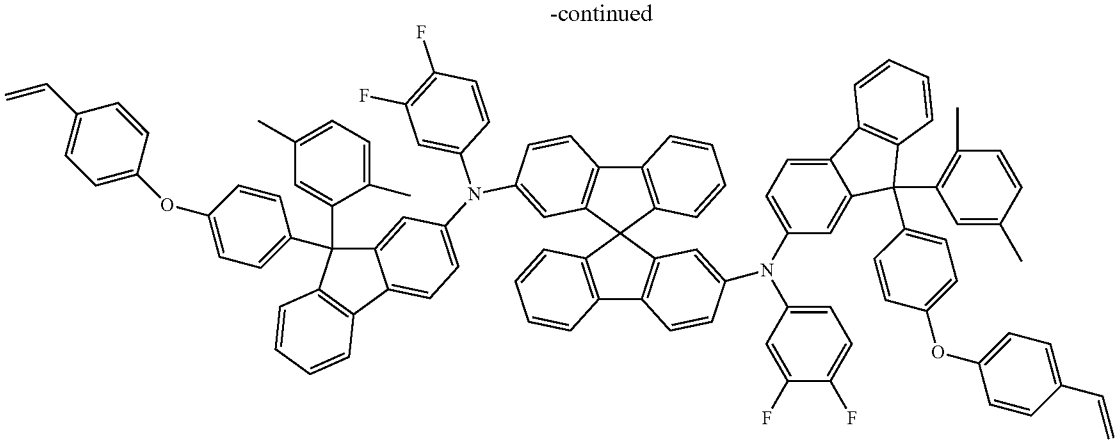
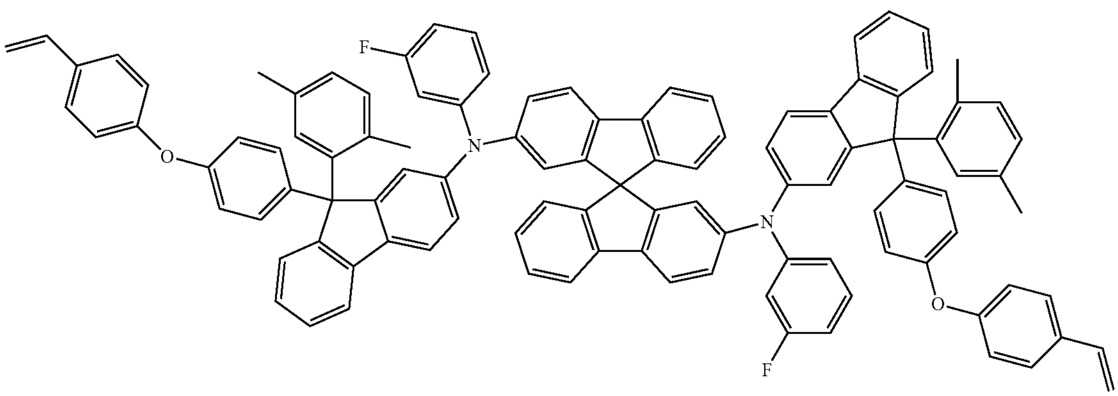
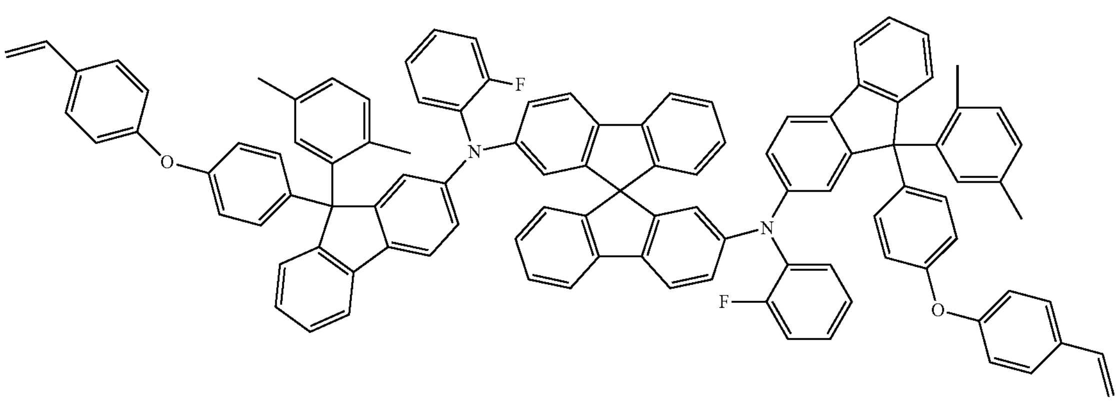
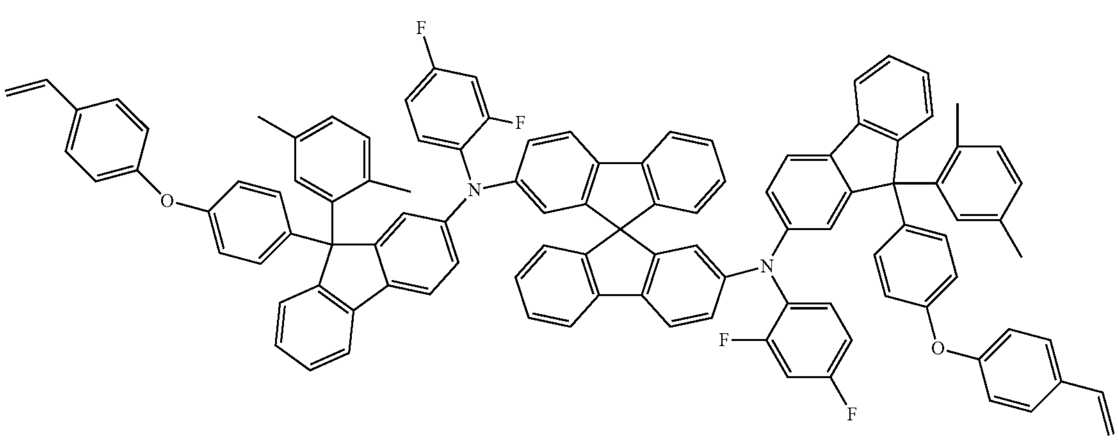

-continued
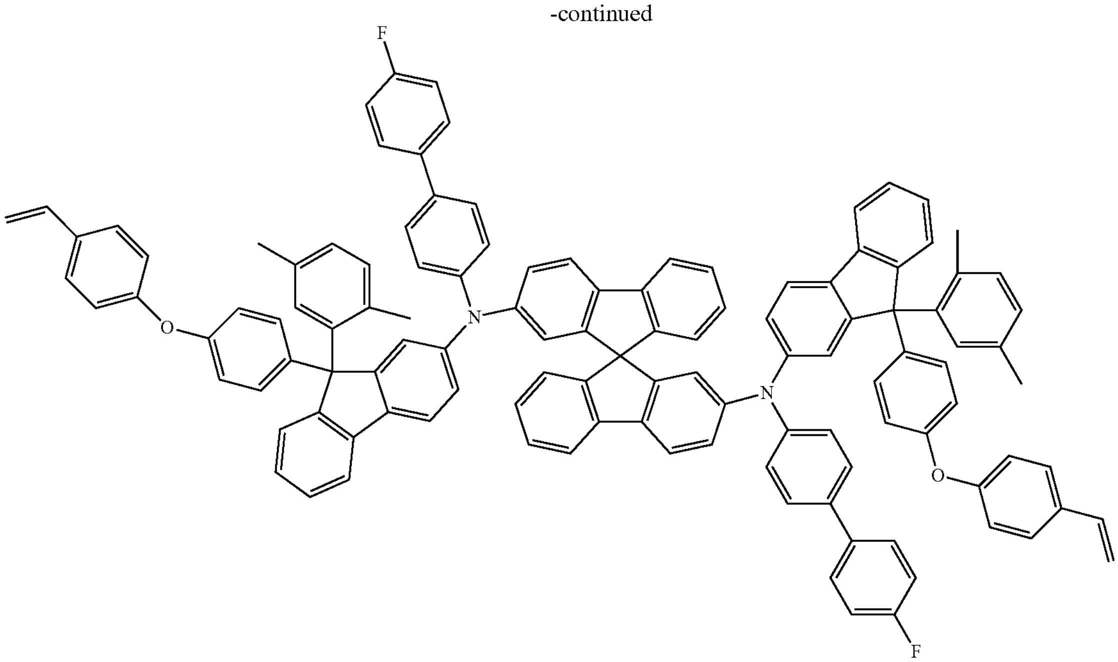
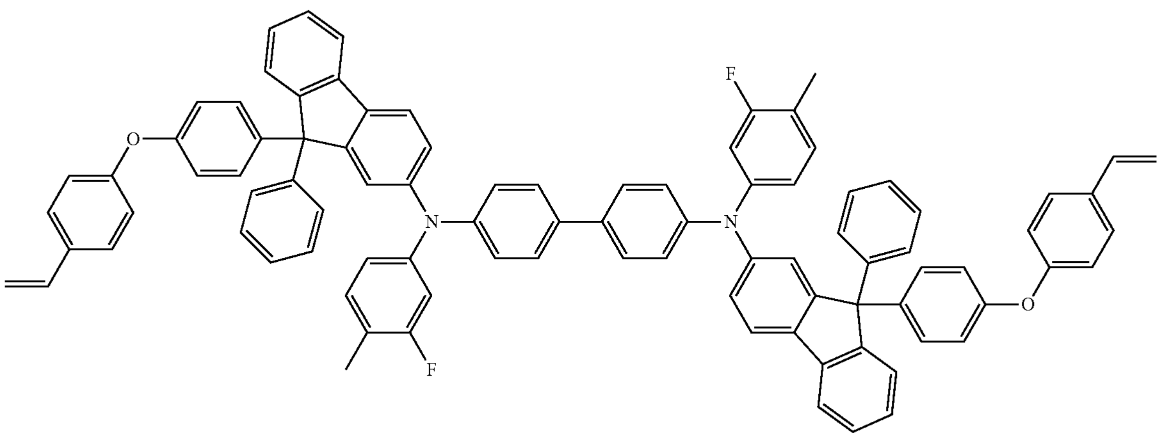
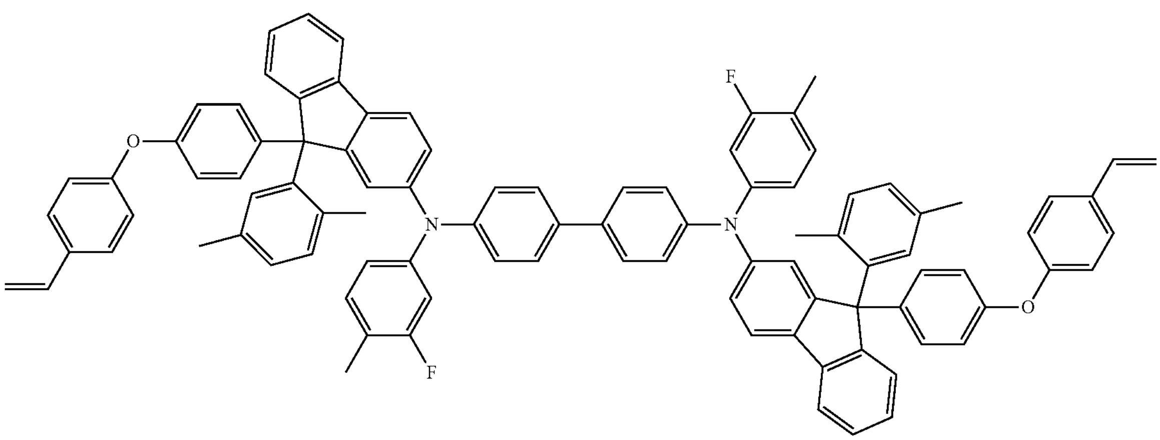

-continued
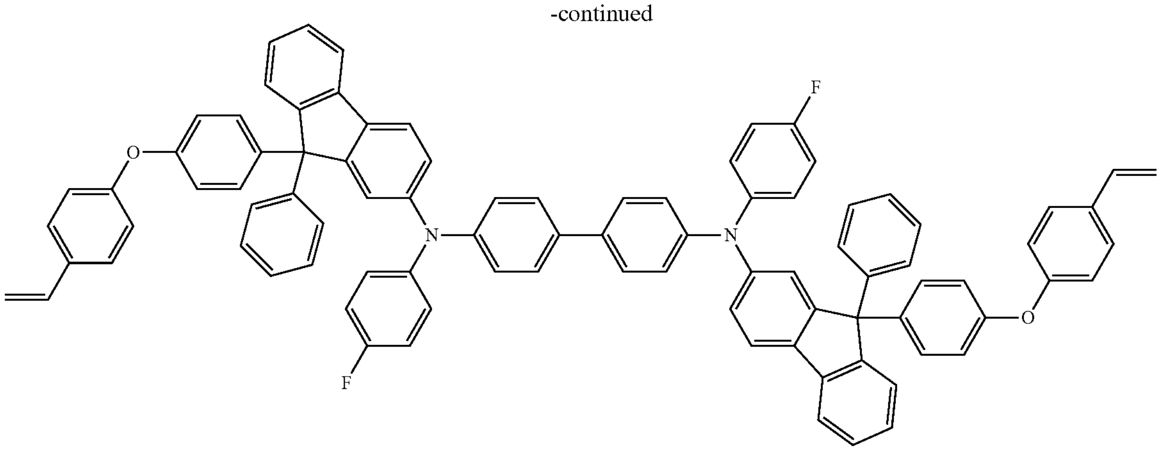
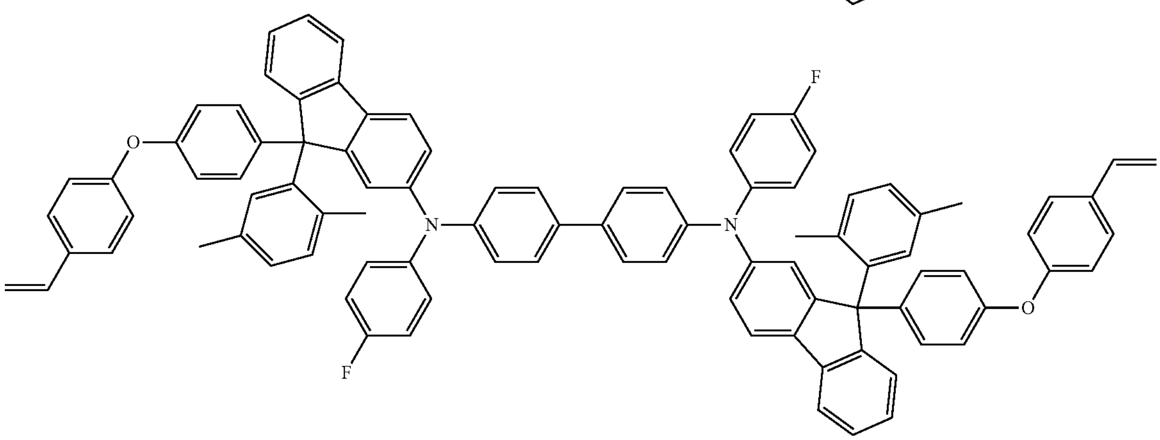
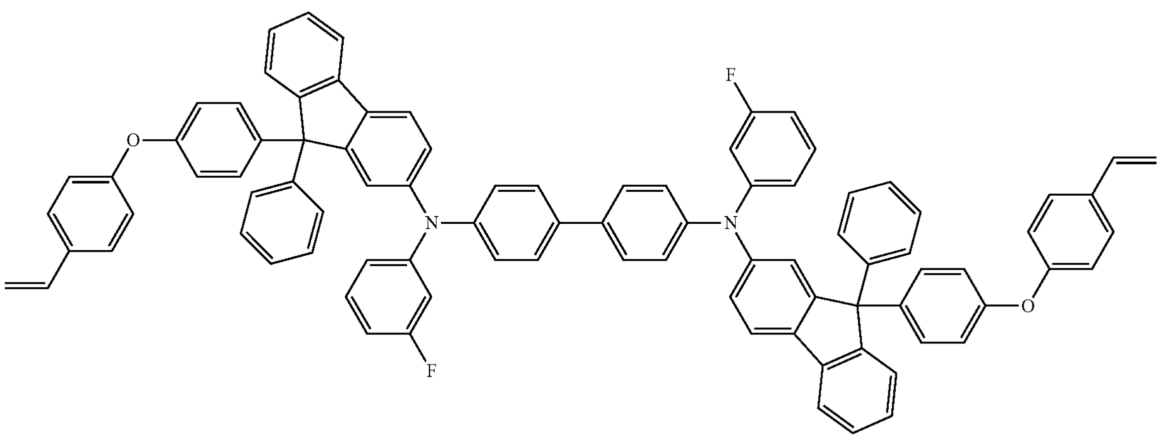
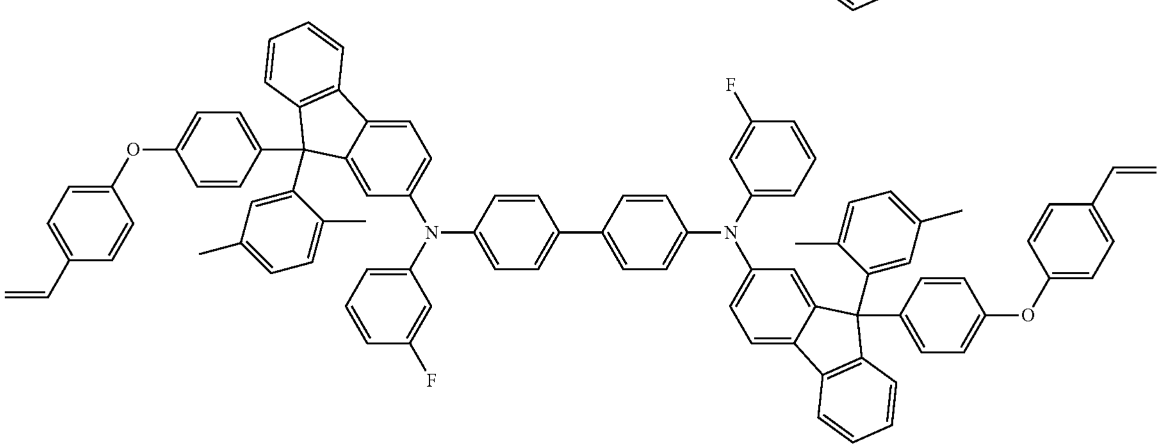

-continued
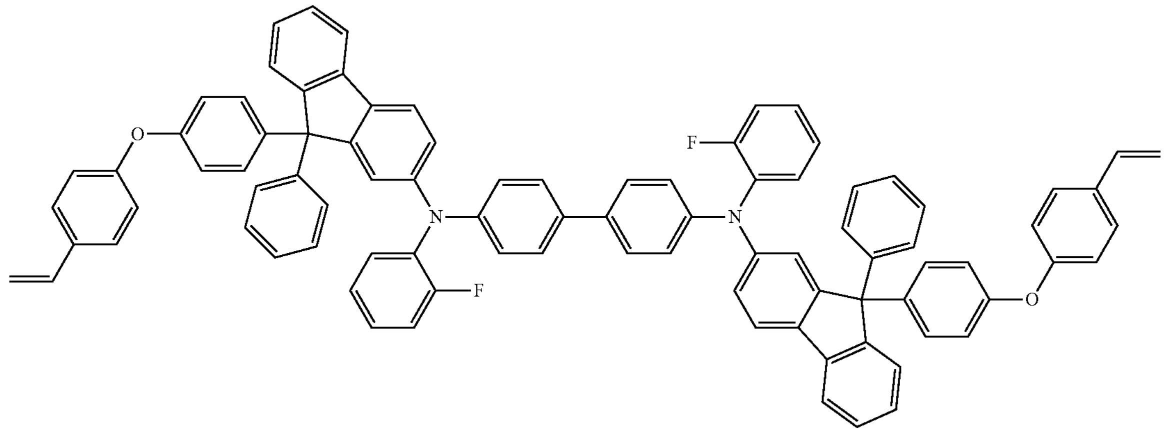
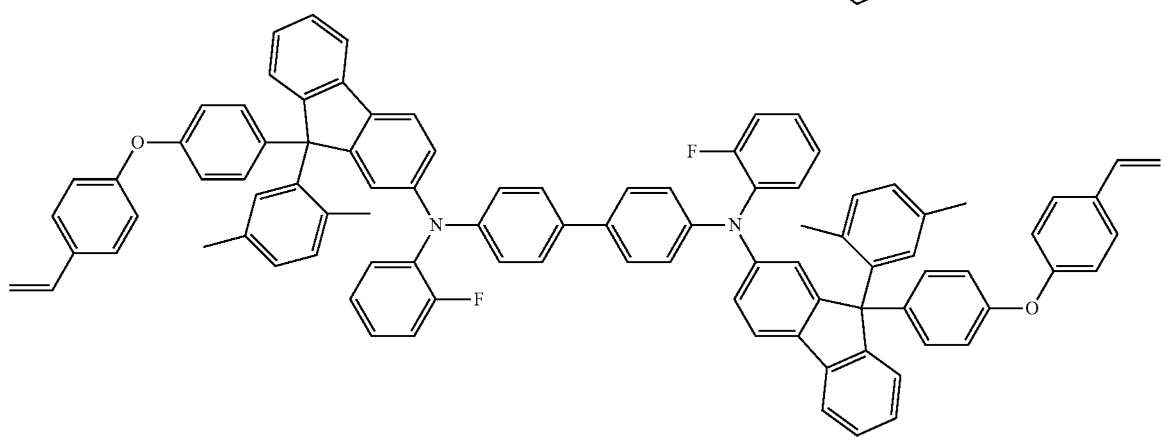
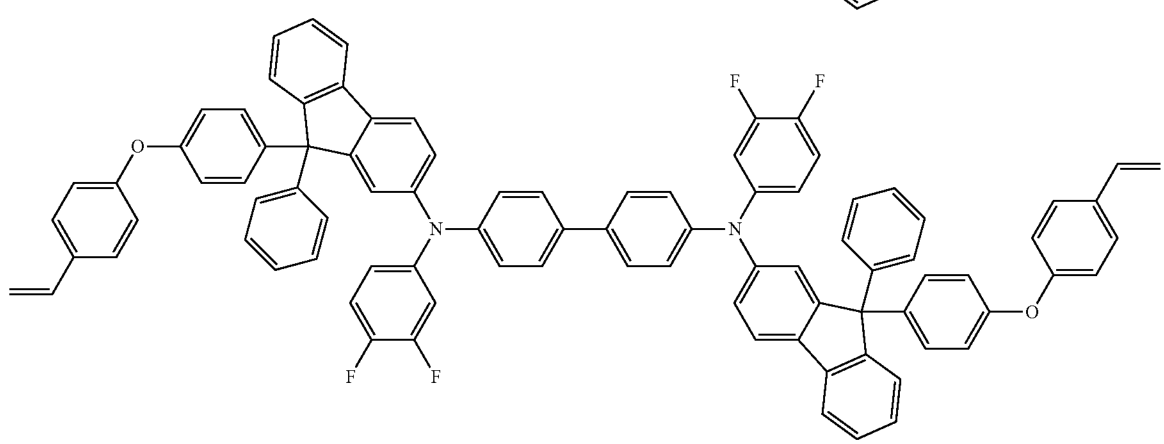
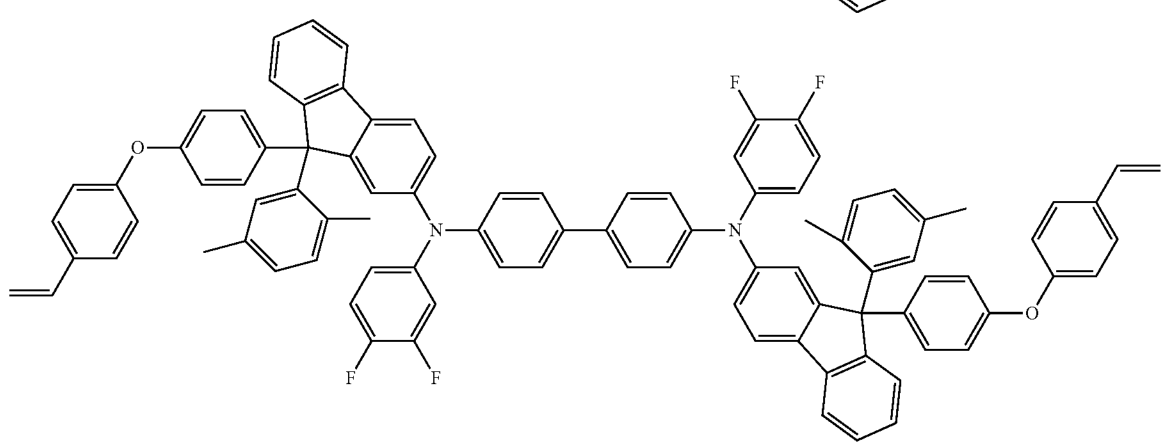

-continued
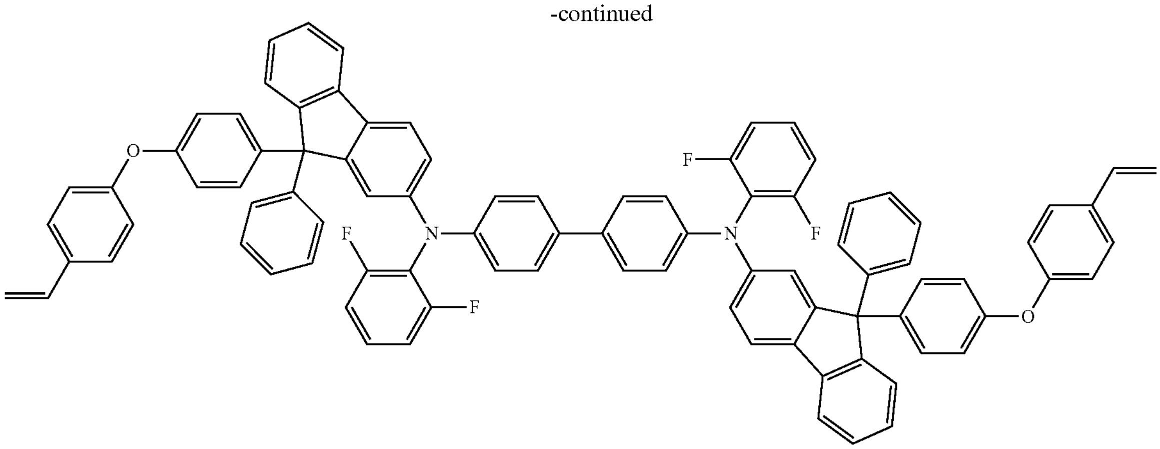
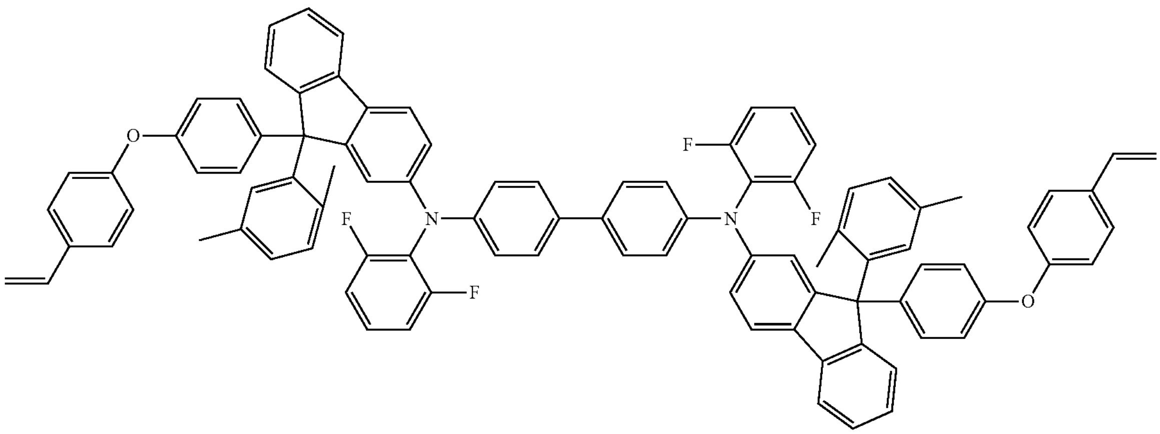
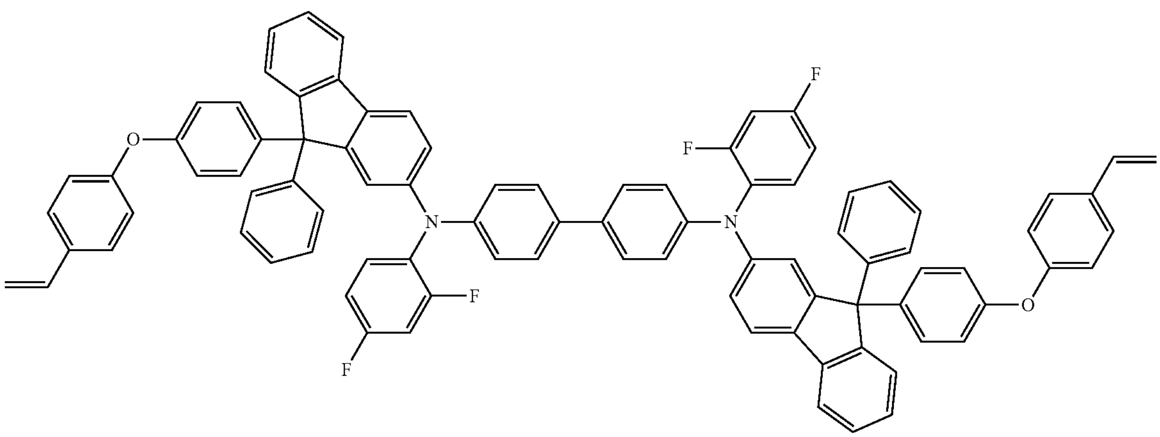
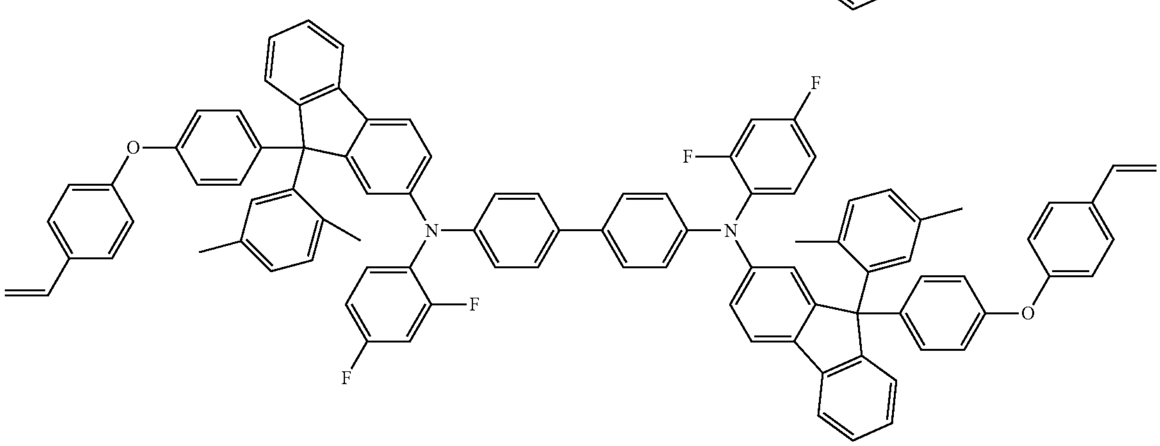

-continued
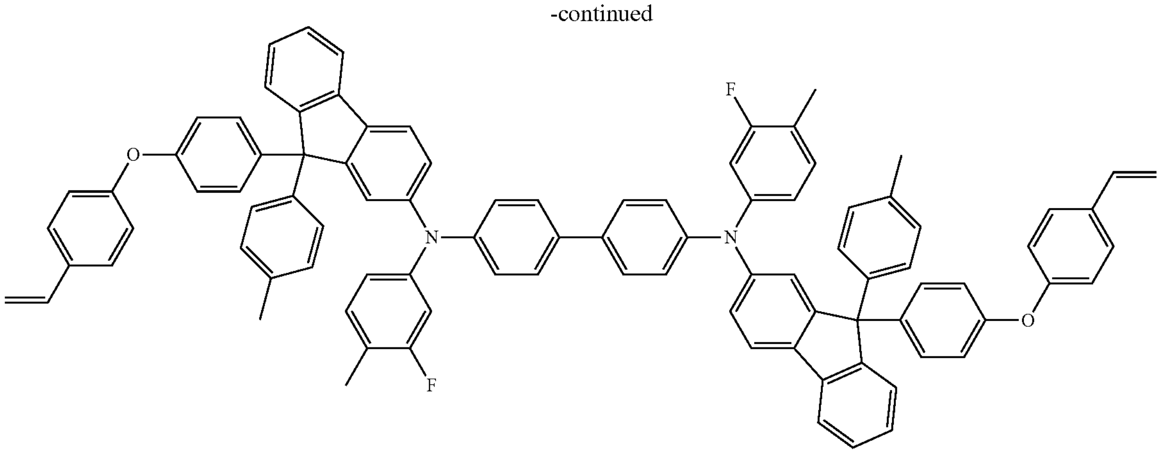
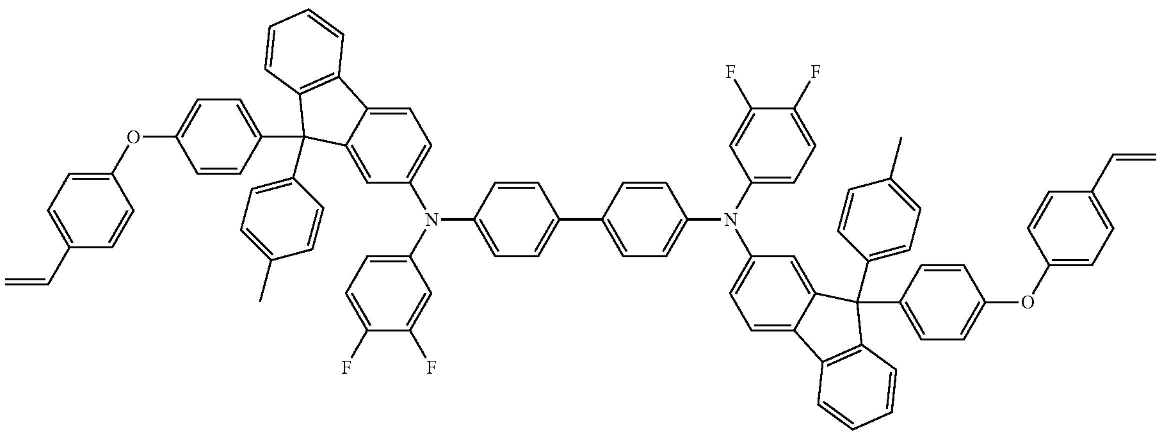
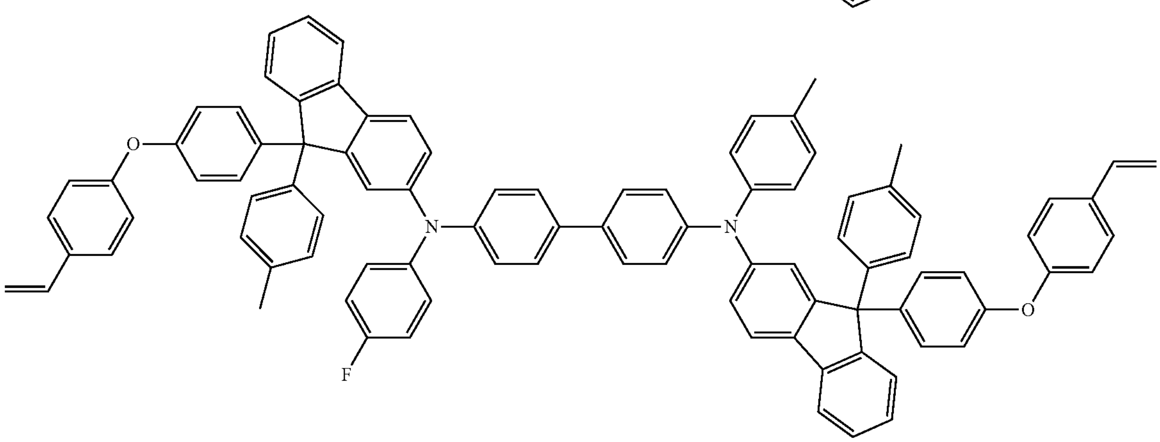
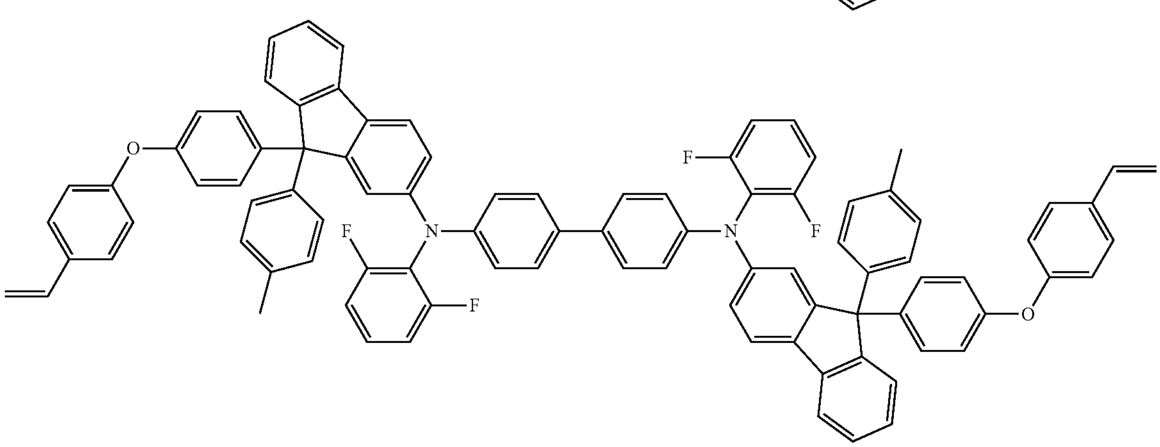

-continued
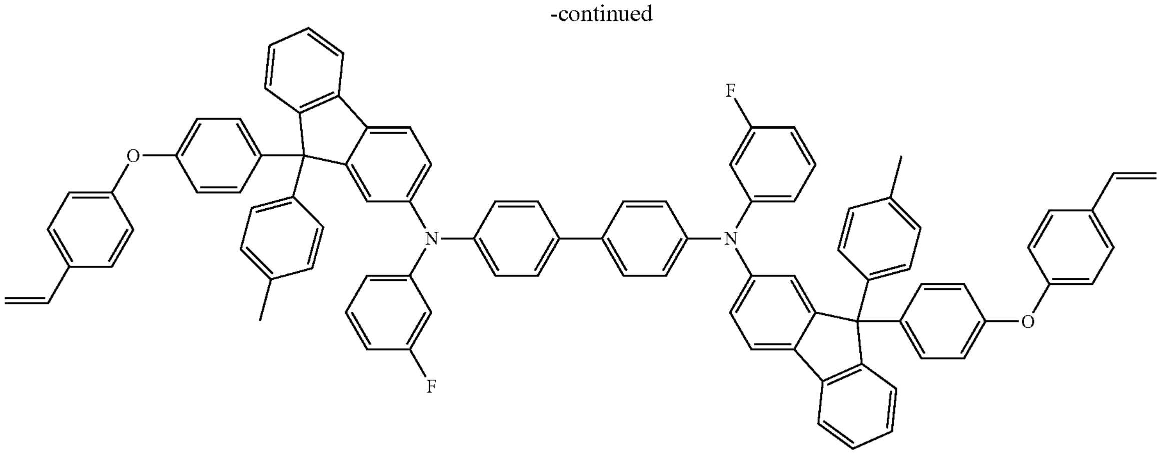
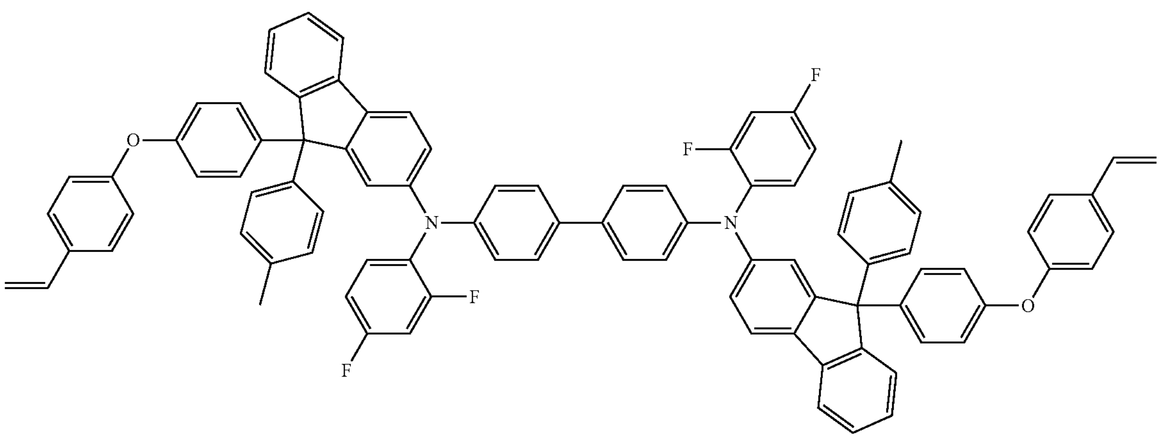
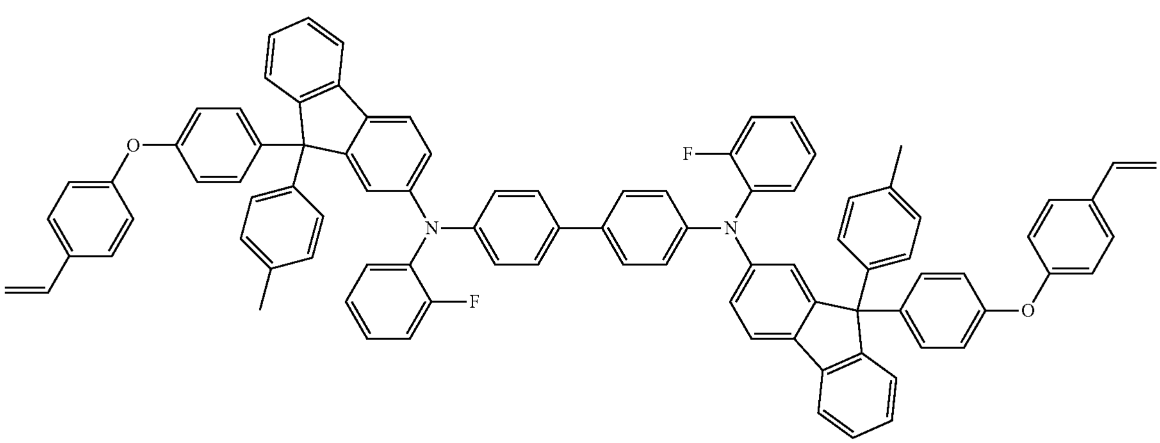

-continued
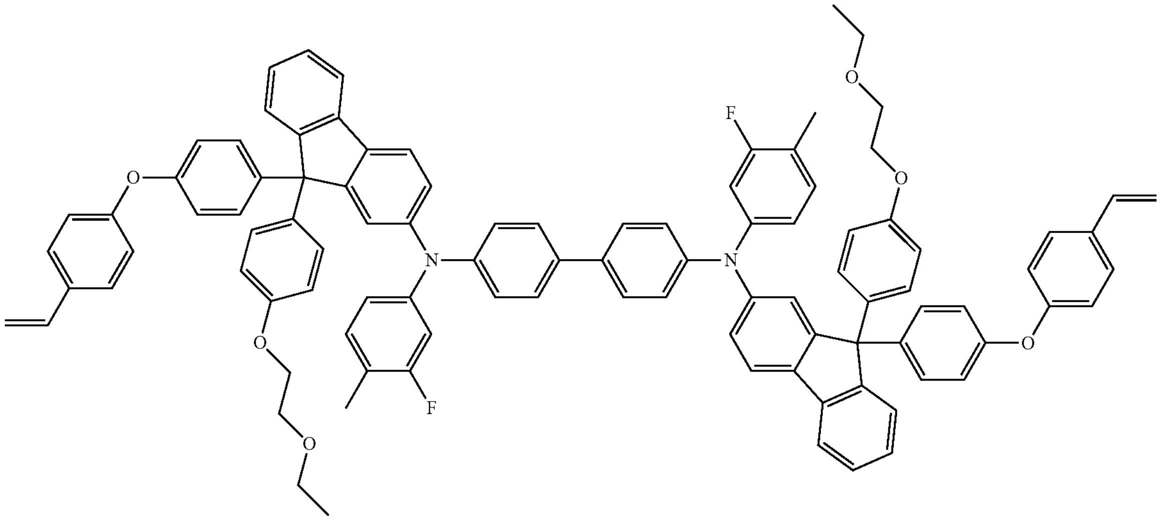
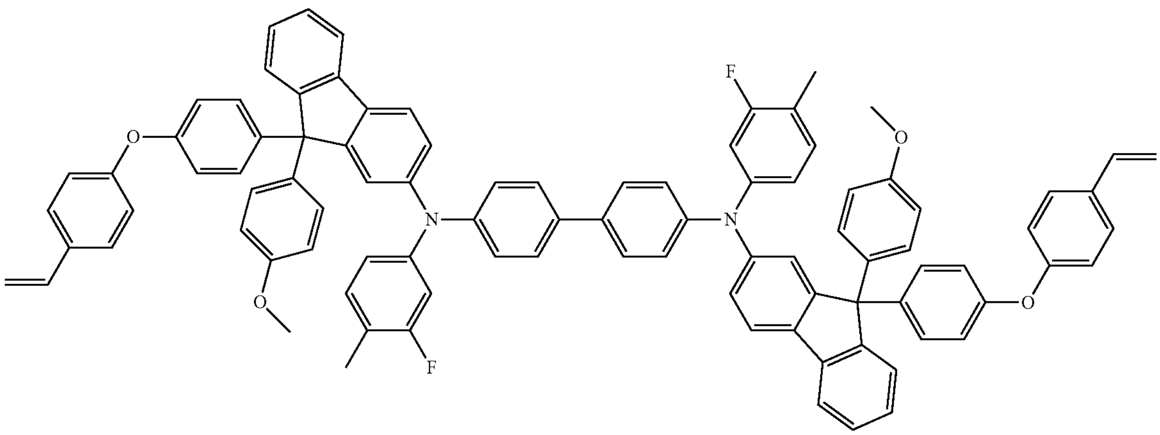
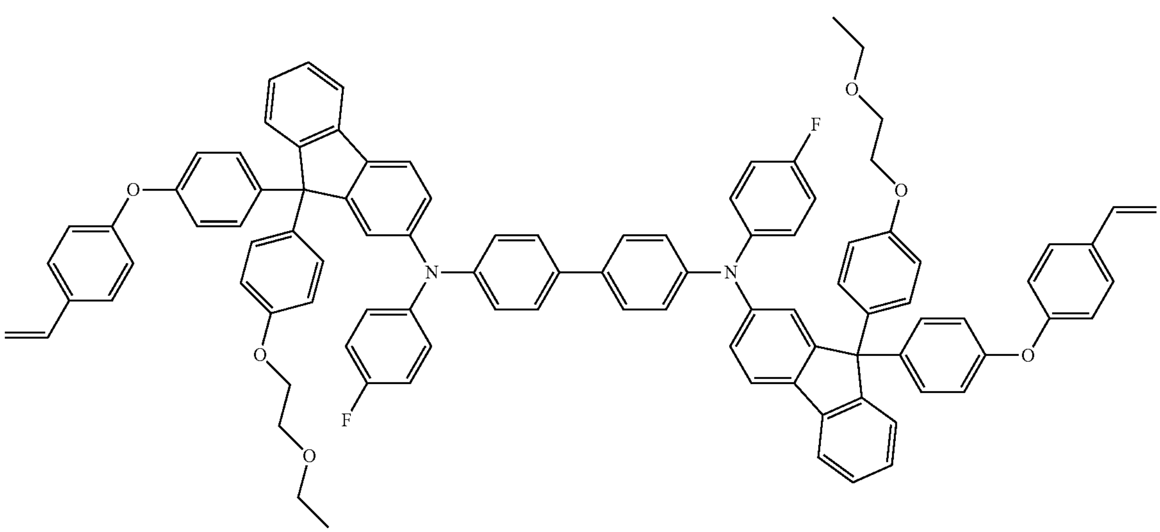

-continued
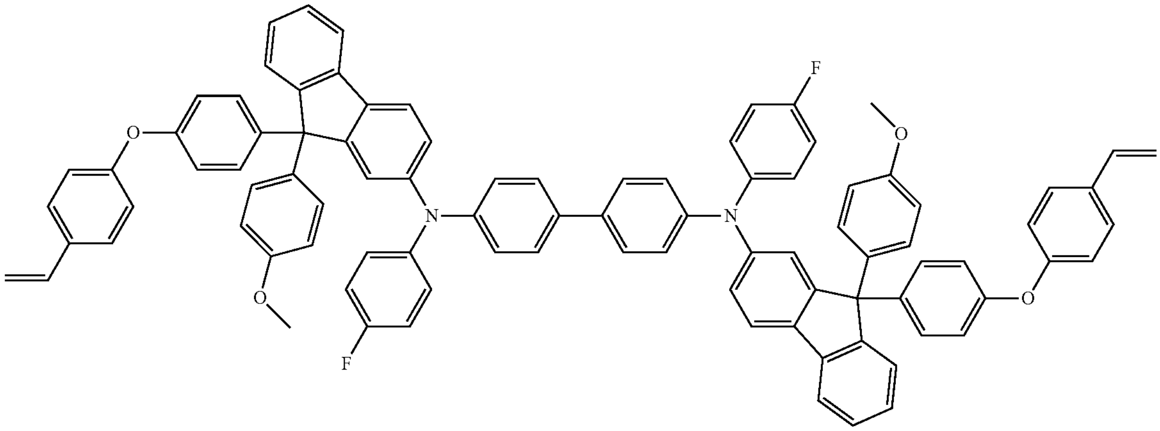
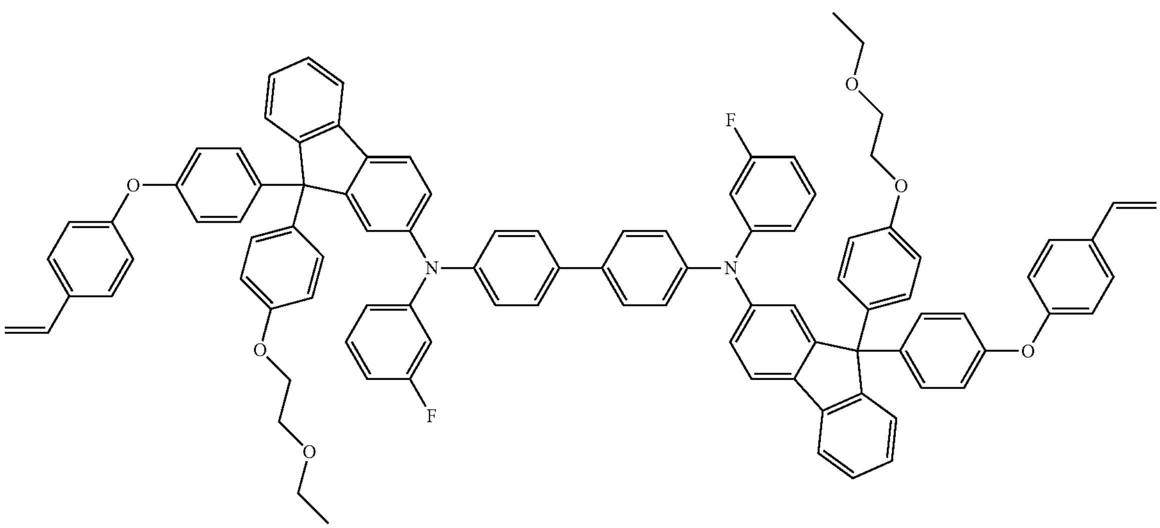
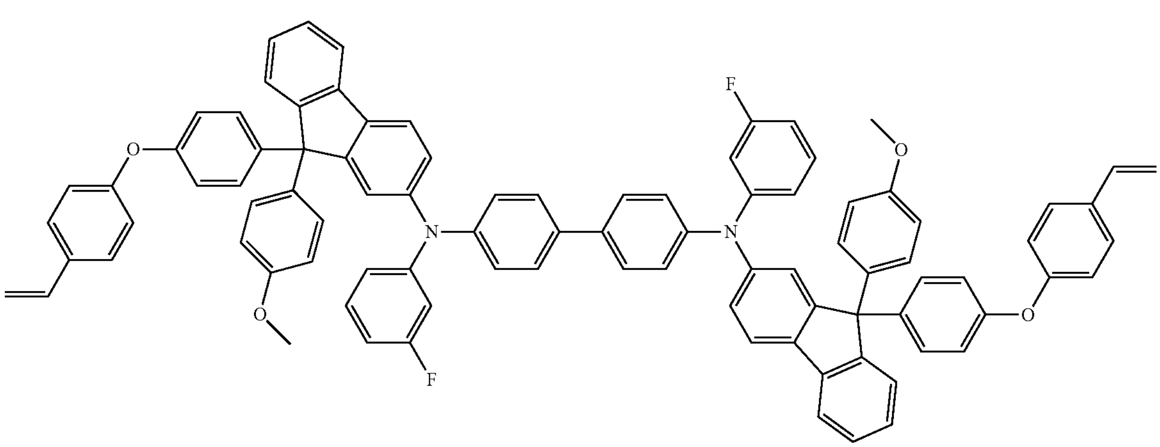

-continued
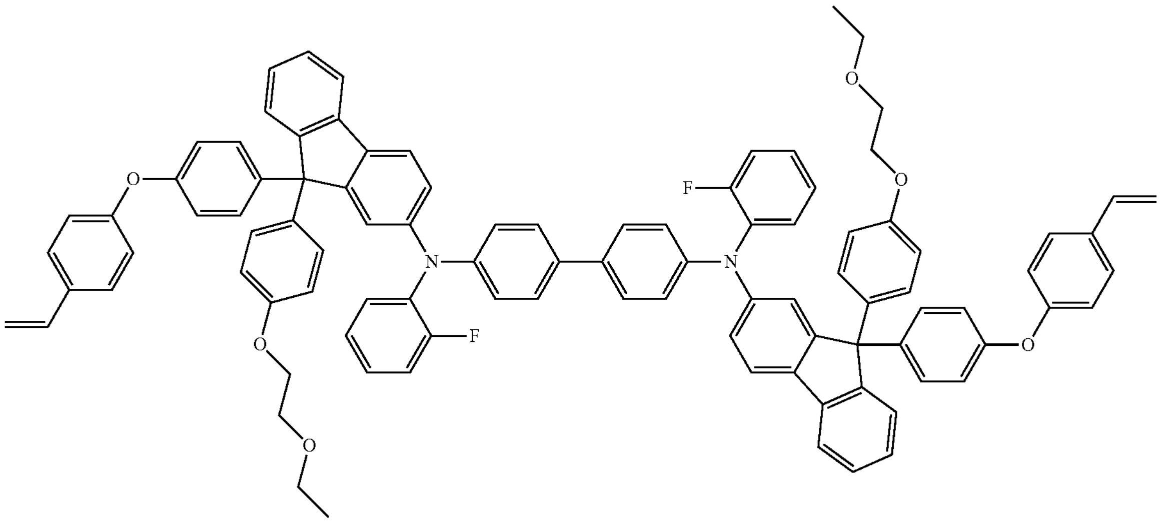
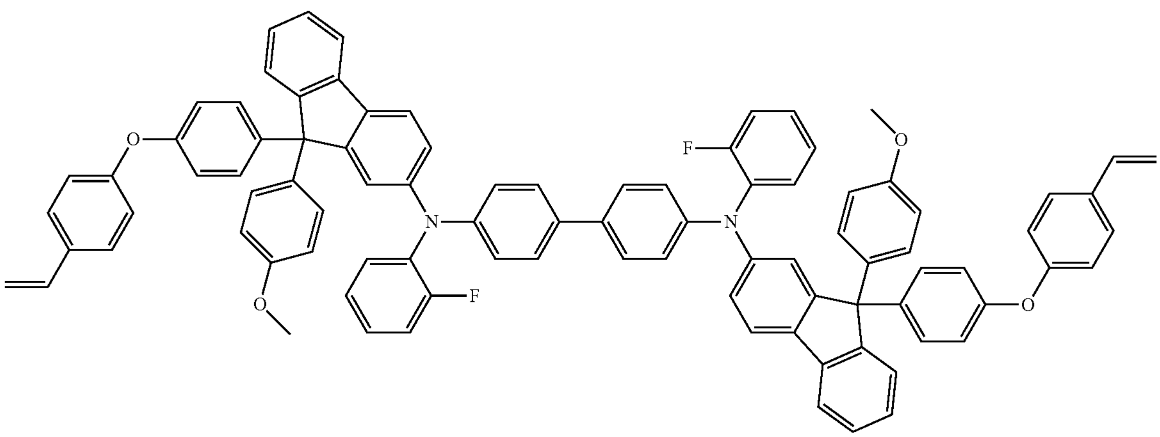
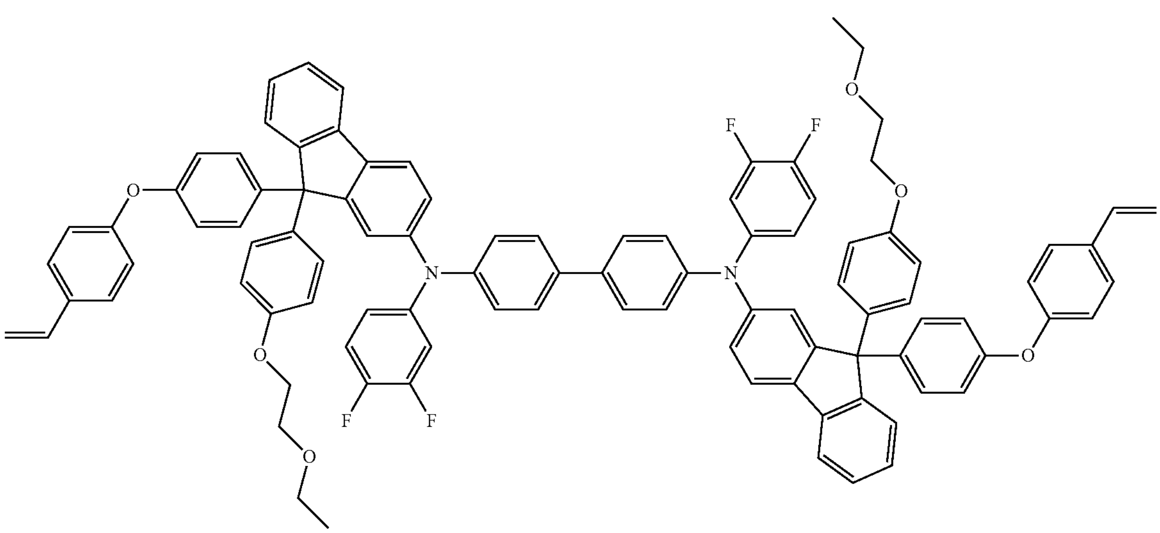

-continued
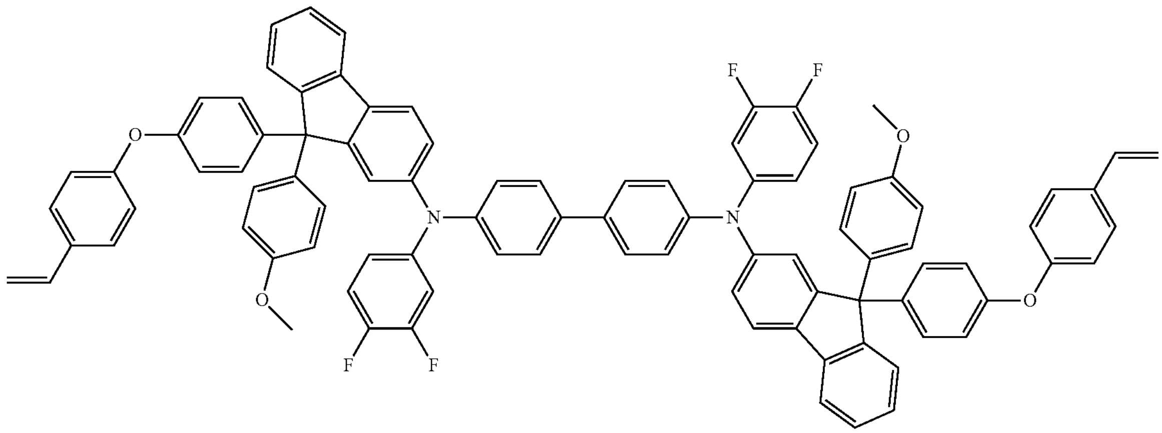
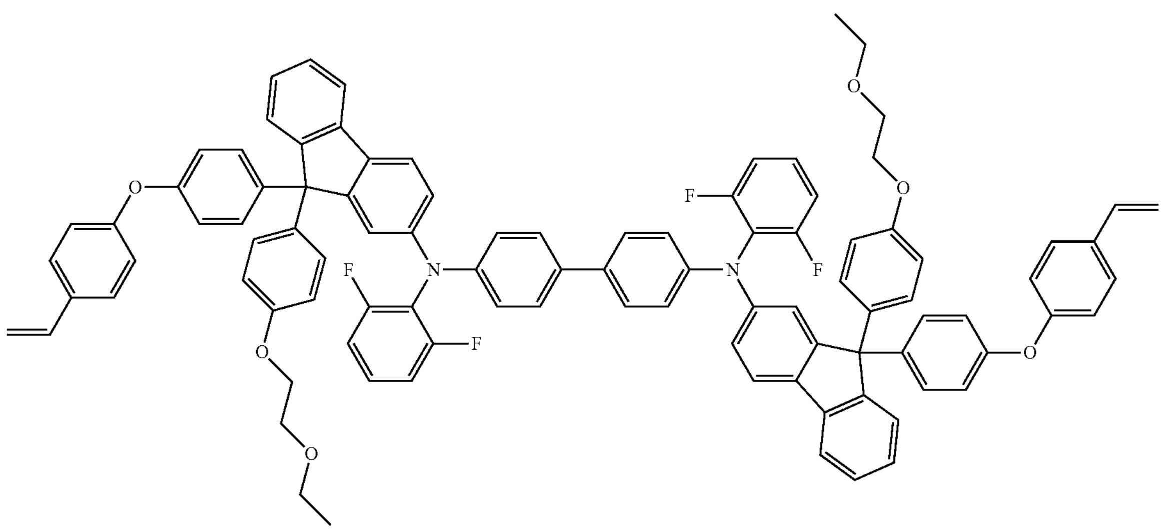
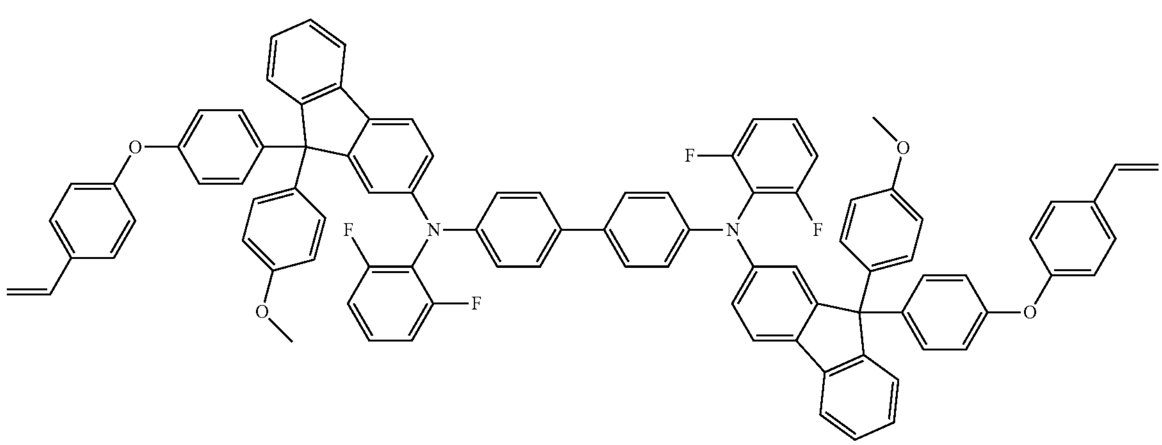

-continued
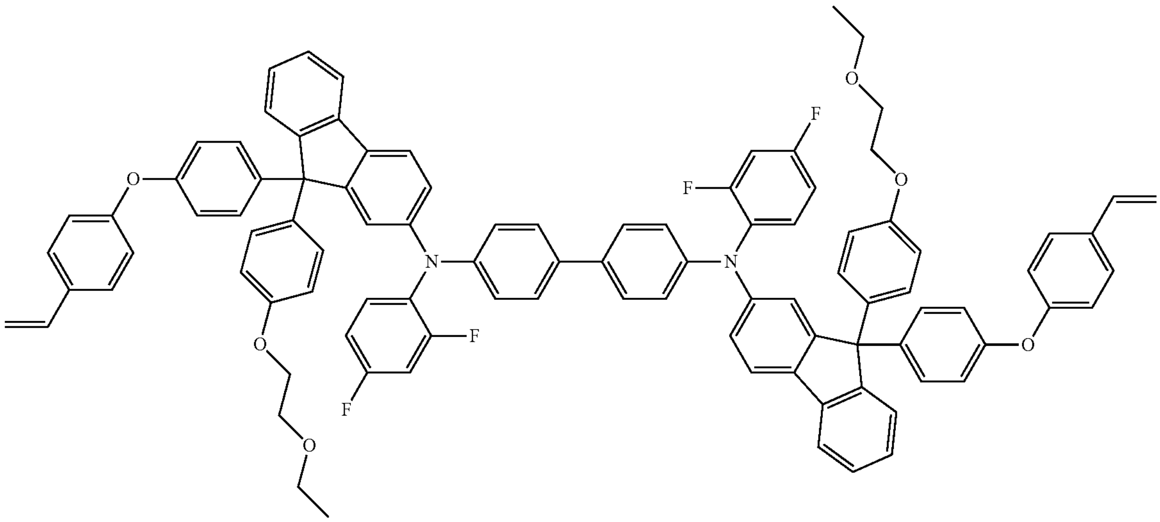
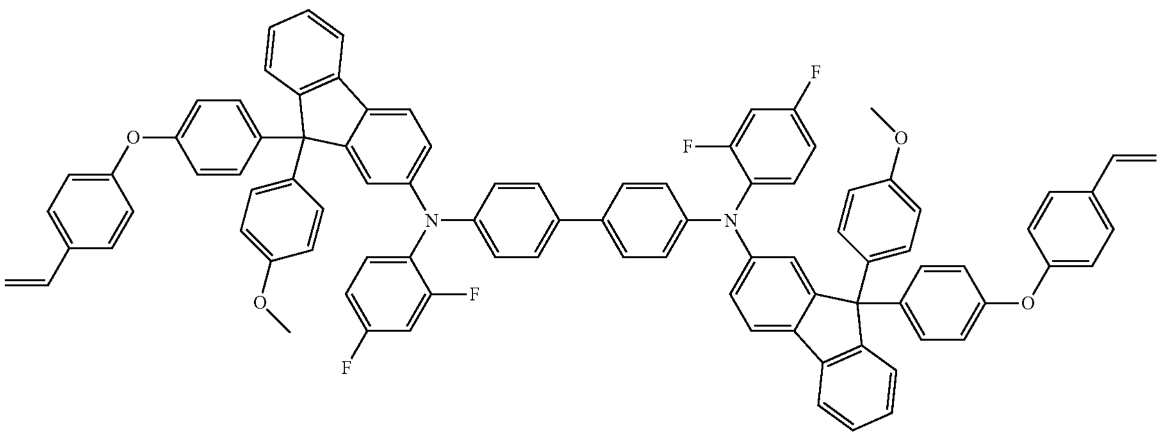
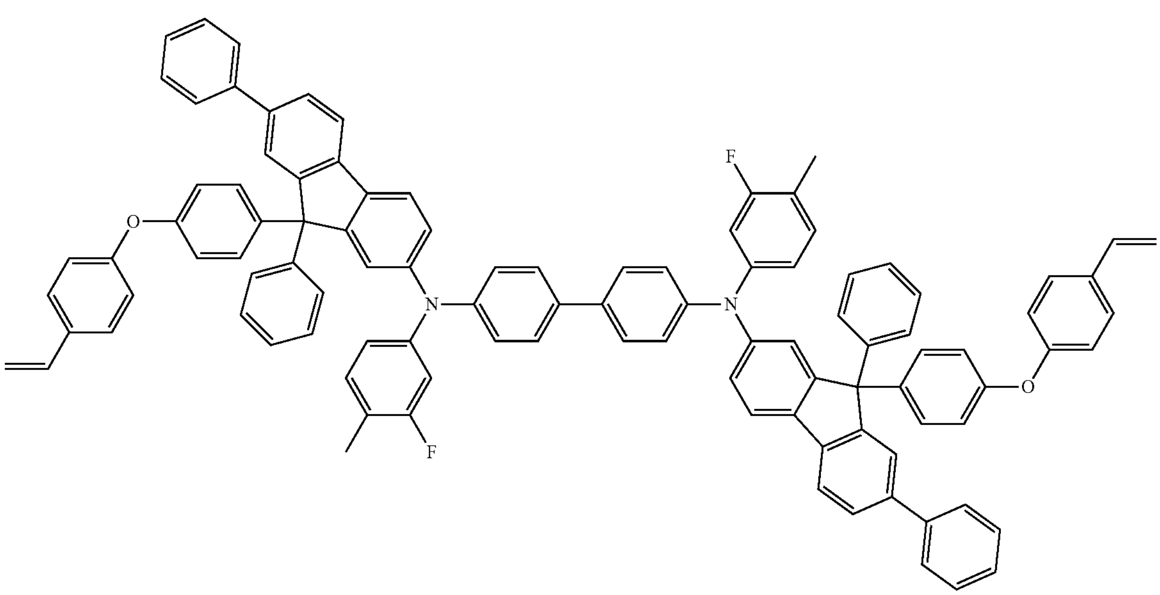

-continued
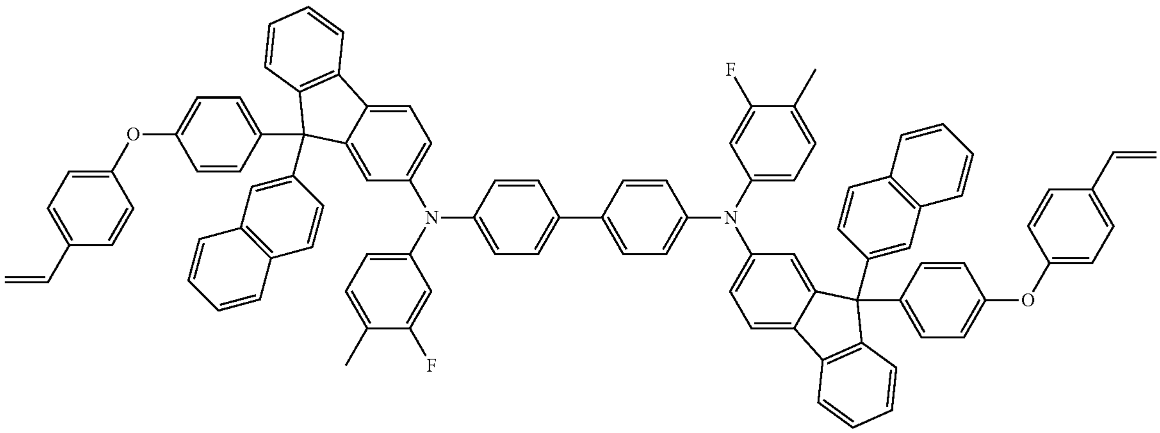
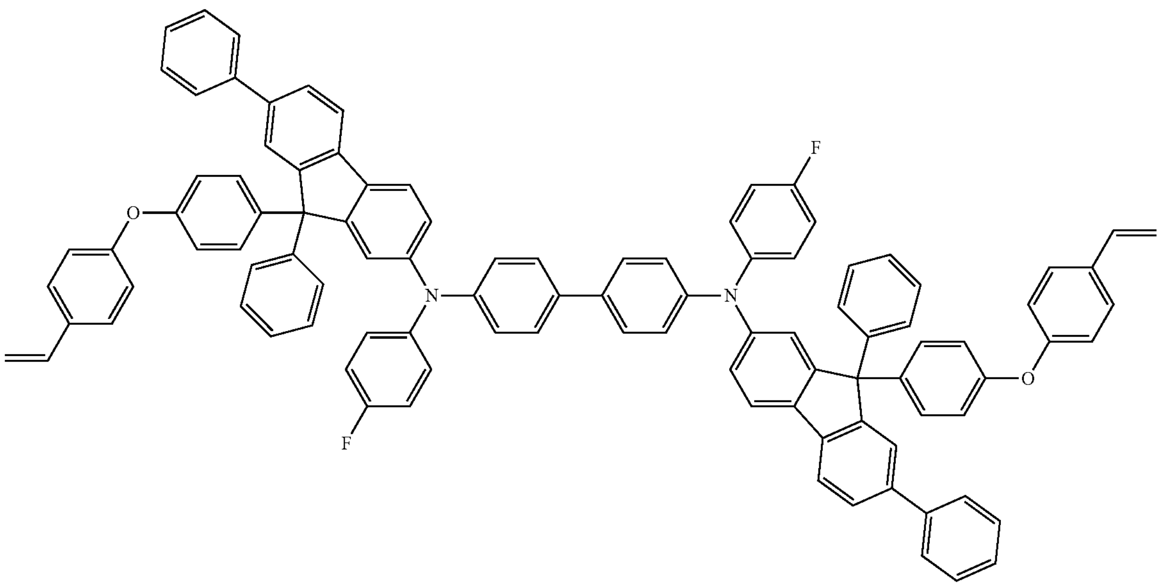
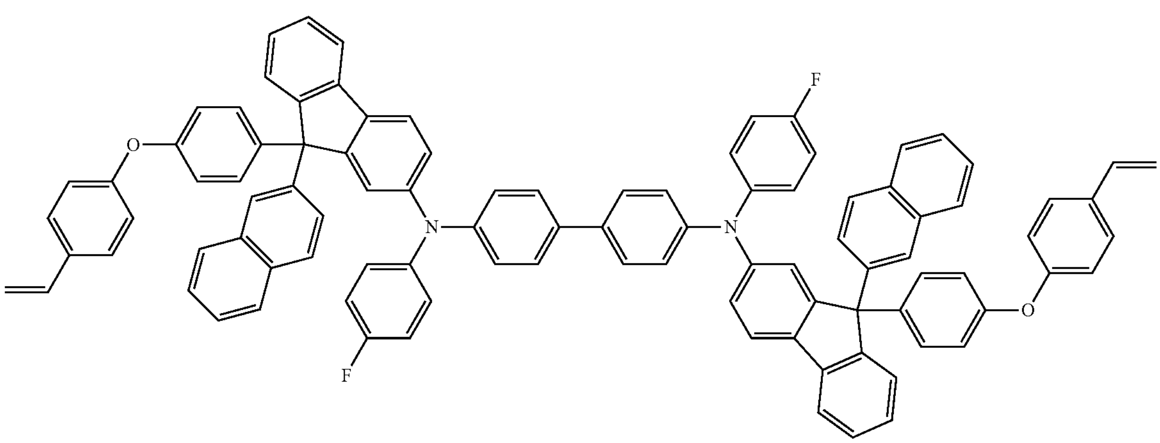

-continued
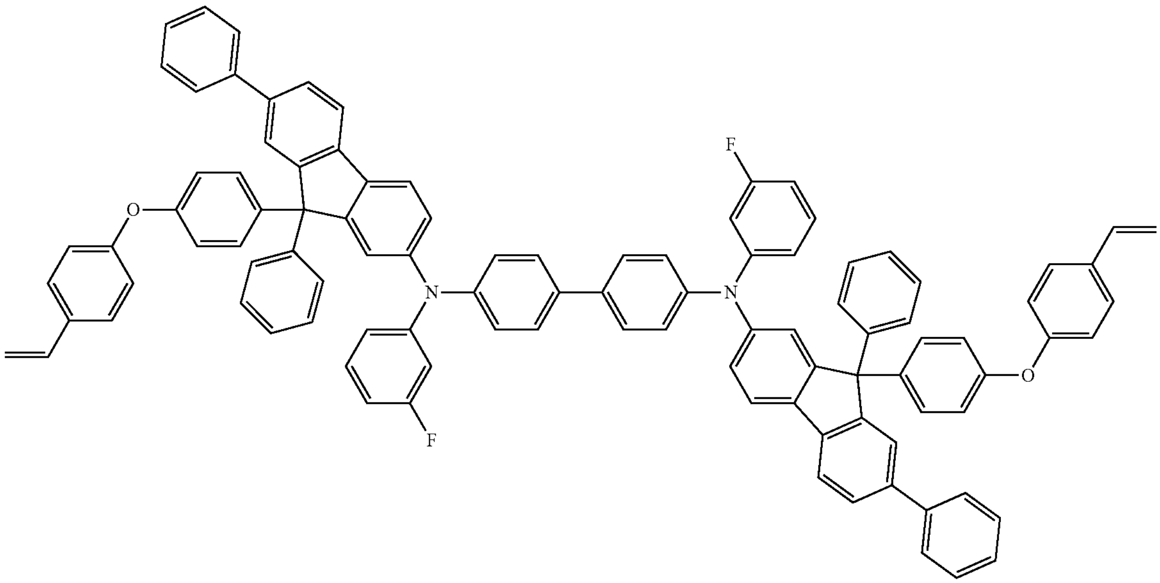
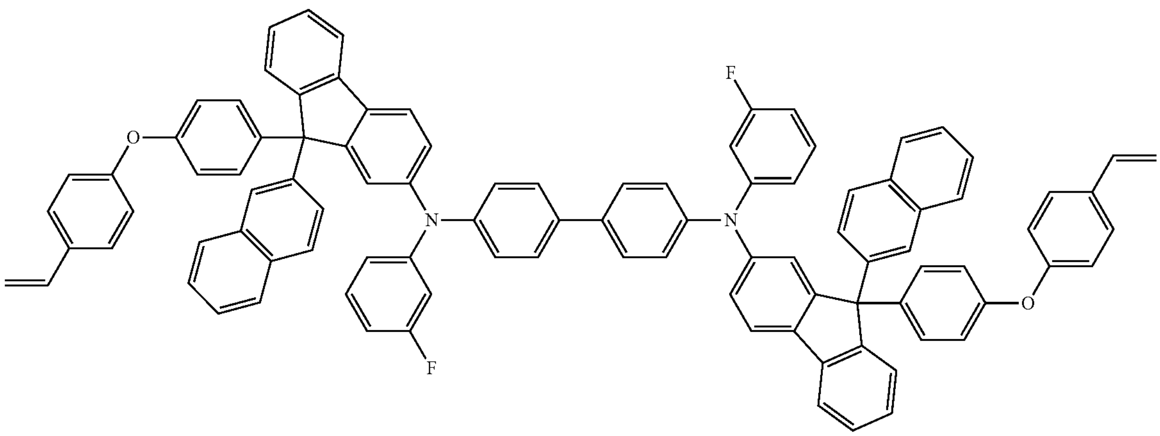
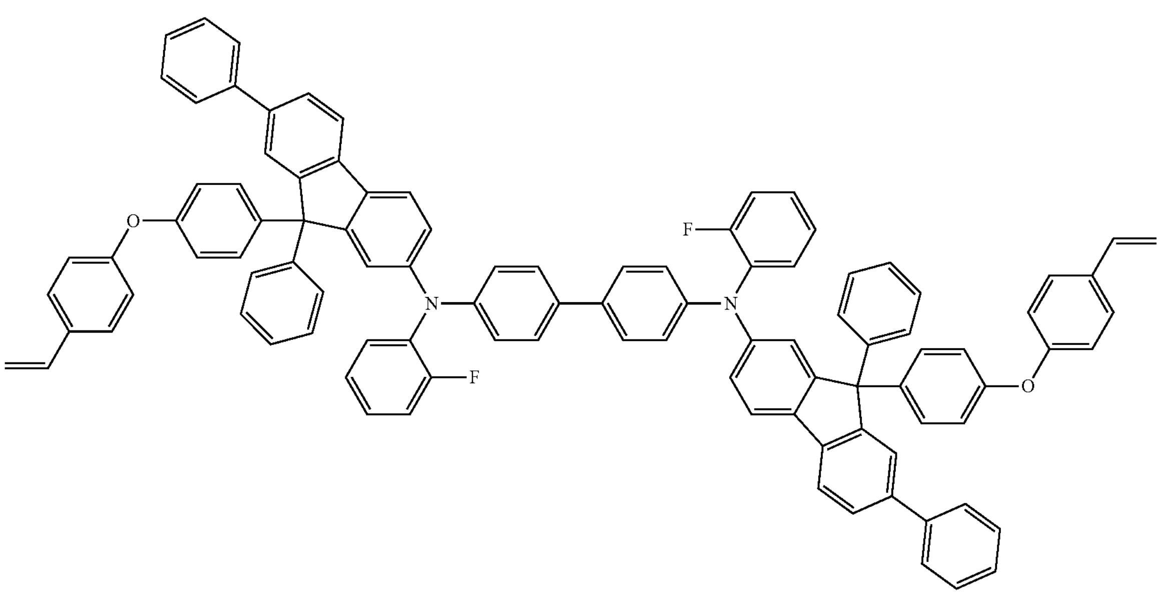

-continued
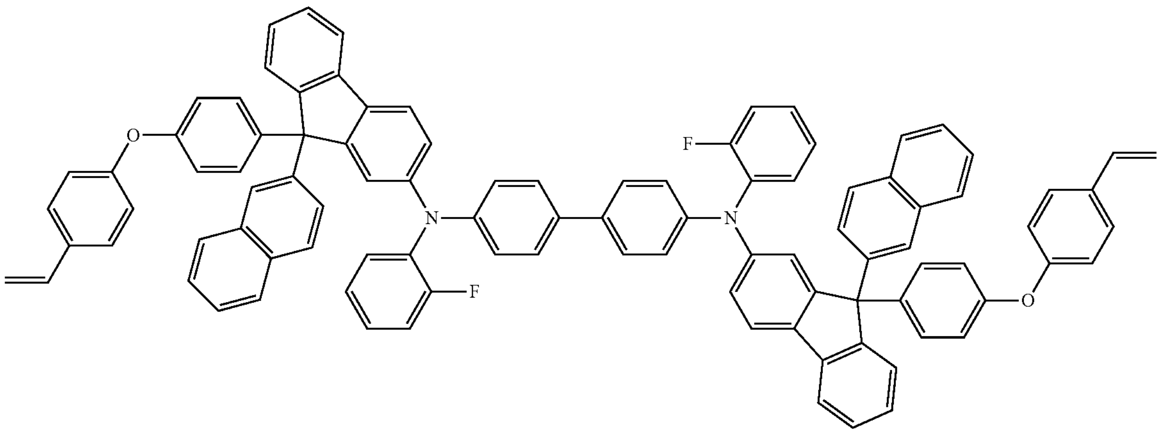
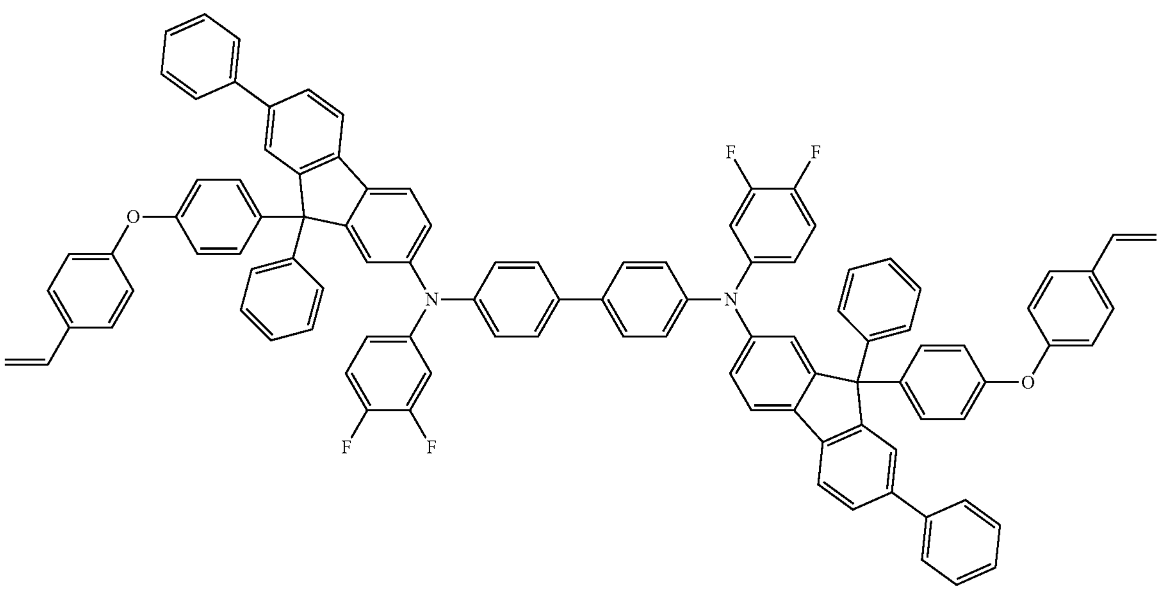
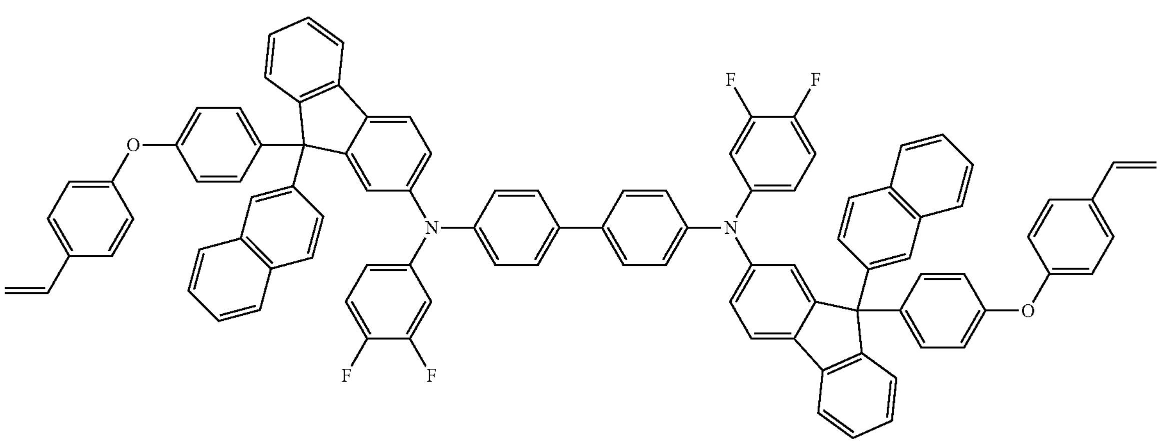

-continued
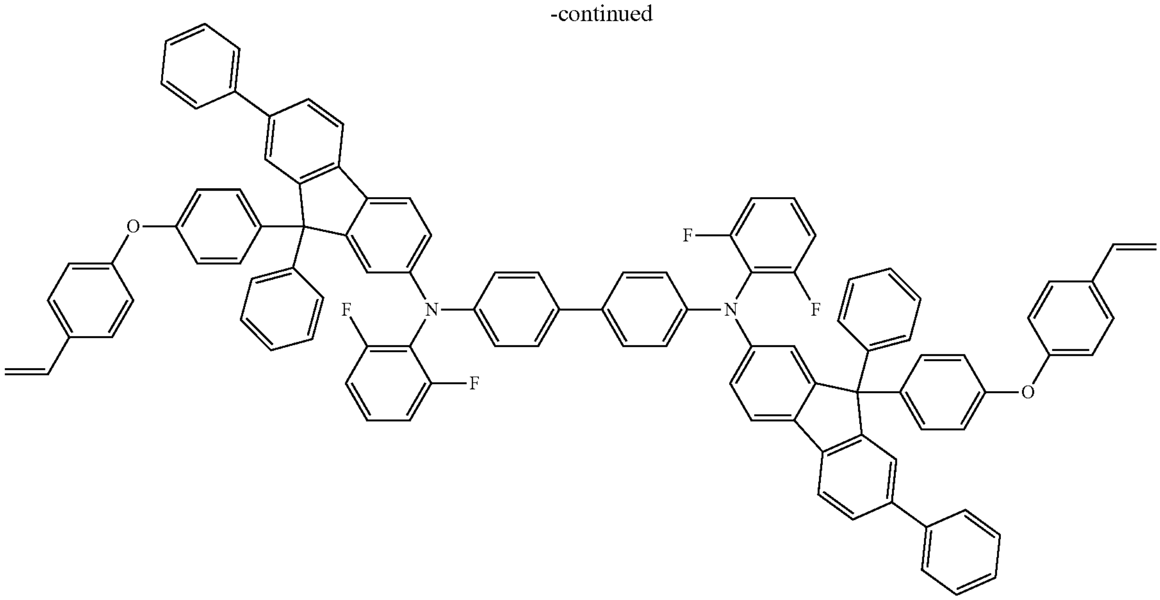
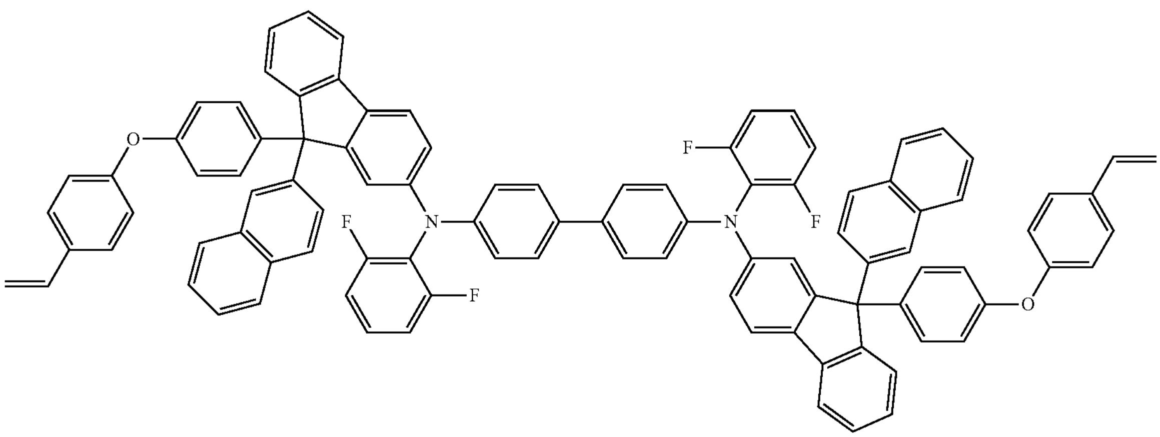
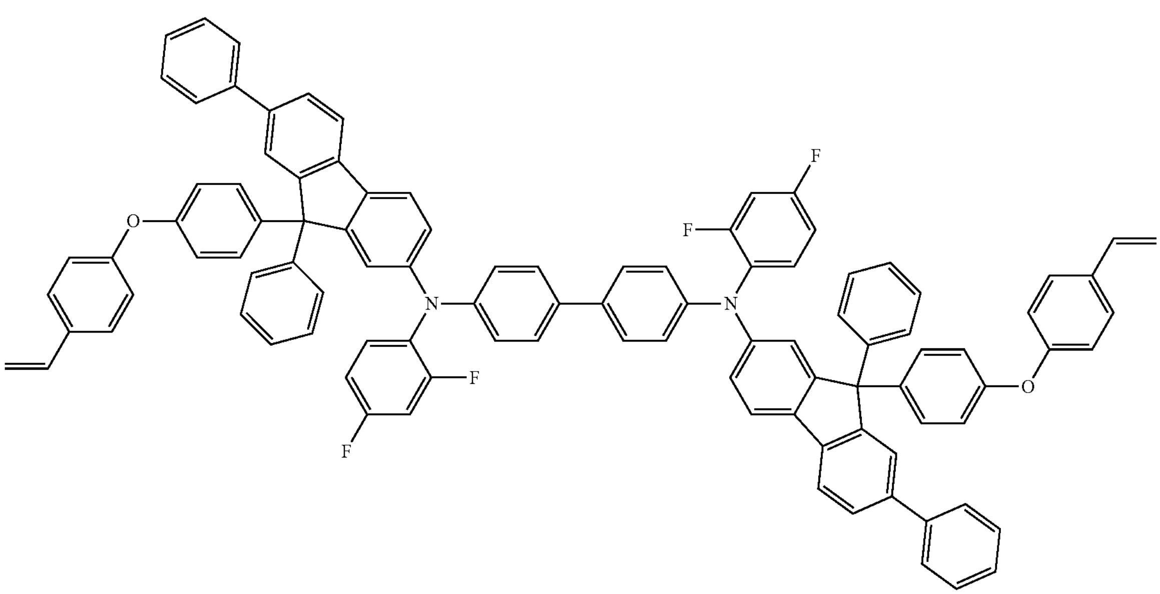

-continued
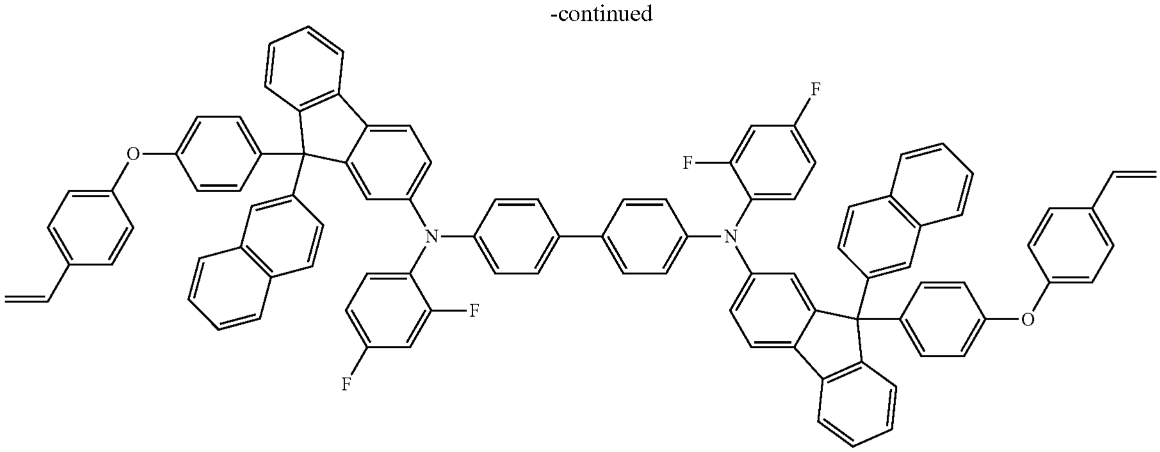
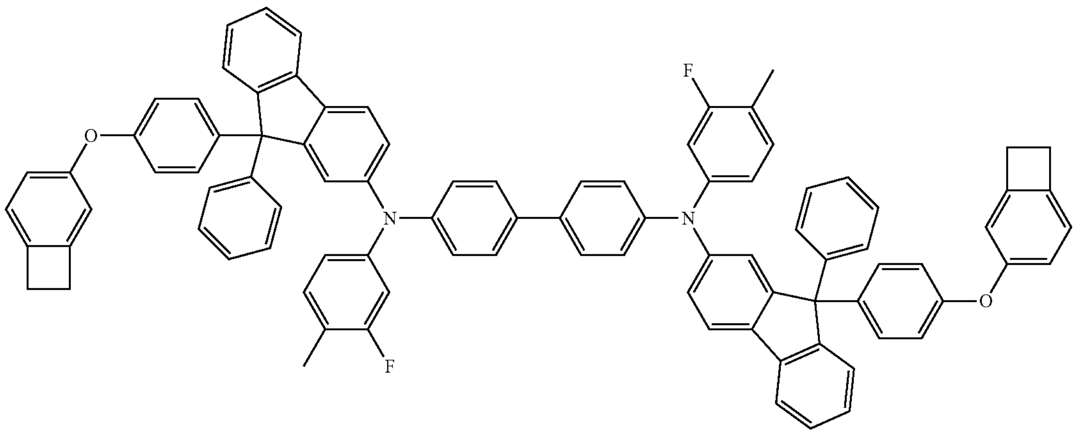
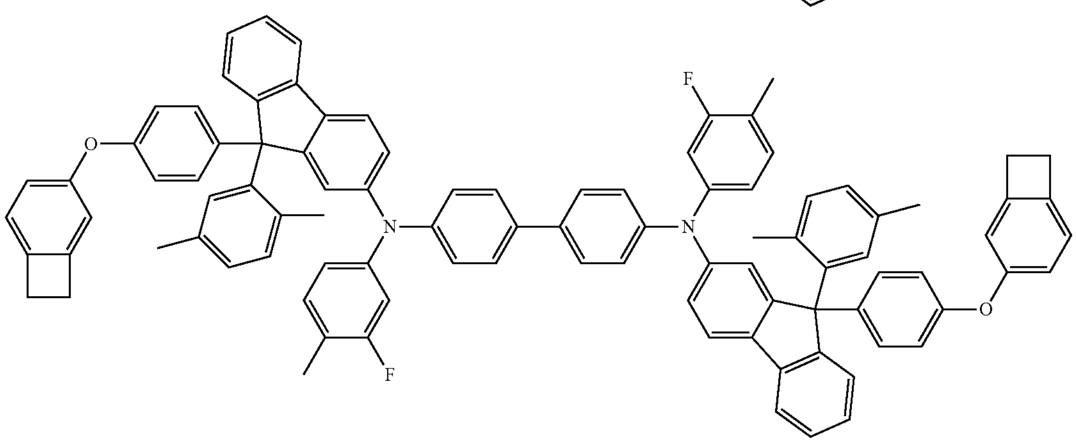
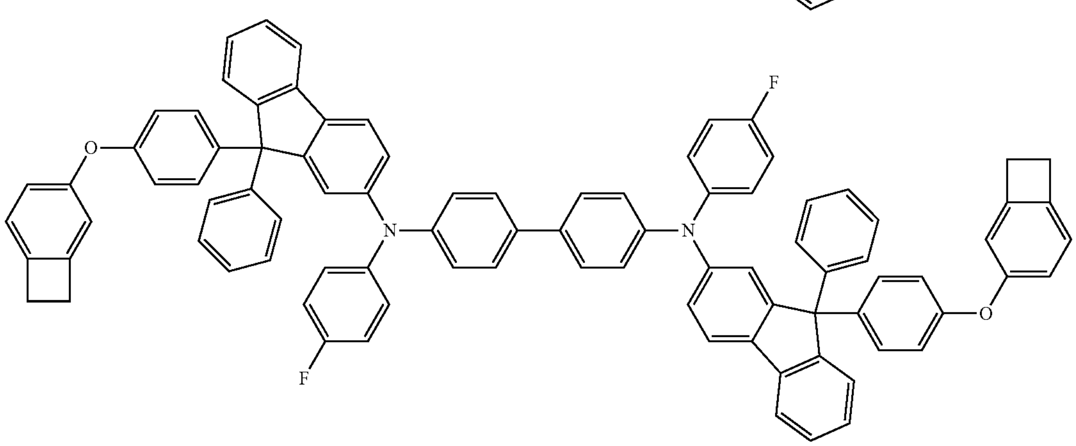

-continued
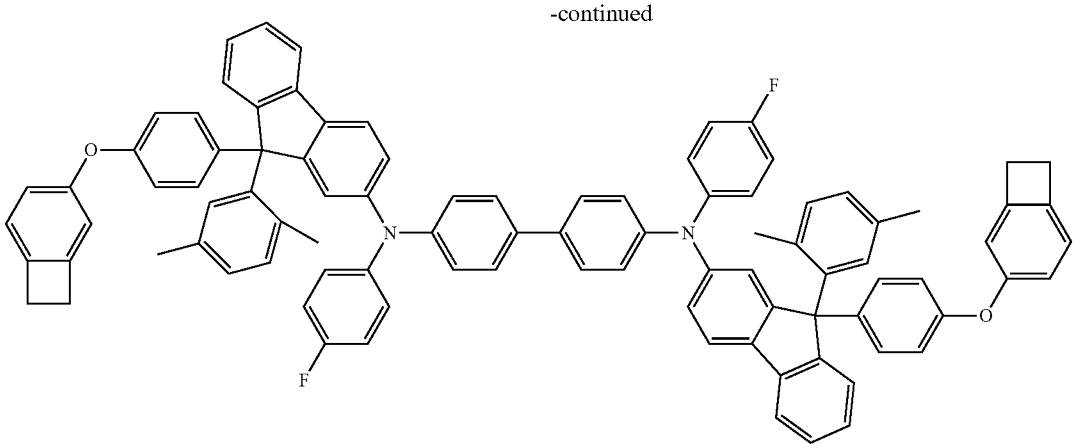
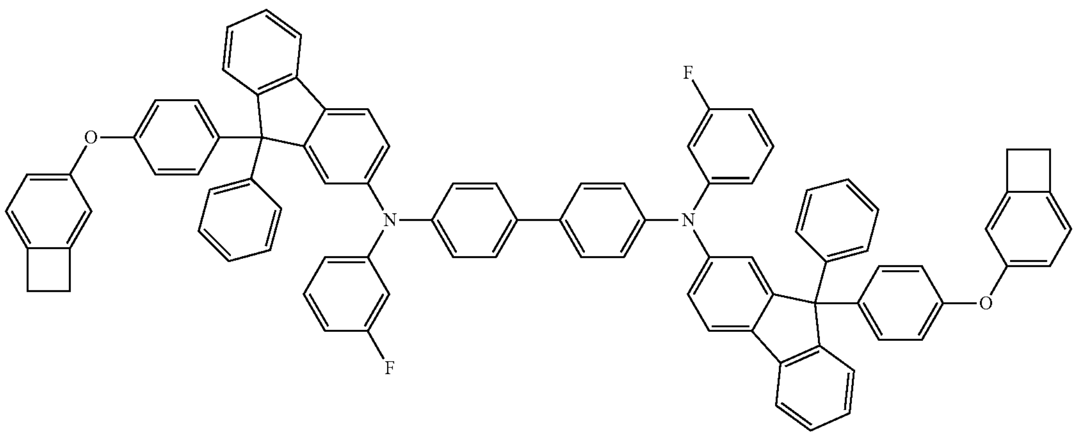
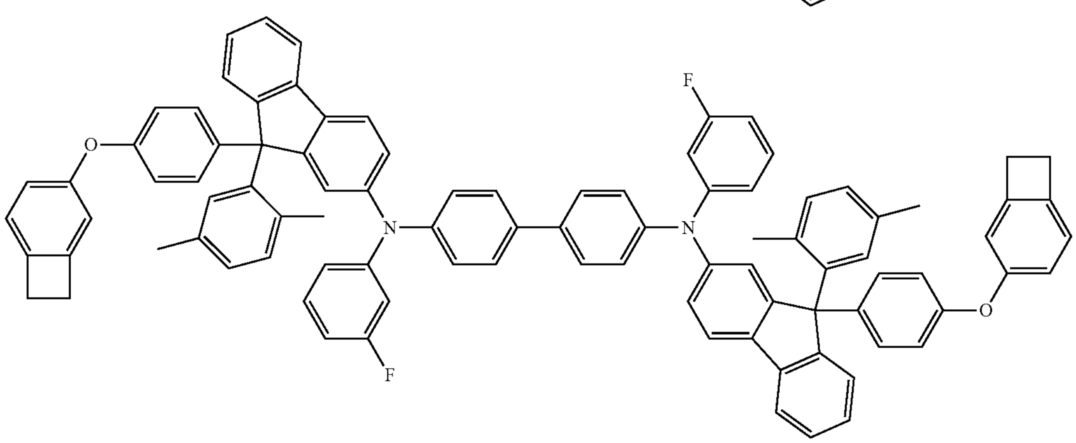
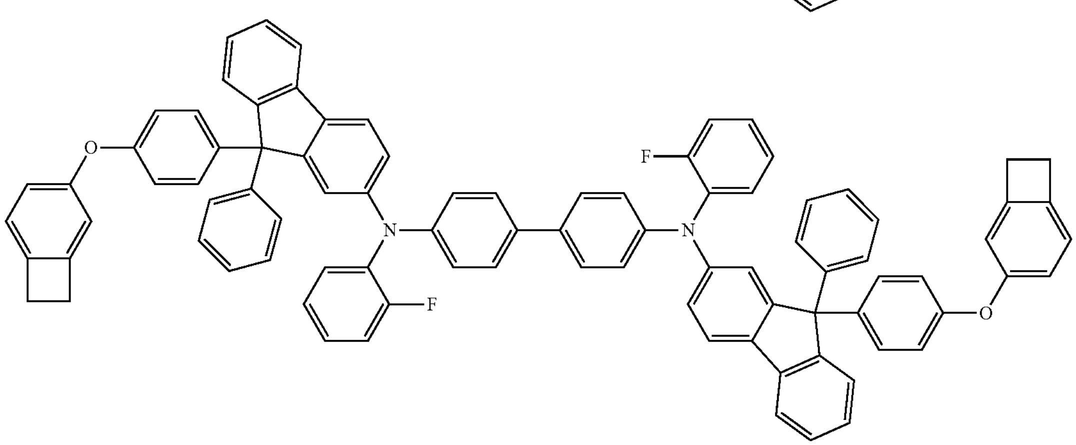

-continued
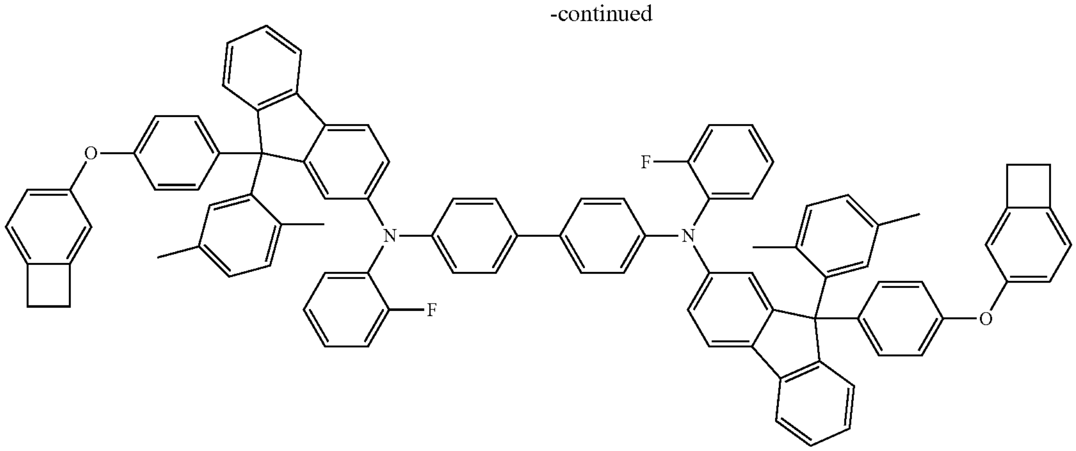
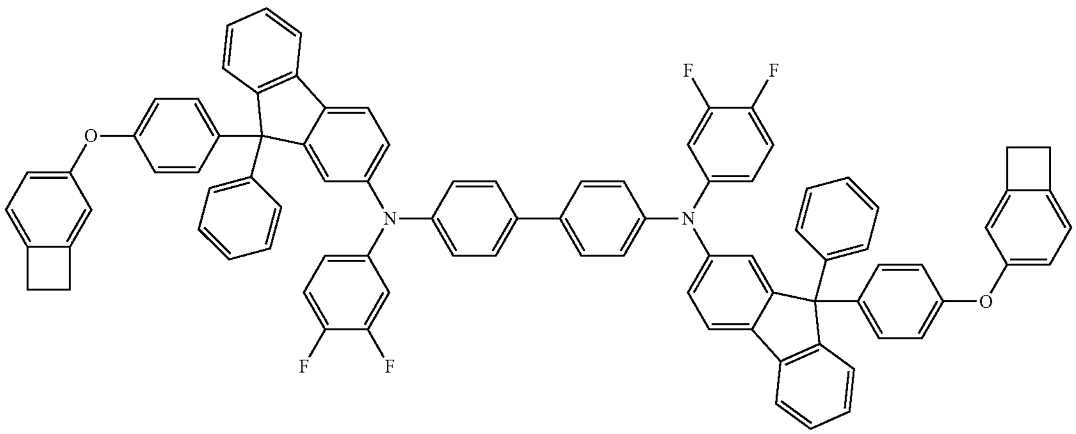
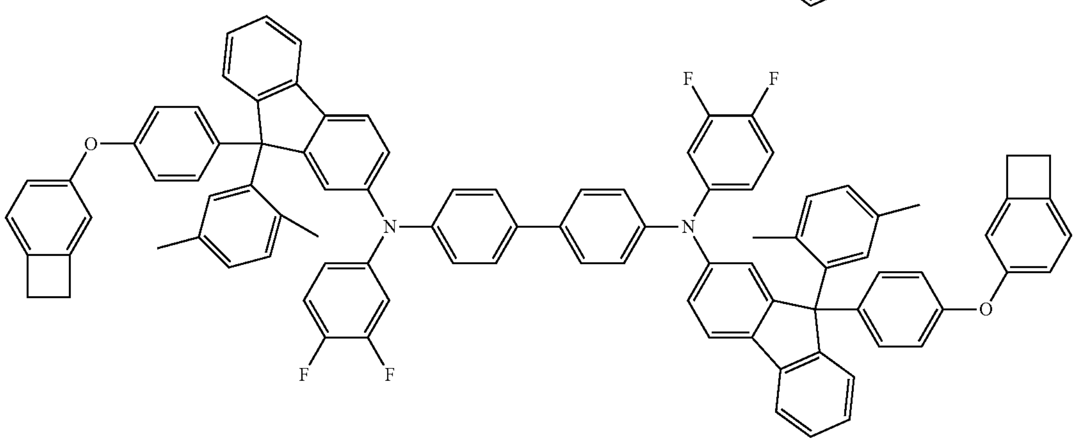
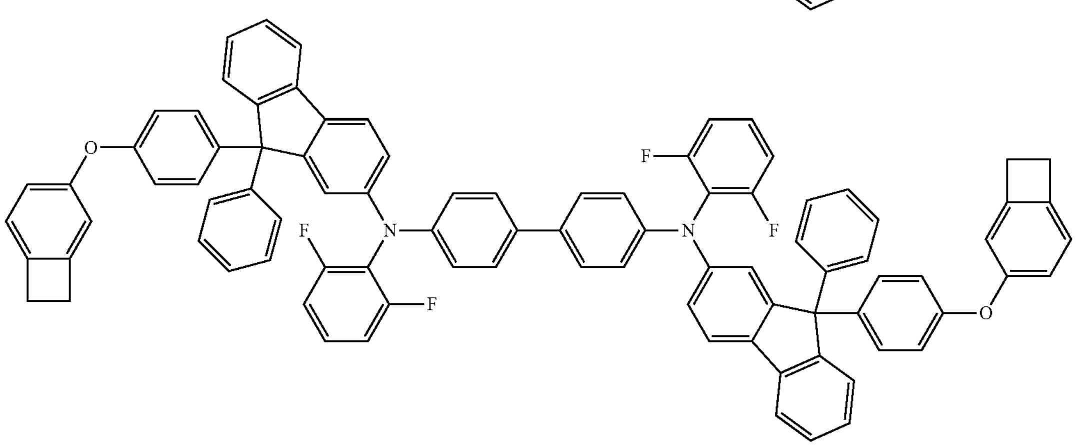

-continued
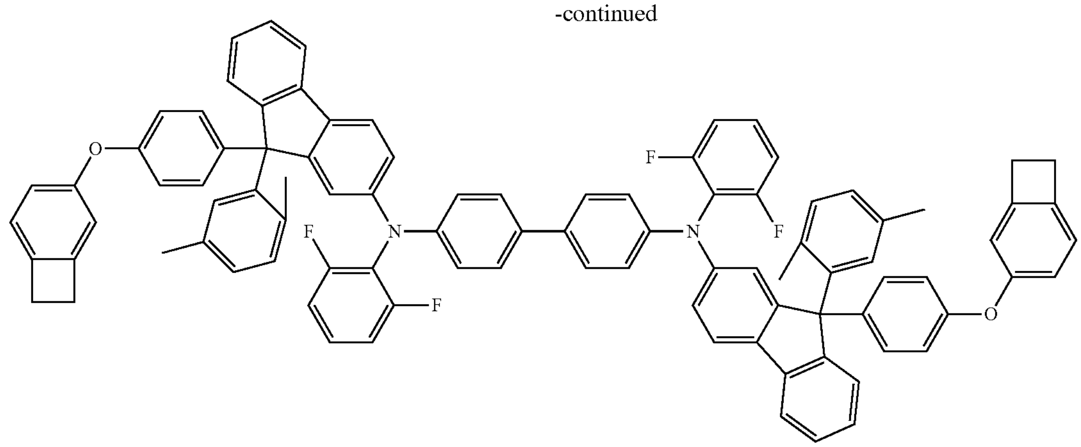
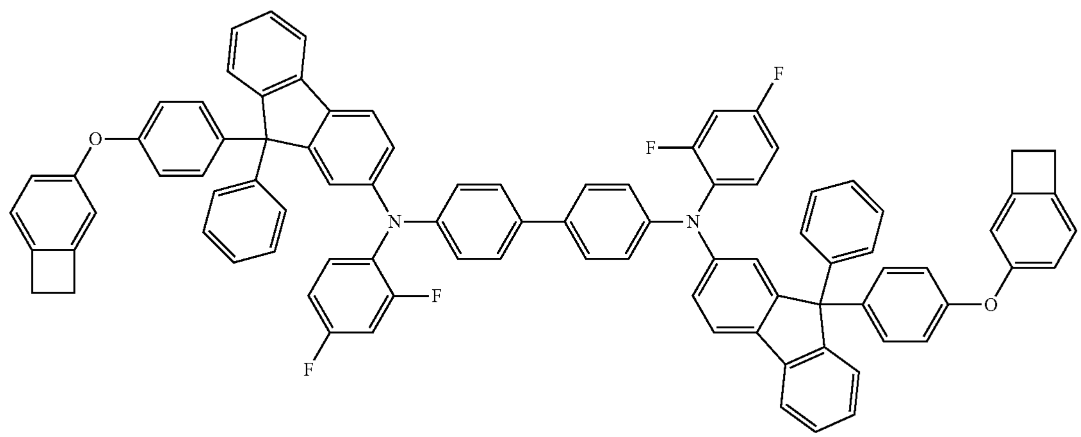
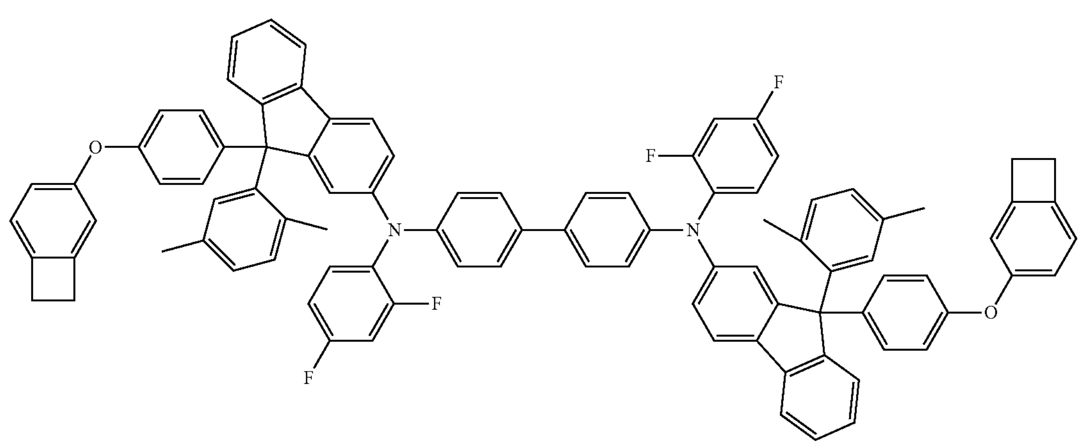

-continued
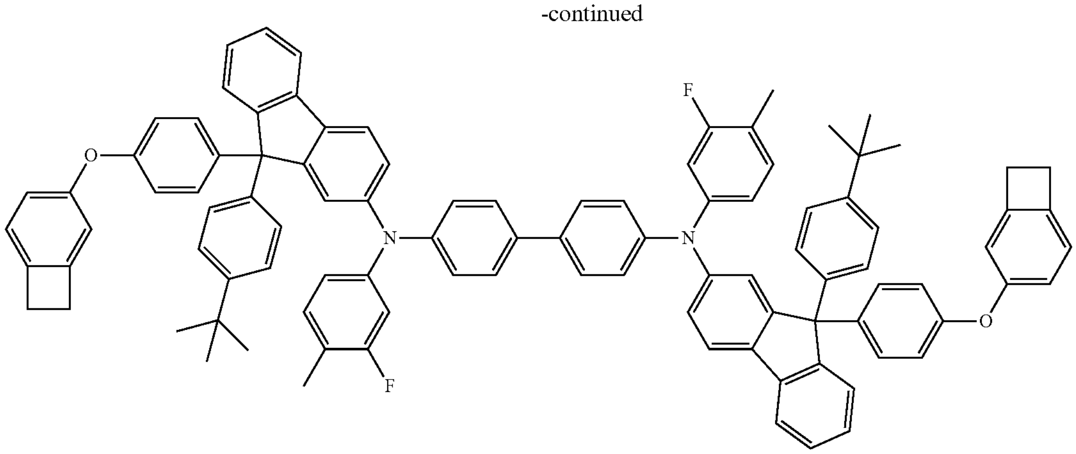
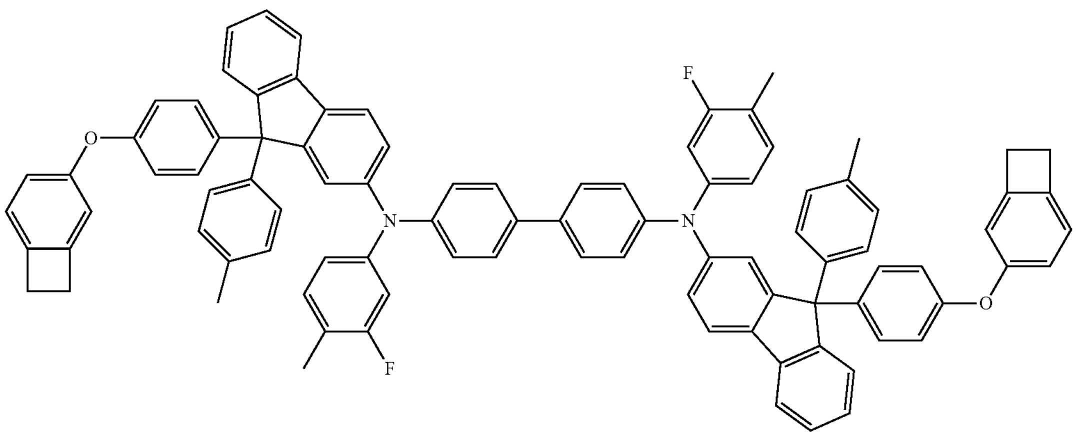
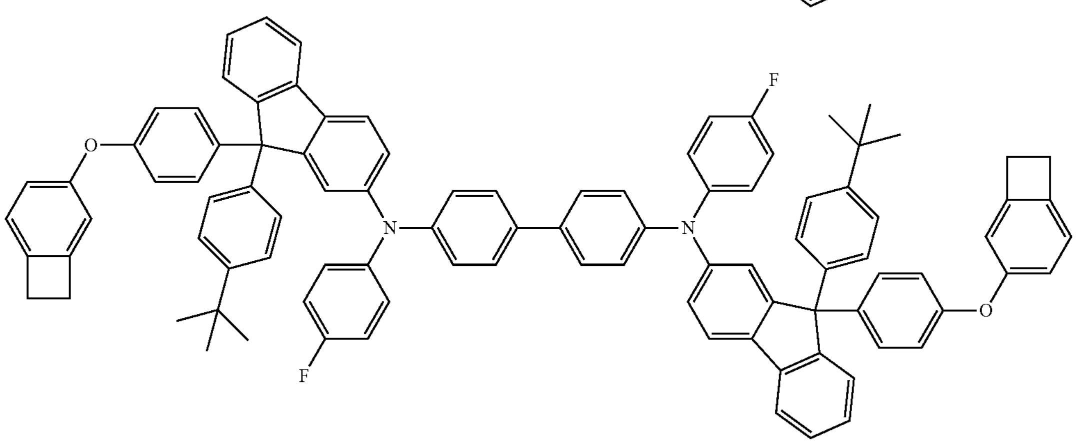
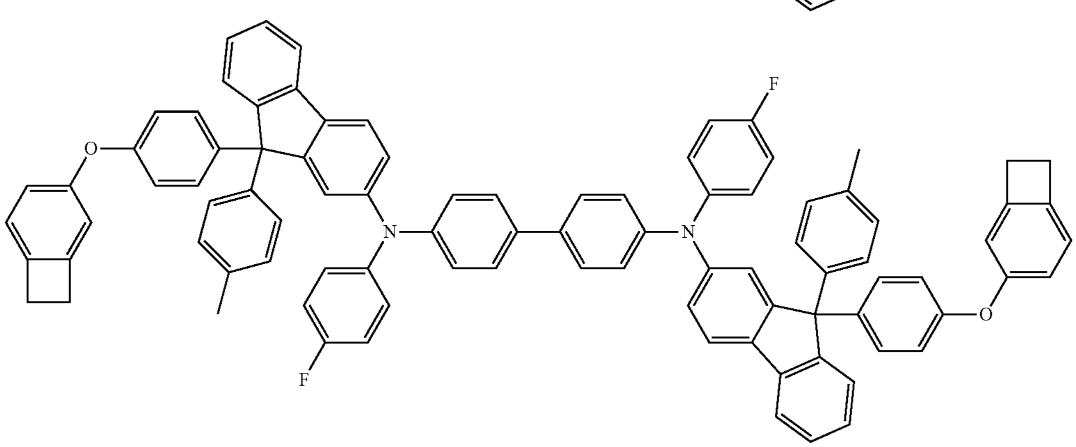

-continued
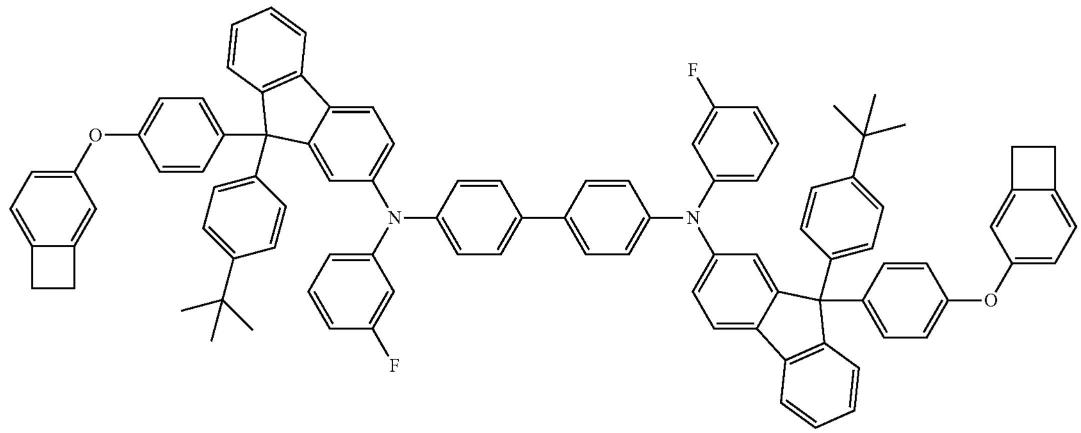
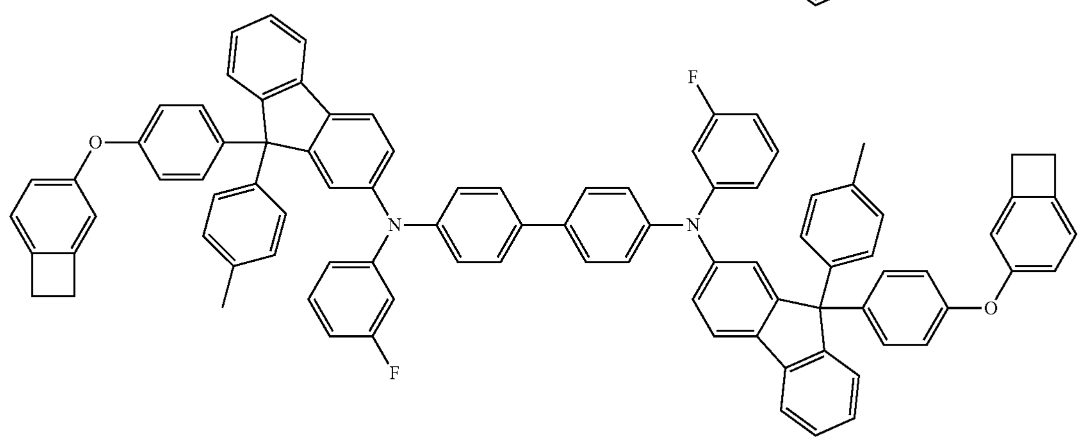
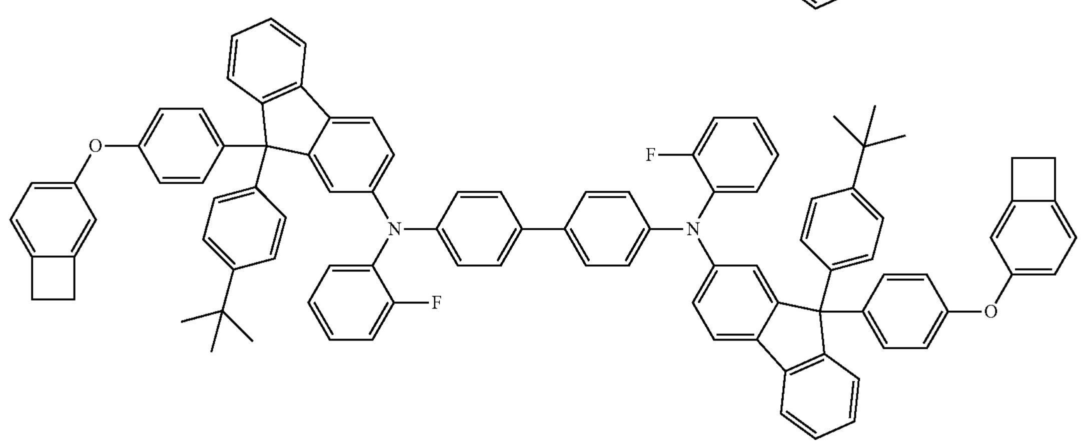
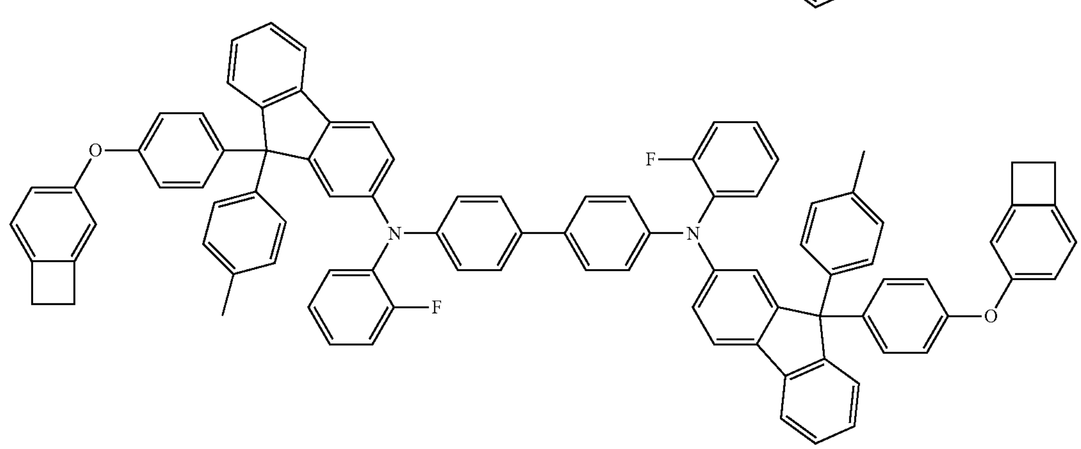

-continued
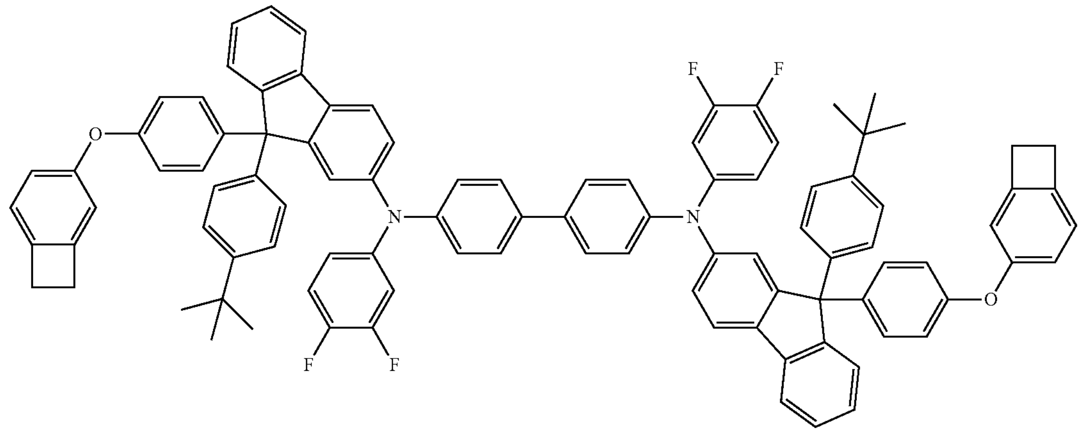
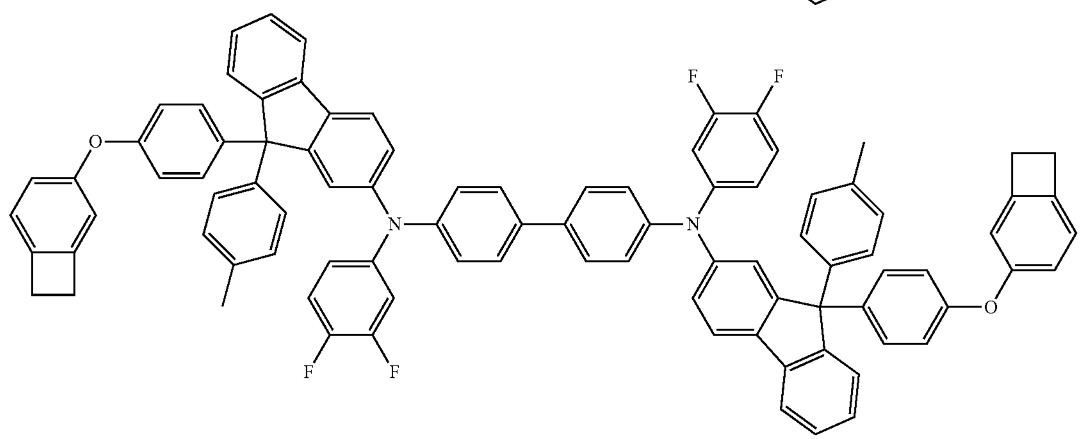
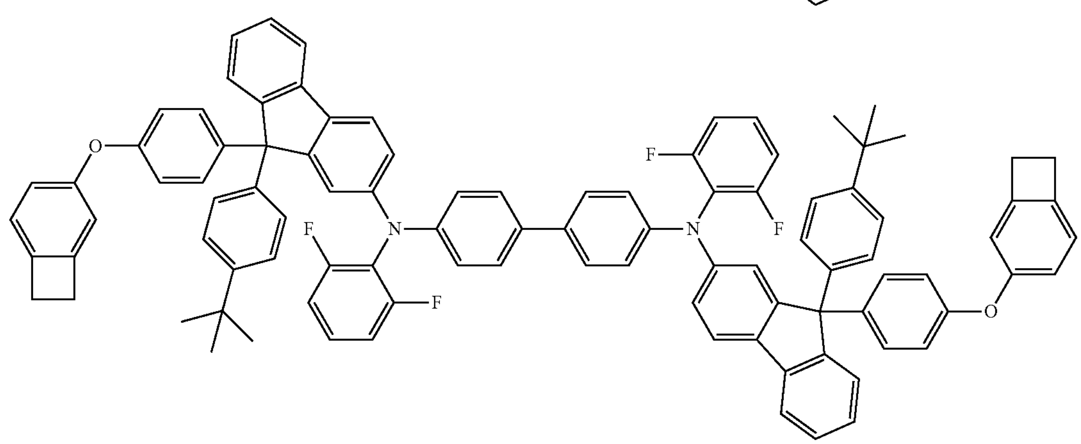
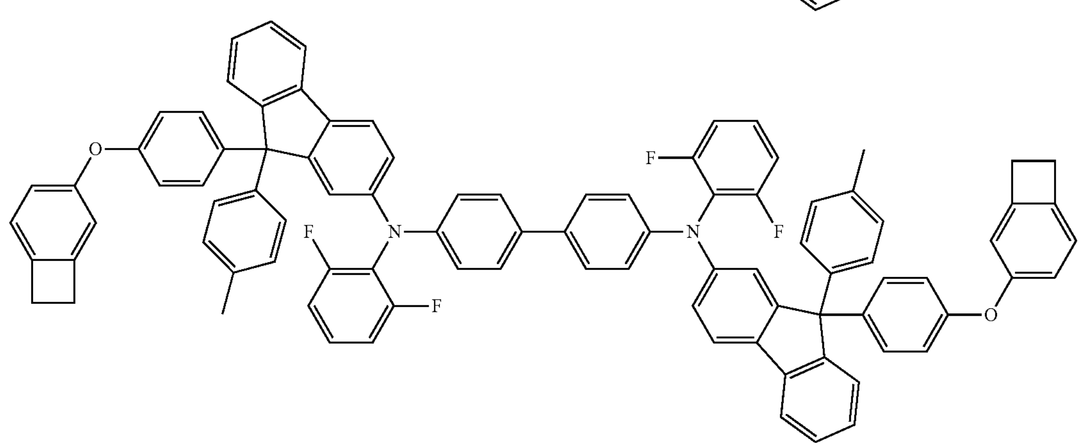

-continued
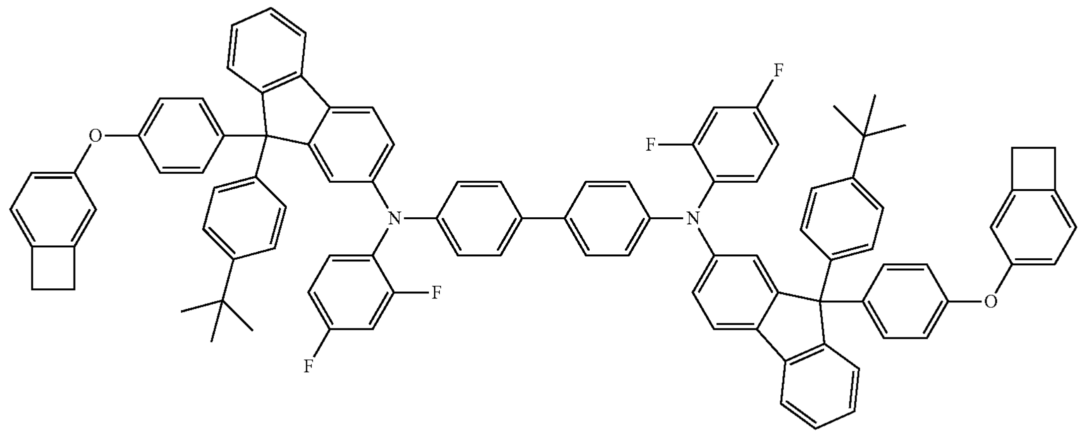
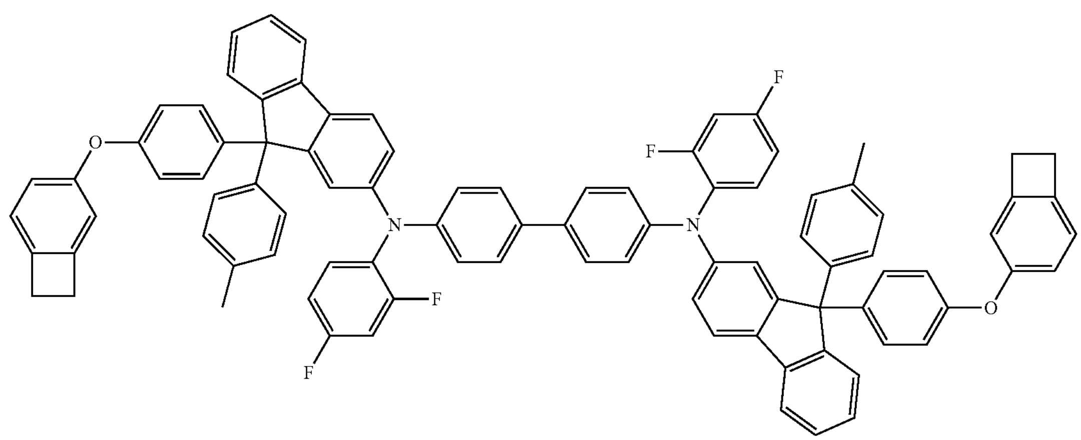
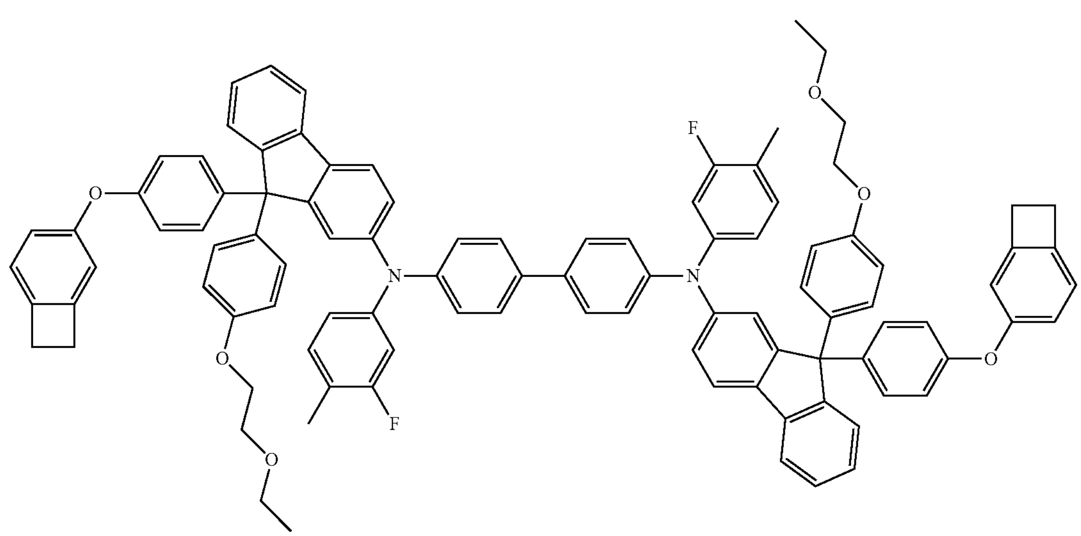

-continued
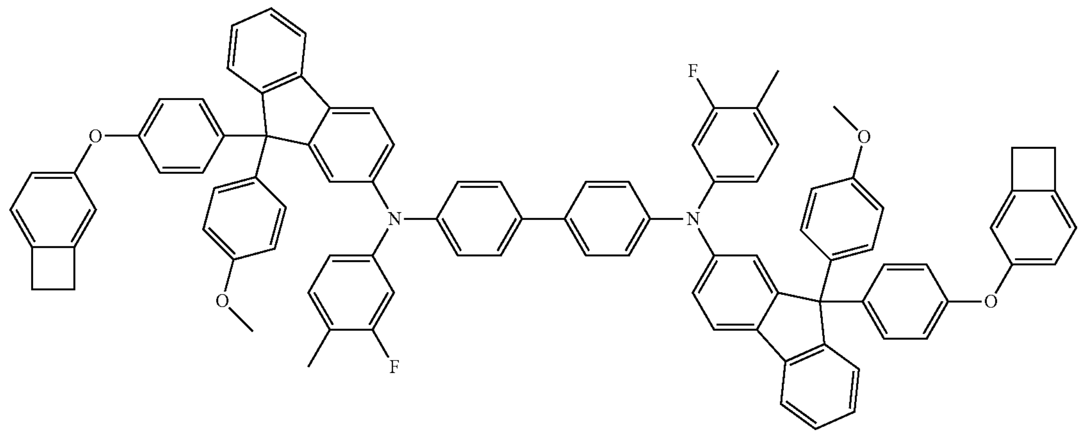
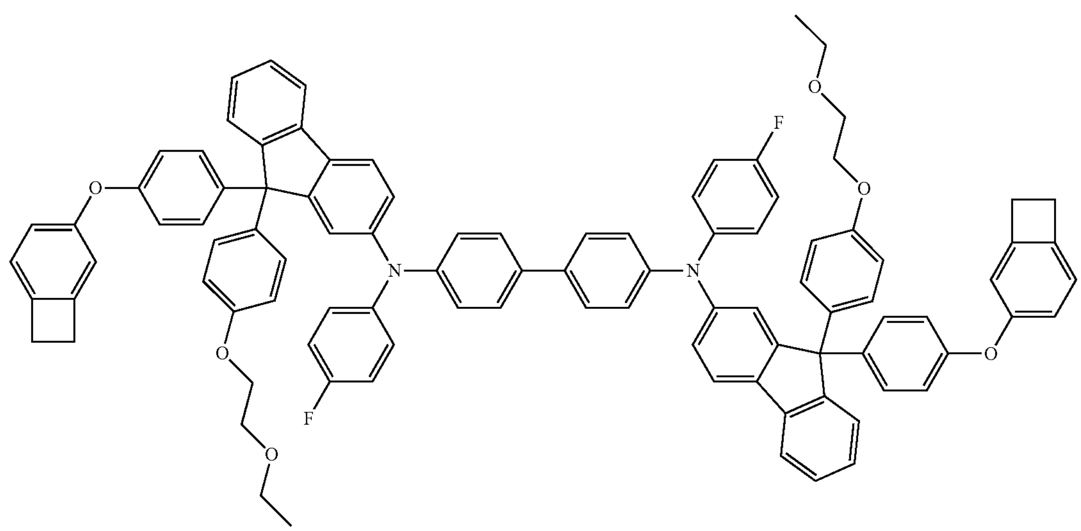
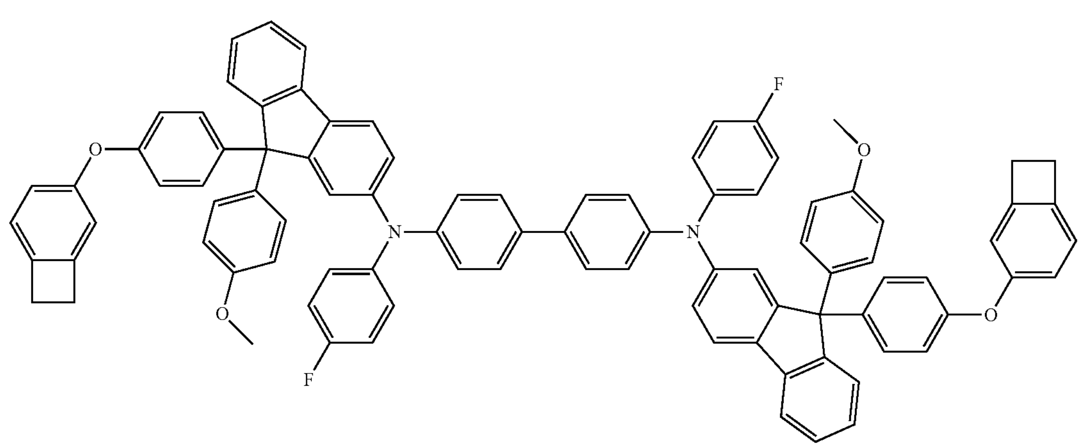

-continued
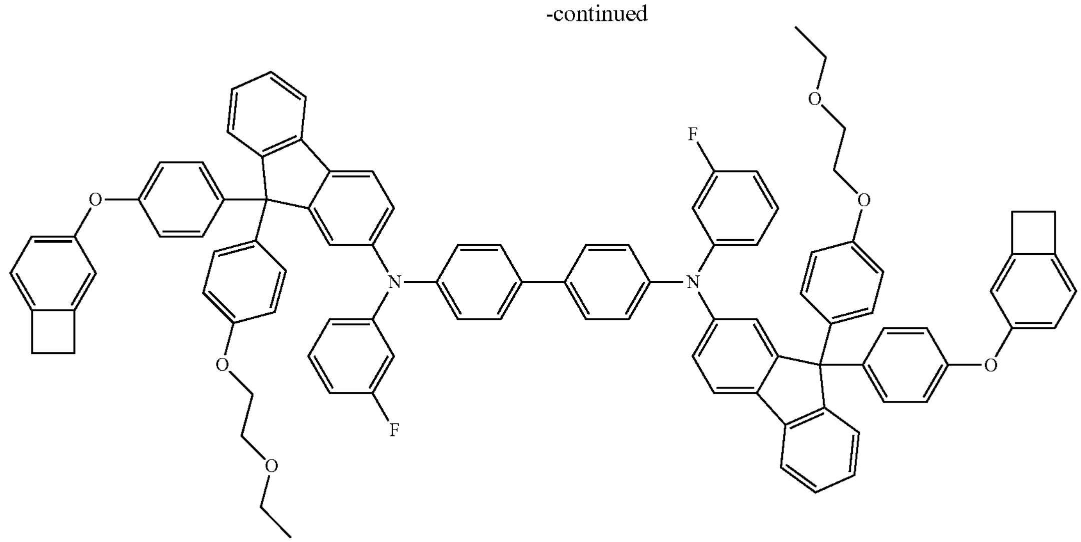
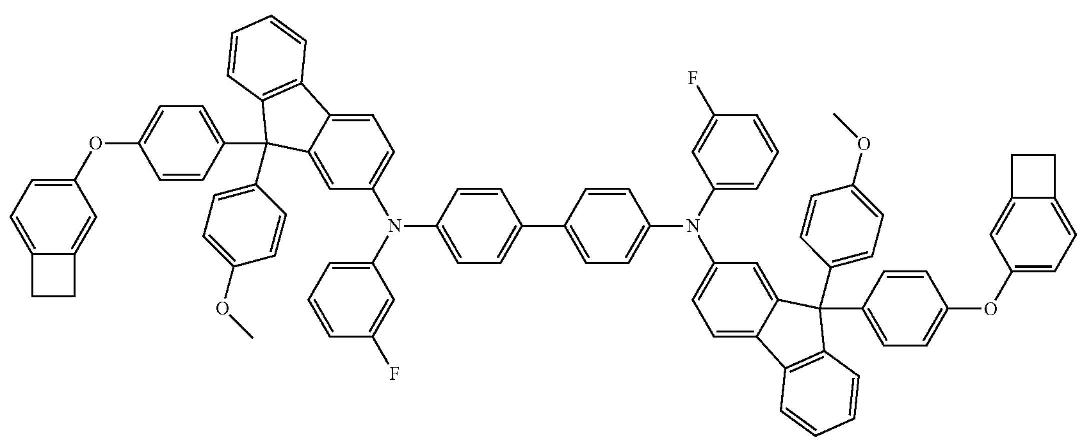
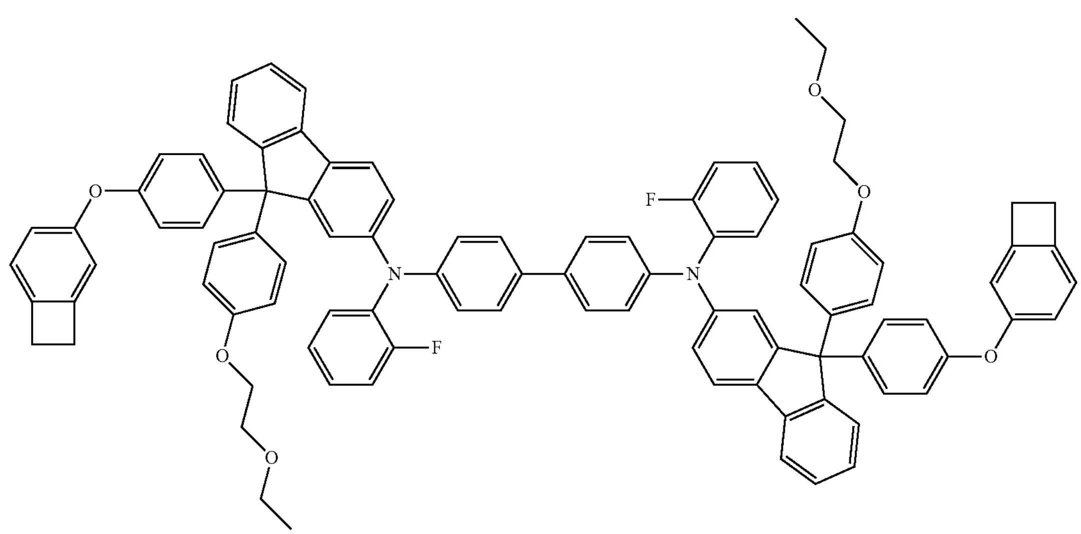

-continued
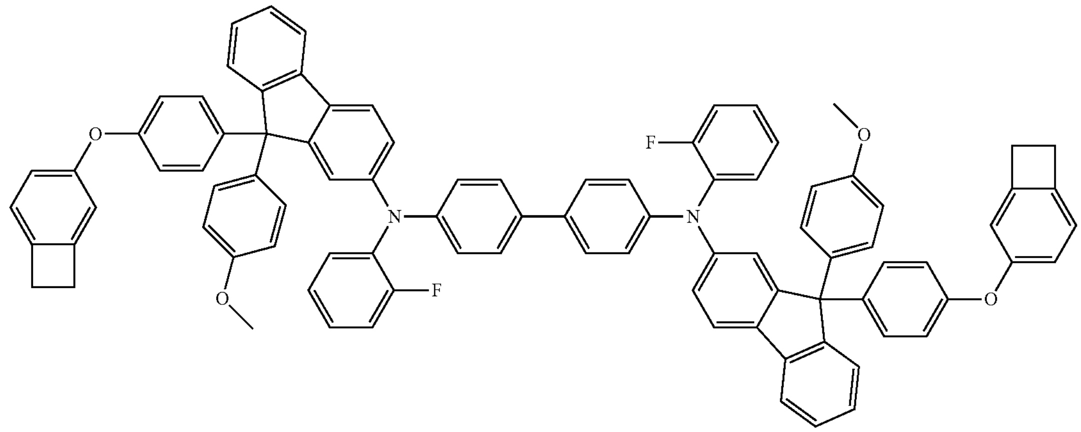
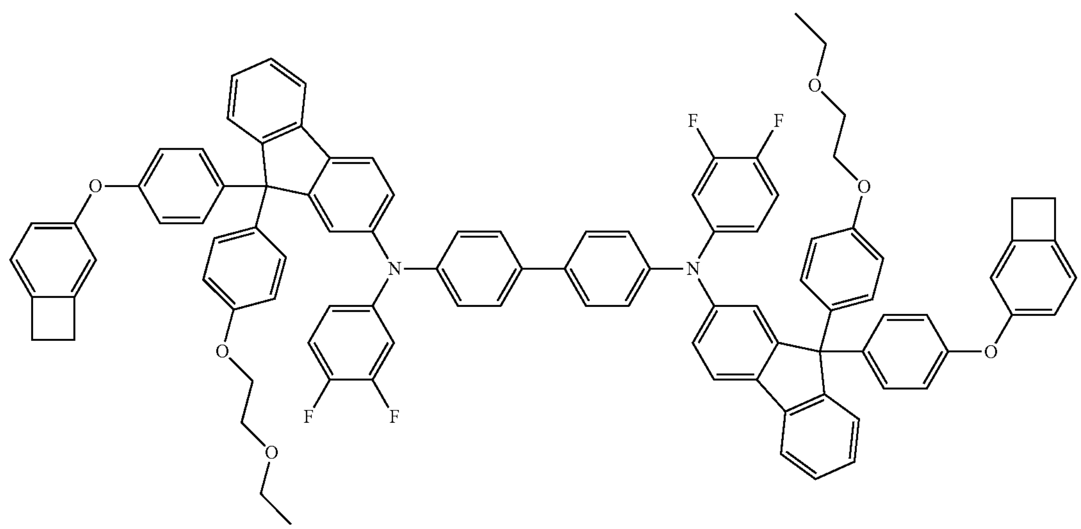
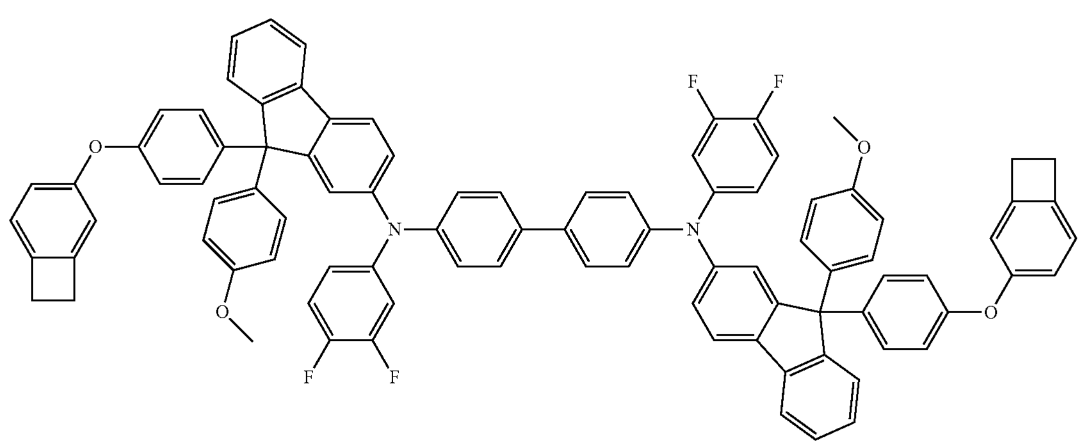

-continued
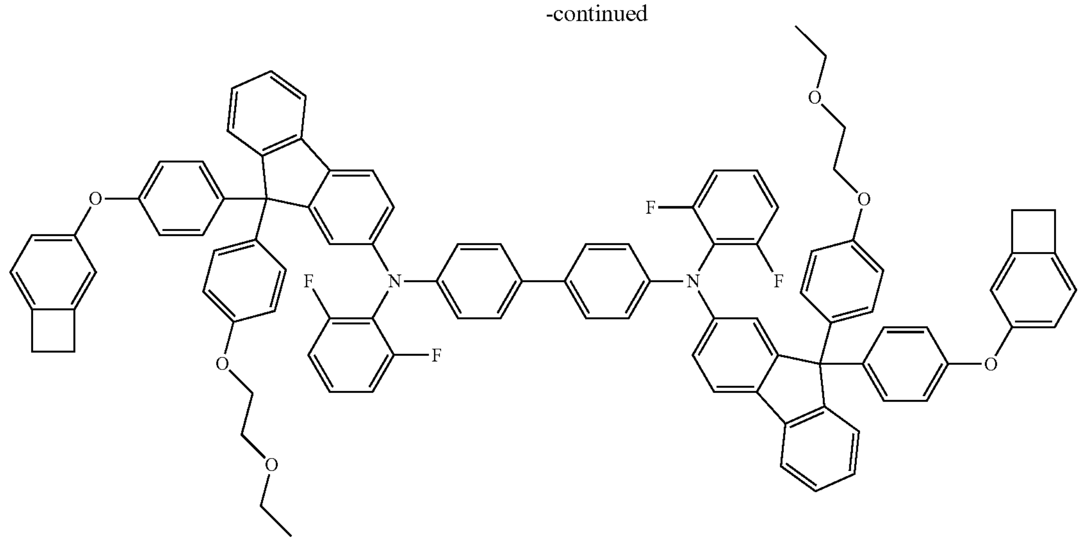
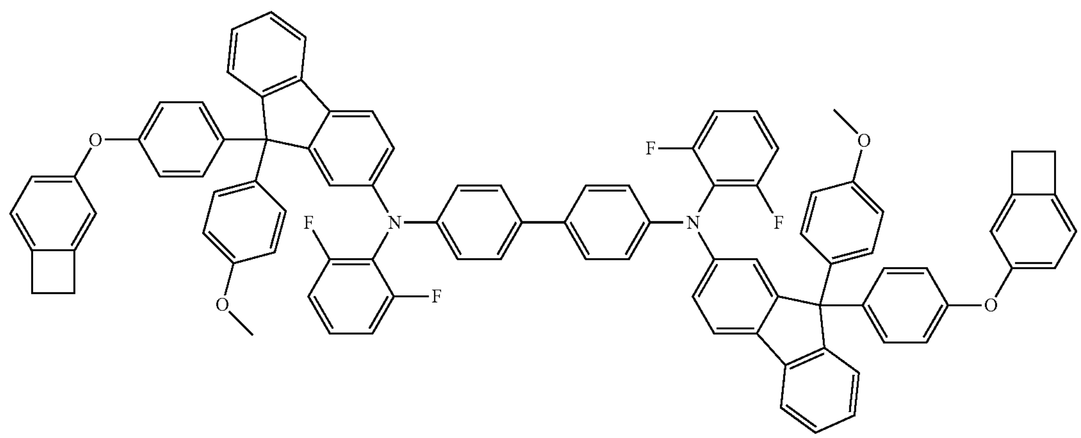
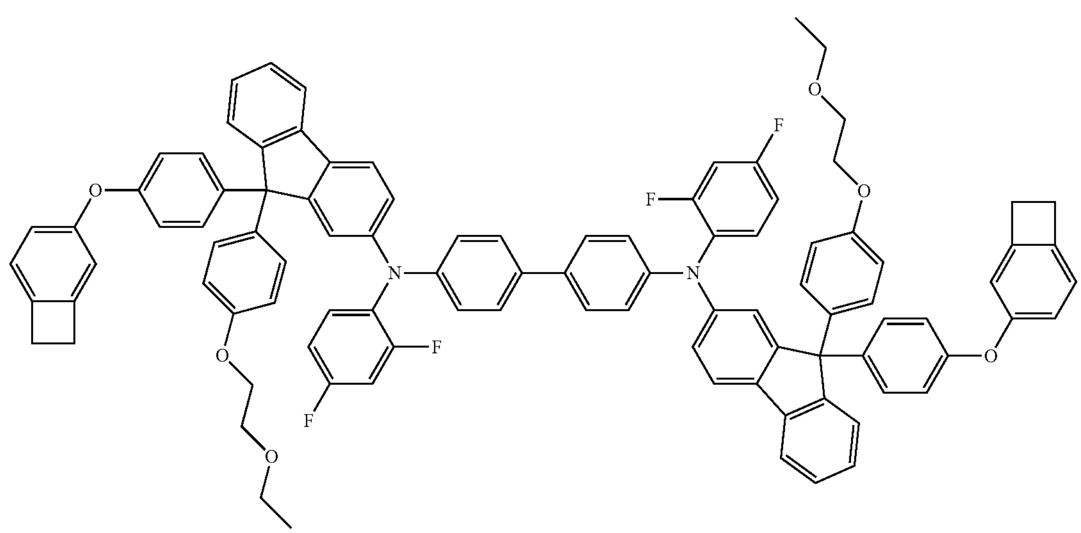

-continued
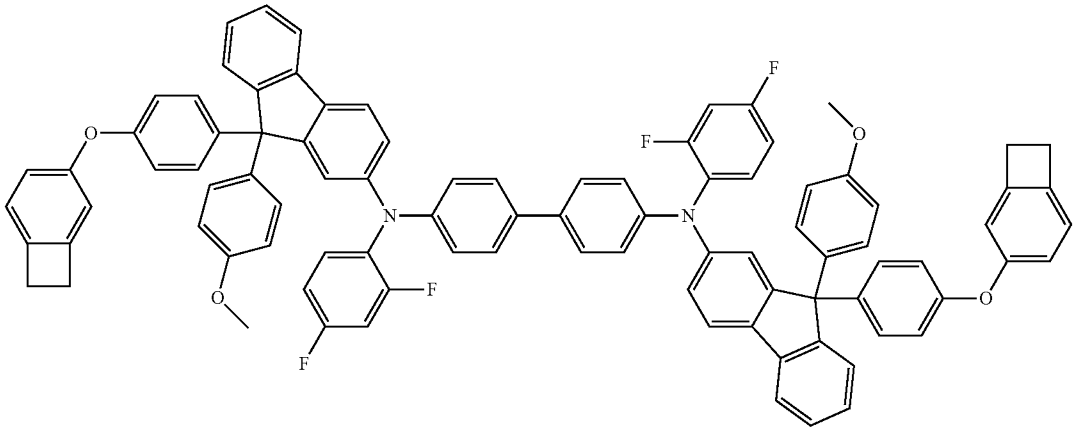
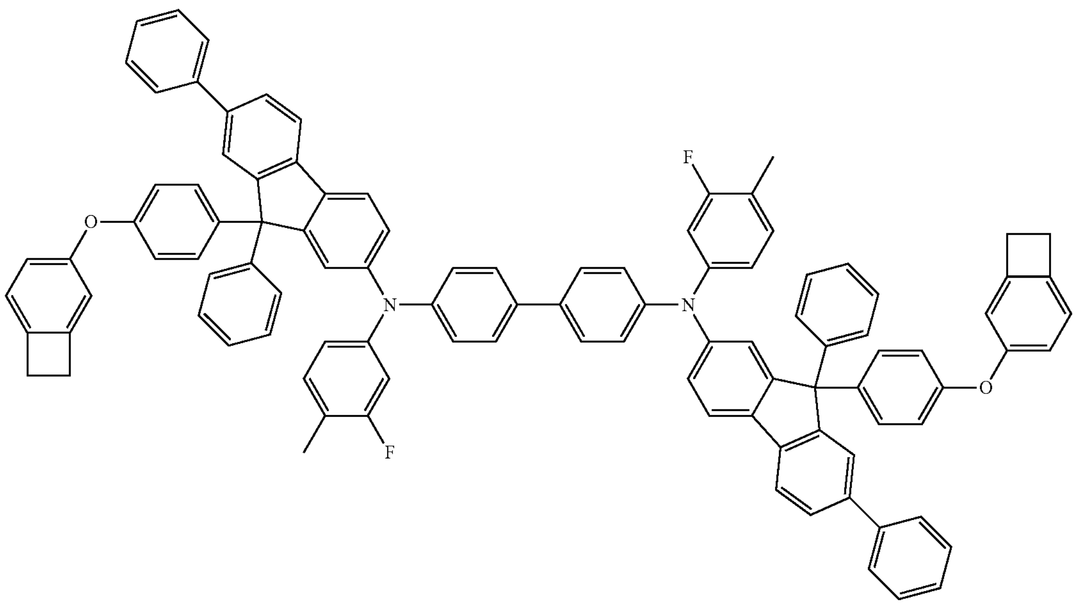
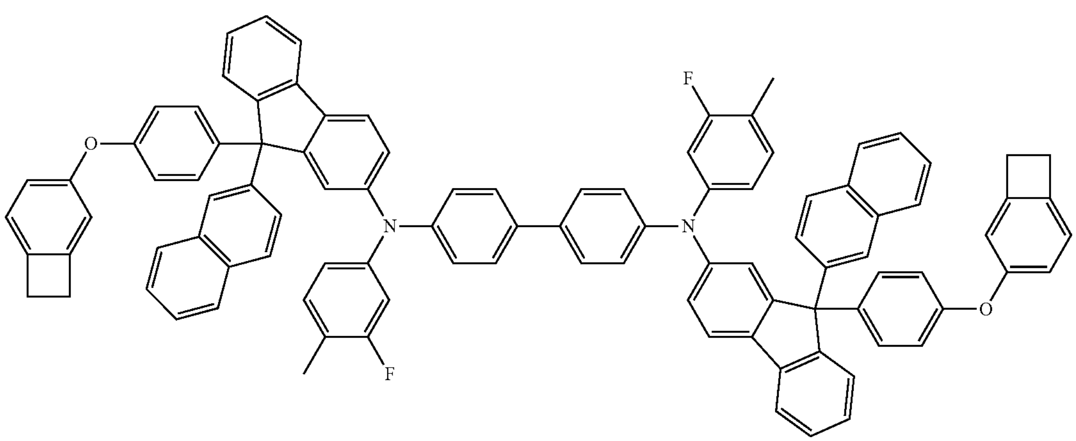

-continued
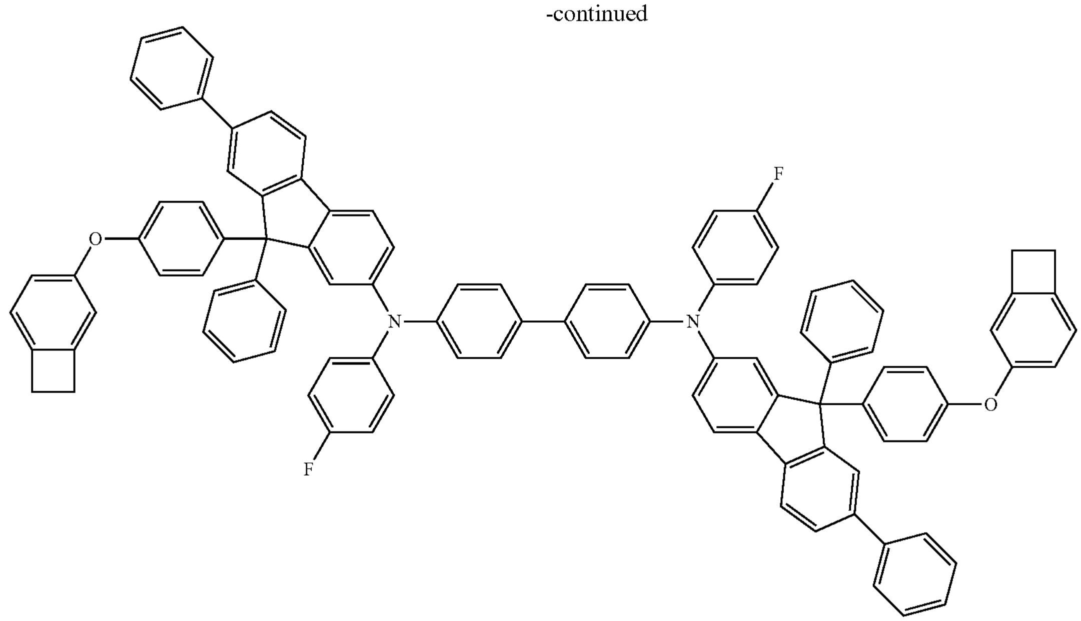
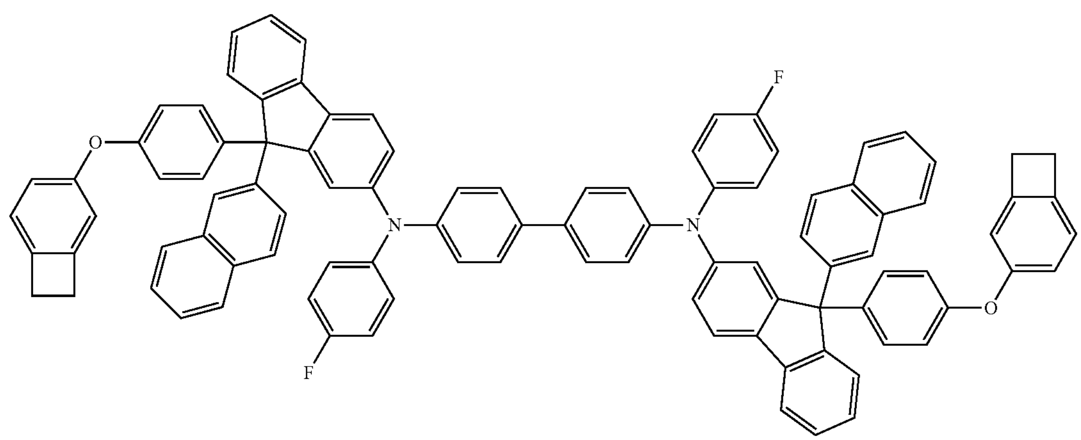
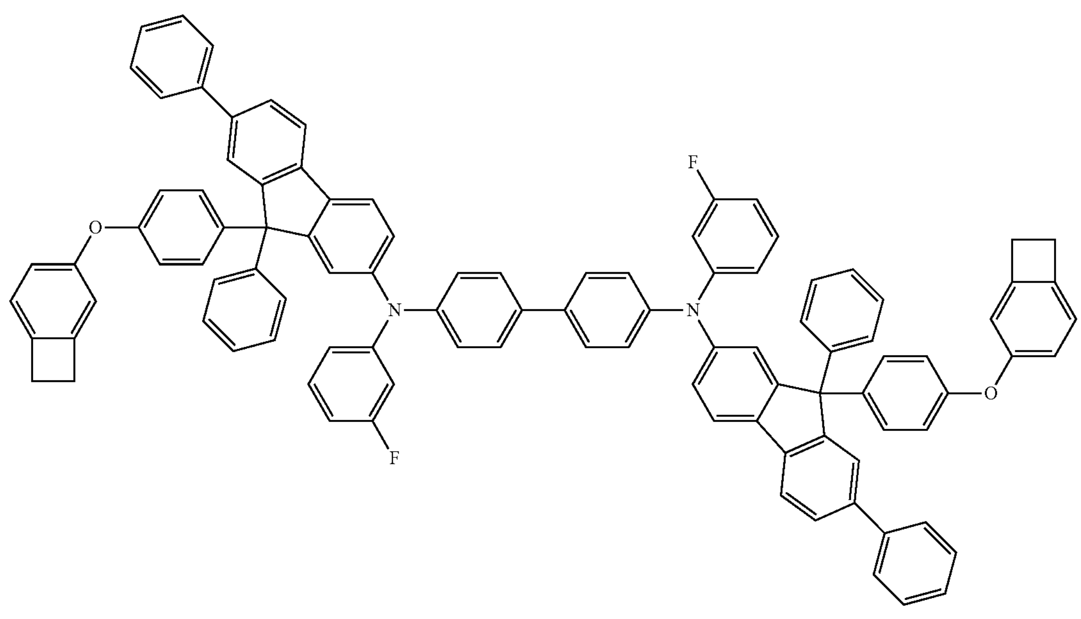

-continued
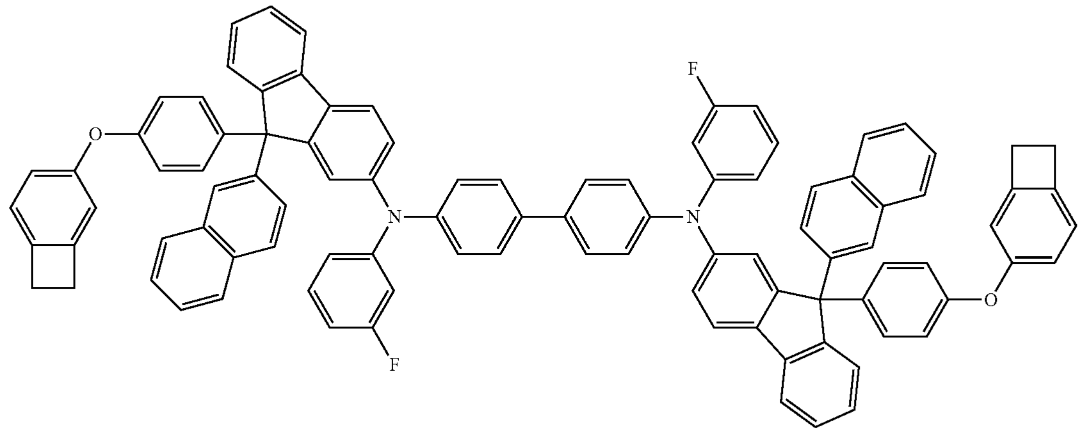
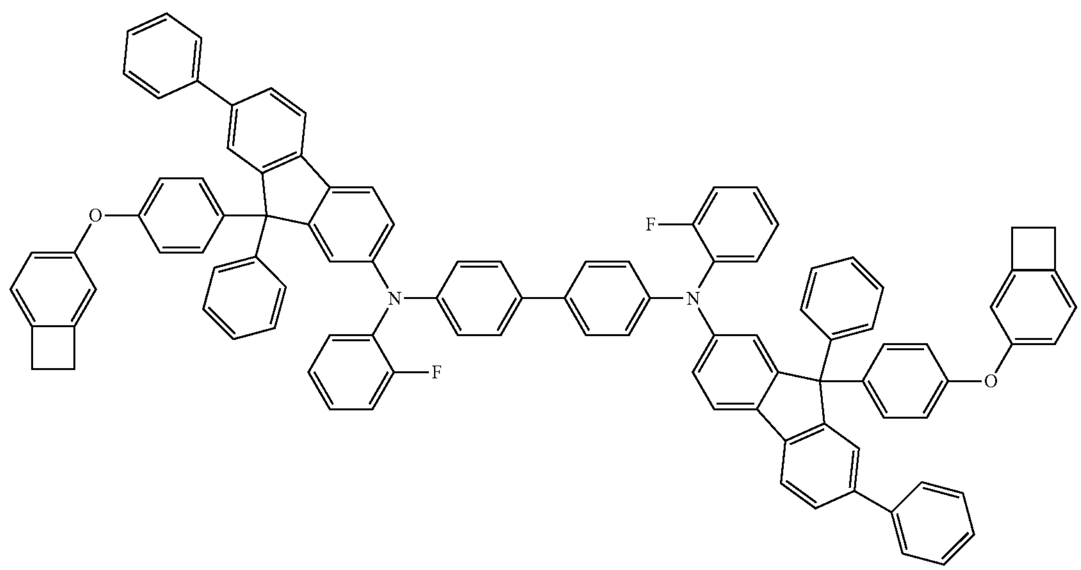
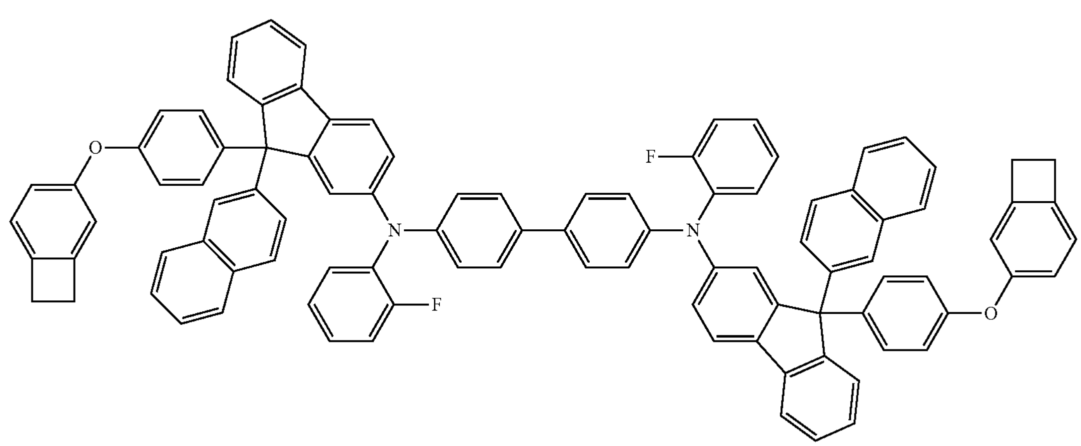

-continued
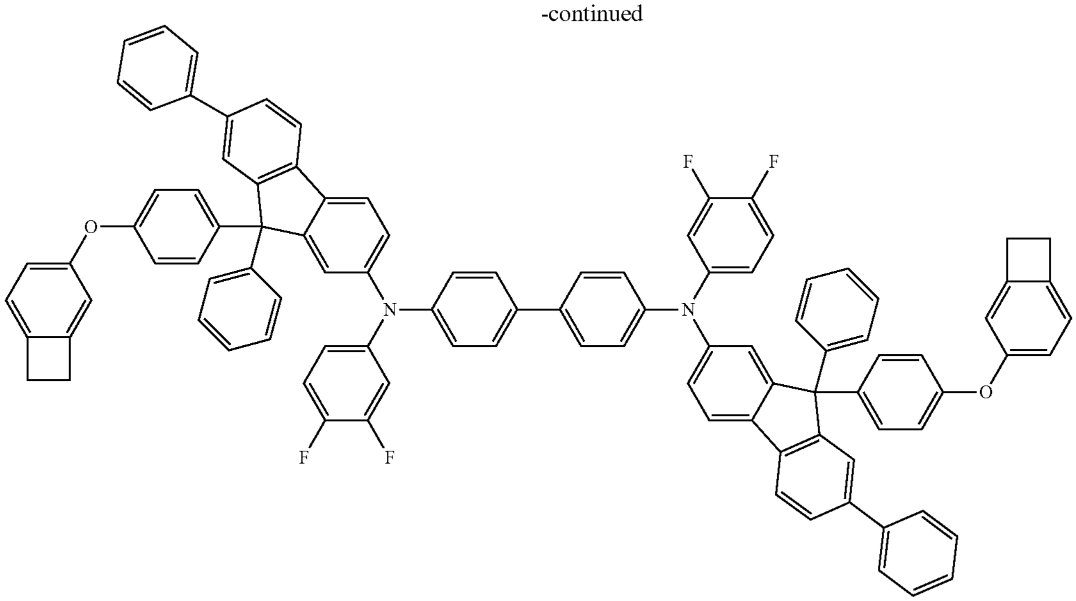
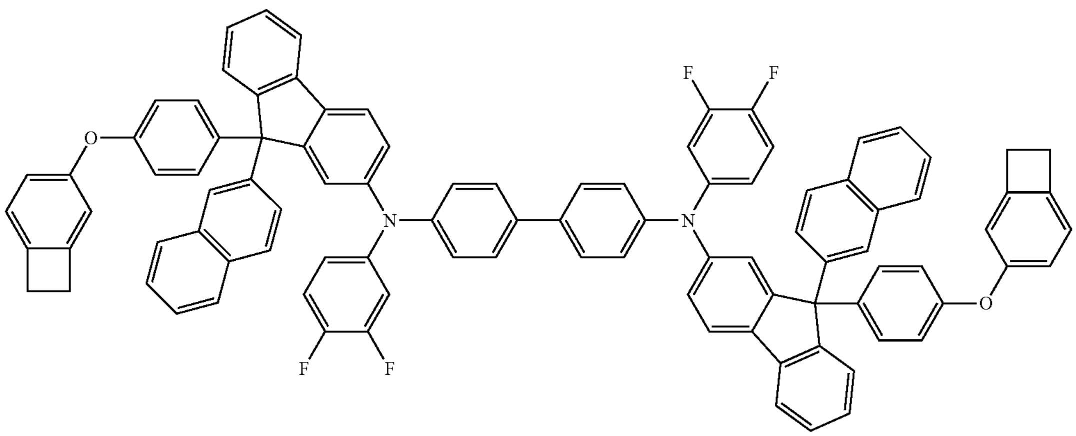
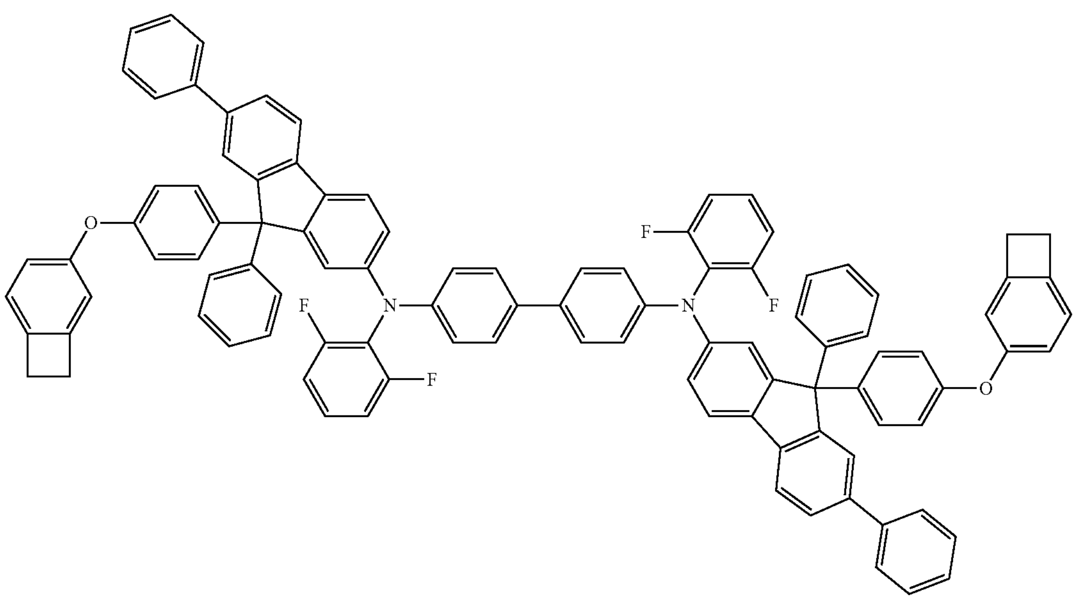

-continued
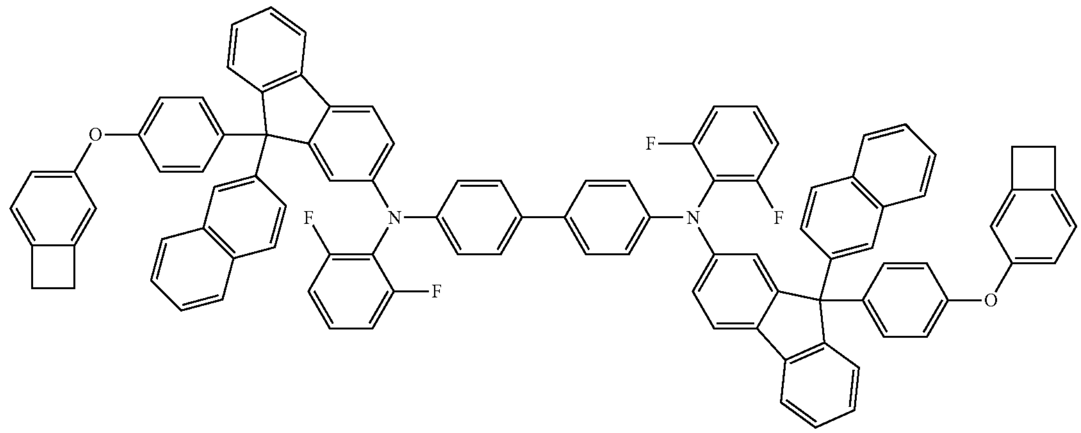
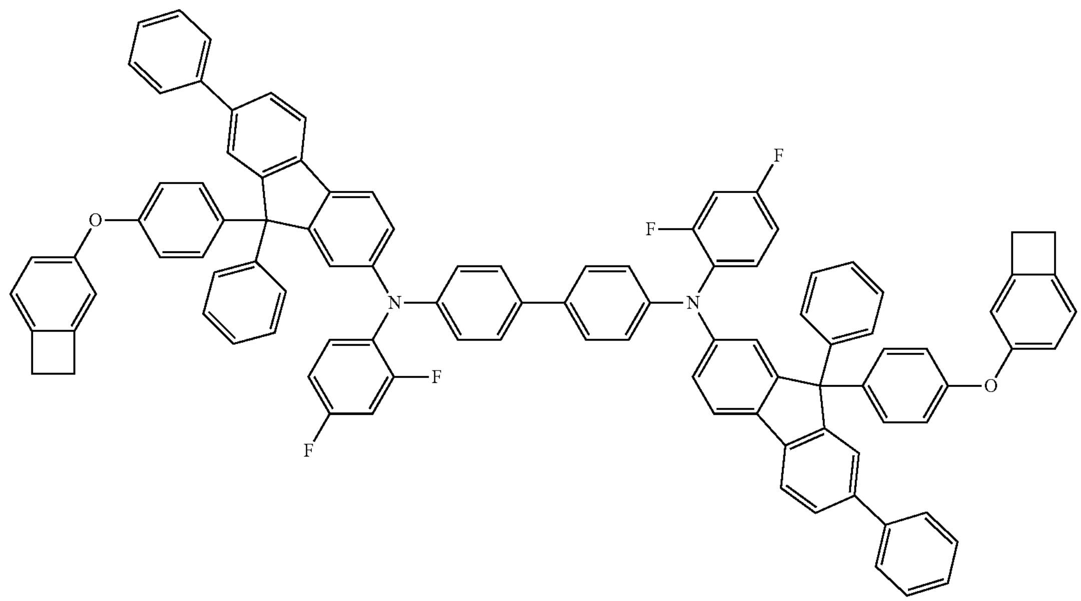
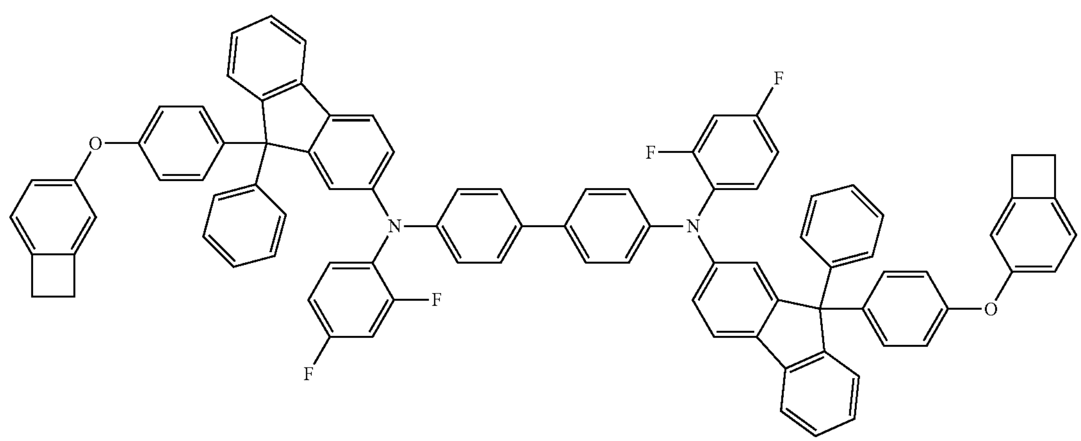

-continued
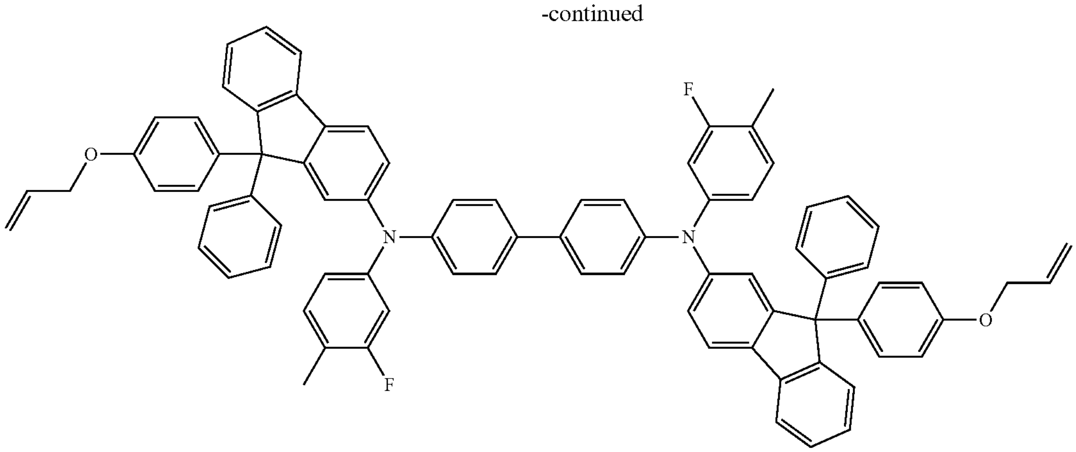
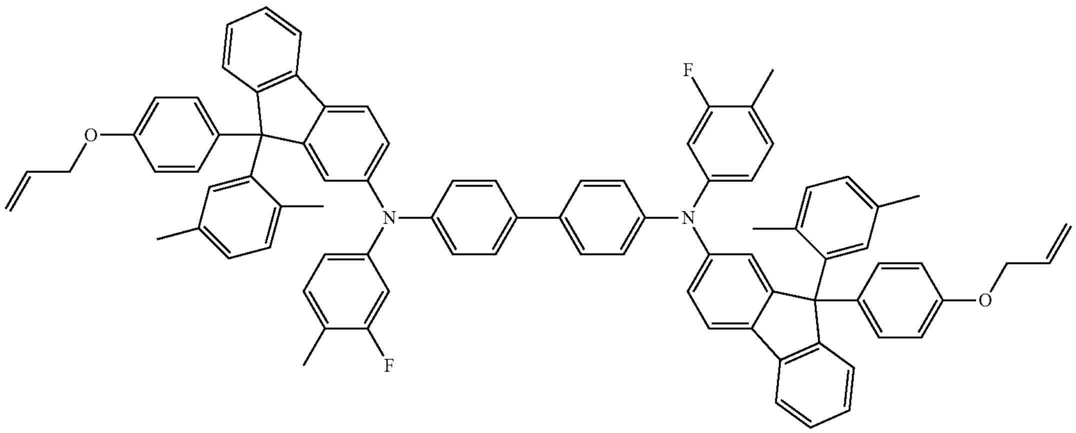
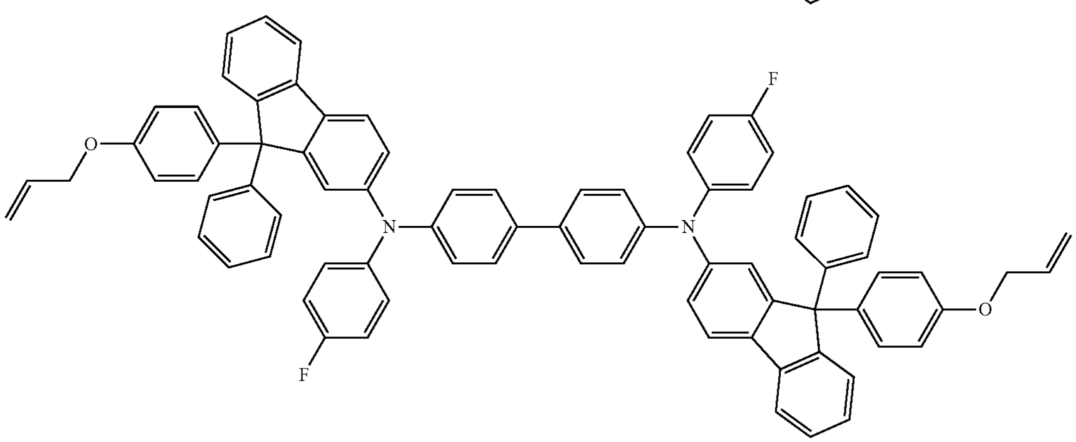
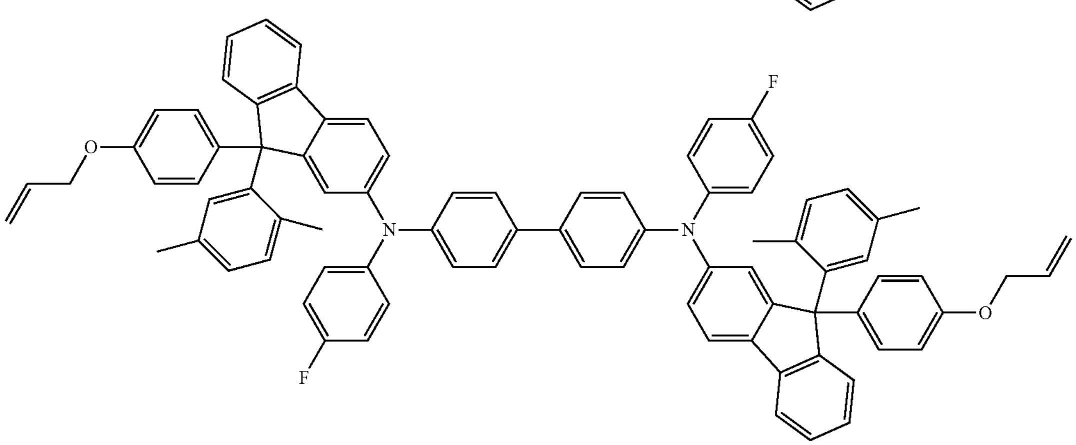

-continued
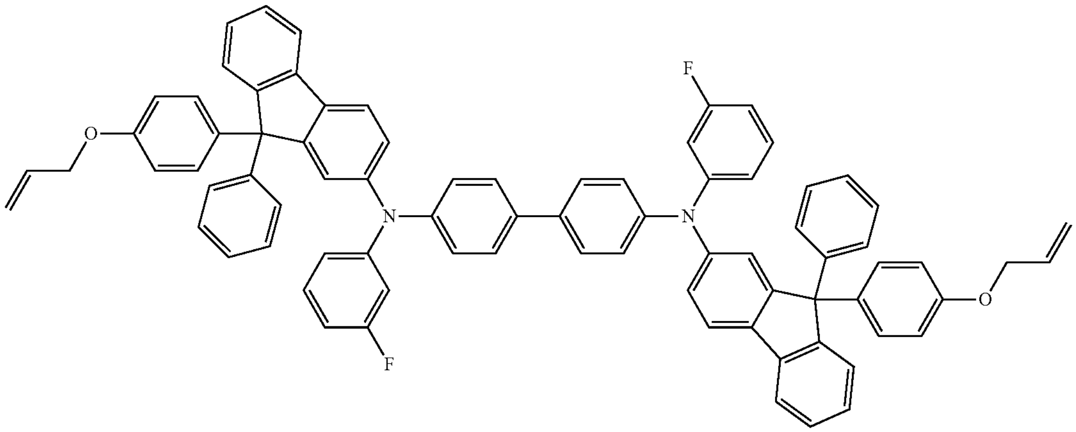
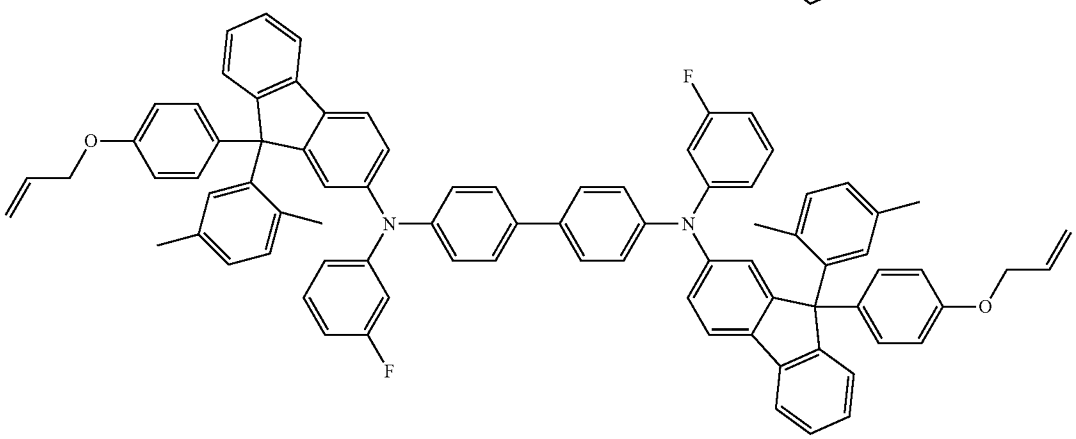
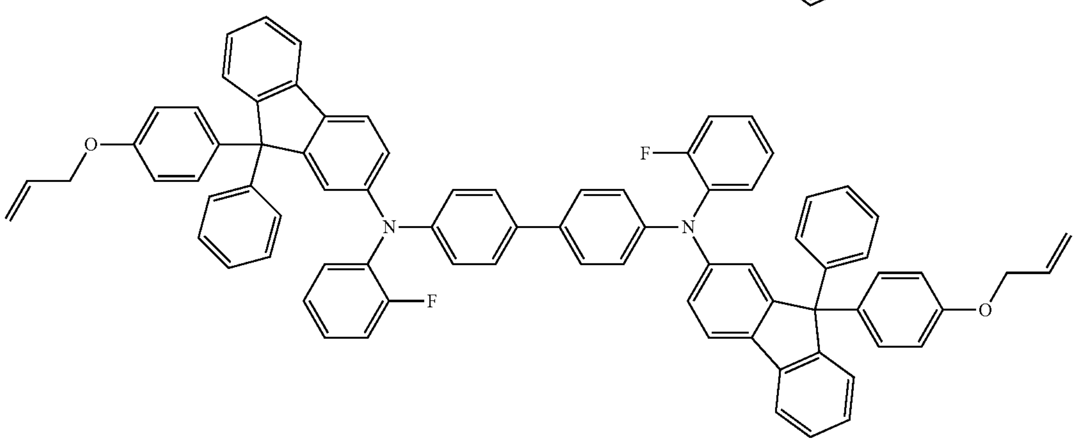
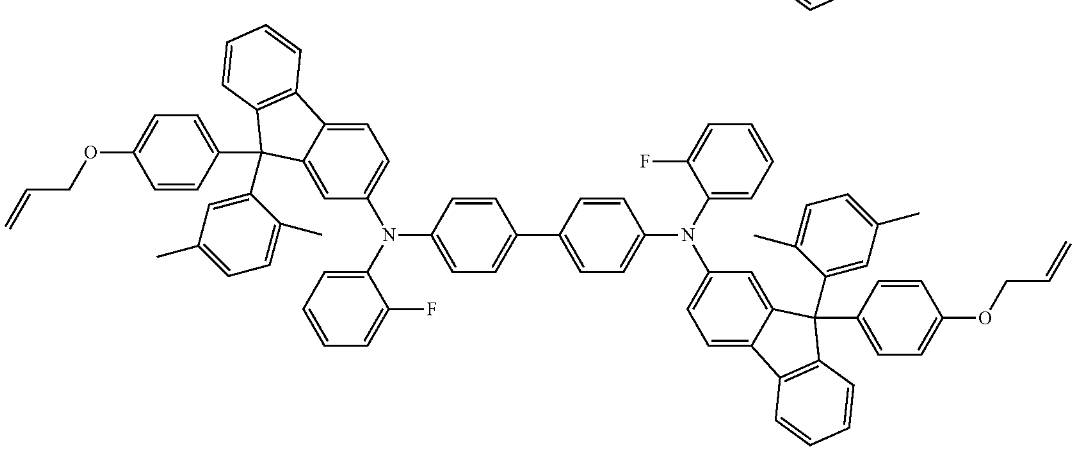

-continued
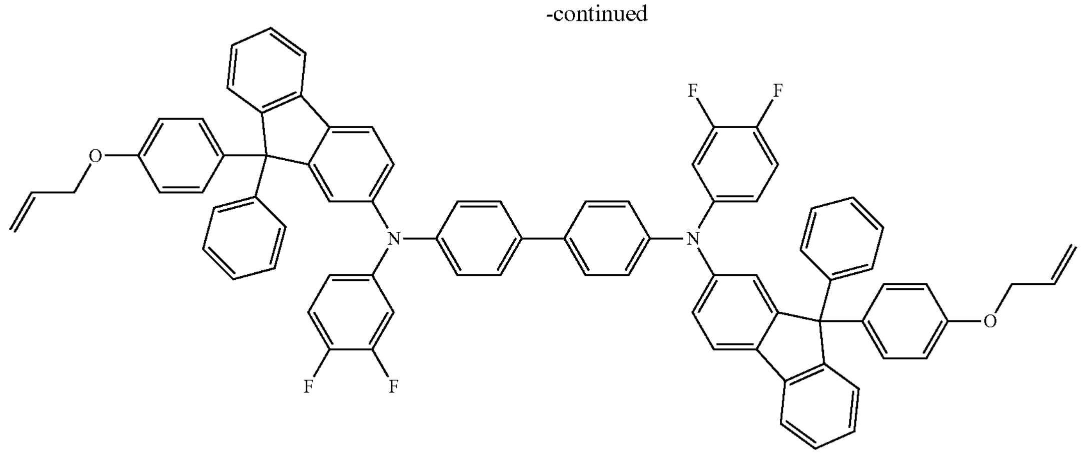
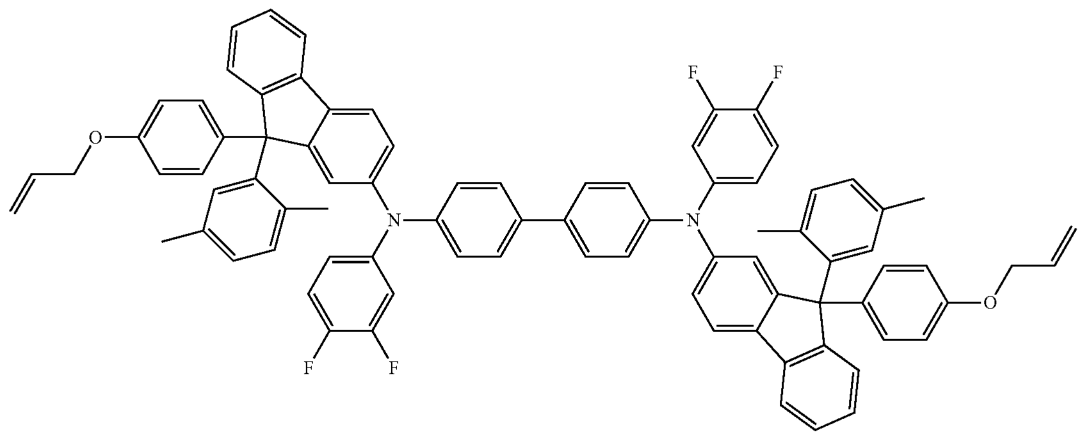
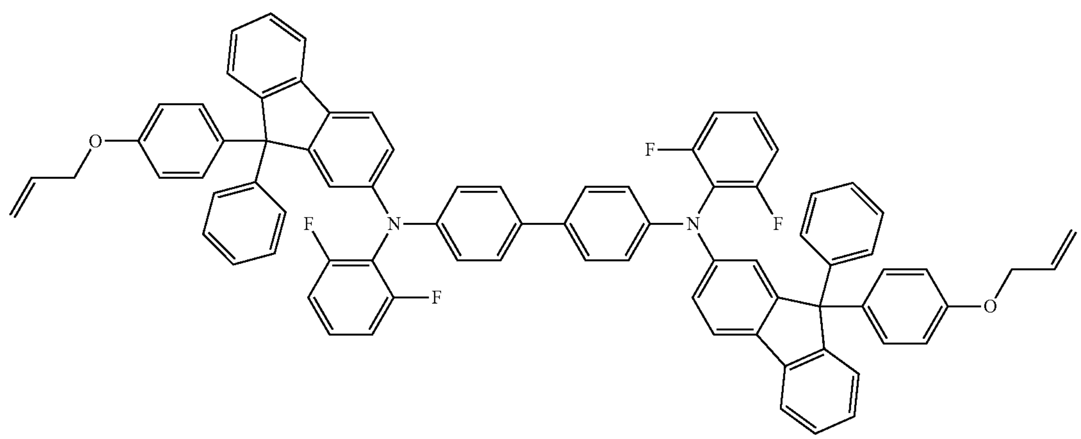
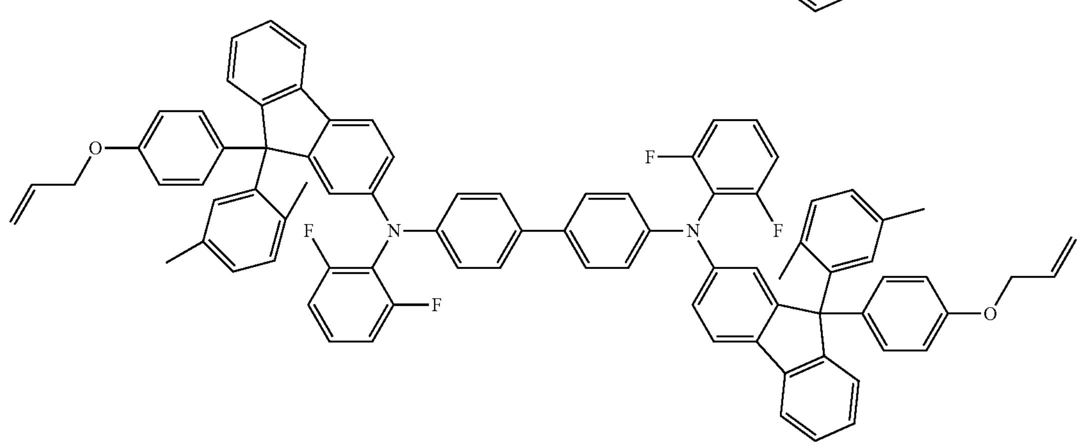

-continued
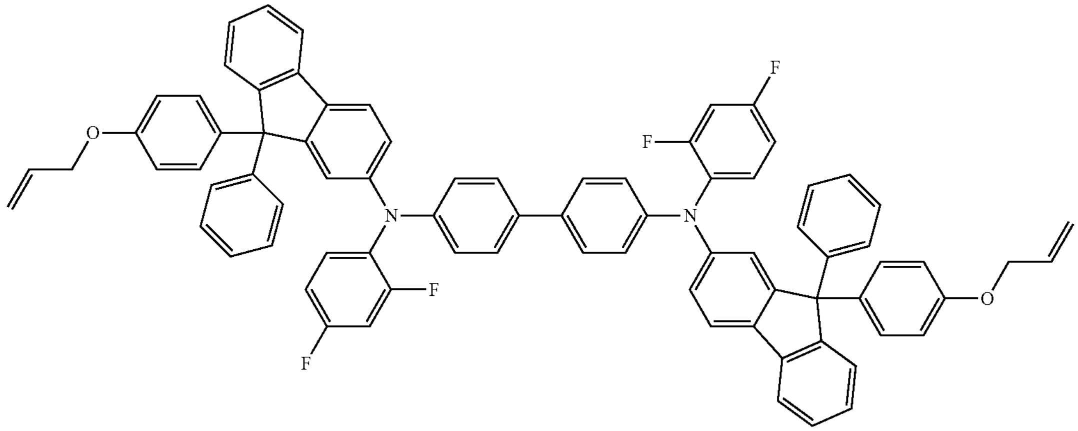
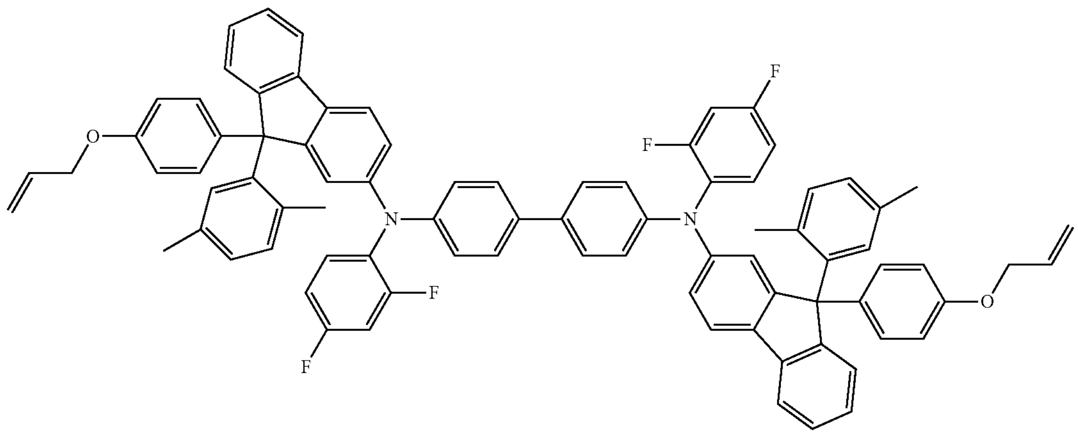
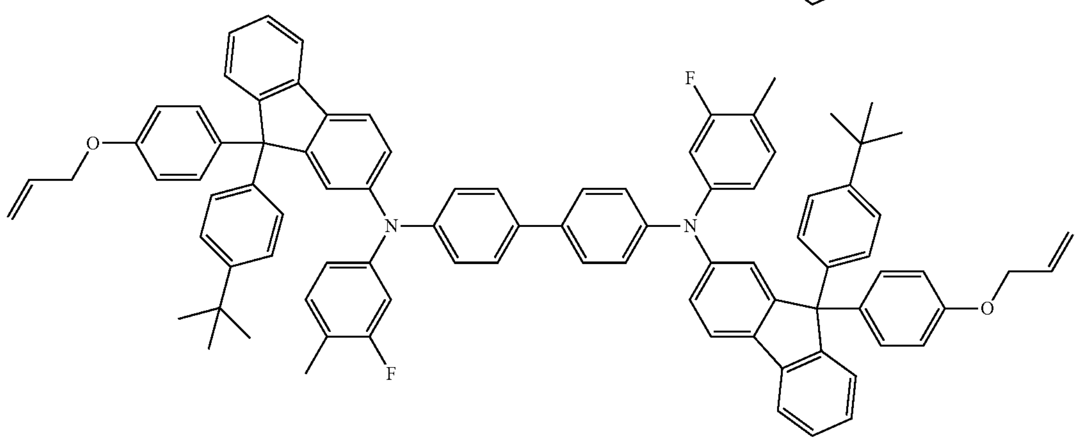
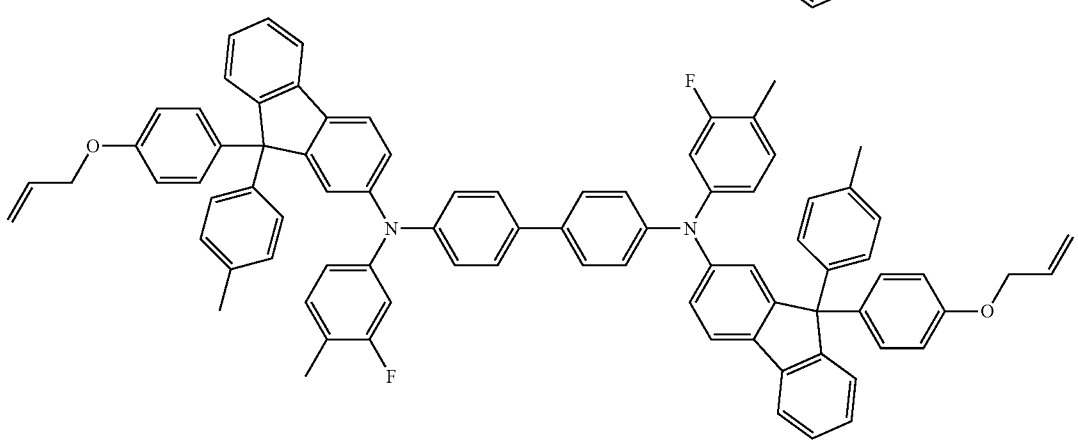

-continued
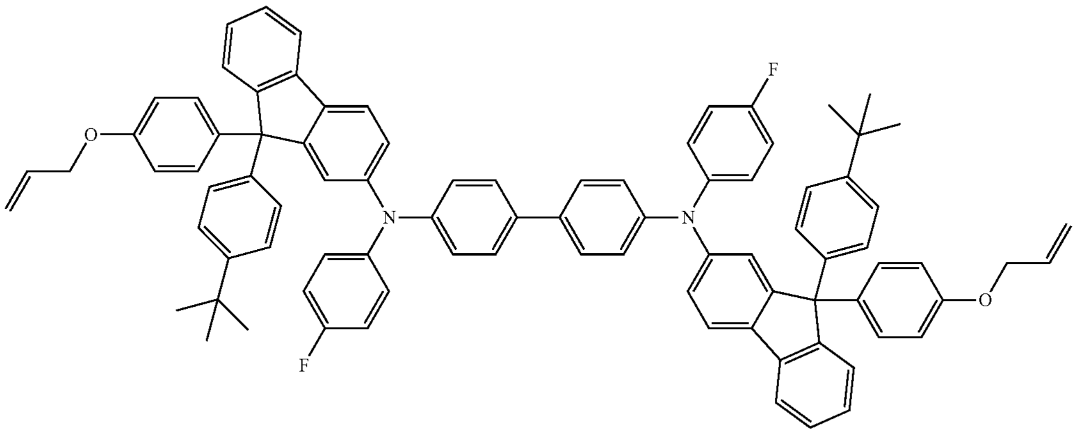
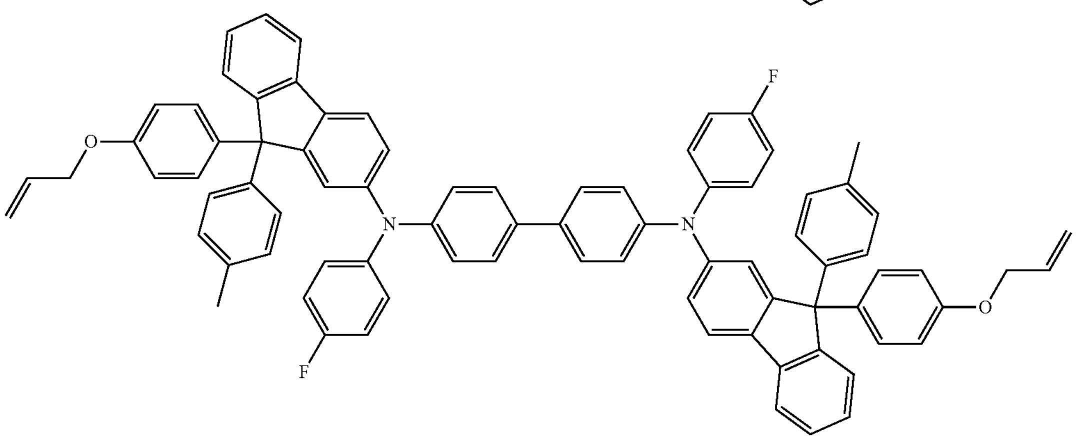
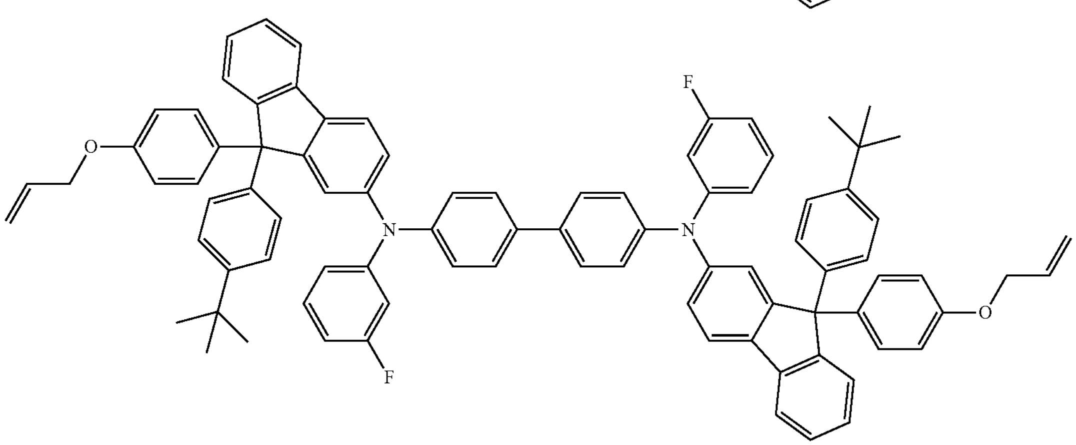
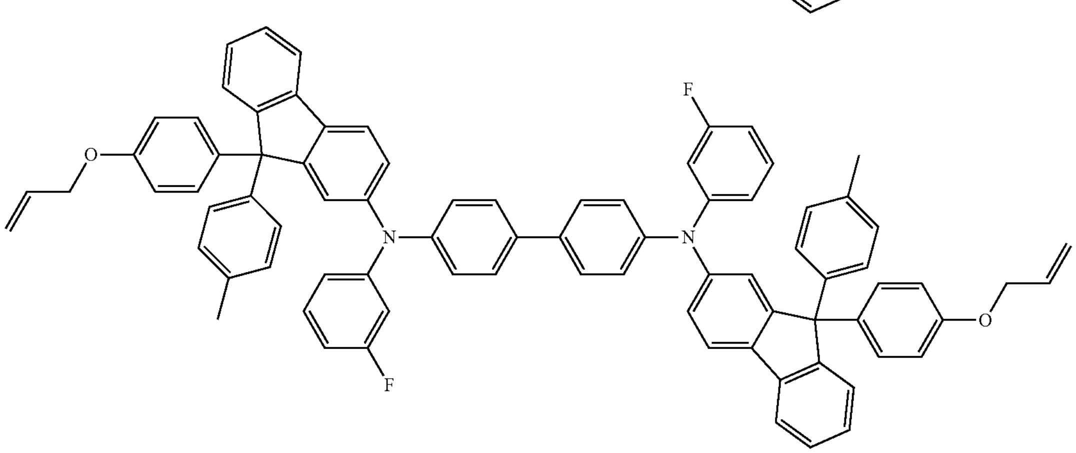

-continued
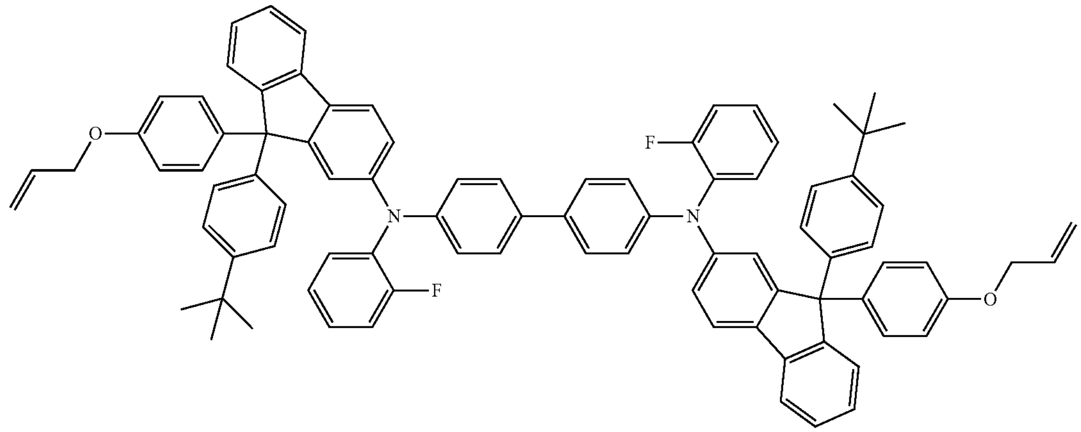
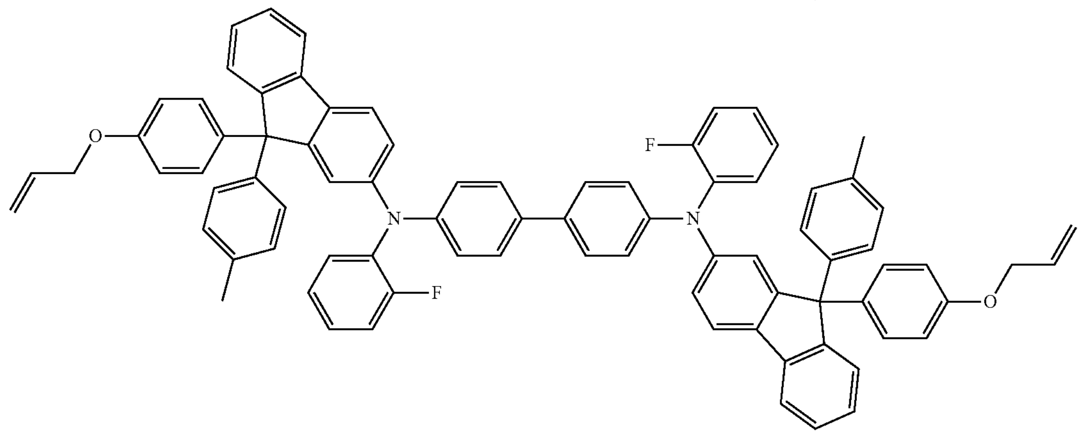
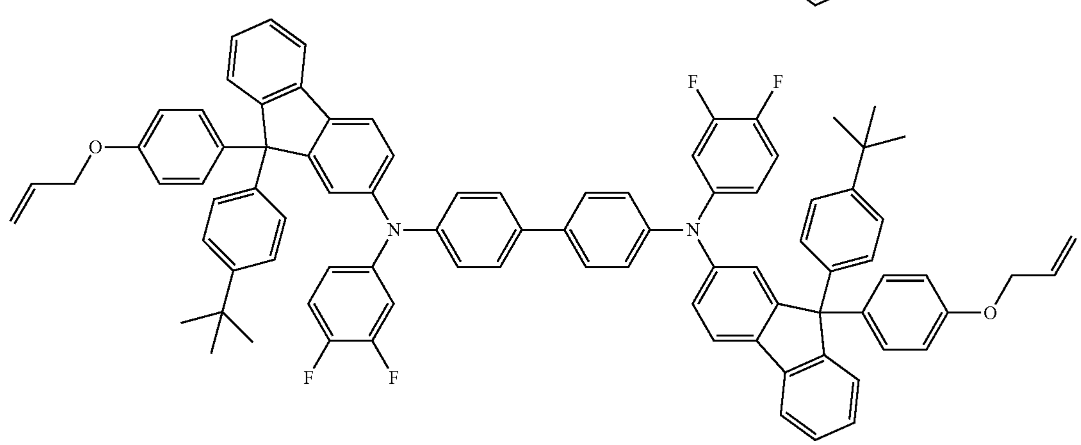
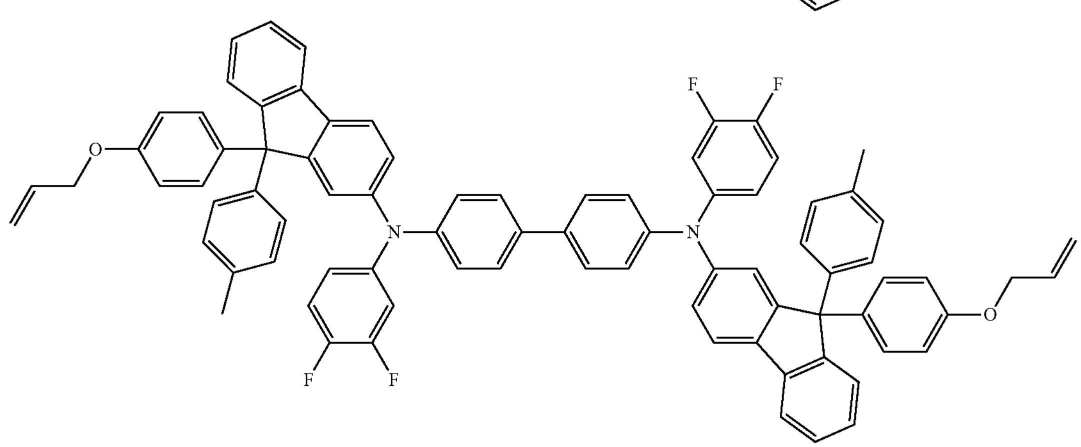

-continued
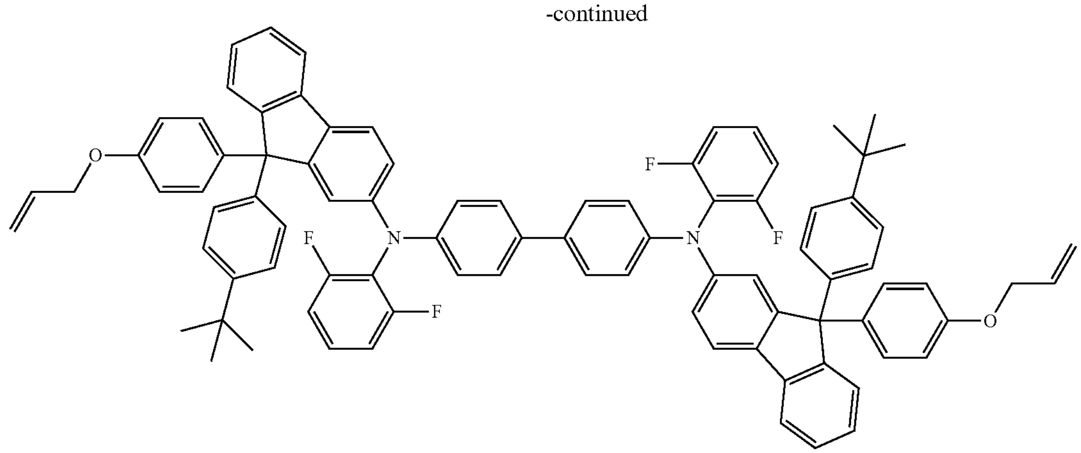
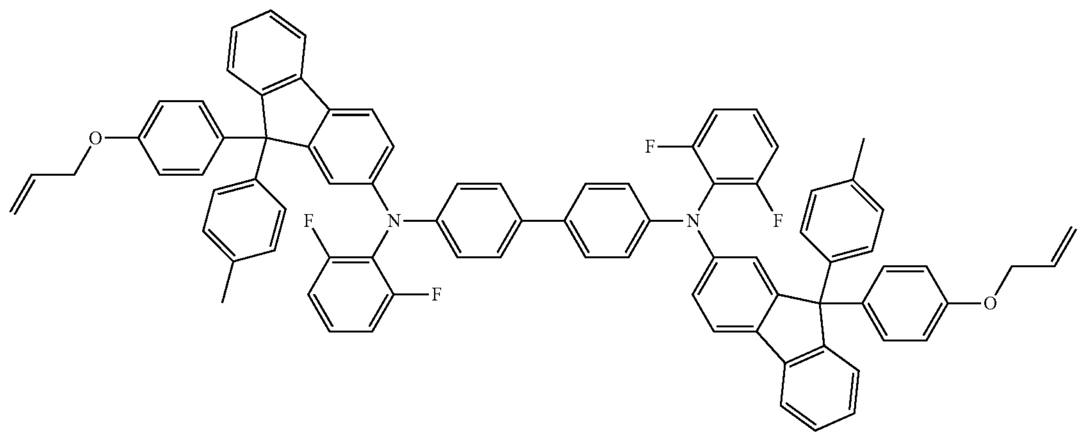
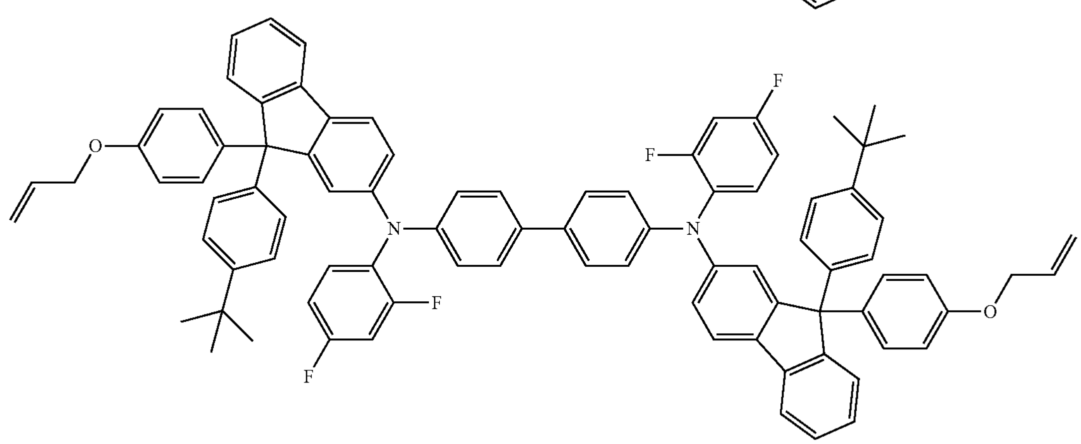
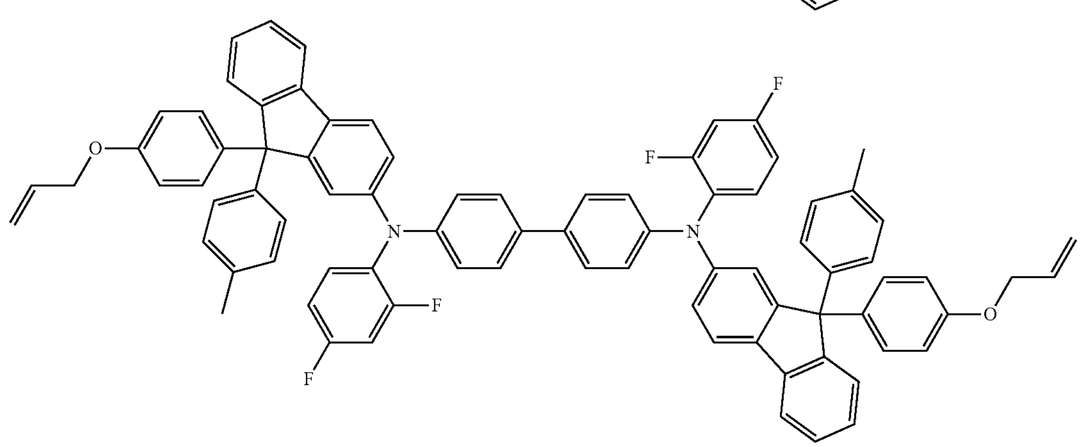

-continued
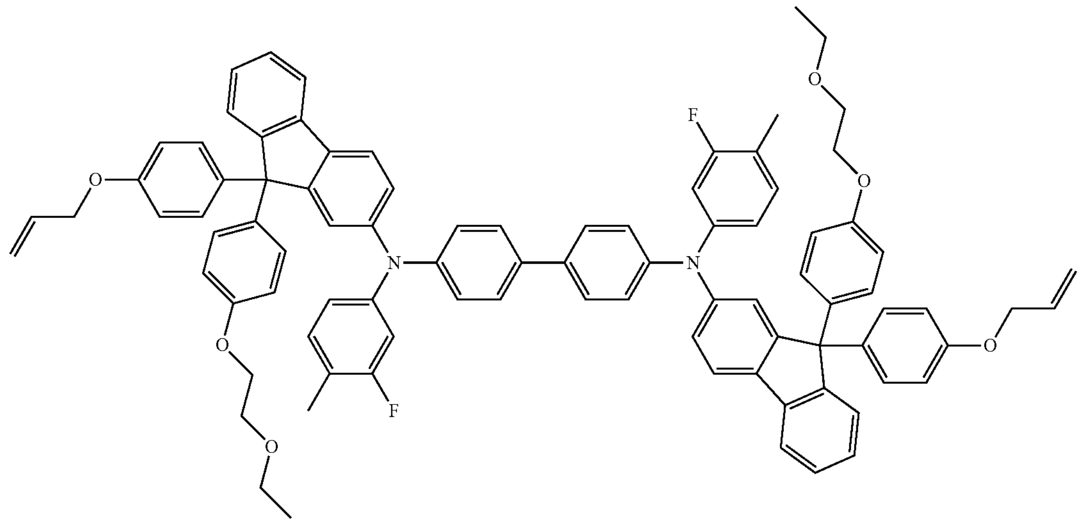
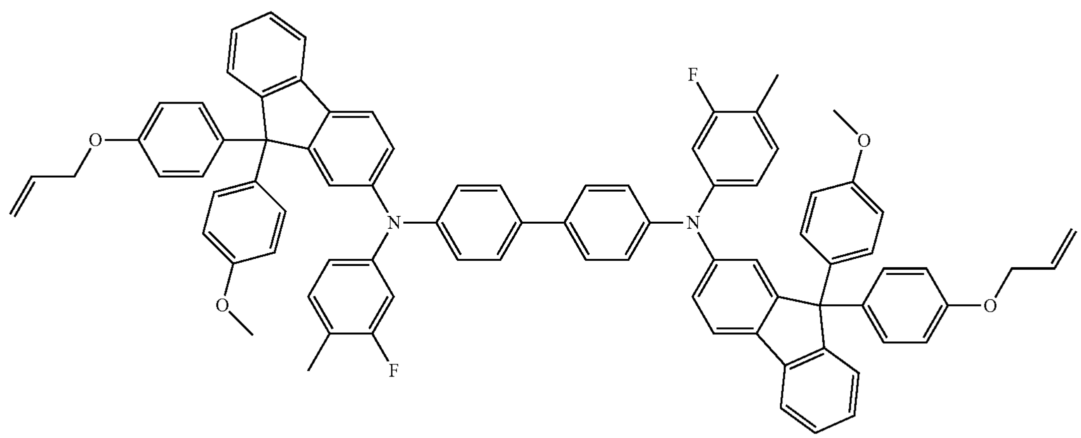
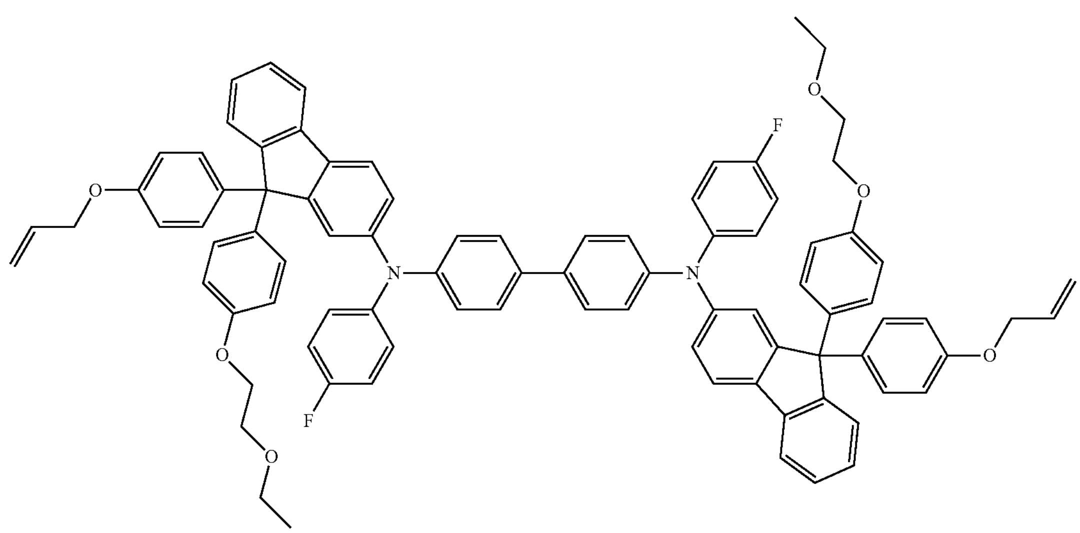

-continued
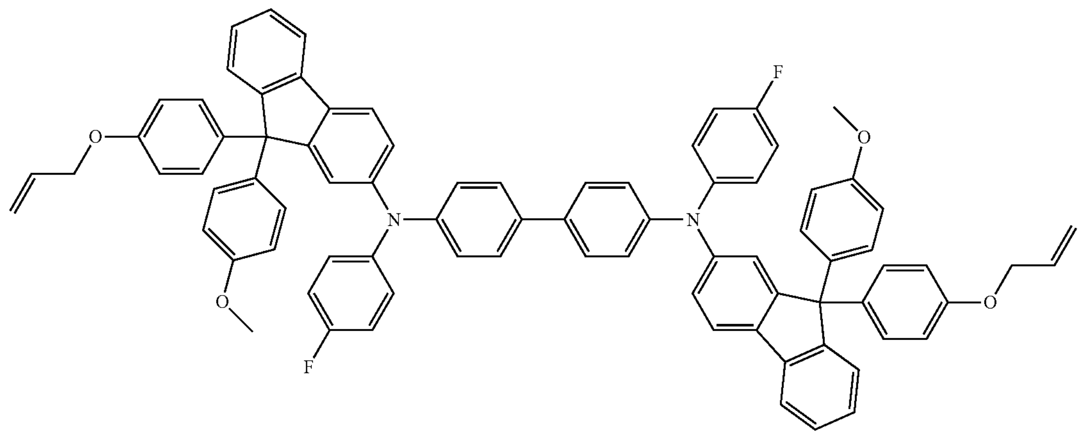
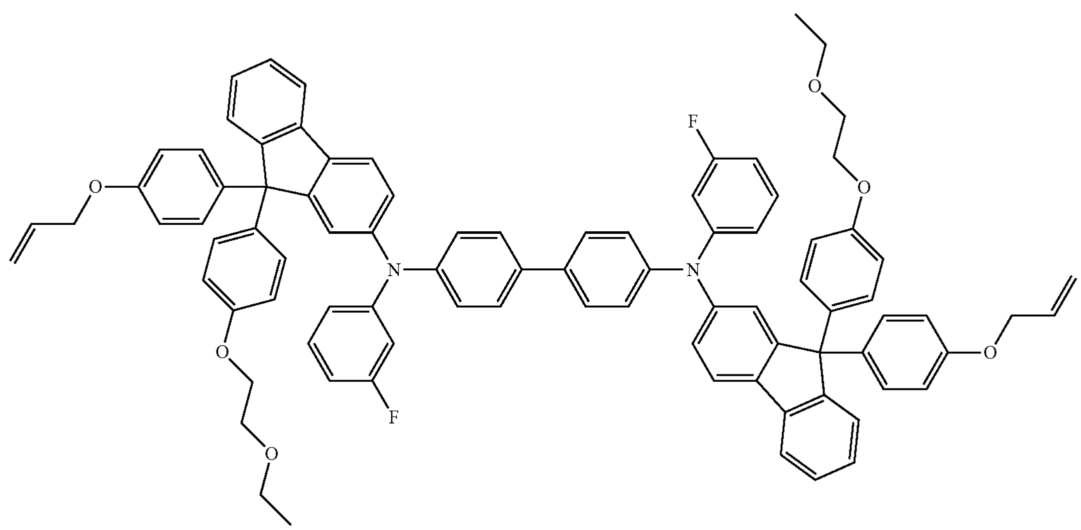
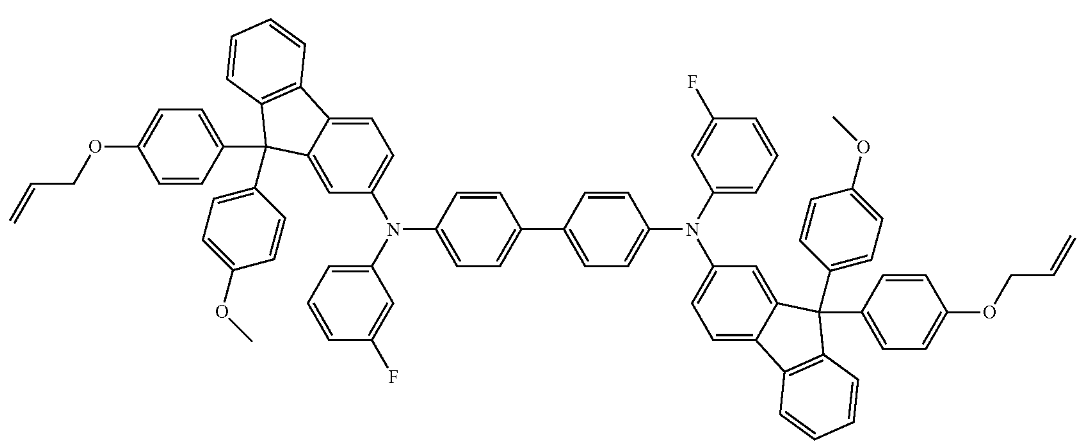

-continued
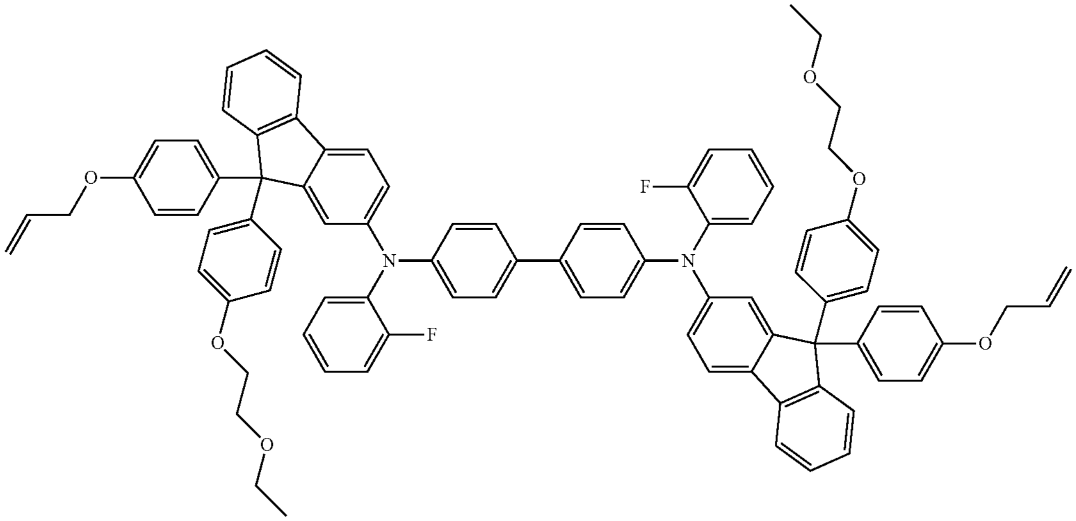
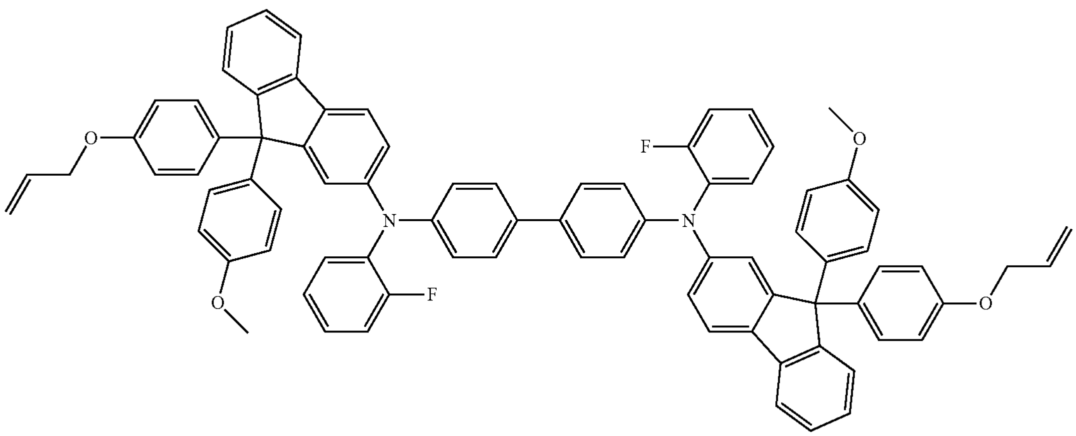
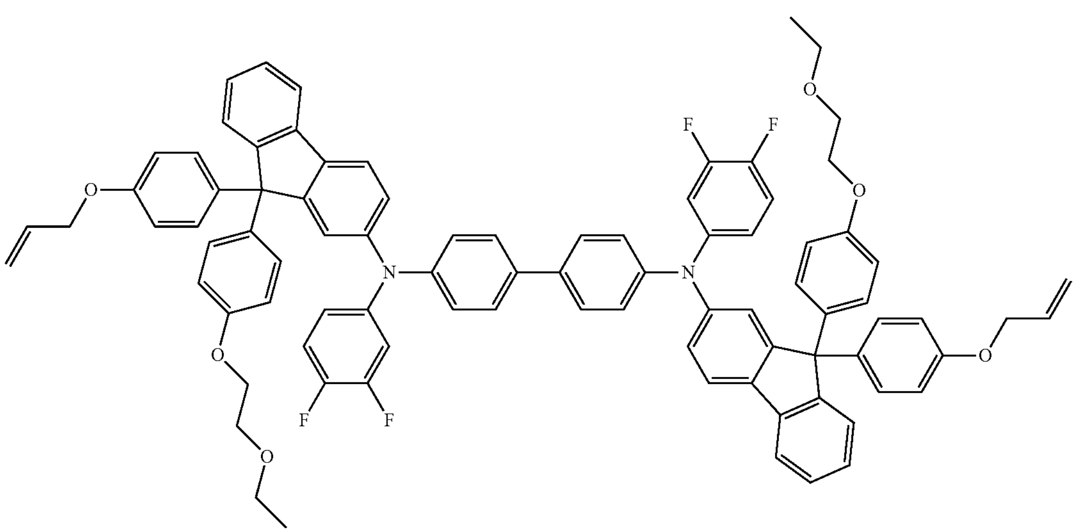

-continued
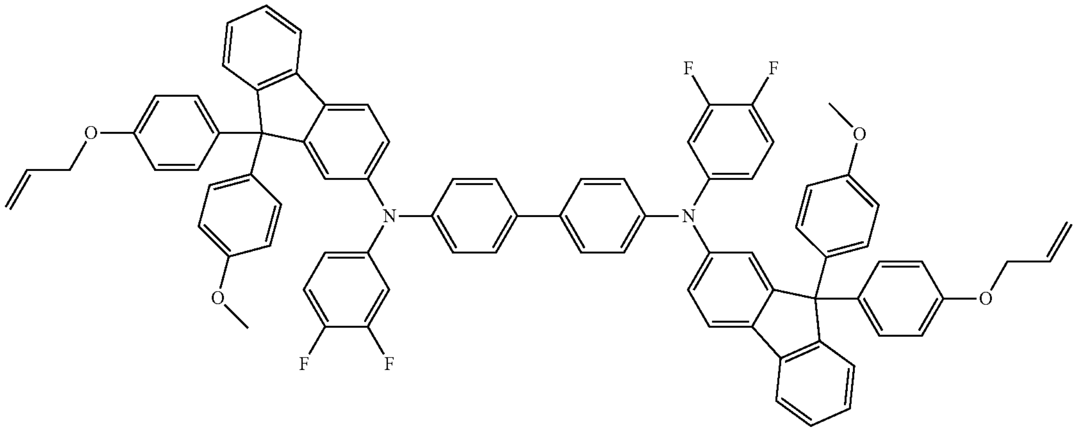
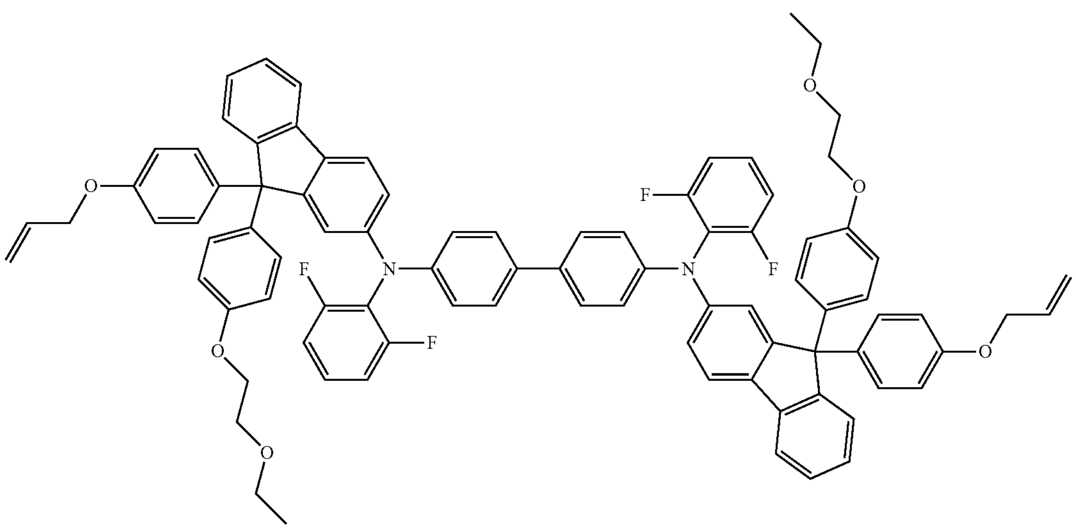
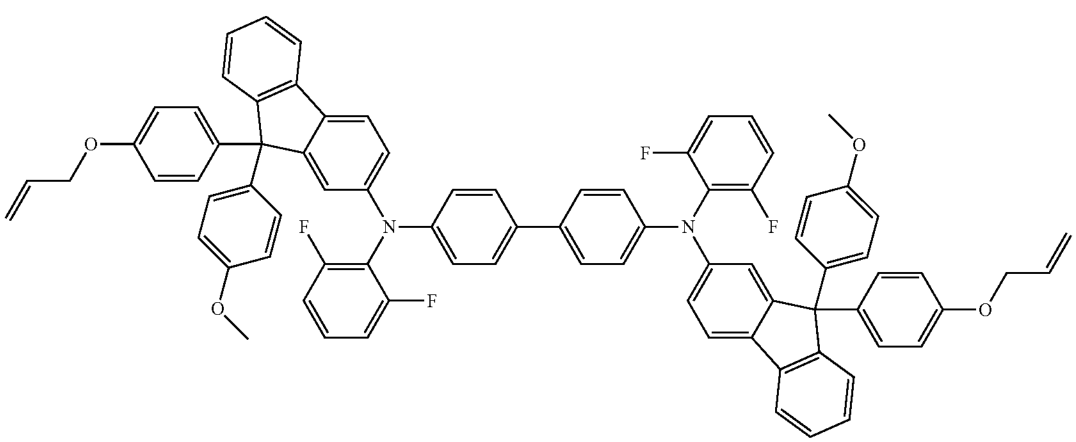

-continued
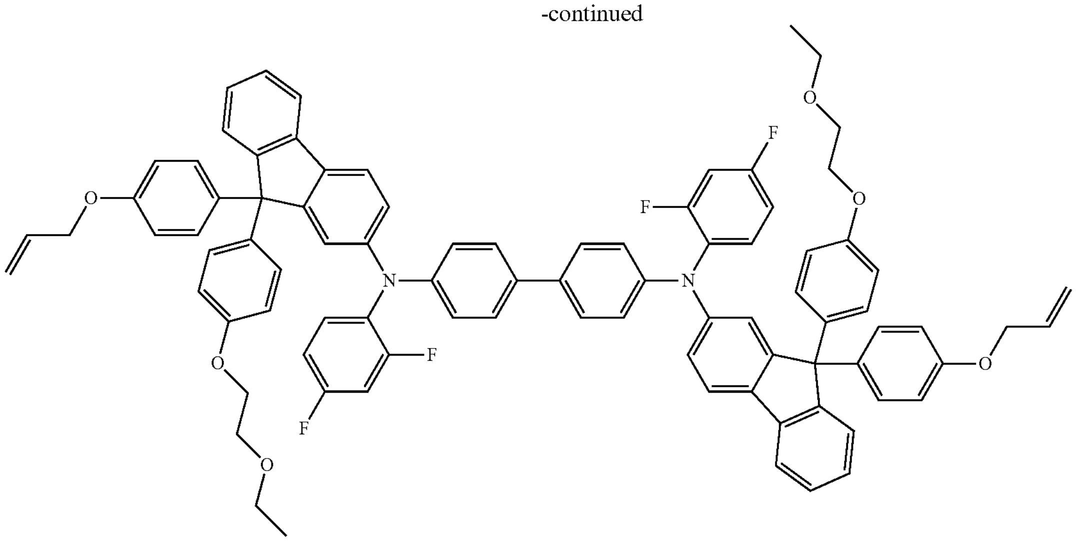
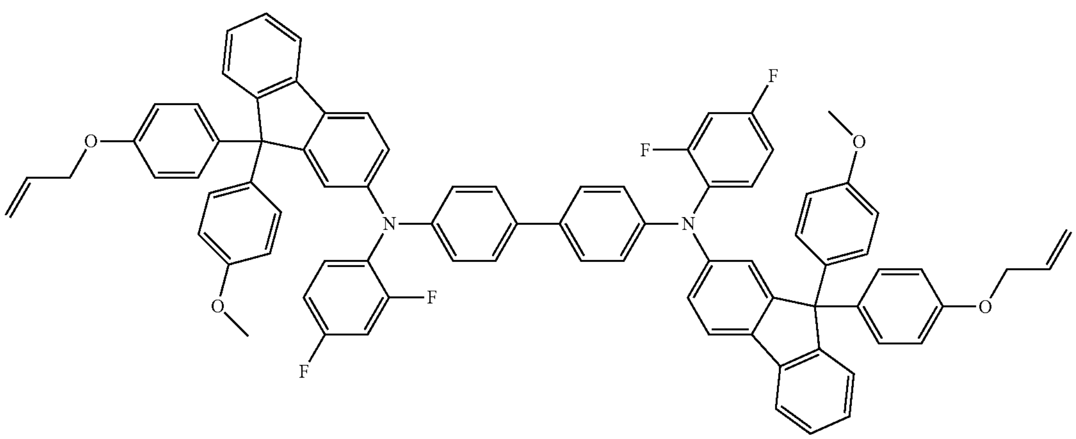
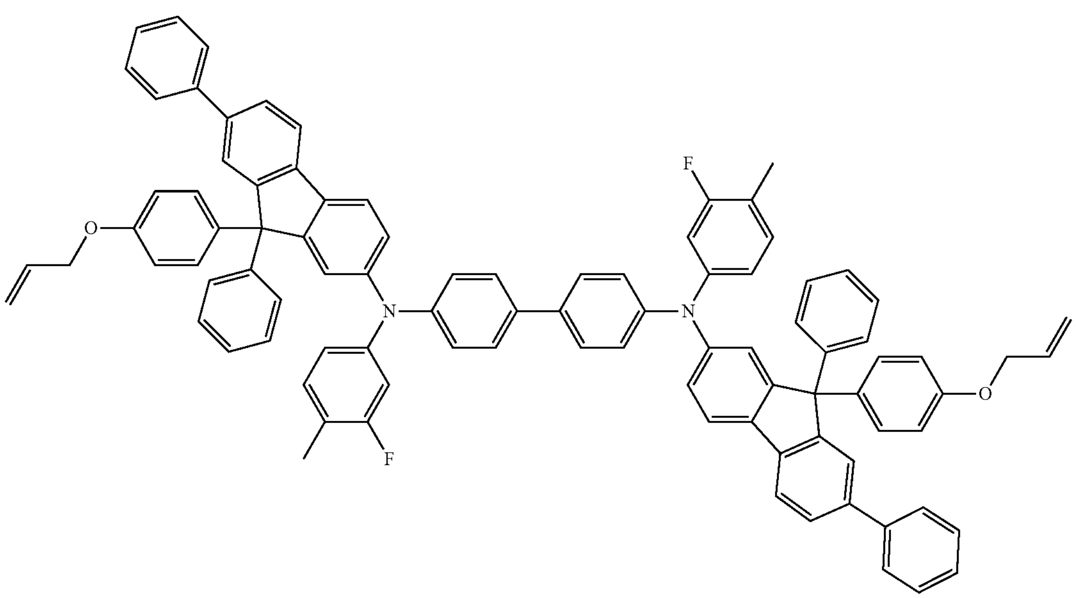

-continued
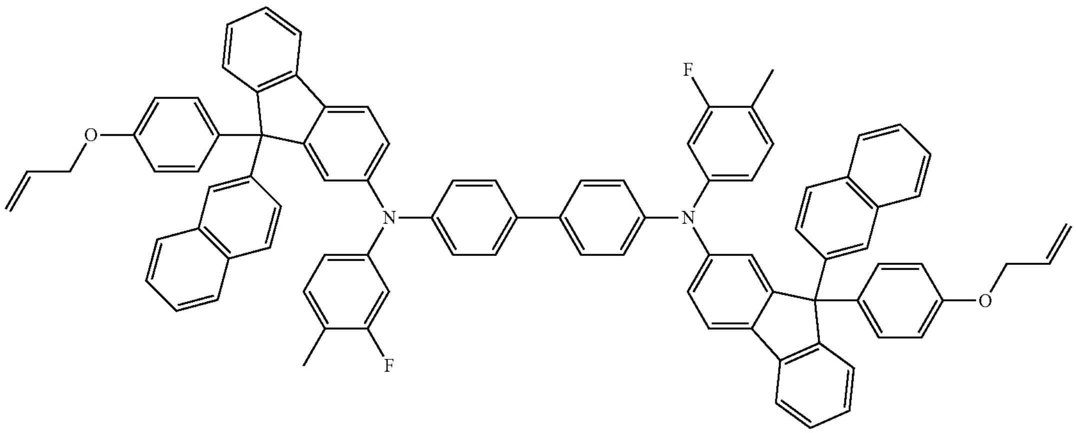
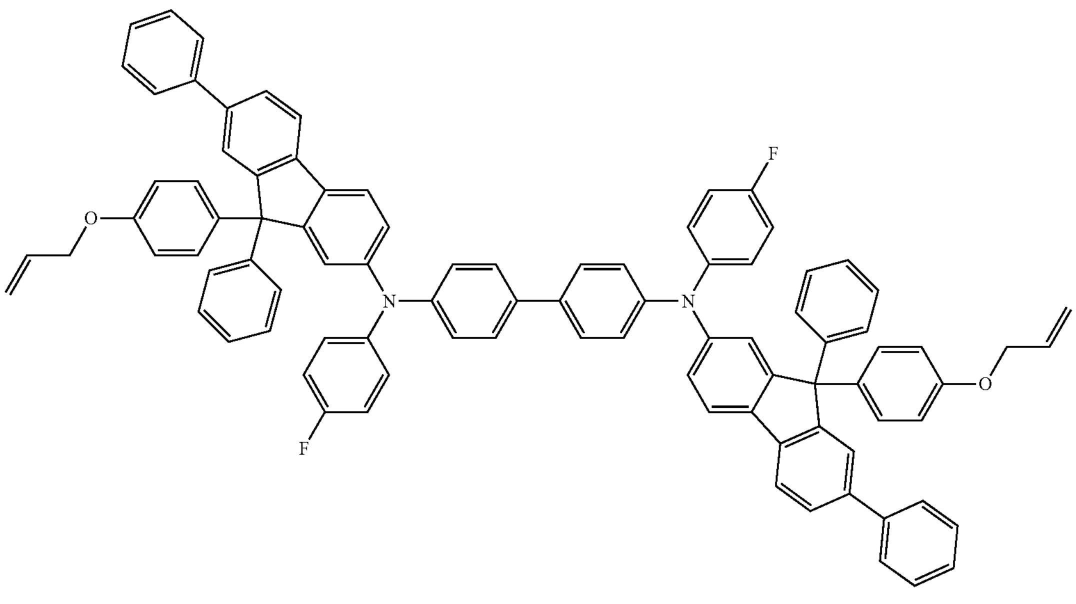
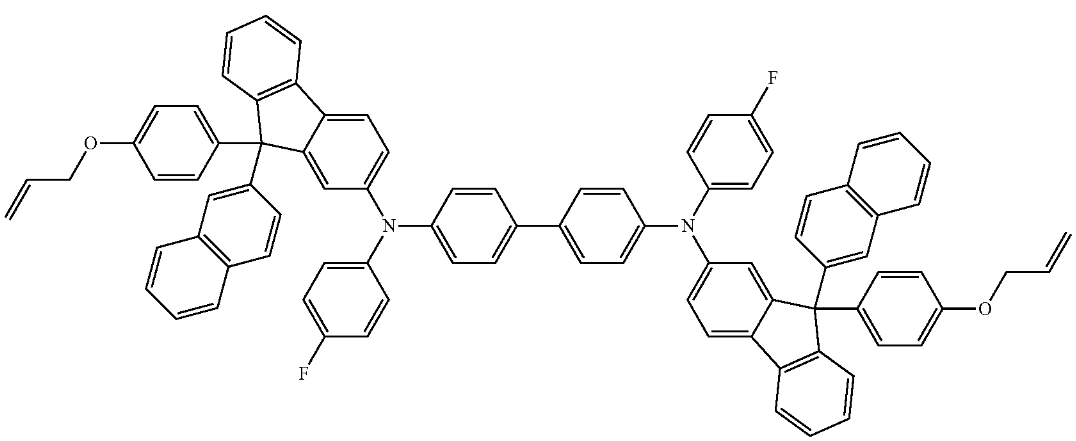

-continued
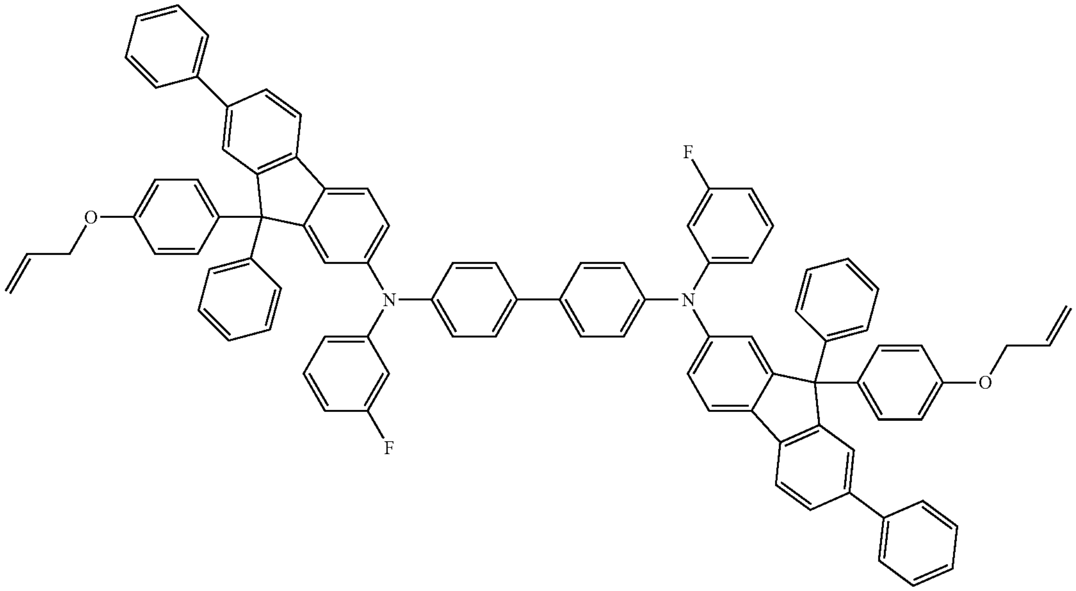
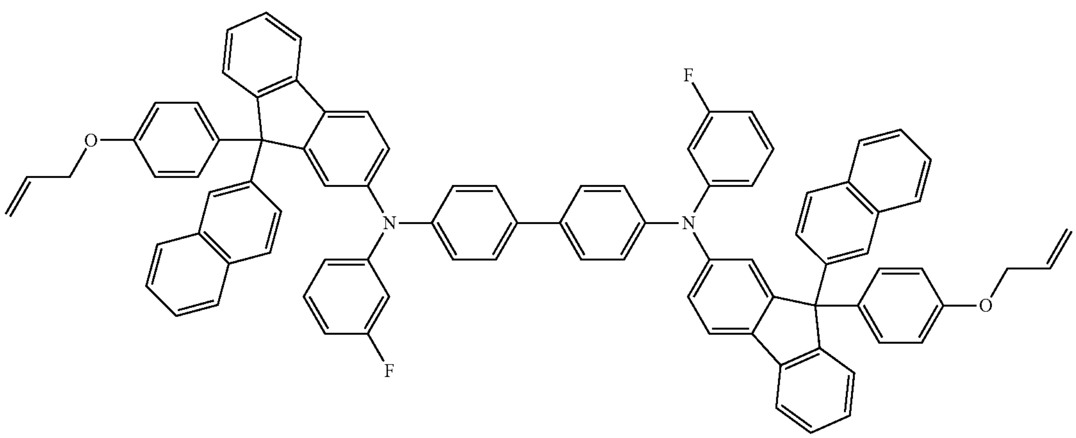
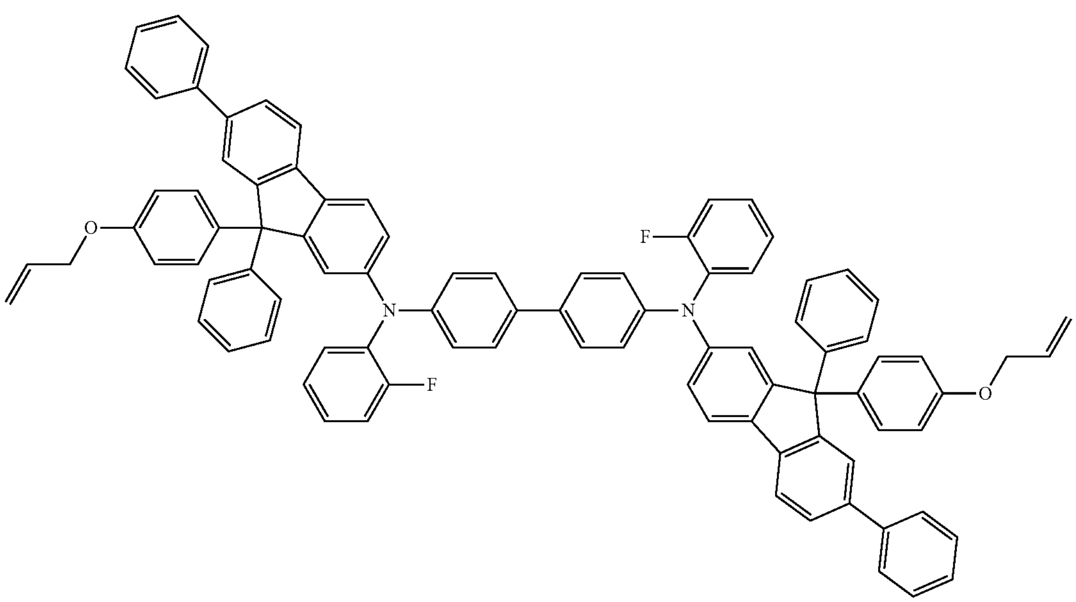

-continued
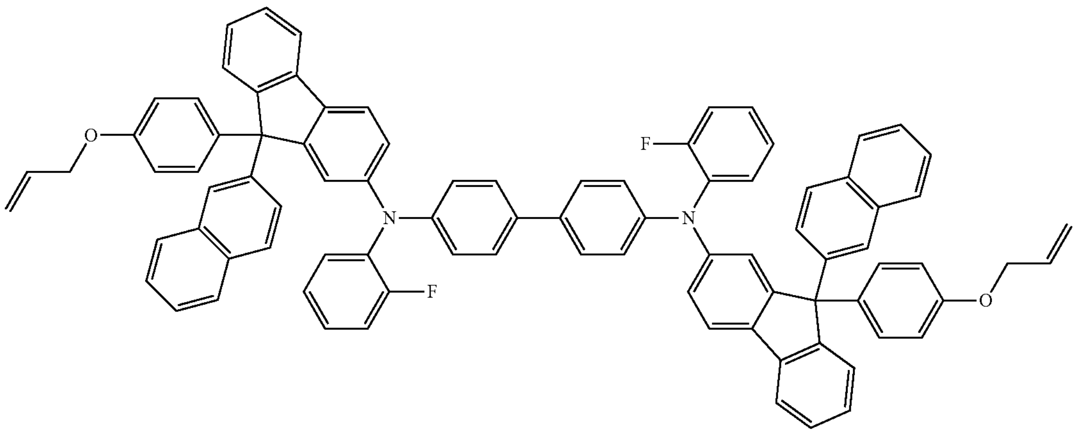
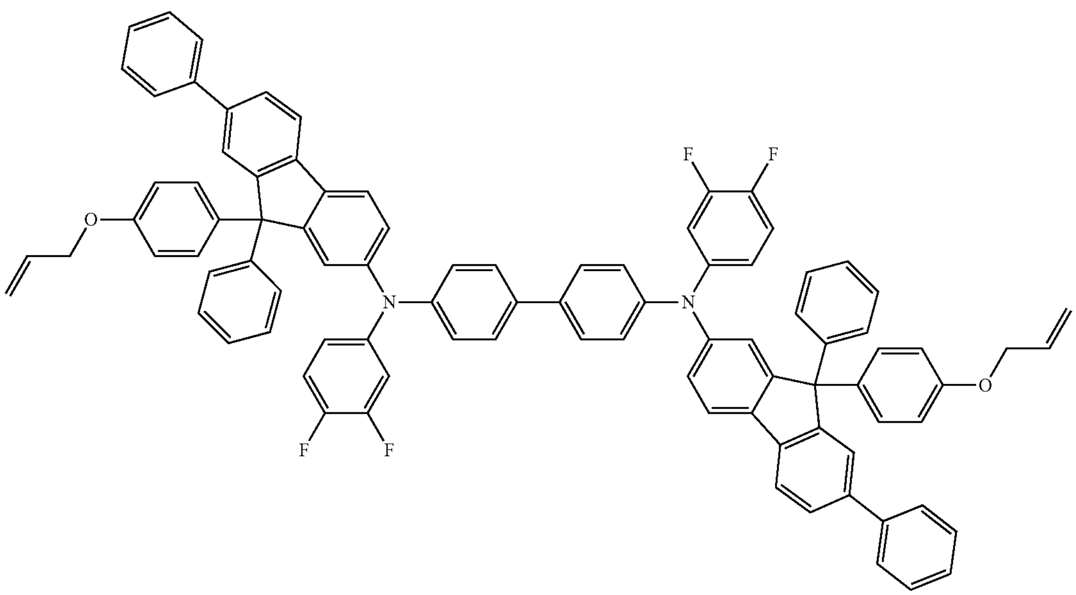
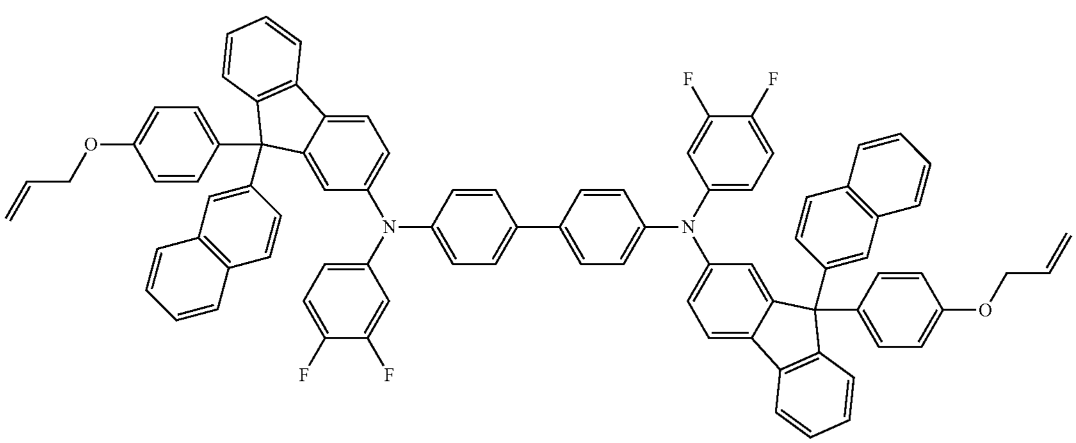

-continued
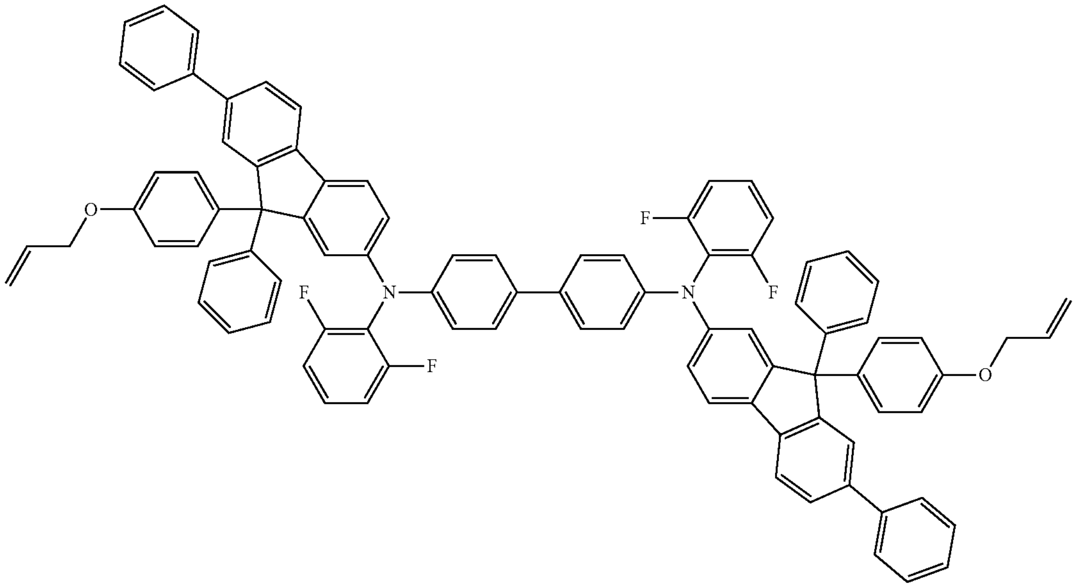
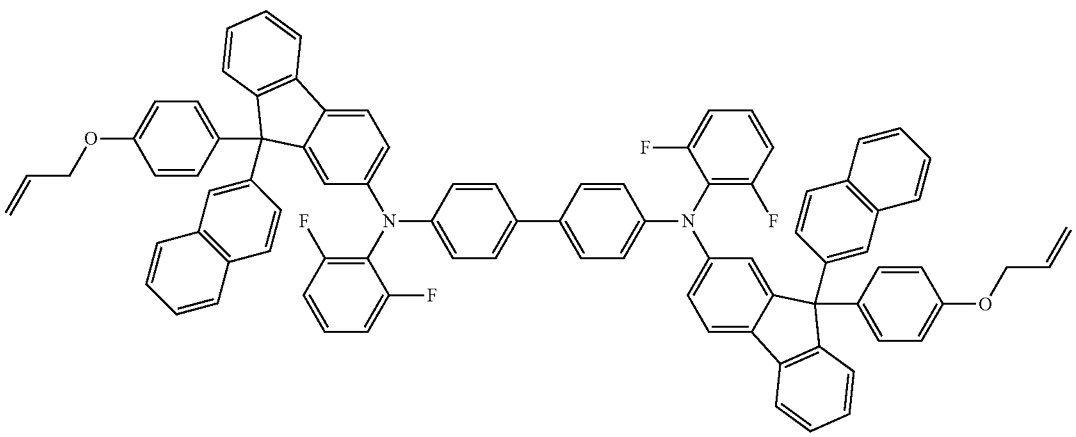
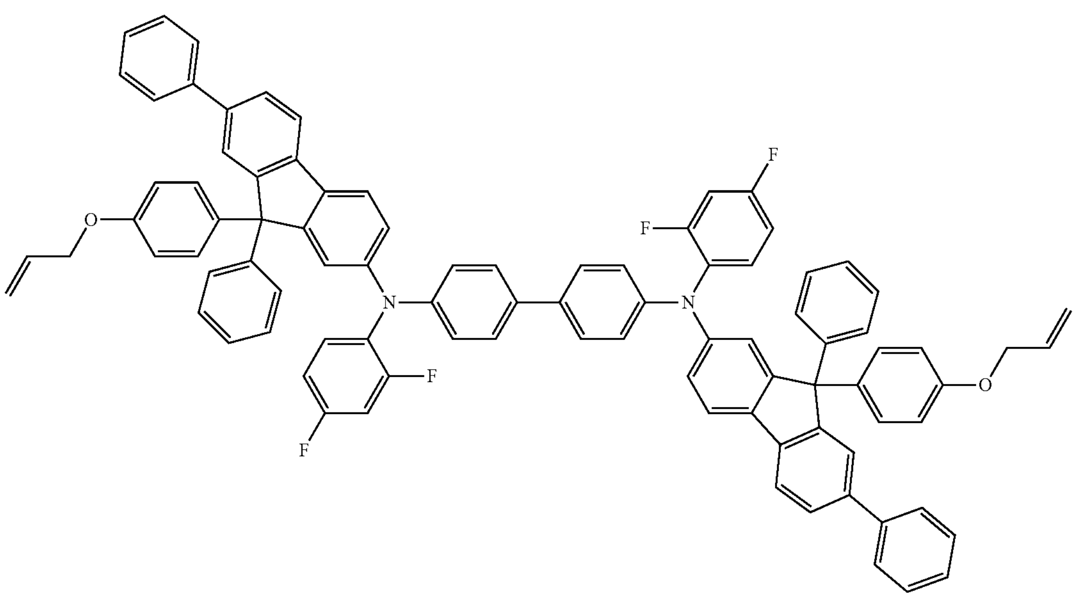

-continued
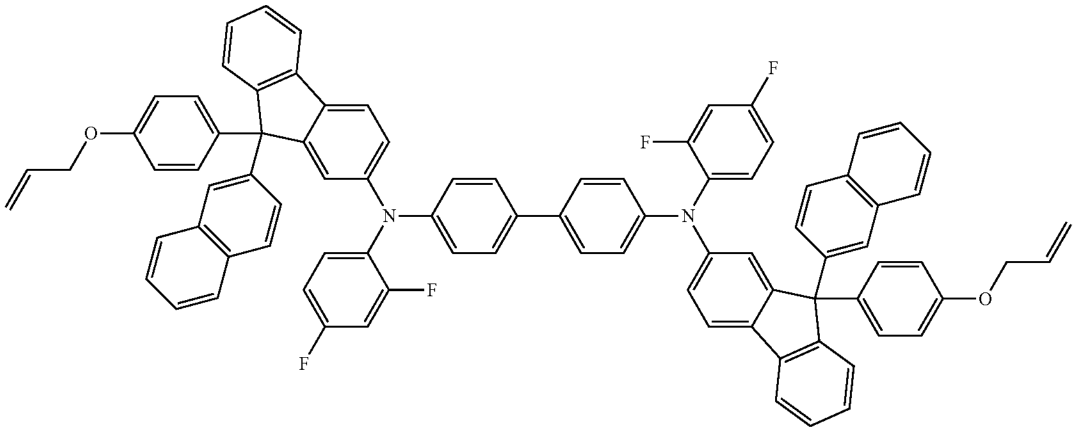
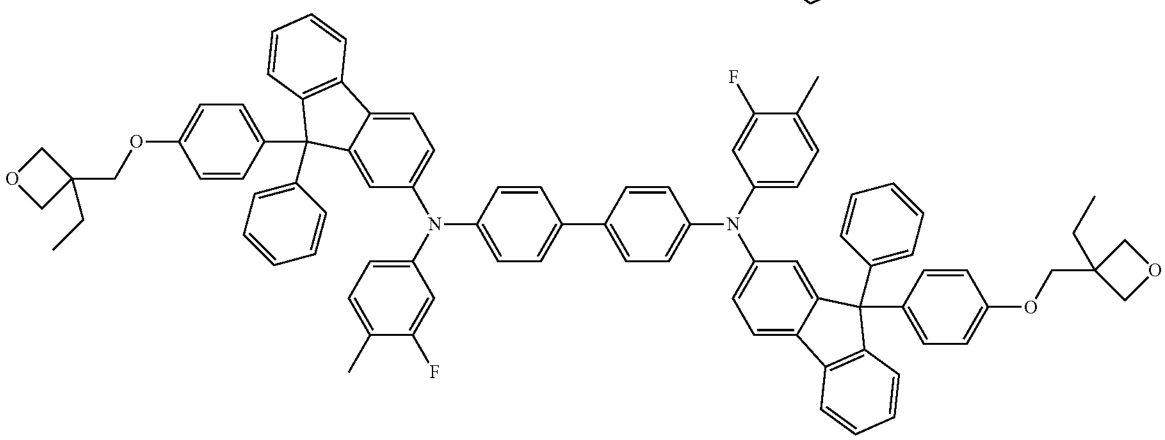
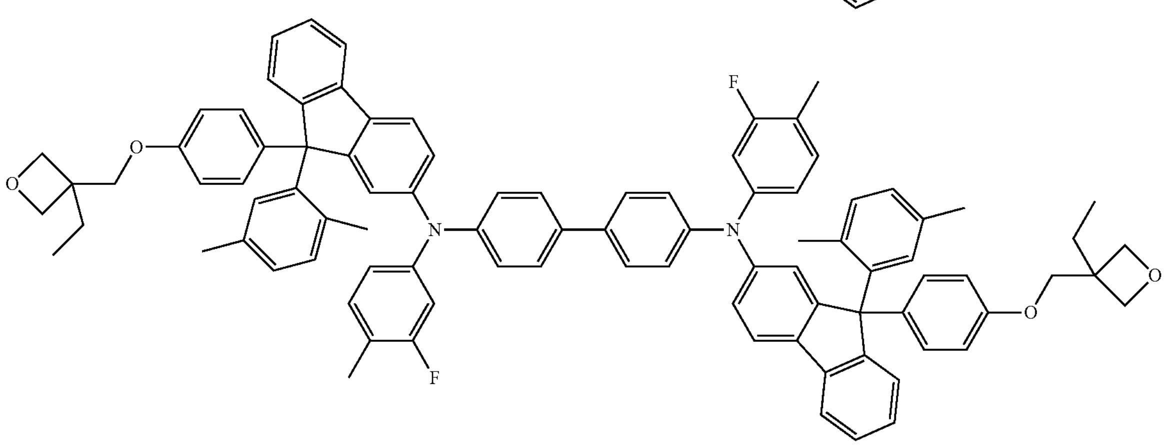
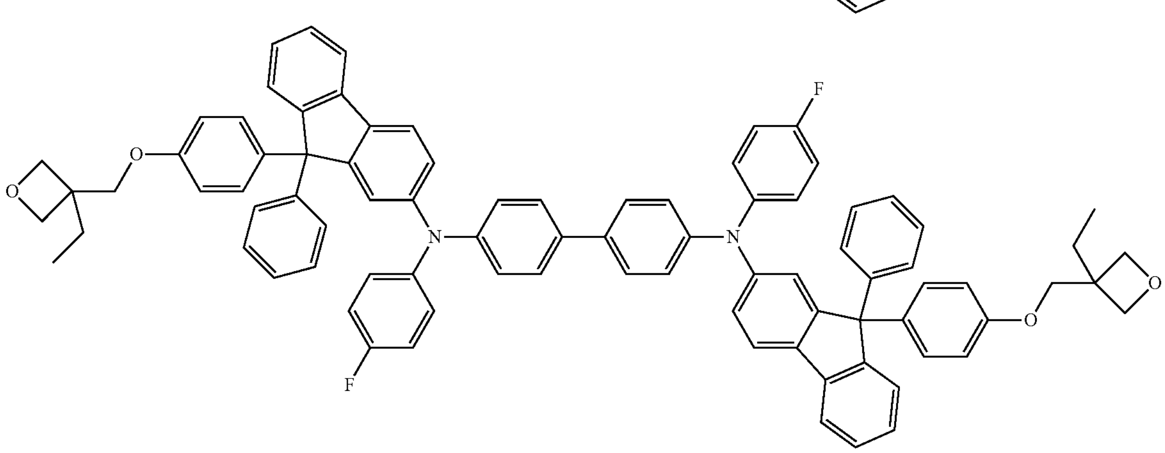

-continued
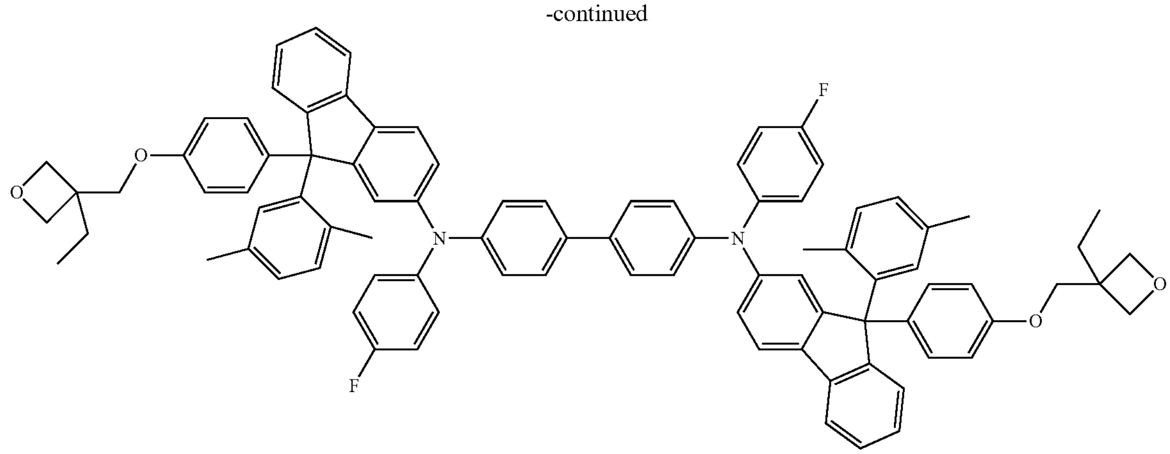
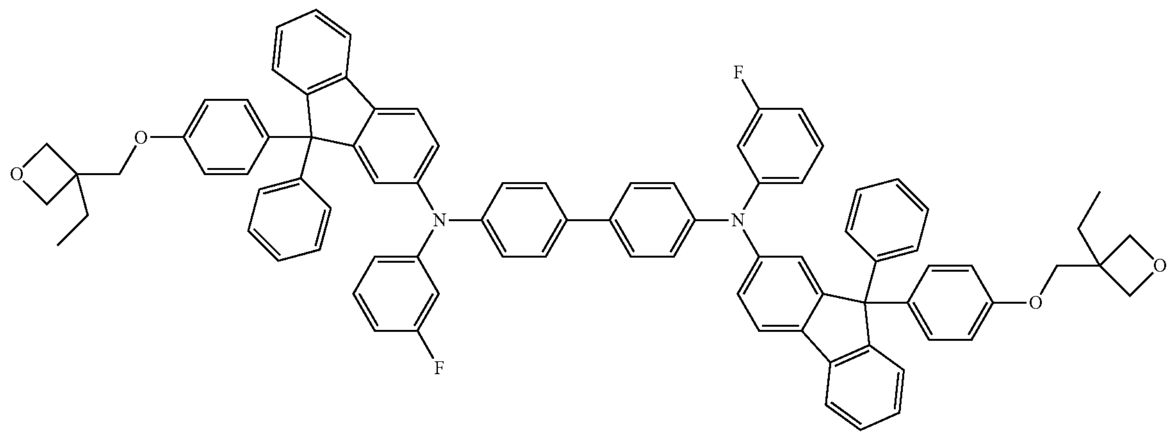
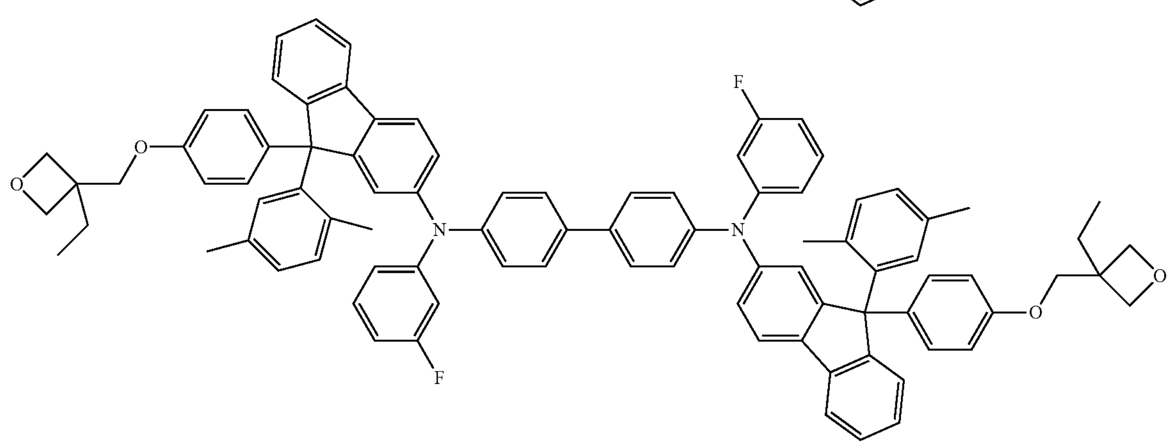
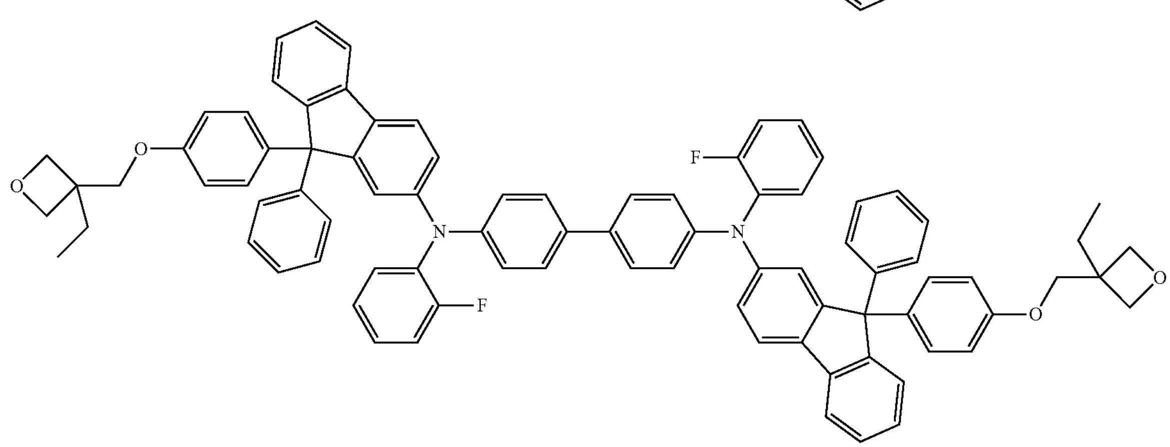

-continued
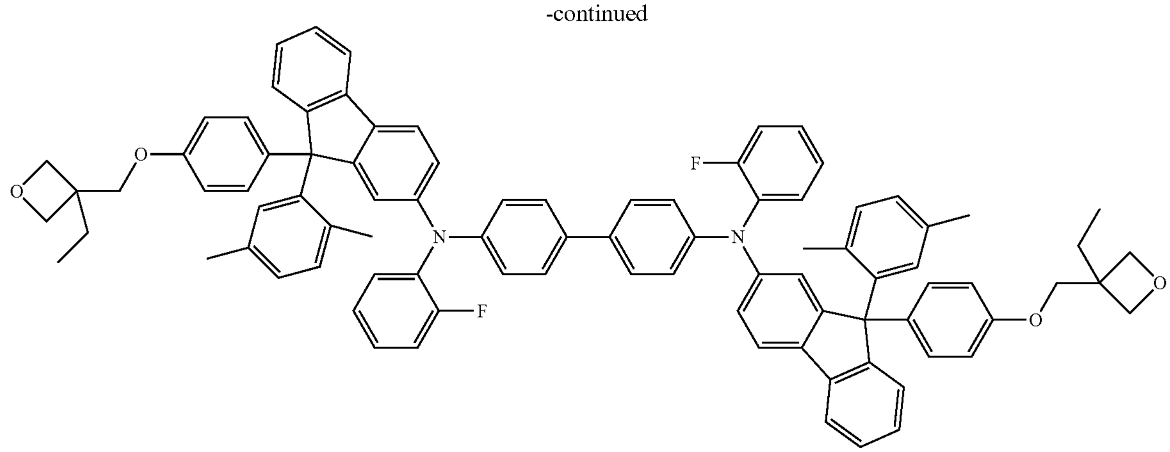
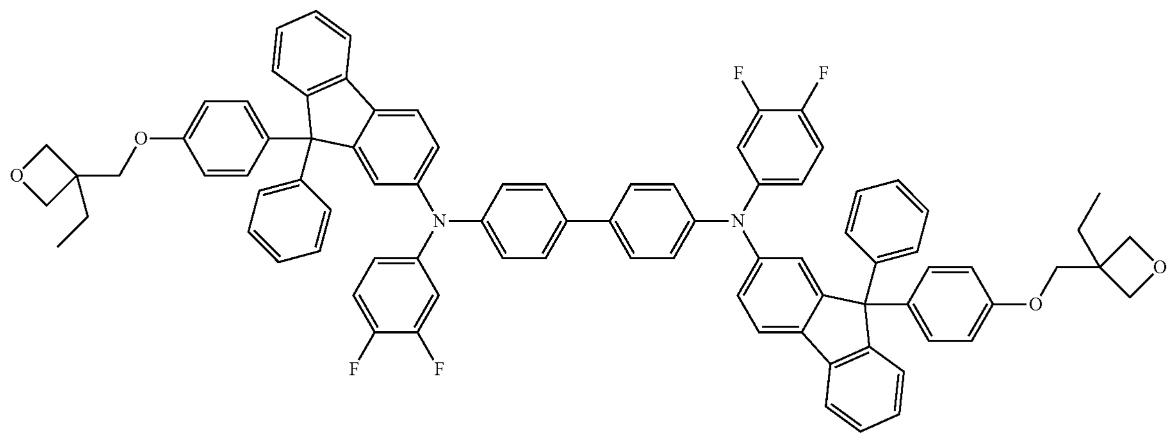
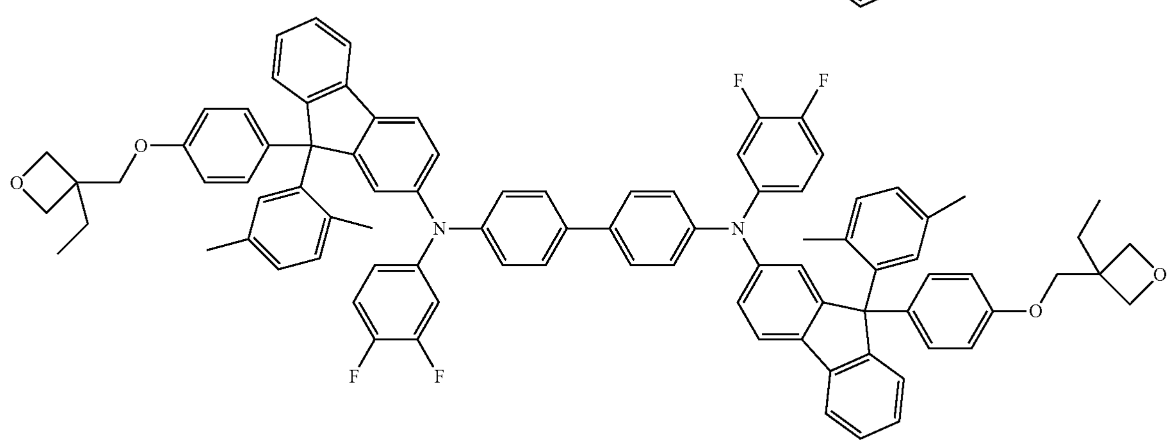
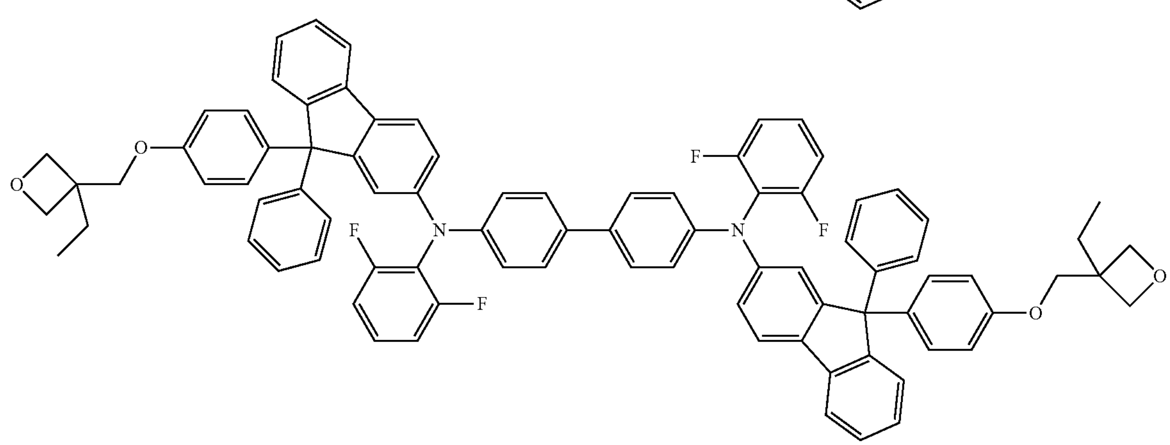

-continued
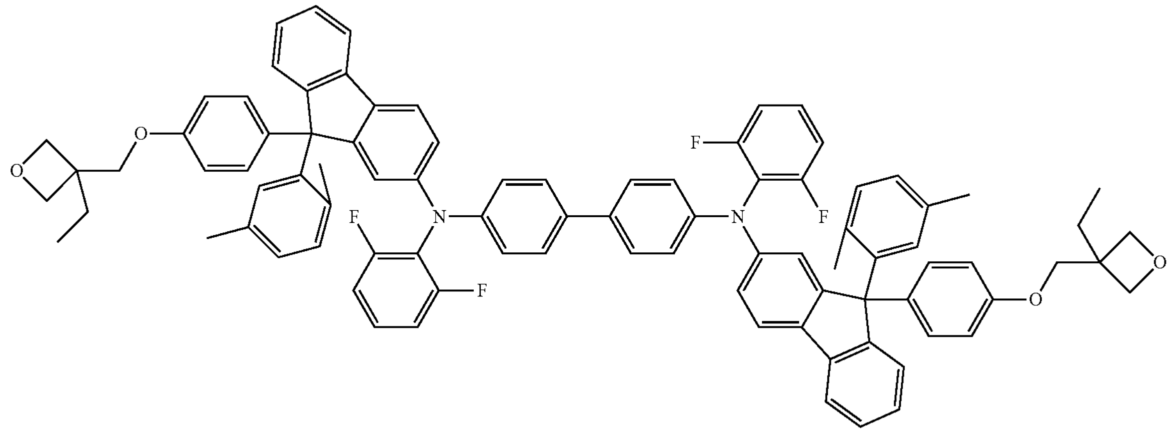
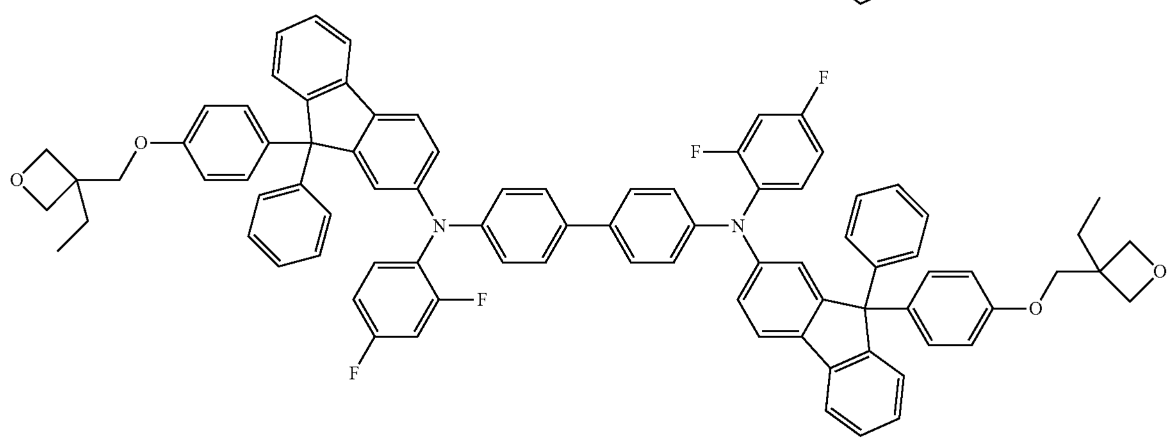
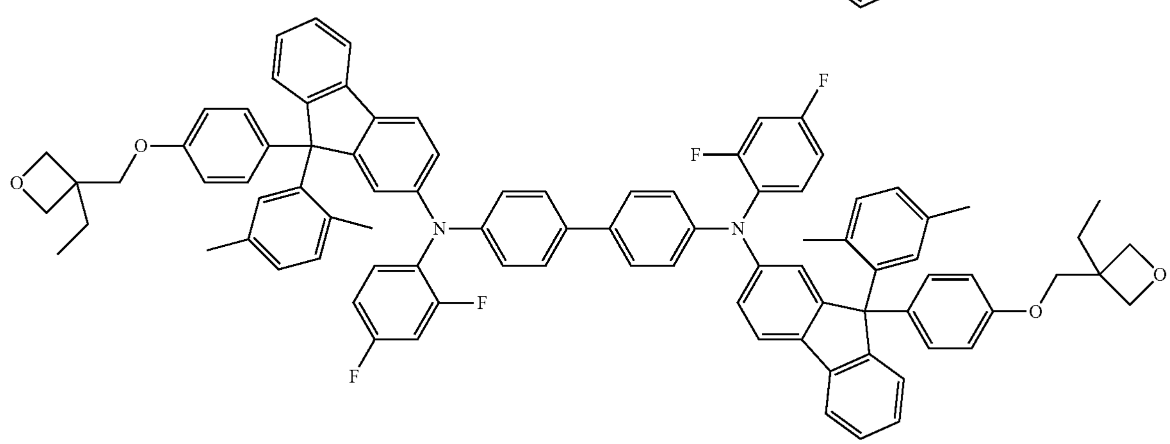
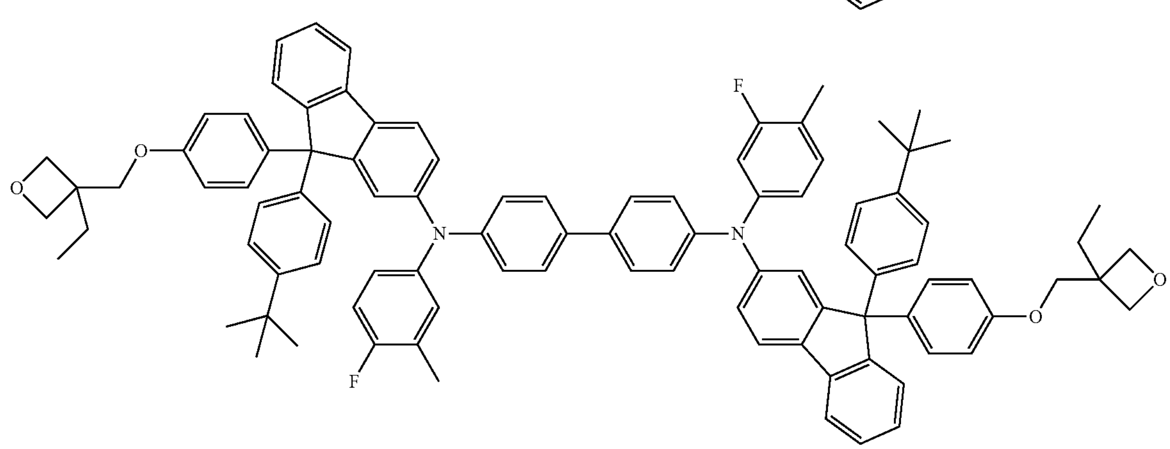

-continued
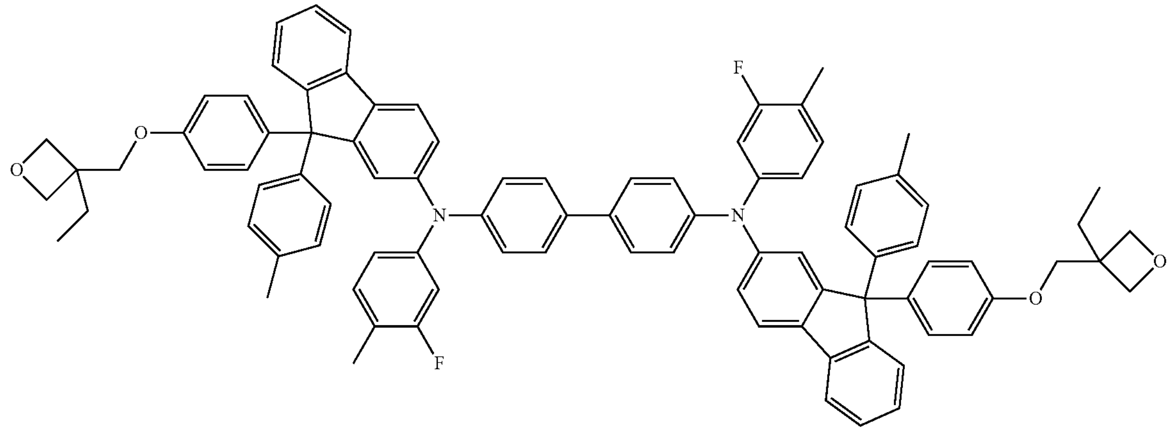
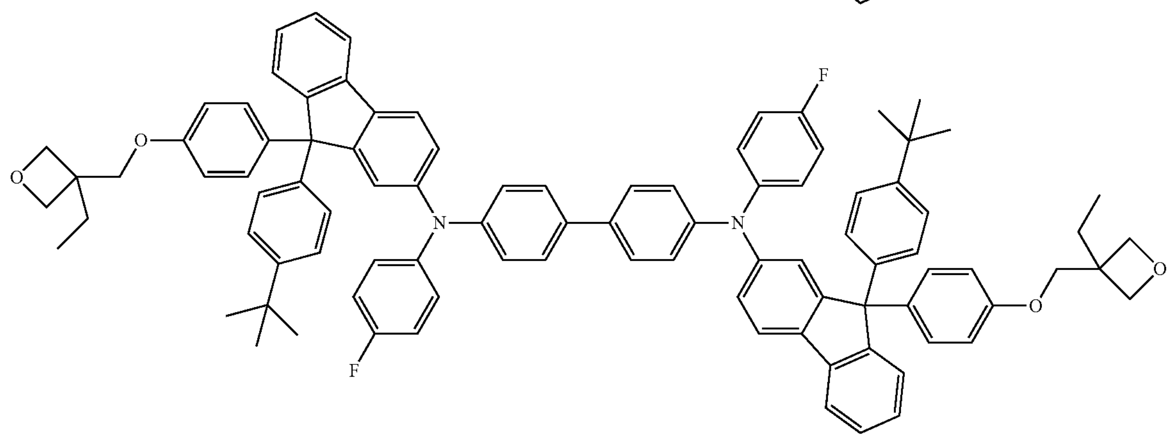
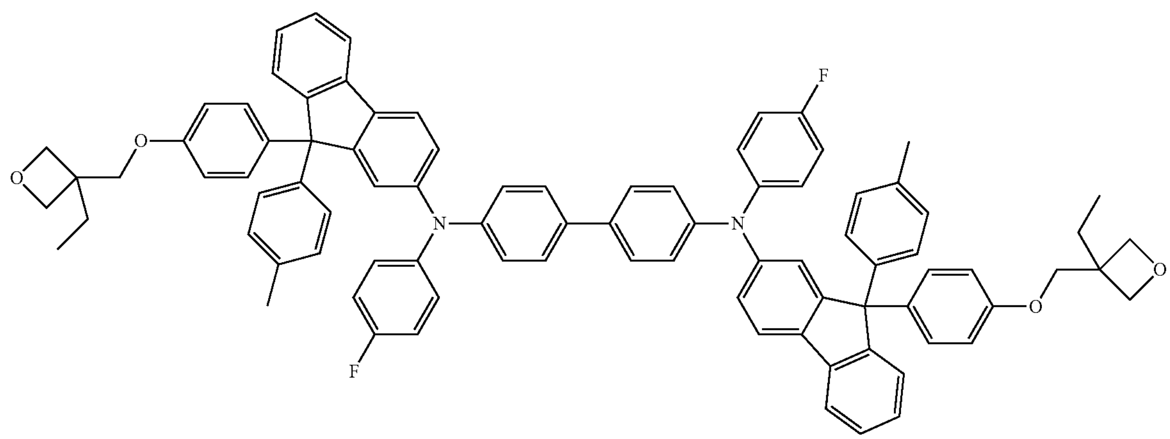
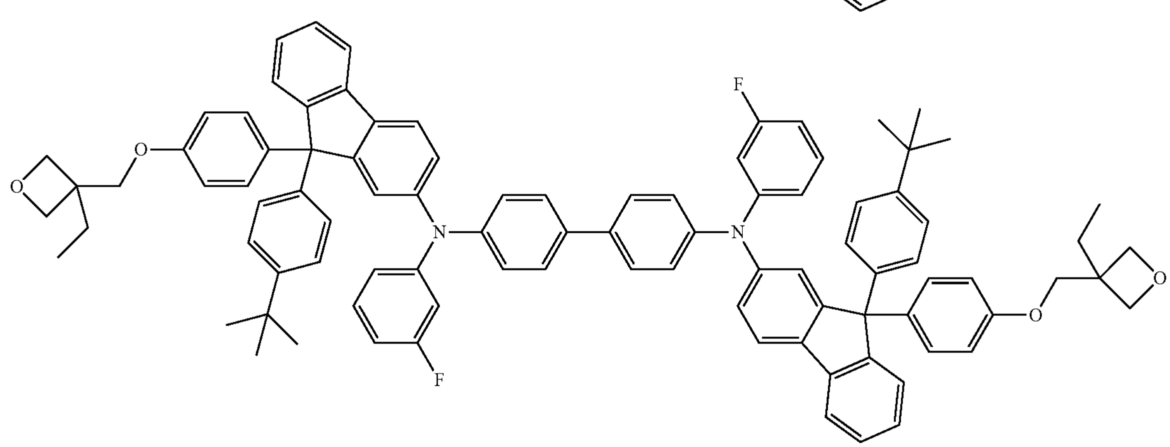

-continued
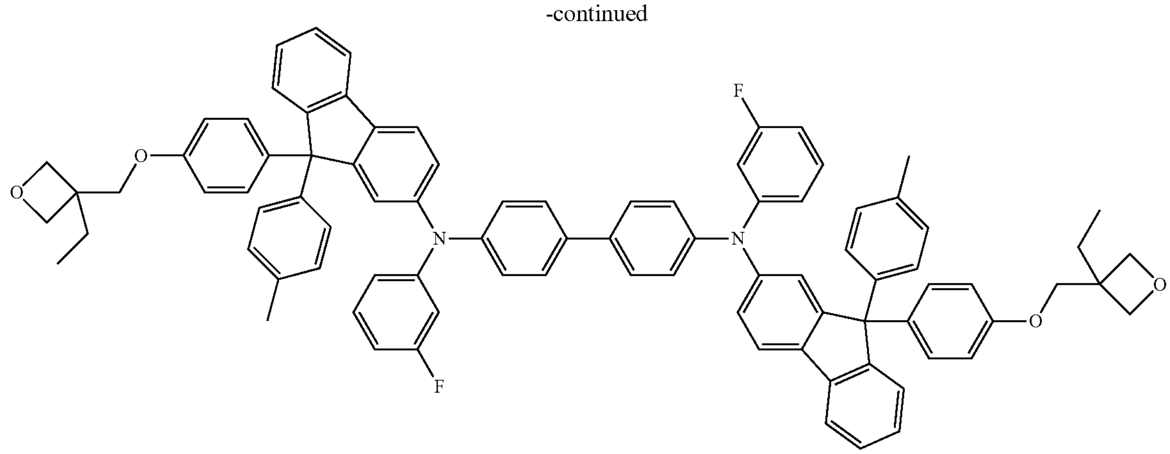
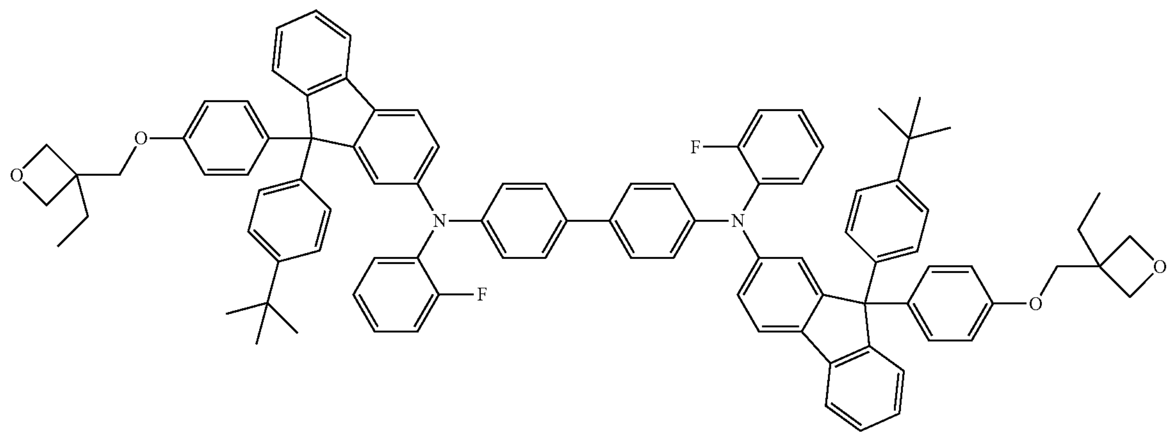
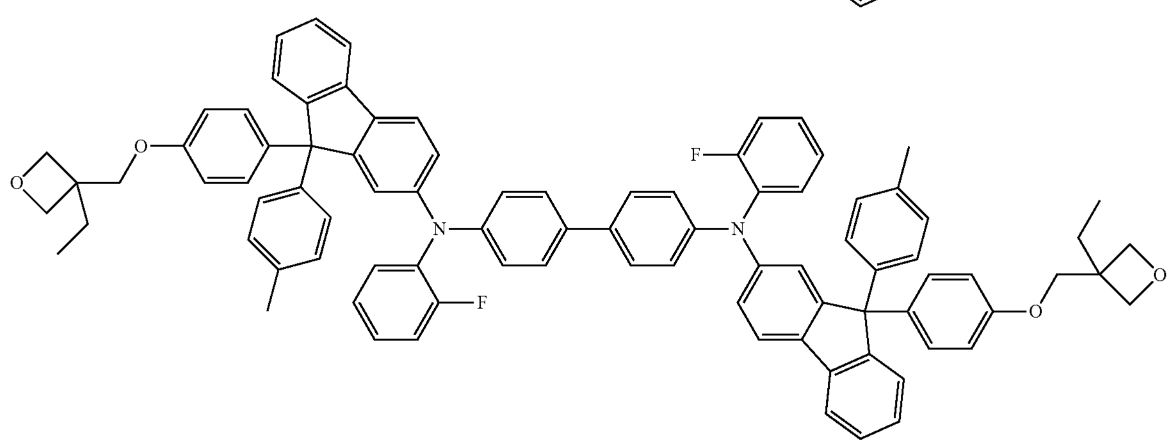
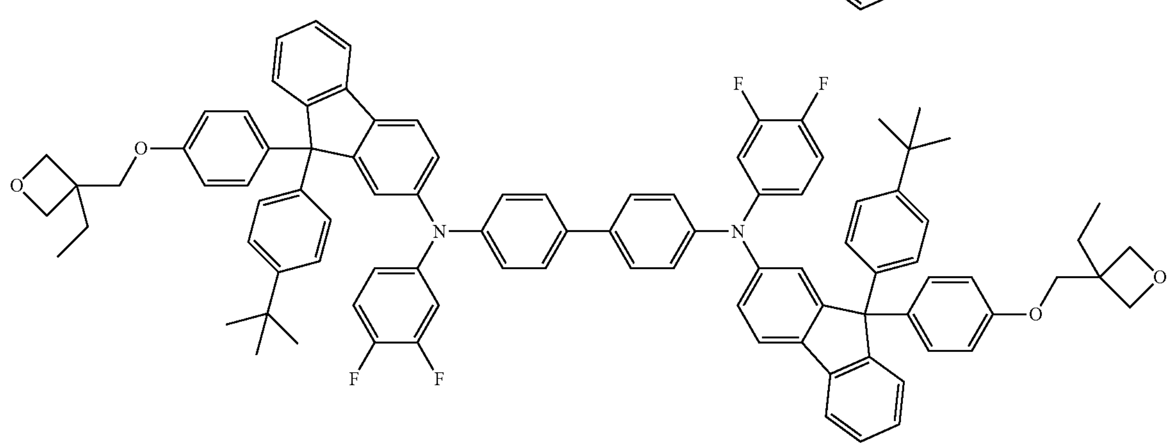

-continued
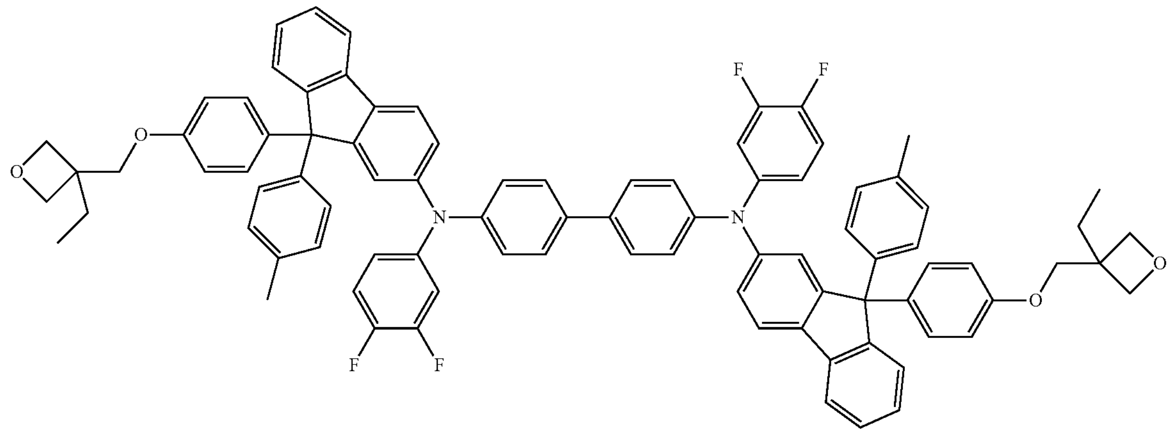
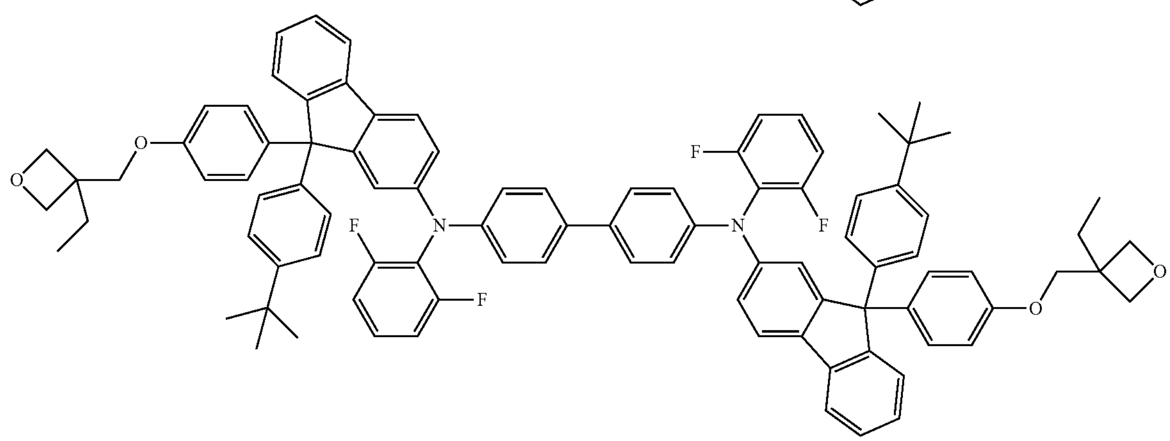
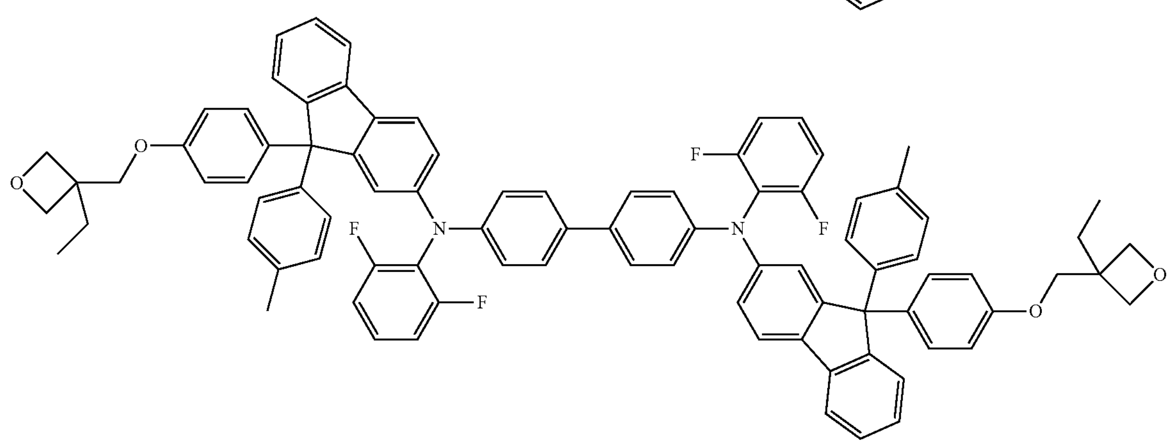
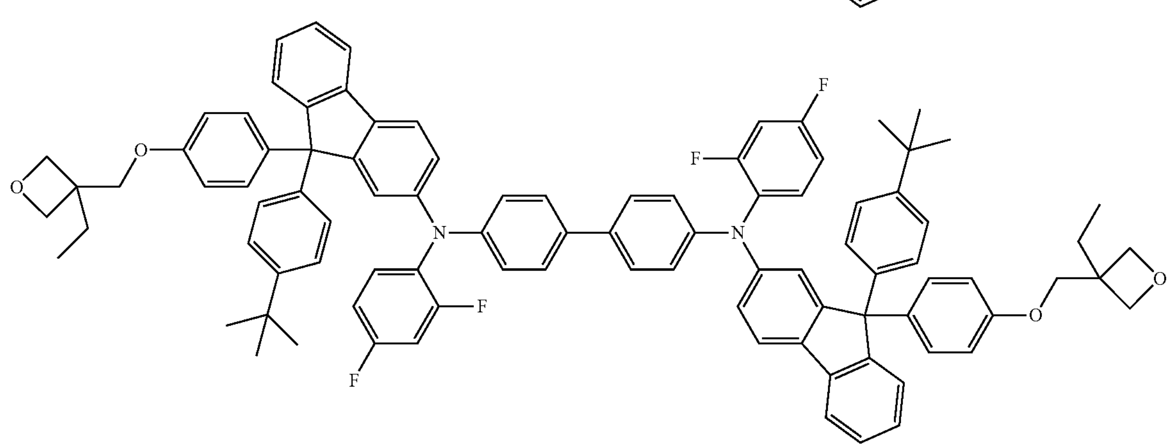

-continued
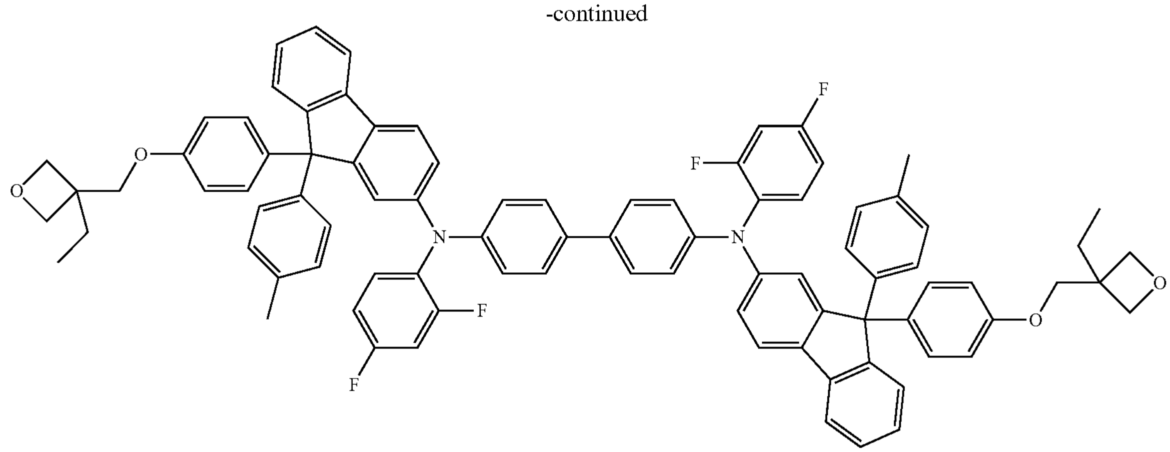
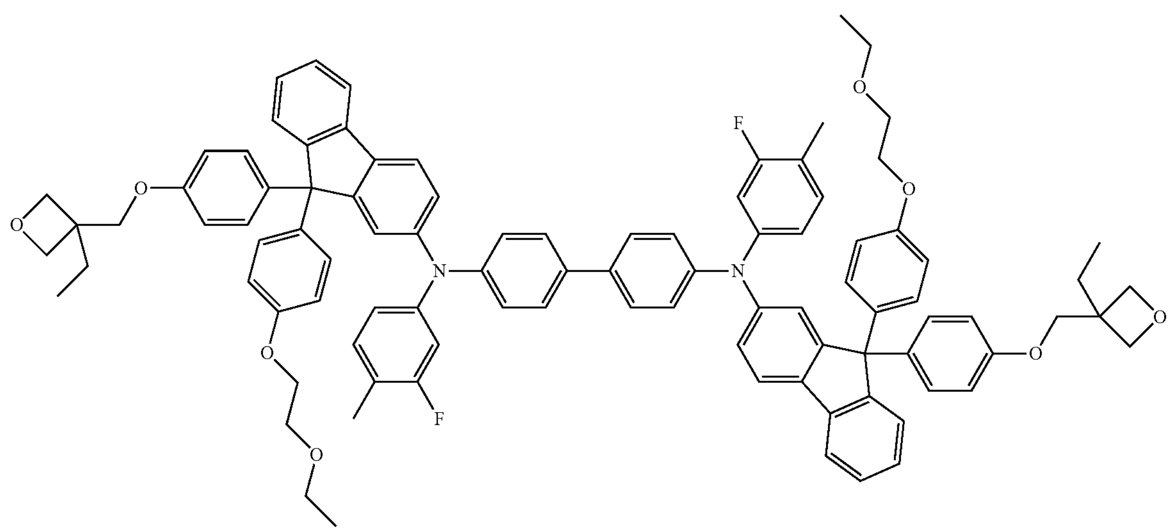
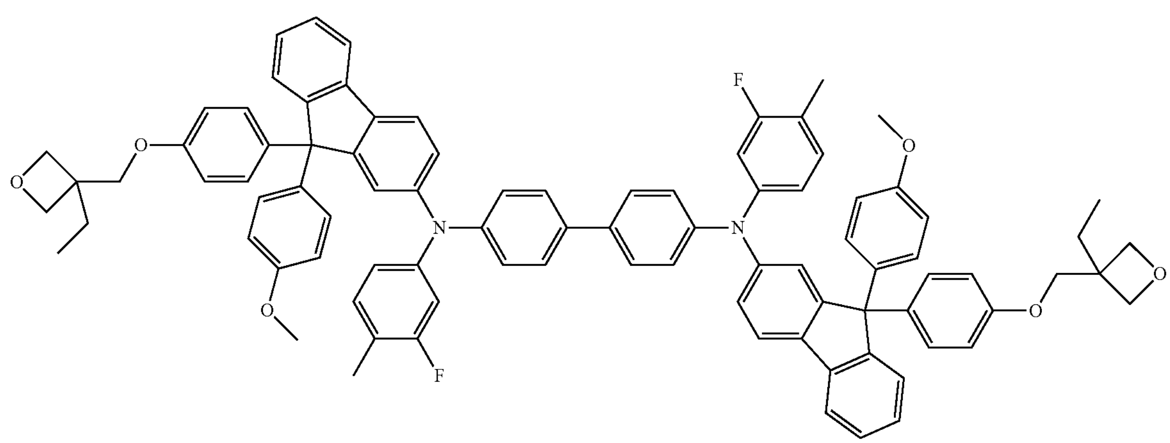

-continued
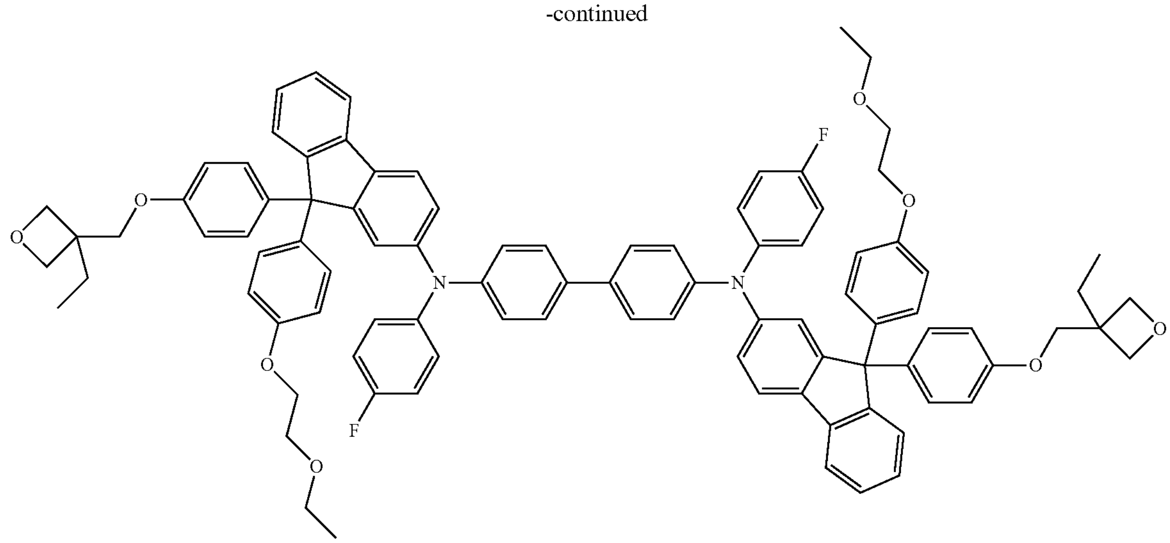
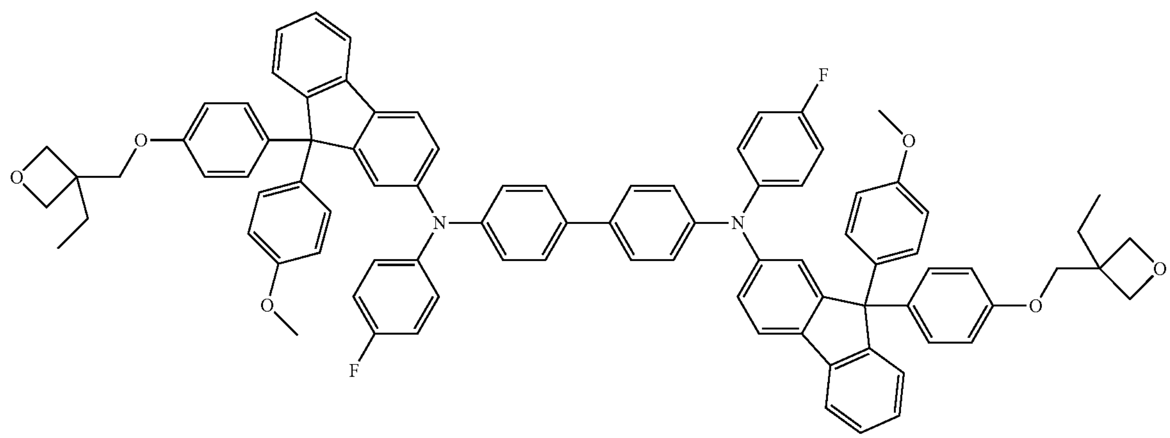
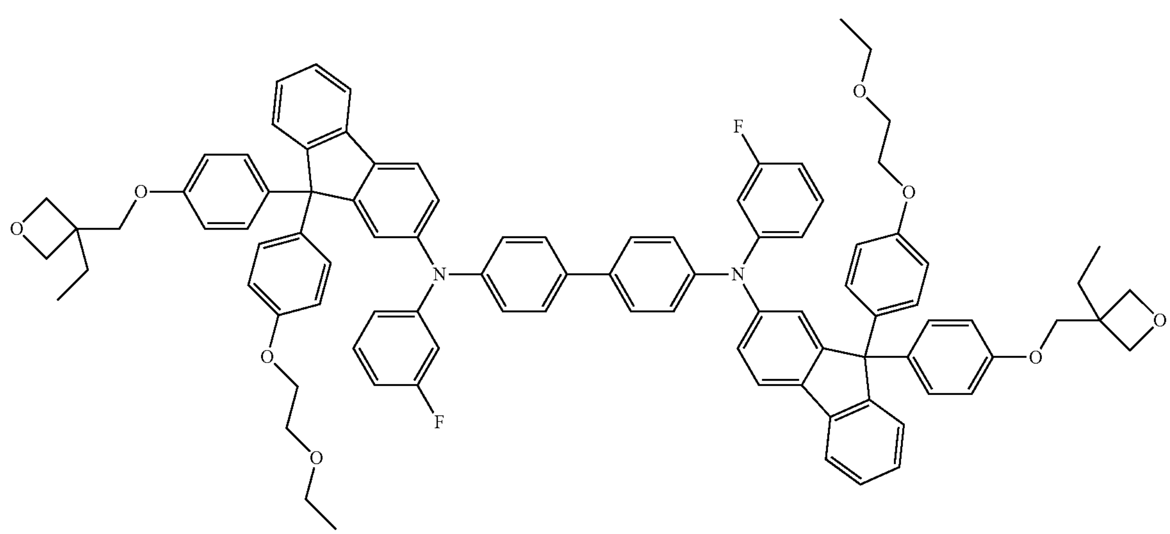

-continued
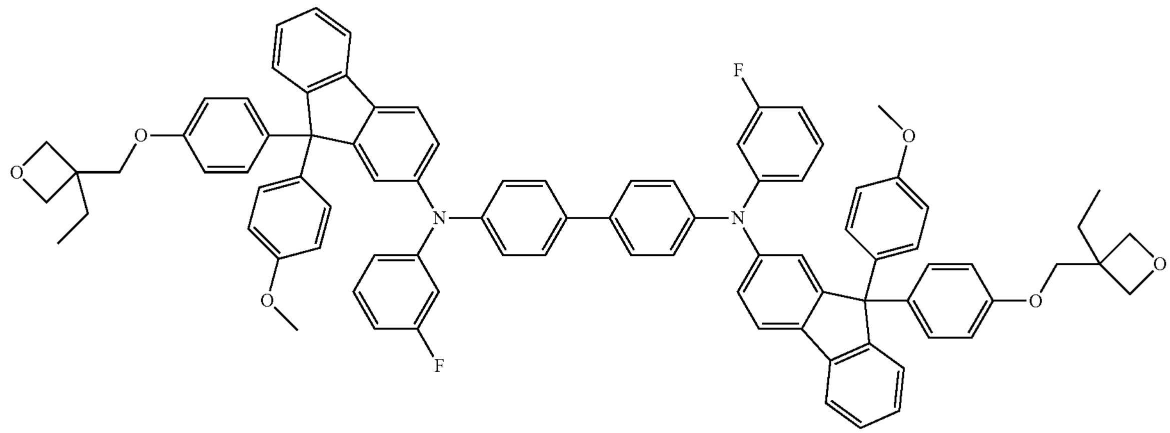
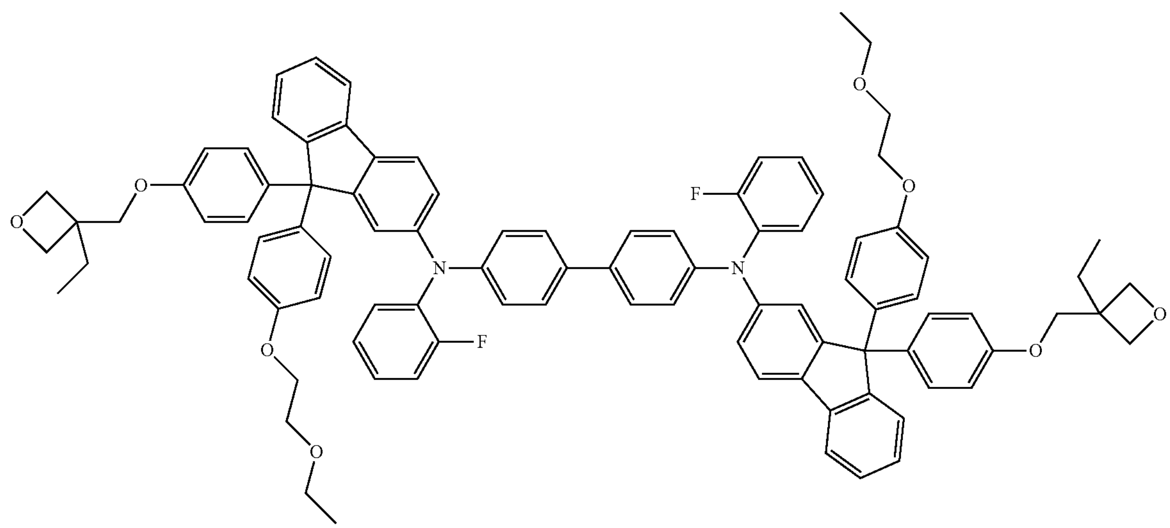
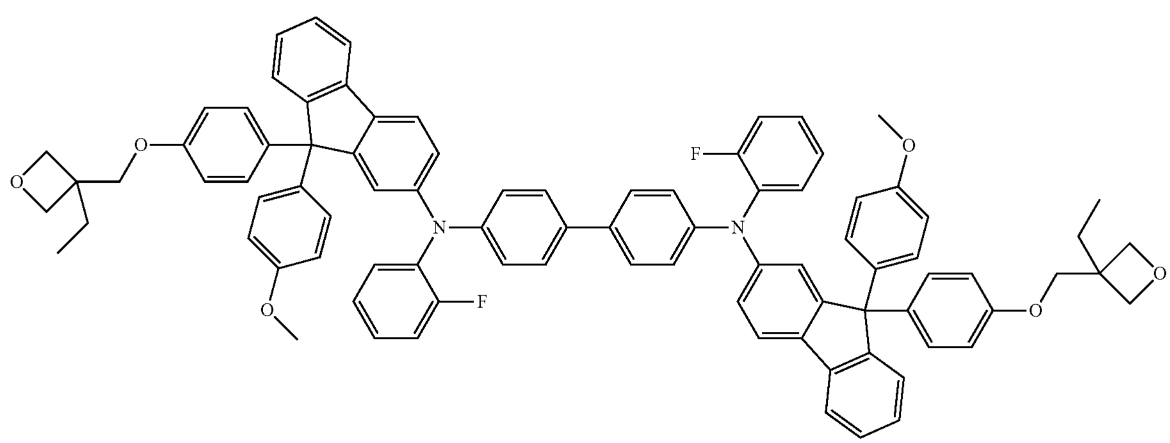

-continued
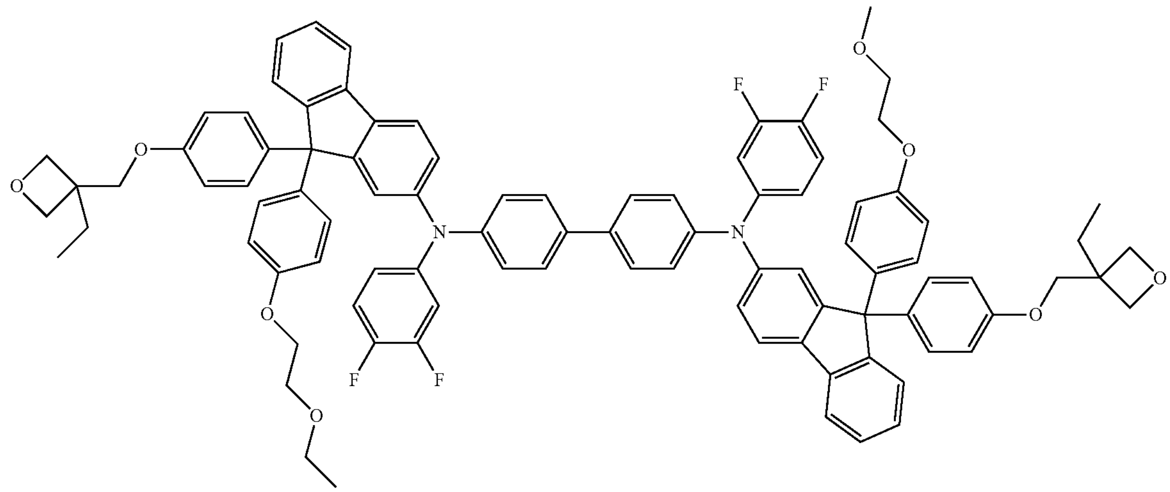
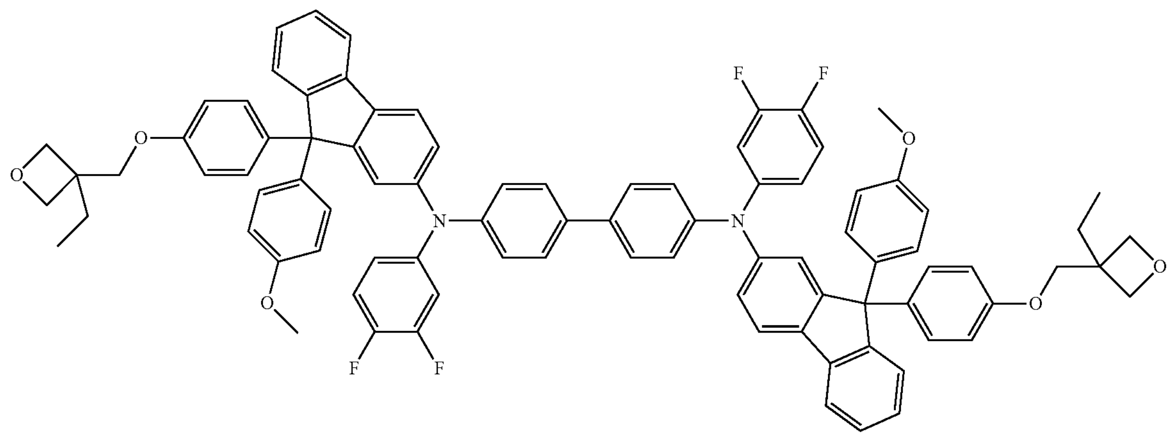
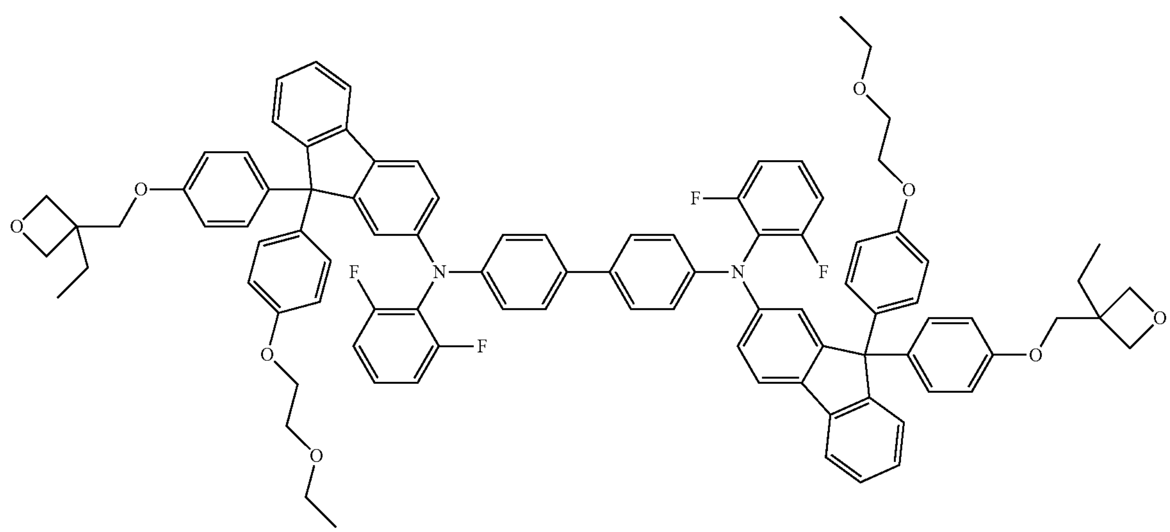

-continued
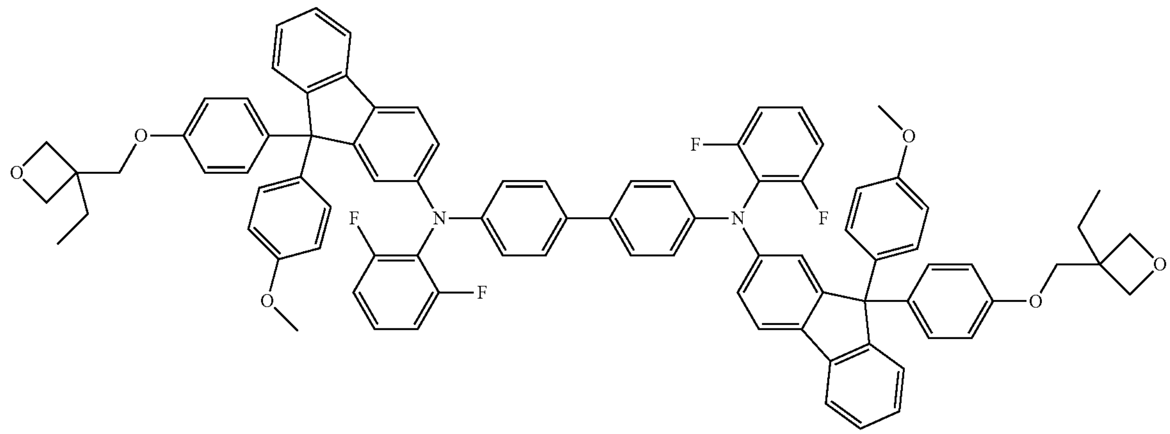
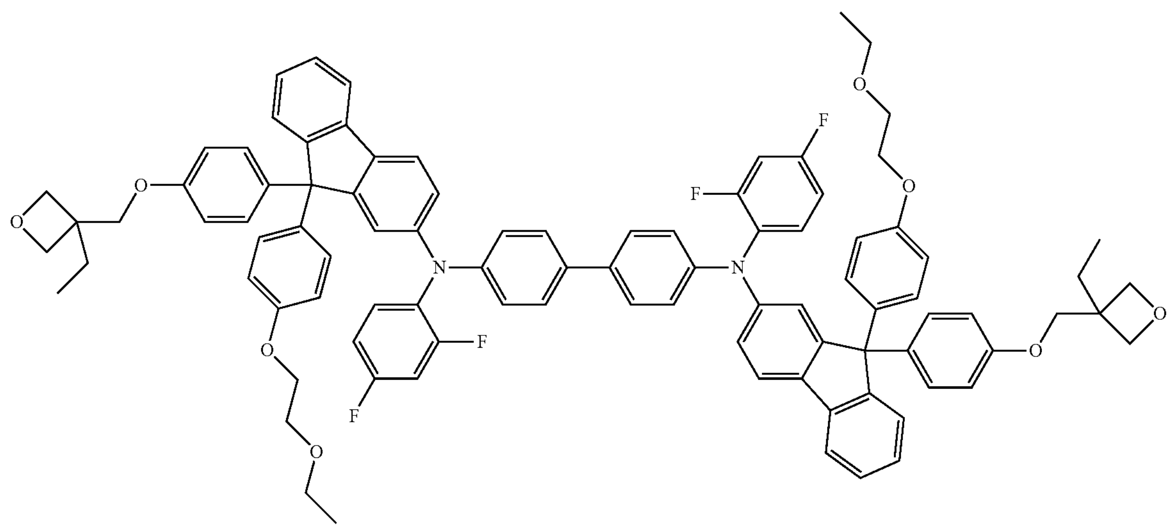
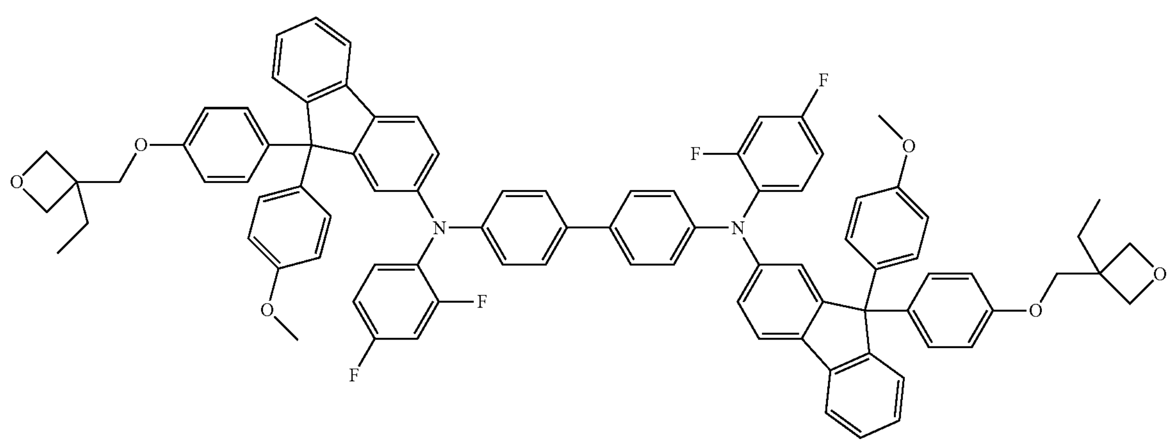

-continued
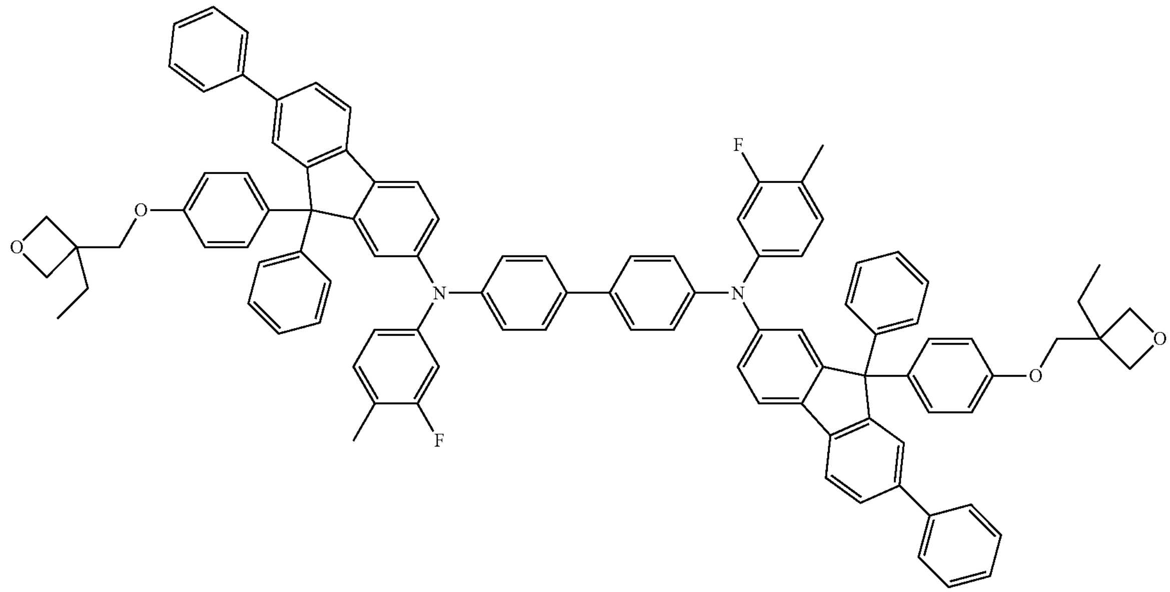
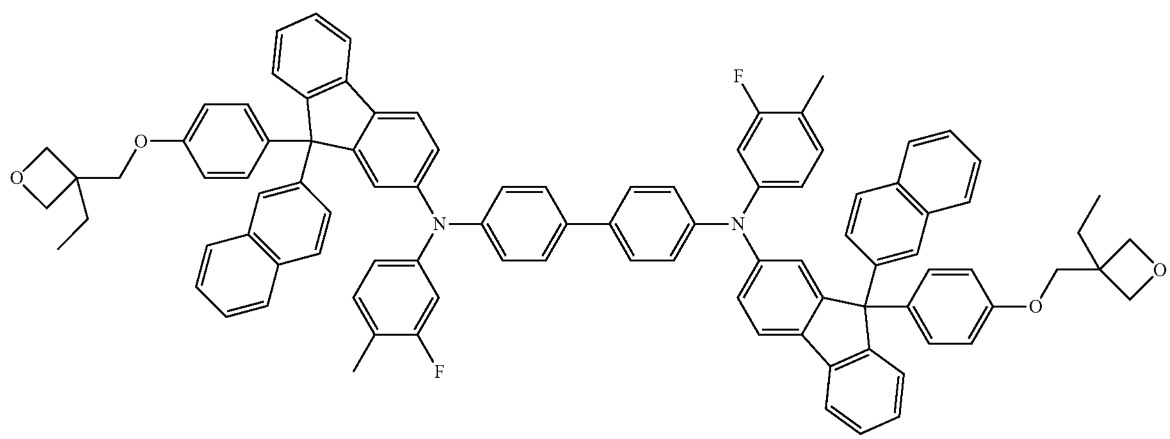
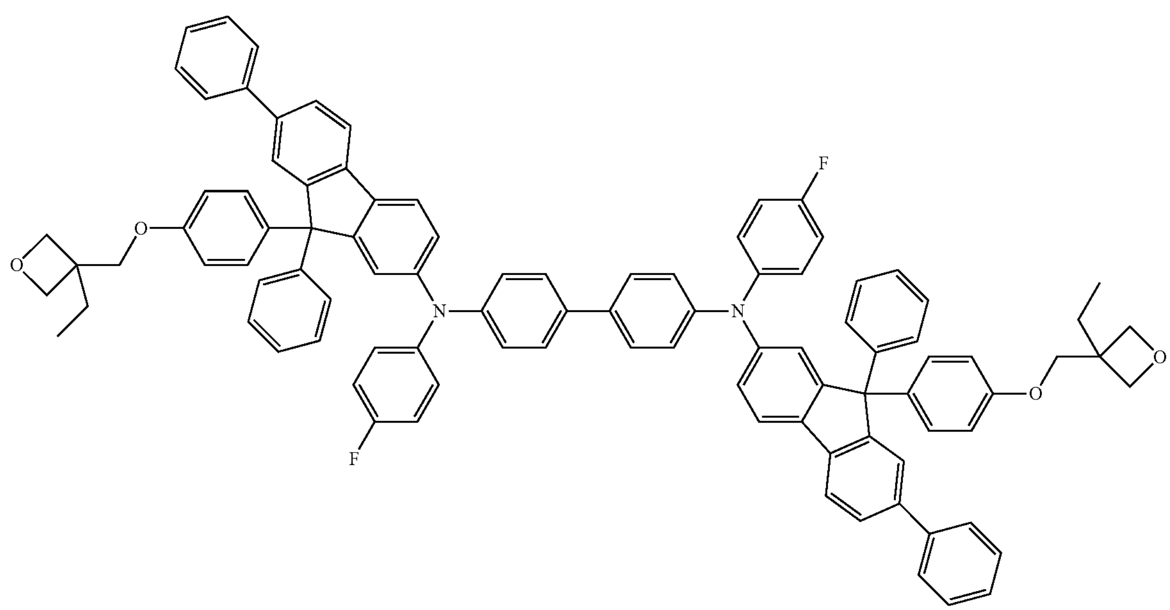

-continued
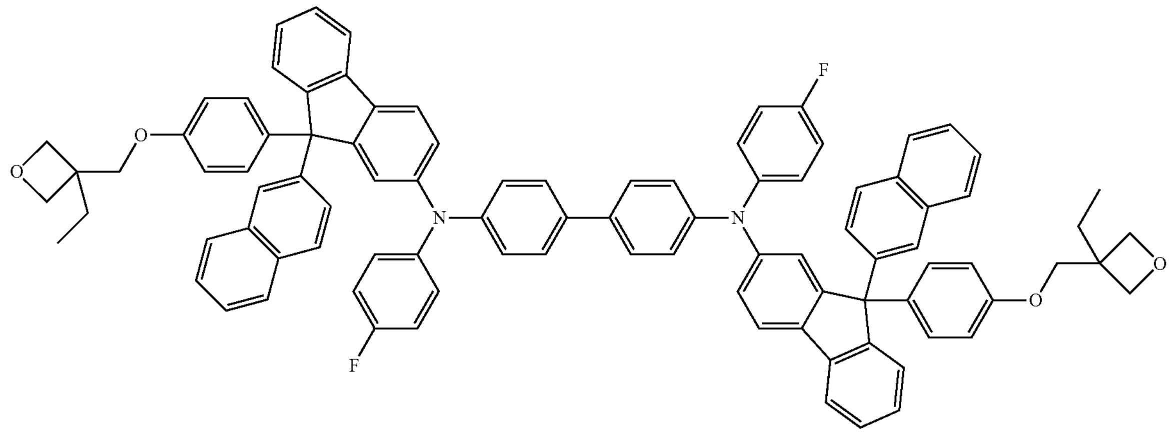
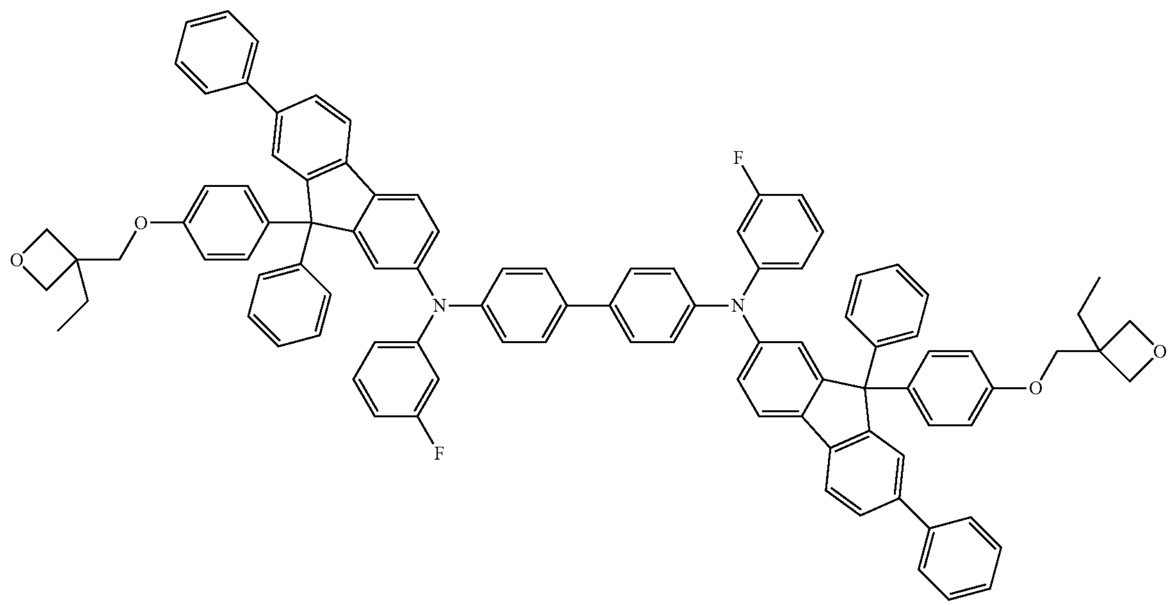
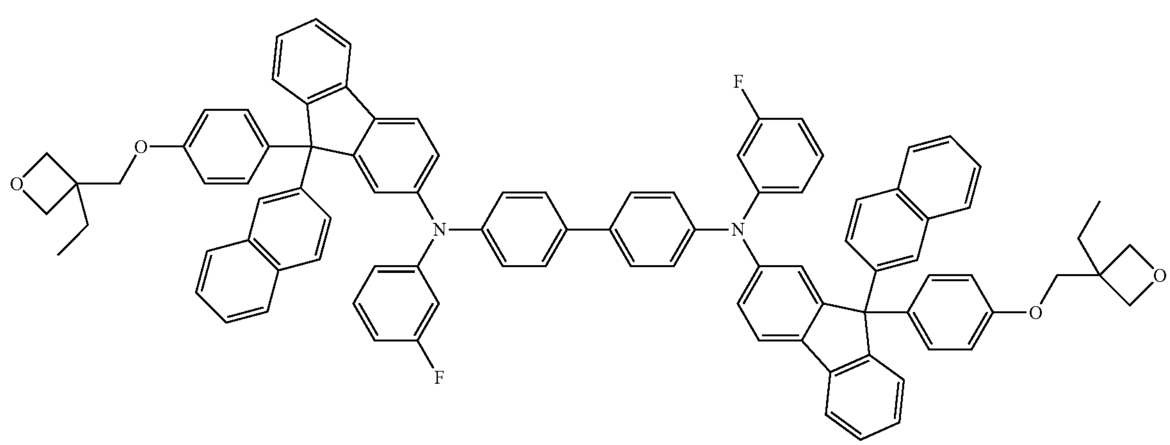

-continued
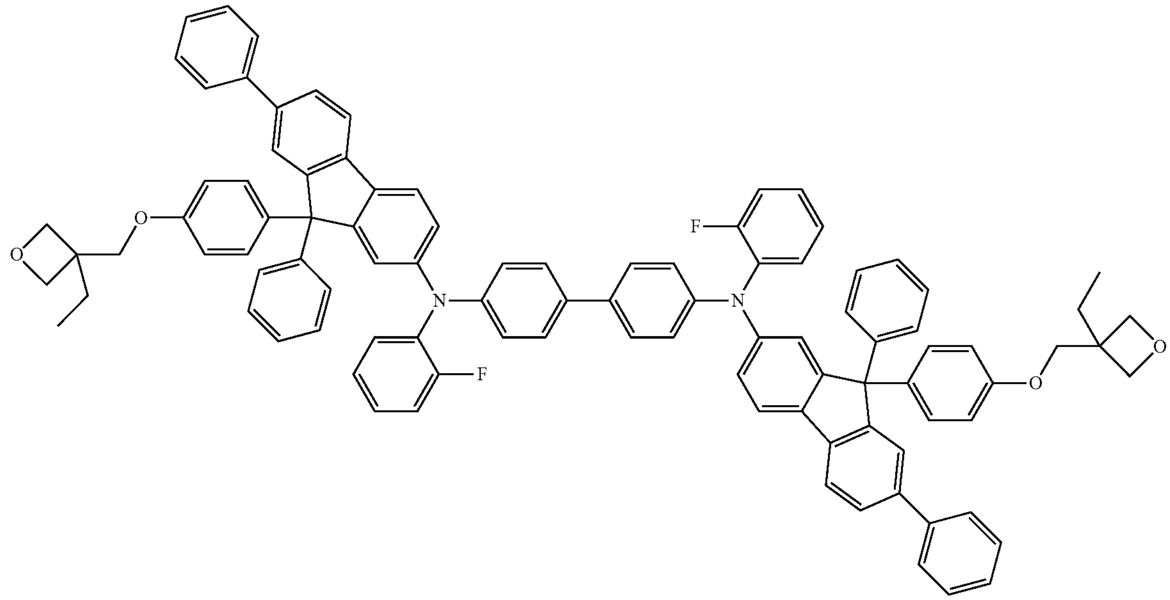
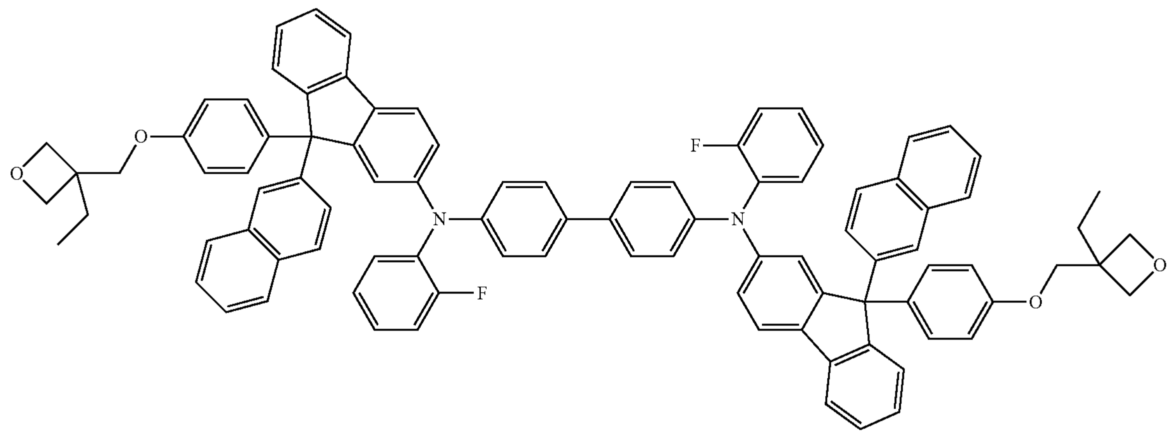
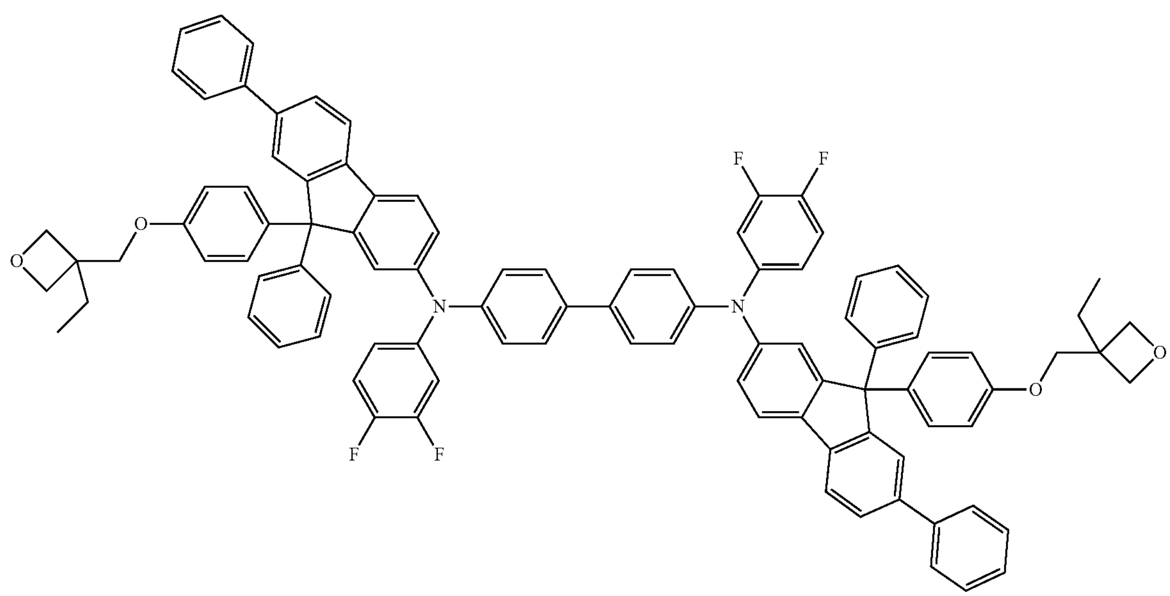

-continued
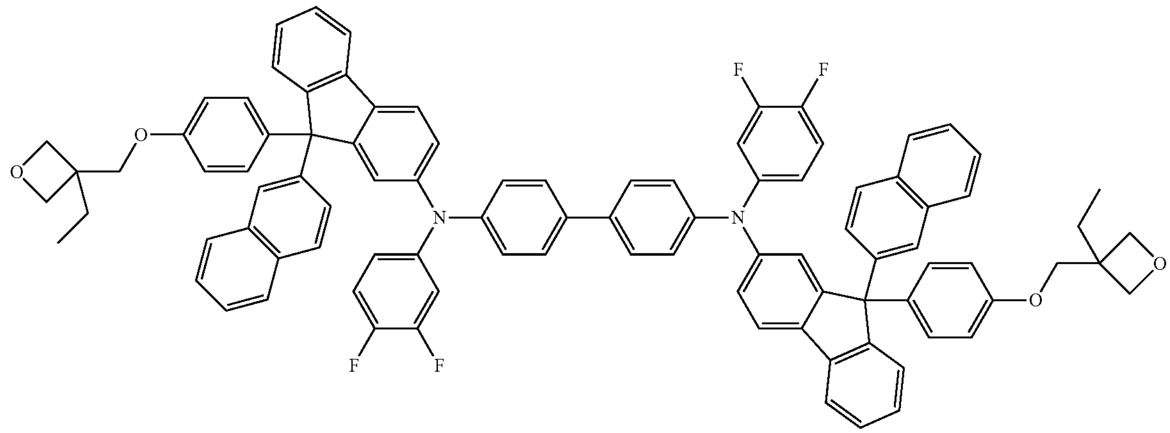
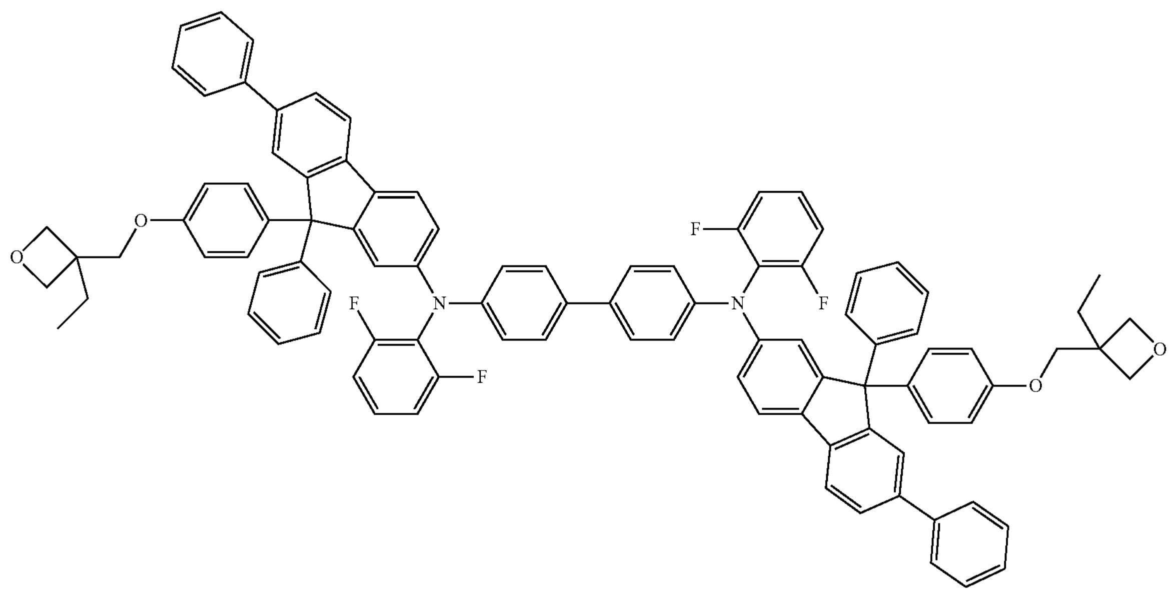
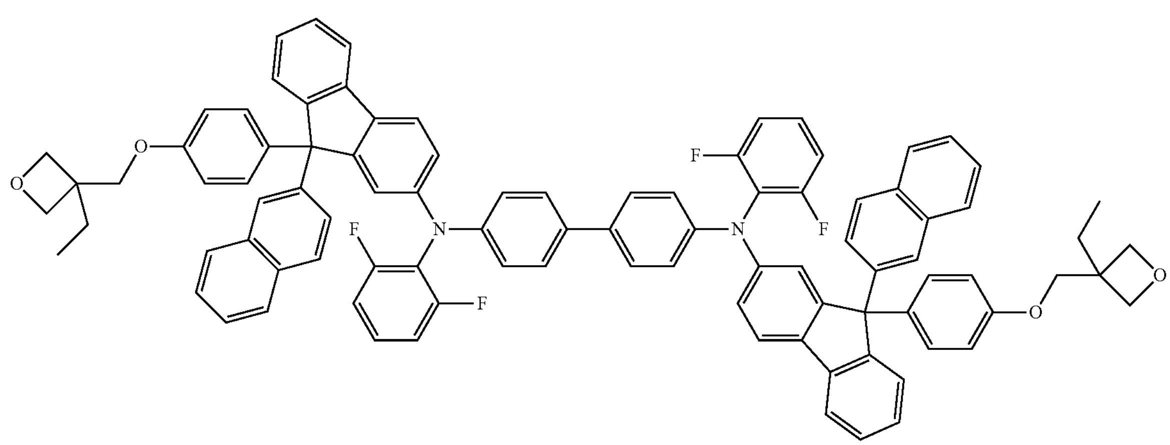

-continued
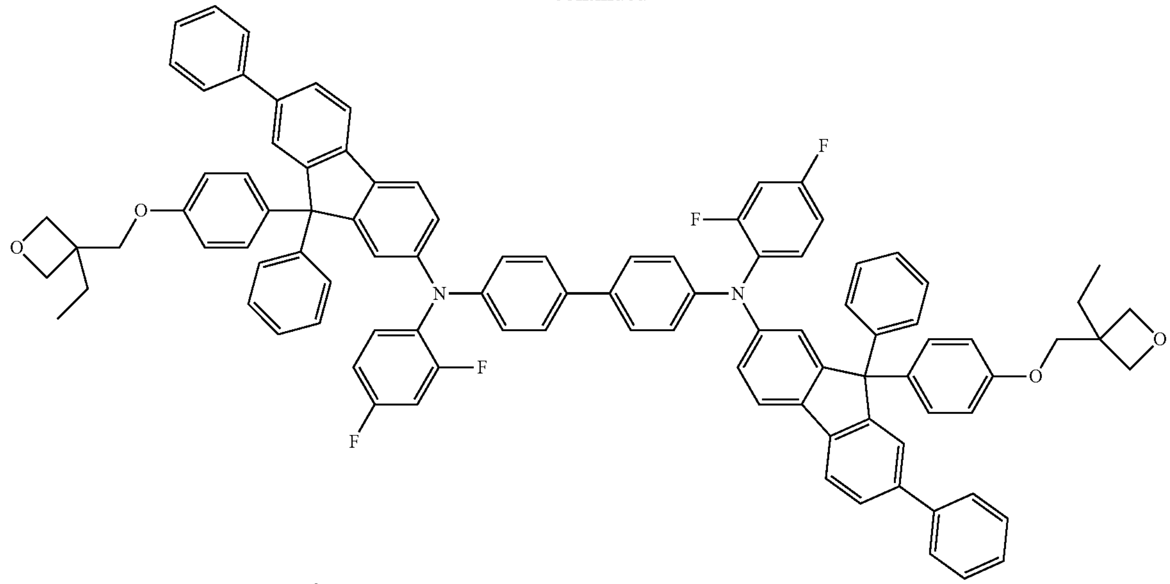
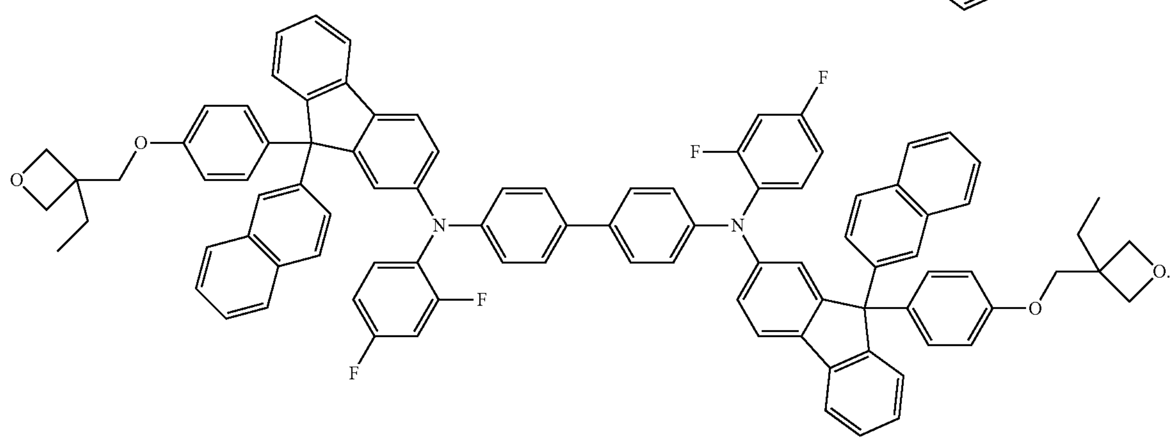
6. The organic light emitting device of claim 1, wherein the curable group is any one selected from the following structures:
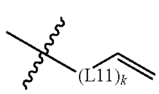
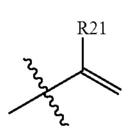
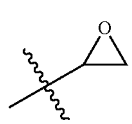
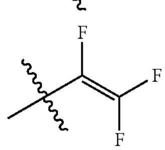
-continued
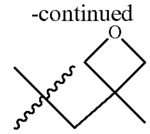
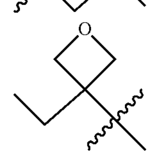
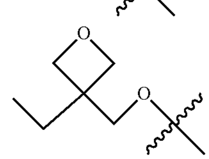
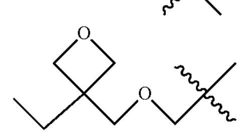
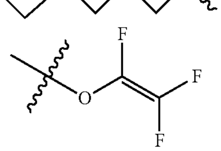

-continued
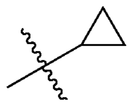
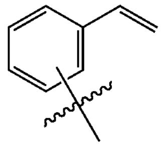
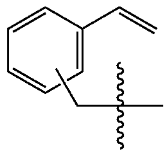
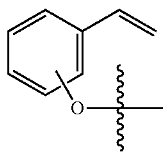
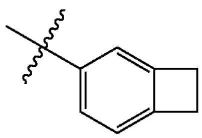
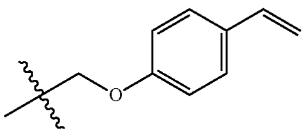
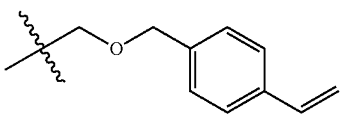
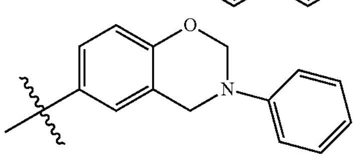
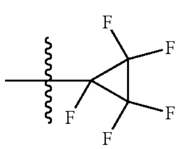
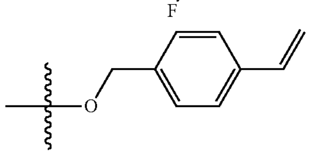
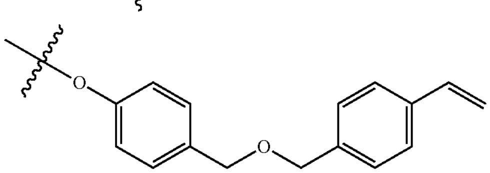
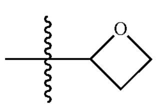
-continued
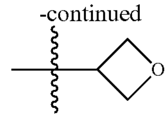
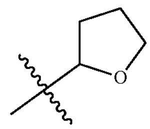
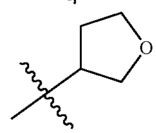
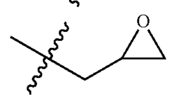
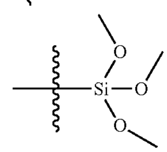
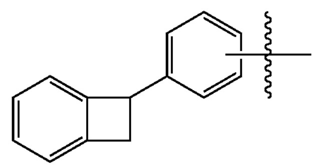
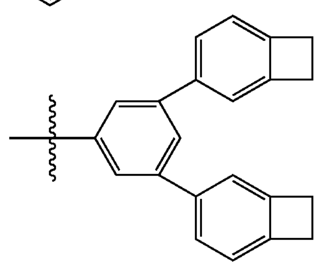
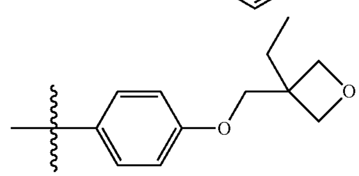
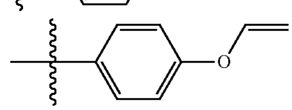
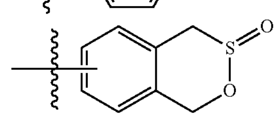
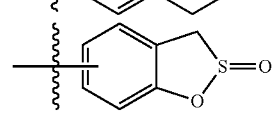
wherein,
L11 is a direct bond; —O—; —S—; a substituted or unsubstituted alkylene group; a substituted or unsubstituted arylene group; or a substituted or unsubstituted heteroarylene group,
k is 1 or 2,
when k is 2, each L11 is the same as or different from each other, and
R21 is a substituted or unsubstituted alkyl group.

7. The organic light emitting device of claim 1, wherein the monomer unit A is represented by any one of the following Chemical Formulae A-1 to A-5:

[Chemical Formula A-1]

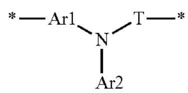

[Chemical Formula A-2]

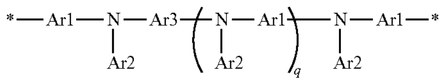

[Chemical Formula A-3]

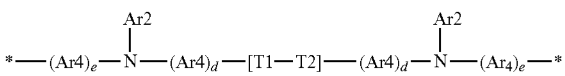

[Chemical Formula A-4]

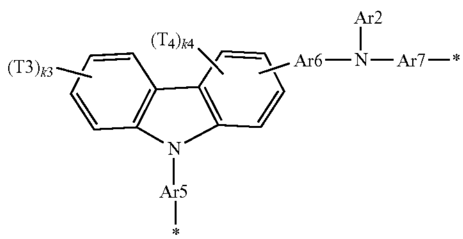

[Chemical Formula A-5]

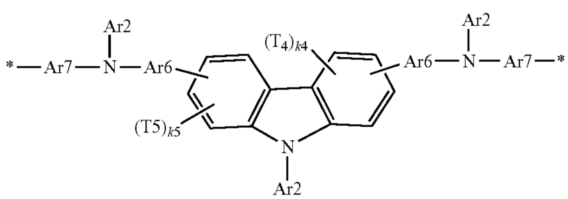

in Chemical Formulae A-1 to A-5,

Ar1 is each independently a substituted or unsubstituted aryl group or a deuterated aryl group, Ar2 is each independently a substituted or unsubstituted aryl group or a deuterated aryl group, Ar3 is each independently a substituted or unsubstituted aryl group or a deuterated aryl group, Ar4 is each independently selected from the group consisting of a substituted or unsubstituted phenylene group; a substituted or unsubstituted naphthylene group; and deuterated analogs thereof, Ar5, Ar6, and Ar7 are the same as or different from each other, and are each independently a substituted or unsubstituted aryl group or a deuterated aryl group, T1 and T2 are the same as or different from each other, and are each independently a conjugated moiety linked in a non-planar configuration, or a deuterated analog thereof, T is selected from the group consisting of a direct bond; a substituted or unsubstituted aryl group; and a deuterated aryl group, and T3 to T5 are the same as or different from each other, and are each independently selected from the group consisting of hydrogen; deuterium; F; a cyano group; an alkyl group; a fluoroalkyl group; an aryl group; a heteroaryl group; an amino group; a silyl group; a germanium group; an alkoxy group; an aryloxy group; a fluoroalkoxy group; a siloxane group; a siloxy group; a deuterated alkyl group; a deuterated moiety-fluorinated alkyl group; a deuterated aryl group; a deuterated heteroaryl group; a deuterated amino group; a deuterated silyl group; a deuterated germanium group; a deuterated alkoxy group; a deuterated aryloxy group; a deuterated fluoroalkoxy group; a deuterated siloxane group; a deuterated siloxy group; and a curable group, where adjacent groups selected from T3, T4, and T5 are optionally bonded to each other to form a ring, d is each an integer from 1 to 6, e is each an integer from 1 to 6, k3 is an integer from 0 to 4, k4 and k5 are the same as or different from each other, and are each an integer from 0 to 3, and q is an integer of 0 or higher, when q, e, d, and k3 to k5 are each 2 or higher, each NAr1Ar2, Ar4, and T3 to T5 is the same as or different from each other, respectively, and

* indicates a binding point in the copolymer.

8. The organic light emitting device of claim 1, wherein the monomer unit B' is represented by any one of the following Chemical Formulae B'-1 to B'-9:

[Chemical Formula B'-1]

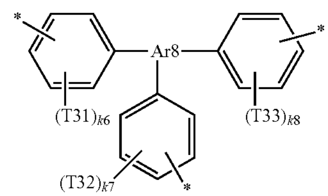

[Chemical Formula B'-2]

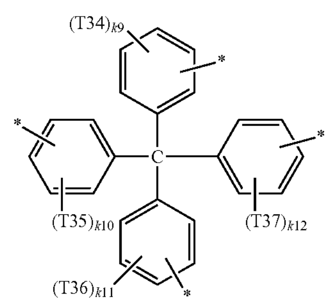

[Chemical Formula B'-3]

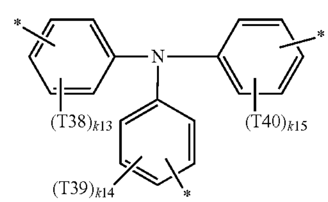

[Chemical Formula B'-4]

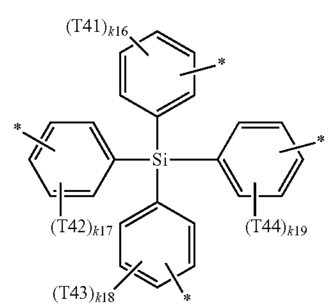

-continued

[Chemical Formula B′-5]

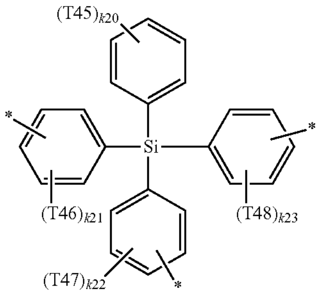

[Chemical Formula B′-6]

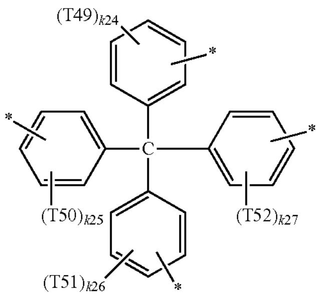

[Chemical Formula B′-7]

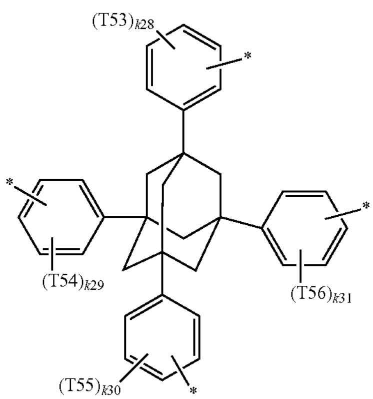

[Chemical Formula B′-8]

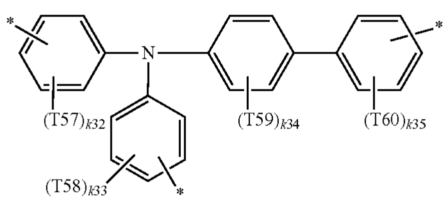

[Chemical Formula B′-9]

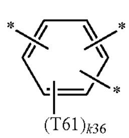

in Chemical Formulae B'-1 to B'-9,

Ar8 is an aromatic cyclic group or deuterated aromatic cyclic group having at least three binding points, T31 to T61 are the same as or different from each other, and are each independently selected from the group consisting of deuterium; F; a cyano group; an alkyl group; a fluoroalkyl group; an aryl group; a heteroaryl group; an amino group; a silyl group; a germanium group; an alkoxy group; an aryloxy group; a fluoroalkoxy group; a siloxane group; a siloxy group; a deuterated alkyl group; a deuterated moiety-fluorinated alkyl group; a deuterated aryl group; a deuterated heterary1 group; a deuterated amino group; a deuterated silyl group; a deuterated germanium group; a deuterated alkoxy group; a deuterated aryloxy group; a deuterated fluoroalkoxy group; a deuterated siloxane group; a deuterated siloxy group; and a curable group, where adjacent groups selected from T31 to T61 are optionally bonded to each other to form a 5-membered or 6-membered aromatic ring, k6 to k19, k21 to k25, and k27 to k35 are the same as or different from each other, and are each independently an integer from 0 to 4, k20 and k26 are the same as or different from each other, and are each independently an integer from 0 to 5, and k36 is an integer from 0 to 3, when K6 to K36 are each 2 or higher, each T31 to T61 is the same as or different from each other, respectively, and

* indicates a binding point in the copolymer.

9. The organic light emitting device of claim 1, wherein the copolymer of Chemical Formula 2 is represented by the following Chemical Formula 2':

[Chemical Formula 2′]

$$\left[ *\!-\!(A)_{a1}\!-\!* \quad (*)_{z1}\!-\!(B')_{b1} \quad *\!-\!(C')_{c1}\!-\!* \quad *\!-\!(E)_{e1} \right]$$

in Chemical Formula 2',

A is a monomer unit comprising at least one triarylamine group,

B' is a monomer unit having at least three binding points in a copolymer,

C' is an aromatic monomer unit or a deuterated analog thereof,

E is selected from the group consisting of hydrogen; deuterium; a halogen group; a substituted or unsubstituted alkyl group; a substituted or unsubstituted aryl group; a substituted or unsubstituted arylamino group; a substituted or unsubstituted siloxane group; and a substituted or unsubstituted curable group, a1, b1, c1, and e1 are a mole fraction, a1+b1+c1+e1=1, a1≠0, and b1≠0, z1 is an integer of 3 or higher, and

* means an attachment point in the copolymer.

10. The organic light emitting device of claim 1, wherein the copolymer of Chemical Formula 2 has a weight average molecular weight of 10,000 g/mol to 5,000,000 g/mol.

11. The organic light emitting device of claim 1, wherein the first organic material layer is a hole injection layer, and the second organic material layer is a hole transport layer.

12. The organic light emitting device of claim 1, wherein the first organic material layer is provided to be brought into contact with the anode, and the second organic material layer is provided to be brought into contact with the first organic material layer.

13. The organic light emitting device of claim 1, wherein,

L is a substituted or unsubstituted phenylene group; a substituted or unsubstituted biphenylylene group; or a substituted or unsubstituted spirobifluorenylene group, L1 to L4 are the same as or different from each other, and each independently a substituted or unsubstituted phenylene group; or a substituted or unsubstituted naphthyl group, L5 and L6 are the same as or different from each other, and each independently a direct bond; or a phenylene group, and Az1 and Az2 are the same as or different from each other, and each independently a phenyl group which is unsubstituted or substituted with an alkyl group having 1 to 20 carbon atoms; a biphenyl group which is unsubstituted or substituted with an alkyl group having 1 to 20 carbon atoms; or a terphenyl group which is unsubstituted or substituted with an alkyl group having 1 to 20 carbon atoms.

14. The organic light emitting device of claim 7, wherein Ar1 to Ar3 and Ar5 to Ar7 are the same as or different from each other, and each independently a phenyl group which is unsubstituted or substituted with an alkyl group having 1 to 20 carbon atoms or an arylamine group having 6 to 30 carbon atoms; a biphenyl group which is unsubstituted or substituted with an alkyl group having 1 to 20 carbon atoms or an arylamine group having 6 to 30 carbon atoms; a terphenyl group which is unsubstituted or substituted with an alkyl group having 1 to 20 carbon atoms or an arylamine group having 6 to 30 carbon atoms; or a naphthyl group which is unsubstituted or substituted with an alkyl group having 1 to 20 carbon atoms or an arylamine group having 6 to 30 carbon atoms, and T1 and T2 are the same as or different from each other, and each independently a substituted or unsubstituted aryl group having 6 to 30 carbon atoms.

15. The organic light emitting device of claim 1, wherein the monomer unit A is any one of the following structures:

A1

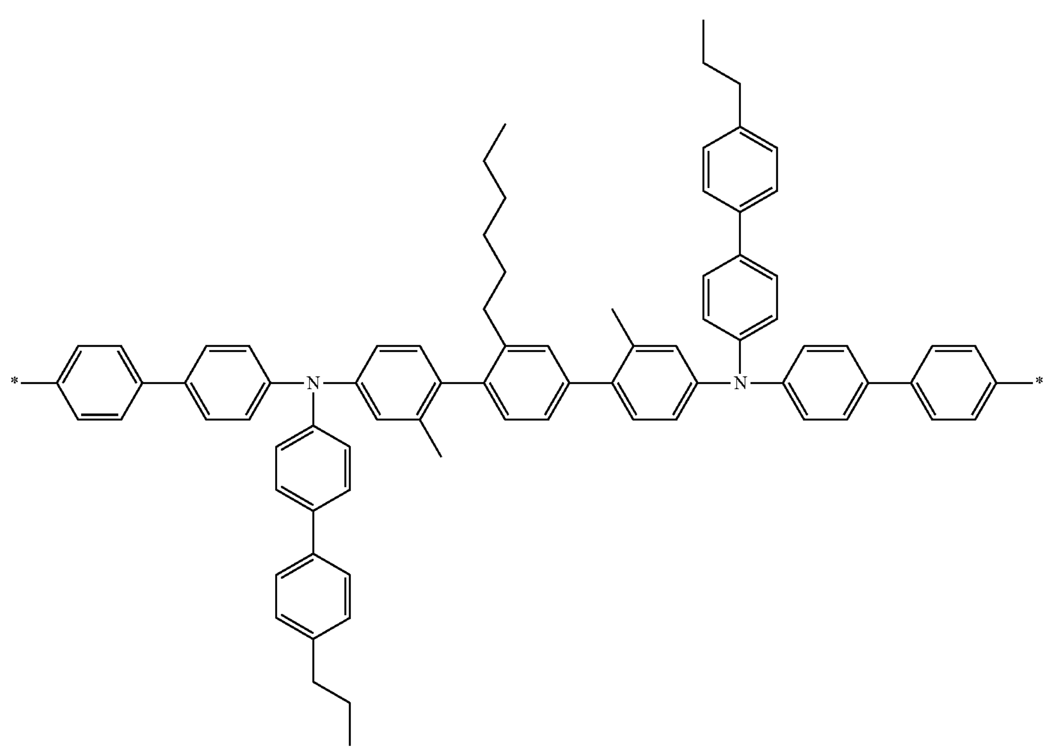

-continued
A2
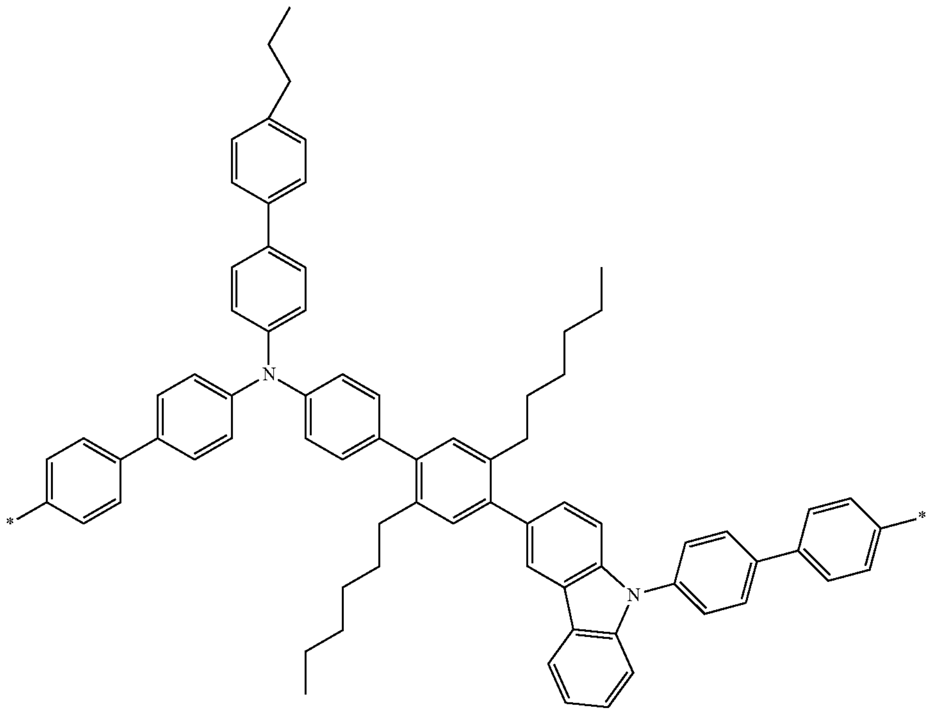
A3
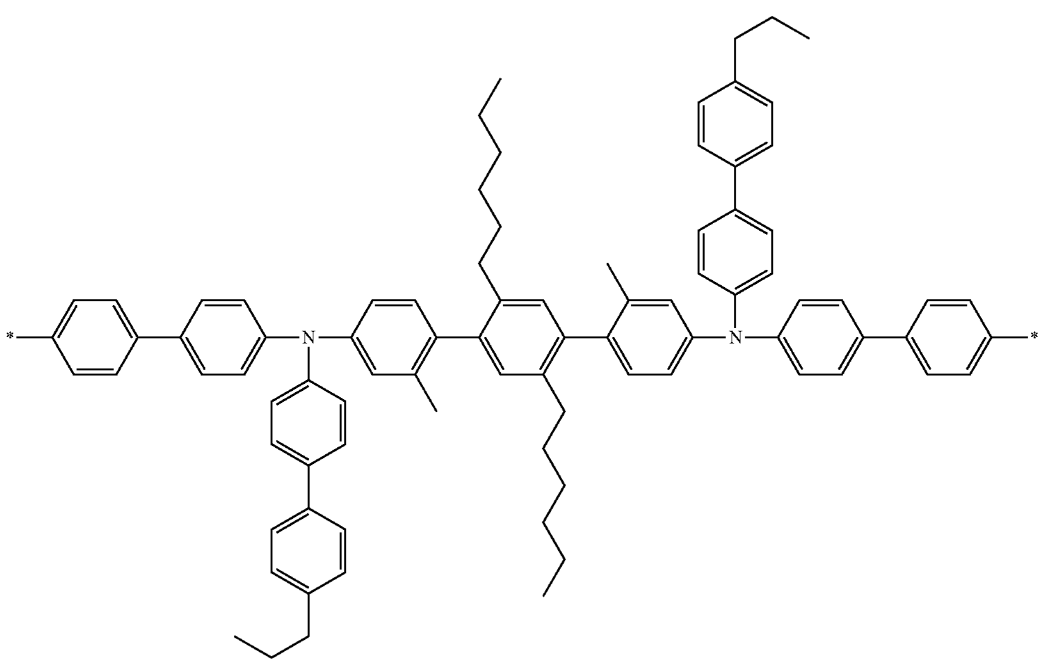

-continued
A4
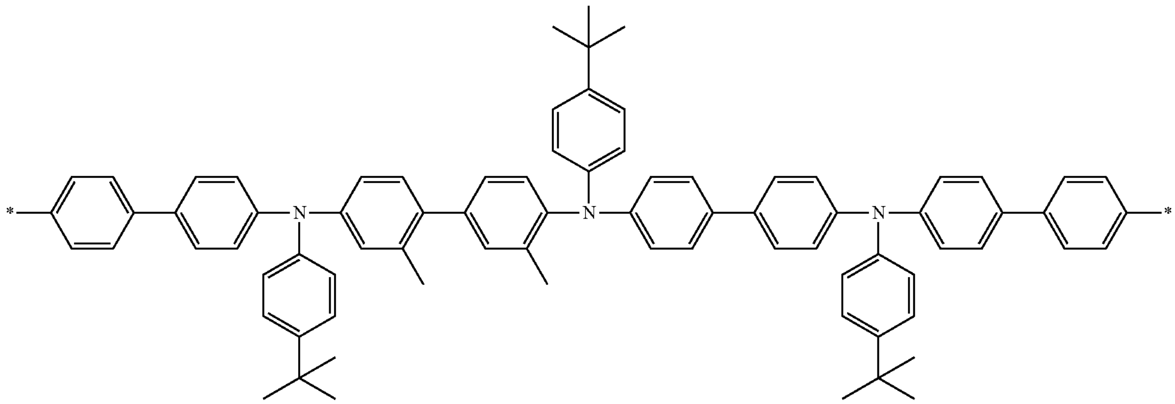
A5
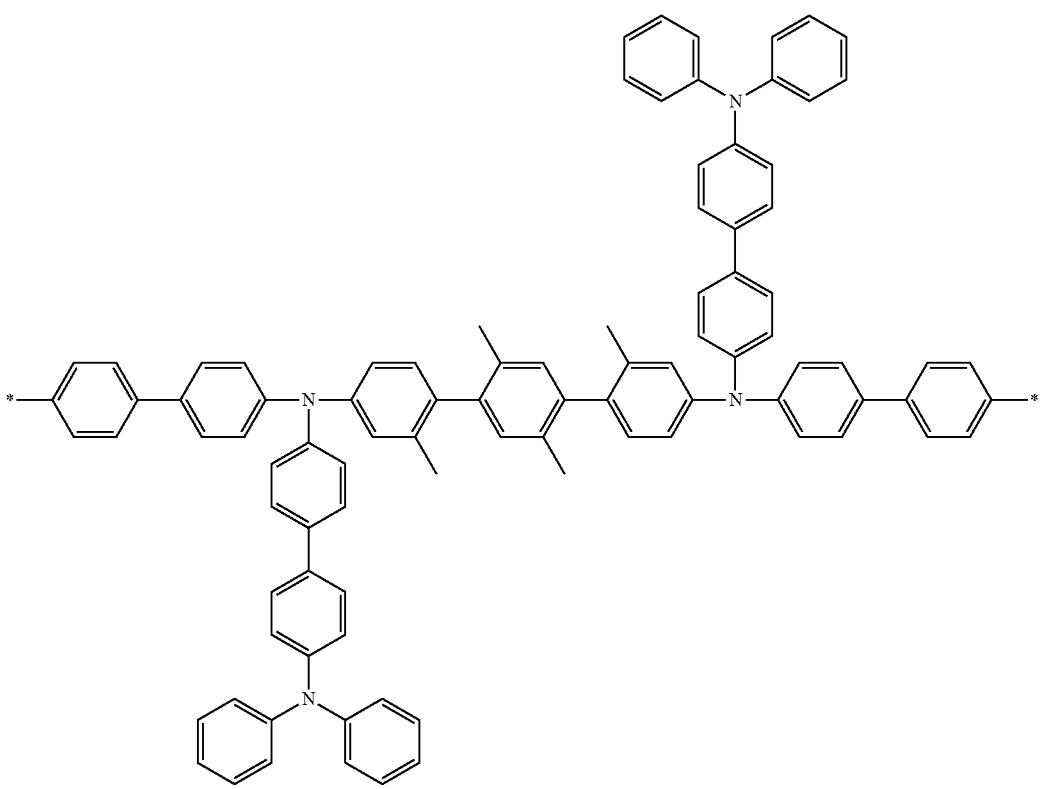

-continued
A6
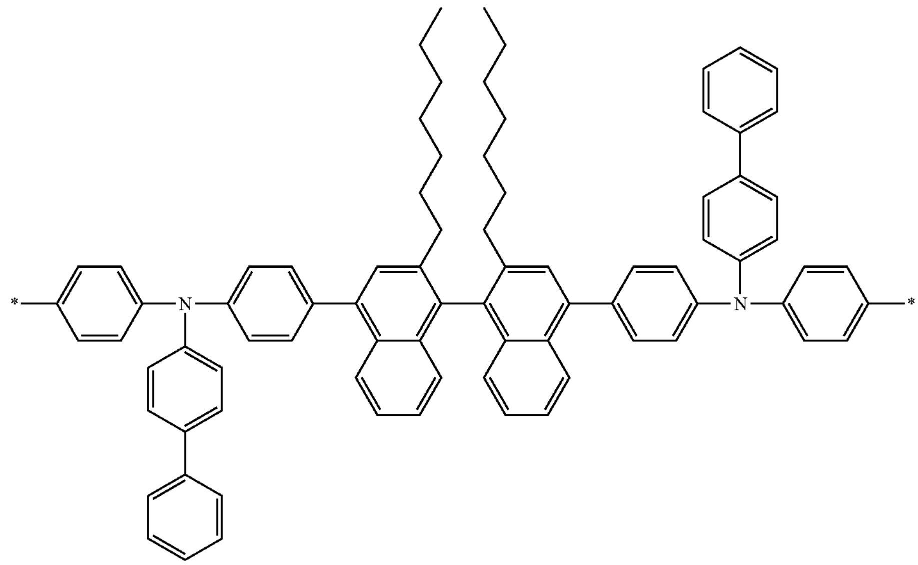
A7
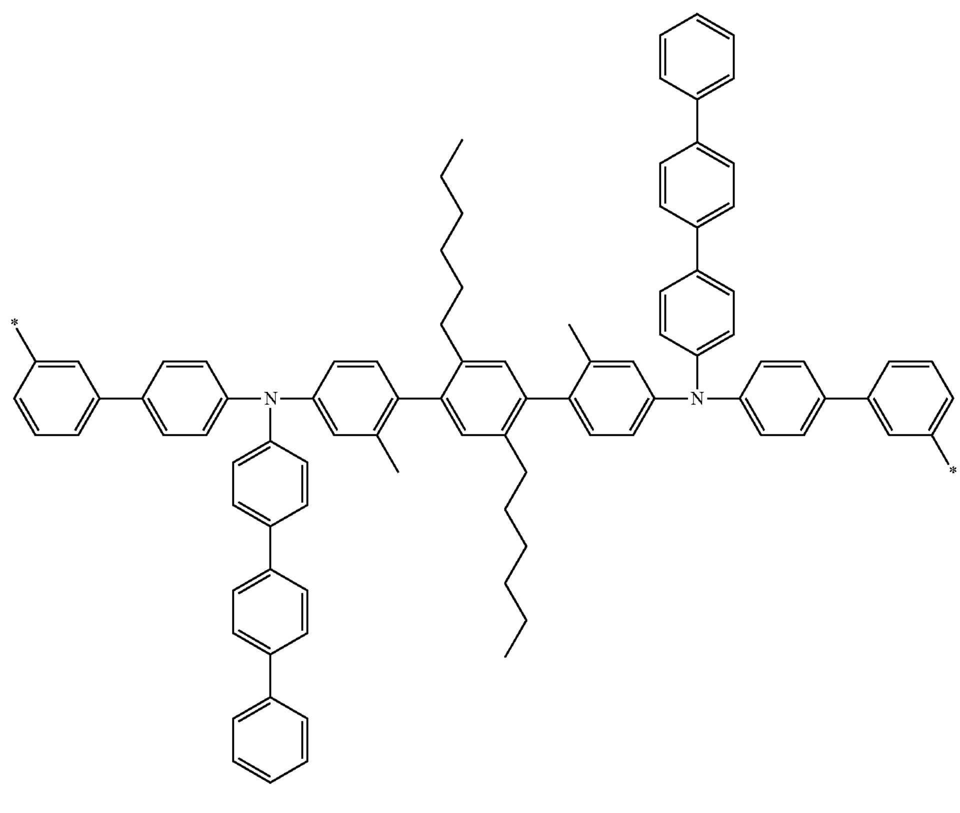
wherein * indicates a binding point in the copolymer.

16. The organic light emitting device of claim 1, wherein the monomer unit B' is any one of the following structures:
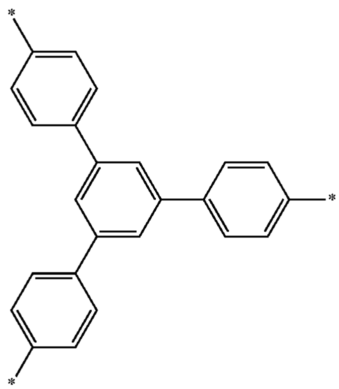
B1
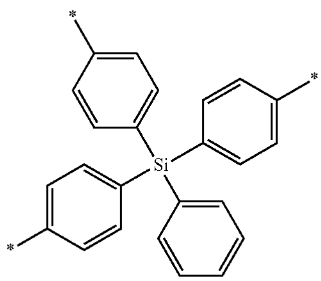
B2
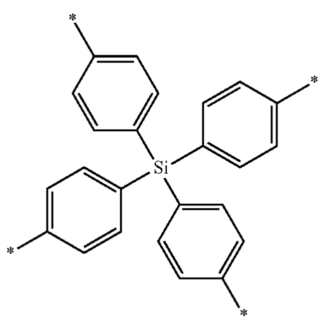
B3
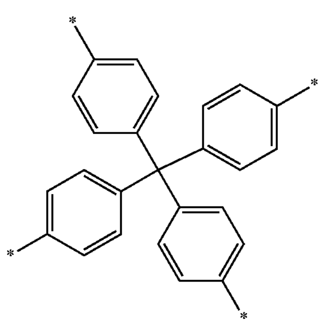
B4
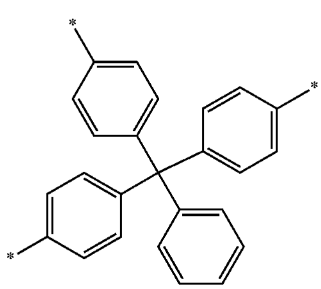
B5
-continued
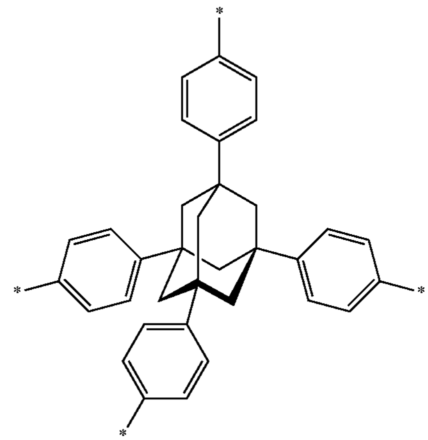
B6
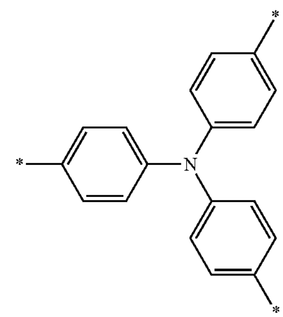
B7
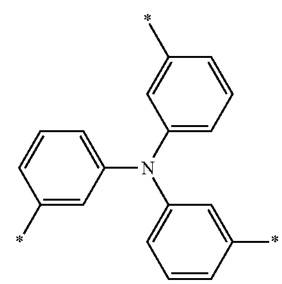
B8
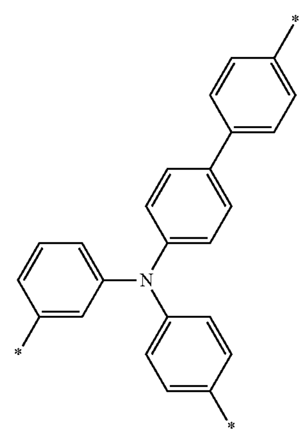
B9
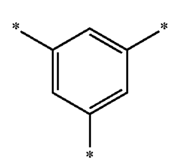
B10

-continued

B11

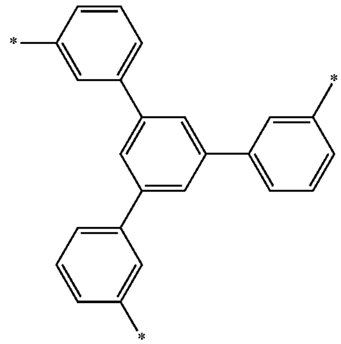

wherein * indicates a binding point in the copolymer.

17. The organic light emitting device of claim 1, wherein the monomer unit C' is any one selected from the following structures:

C1

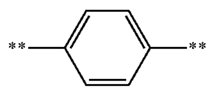

C2

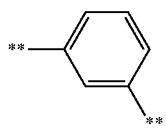

C3

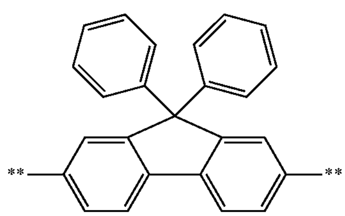

C4

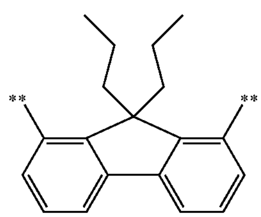

C5

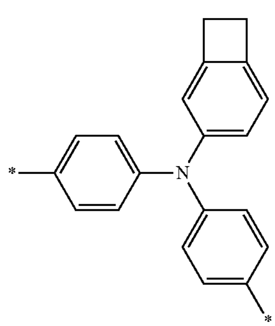

-continued

C6

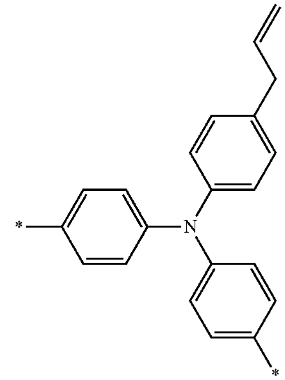

C7

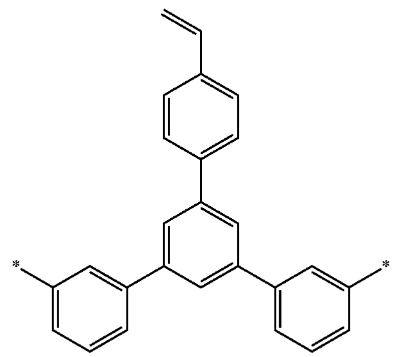

wherein * indicates a binding point in the copolymer.

18. The organic light emitting device of claim 1, wherein the unit E is independently any one of the following structures:

E1

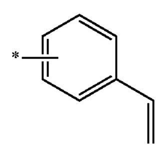

E2

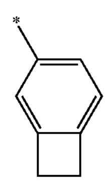

E3

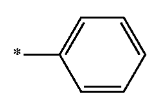

E4

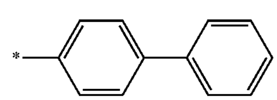

-continued
E5
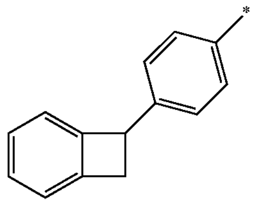
E6
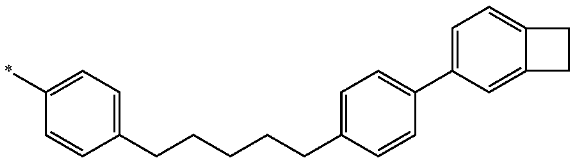
E7
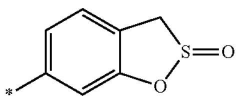
E8
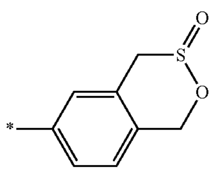
E9
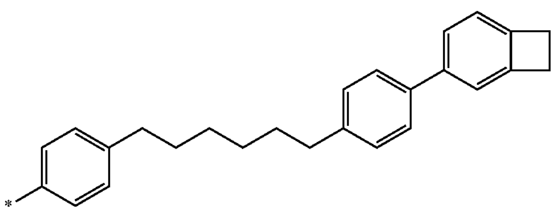
E10
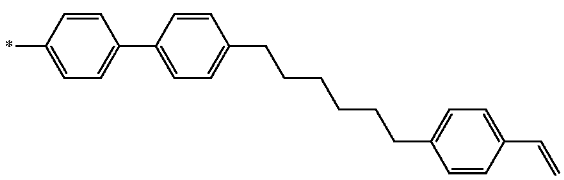
-continued
E11
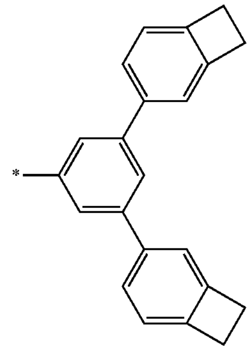
E12
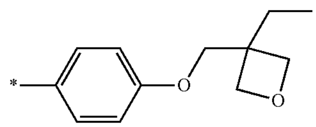
E13
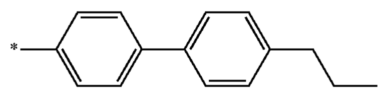
E14
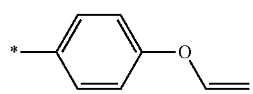
wherein * indicates a binding point in the copolymer.
19. The organic light emitting device of claim 9, wherein a1 is 0.3 to 0.9, b1 is 0.05 to 0.4, c1 is 0 to 0.15 and e1 is 0.05 to 0.6.
* * * * *